US009979427B2

(12) United States Patent
Thomas et al.

(10) Patent No.: US 9,979,427 B2
(45) Date of Patent: May 22, 2018

(54) PRIVACY AND SECURITY SYSTEMS AND METHODS OF USE

(71) Applicant: PPIP LLC, Tempe, AZ (US)

(72) Inventors: Teddy David Thomas, Bedford, NH (US); Harald Quintus-Bosz, Sudbury, MA (US); Manas Chandran Menon, Boston, MA (US); Anthony Clegg Parker, Arlington, MA (US); Klaus Heribert Renner, Hollis, NH (US); Julien Prosper Marc Aknin, Somerville, MA (US); Christopher O. Evans, Amherst, NH (US); Bing Xu, Austin, TX (US); Huyen NguyenNgoc Cam Le, Portola Valley, CA (US); Fa Dai, Auburn, AL (US); John Stadille, Frederick, CO (US); Michael Fong, Chandler, AZ (US); John Kinnard, San Tan Valley, AZ (US); Craig Ovans, Chandler, AZ (US); Andres Parada, Chicago, IL (US); John Deros, Phoenix, AZ (US); Andrew Goodfellow, Scottsdale, AZ (US); Justin David Cumming, Boston, MA (US); Gregg Robert Draudt, Boston, MA (US); Eric Smallwood, Boston, MA (US); Piotr Diduch, Billerica, MA (US); Christopher R. McCaslin, Alameda, CA (US); Elias R. Samia, Berkeley, CA (US); Evan Hutker, Boston, MA (US); Robert Francis Hartmann, Westford, MA (US); Stuart Eric Schechter, Newton, MA (US)

( * ) Notice: Subject to any disclaimer, the term of this patent is extended or adjusted under 35 U.S.C. 154(b) by 0 days. days.

(21) Appl. No.: 14/849,502

(22) Filed: Sep. 9, 2015

(65) Prior Publication Data

US 2016/0234356 A1 Aug. 11, 2016

Related U.S. Application Data

(60) Provisional application No. 62/048,173, filed on Sep. 9, 2014, provisional application No. 62/100,462, filed (Continued)

(51) Int. Cl.
*H04M 1/00* (2006.01)
*H04B 1/3888* (2015.01)

(Continued)

(52) U.S. Cl.
CPC ......... *H04B 1/3888* (2013.01); *H04B 1/3838* (2013.01); *H04M 1/0202* (2013.01);

(Continued)

(58) Field of Classification Search
CPC . H04B 1/3838; H04B 1/3888; H04M 1/0202; H04M 1/035

(Continued)

(56) References Cited

U.S. PATENT DOCUMENTS

| | | | | |
|---|---|---|---|---|
| 4,910,920 A * | 3/1990 | Nichols | ................ | H05K 9/0016 174/361 |
| 7,552,245 B2 | 6/2009 | Sherman et al. | | |

(Continued)

OTHER PUBLICATIONS

Dong Yun Lee, International Search Report, dated Jan. 13, 2016, PCT/US2015/050054, Korean Intellectual Property Office.

(Continued)

*Primary Examiner* — Raj Chakraborty
(74) *Attorney, Agent, or Firm* — Ronald Fernando

(57) ABSTRACT

Some embodiments include a privacy/security apparatus for a portable communication device that includes a housing (Continued)

assembly configured to at least partially attenuate at least one of sound energy, acoustic energy, and electromagnetic energy including light, optical, and IR energy and RF radiation from passing through the housing assembly. The housing assembly includes a Faraday cage with two or more portions, and at least one protective shell coupled to or forming at least one aperture. The at least one aperture is configured and arranged to at least partially enclose the portable communication device so that at least a portion of the portable communication device is positioned within at least one portion of the Faraday cage, and the at least one seal coupled or integrated with the protective shell. The housing assembly can be an articulating assembly, a sliding assembly, and can include an active acoustic jamming or passive acoustic attenuation element.

33 Claims, 273 Drawing Sheets

Related U.S. Application Data on Jan. 6, 2015, provisional application No. 62/161,759, filed on May 14, 2015, provisional application No. 62/195,903, filed on Jul. 23, 2015, provisional application No. 62/198,635, filed on Jul. 29, 2015, provisional application No. 62/209,249, filed on Aug. 24, 2015.

(51) Int. Cl.

| | |
|---|---|
| ***H04M 1/02*** | (2006.01) |
| ***H04M 1/03*** | (2006.01) |
| ***H04B 1/3827*** | (2015.01) |
| ***H05K 9/00*** | (2006.01) |
| *H04M 1/18* | (2006.01) |

(52) U.S. Cl.
CPC .......... *H04M 1/035* (2013.01); *H05K 9/0069* (2013.01); *H04M 1/185* (2013.01)

(58) Field of Classification Search
USPC ........................................................ 455/575.8
See application file for complete search history.

(56) References Cited

U.S. PATENT DOCUMENTS 7,795,842 B2 9/2010 Sherman et al.
7,812,640 B2 10/2010 Sherman
7,863,856 B2 1/2011 Sherman et al.
7,899,946 B2 3/2011 Ohshima
8,032,259 B2 4/2011 Sherman et al.
7,966,355 B2 6/2011 Sherman et al.
7,969,748 B2 * 6/2011 Niederkorn .......... H04B 1/3833 361/756
7,970,433 B2 6/2011 Sherman et al.
8,069,282 B2 11/2011 Sherman et al.
8,078,204 B2 12/2011 Bychkov et al.
8,078,978 B2 12/2011 Perry et al.
8,091,772 B2 1/2012 Sherman et al.
8,101,872 B2 1/2012 Malone
8,180,395 B2 5/2012 Moran et al.
8,265,689 B2 9/2012 Ron
8,340,795 B2 12/2012 Sherman
8,342,394 B2 1/2013 Sherman et al.
8,352,802 B2 1/2013 Katz et al.
8,517,255 B2 8/2013 Sherman et al.
8,560,014 B1 10/2013 Hu et al.
8,618,426 B2 12/2013 Malone
8,675,850 B2 3/2014 Bychkov et al.
8,866,642 B2 10/2014 Ron et al.
8,971,865 B2 3/2015 Bychkov et al.
8,994,230 B2 3/2015 Sherman et al.
9,158,340 B2 * 10/2015 Reed ..................... G06F 1/1637
9,241,051 B1 * 1/2016 Peterson, III ....... H04M 1/0264
9,286,883 B1 * 3/2016 Ayrapetian .......... G10L 21/0208
2007/0259704 A1 11/2007 Jung
2008/0195797 A1 8/2008 Sherman et al.
2008/0235441 A1 9/2008 Sherman et al.
2008/0243279 A1 10/2008 Sherman et al.
2008/0305833 A1 12/2008 Sherman et al.
2008/0307142 A1 12/2008 Sherman et al.
2009/0045779 A1 2/2009 Sherman et al.
2009/0049203 A1 2/2009 Sherman et al.
2009/0049343 A1 2/2009 Katz et al.
2009/0078760 A1 3/2009 Sherman et al.
2009/0083000 A1 3/2009 Sherman et al.
2009/0083060 A1 3/2009 Sherman et al.
2009/0106695 A1 4/2009 Perry et al.
2009/0124269 A1 5/2009 Bychkov et al.
2009/0133067 A1 5/2009 Sherman et al.
2009/0135030 A1 5/2009 Ron et al.
2009/0146862 A1 6/2009 Malone
2009/0156188 A1 6/2009 Bychkov et al.
2009/0179612 A1 7/2009 Sherman et al.
2009/0179668 A1 7/2009 Sherman
2009/0182908 A1 7/2009 Sherman et al.
2009/0185667 A1 7/2009 Bychkov et al.
2009/0199025 A1 8/2009 Sherman et al.
2009/0254690 A1 10/2009 Sherman et al.
2009/0289662 A1 11/2009 Sherman
2010/0004025 A1 1/2010 Ron
2010/0093401 A1 4/2010 Moran et al.
2010/0128761 A1 * 5/2010 Cornwell ................ H04K 3/42 375/219
2011/0014863 A1 * 1/2011 Foster ................... H04K 3/415 455/1
2011/0014951 A1 1/2011 Sherman et al.
2012/0062043 A1 3/2012 Sherman et al.
2012/0085576 A1 4/2012 Malone
2012/0120994 A1 5/2012 Sherman et al.
2012/0308064 A1 12/2012 Matthews
2013/0045776 A1 2/2013 Sherman et al.
2013/0206470 A1 8/2013 Davis
2013/0337859 A1 * 12/2013 Patel ...................... H04W 4/10 455/518
2014/0159980 A1 6/2014 Finegold
2014/0190841 A1 7/2014 Nash
2014/0284095 A1 9/2014 Behuniak et al.

OTHER PUBLICATIONS

International Search Report, dated Feb. 19, 2016, PCT/US2015/050055, Korean Intellectual Property Office.
Written Opinion of the International Searching Authority, dated Feb. 19, 2016, PCT/US2015/050055, Korean Intellectual Property Office.

* cited by examiner 8800
8802
8805

8800
8802
8815
8830

8800
8802
8815
8830
8840

8800
8815
8830
8840

8800
8815
8840

FIG. 96B
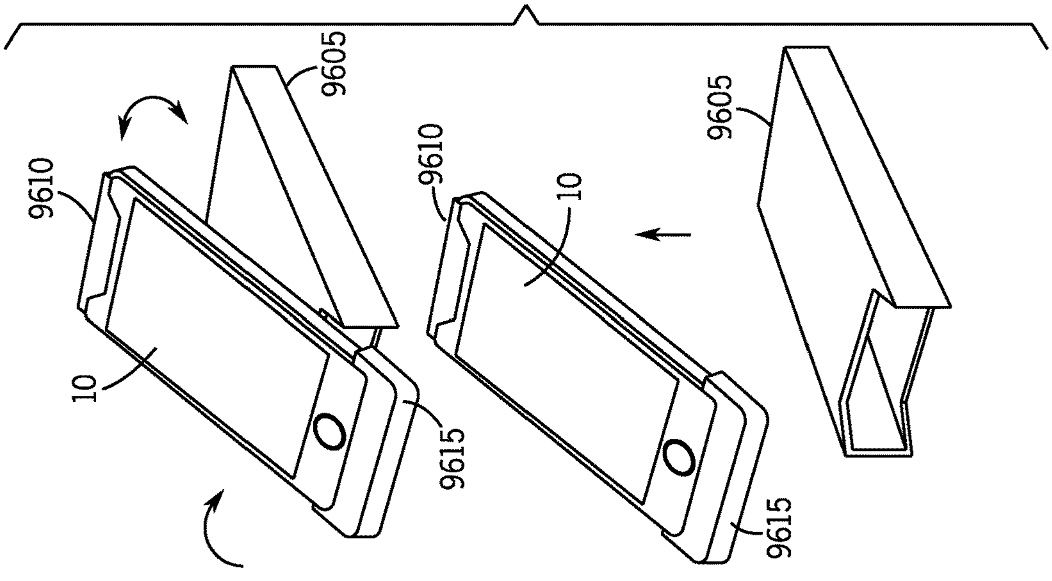
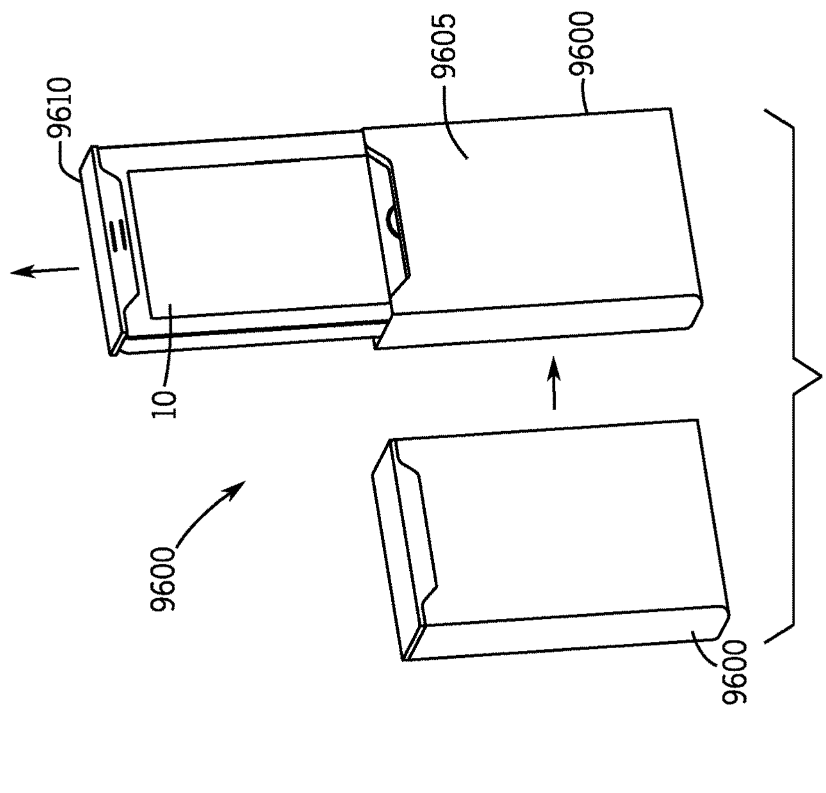
FIG. 96A

FIG. 133
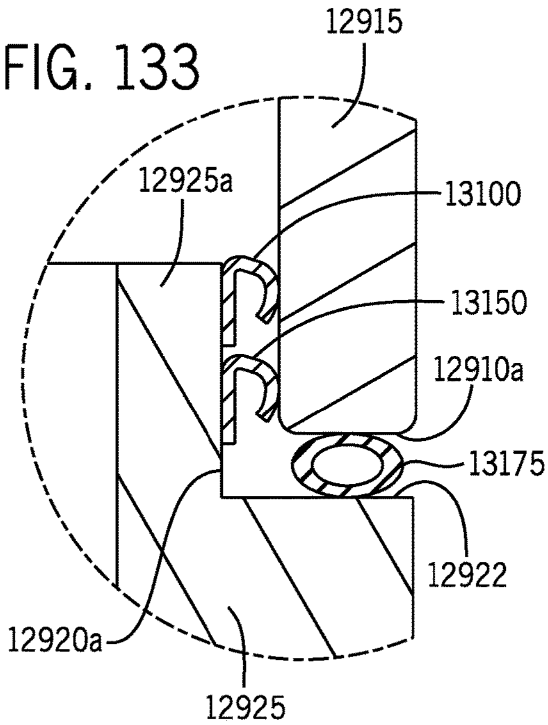
FIG. 132
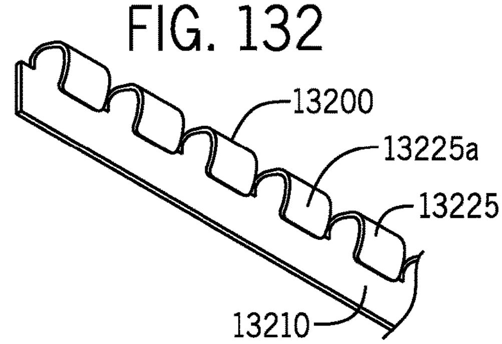
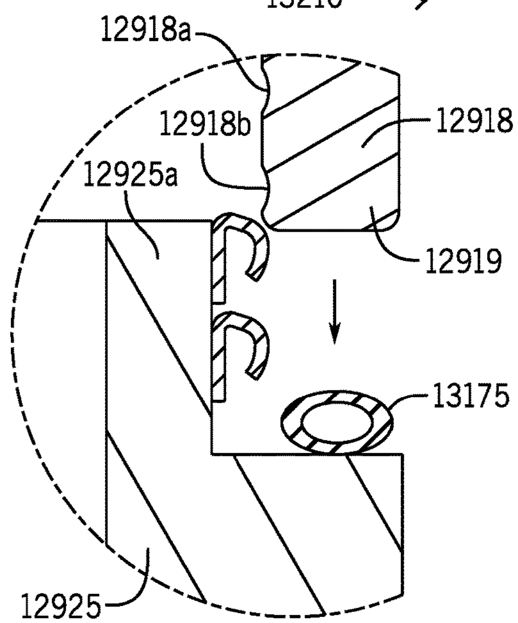
FIG. 135
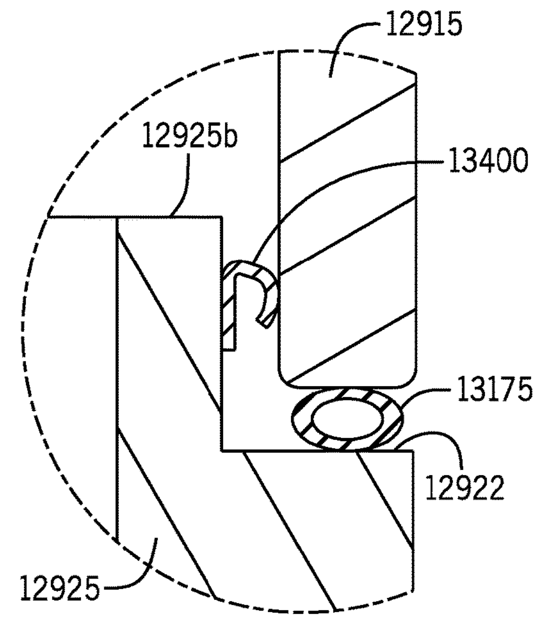
FIG. 134
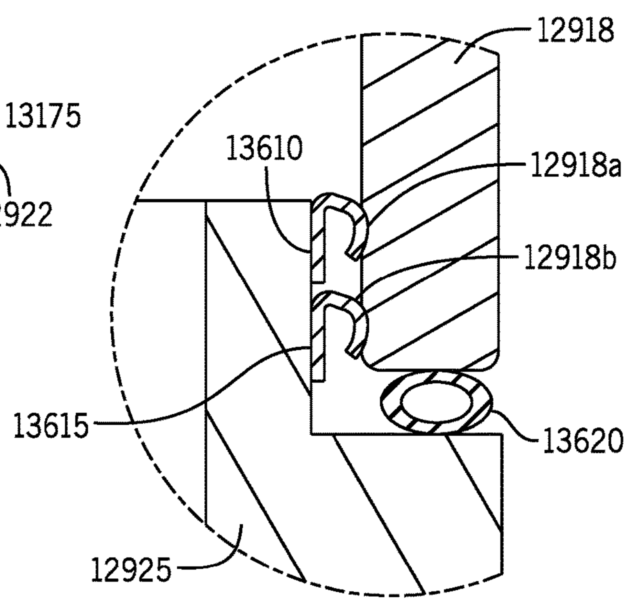
FIG. 136

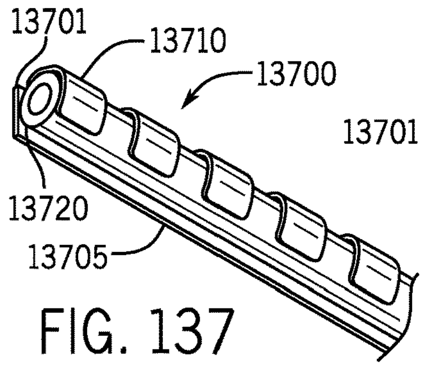
FIG. 137
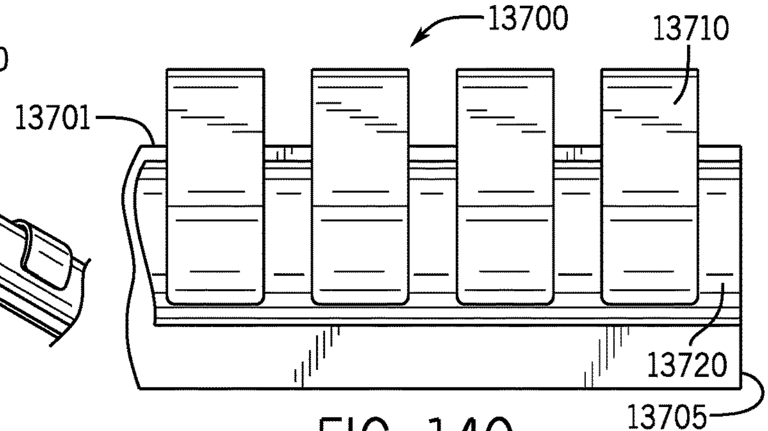
FIG. 140
FIG. 138
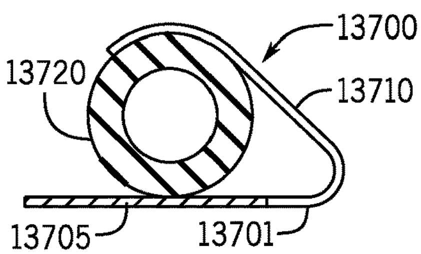
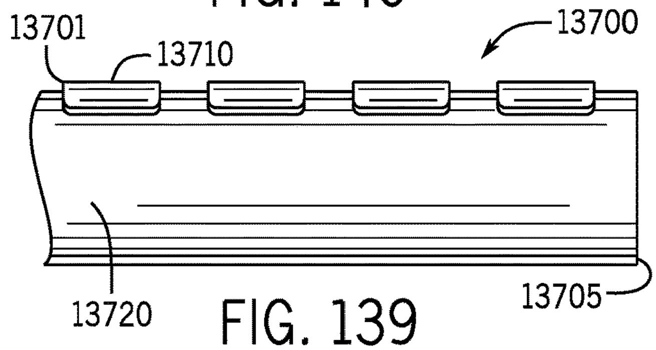
FIG. 139
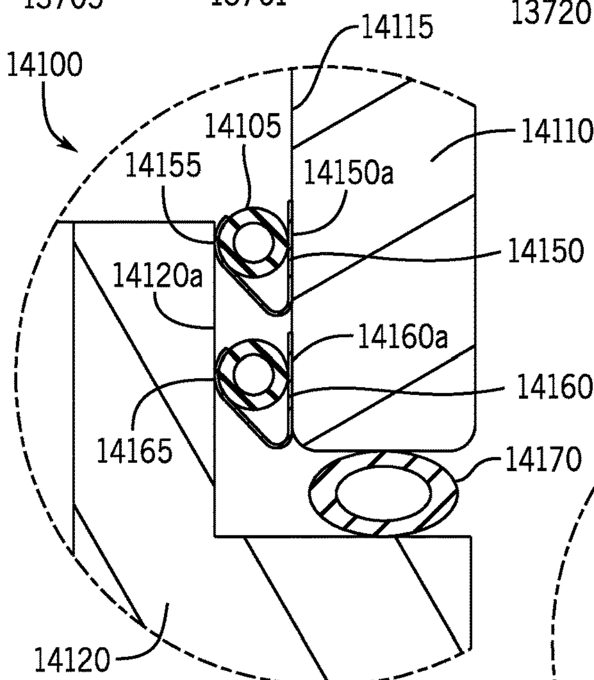
FIG. 141
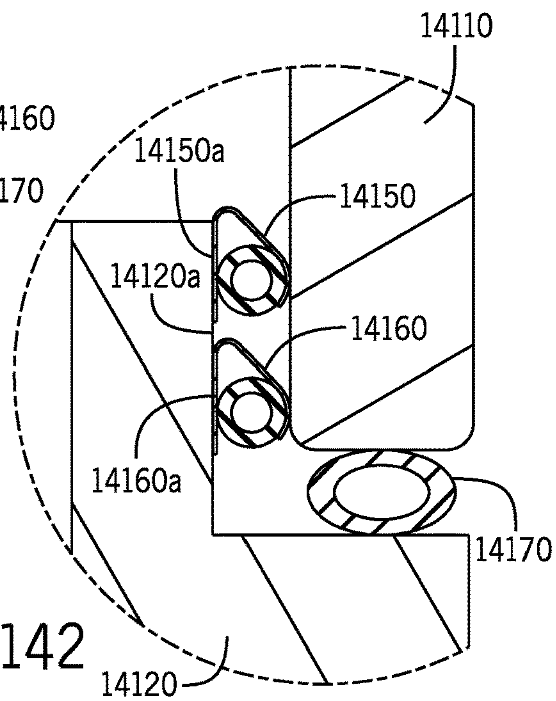
FIG. 142

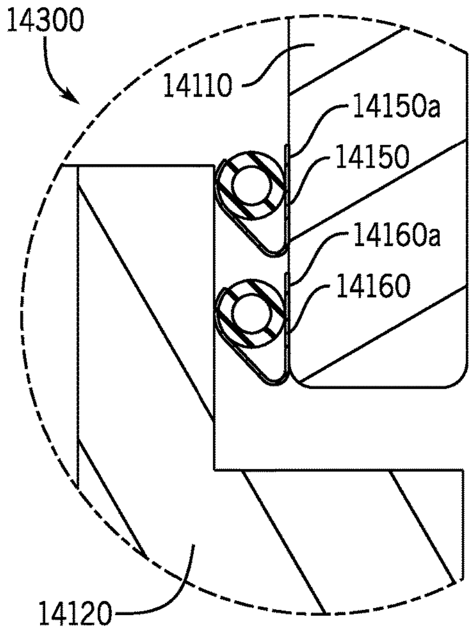
FIG. 143
FIG. 144
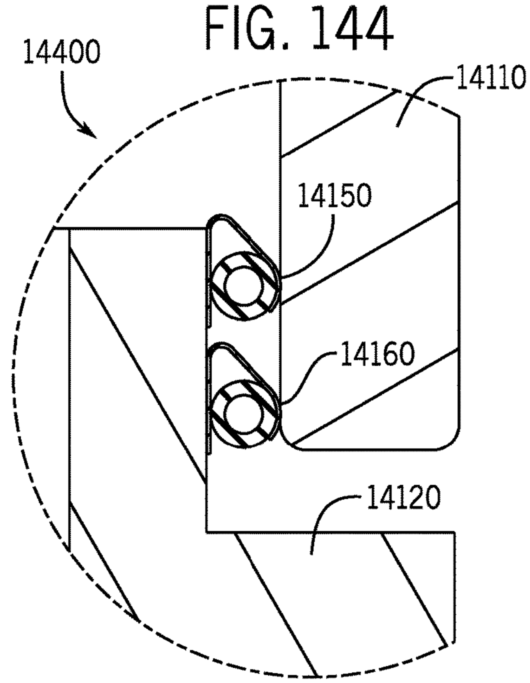
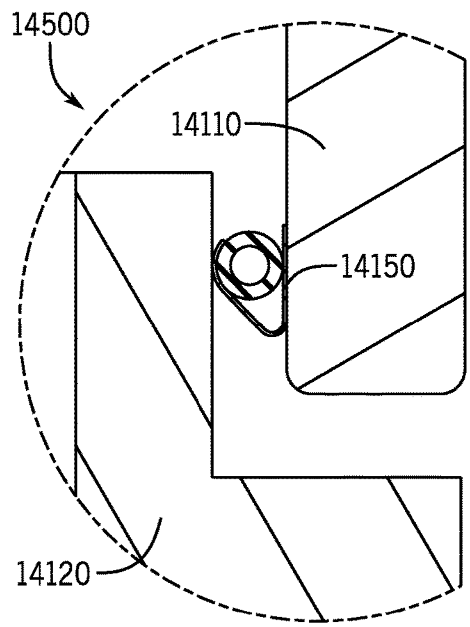
FIG. 145
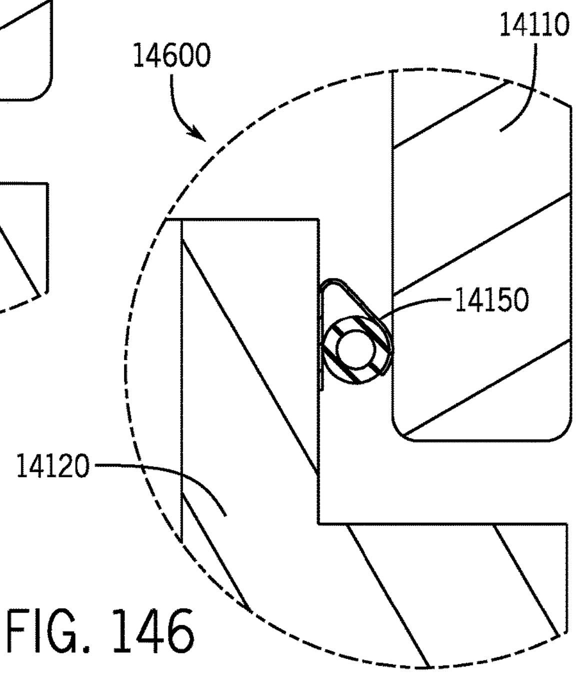
FIG. 146

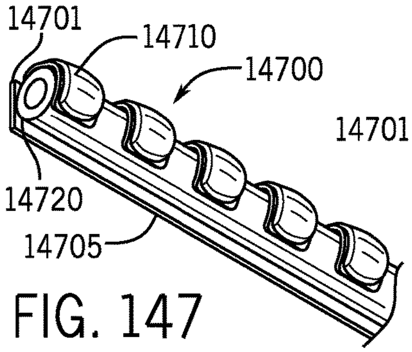
FIG. 147
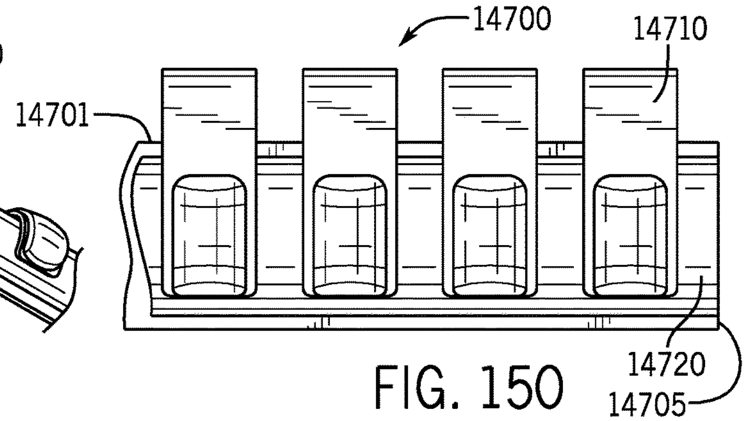
FIG. 150
FIG. 148
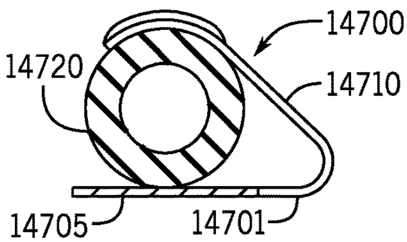
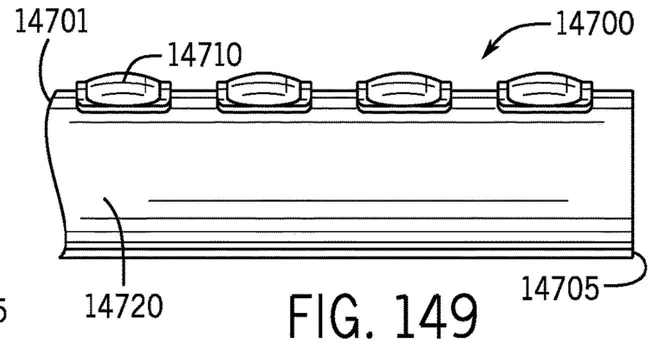
FIG. 149
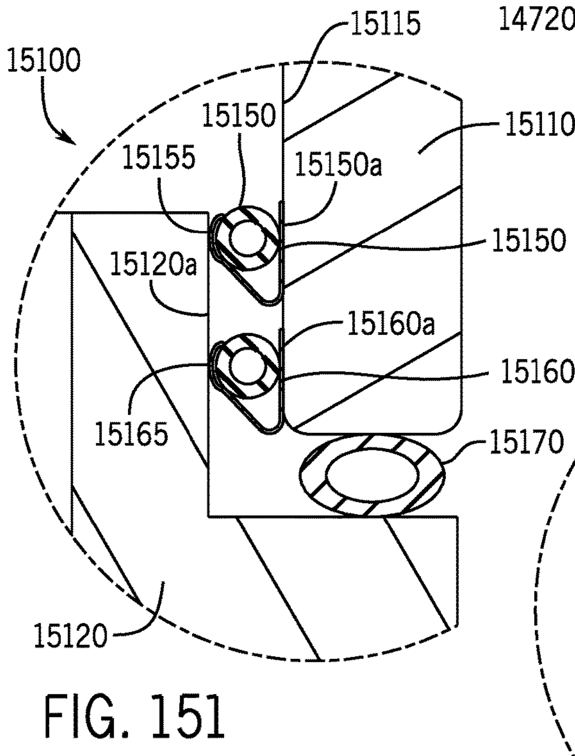
FIG. 151
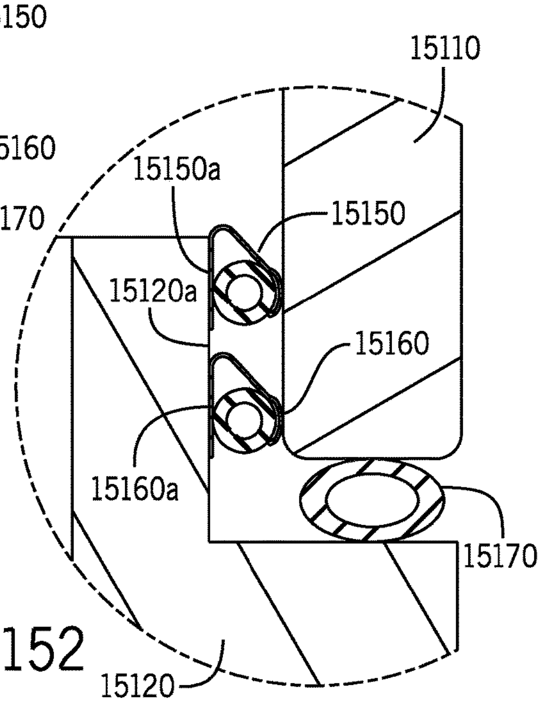
FIG. 152

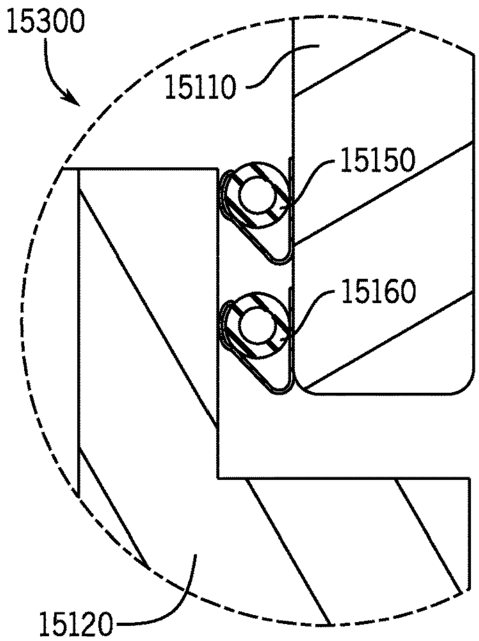
FIG. 153
FIG. 154
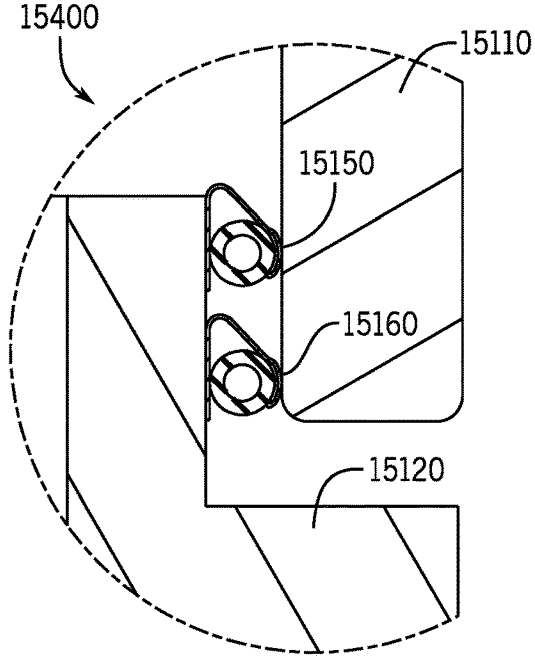
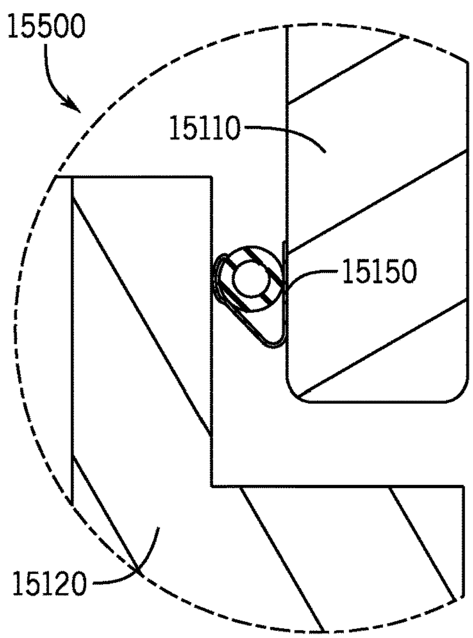
FIG. 155
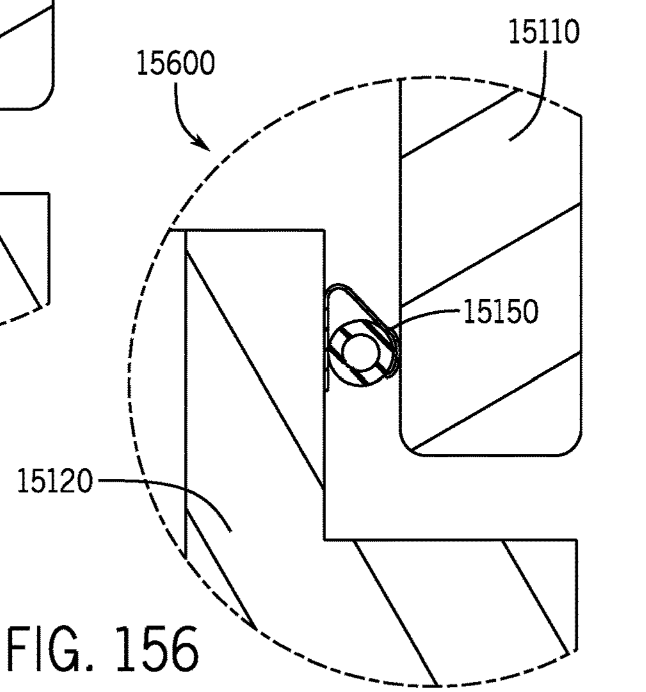
FIG. 156

| SYMBOL (19311) | STATE NAME (19312) | CASE (19314) | PHONE ACOUSTICS (19316) | MASKING (19318) | PHONE (19319) | |
|---|---|---|---|---|---|---|
| | CLOSED OFF | CLOSED | SEALED | OFF | PRESENT | 19370 |
| | CLOSED ON | CLOSED | SEALED | FULL ON | PRESENT | 19375 |
| | OPEN FREE | OPEN | UNSEALED | OFF | PRESENT | 19380 |
| | OPEN OFF | OPEN | SEALED | OFF | PRESENT | 19385 |
| | OPEN ON | OPEN | SEALED | FULL ON | PRESENT | 19390 |

FIG. 223
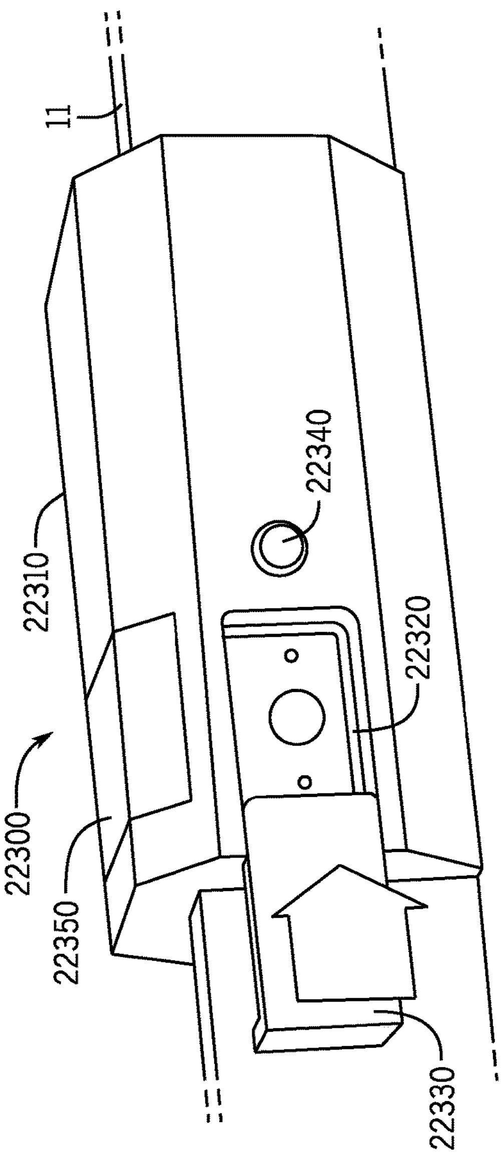
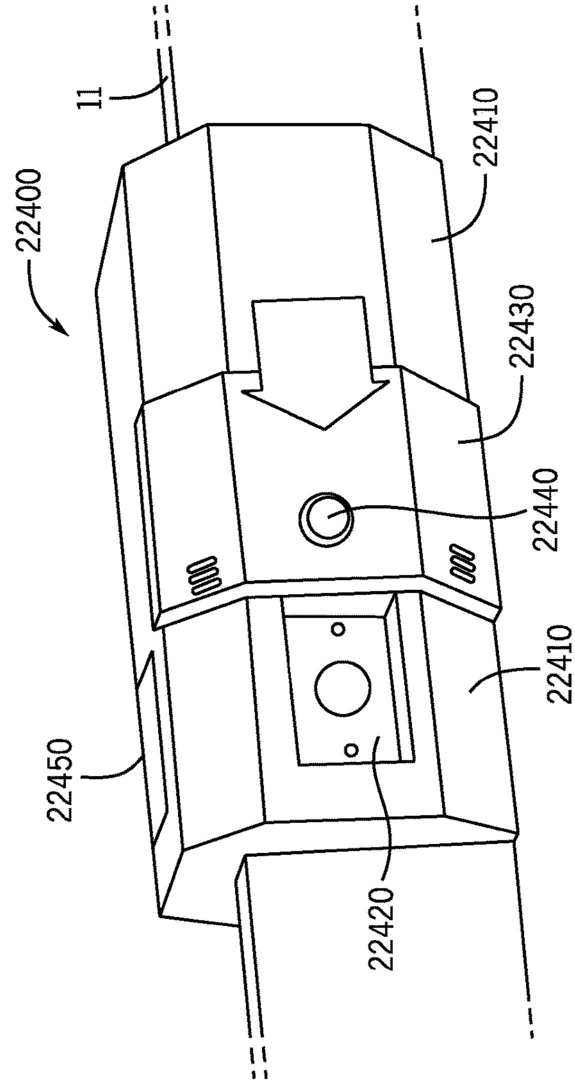
FIG. 224

26100
26120
25910
25915

26110

26000
25930
25910

26010

25900
25920
25930
25910
25915

25930

25960

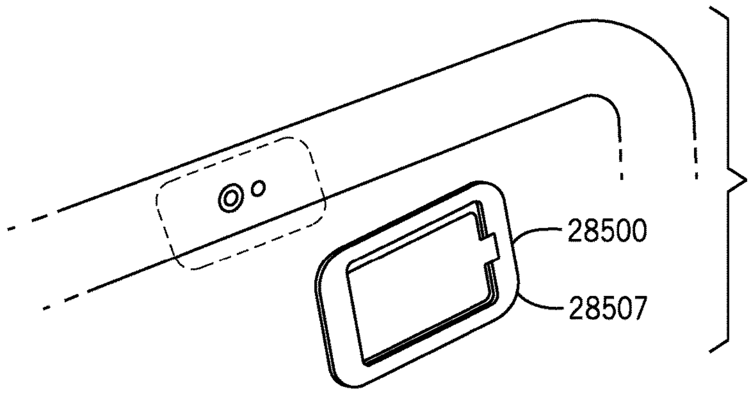
FIG. 285A
FIG. 285B
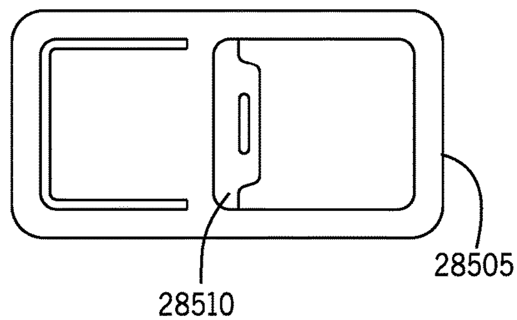
FIG. 285C
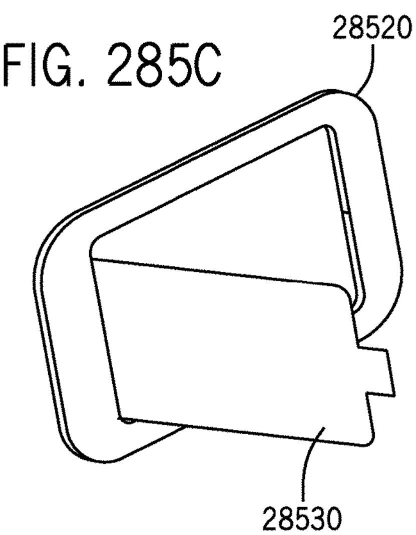
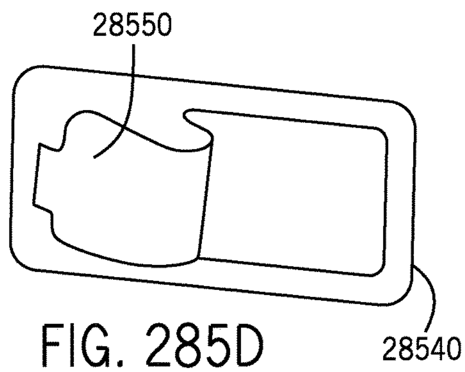
FIG. 285D
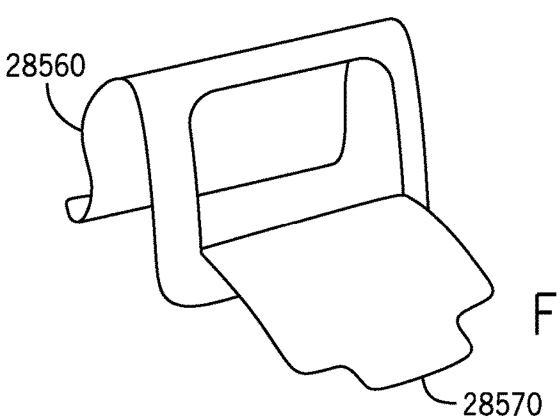
FIG. 285E

PRIVACY AND SECURITY SYSTEMS AND METHODS OF USE

RELATED APPLICATIONS

This application claims priority from Provisional Application No. 62/048,173, filed on Sep. 9, 2014, Provisional Application No. 62/100,462, filed on Jan. 6, 2015, Provisional Application No. 62/161,759, filed on May 14, 2015, Provisional Application No. 62/195,903, filed on Jul. 23, 2015, Provisional Application No. 62/198,635, filed on Jul. 29, 2015, and Provisional Application No. 62/209,249, filed on Aug. 24, 2015, the entire contents of which are incorporated herein by reference.

BACKGROUND

Mobile communication and computing devices such as cellular phones, smart phones, computer laptops and tablets etc., are becoming essential personal accessories, oftentimes rarely out of sight of the user. Desktop computers, gaming consoles, wearable devices such as "Smart" watches and Google Glass® already have or eventually will have audio and video recording capabilities, as well as a wide variety of RF transmit/receive capabilities for communication. The advent of the "Internet of Things" (or the "Internet of Everything"), in which most every day devices, from thermostats and appliances to food packages, clothing, medical devices and automobiles (to name a few) have or will have audio, video and RF capabilities is also upon us. Moreover, all of the previously mentioned devices have or someday will potentially include other sensors such as gyroscopes, accelerometers, and proximity, temperature, light, pressure, and other sensors. Ongoing improvements in RF transceiver technology and advancements in the miniaturization of audio-visual capabilities and other devices such as microphones, video cameras and displays provide the user with unparalleled ability to receive, process, and transmit large volumes of data. Devices can record audio and visual information from their environment, process the data either locally or remotely (e.g., "cloud" storage and/or processing) for audio and video transfer directly to a user, or to virtually anywhere in the world capable of receiving a wireless and/or internet service.

Increasing publicity regarding surveillance and the steady rise in the capability of mobile communication and other devices has precipitated an increased awareness of privacy/security concerns associated with such device use. Currently, mobile communication and computing devices do not incorporate so-called "intelligent awareness" to automatically alter their audio-video and transceiver behavior based on a user's environment or requirements, let alone alter behavior to their wishes (such as a user's desire to turn off any of their device's specific capabilities). For example, cellular phones do not know when a user is in a movie theater to automatically turn-off or convert to a quiet-alert mode, and are not easily switched to a secure mode to prevent unwanted reception of RF signals or acquisition of audio visual information from their immediate environment. Furthermore, improvements in wireless network infrastructure enabling location through triangulation, proximity, and ubiquitous use of GPS technology within mobile devices have allowed accurate device location detection, potentially allowing the dissemination of confidential user information.

In general, device manufacturers and network providers (cellular, internet, private or public networks WiFi and other such networks) rarely, if ever, allow users to totally control reception and transmission of RF or a device's audio-video capabilities. Even with the control that is possible, hackers, malware and other malicious people or code can hijack these functions. Conventional cases or peripheral devices which add features or capabilities or provide protection, aesthetic or other value or do not provide users with full control of their devices' capabilities

SUMMARY

Some embodiments include a privacy/security apparatus for a portable communication device comprising a housing assembly configured to at least partially attenuate at least one of sound energy, acoustic energy, and electromagnetic energy including light, optical, and IR energy and RF radiation from passing through the housing assembly. The housing assembly comprises a Faraday cage comprising two or more portions, and at least one protective shell coupled to or forming at least one aperture. The at least one aperture is configured and arranged to at least partially enclose the portable communication device so that at least a portion of the portable communication device is positioned within at least one portion of the Faraday cage, and the at least one seal coupled or integrated with the protective shell.

Some embodiments include a privacy/security apparatus where the housing assembly includes an articulating assembly configured and arranged to articulate a portion of the housing assembly to one or more positions to enable a user to insert or enclose and remove the portable communication device. In some other embodiments, the housing assembly includes a sliding assembly configured and arranged to slide a portion of the housing assembly to one or more positions to enable a user to insert, enclose or remove the portable communication device. In some embodiments, the housing assembly includes at least one active acoustic jamming or passive acoustic attenuation element.

In some embodiments of the invention, housing assembly is configured and arranged to be movable between an open and a closed position to enable a user to insert or enclose and remove the portable communication device. In some embodiments, the housing assembly comprises a sheath. In other embodiments, the housing assembly comprises a hood assembly and a base assembly. Further, the base assembly includes a Faraday base assembly forming at least one of the portions of the Faraday cage.

In some embodiments, the at least one seal comprises an environmental seal. In some further embodiments, the at least one seal comprises an RF seal. In some embodiments, the at least one seal comprises at least one of a magnetic seal, an electromagnetic seal, an acoustic seal, and an optical seal. In some embodiments, the at least one seal comprises a fingerstock element. In some further embodiments, the seal includes at least one elastomeric element positioned adjacent to the fingerstock. In some embodiments of the invention, the at least one elastomeric element is positioned within at least a portion of the fingerstock.

Some embodiments of the invention include a housing assembly that includes at least one port configured to couple with the portable communication device. In some embodiments, the at least one port comprises at least one of a sound transfer port, an RF transfer port, a data transfer port, a power transfer port, and an optical port. In some embodiments, the at least one protective shell includes a decorative layer or region. In some embodiments of the invention, the decorative layer or region comprises at least one of a patterned surface, a window, a display, an emblem, and a logo.

Some embodiments of the invention include a privacy/security apparatus where the housing assembly includes at least one controller configured and arranged to modulate at least one privacy/security setting. In some embodiments, the at least one privacy/security setting includes a setting that alters the magnitude of energy reaching the portable communication device through the housing assembly. In some further embodiments, the energy comprises at least one of sound energy, RF energy, electrical energy, electromagnetic energy, and optical and/or IR energy.

In some embodiments of the invention, the housing assembly includes at least one microphone. In some embodiments, the housing assembly includes at least one speaker or sound generator. In some embodiments, the housing assembly includes at least one compression seal configured and arranged to couple with at least one of a microphone, a speaker, a camera, a display, a sensor, and an RF antenna of the portable communication device.

Some embodiments of the invention include a housing assembly that includes active acoustic protection. In some embodiments, the active acoustic protection comprises a random noise generator generating a signal which is acoustically delivered to at least one microphone of the portable communication device.

In some embodiments, the housing assembly includes at least one DC pass-through configured and arranged to pass direct current through the Faraday cage. In some further embodiments, the housing assembly includes an onboard power supply.

Some embodiments of the invention include a privacy/security apparatus where the movement of the hood assembly results in the covering of all of the portable communications device's microphones and cameras in a closed position, and the uncovering of all of the portable communications device's microphones and cameras in an open position.

DESCRIPTION OF THE DRAWINGS

FIGS. 96A-96B illustrate various views of a privacy/security enclosure according to at least one embodiment of the invention.

FIG. 121 depicts a microphone blocking assembly according to one embodiment of the invention.

FIG. 122 depicts a microphone blocking assembly according to one embodiment of the invention.

FIGS. 123A-123C depict views of a microphone blocking assembly according to one embodiment of the invention.

FIGS. 124A-124B depict views of a microphone blocking assembly according to one embodiment of the invention.

FIGS. 125A-125G depict privacy/security enclosure housing cross-sections according to one embodiment of the invention.

FIGS. 126A-126C depict various views of a privacy/security enclosure housing according to one embodiment of the invention.

FIGS. 127A-127D illustrate user device insertion and positioning into a privacy/security enclosure according to one embodiment of the invention.

FIGS. 128A-128H illustrate cross-sectional detail views of privacy/security enclosure housing gasket seals according to one embodiment of the invention.

FIG. 129 illustrates a perspective view of a privacy/security enclosure including a partial cutaway interior view showing RF gaskets according to some embodiments of the invention.

FIG. 130 illustrates an interior view from line 2 of FIG. 129 according to some embodiments of the invention.

FIG. 131 illustrates a cross-sectional view of the privacy/security enclosure of FIG. 129 through cut line 3 of FIG. 130 according to some embodiments of the invention.

FIG. 132 illustrates a fingerstock according to some embodiments of the invention.

Figure 129:
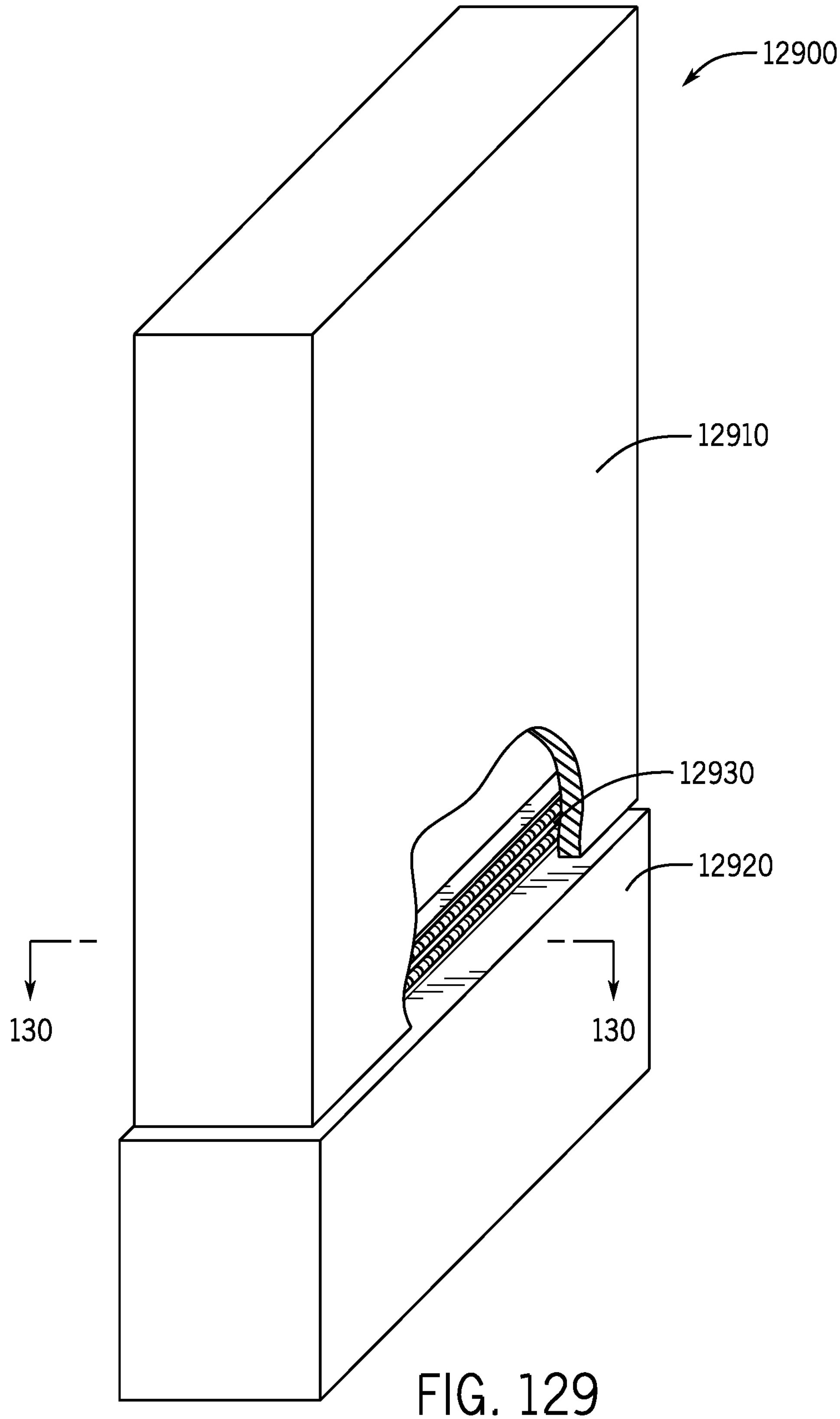
Figure 131:
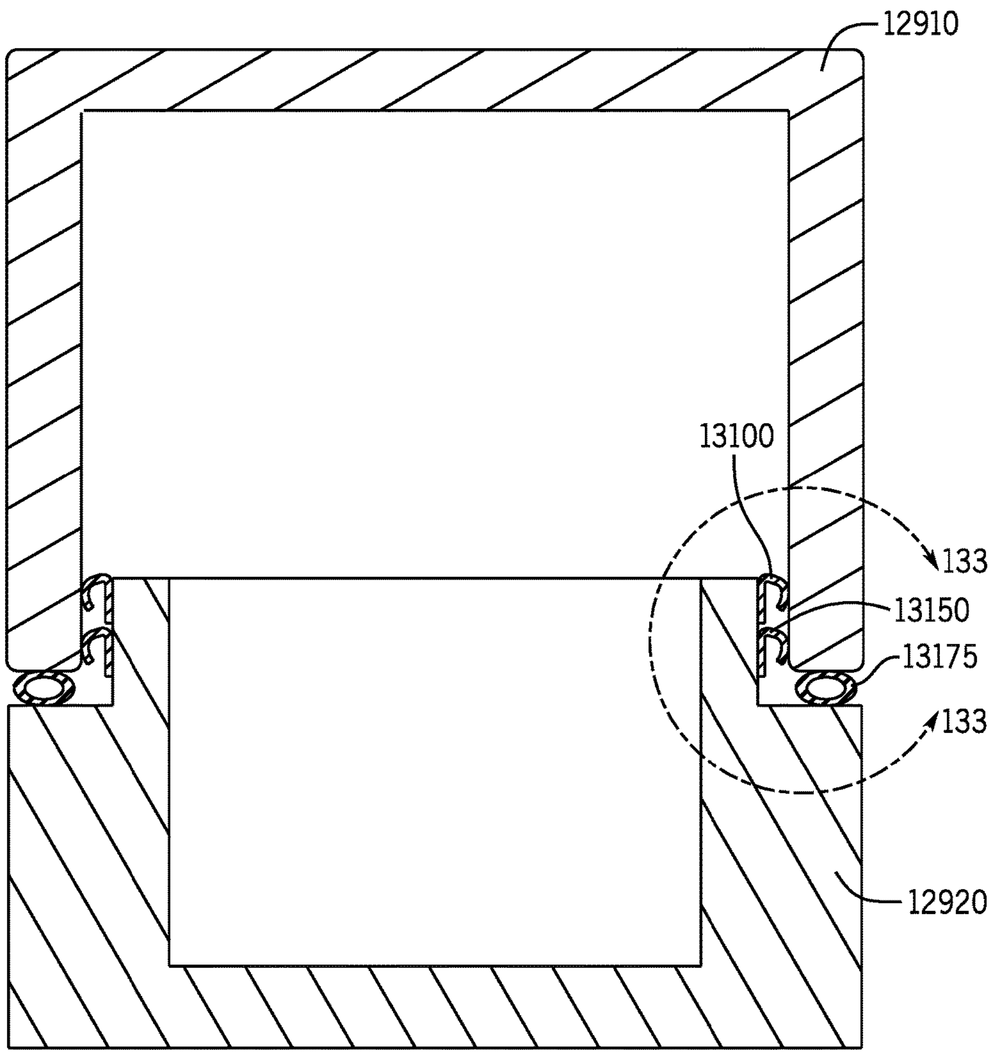

FIG. 133 illustrates a close up cross-sectional view of the privacy/security enclosure of FIG. 129 through cut line 5 of FIG. 131 showing a dual fingerstock and base gasket according to some embodiments of the invention.

FIG. 134 illustrates an example of the view of FIG. 133 including a single fingerstock and base gasket according to some embodiments of the invention.

FIG. 135 illustrates an assembly view of FIG. 133 depicting insertion of a lid insertion onto the base of a privacy/security enclosure with the lid comprising fingerstock grooves according to some embodiments of the invention.

FIG. 136 illustrates the assembled view of FIG. 135 according to some embodiments of the invention.

FIG. 137 illustrates a compound gasket assembly according to some embodiments of the invention.

FIG. 138 illustrates a cross sectional view of a compound gasket assembly according to some embodiments of the invention.

FIG. 139 illustrates a rear view of a compound gasket assembly according to one embodiment of the invention.

FIG. 140 illustrates a front view of a compound gasket assembly according to one embodiment of the invention.

FIG. 141 illustrates an example of the view of FIG. 133 including a dual fingerstocks (of FIG. 138) and base gasket according to some embodiments of the invention.

FIG. 142 illustrates an example of the view of FIG. 133 including a dual fingerstocks and base gasket according to some embodiments of the invention.

FIG. 143 illustrates an example of the view of FIG. 133 including dual fingerstocks of FIG. 138 according to some embodiments of the invention.

FIG. 144 illustrates an example of the view of FIG. 133 including dual fingerstocks of FIG. 138 according to some embodiments of the invention.

FIG. 145 illustrates an example of the view of FIG. 133 including a single fingerstock of FIG. 138 according to some embodiments of the invention.

FIG. 146 illustrates an example of the view of FIG. 133 including a single fingerstock of FIG. 138 according to some embodiments of the invention.

FIG. 147 illustrates a compound gasket assembly according to some further embodiments of the invention.

FIG. 148 illustrates a cross sectional view of a compound gasket assembly according to some further embodiments of the invention.

FIG. 149 illustrates a rear view of a compound gasket assembly according to further embodiments of the invention.

FIG. 150 illustrates a front view of a compound gasket assembly according to further embodiments of the invention.

FIG. 151 illustrates an example of the view of FIG. 133 including a dual fingerstocks and base gasket according to some embodiments of the invention.

FIG. 152 illustrates an example of the view of FIG. 133 including a dual fingerstocks and base gasket according to some embodiments of the invention.

FIG. 153 illustrates an example of the view of FIG. 133 including a dual fingerstocks and base gasket according to some embodiments of the invention.

FIG. 154 illustrates an example of the view of FIG. 133 including a dual fingerstocks and base gasket according to some embodiments of the invention.

FIG. 155 illustrates an example of the view of FIG. 133 including a single fingerstock according to some embodiments of the invention.

FIG. 156 illustrates an example of the view of FIG. 133 including a single fingerstock according to some embodiments of the invention.

Figures 157A, 157B, 157C:
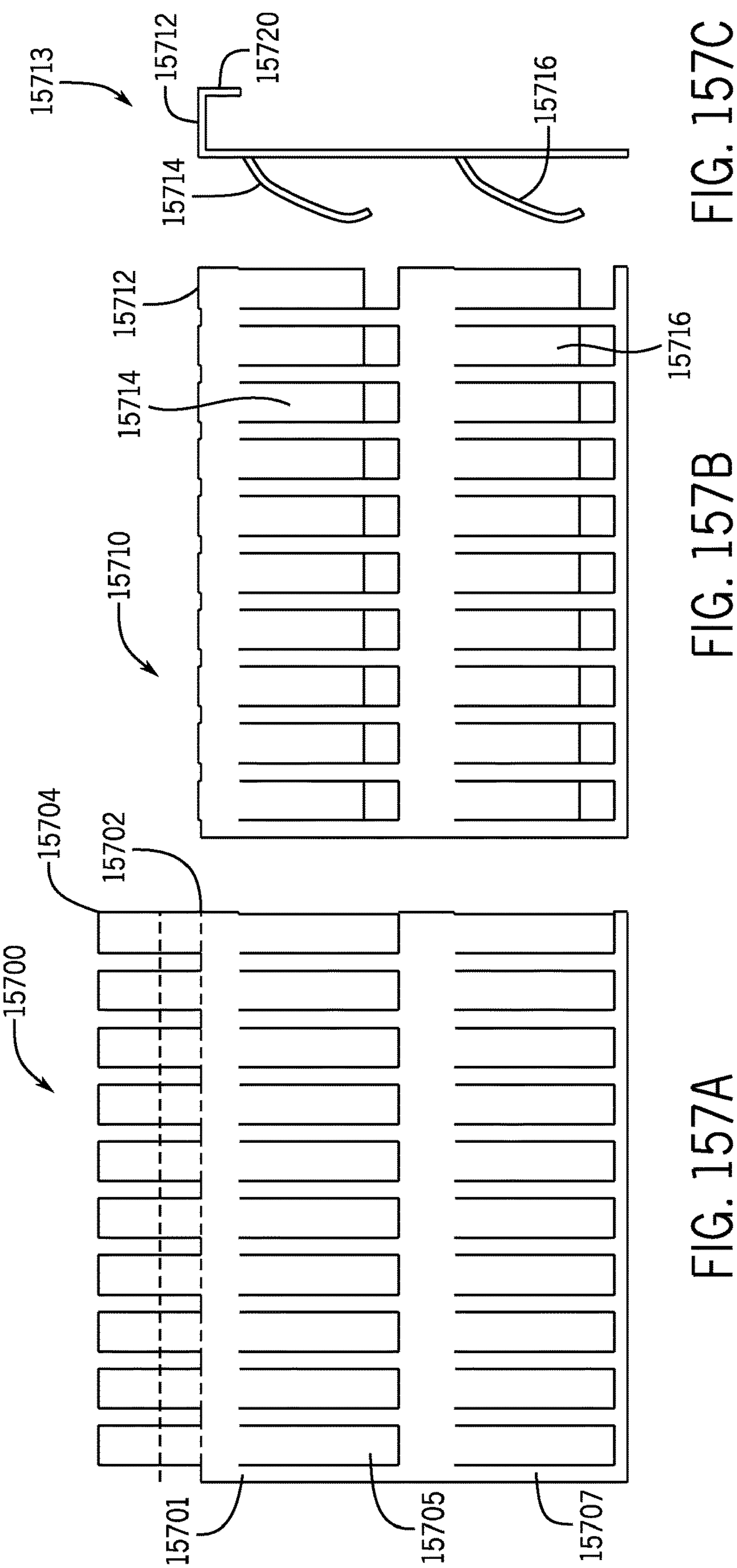

FIGS. 157A-157C illustrate custom fingerstocks according to some embodiments of the invention.

Figure 158C:
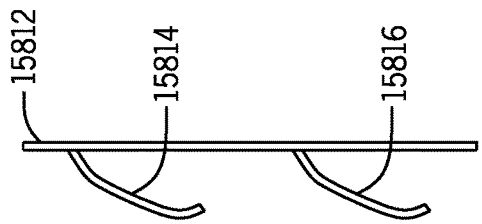
Figure 158B:
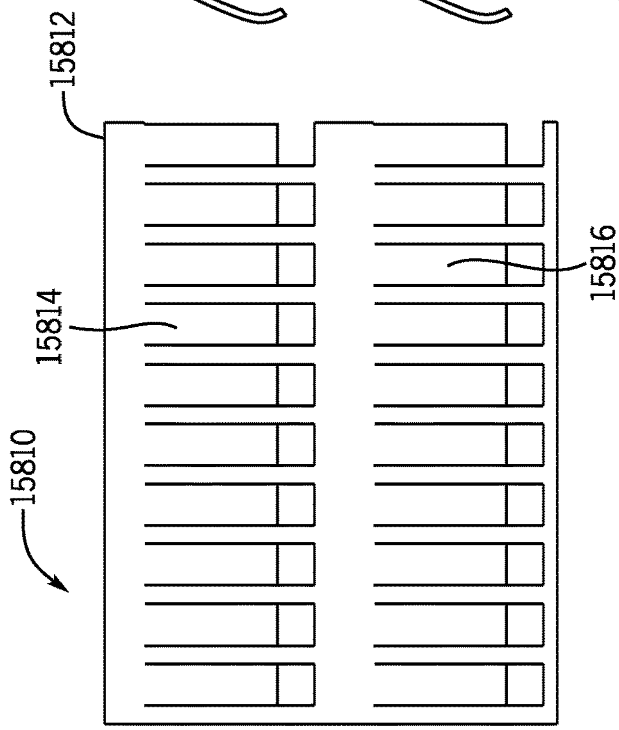
Figure 158A:
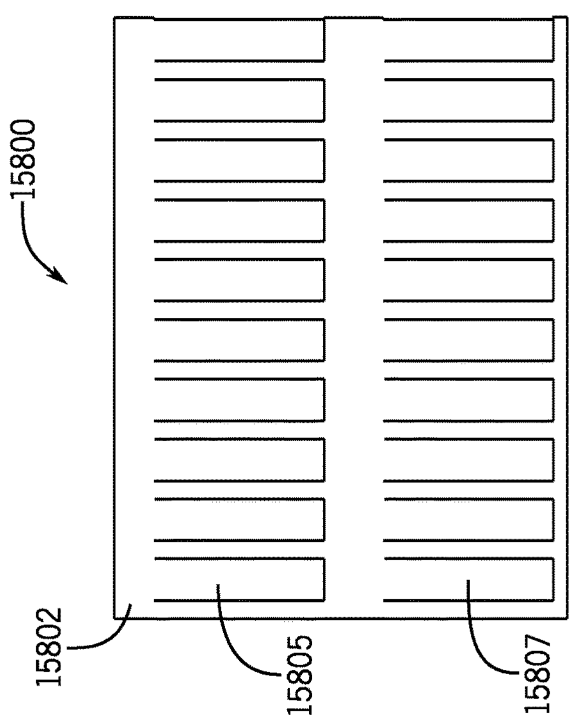

FIGS. 158A-158C illustrate custom fingerstocks according to some embodiments of the invention.

Figure 159C:
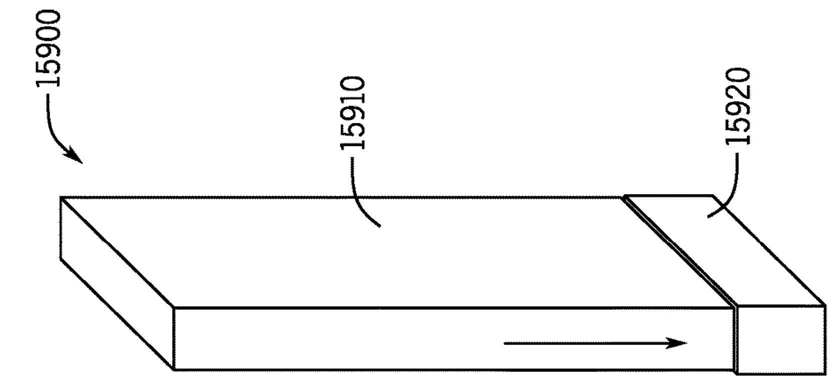
Figure 159B:
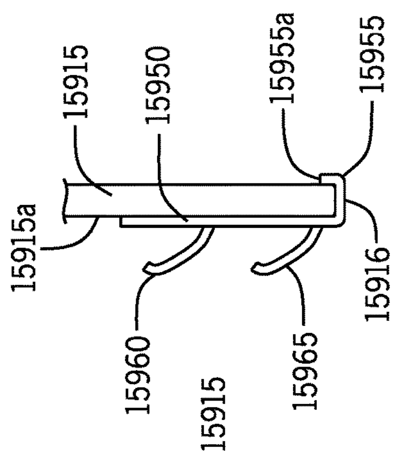
Figure 159A:
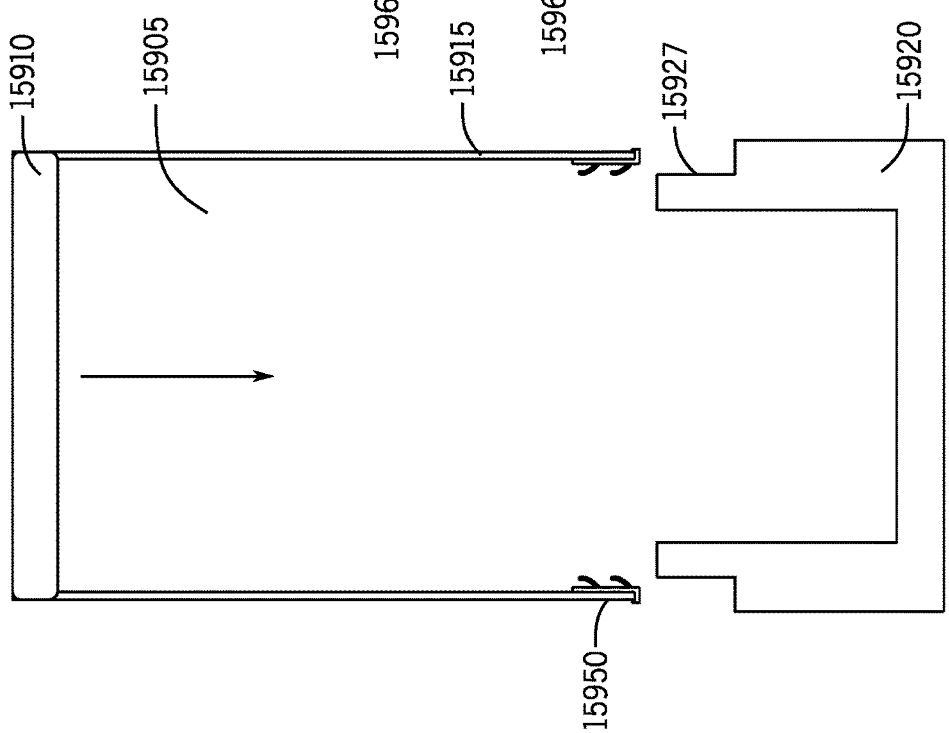

FIGS. 159A-159C illustrates custom fingerstocks integrated with a privacy/security enclosure according to some embodiments of the invention.

Figure 160:
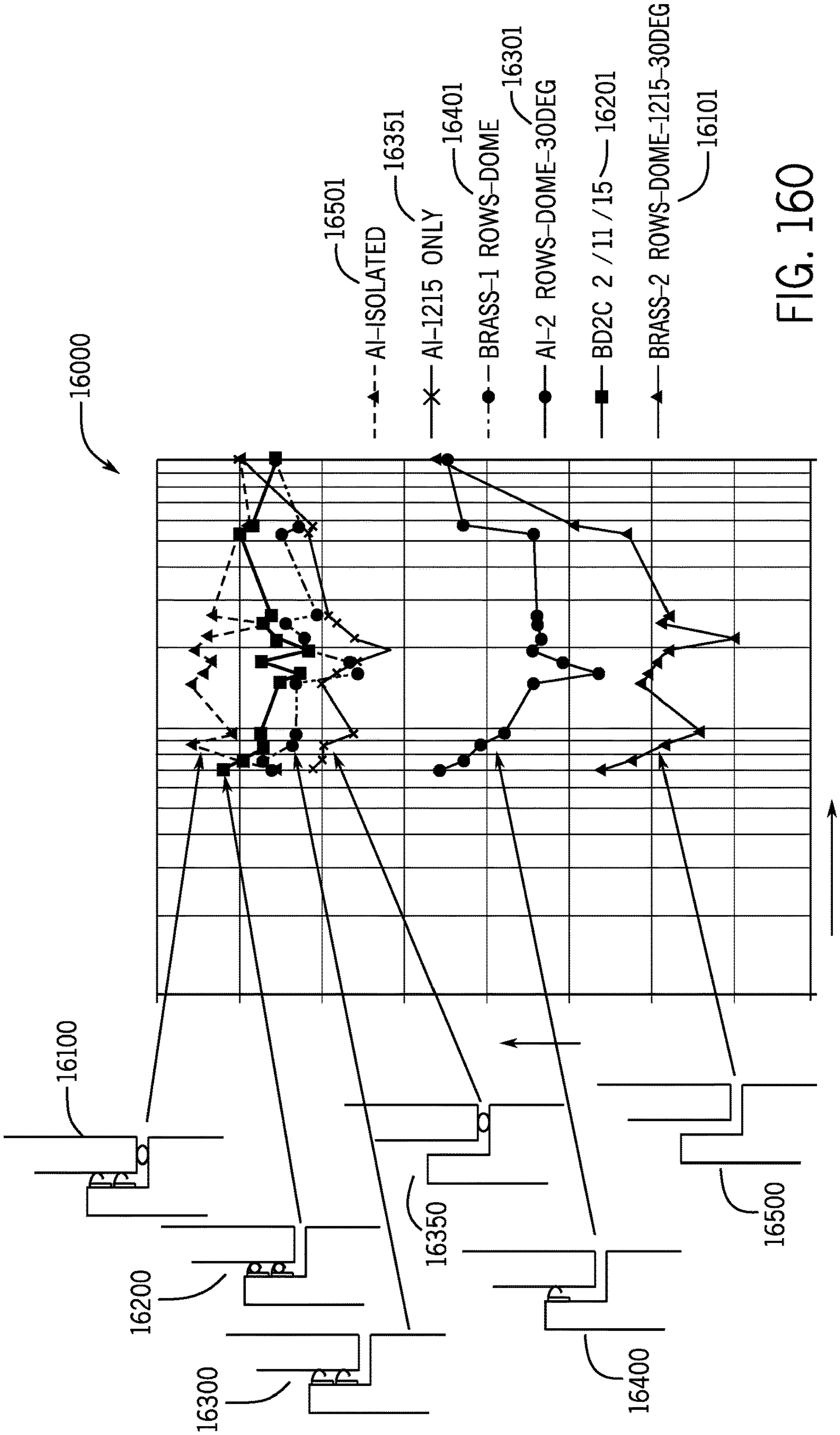

FIG. 160 illustrates RF attenuation behavior of various embodiments of the invention.

Figures 161A, 161B, 161C:
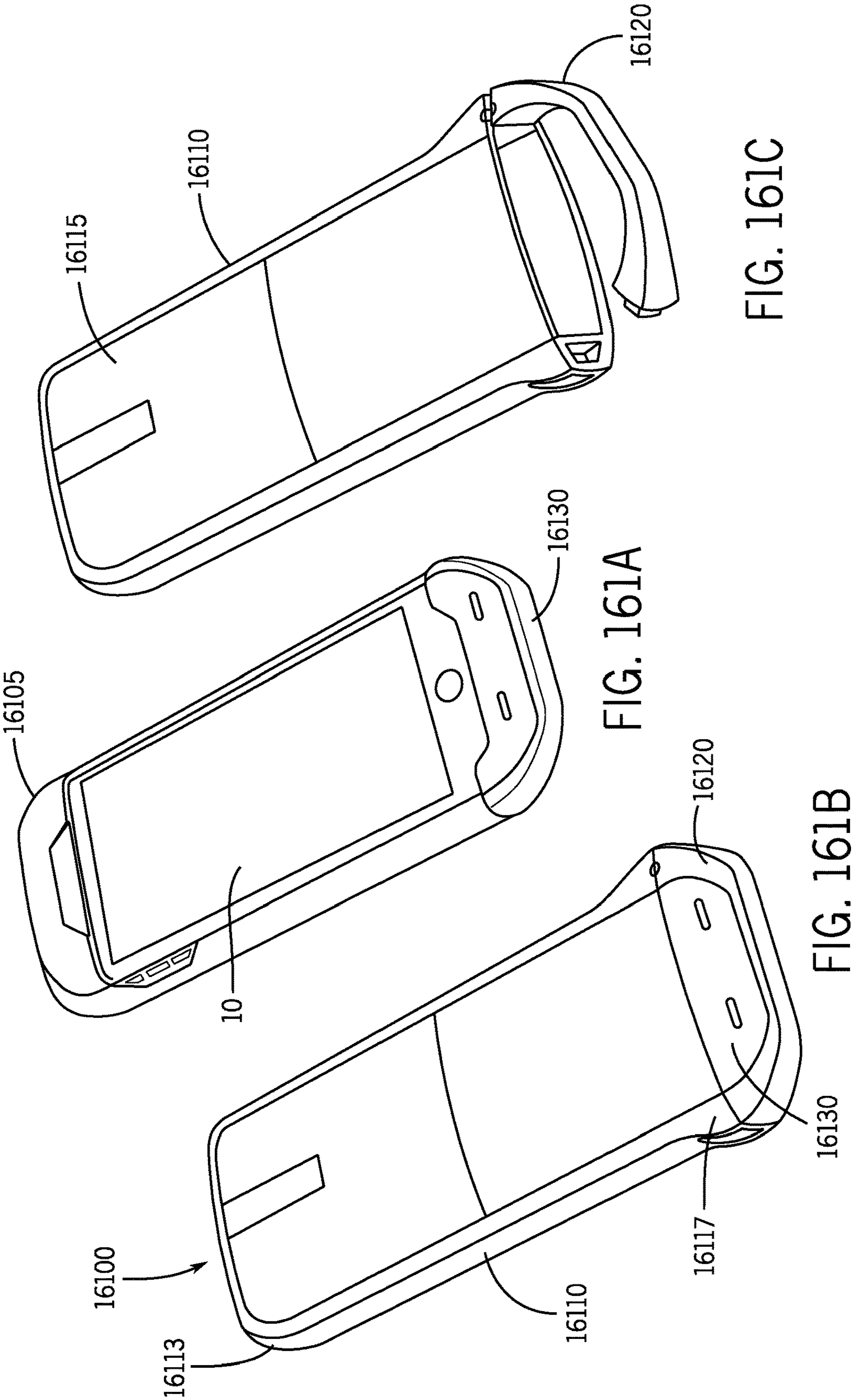

FIGS. 161A-161C illustrate perspective views of various embodiments of a privacy/security enclosure.

Figures 162A, 162B, 162C:
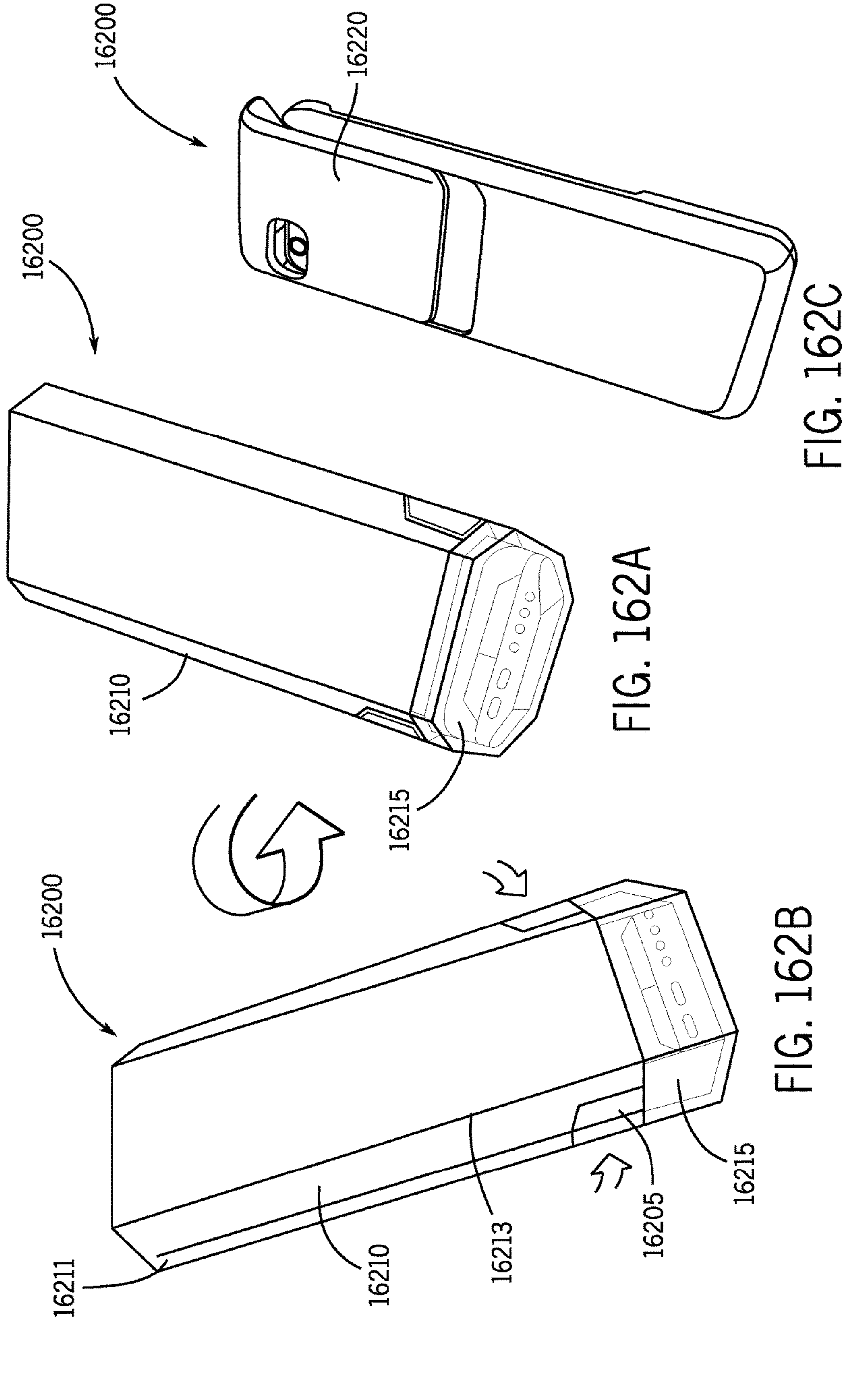

FIGS. 162A-162C illustrate perspective views of various embodiments of a privacy/security enclosure.

Figures 163A, 163B, 163C:
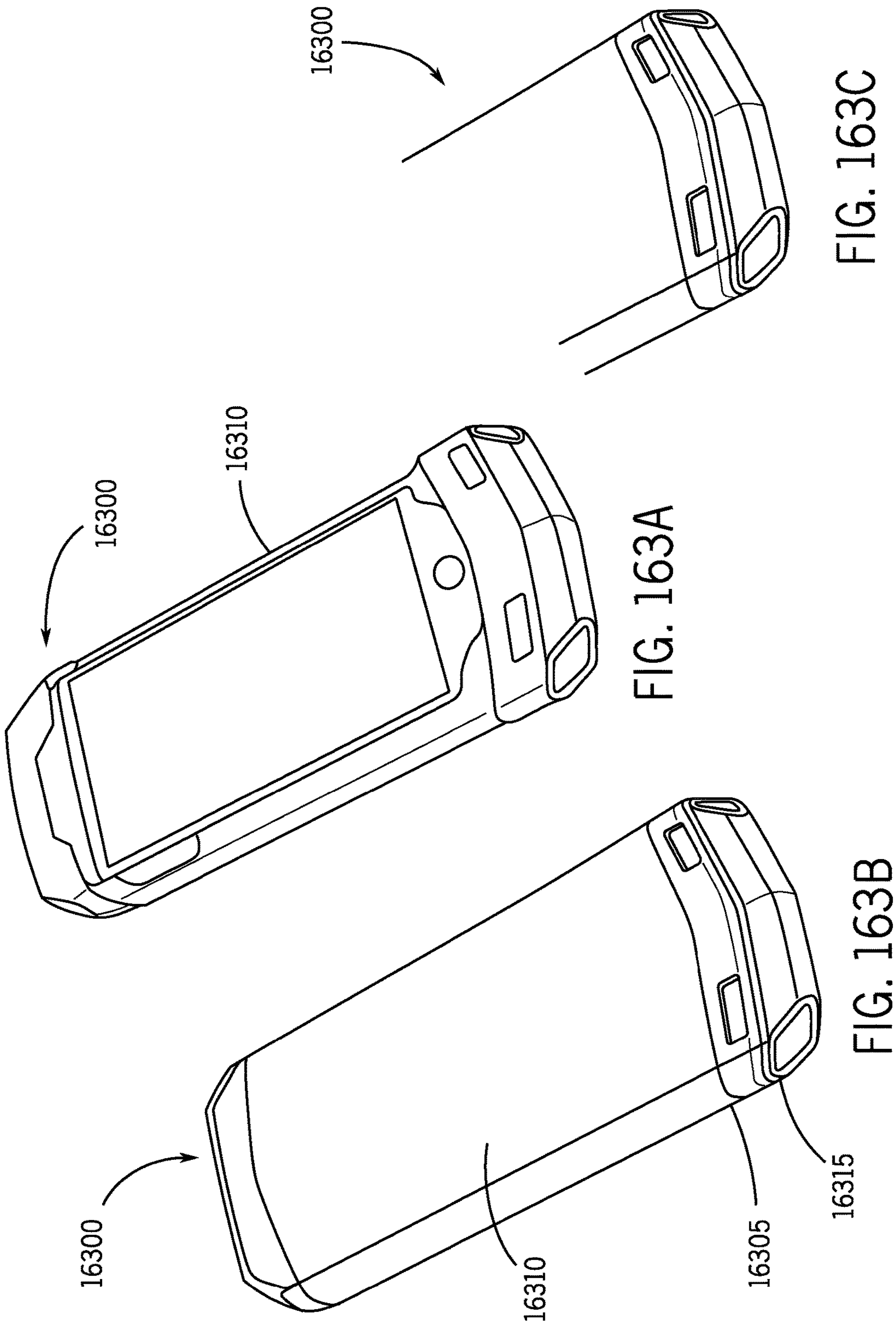

FIGS. 163A-163C illustrate perspective views of various embodiments of a privacy/security enclosure.

Figure 164C:
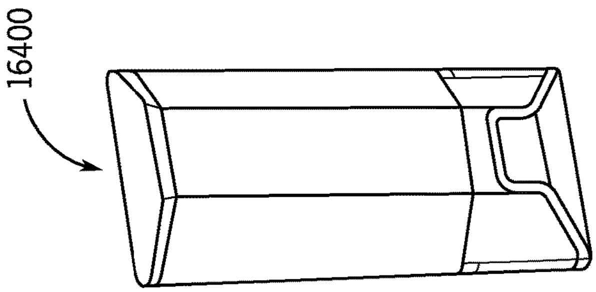
Figure 164A:
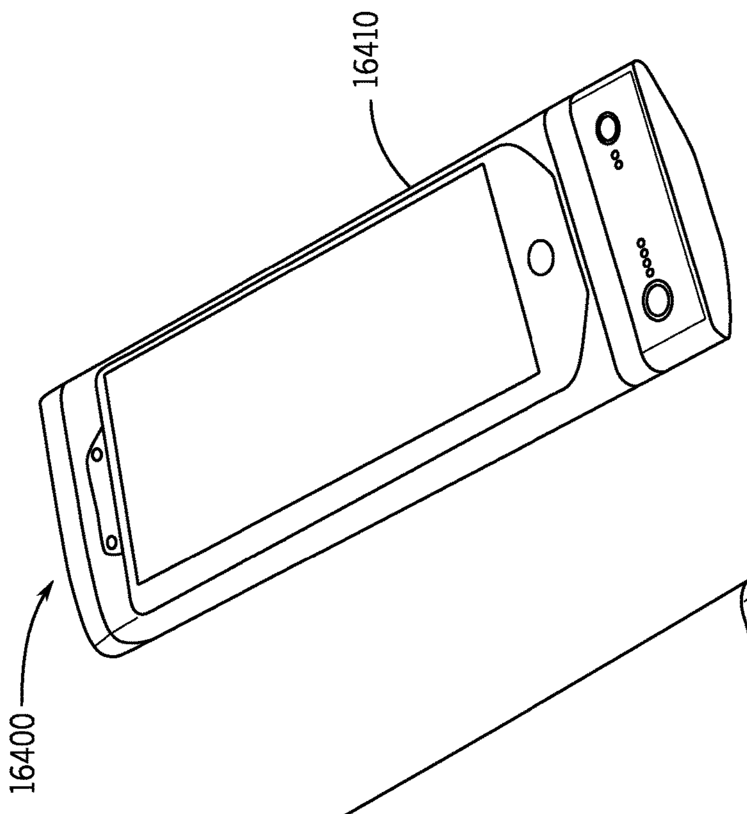
Figure 164B:
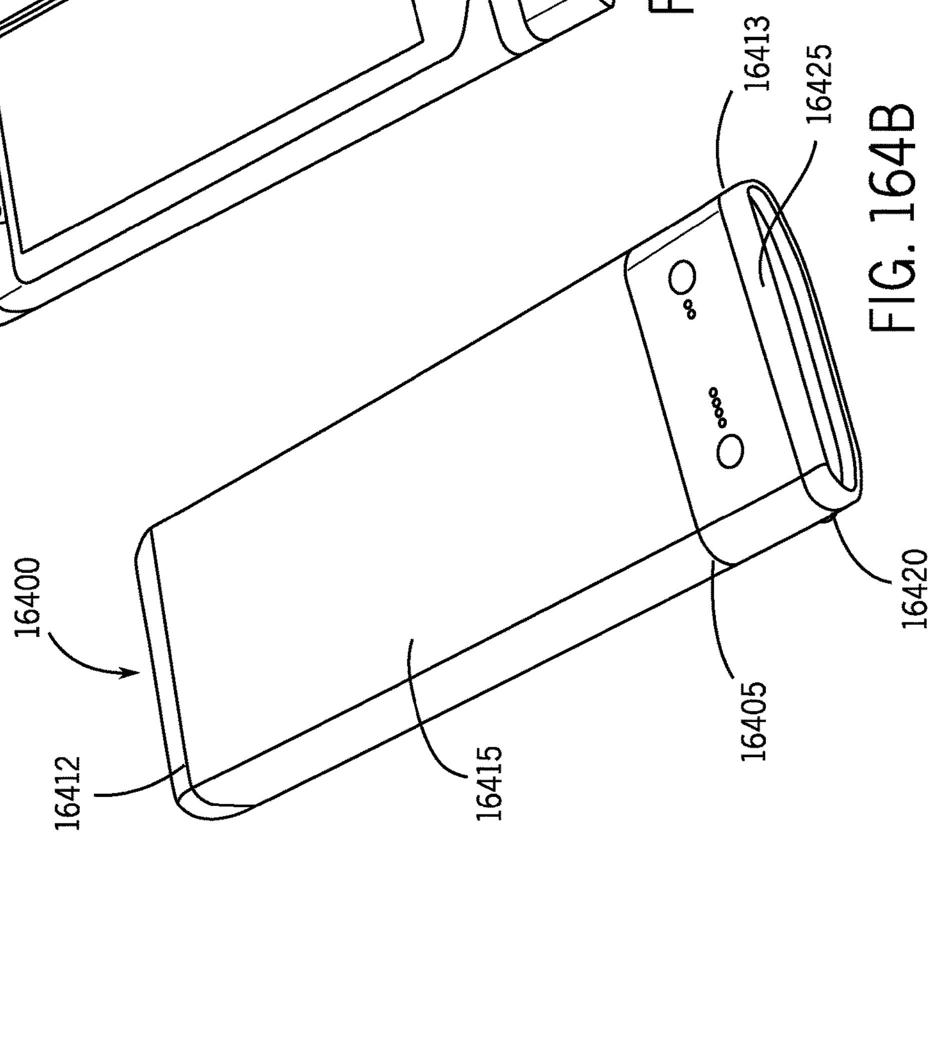

FIGS. 164A-164C illustrate perspective views of various embodiments of a privacy/security enclosure.

Figure 165C:
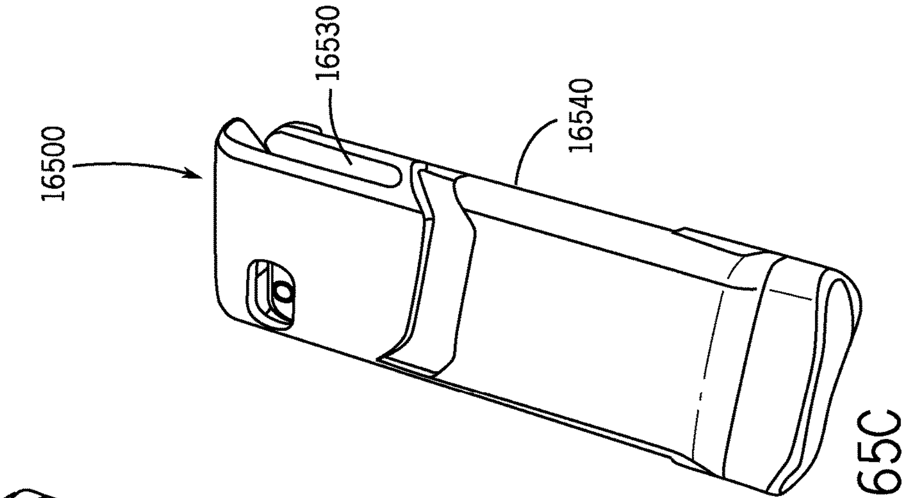
Figure 165A:
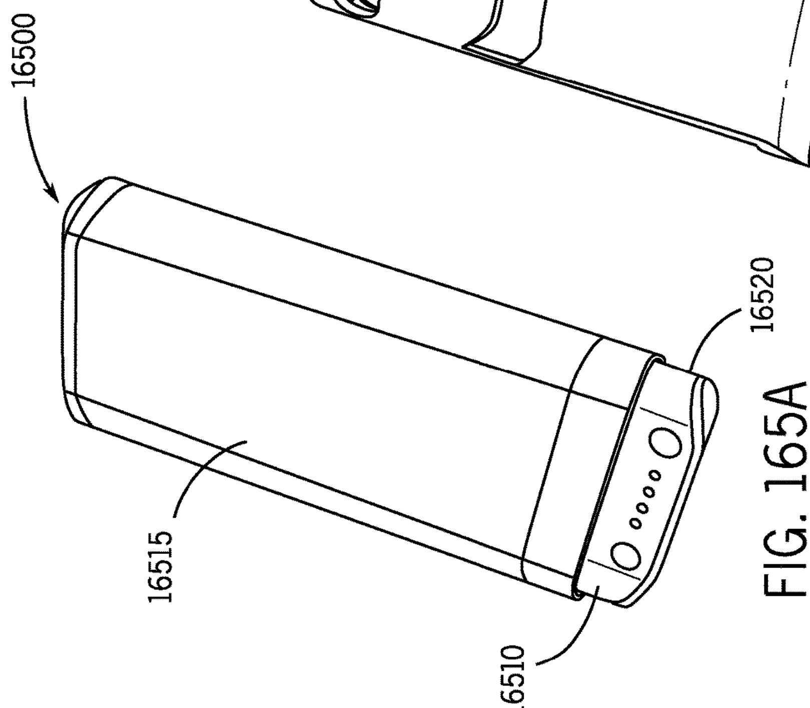
Figure 165B:
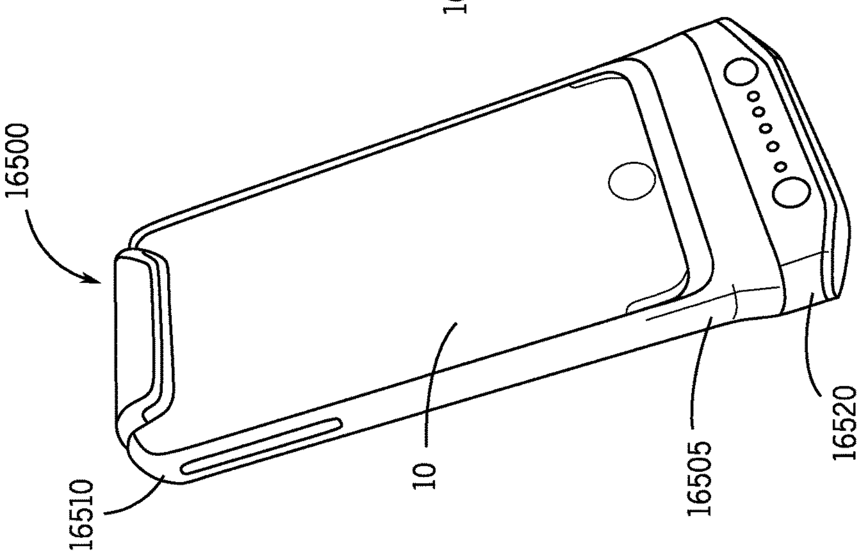

FIGS. 165A-165C illustrate perspective views of various embodiments of a privacy/security enclosure.

Figure 166C:
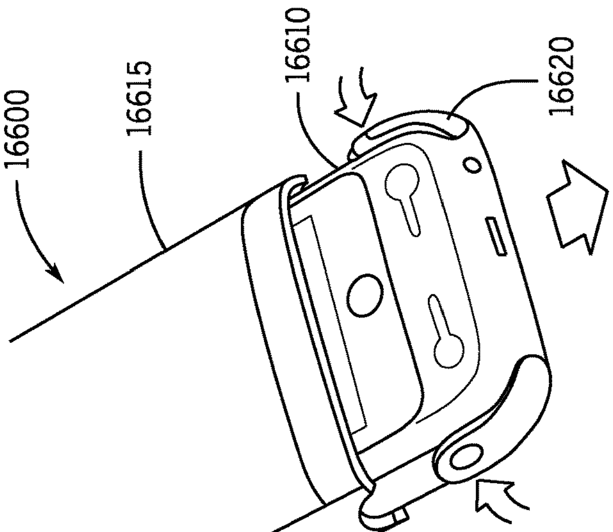
Figure 166A:
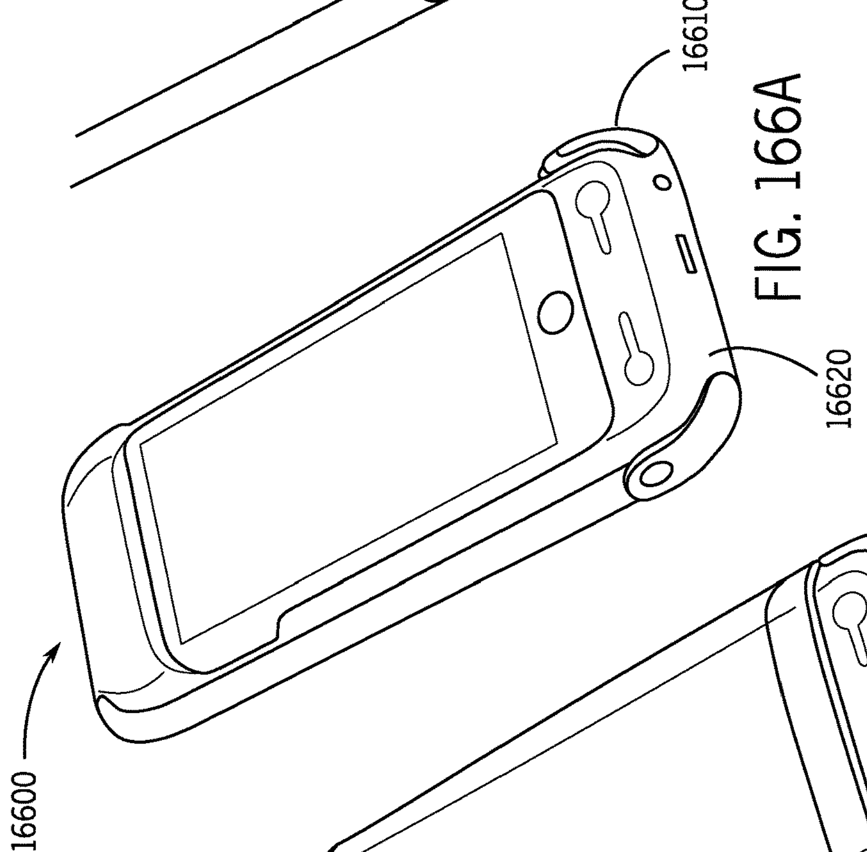
Figure 166B:
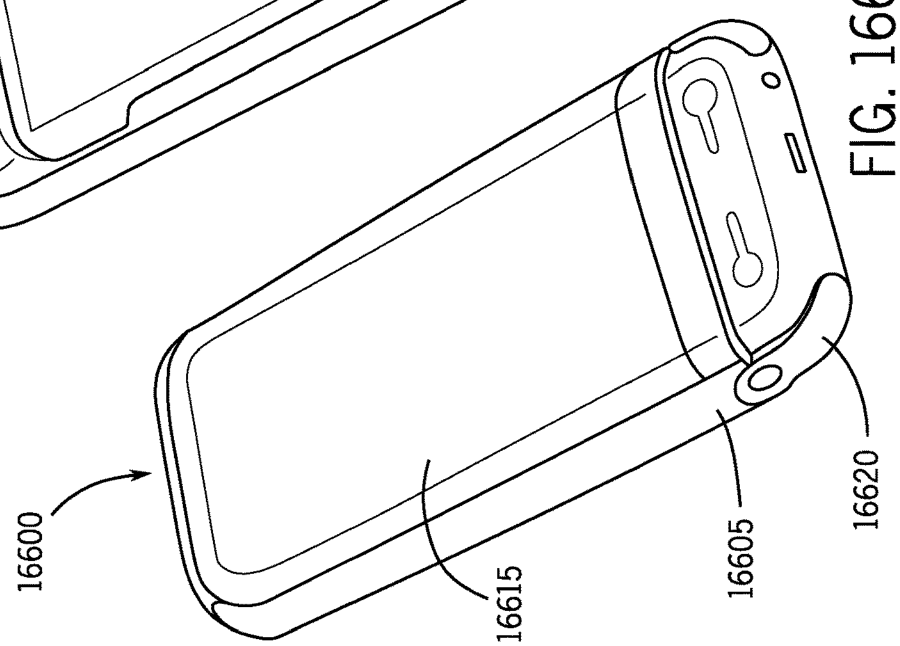

FIGS. 166A-166C illustrate perspective views of various embodiments of a privacy/security enclosure.

Figure 167C:
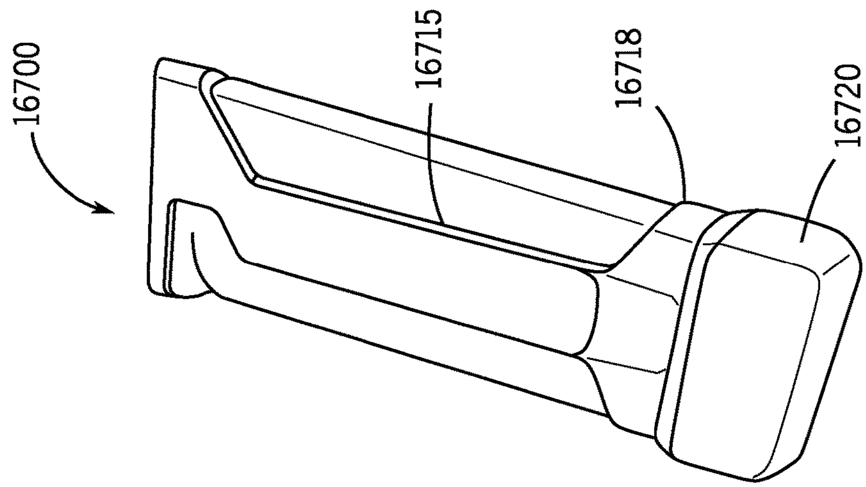
Figure 167A:
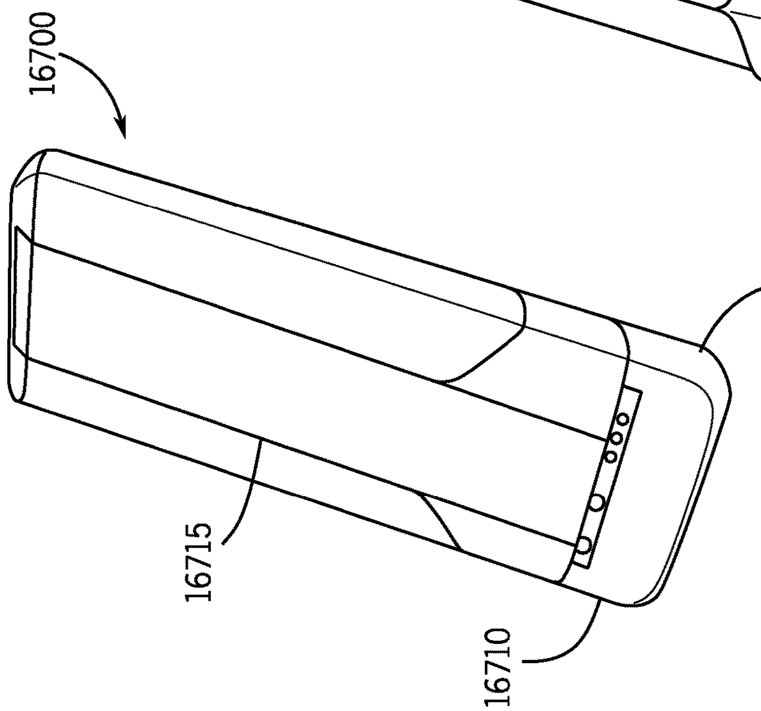
Figure 167B:
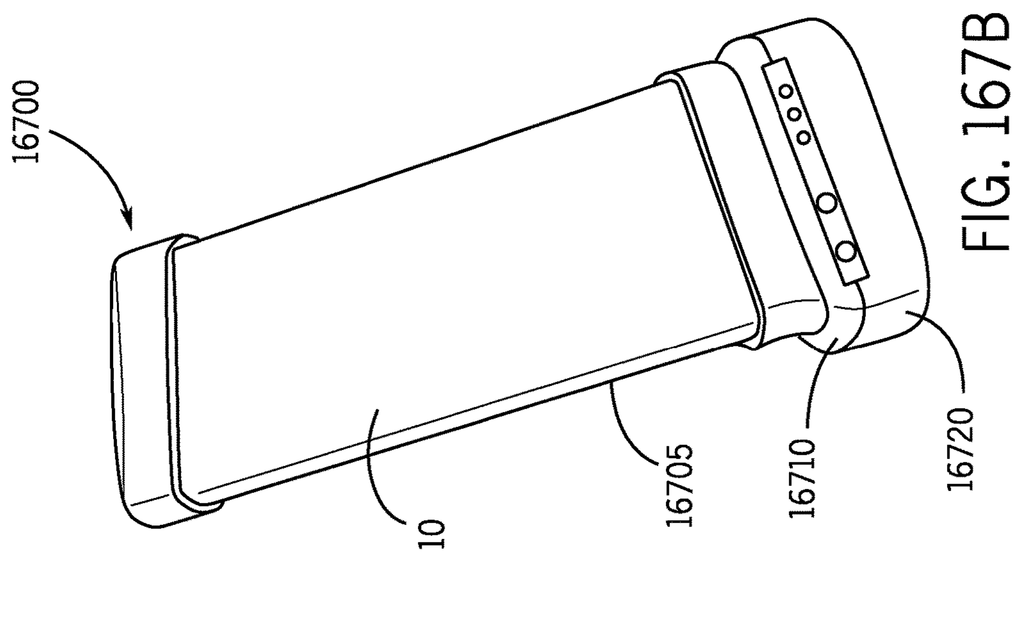

FIGS. 167A-167C illustrate perspective views of various embodiments of a privacy/security enclosure.

Figure 168C:
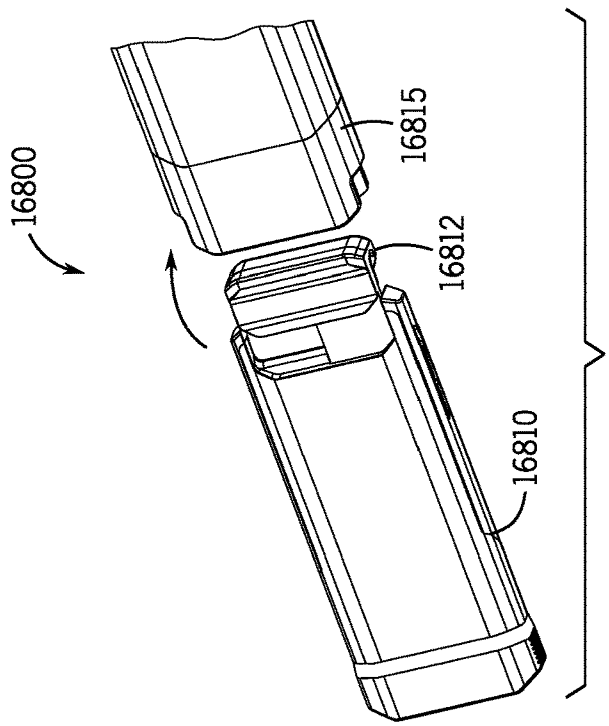
Figure 168B:
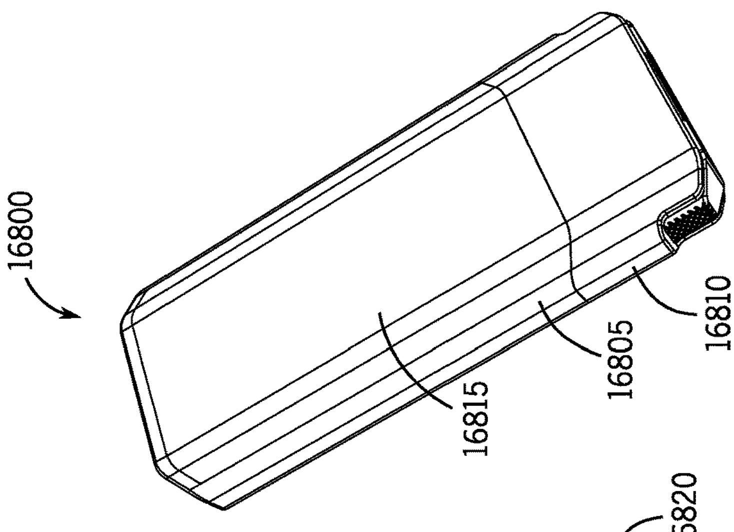
Figure 168A:
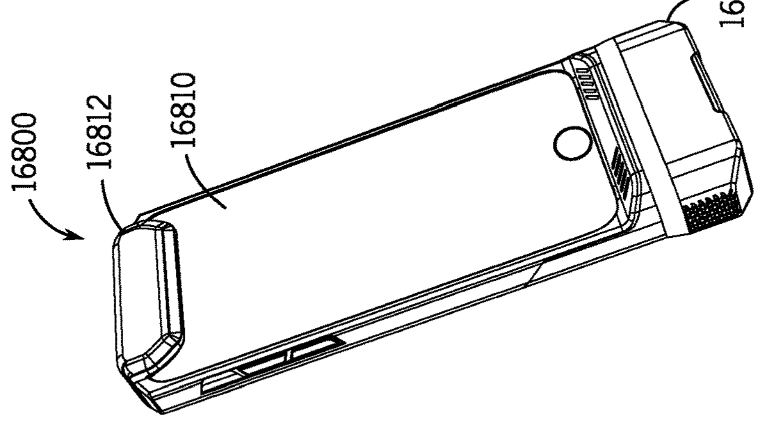

FIGS. 168A-168C illustrate perspective views of various embodiments of a privacy/security enclosure.

Figure 169B:
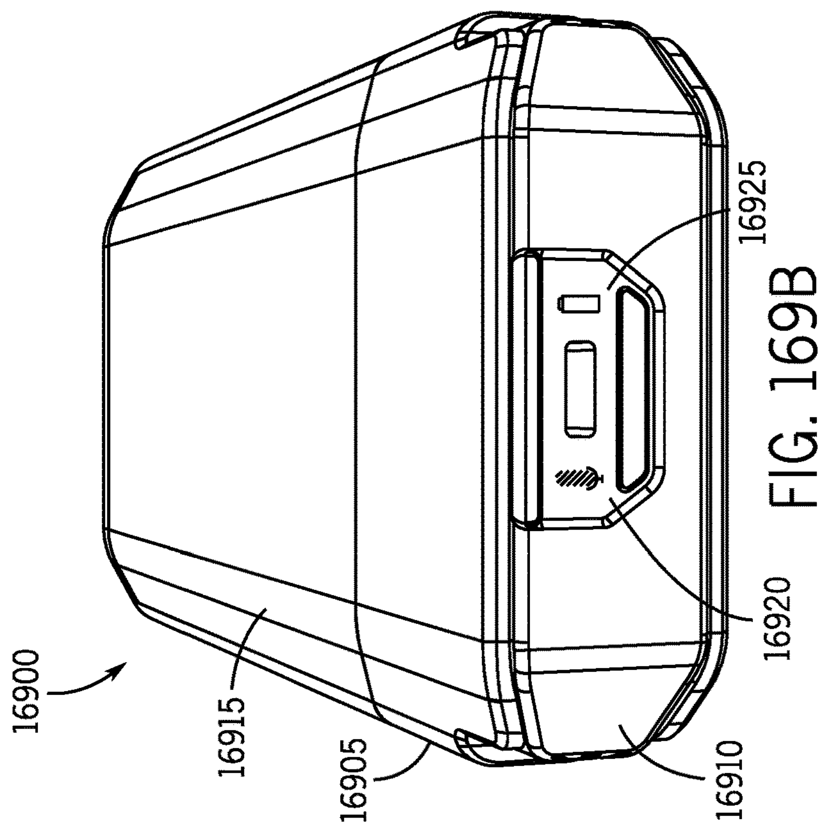
Figure 169A:
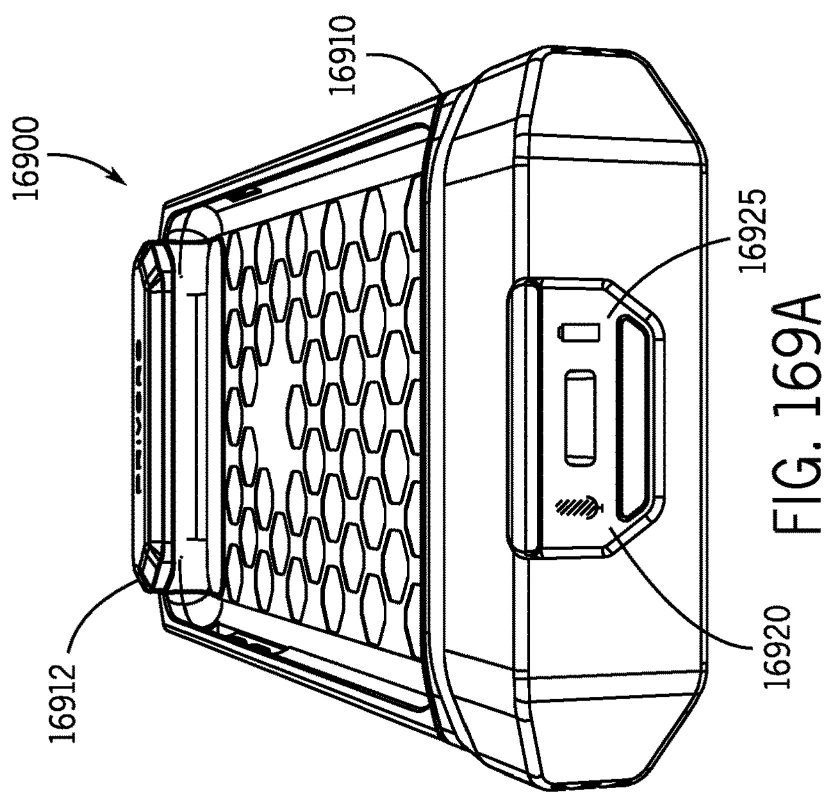

FIGS. 169A-169B illustrate perspective views of various embodiments of a privacy/security enclosure.

Figure 170B:
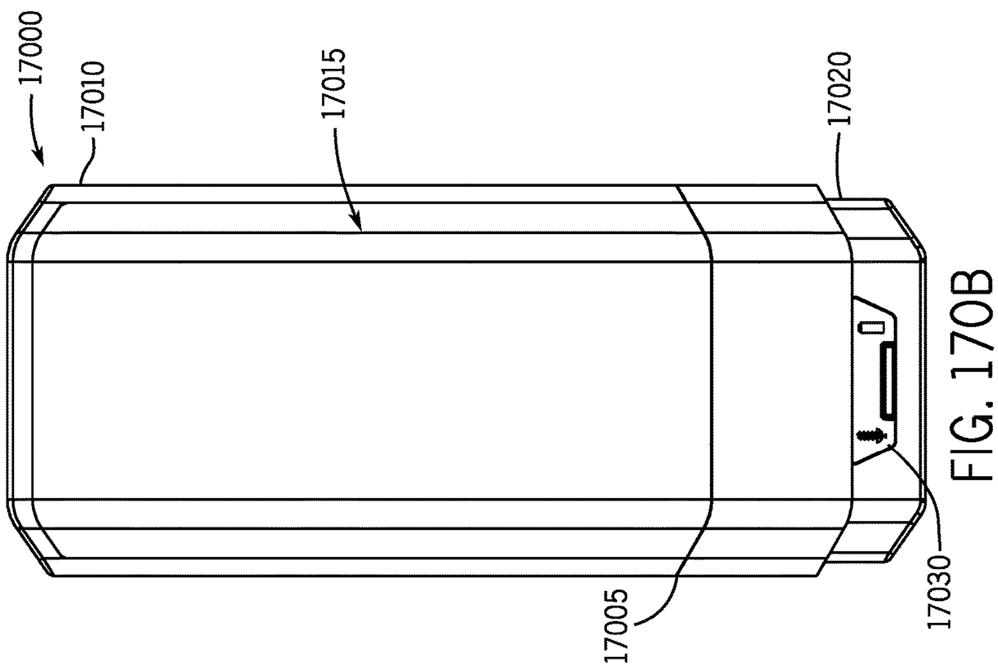
Figure 170A:
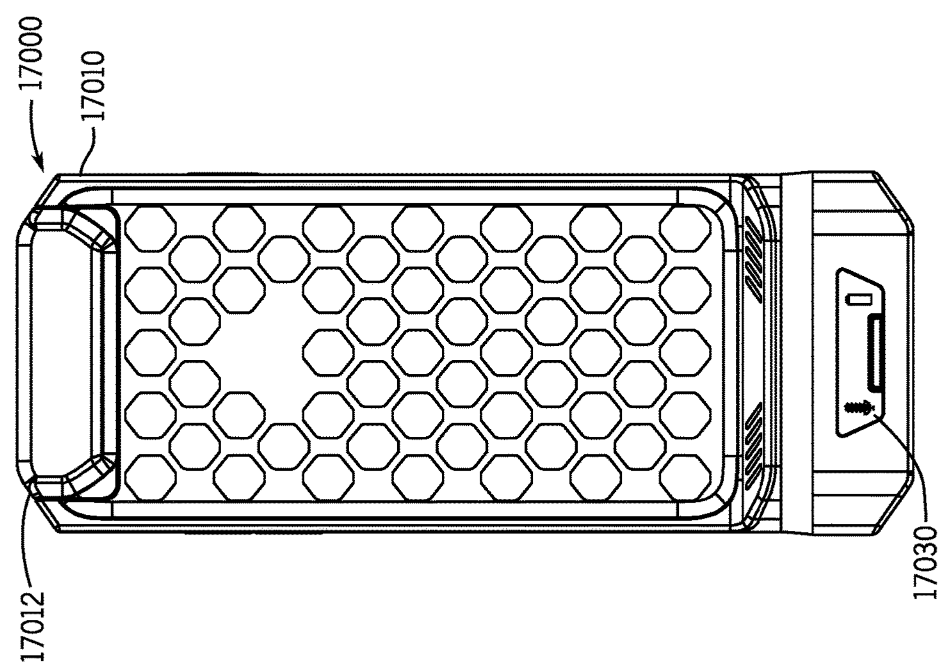

FIGS. 170A-170B illustrate perspective views of various embodiments of a privacy/security enclosure.

Figure 171B:
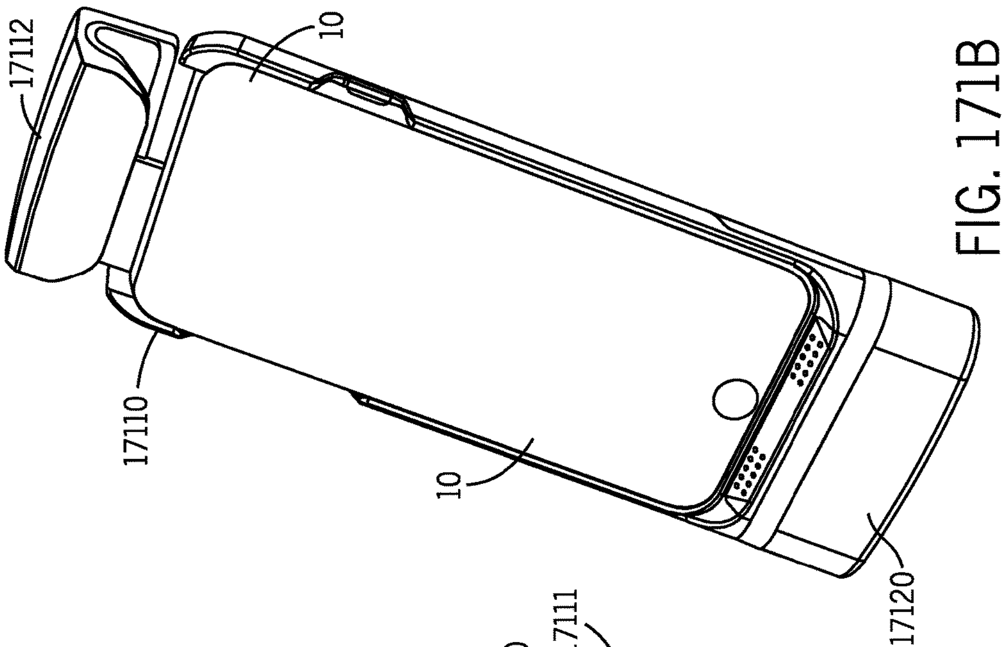
Figure 171A:
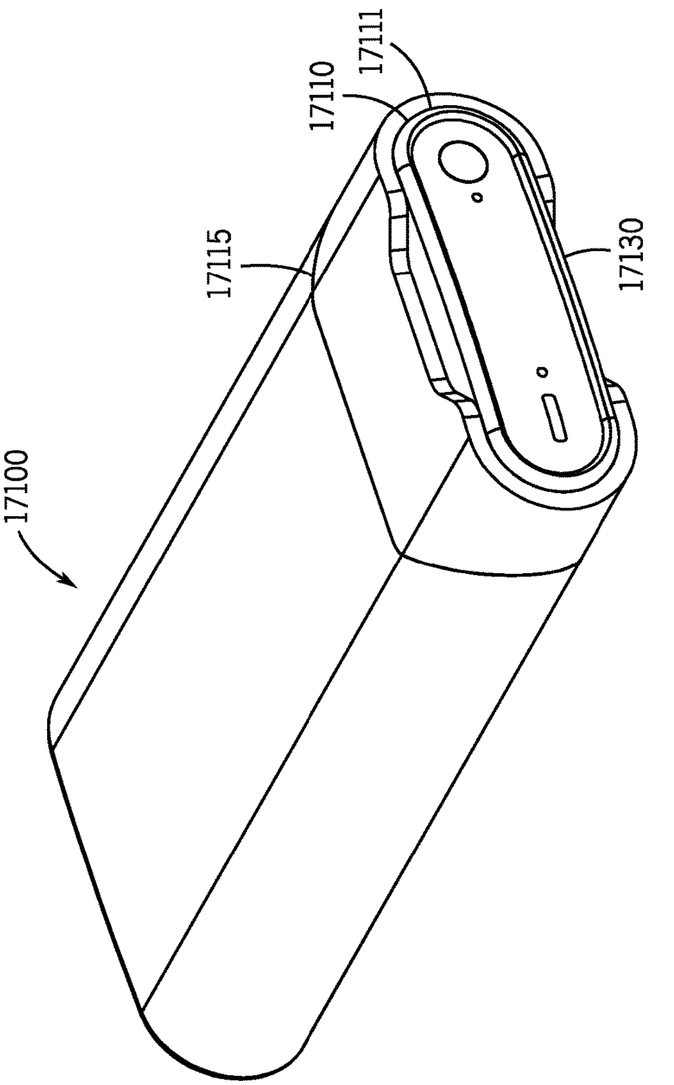

FIGS. 171A-171B illustrate perspective views of various embodiments of a privacy/security enclosure.

Figure 171D:
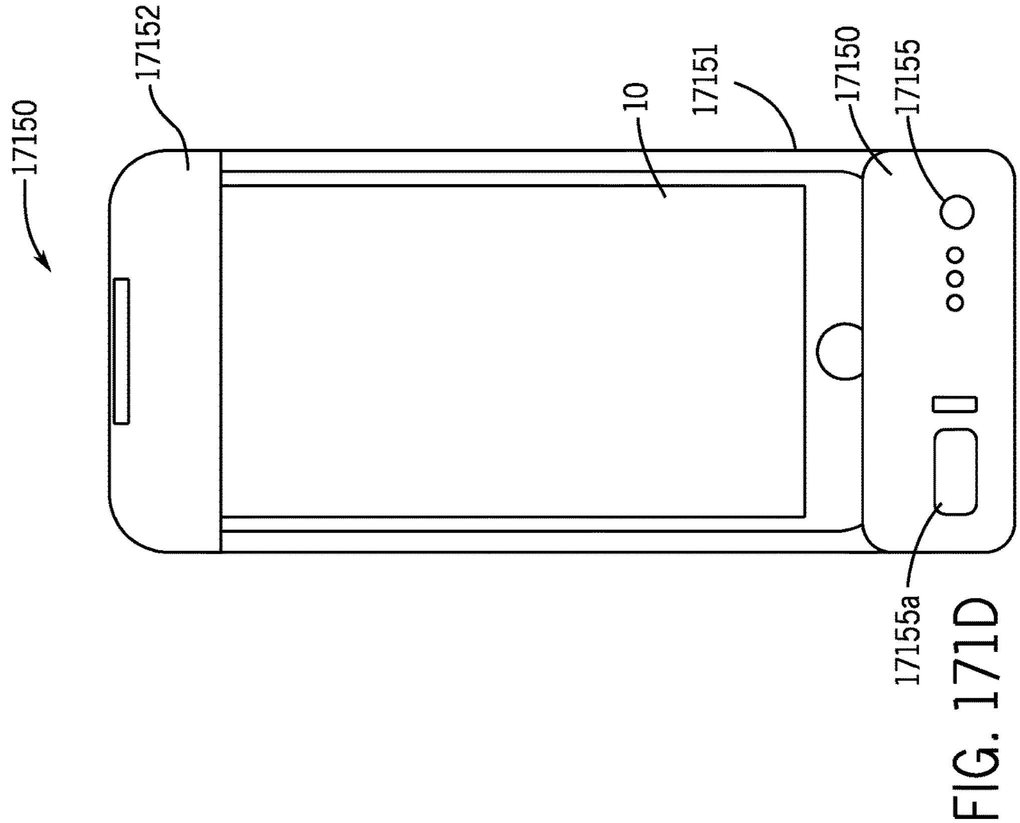
Figure 171C:
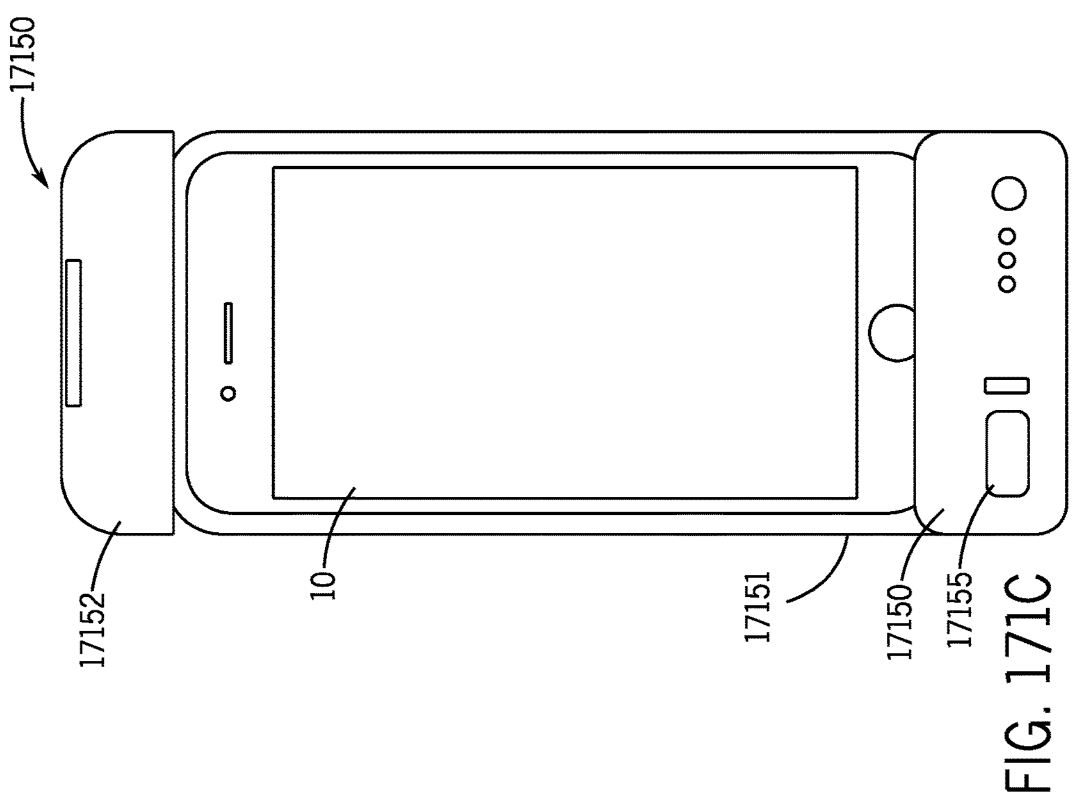

FIGS. 171C-171D illustrate user interfaces and uses of user interfaces of a privacy/security enclosure according to some embodiments of the invention.

FIGS. 172A-172C, and 173-187 illustrate detailed perspective views of various embodiments of a privacy/security enclosure according to some embodiments of the invention.

FIGS. 188-189, and 190A-190D illustrates icon displays of a privacy/security enclosure in accordance with some embodiments of the invention.

FIGS. 191A-191F illustrates an overview of a privacy/security enclosure in accordance with some embodiments of the invention.

Figure 192:
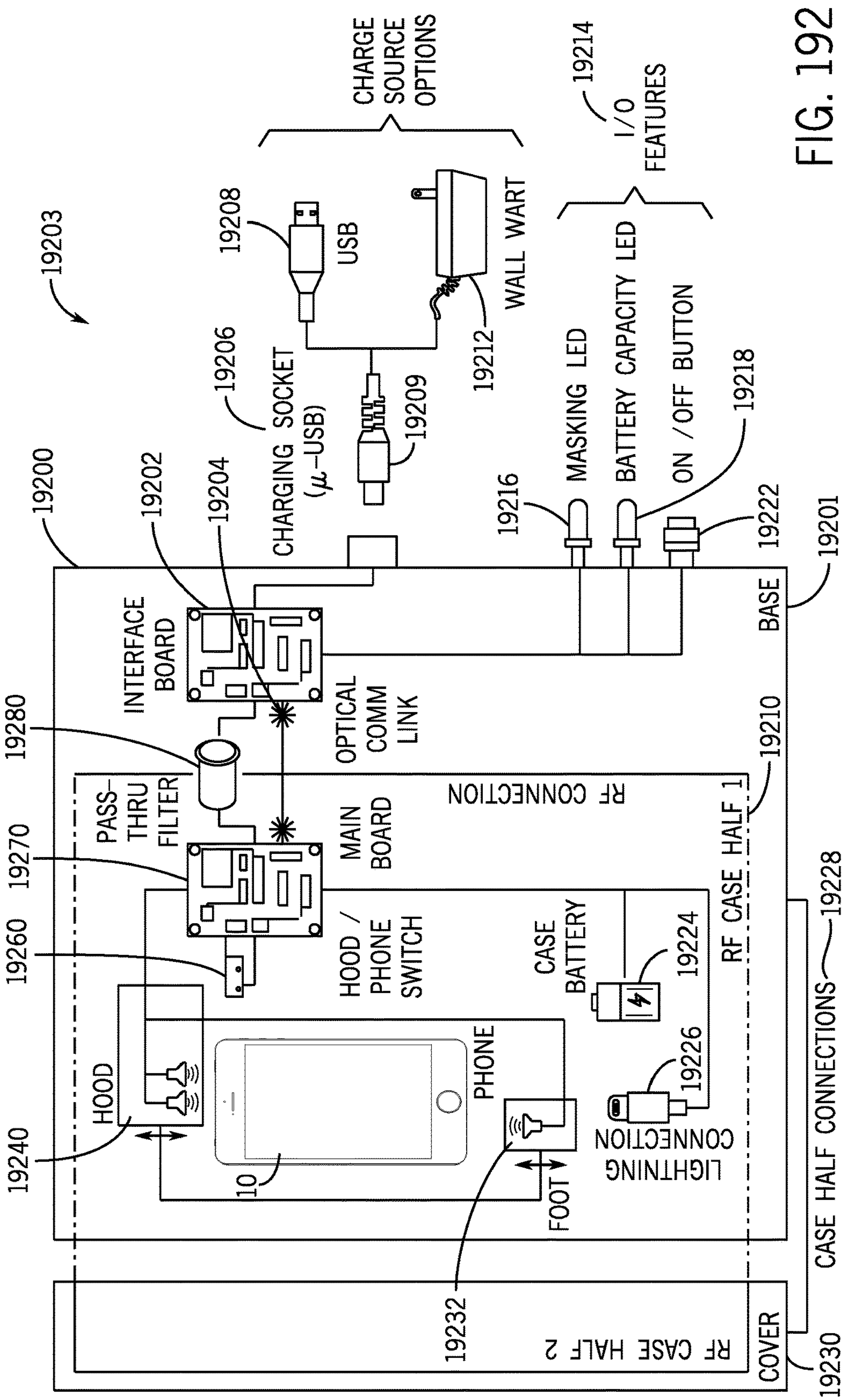

FIG. 192 illustrates a circuit system layout of a privacy/security enclosure in accordance with some embodiments of the invention.

Figure 193:
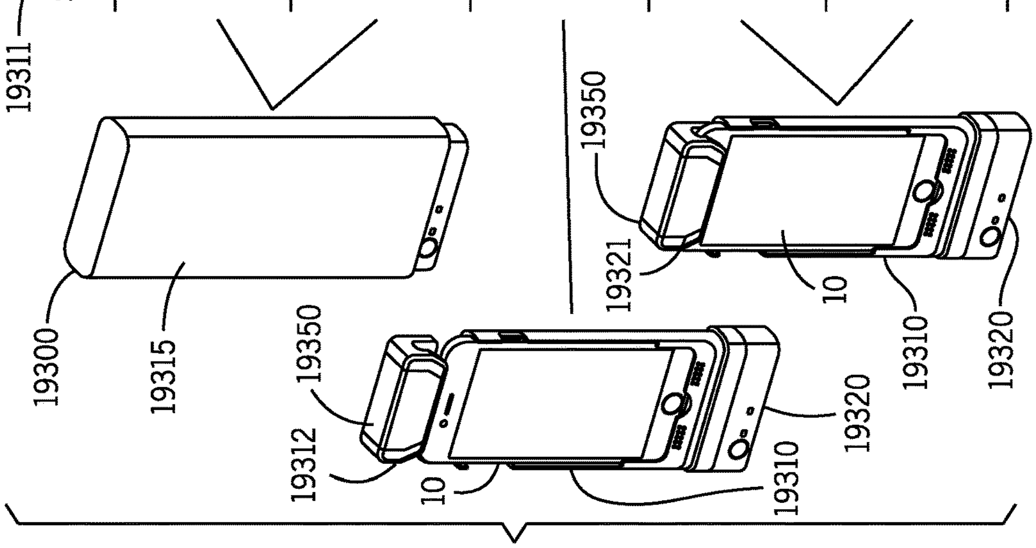

FIG. 193 illustrates an operational state diagram of a privacy/security enclosure in accordance with some embodiments of the invention.

Figure 194:
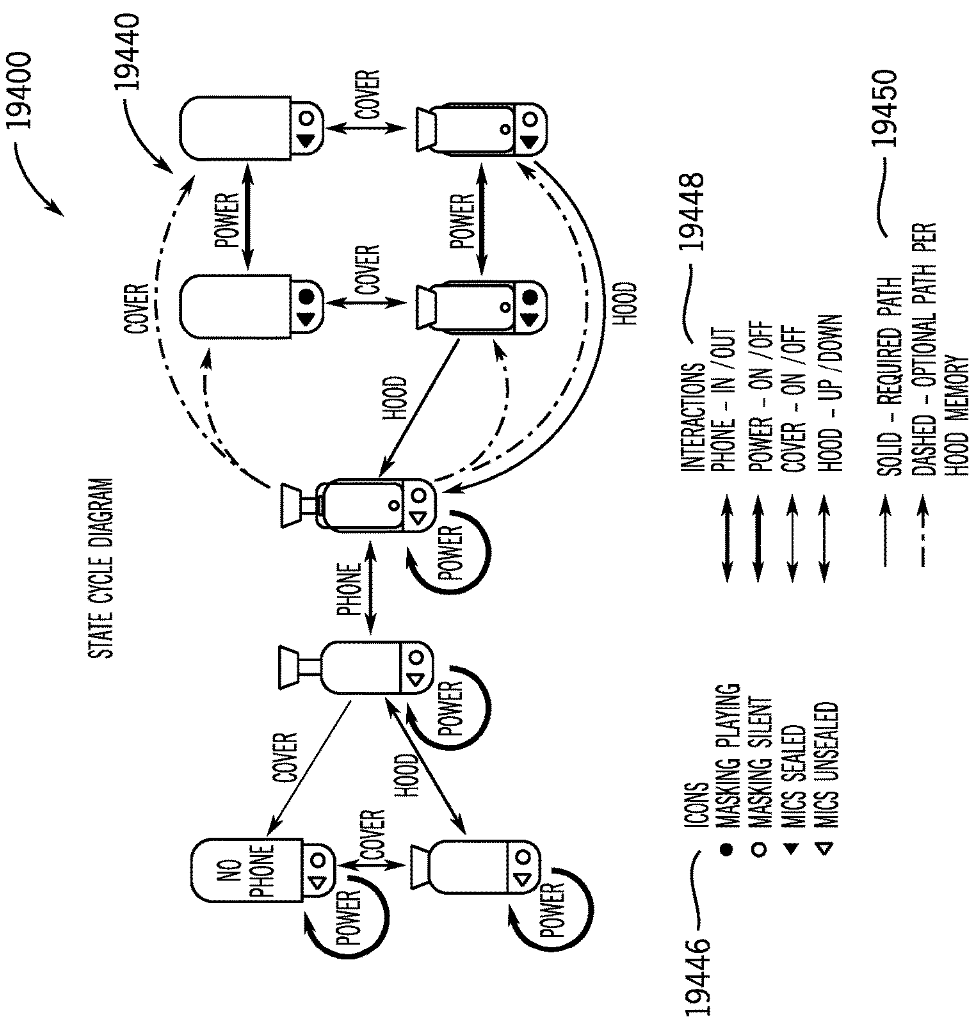

FIG. 194 illustrates a state cycle diagram of a privacy/security enclosure in accordance with some embodiments of the invention.

Figure 195B:
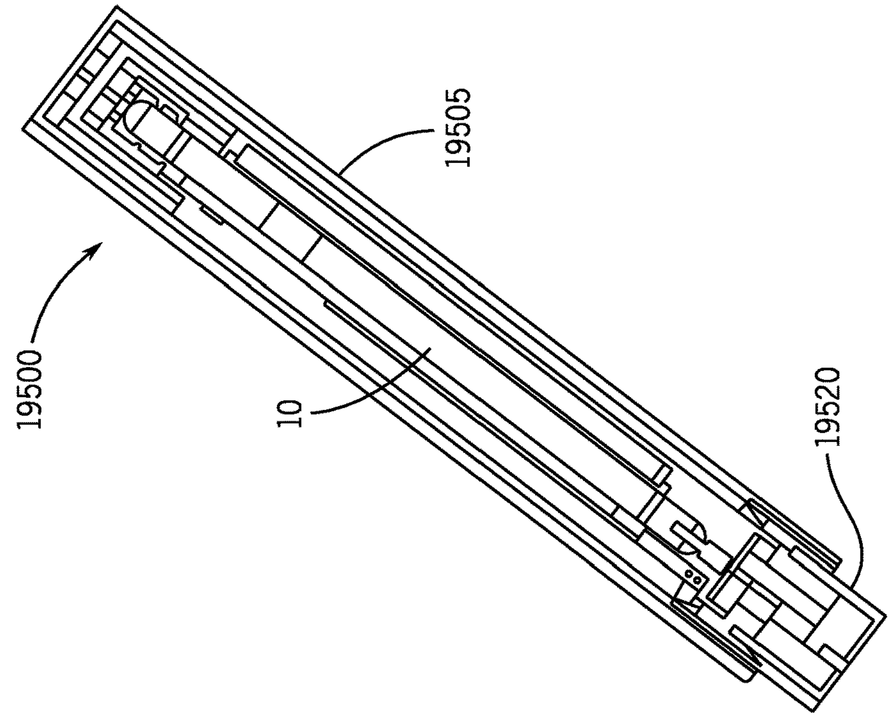
Figure 195A:
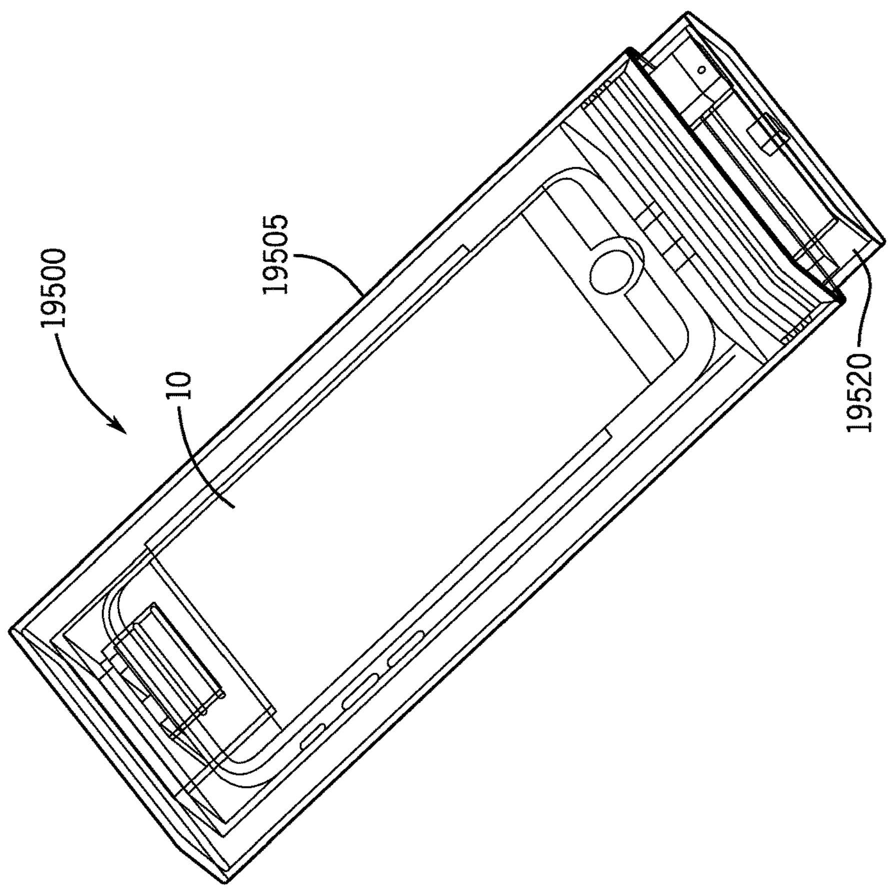

FIGS. 195A-195B illustrates partial interior perspective views of a privacy/security enclosure in accordance with some embodiments of the invention.

Figure 196:
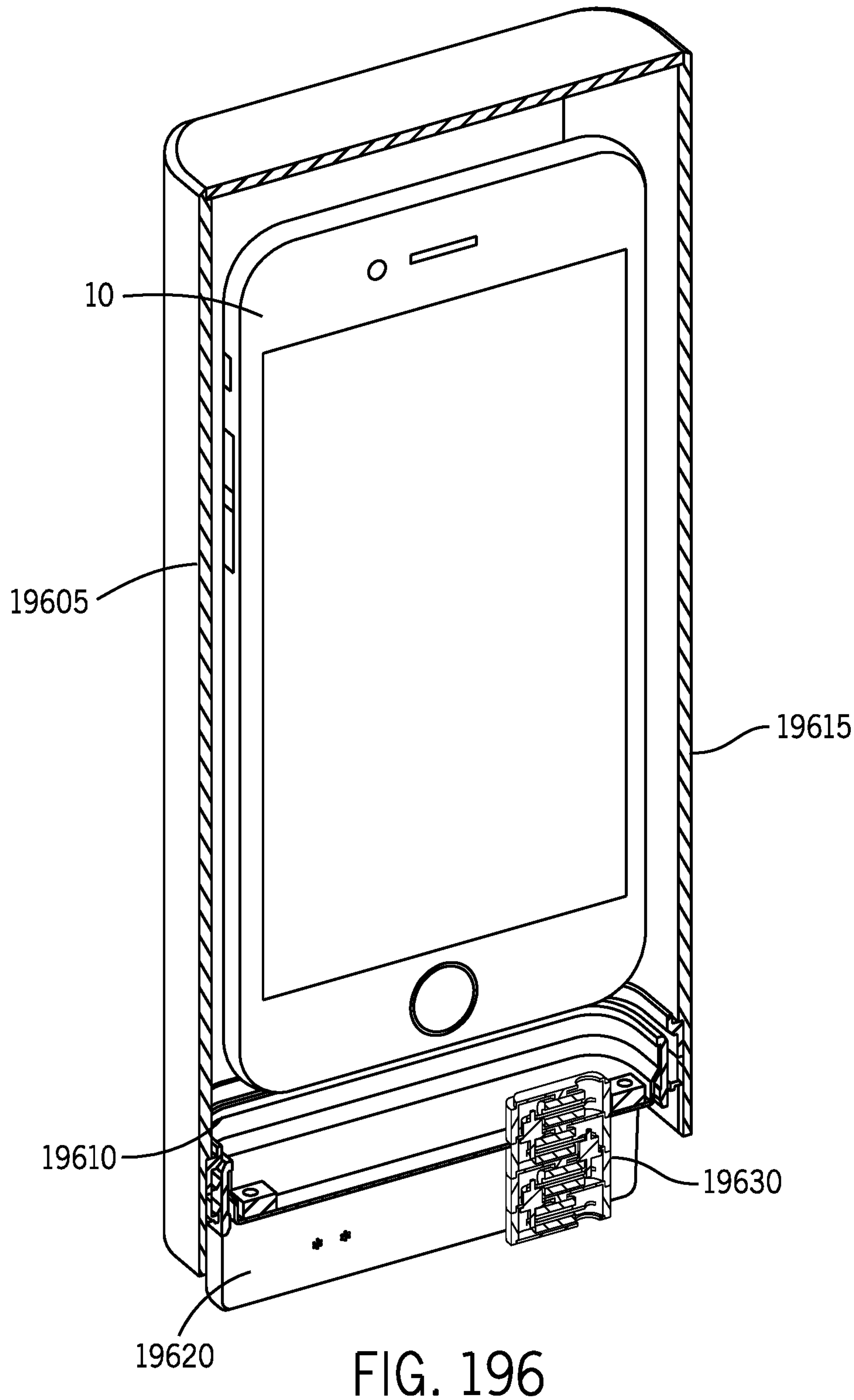

FIG. 196 illustrates a partial cut-away view of a privacy/security enclosure in accordance with some embodiments of the invention.

Figure 197B:
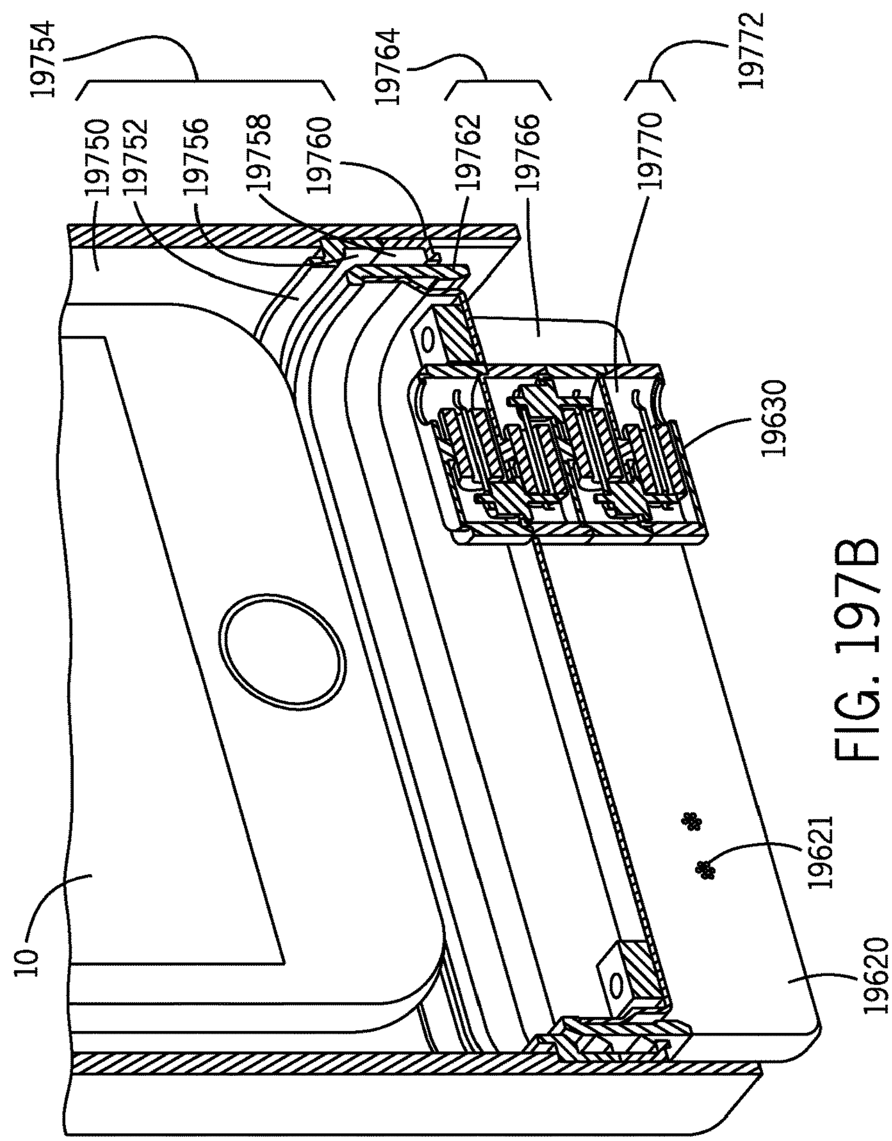
Figure 197A:
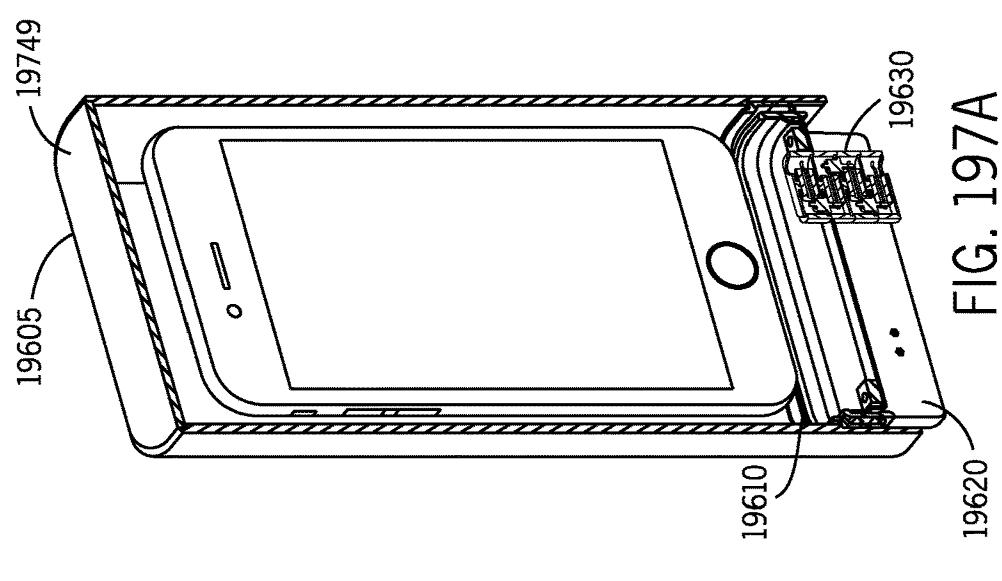
Figure 198C:
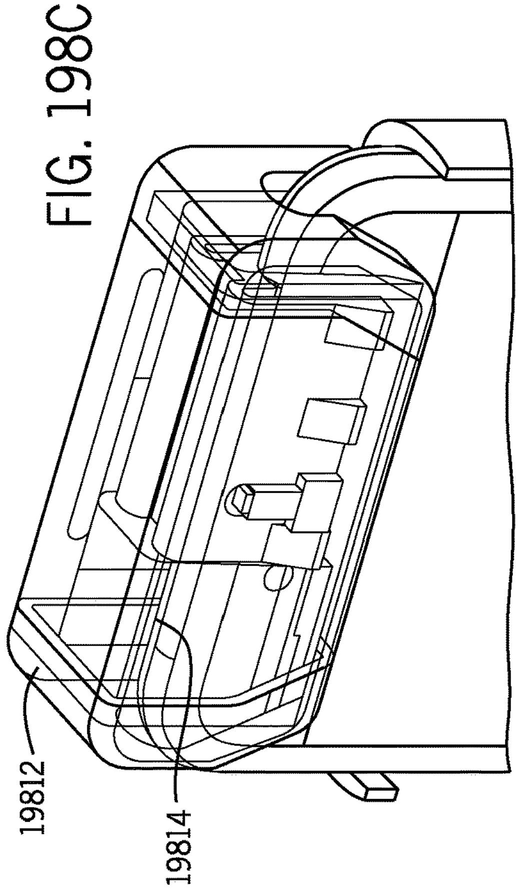
Figure 198D:
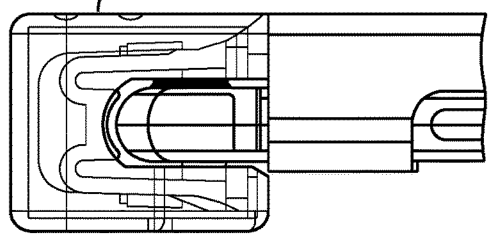
Figure 198A:
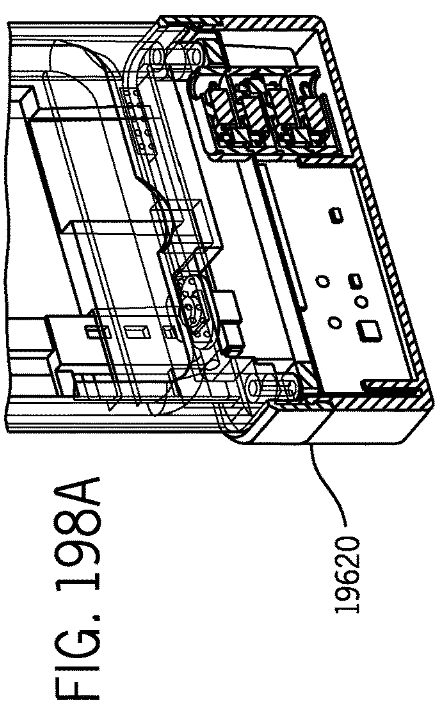
Figure 198B:
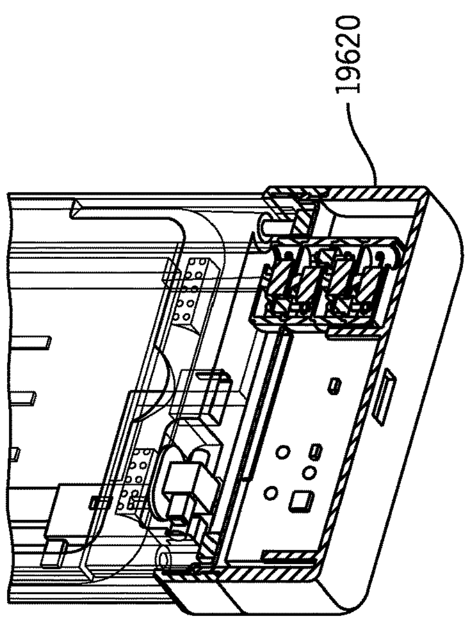
Figure 199E:
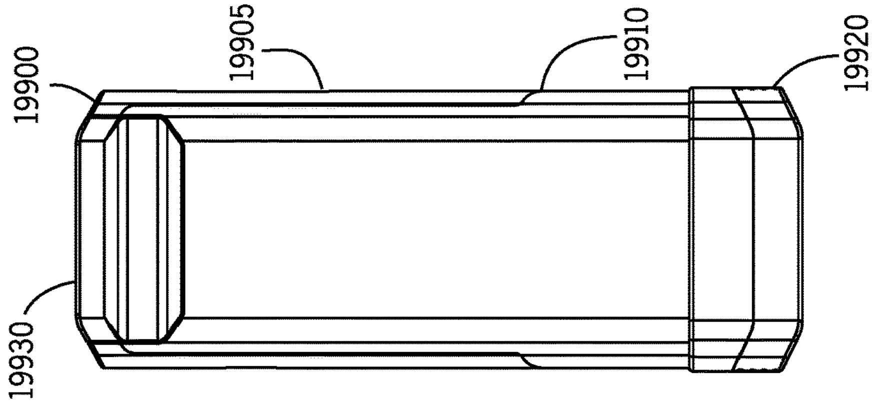
Figure 199D:
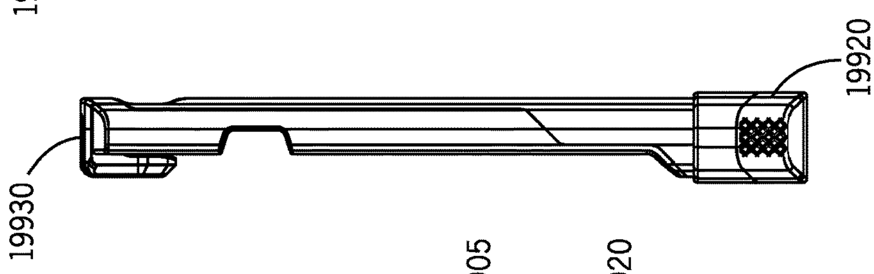
Figure 199C:
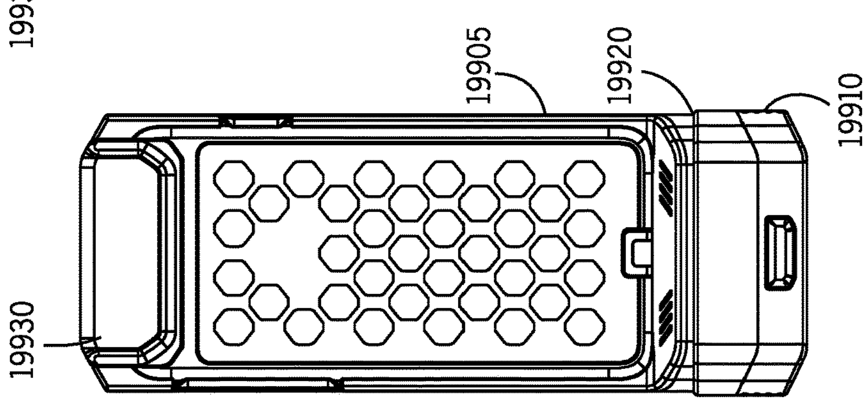
Figure 199B:
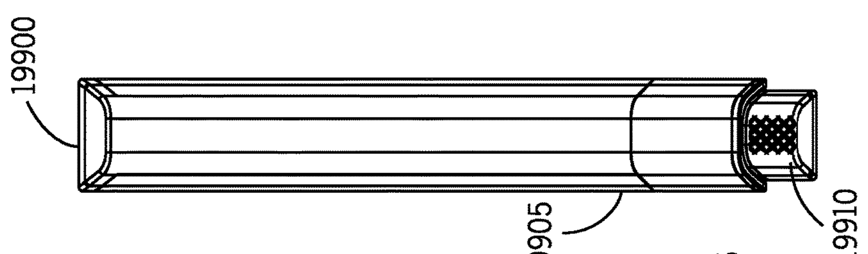
Figure 199A:
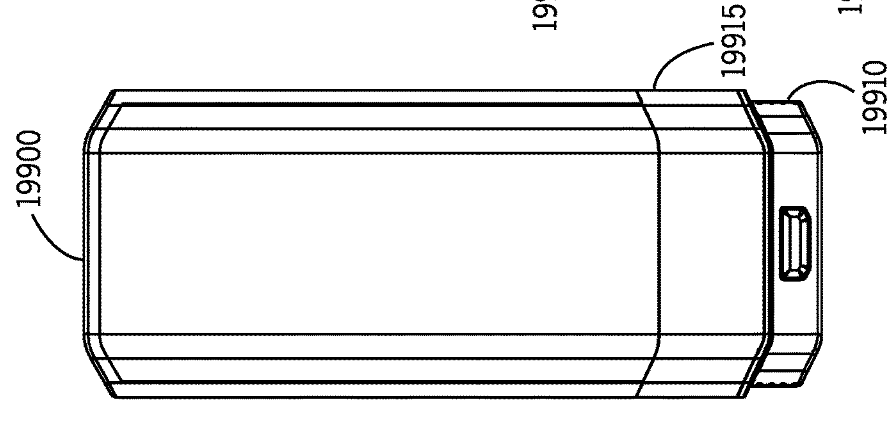

FIGS. 197A-197B illustrates a close-up view of the partial cut-away view in FIG. 196 in accordance with some embodiments of the invention.

FIGS. 198A-198D illustrates partial interior views of portions of a privacy/security enclosure in accordance with some embodiments of the invention.

FIGS. 199A-199E illustrates exterior views of a privacy/security enclosure in accordance with some embodiments of the invention.

FIGS. 200A-200D illustrates exterior views of a privacy/security enclosure in accordance with some embodiments of the invention.

FIGS. 201A-201E illustrates exterior views of a privacy/security enclosure in accordance with some embodiments of the invention.

Figure 202B:
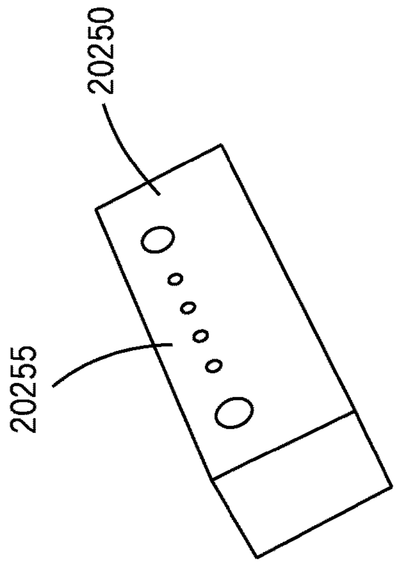
Figure 202A:
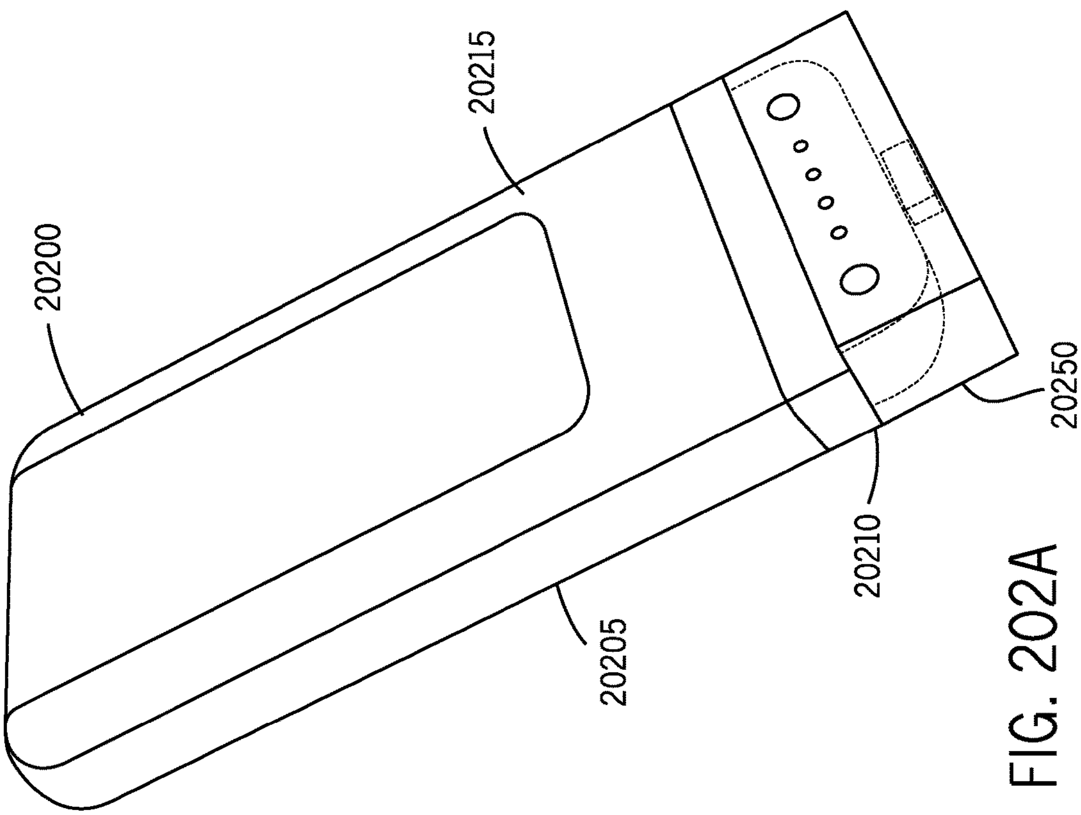
Figure 203:
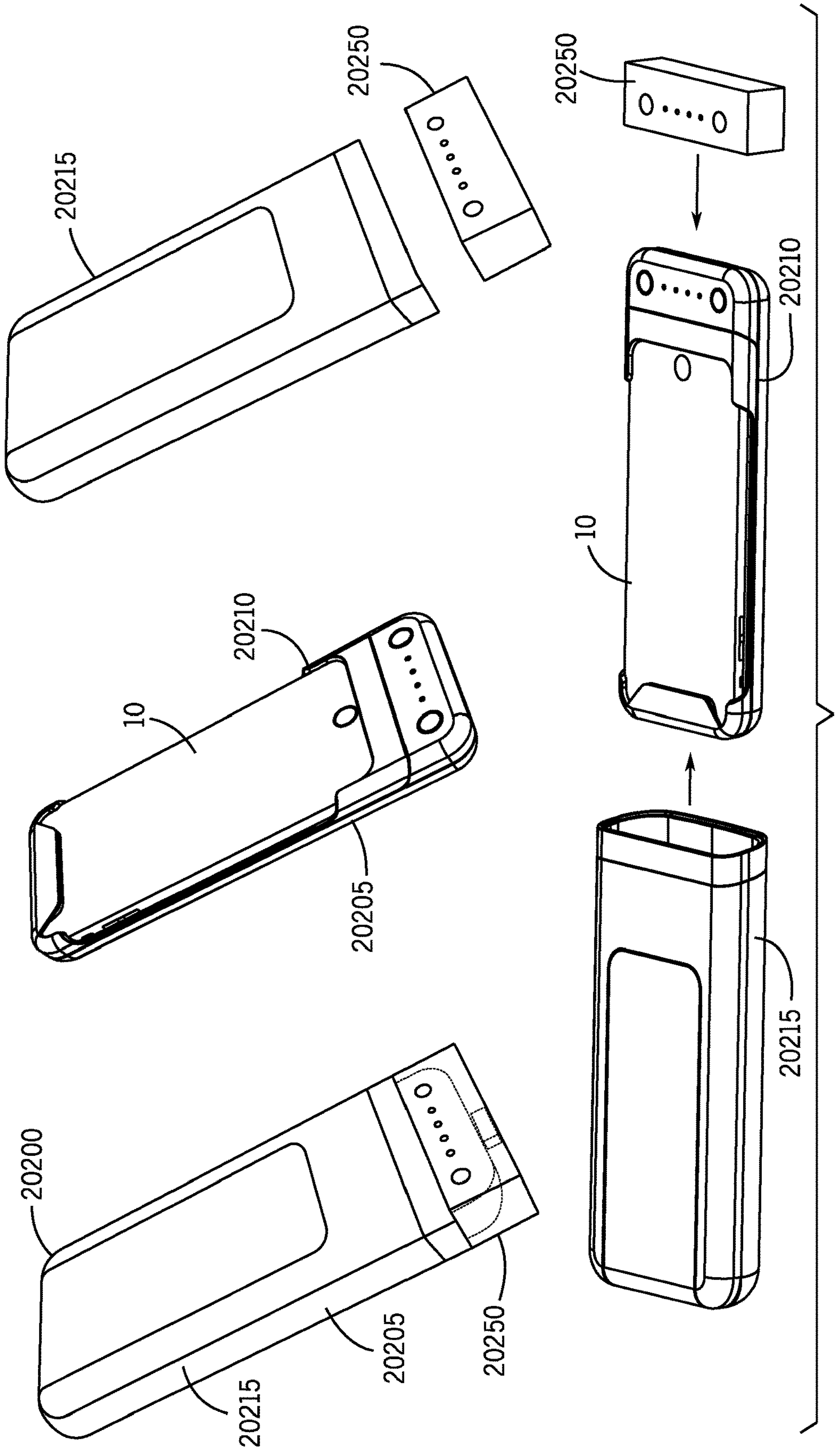

FIG. 202A illustrates a privacy/security enclosure including removable Faraday enclosure in accordance with some embodiments of the invention FIG. 202B depicts a removable Faraday enclosure in accordance with some embodiments of the invention FIG. 203 depicts an assembly view of a privacy/security enclosure including removable Faraday enclosure in accordance with some embodiments of the invention FIGS. 204A-204C, and 205A-205F illustrate privacy/security enclosures including removable Faraday enclosures and privacy/security enclosures that can be used with removable Faraday enclosures in accordance with some embodiments of the invention.

Figure 206:
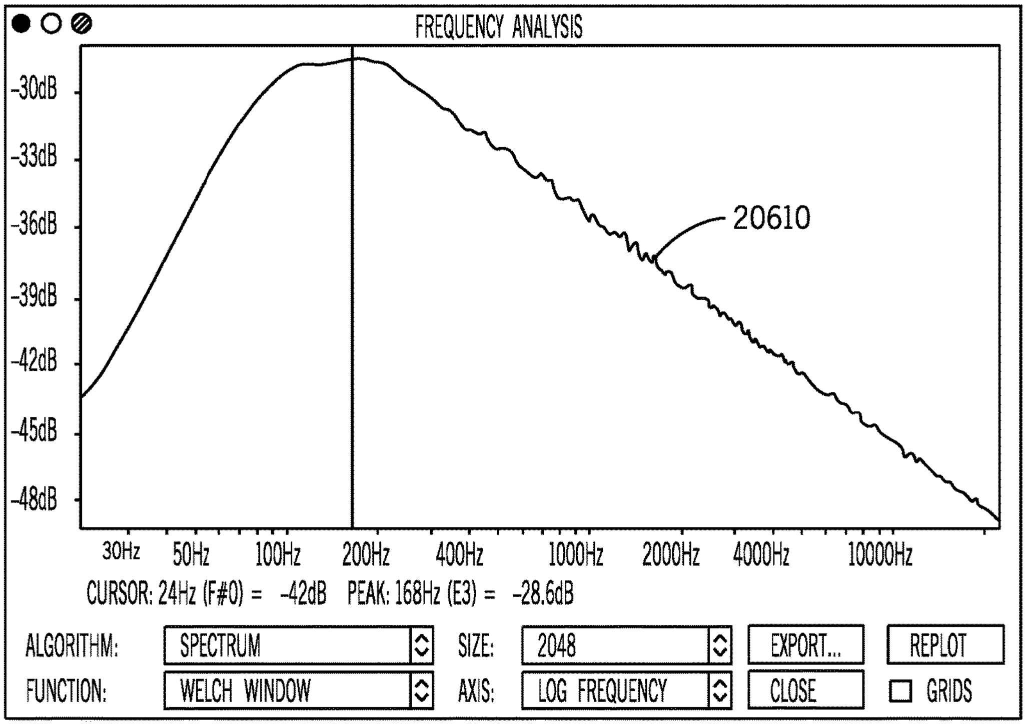

FIG. 206 illustrates a frequency profile of pink noise in accordance with some embodiments of the invention.

Figure 207:
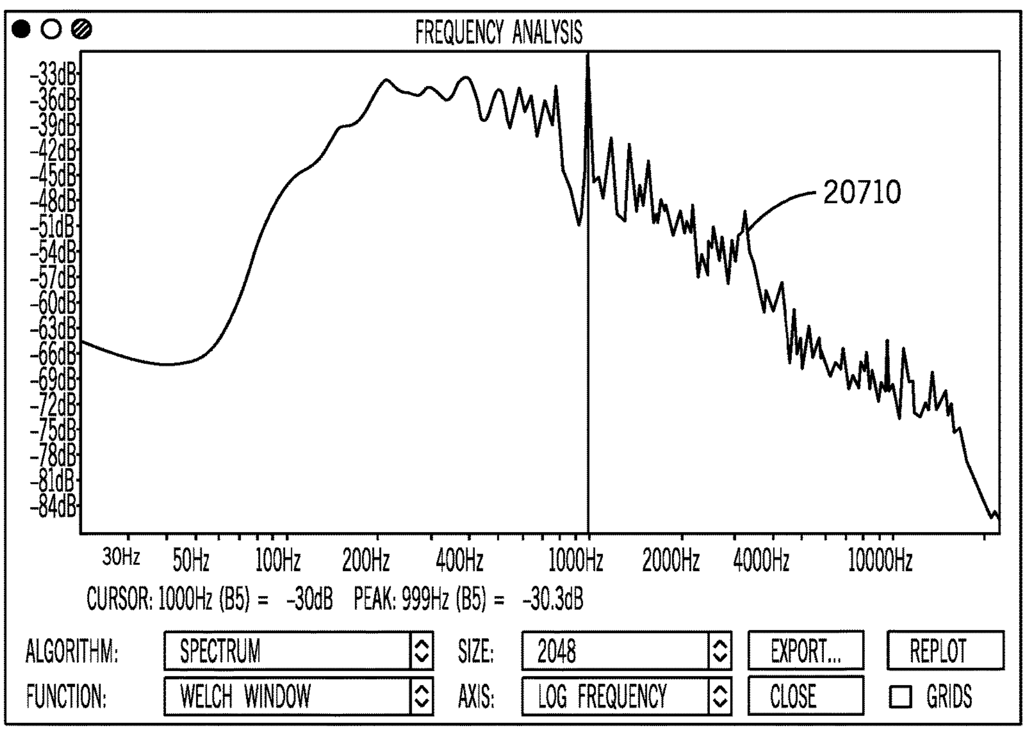

FIG. 207 illustrates a frequency profile of human voice in accordance with some embodiments of the invention.

Figure 208:
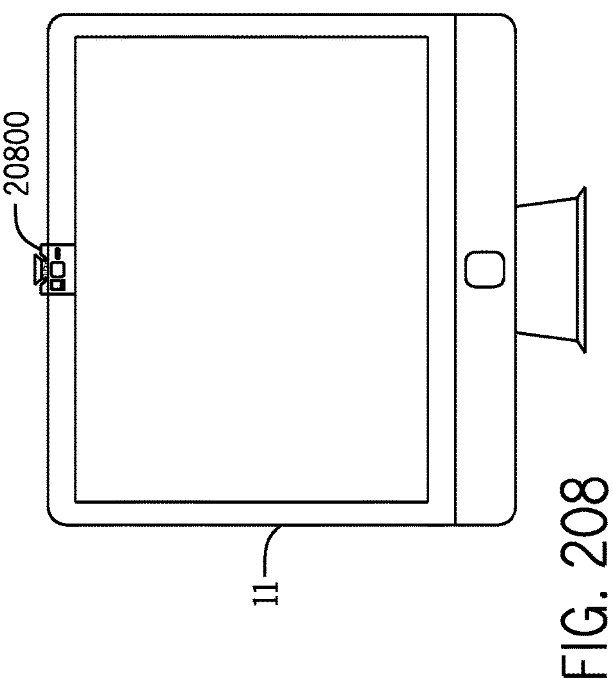

FIG. 208 illustrates front view of a computer or display monitor including a mounted privacy/security enclosure in accordance with some embodiments of the invention.

Figure 209:
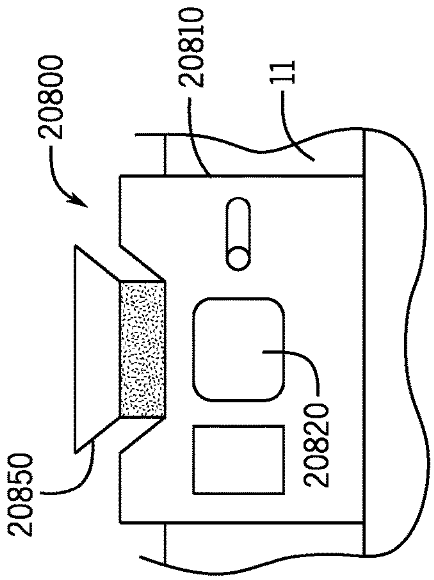

FIG. 209 illustrates a close up view of the privacy/security enclosure of FIG. 208 in accordance with some embodiments of the invention.

Figure 210:
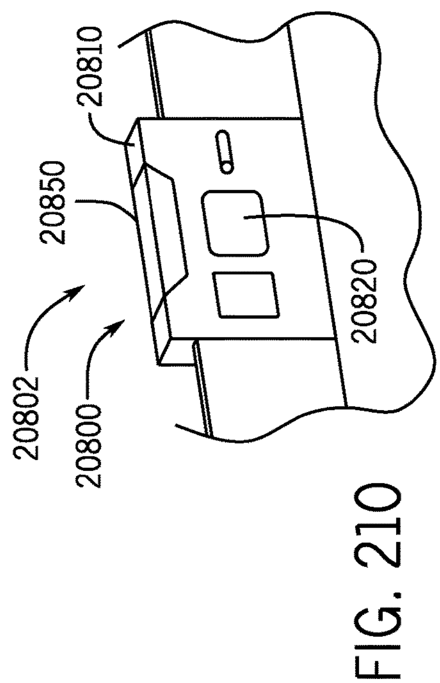

FIG. 210 illustrates a close up front perspective view of a privacy/security enclosure in a covered and protected configuration in accordance with some embodiments of the invention.

Figure 211:
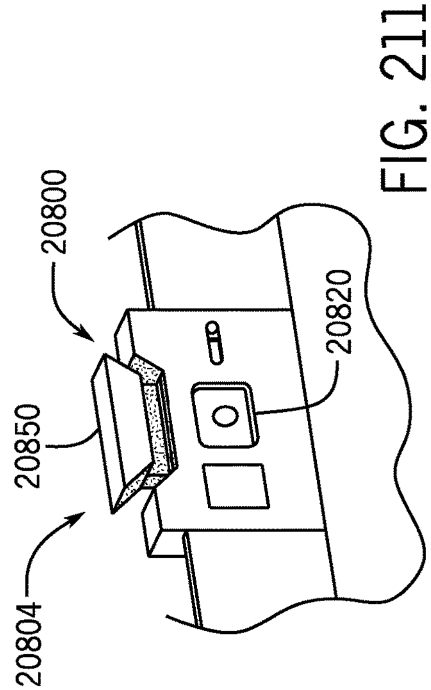

FIG. 211 illustrates a close up front perspective view of a privacy/security enclosure in an uncovered and unprotected configuration in accordance with some embodiments of the invention.

Figure 212B:
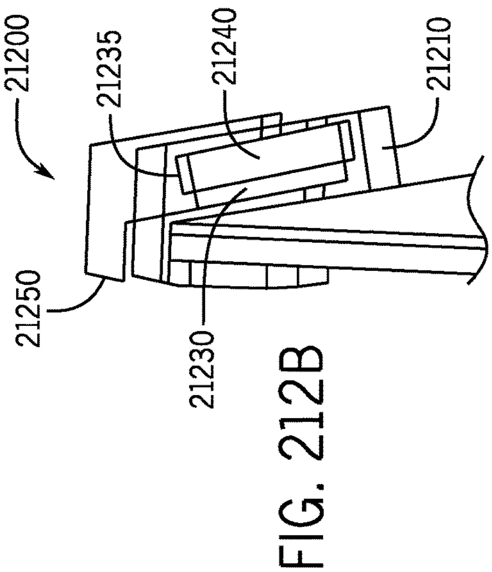
Figure 212C:
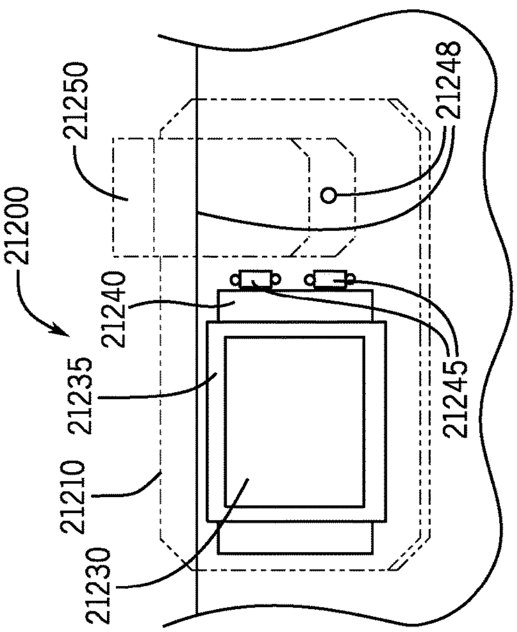
Figure 212A:
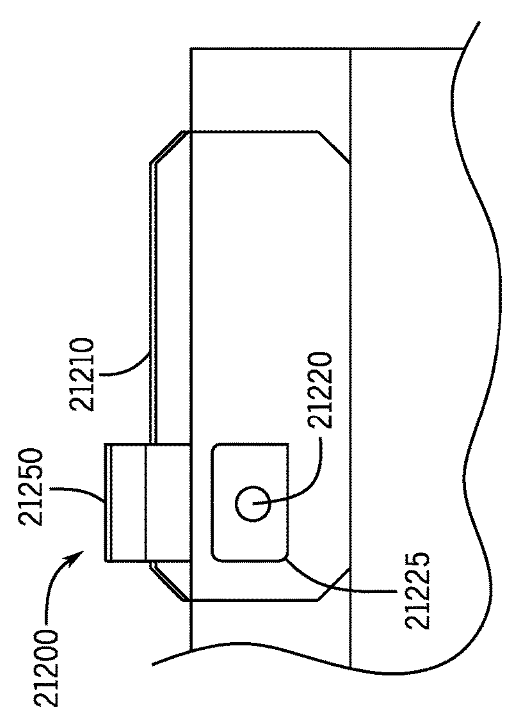

FIGS. 212A-212C illustrate an internal architecture view of a privacy/security enclosure in accordance with some embodiments of the invention.

Figure 213A:
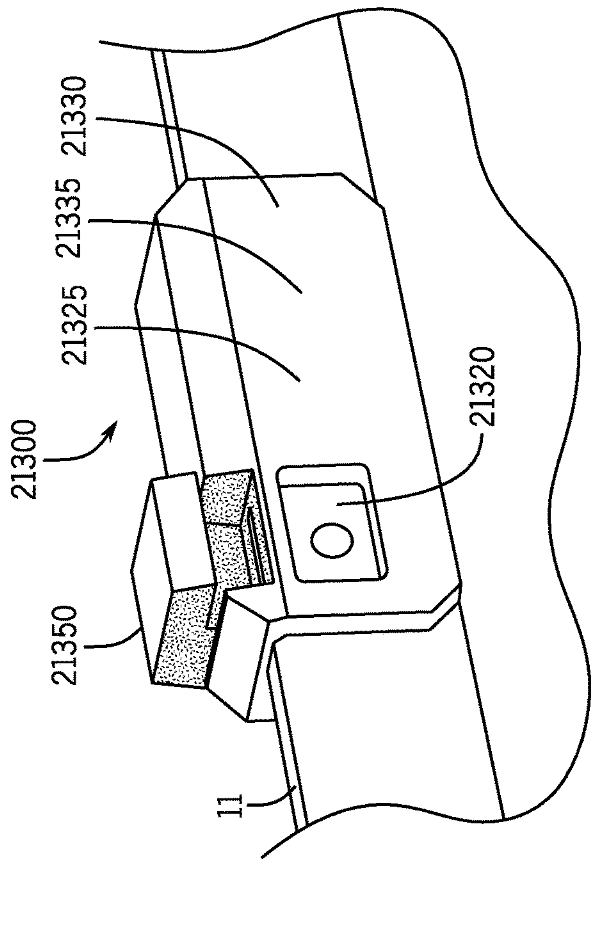
Figure 213B:
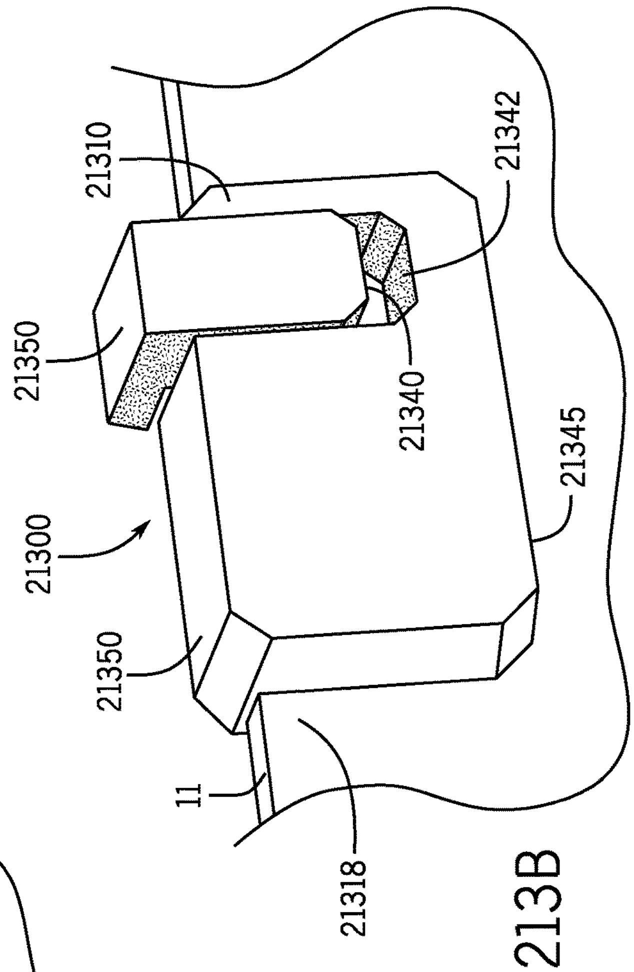

FIGS. 213A-213B illustrates a front and rear perspective view of a privacy/security enclosure in accordance with some embodiments of the invention.

Figure 214:
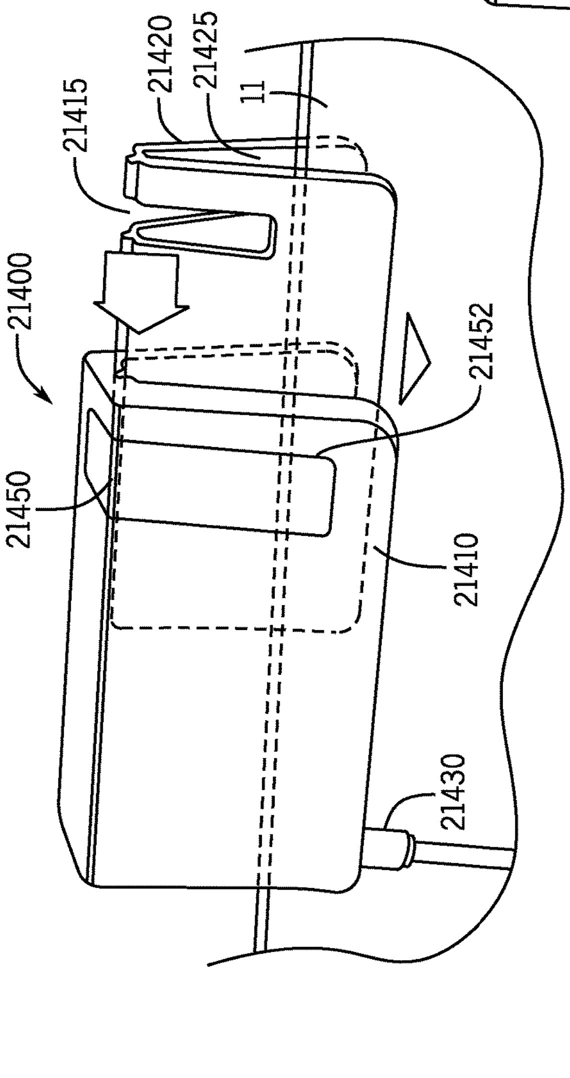

FIG. 214 depicts a reconfiguration of a mounted privacy/security enclosure in accordance with some embodiments of the invention.

Figure 215:
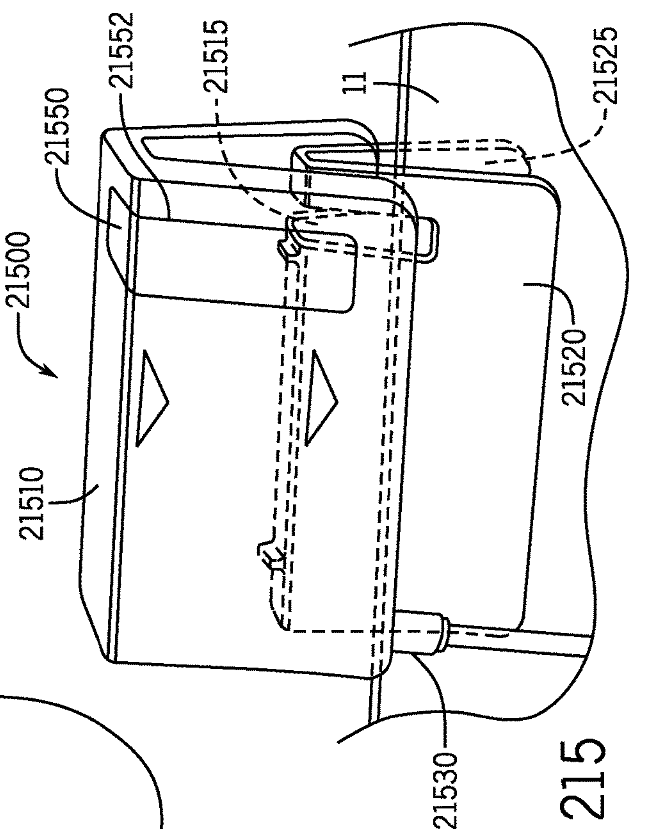

FIG. 215 depicts a reconfiguration of a mounted privacy/security enclosure in accordance with another embodiment of the invention.

Figure 216:
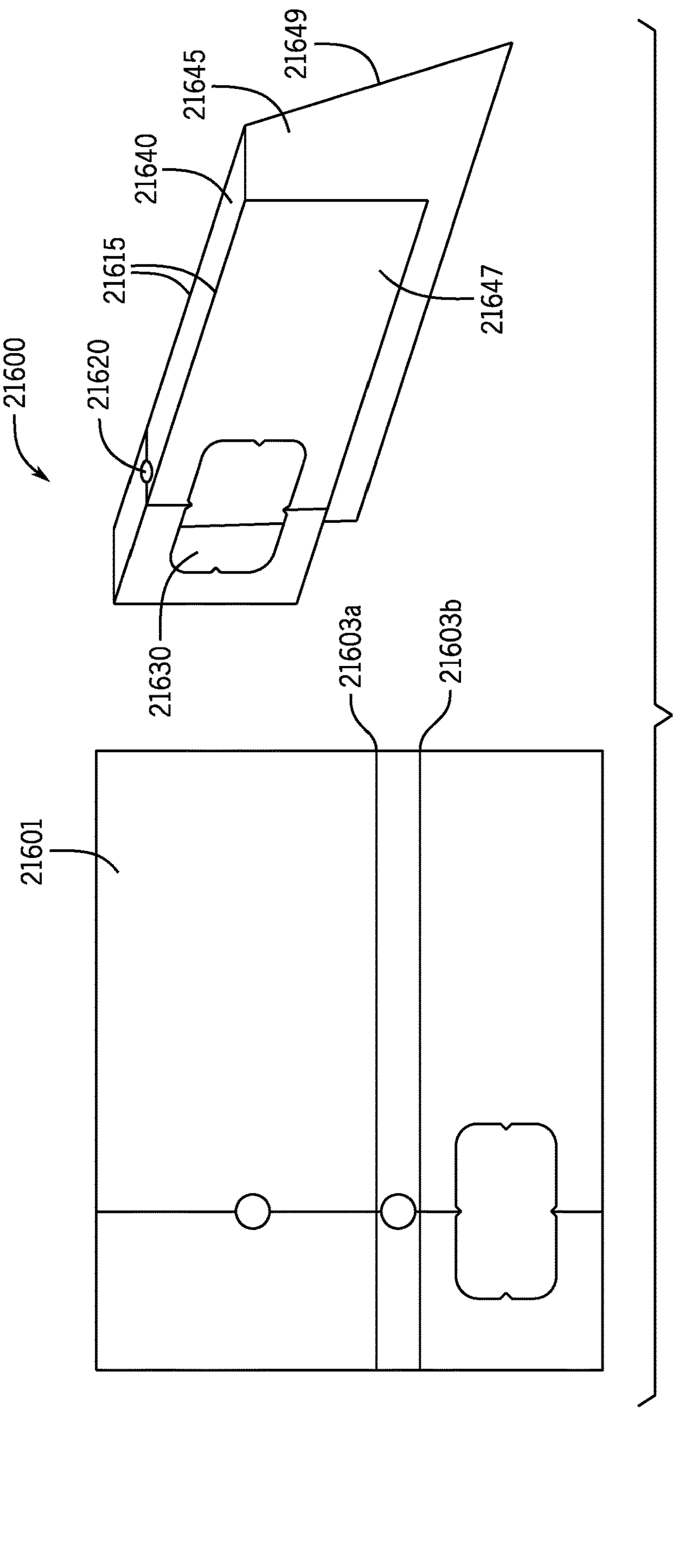

FIG. 216 illustrates architecture views of a privacy/security enclosure in accordance with some embodiments of the invention.

Figure 217C:
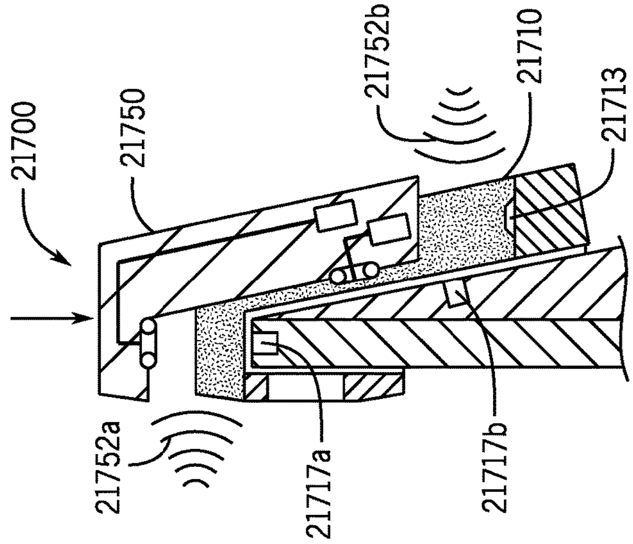
Figure 217B:
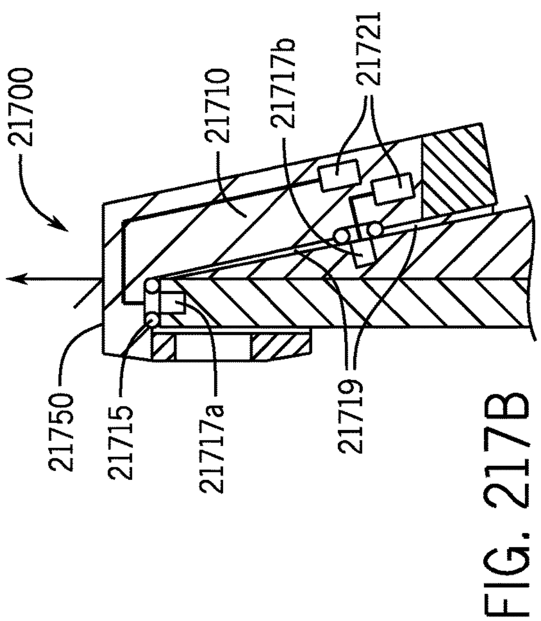
Figure 217A:
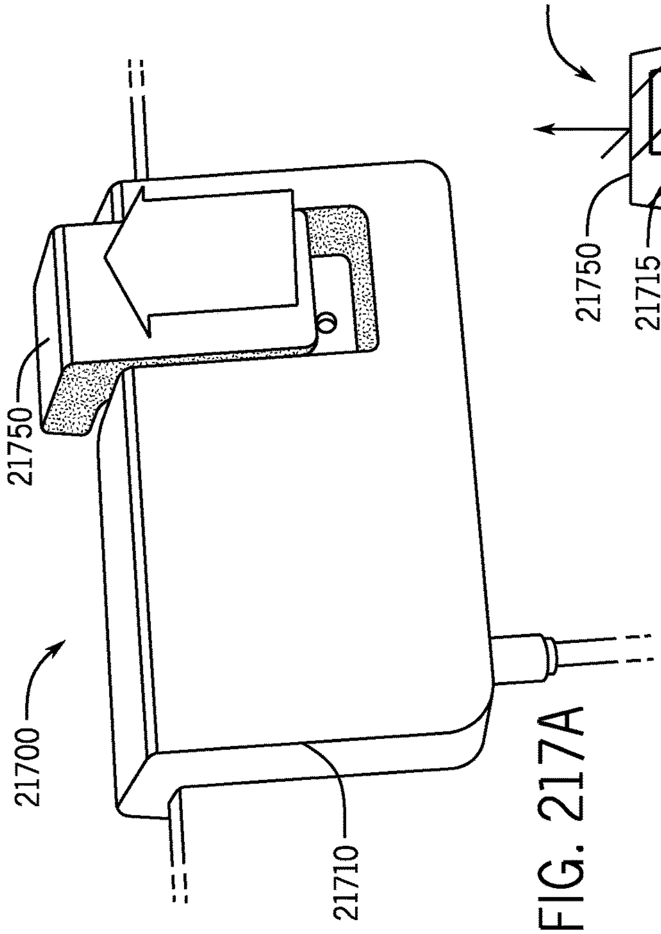

FIGS. 217A-217C illustrates views of a privacy/security enclosure in accordance with some embodiments of the invention.

Figure 218A:
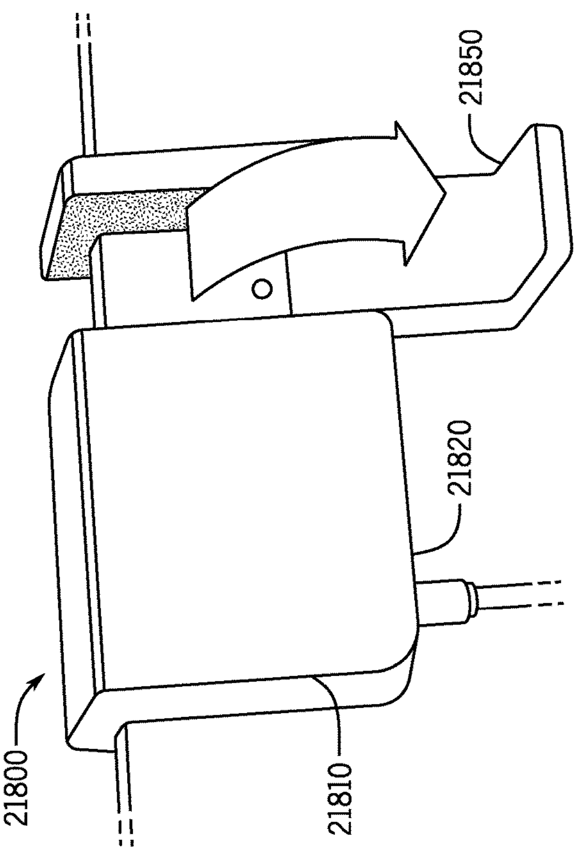
Figure 218C:
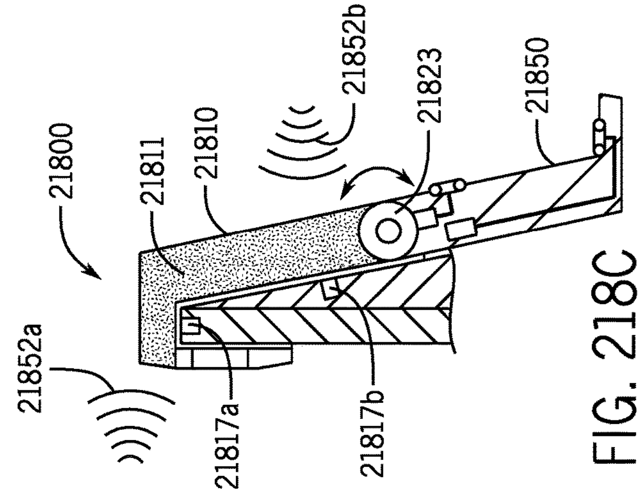
Figure 218B:
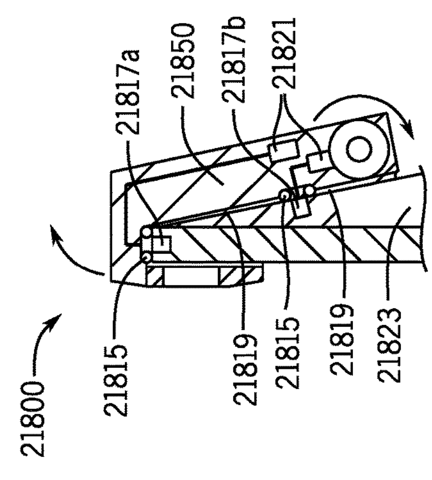

FIGS. 218A-218C illustrates views of a privacy/security enclosure in accordance with some further embodiments of the invention.

Figure 219:
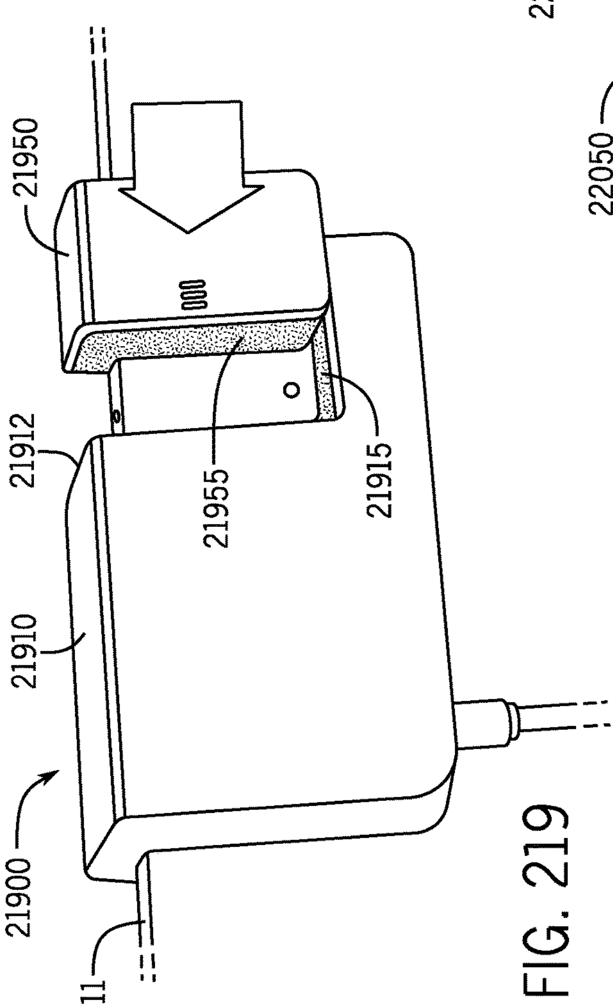

FIG. 219 illustrates an operational view of a privacy/security enclosure in accordance with some embodiments of the invention.

Figure 220:
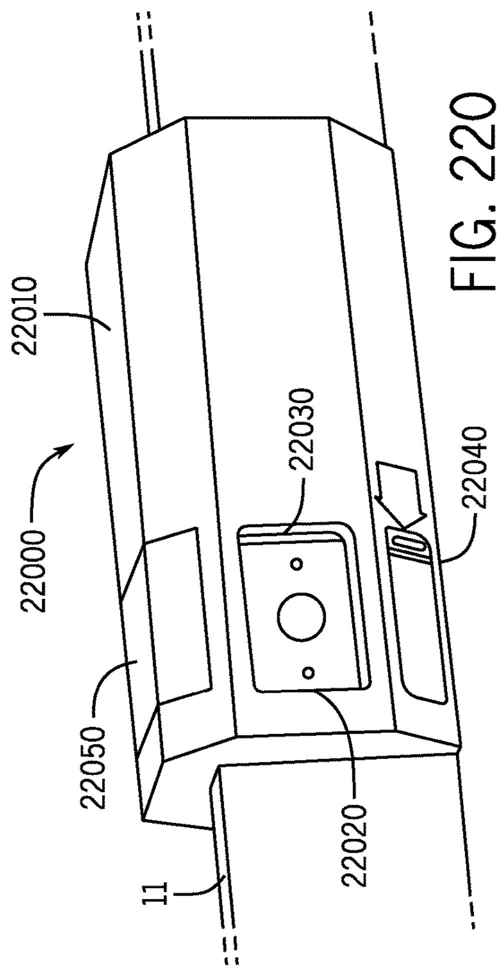

FIG. 220 illustrates an operational view of a privacy/security enclosure in accordance with some further embodiments of the invention.

Figure 221:
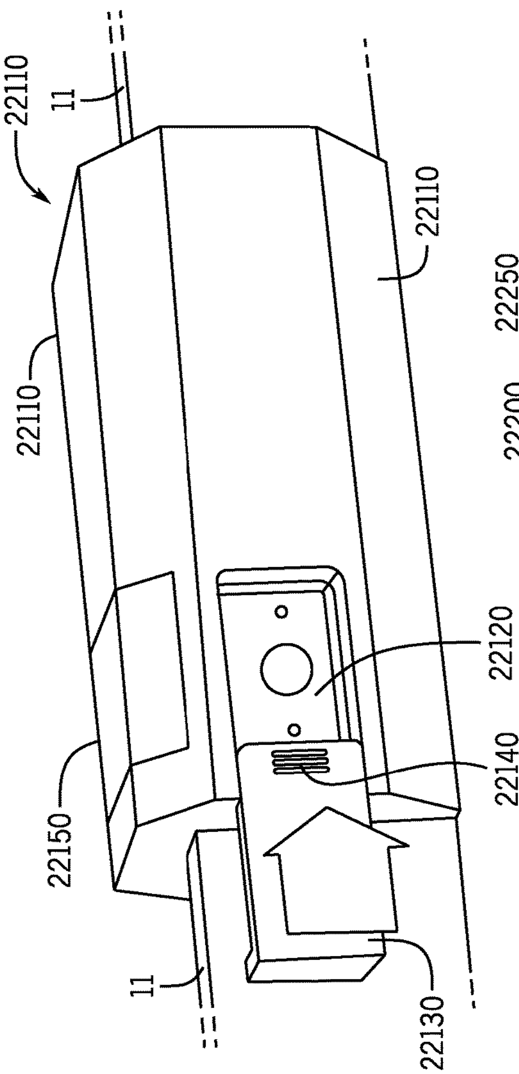

FIG. 221 illustrates an operational view of a privacy/security enclosure in accordance with some embodiments of the invention.

Figure 222:
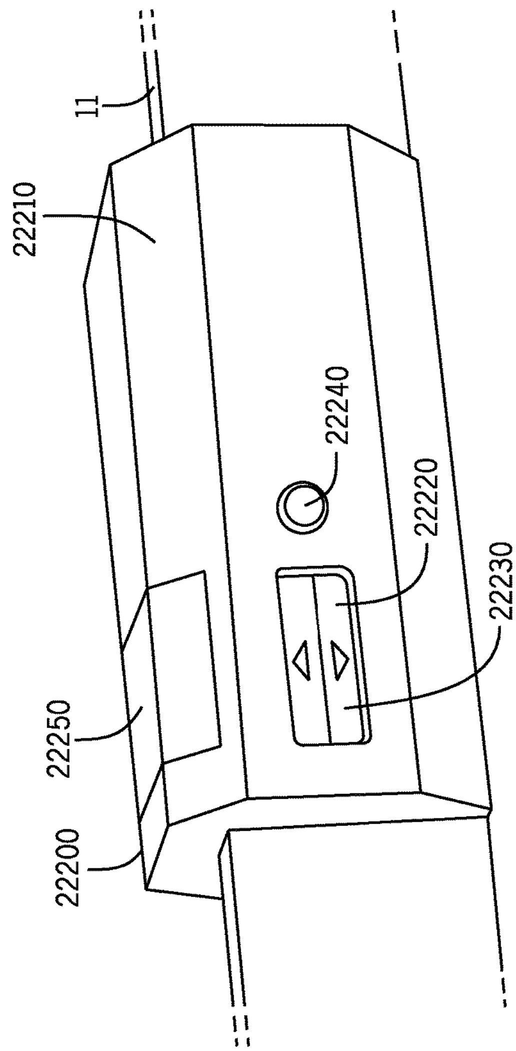

FIG. 222 illustrates an operational view of a privacy/security enclosure in accordance with some further embodiments of the invention.

FIG. 223 illustrates an operational view of a privacy/security enclosure in accordance with some embodiments of the invention.

FIG. 224 illustrates an operational view of a privacy/security enclosure in accordance with some further embodiments of the invention.

Figure 225:
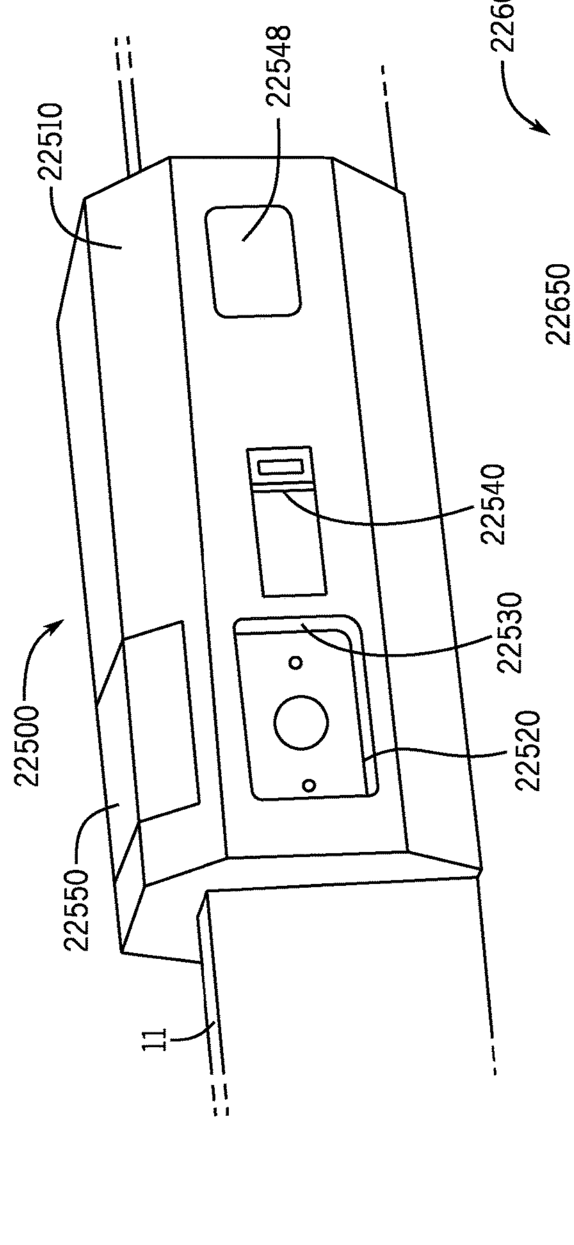

FIG. 225 illustrates an operational view of a privacy/security enclosure in accordance with some embodiments of the invention.

Figure 226:
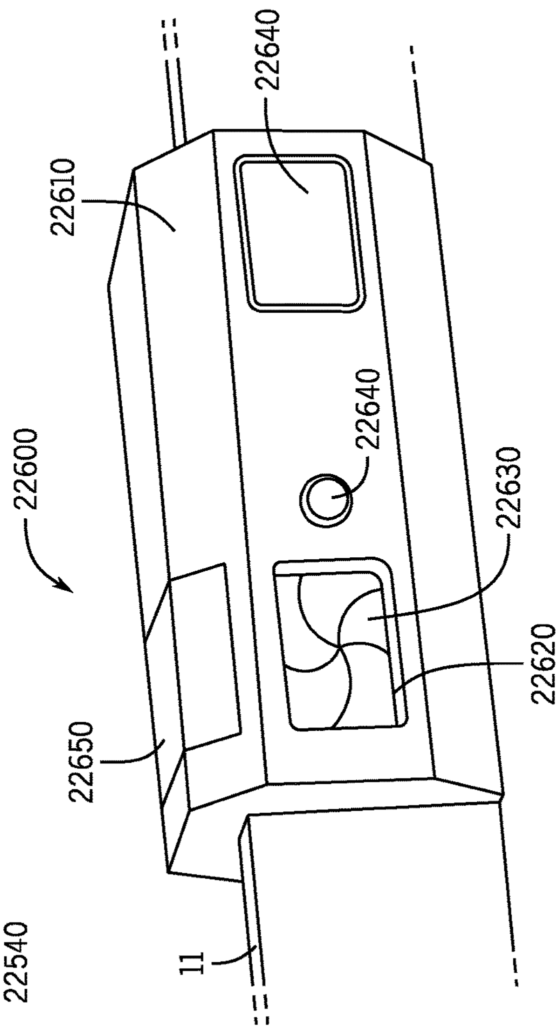

FIG. 226 illustrates an operational view of a privacy/security enclosure in accordance with some further embodiments of the invention.

Figure 227:
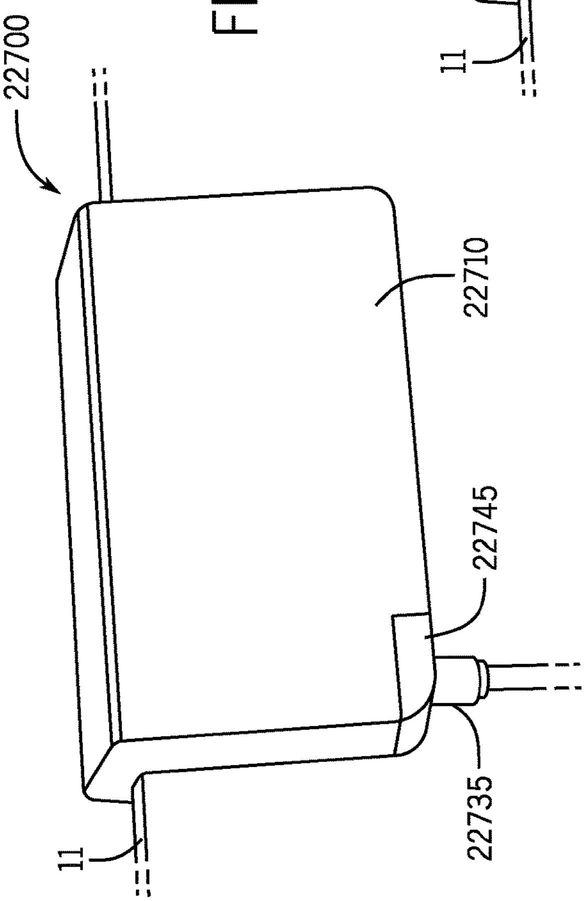

FIG. 227 illustrates a rear view of a privacy/security enclosure in accordance with some embodiments of the invention.

Figure 228:
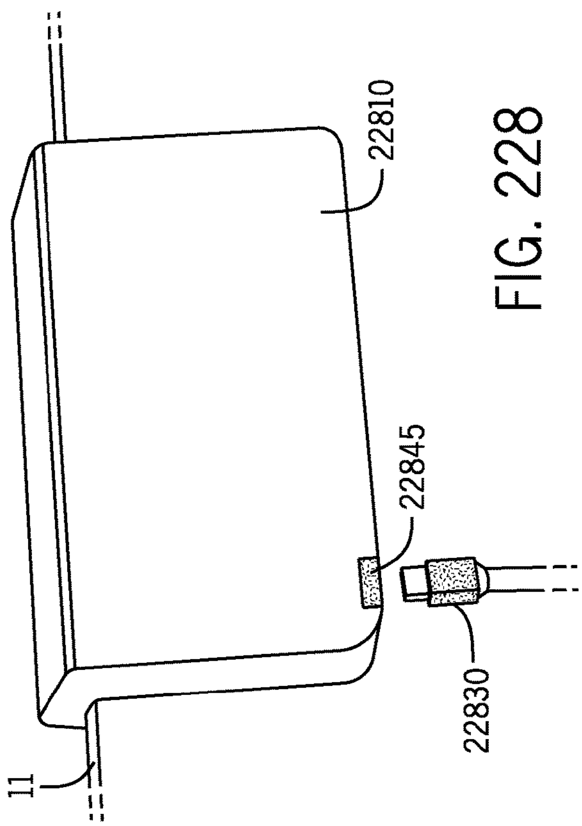

FIG. 228 illustrates a rear view of a privacy/security enclosure in accordance with some embodiments of the invention.

Figure 229:
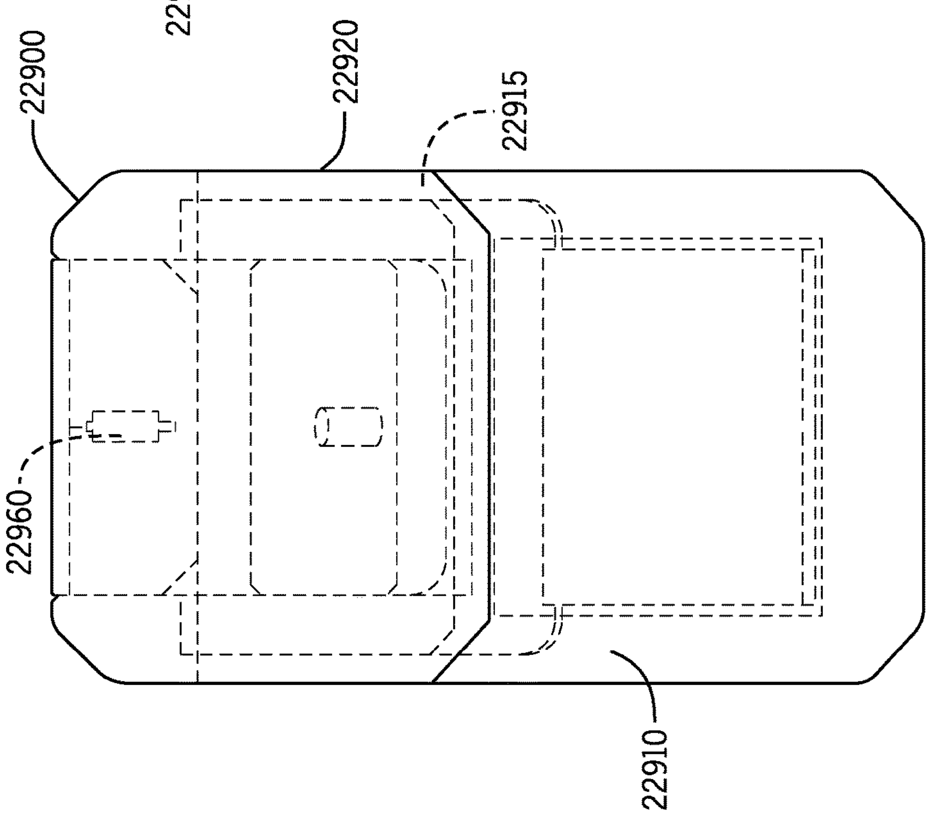

FIG. 229 illustrates a front view of a privacy/security enclosure in accordance with some embodiments of the invention.

Figure 230:
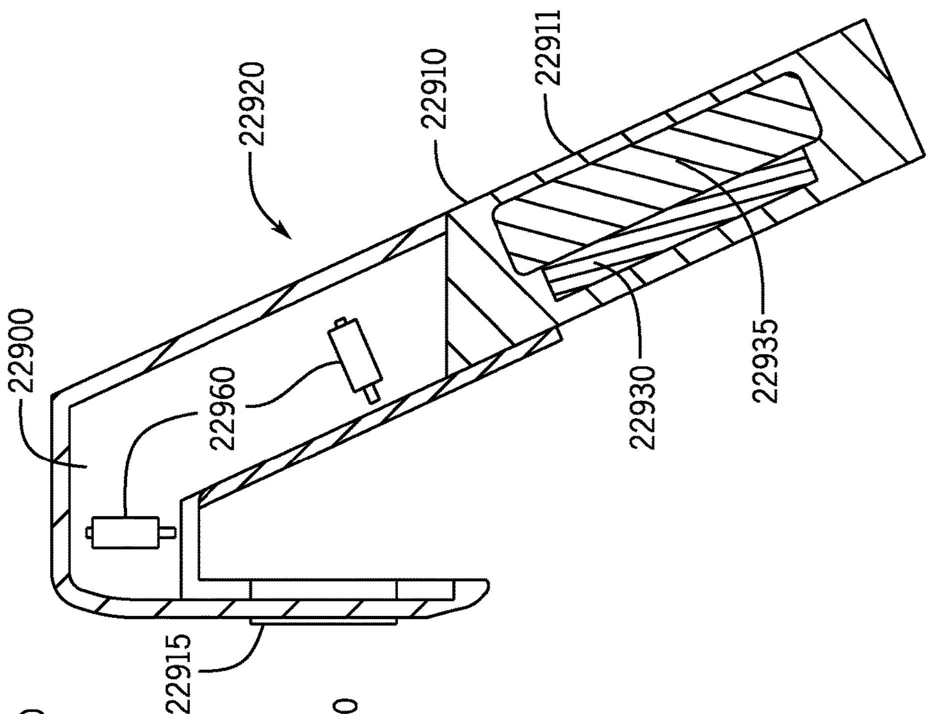

FIG. 230 illustrates a side view of a privacy/security enclosure in accordance with some embodiments of the invention.

Figure 231:
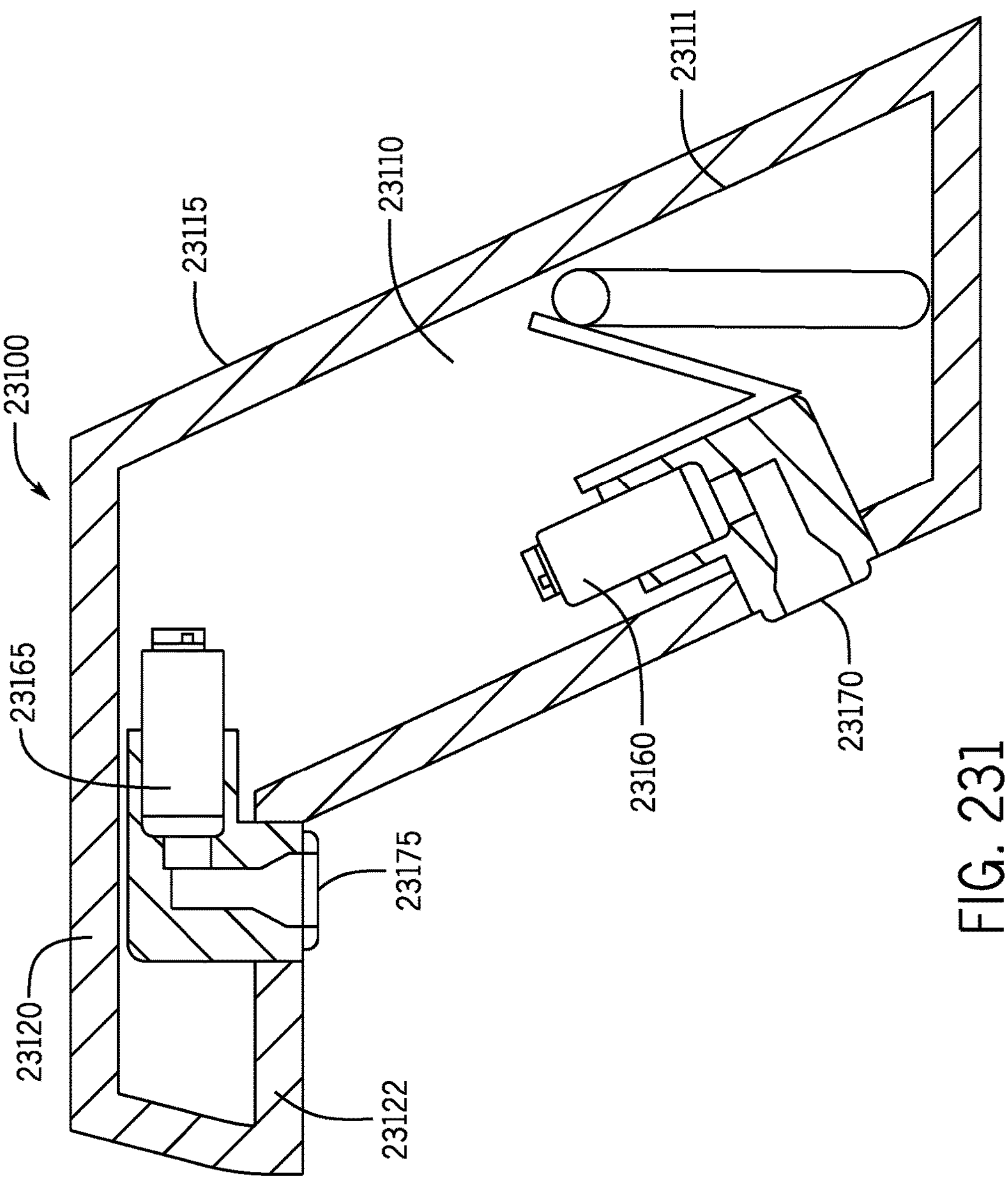

FIG. 231 illustrates a side internal view of a privacy/security enclosure in accordance with some embodiments of the invention.

Figure 232C:
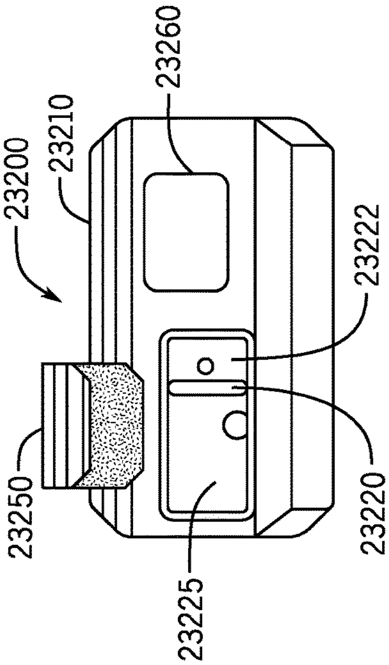
Figure 232B:
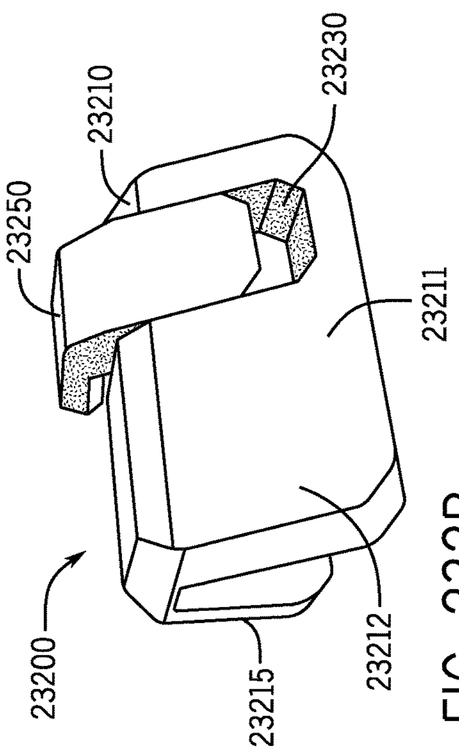
Figure 232A:
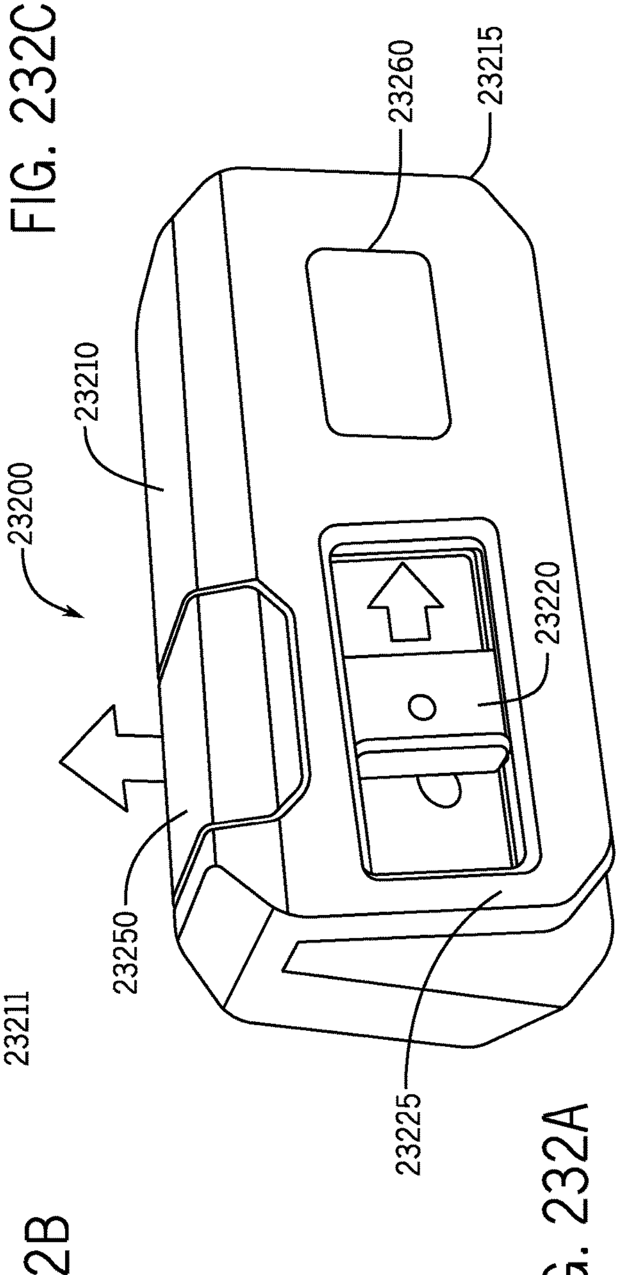

FIGS. 232A-232C illustrate perspective views of a privacy/security enclosure in accordance with some embodiments of the invention.

Figures 233A, 233B, 233C:
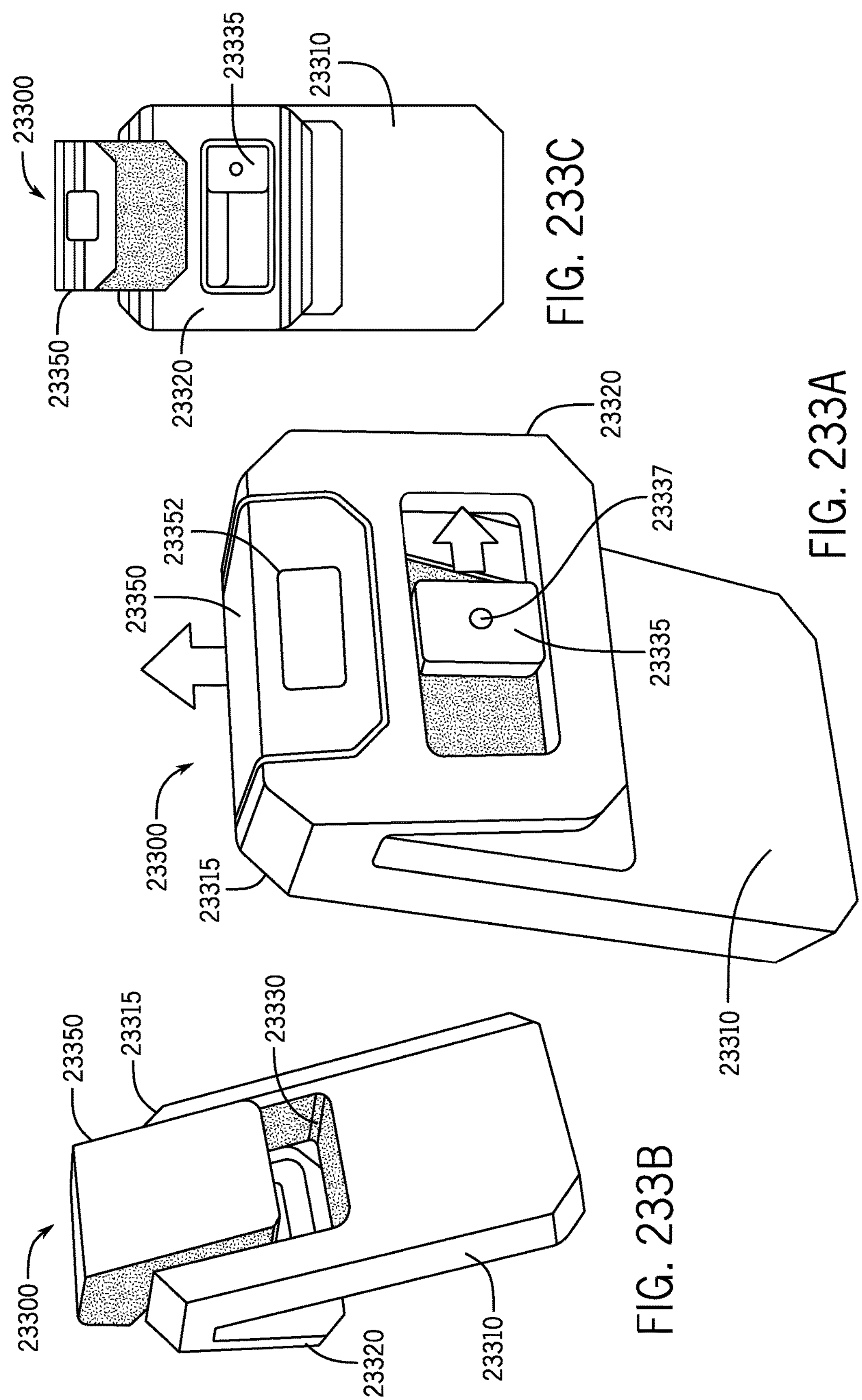

FIGS. 233A-233C illustrate perspective views of a privacy/security enclosure in accordance with some embodiments of the invention.

Figure 234C:
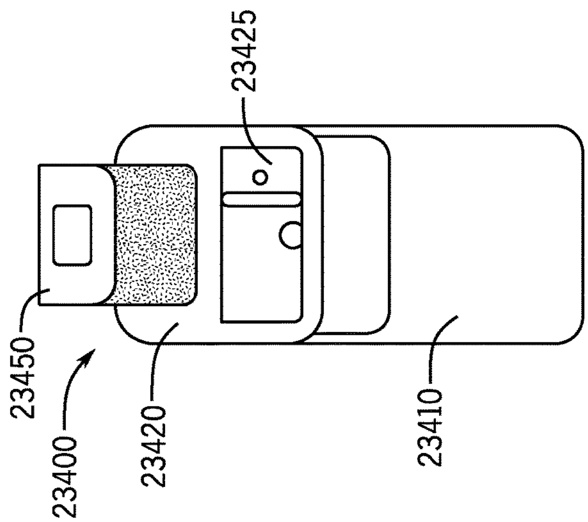
Figure 234A:
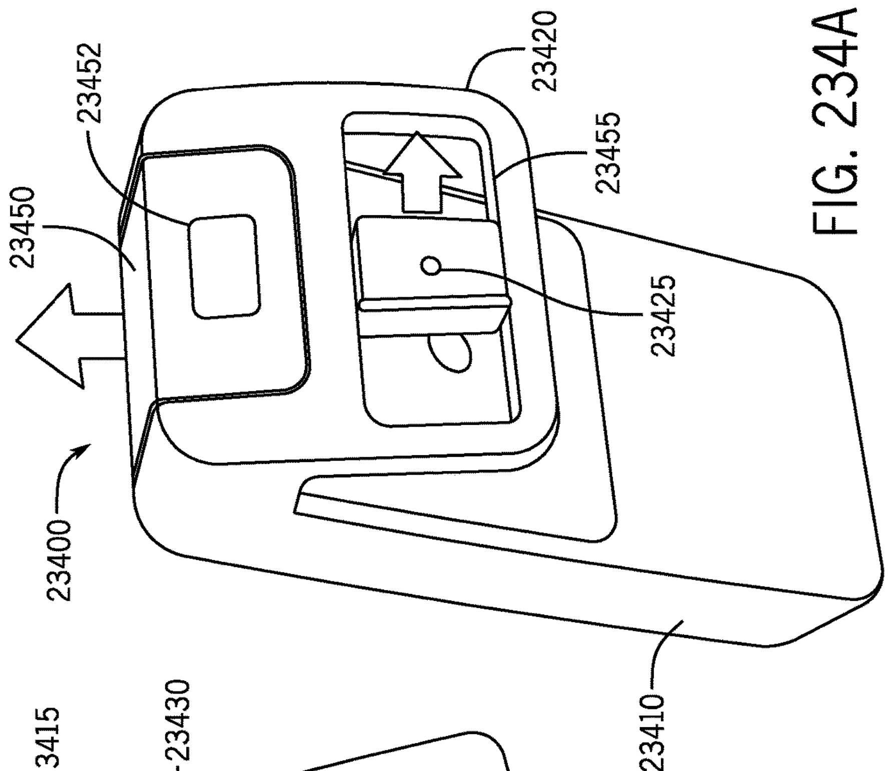
Figure 234B:
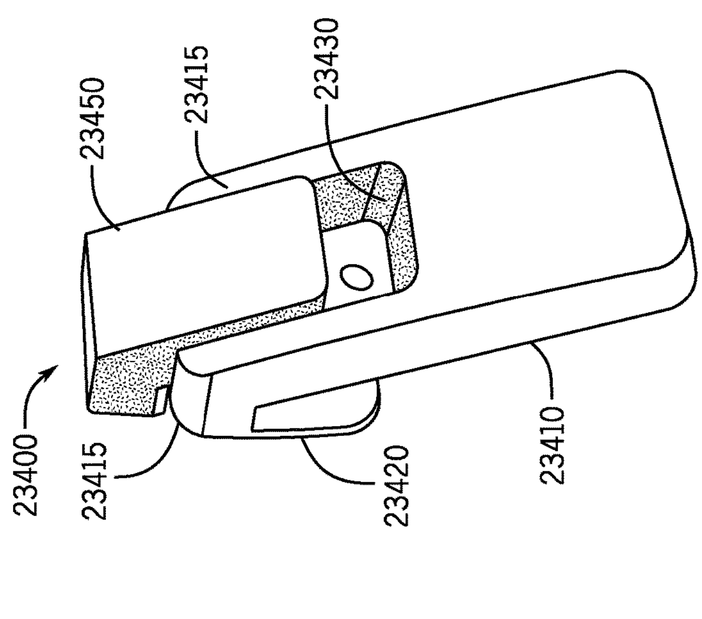

FIGS. 234A-234C illustrate perspective views of a privacy/security enclosure in accordance with some embodiments of the invention.

Figures 235A, 235B, 235C:
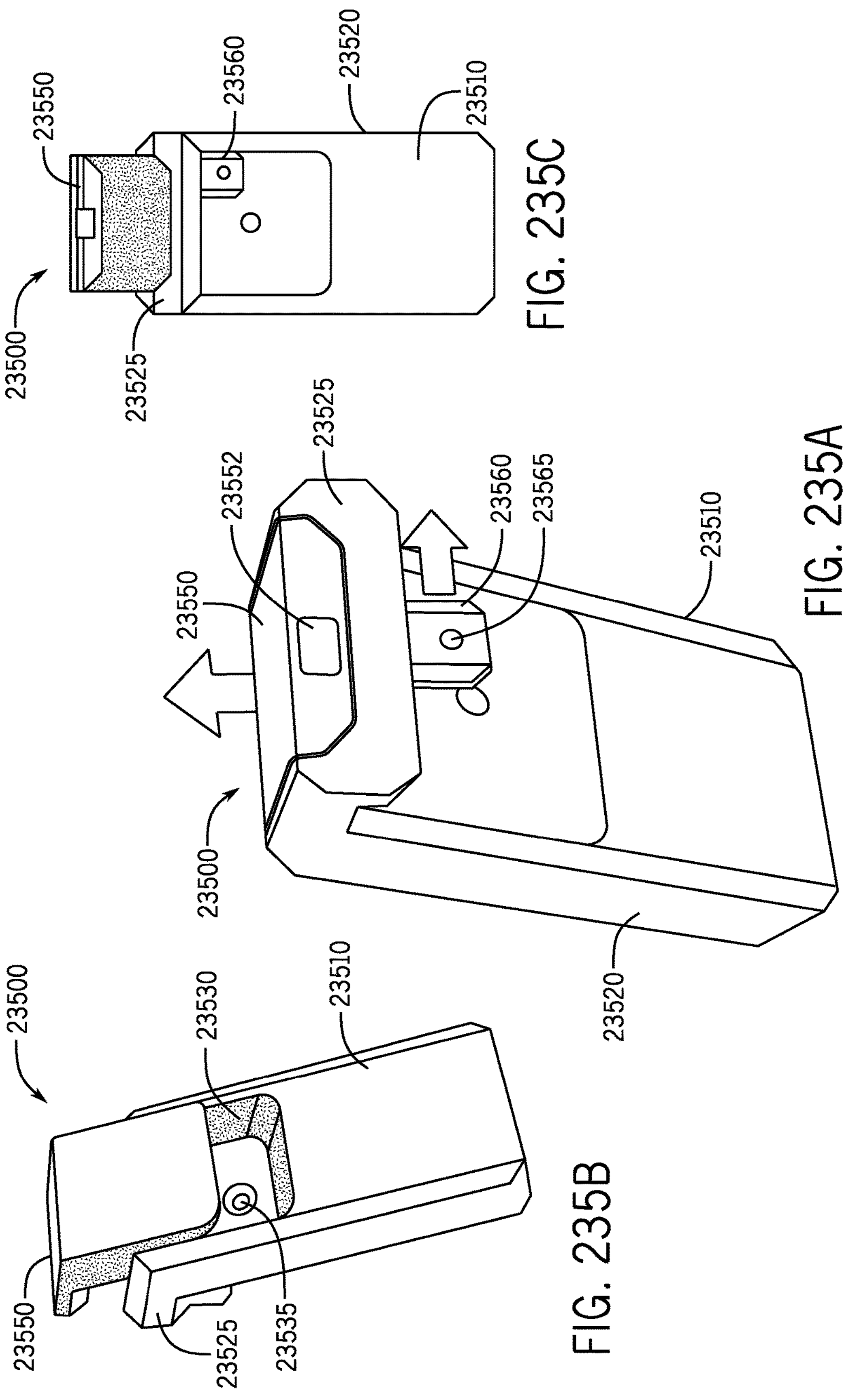

FIGS. 235A-235C illustrate perspective views of a privacy/security enclosure in accordance with some embodiments of the invention.

Figure 236C:
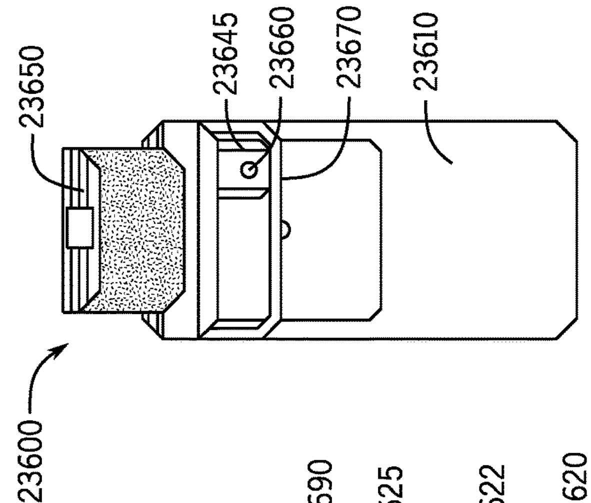
Figure 236A:
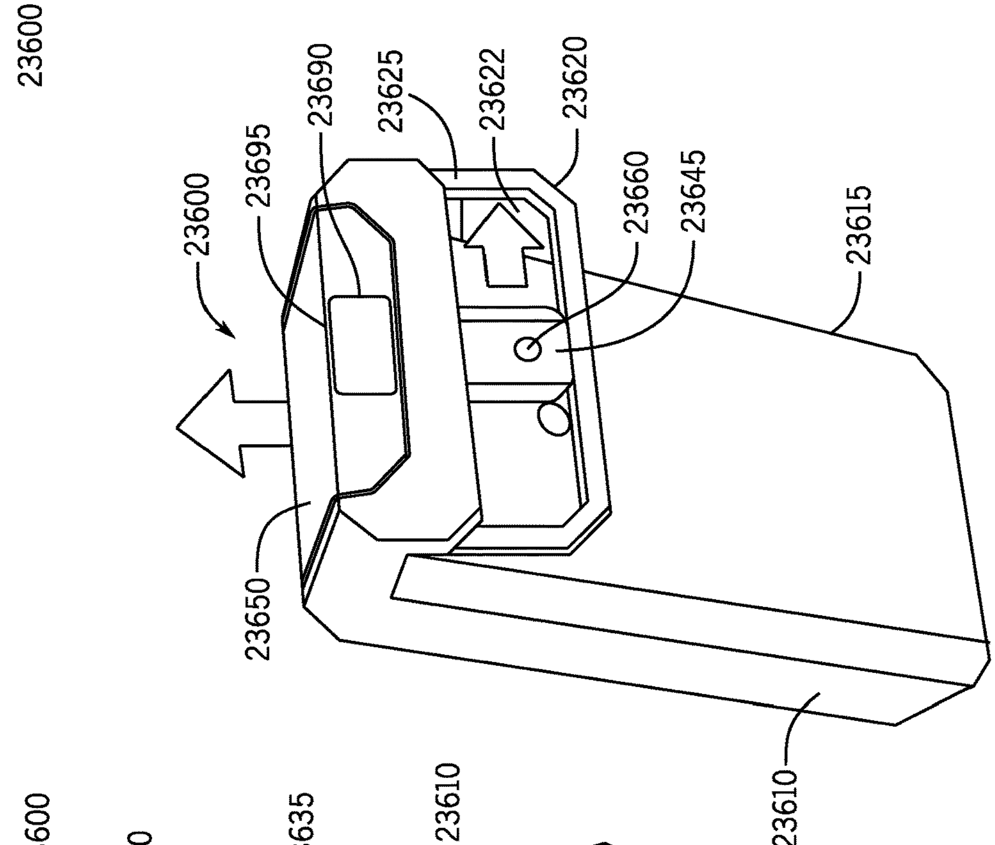
Figure 236B:
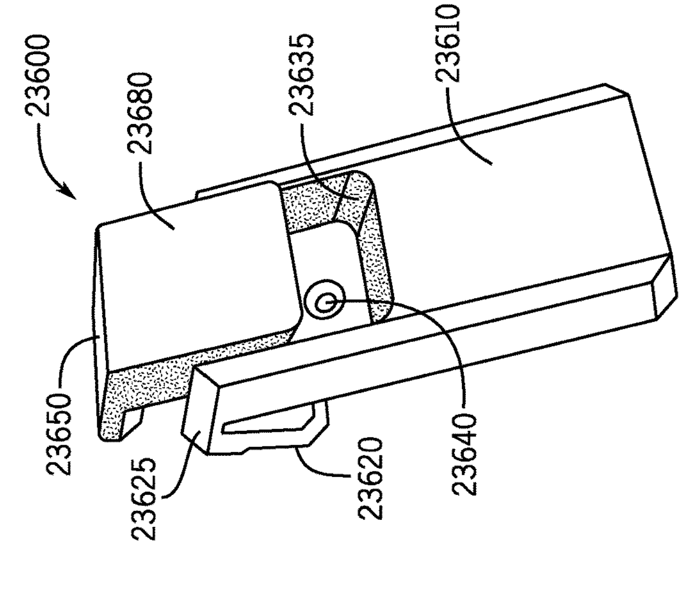

FIGS. 236A-236C illustrate perspective views of a privacy/security enclosure in accordance with some embodiments of the invention.

Figure 237C:
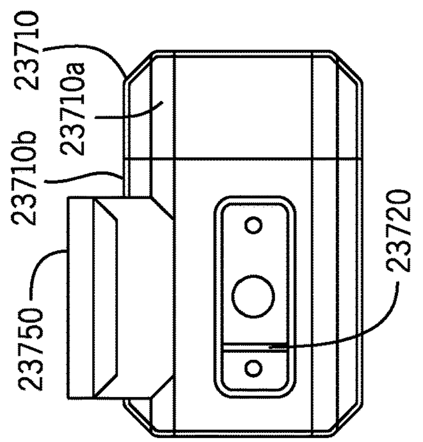
Figure 237B:
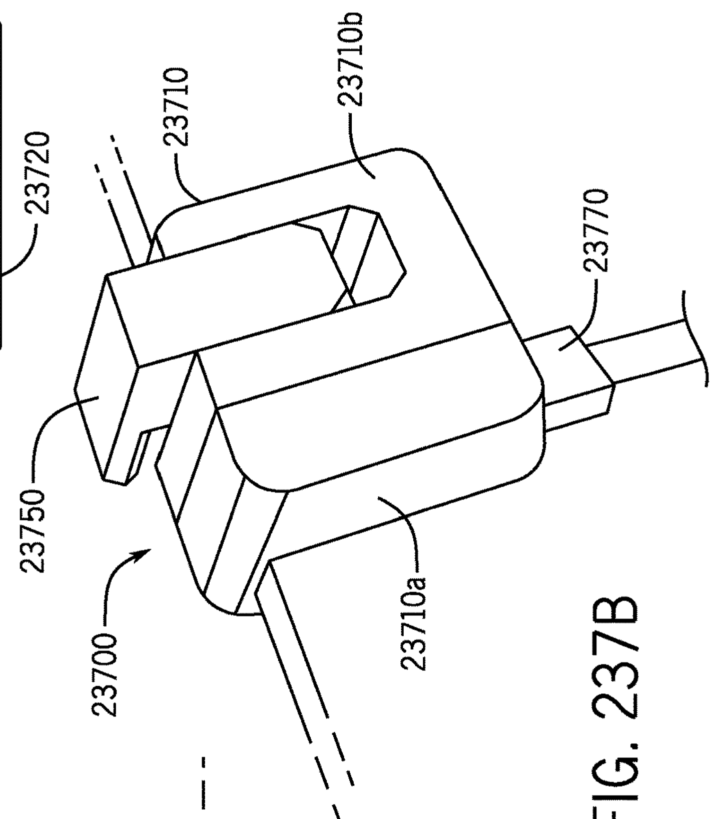
Figure 237A:
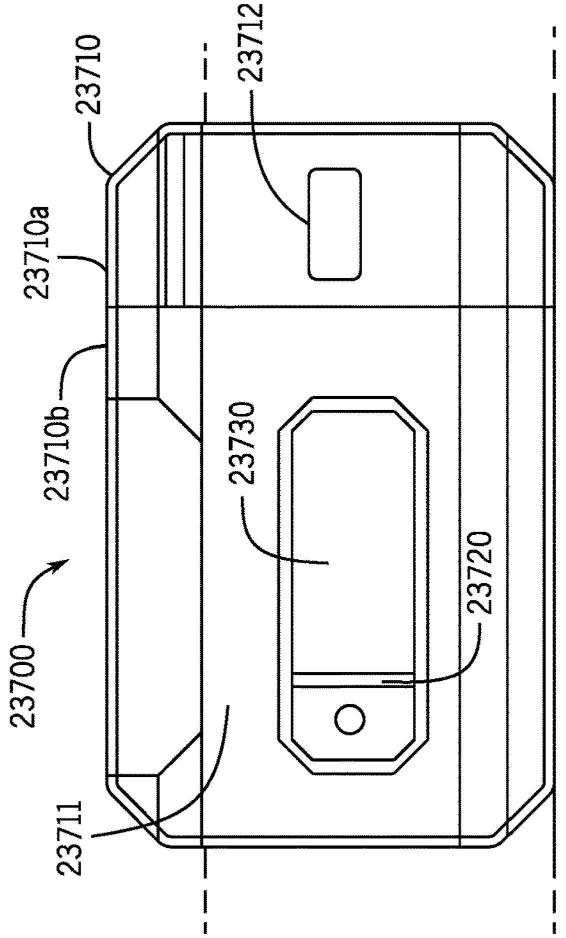
Figure 238D:
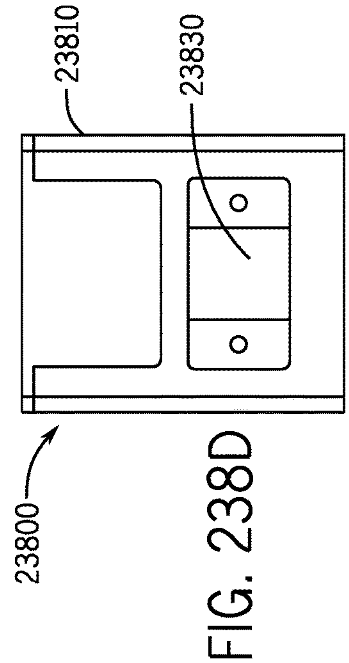
Figure 238C:
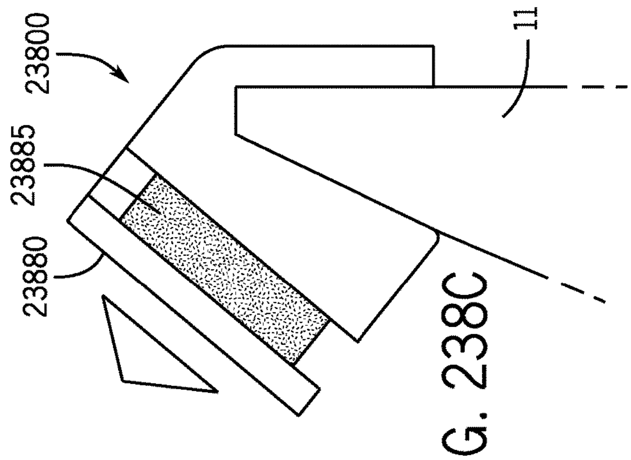
Figure 238B:
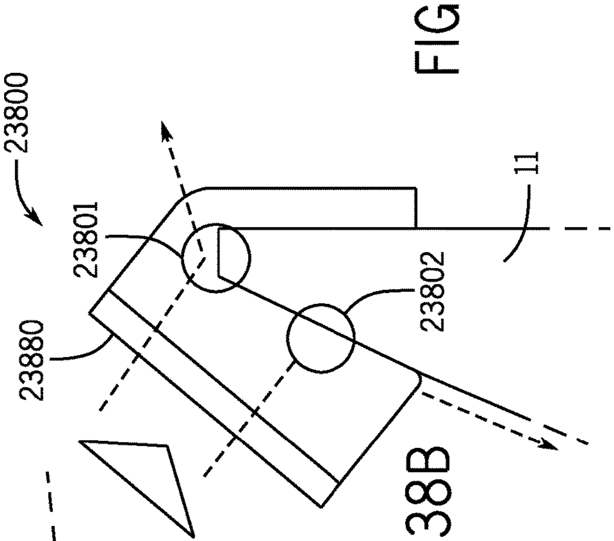
Figure 238A:
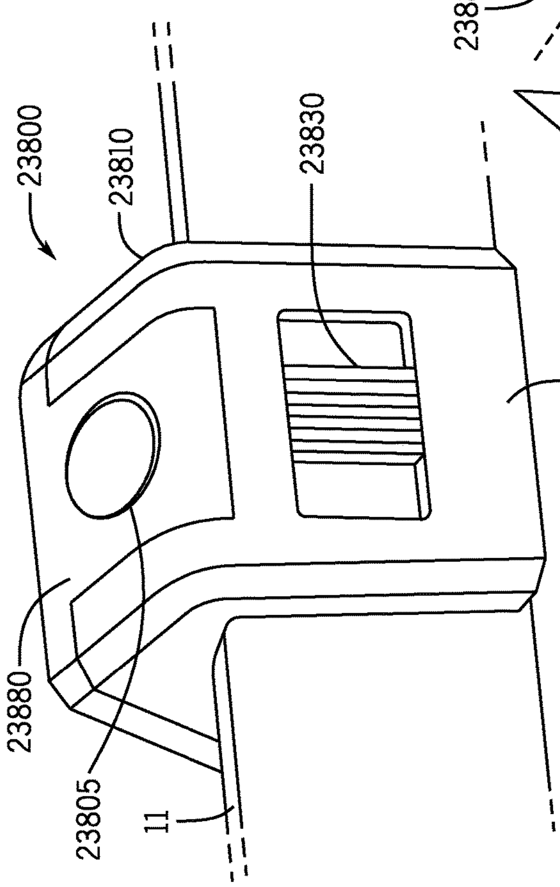

FIGS. 237A-237C illustrate perspective views of a privacy/security enclosure in accordance with some embodiments of the invention.

FIGS. 238A-238D illustrate perspective views of a privacy/security enclosure in accordance with some embodiments of the invention.

Figure 239C:
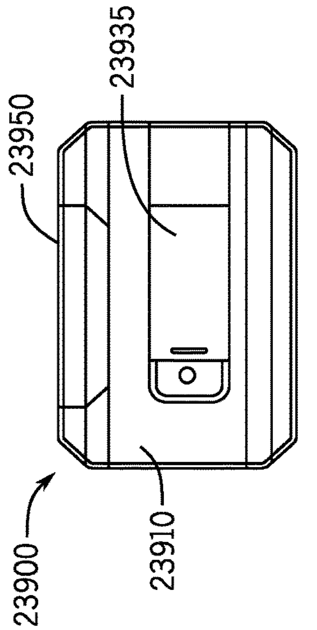
Figure 239B:
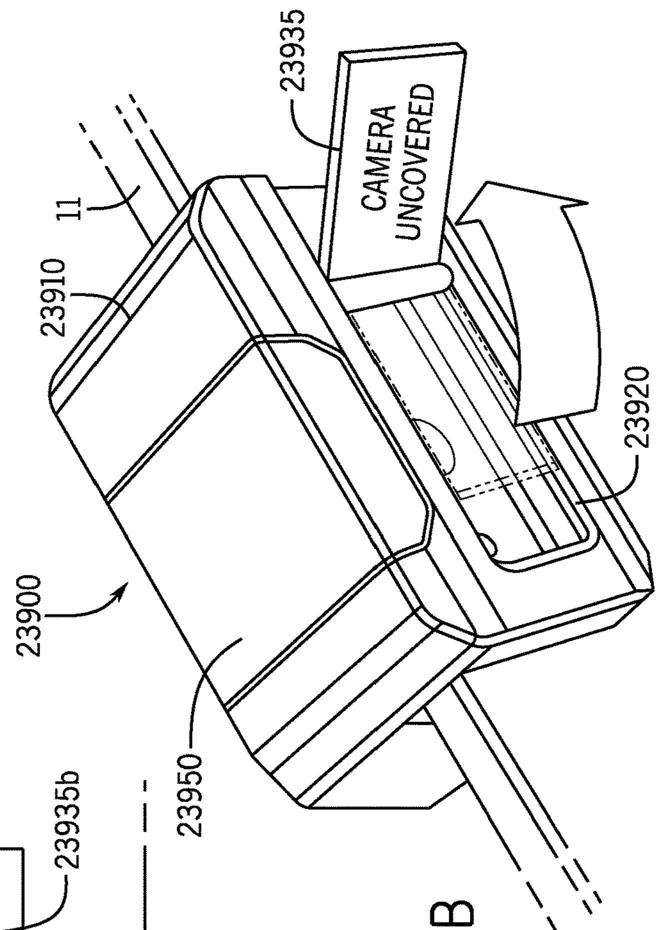
Figure 239A:
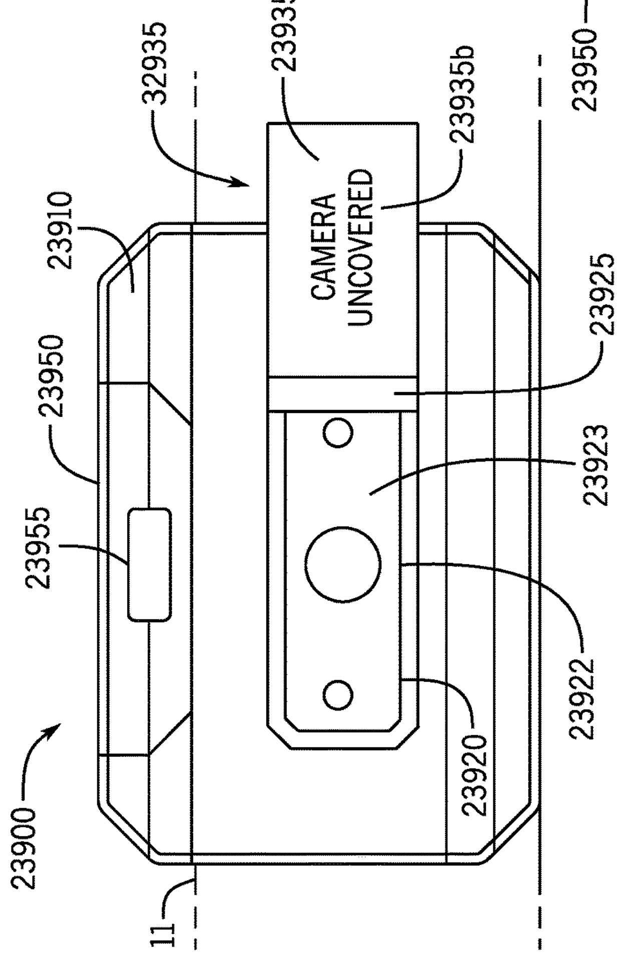

FIGS. 239A-239C illustrate perspective views of a privacy/security enclosure in accordance with some embodiments of the invention.

Figure 240C:
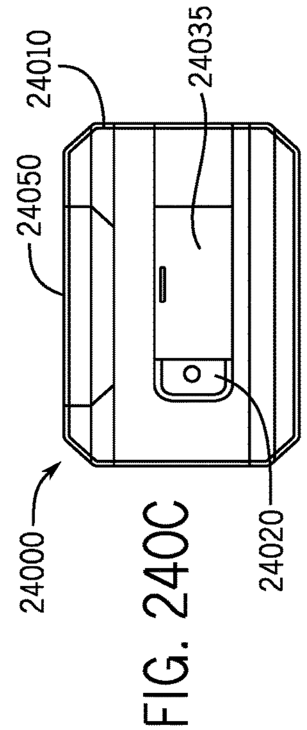
Figure 240B:
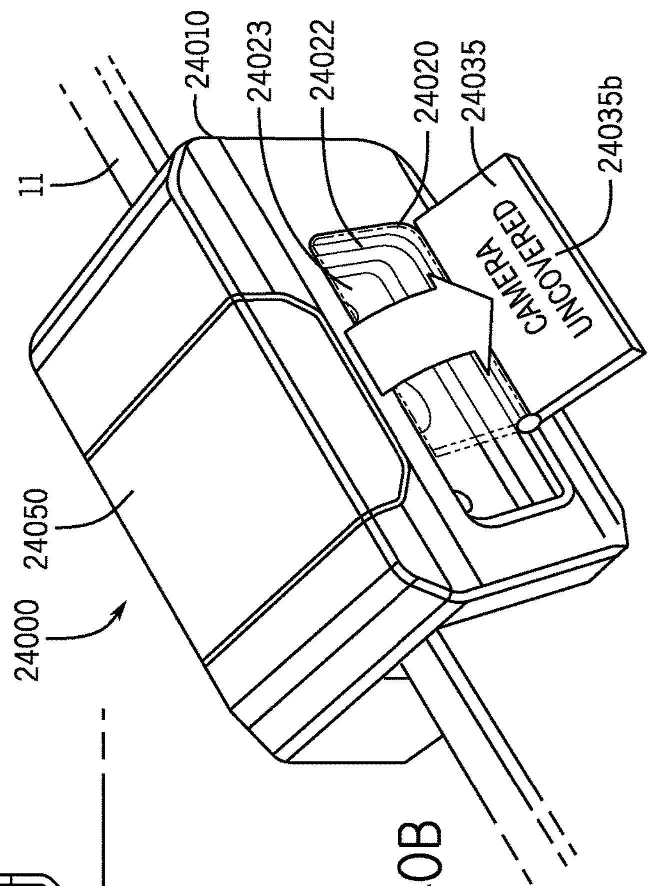
Figure 240A:
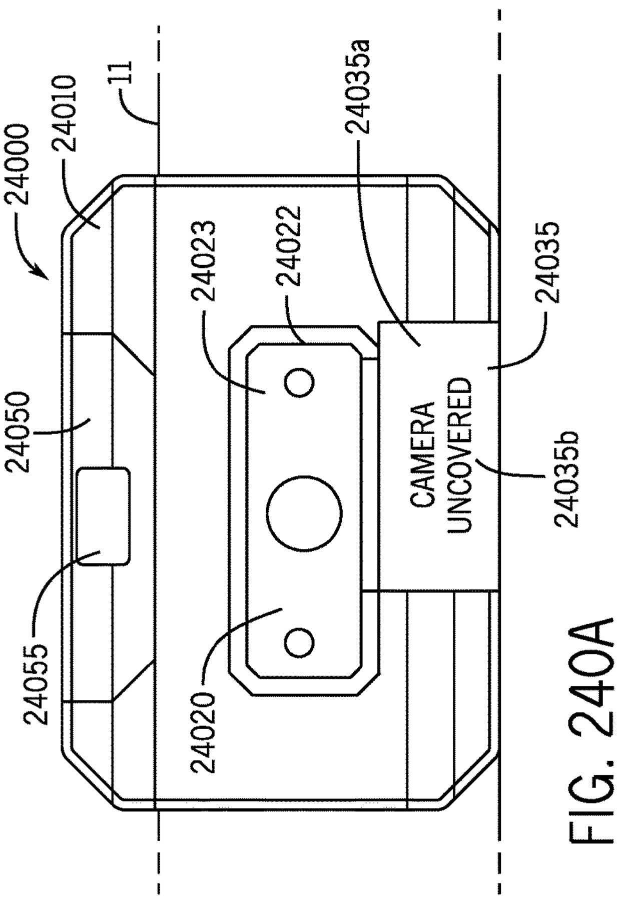

FIGS. 240A-240C illustrates perspective views of a privacy/security enclosure in accordance with some embodiments of the invention.

Figure 241C:
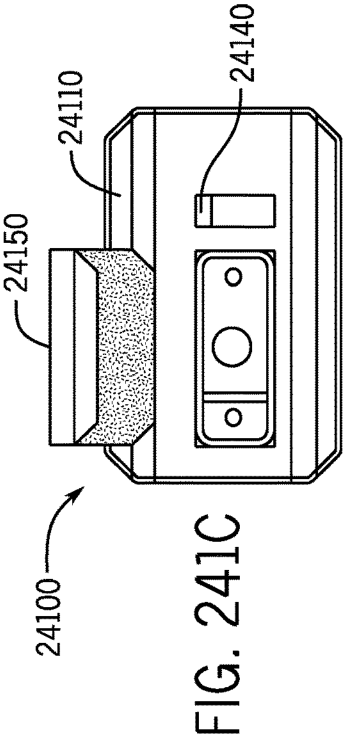
Figure 241B:
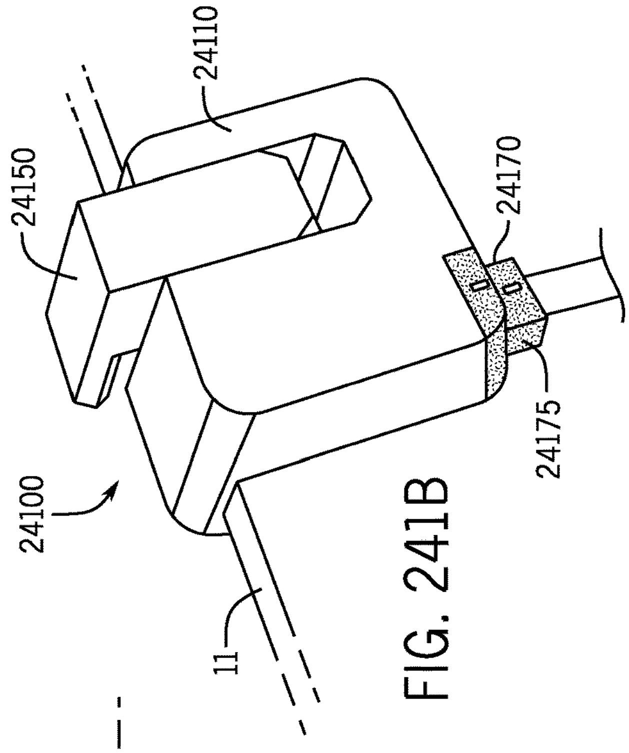
Figure 241A:
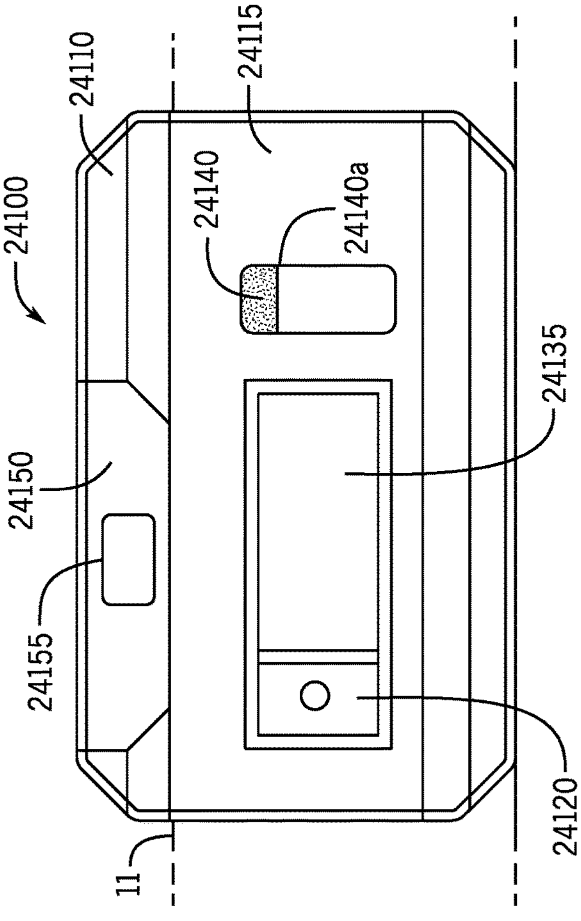

FIGS. 241A-241C illustrates perspective views of a privacy/security enclosure in accordance with some embodiments of the invention.

Figure 242C:
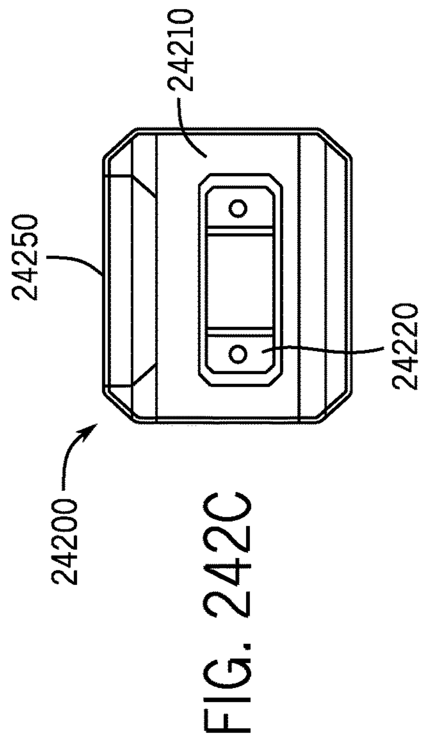
Figure 242B:
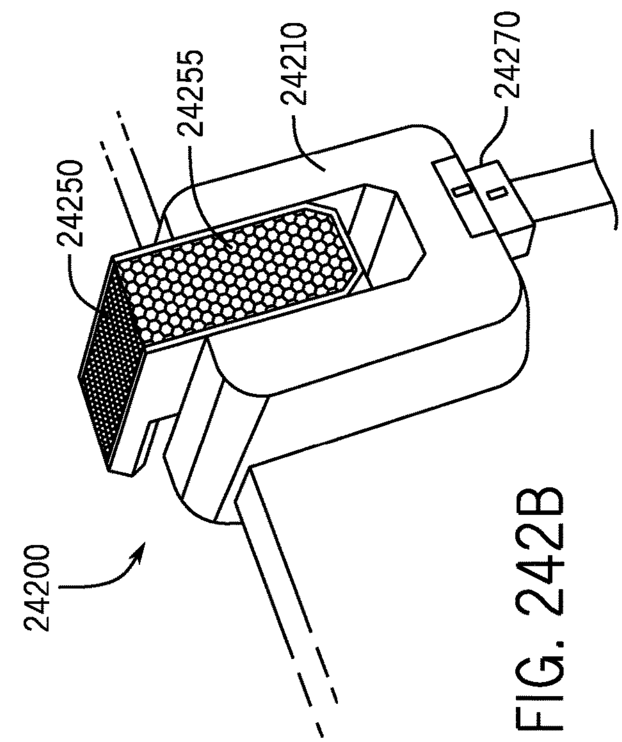
Figure 242A:
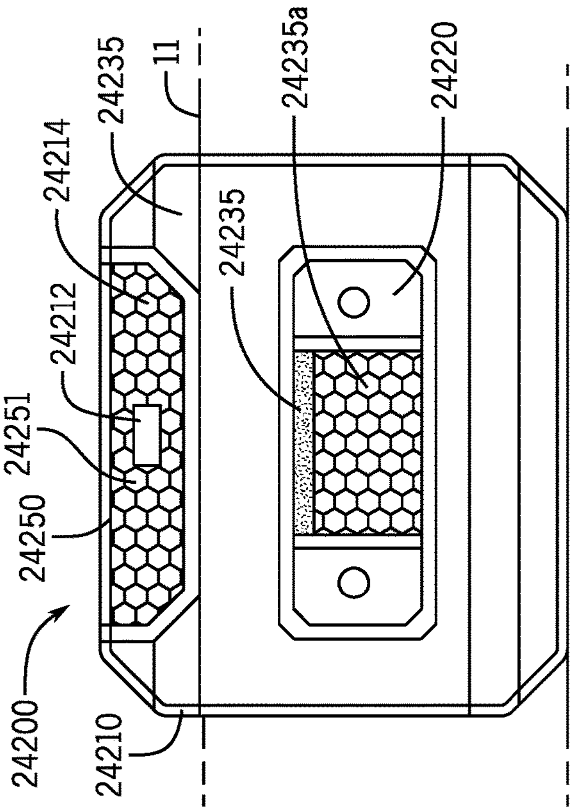
Figures 243A, 243B, 243C, 243D:
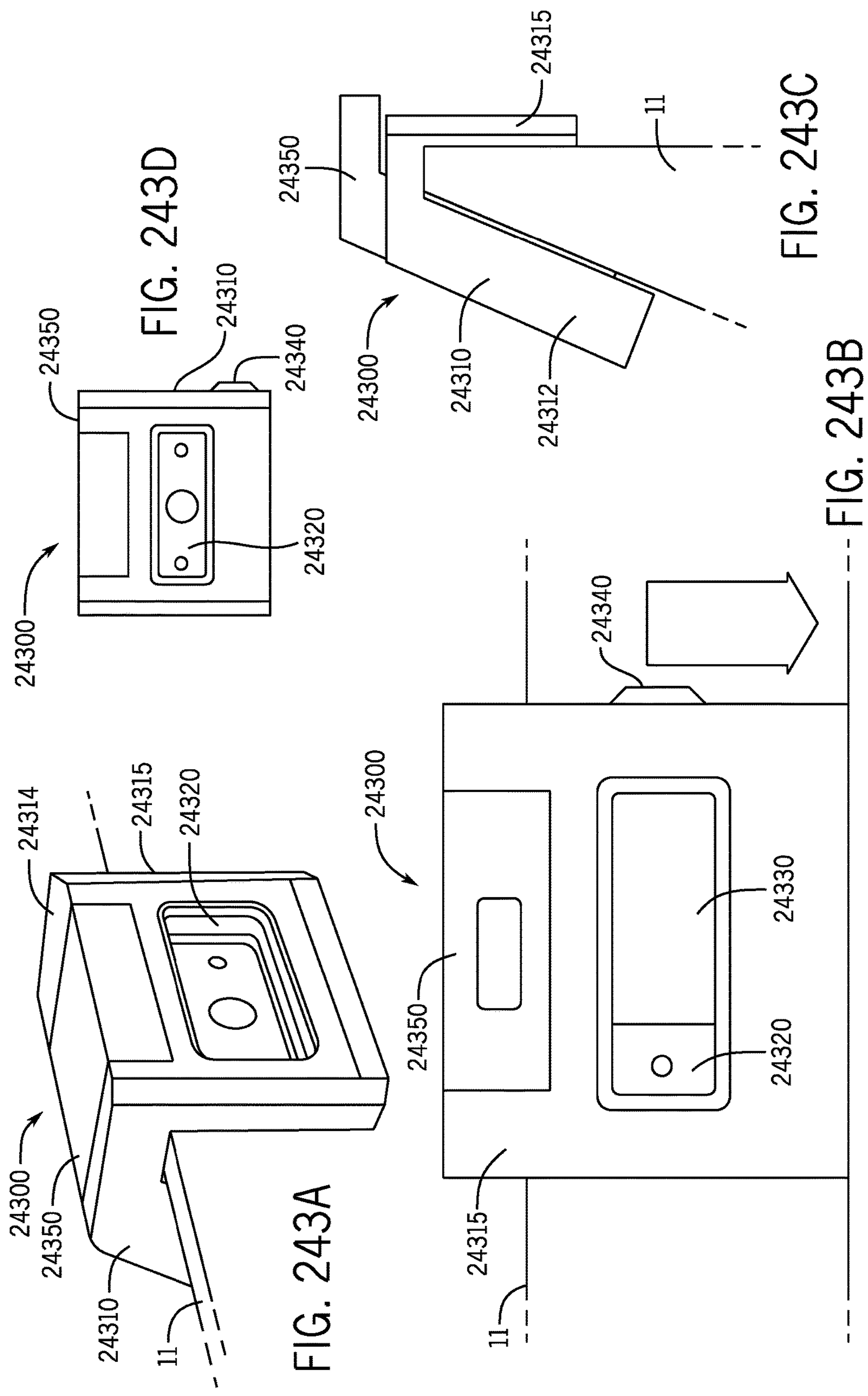

FIGS. 242A-242C illustrates perspective views of a privacy/security enclosure in accordance with some embodiments of the invention.

FIGS. 243A-243D illustrates perspective views of a privacy/security enclosure in accordance with some embodiments of the invention.

Figure 244C:
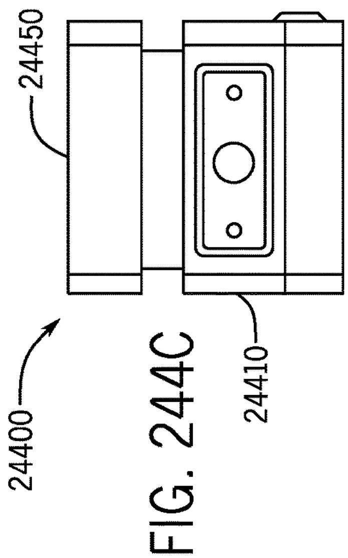
Figure 244B:
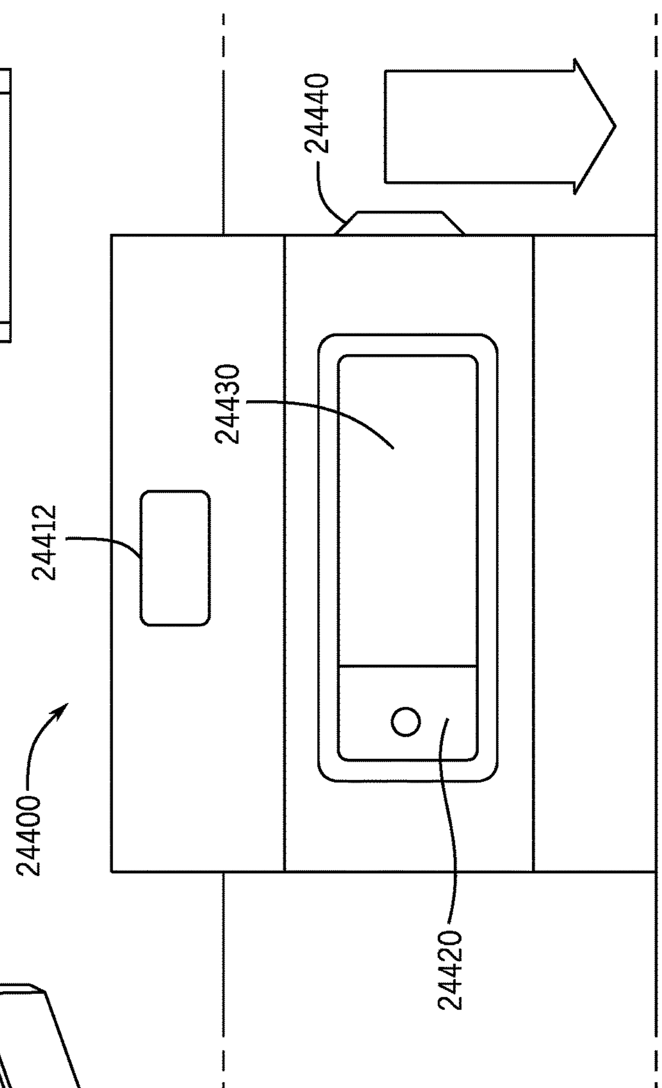
Figure 244A:
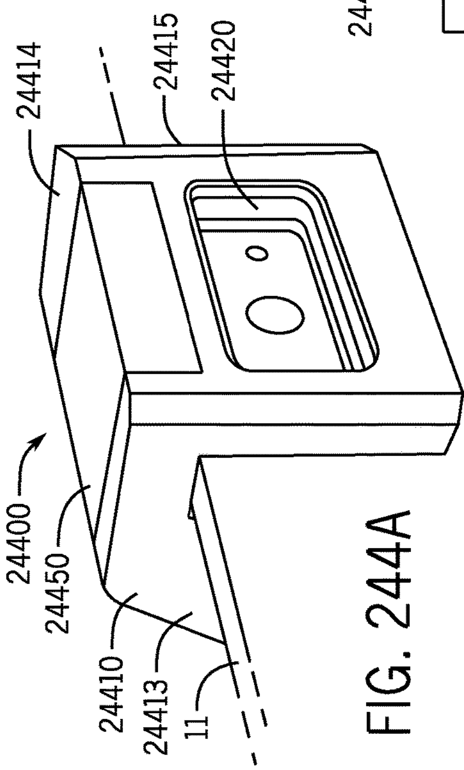

FIGS. 244A-244C illustrates perspective views of a privacy/security enclosure in accordance with some embodiments of the invention.

Figure 245A:
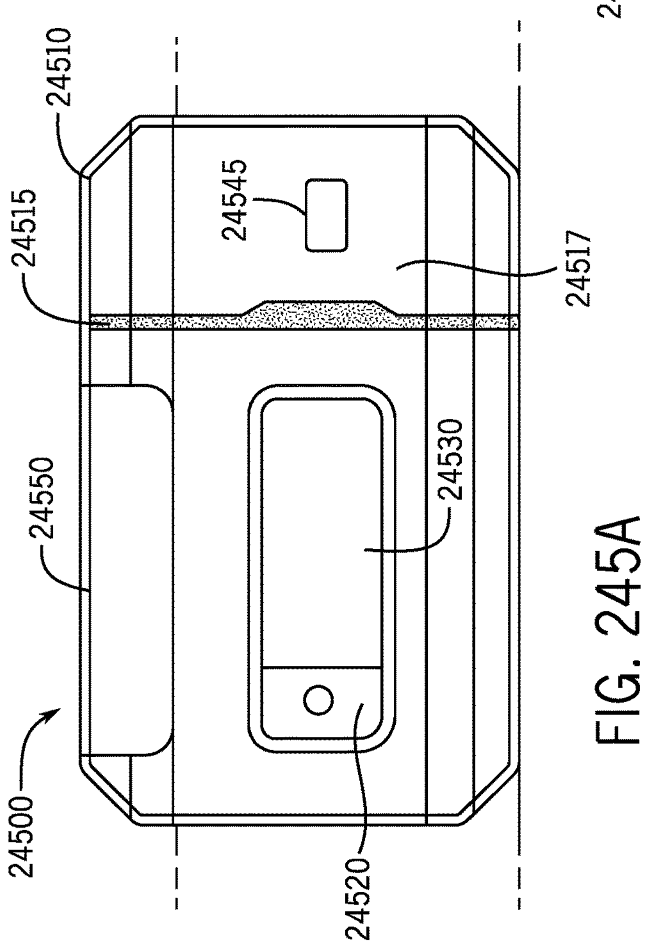
Figure 245B:
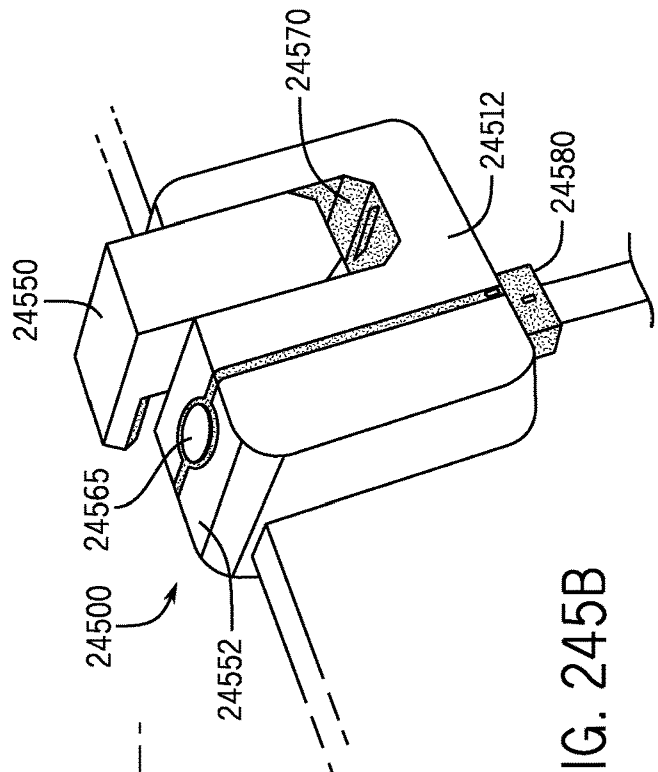
Figure 245C:
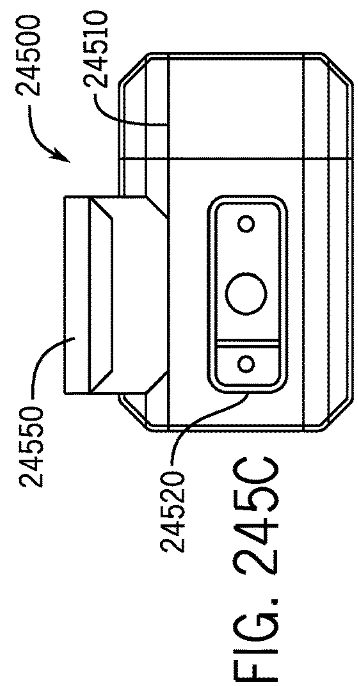

FIGS. 245A-245C illustrates perspective views of a privacy/security enclosure in accordance with some embodiments of the invention.

Figure 246D:
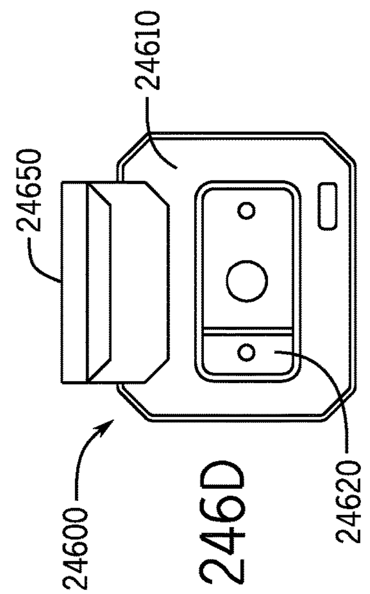
Figure 246C:
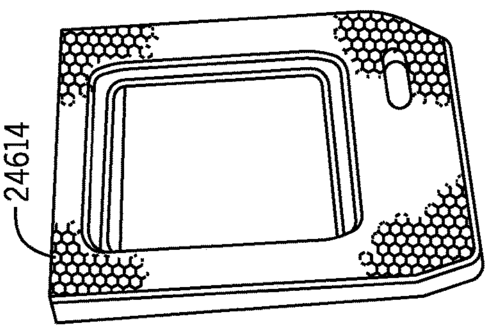
Figure 246B:
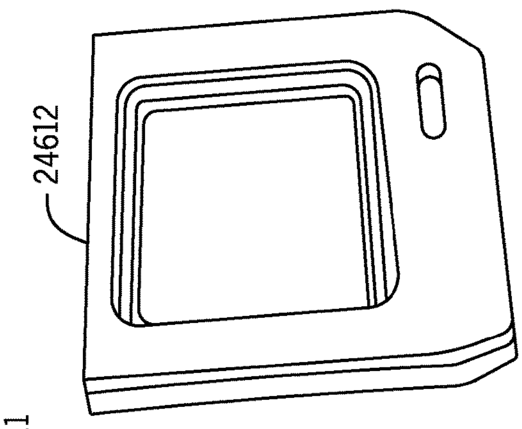
Figure 246A:
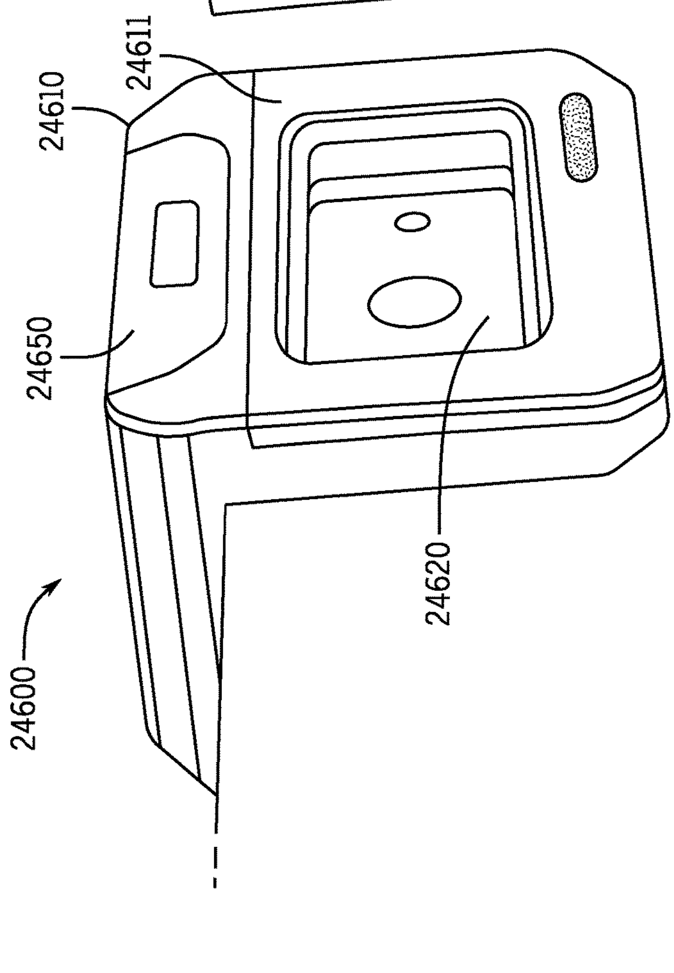
Figure 247:
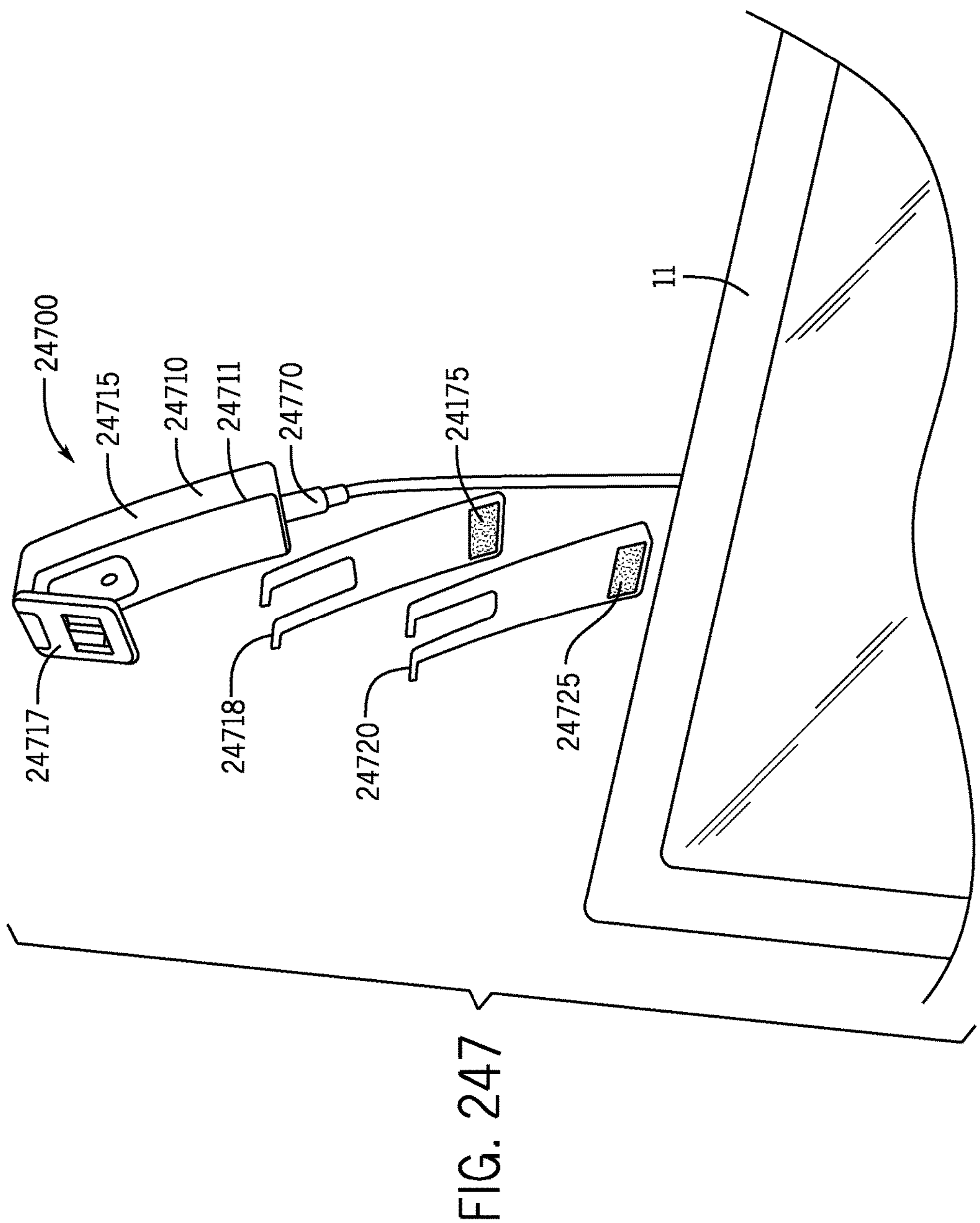

FIGS. 246A-246D illustrate perspective views of a privacy/security enclosure in accordance with some embodiments of the invention in accordance with some embodiments of the invention FIG. 247 illustrates a privacy/security enclosure mounting assembly view in accordance with some embodiments of the invention.

Figure 248:
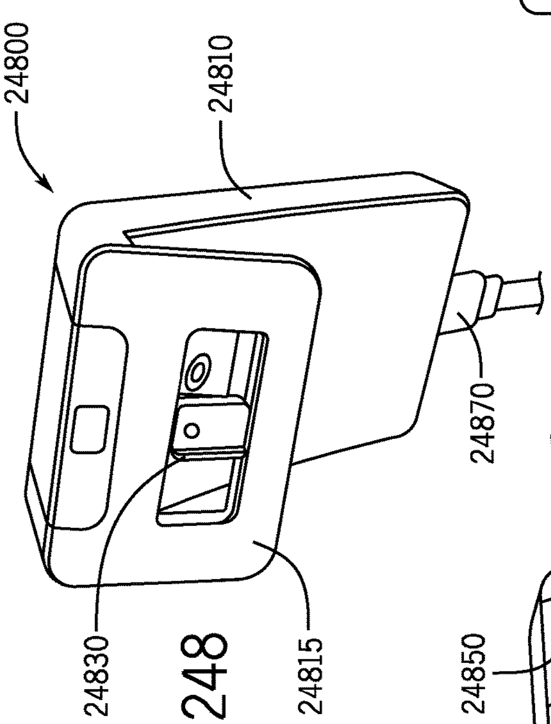

FIG. 248 illustrates a front perspective view of a privacy/security enclosure in accordance with some embodiments of the invention.

Figure 249:
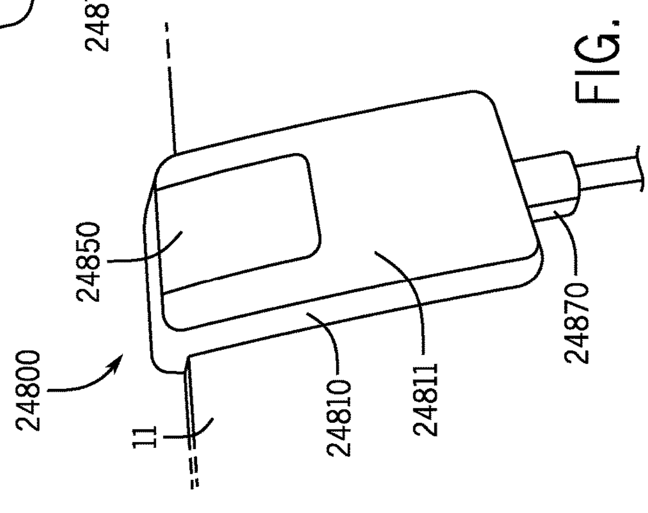

FIG. 249 illustrates a rear perspective view of the privacy/security enclosure of FIG. 248 mounted to a display device in accordance with some embodiments of the invention.

Figure 250:
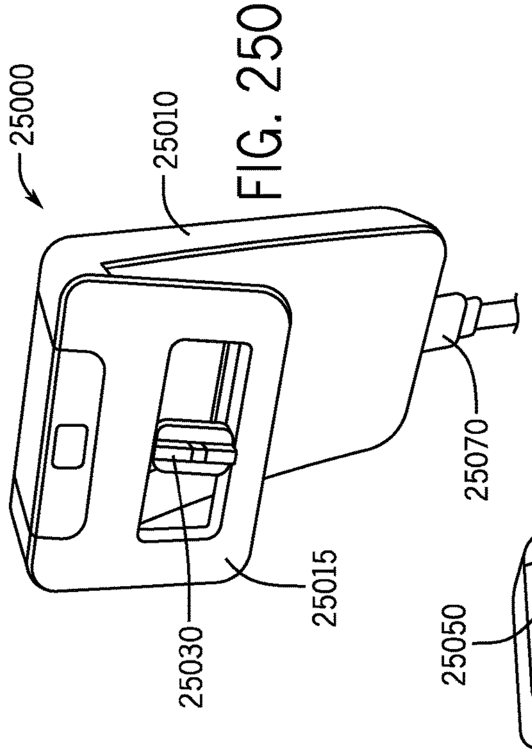

FIG. 250 illustrates a front perspective view of a privacy/security enclosure in accordance with some embodiments of the invention.

Figure 251:
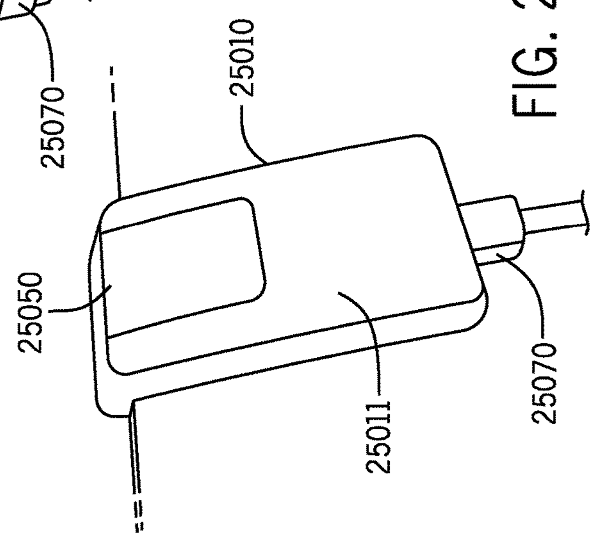

FIG. 251 illustrates a rear perspective view of the privacy/security enclosure of FIG. 250 mounted to a computer or display device in accordance with some embodiments of the invention.

Figure 252:
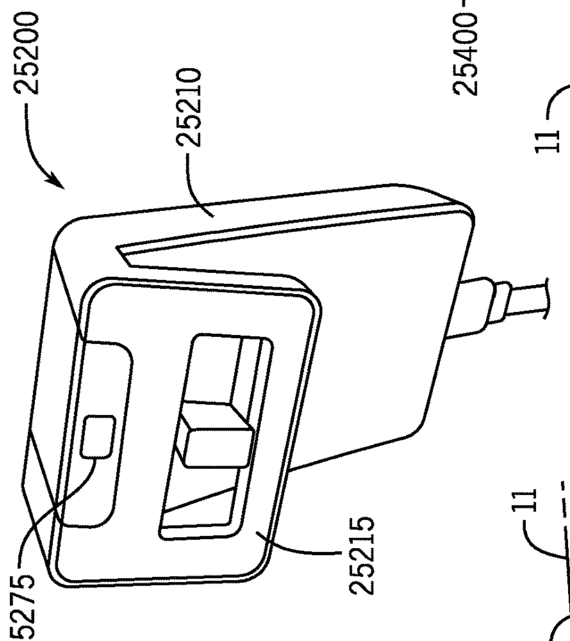

FIG. 252 illustrates a front perspective view of a privacy/security enclosure in accordance with some embodiments of the invention.

Figure 253:
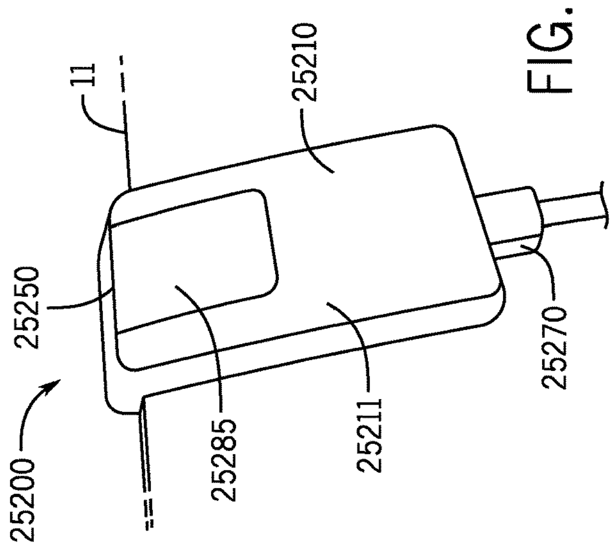

FIG. 253 illustrates a rear perspective view of the privacy/security enclosure of FIG. 248 mounted to a computer or display device in accordance with some embodiments of the invention.

Figure 254:
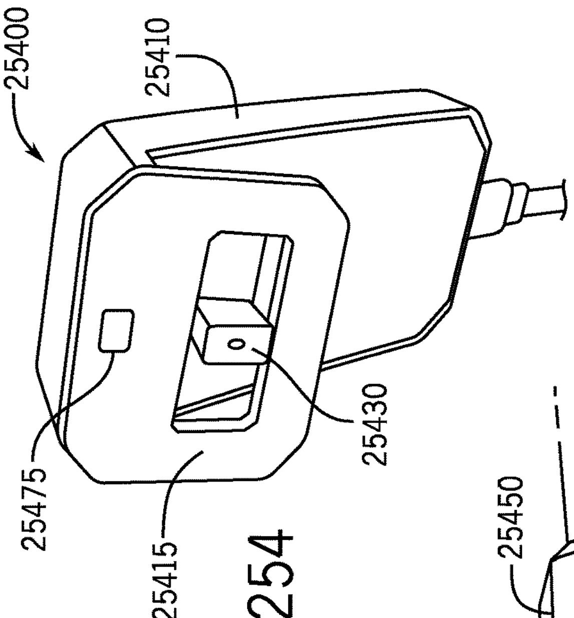

FIG. 254 illustrates a front perspective view of a privacy/security enclosure in accordance with some embodiments of the invention.

Figure 255:
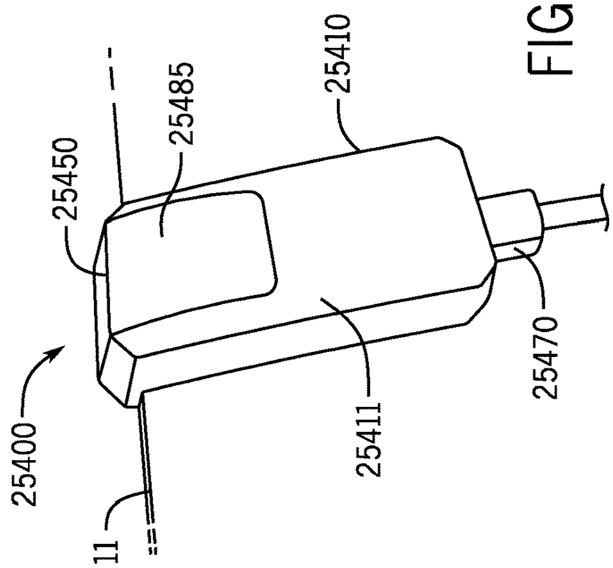

FIG. 255 illustrates a rear perspective view of the privacy/security enclosure of FIG. 250 mounted to a computer or display device in accordance with some embodiments of the invention.

Figure 256:
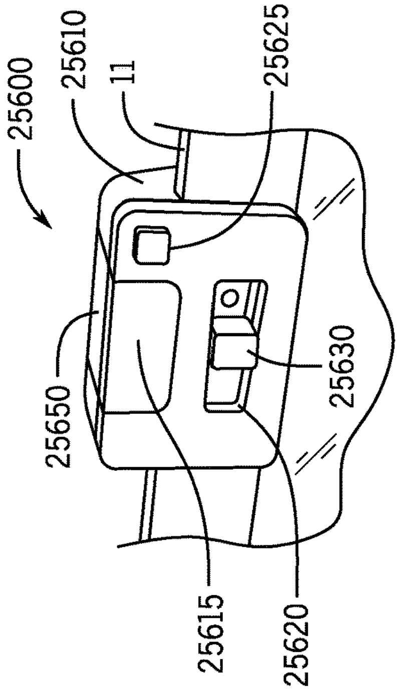

FIG. 256 illustrates a perspective view of a computer or display mounted privacy/security enclosure in accordance with some embodiments of the invention.

Figure 257:
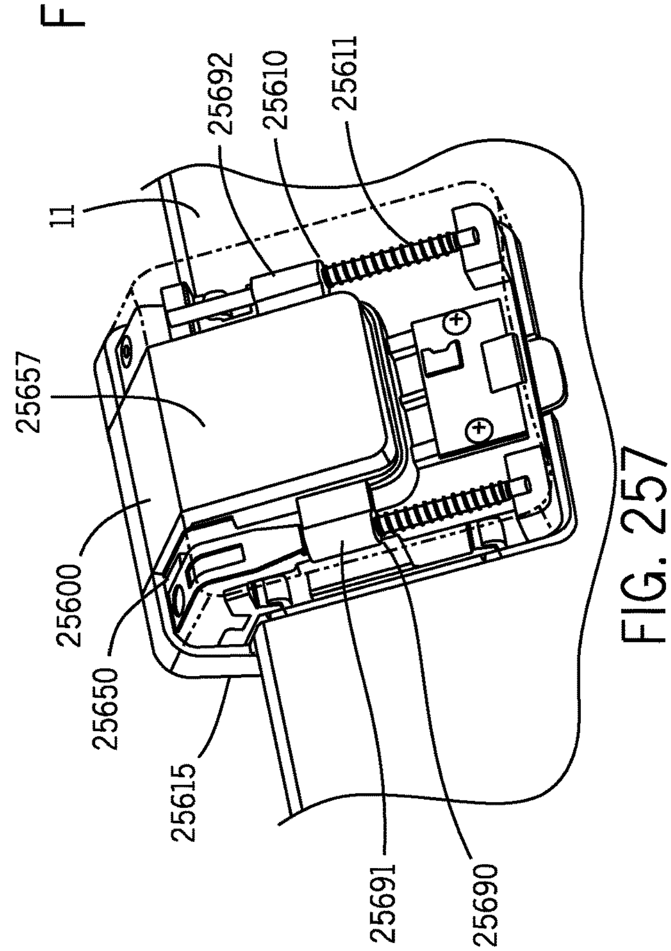
Figures 259, 259A, 259B, 260, 260A, 261, 261A:
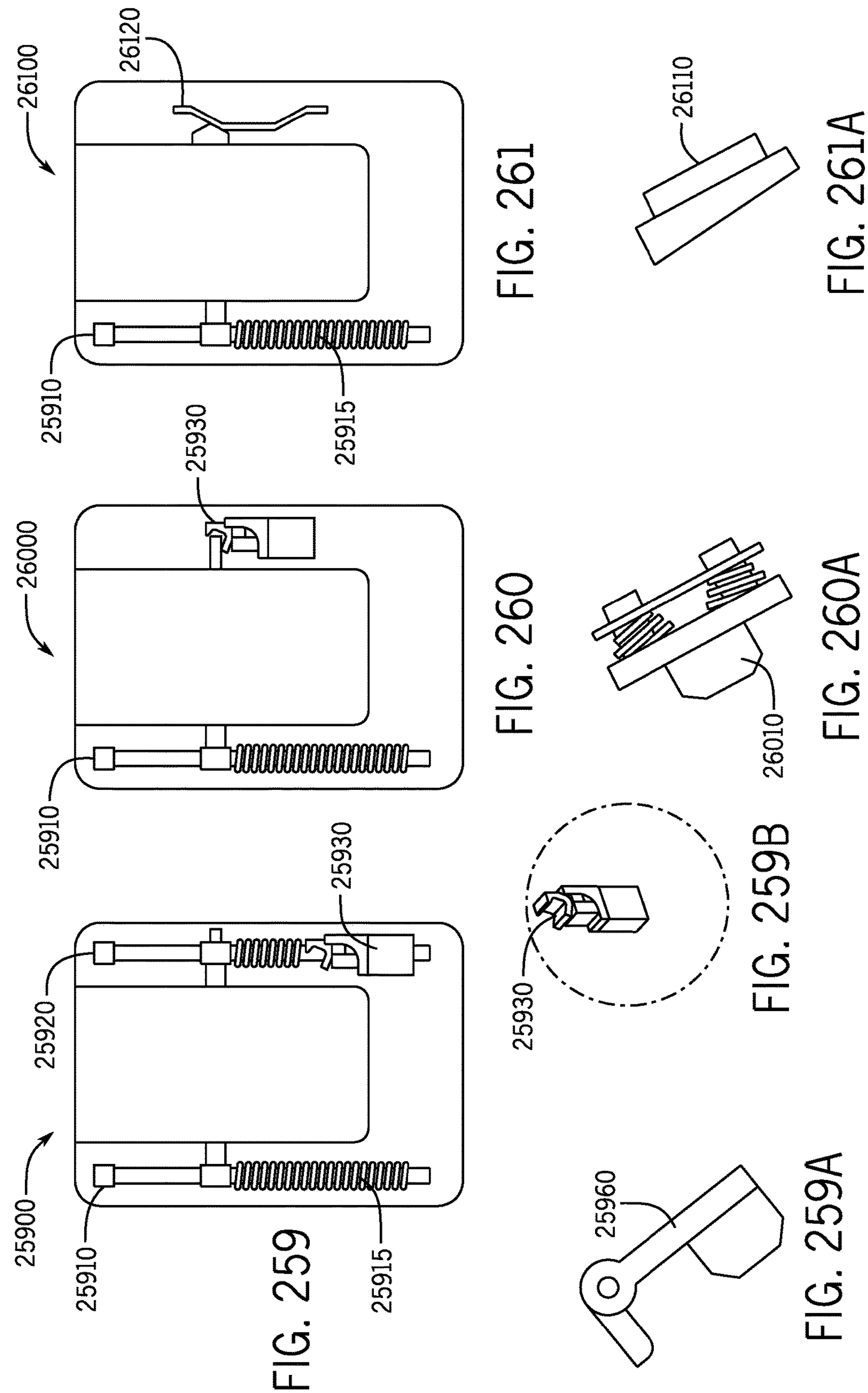

FIG. 257 illustrates a perspective view of a computer or display mounted privacy/security enclosure including a partial internal component view in accordance with some embodiments of the invention.

Figure 258:
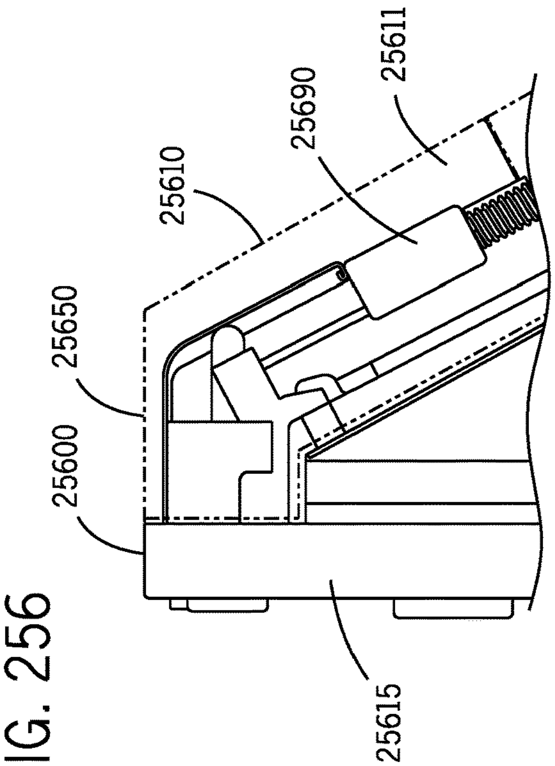

FIG. 258 illustrates a side view of a computer or display mounted privacy/security enclosure including a partial internal component view in accordance with some embodiments of the invention.

FIGS. 259, 259A, 259B, 260, 260A, 261, 261A illustrates internal release mechanisms in accordance with some embodiments of the invention.

Figure 262:
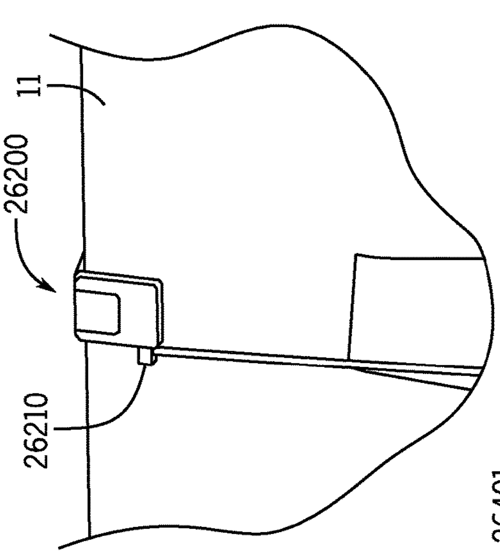
Figure 263:
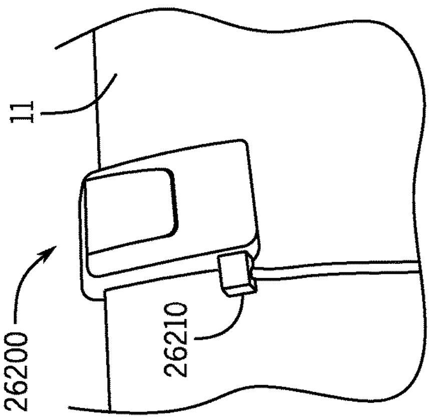

FIGS. 262-263 illustrate rear perspective views of computer or display mounted privacy/security enclosures in accordance with some embodiments of the invention.

Figure 264A:
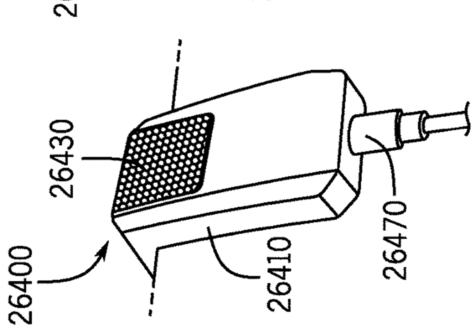
Figure 264B:
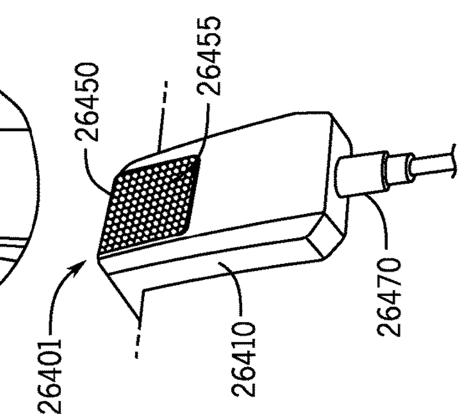

FIGS. 264A-264B illustrates rear perspective views of privacy/security enclosures including textures in accordance with some embodiments of the invention.

Figure 265A:
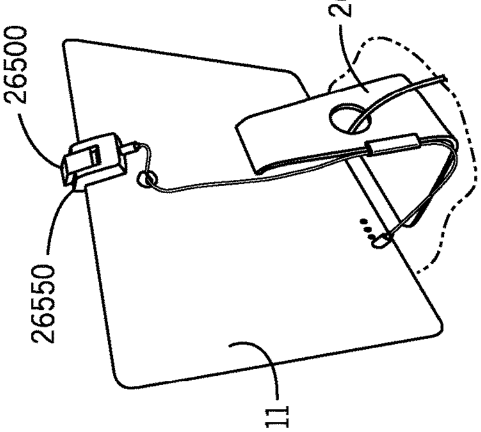
Figure 265B:
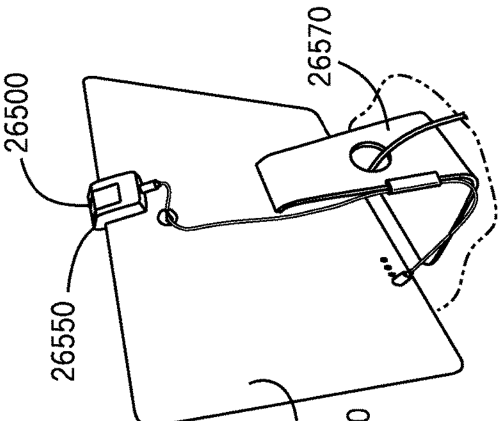

FIGS. 265A-265B illustrate rear perspective views of computer or display mounted privacy/security enclosure with cable management in accordance with some embodiments of the invention.

Figure 266:
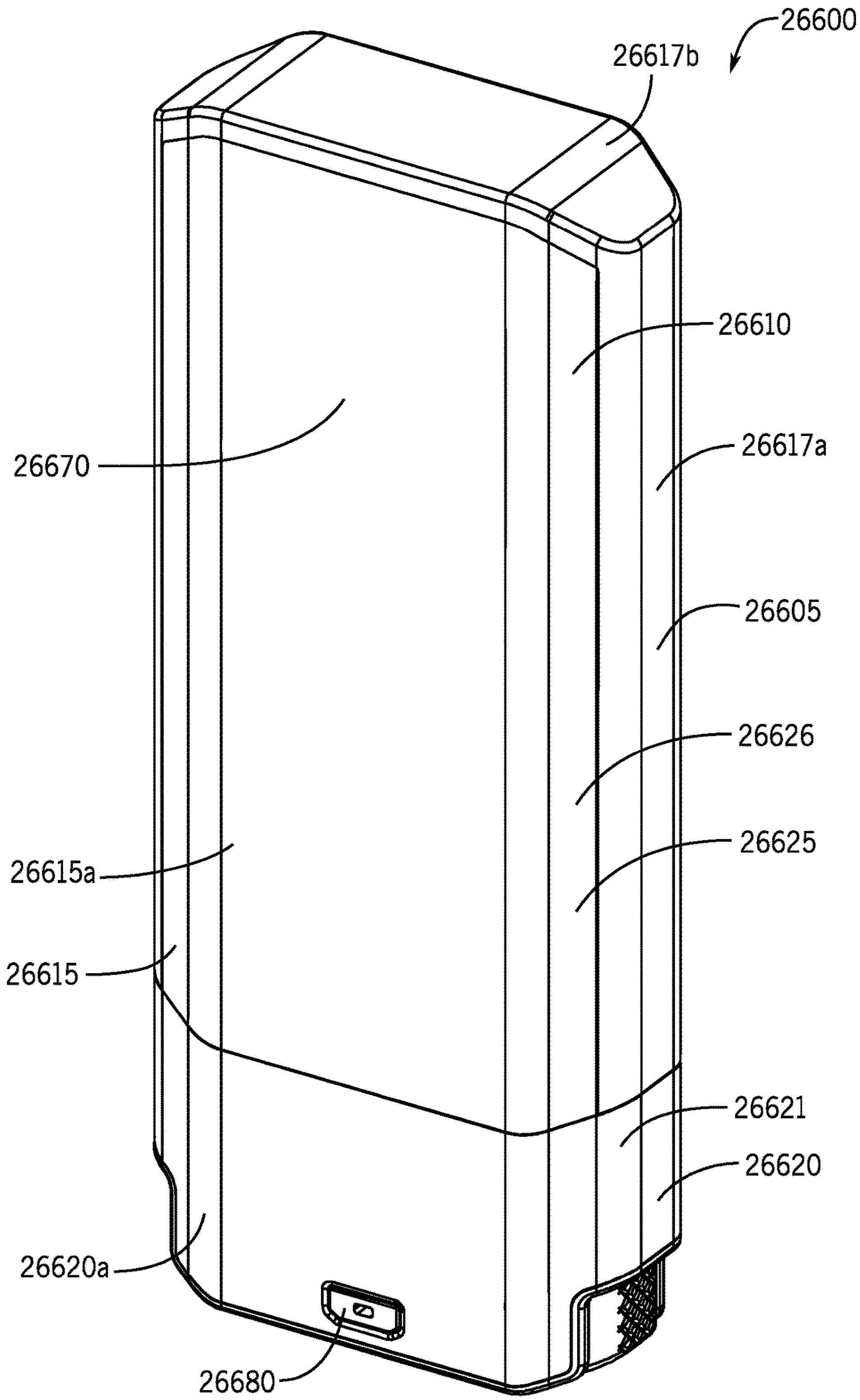

FIG. 266 illustrates a front perspective view of a privacy/security enclosure according to some embodiments of the invention.

Figure 267:
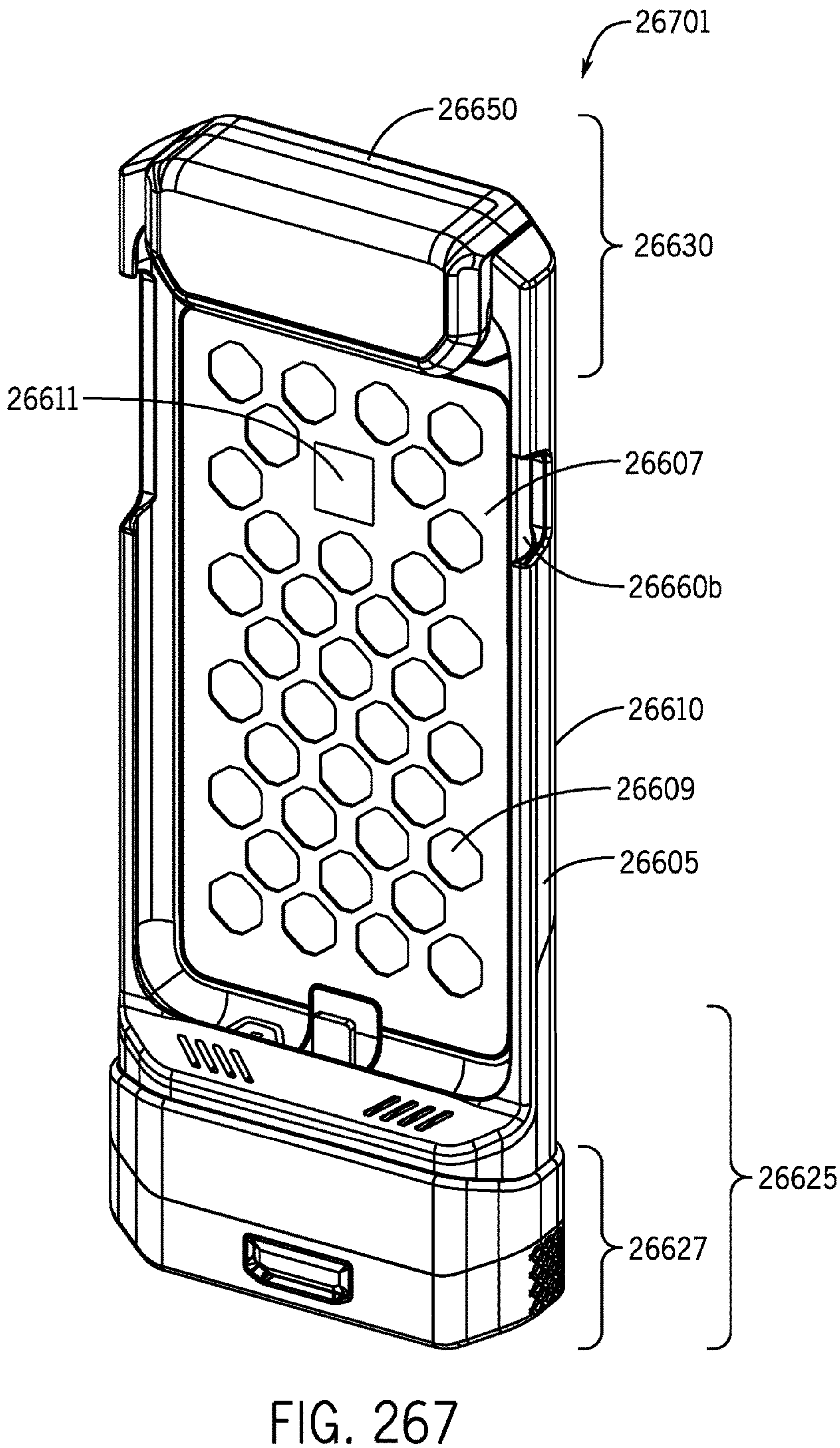

FIG. 267 illustrates a front perspective view of a privacy/security enclosure with a hood or cover portion removed according to some embodiments of the invention.

Figure 268:
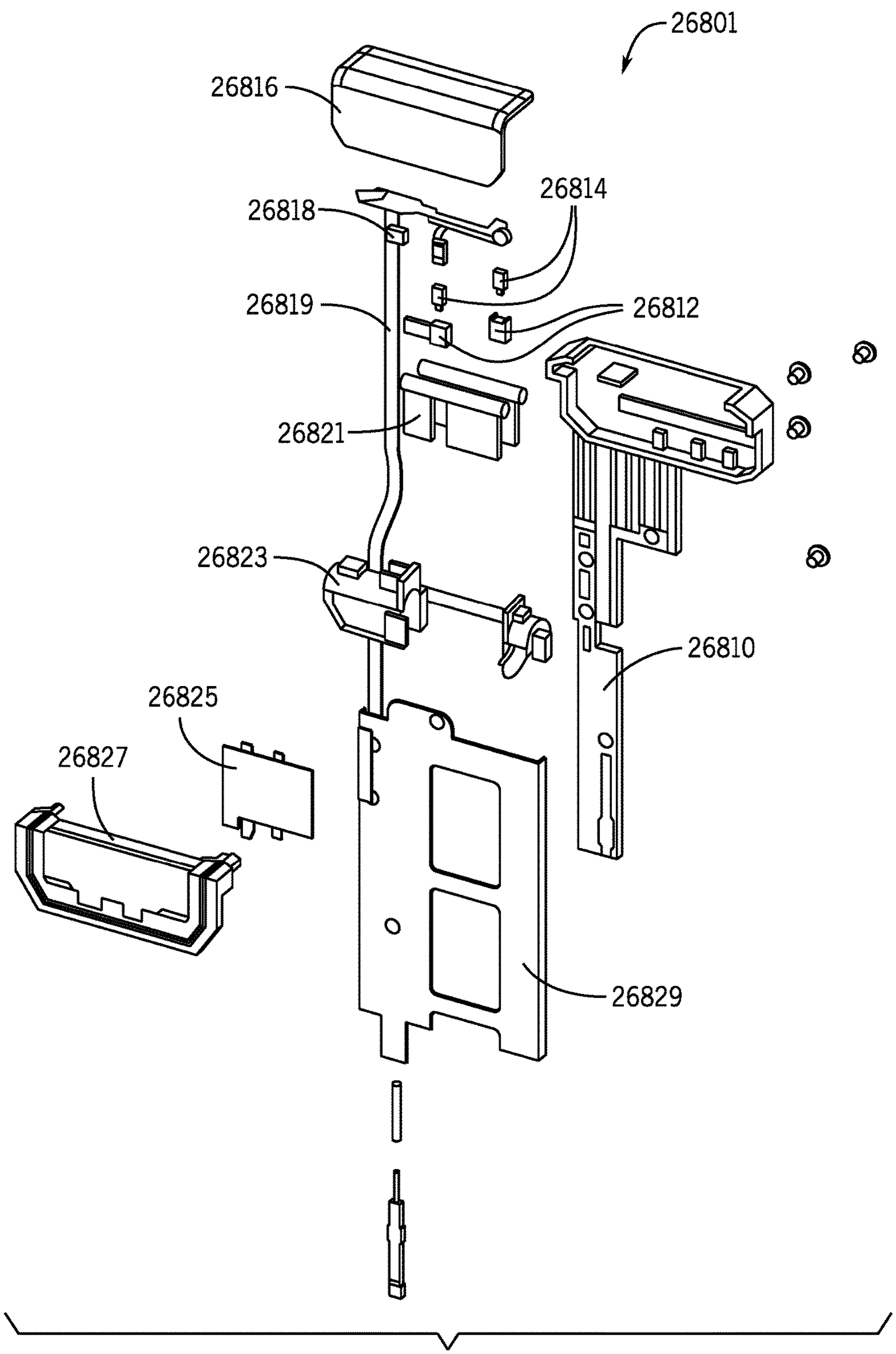

FIG. 268 illustrates an exploded assembly view of portions of the privacy/security enclosure in accordance with some embodiments of the invention.

Figure 269:
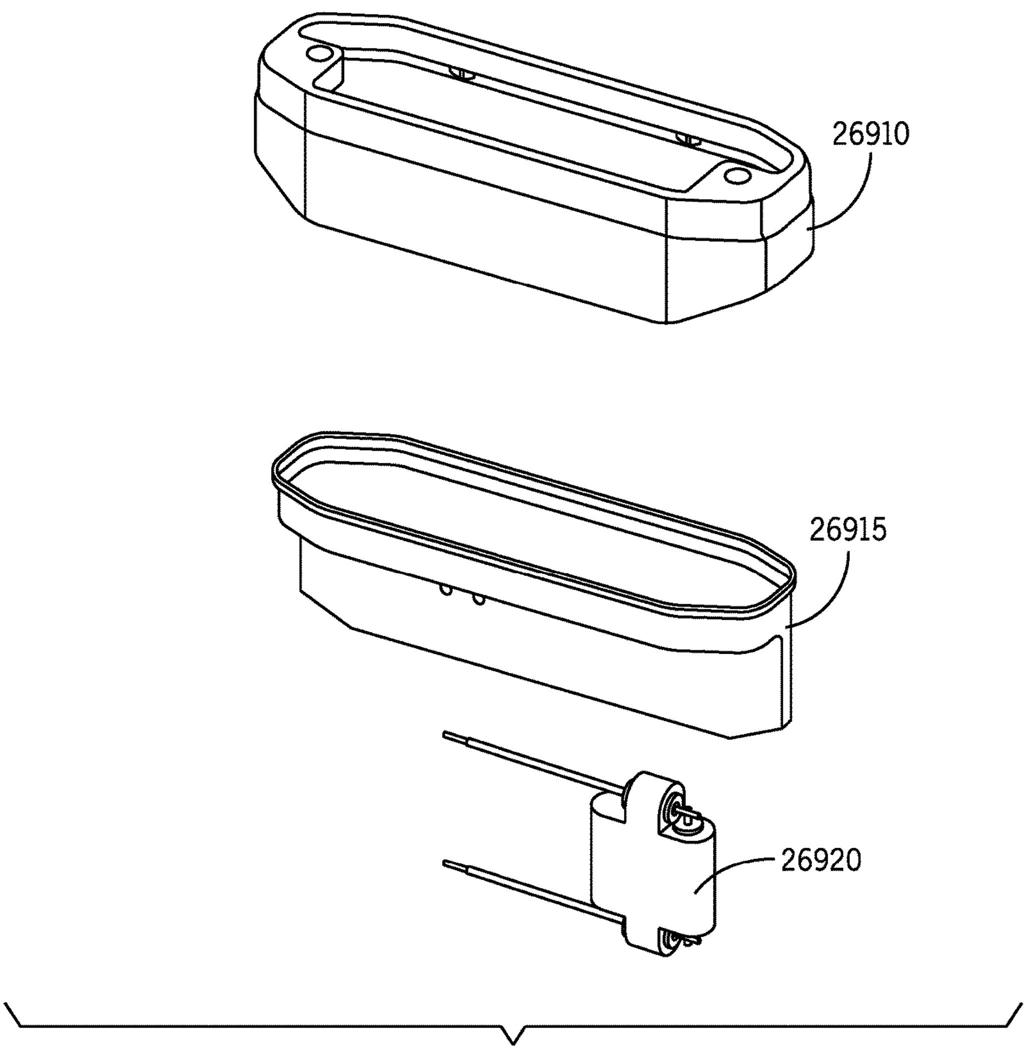

FIG. 269 illustrates components of the Faraday base assembly of a privacy/security enclosure in accordance with some embodiments of the invention.

Figure 270:
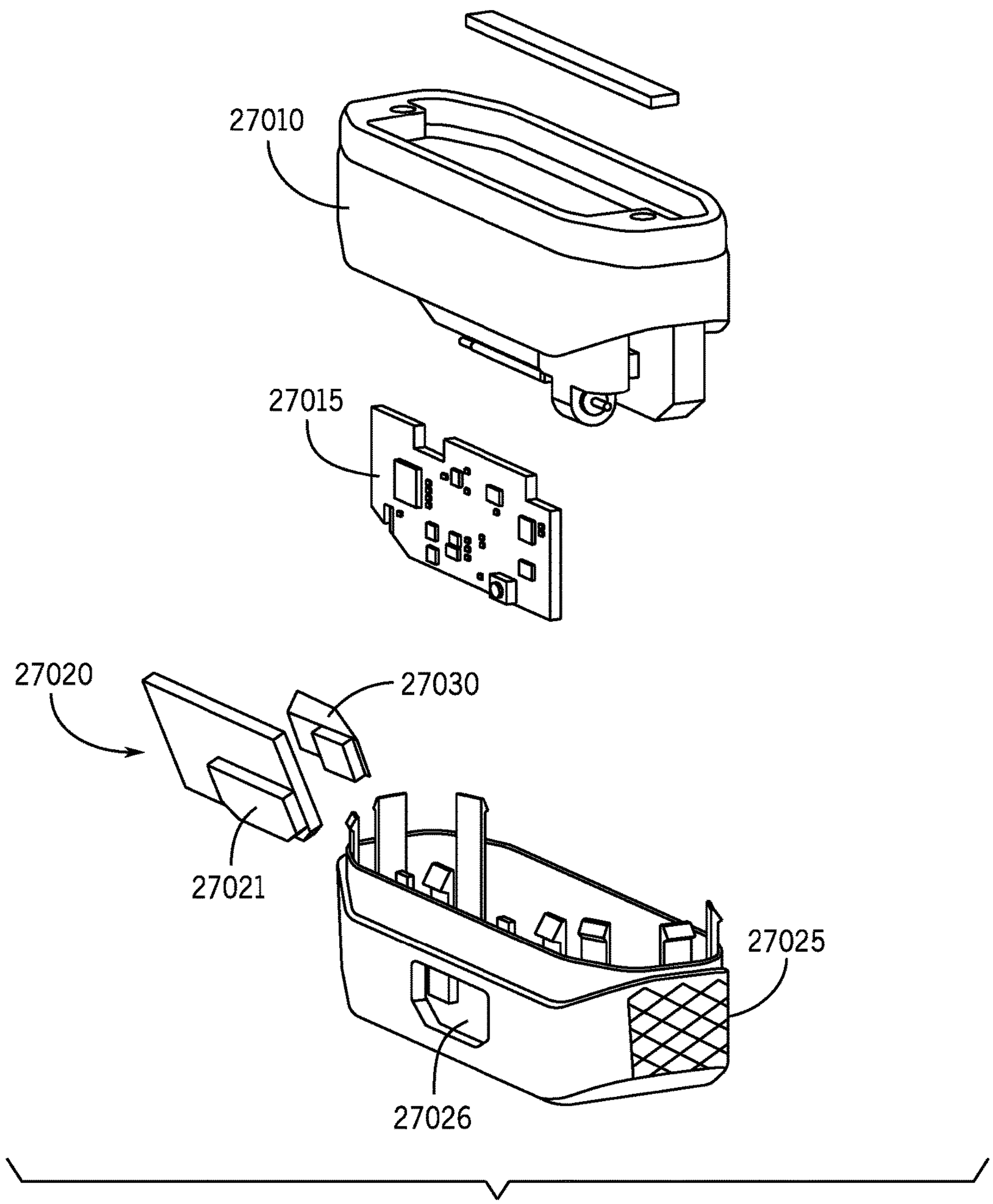

FIG. 270 illustrates an exploded assembly view of portions of the Faraday base assembly in accordance with some embodiments of the invention.

Figure 271:
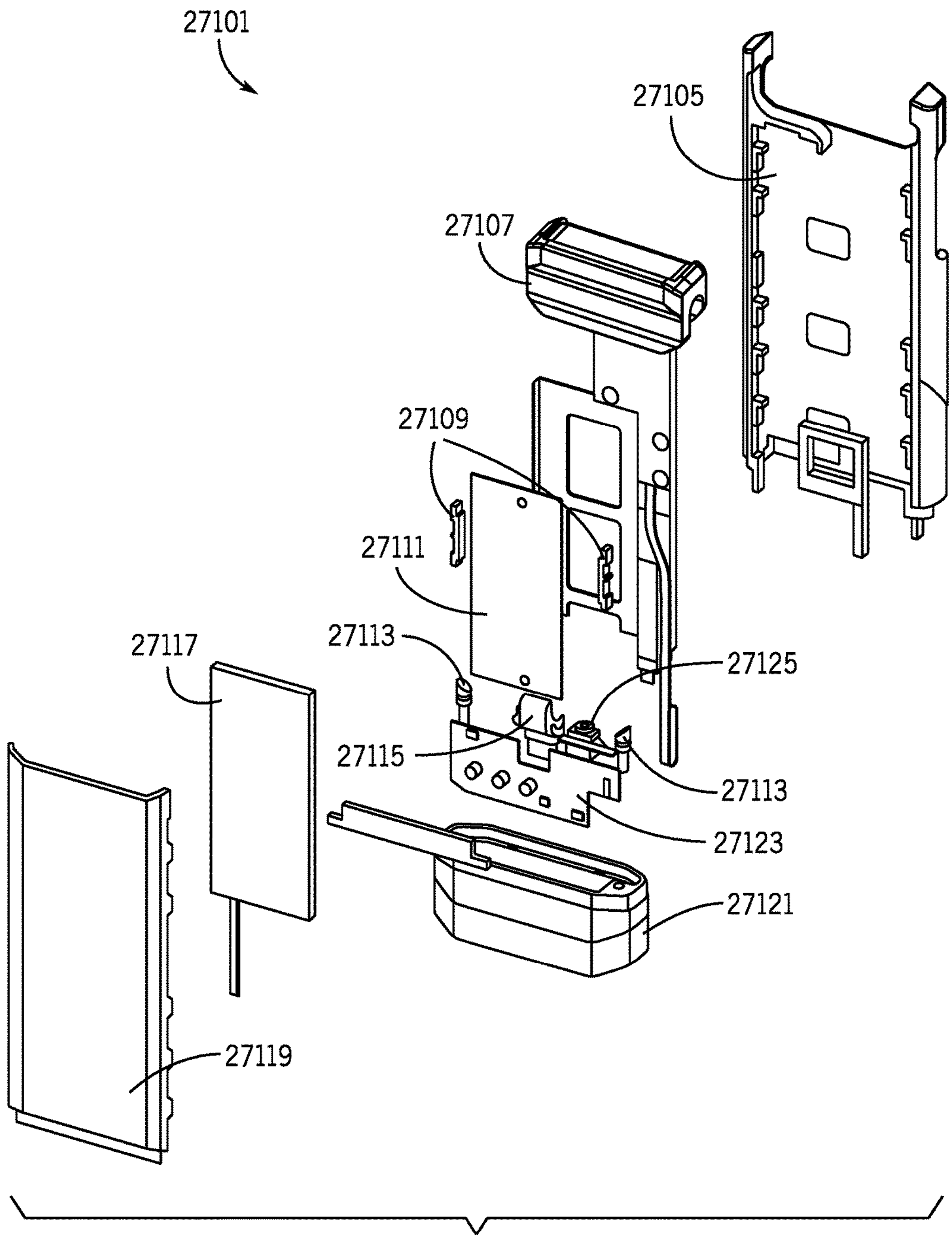

FIG. 271 illustrates an exploded assembly view of portions of the privacy/security enclosure in accordance with some embodiments of the invention.

Figure 272:
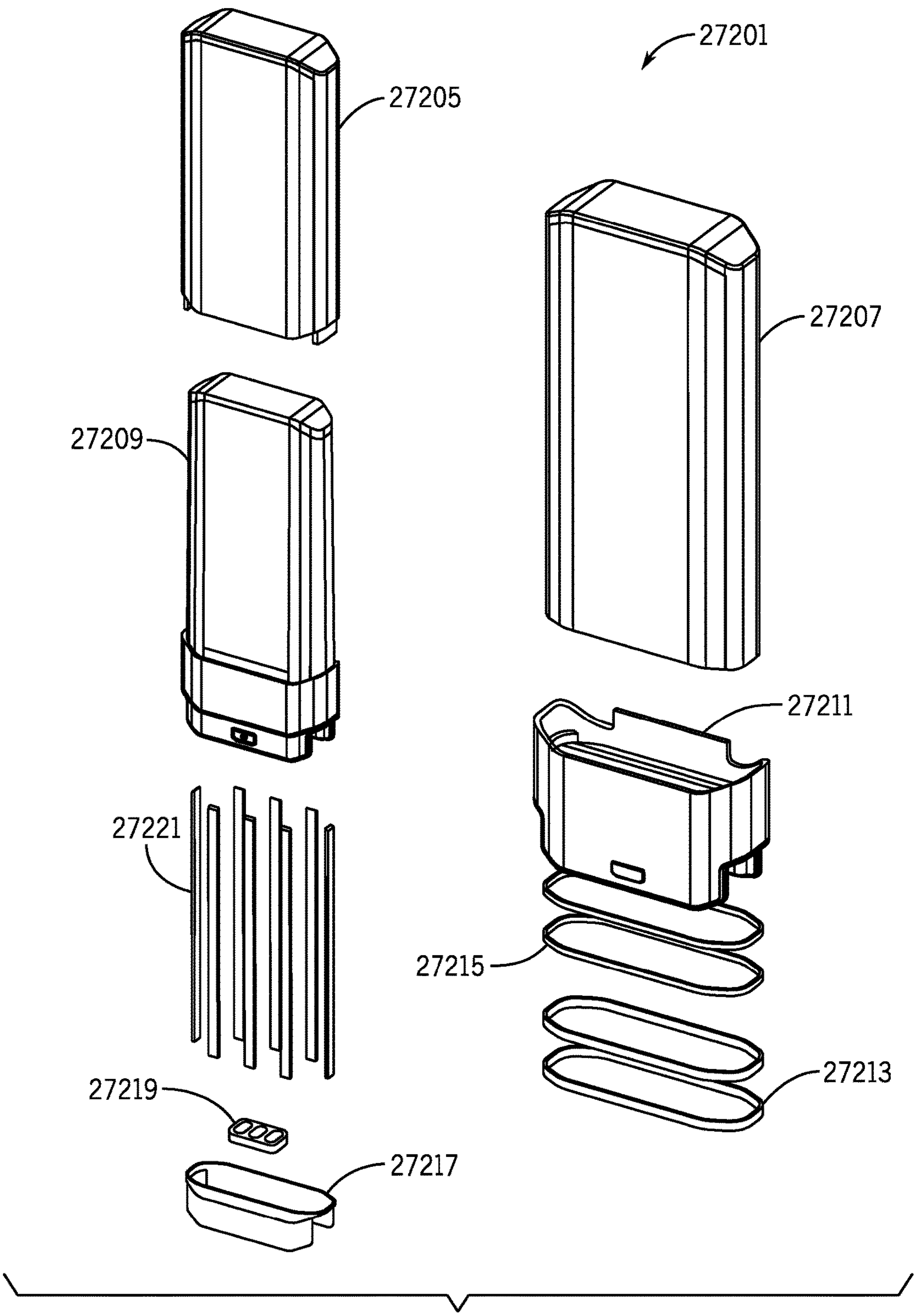

FIG. 272 illustrates an exploded assembly view of portions of the privacy/security enclosure in accordance with some embodiments of the invention.

FIGS. 273-276 illustrate perspective views of privacy/security enclosures including mechanical isolation in accordance with some embodiments of the invention.

Figure 277:
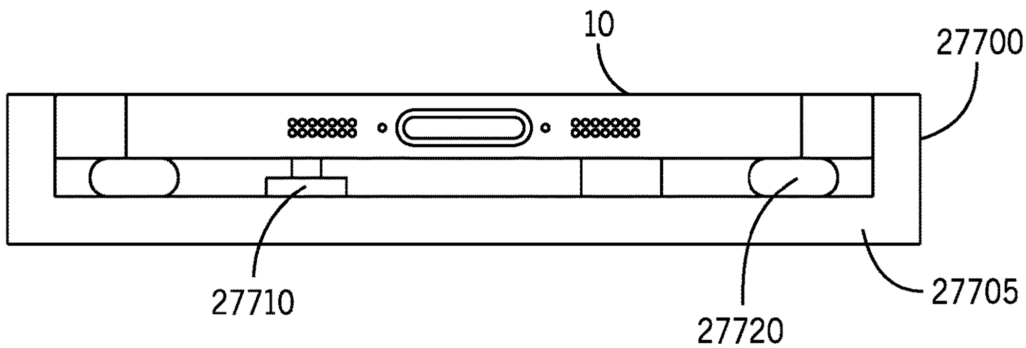

FIG. 277 illustrates an end view of a privacy/security enclosure including broadband vibration in accordance with some embodiments of the invention.

Figure 278:
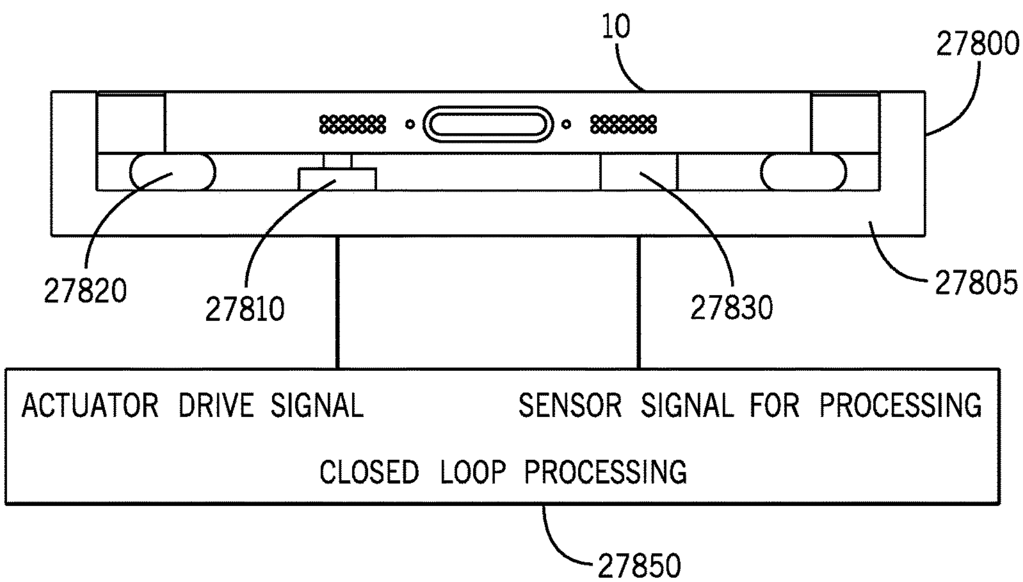

FIG. 278 illustrates an end view of a privacy/security enclosure including active vibration cancellation in accordance with some embodiments of the invention.

Figure 279:
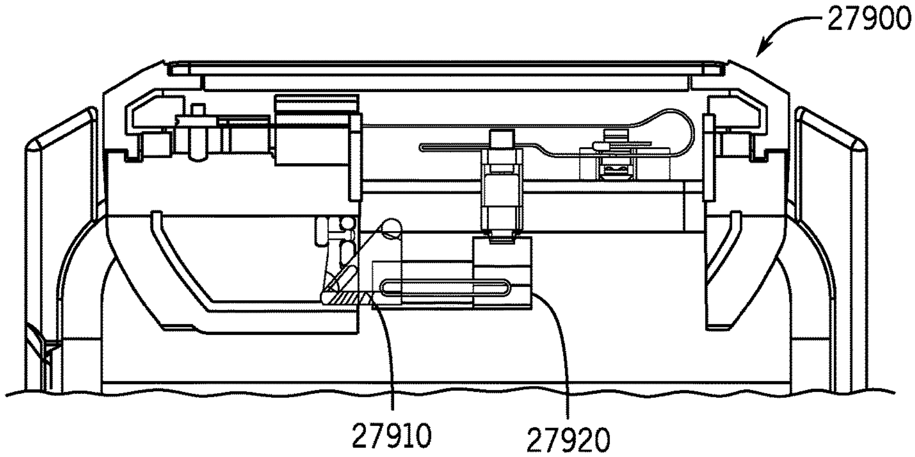
Figure 280:
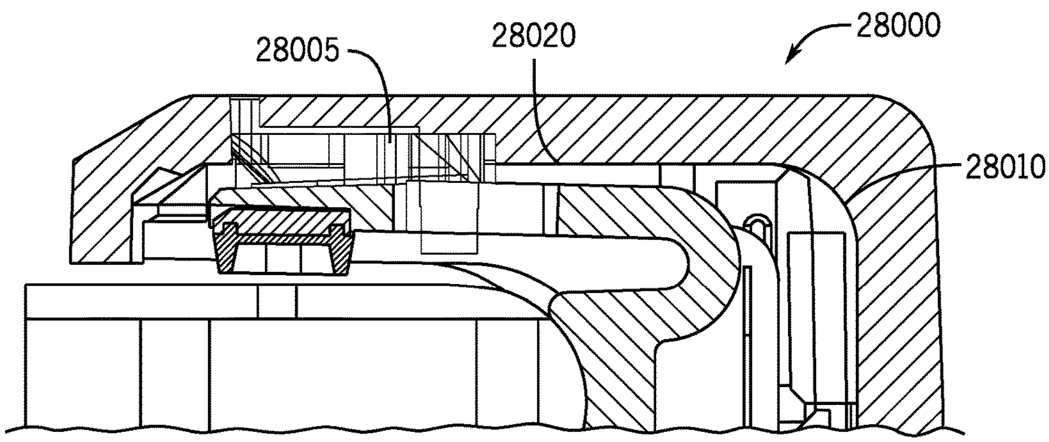
Figure 281:
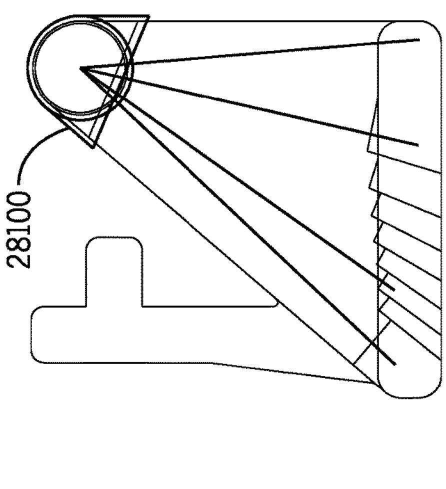
Figure 282:
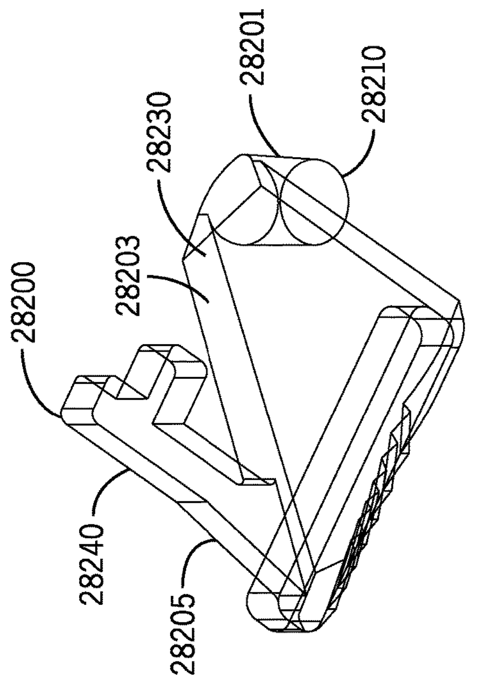
Figure 283:
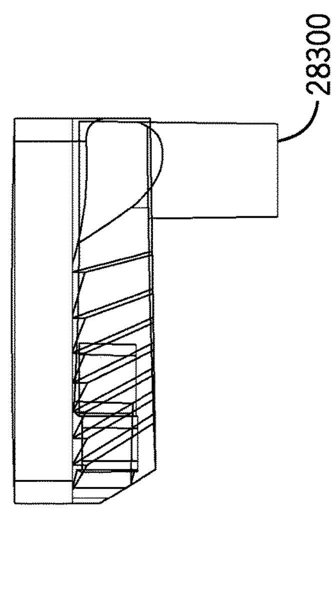
Figure 284:
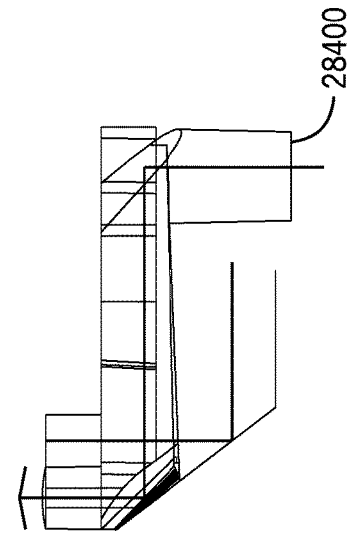

FIGS. 279 and 280 illustrate internal cross-sectional views of a privacy/security enclosure with in accordance with some embodiments of the invention.

FIGS. 281-282, and 283-284 illustrate light transmission within a privacy/security enclosure in accordance with some embodiments of the invention.

FIGS. 285A-285E illustrate privacy/security enclosures for device cameras in accordance with some embodiments of the invention.

Figure 286:
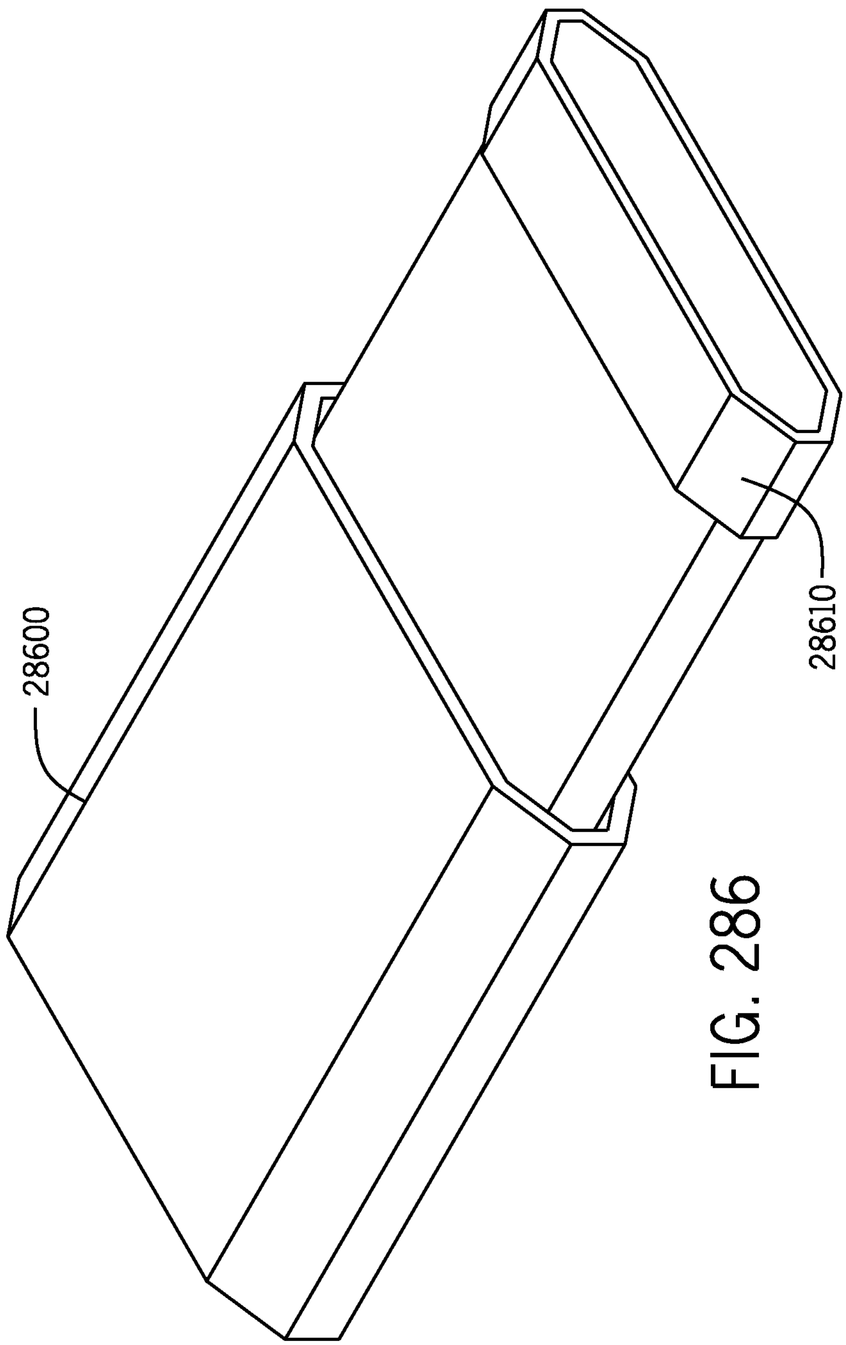

FIG. 286 illustrates a privacy/security enclosure including a Faraday sleeve in accordance with some embodiments of the invention.

Figure 287A:
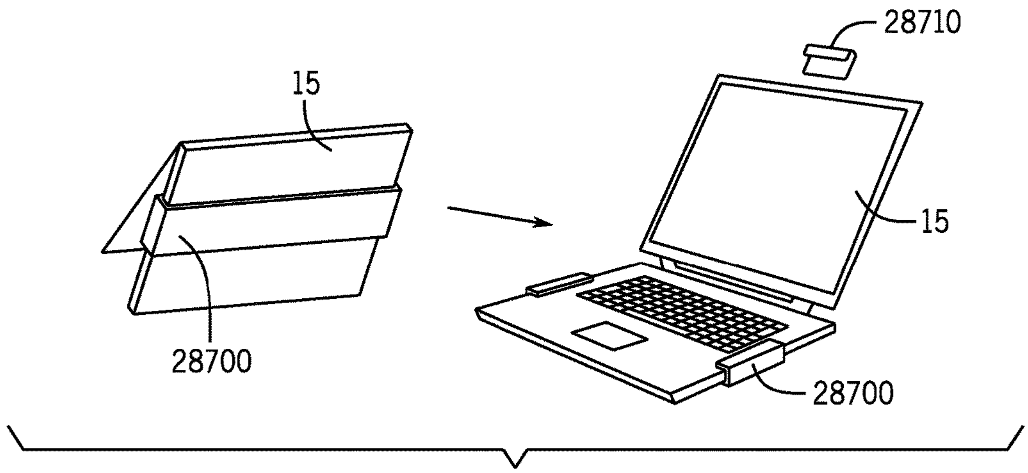
Figure 287B:
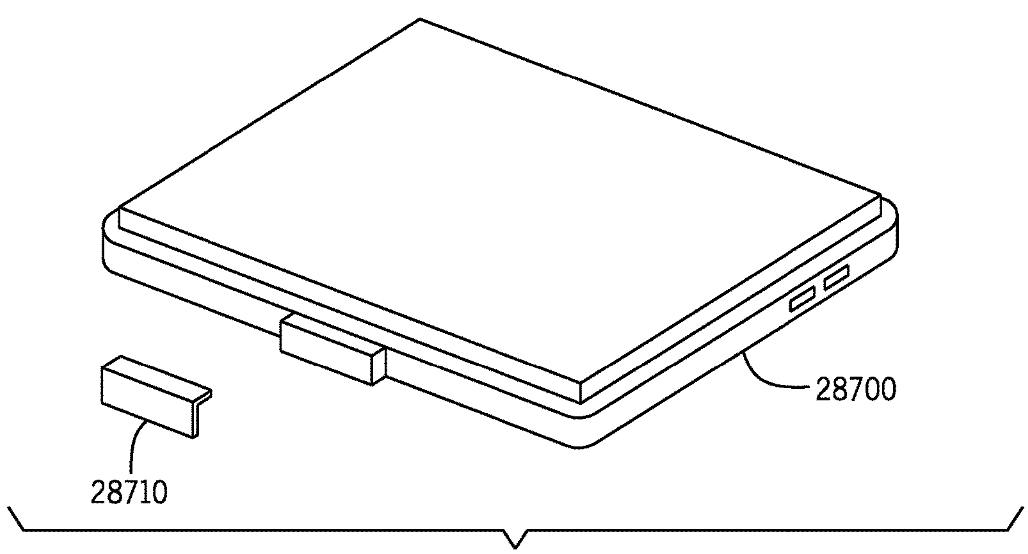

FIGS. 287A-287B illustrate privacy/security enclosures for use with device cases in accordance with some embodiments of the invention.

Figure 288:
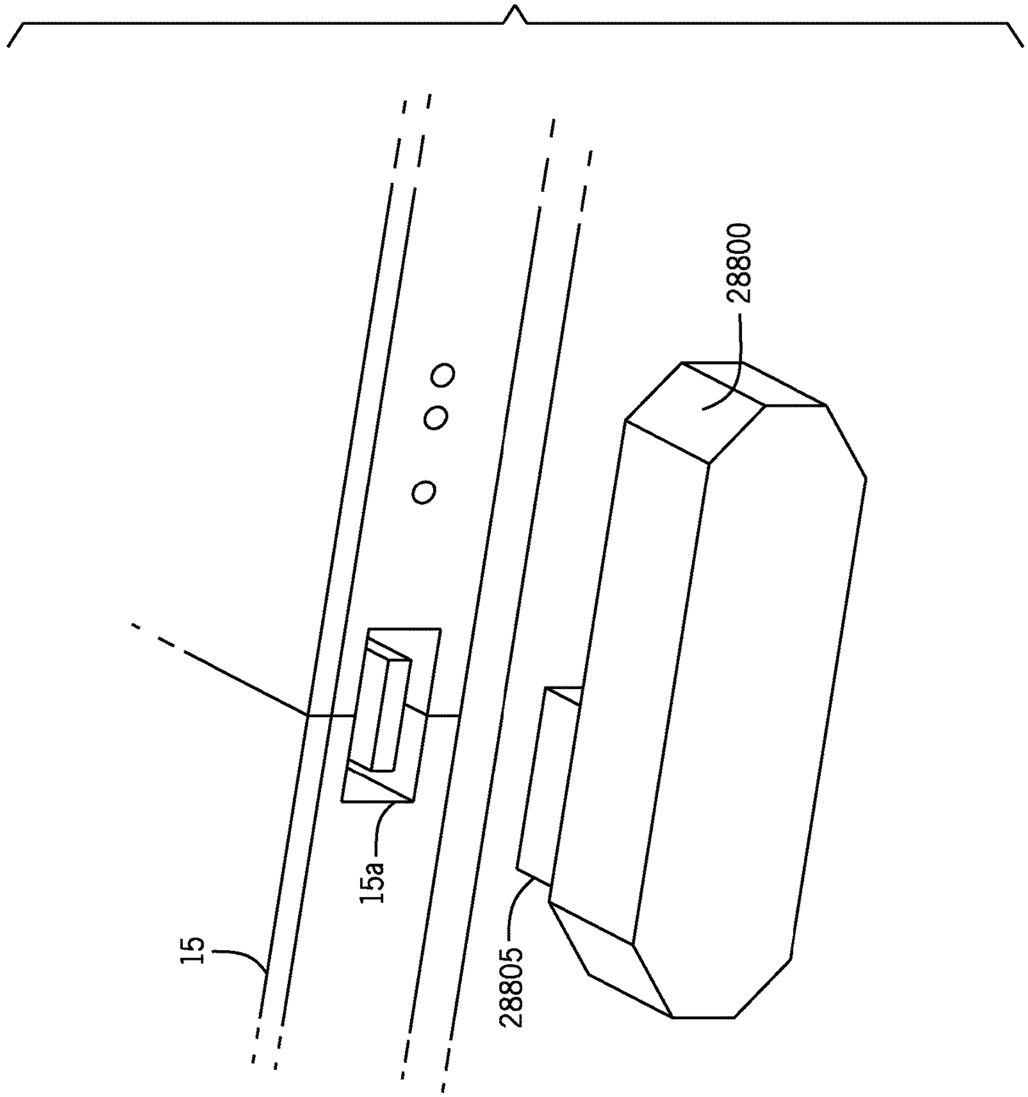

FIG. 288 illustrates a USB-powered active portion of a privacy/security enclosure in accordance with some embodiments of the invention.

Figure 289A:
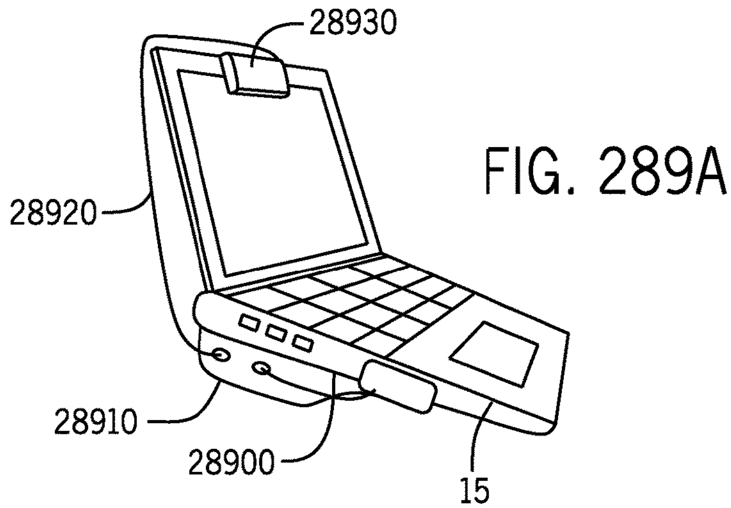
Figure 289B:
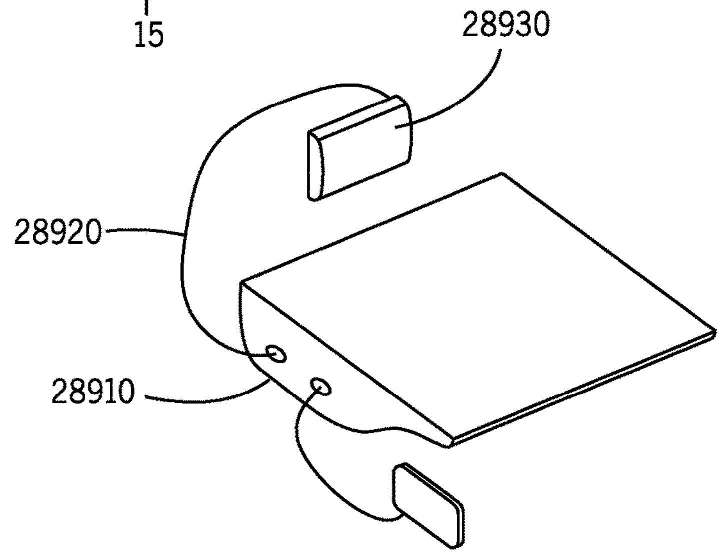
Figure 289C:
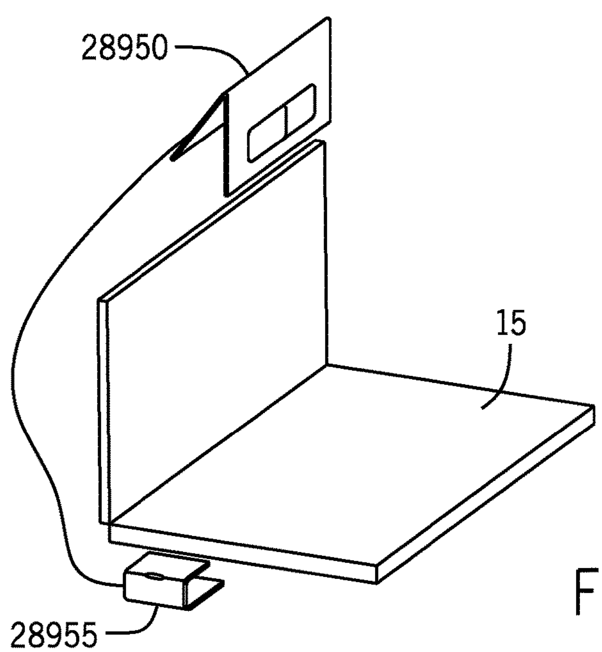

FIGS. 289A-289C illustrate tethered privacy/security enclosures in accordance with some embodiments of the invention.

Figure 290:
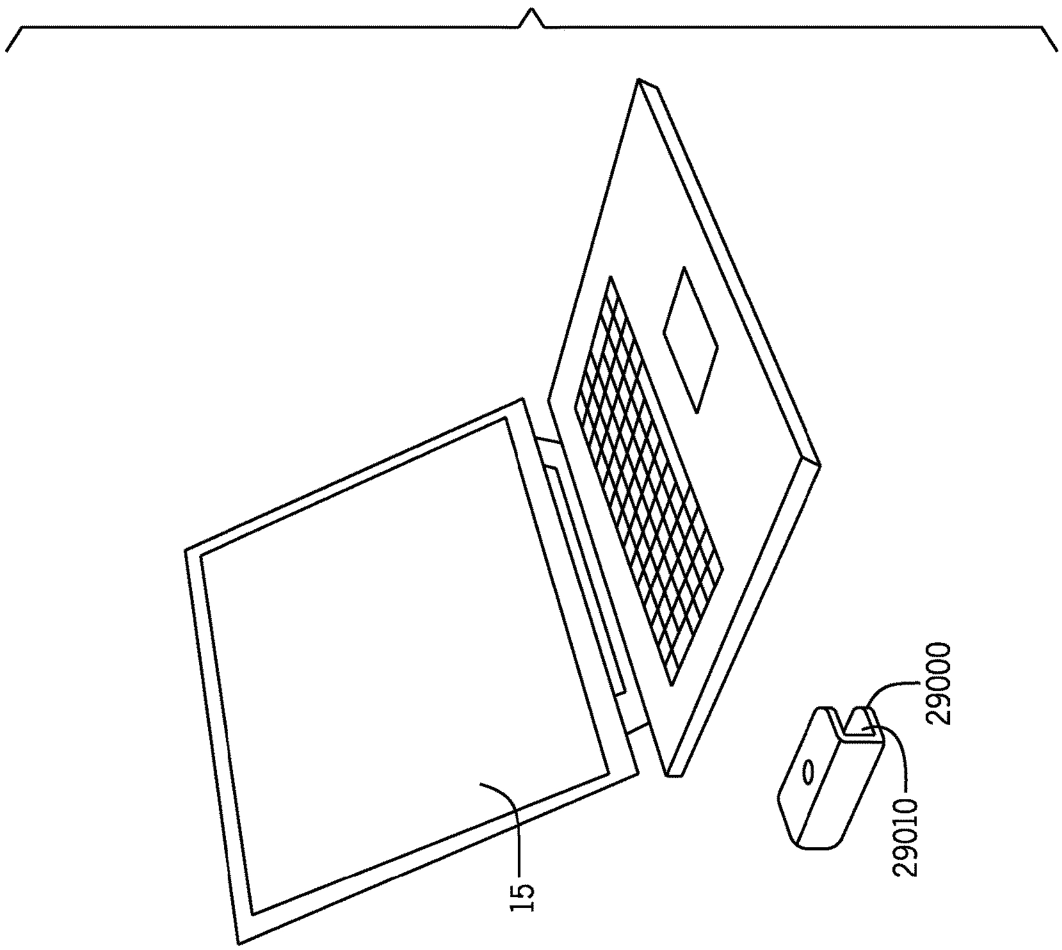

FIG. 290 illustrates an ultrasonic clip-on privacy/security enclosure in accordance with some embodiments of the invention.

Figure 291:
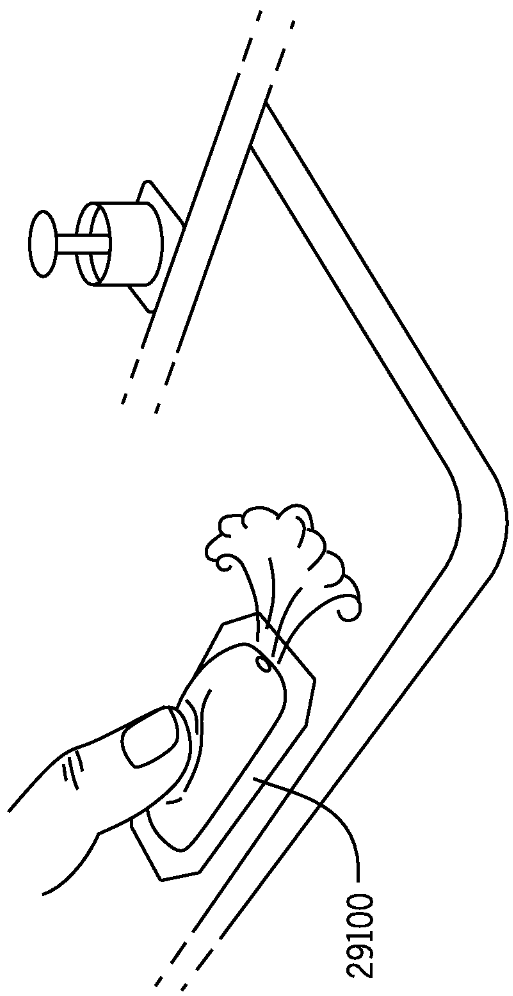

FIG. 291 illustrates a vacuum seal over microphone in accordance with some embodiments of the invention.

Figure 292:
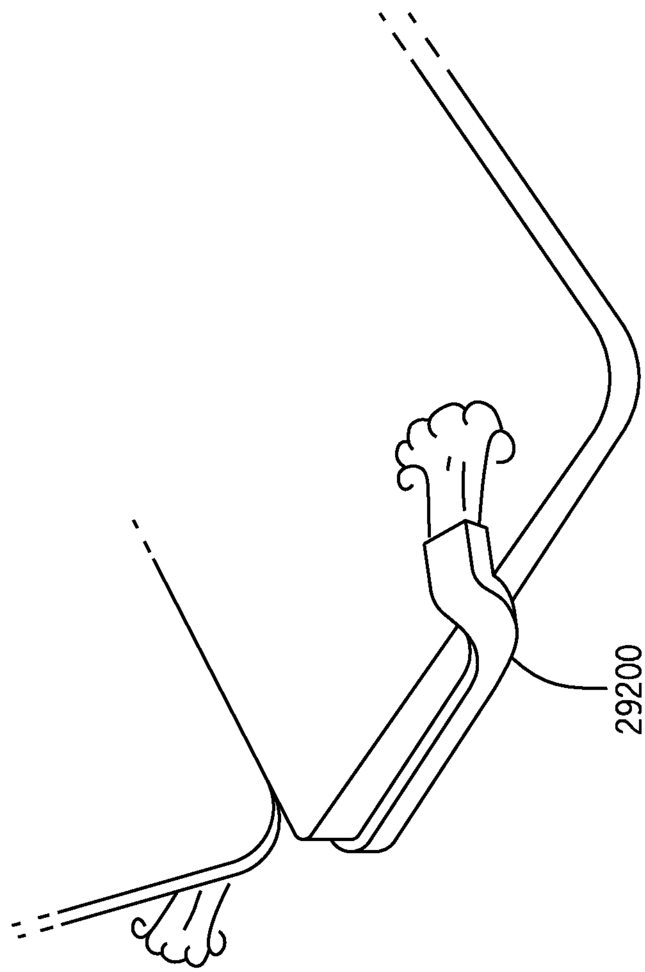

FIG. 292 illustrates internal air flow acoustic muffling in accordance with some embodiments of the invention.

Figure 293A:
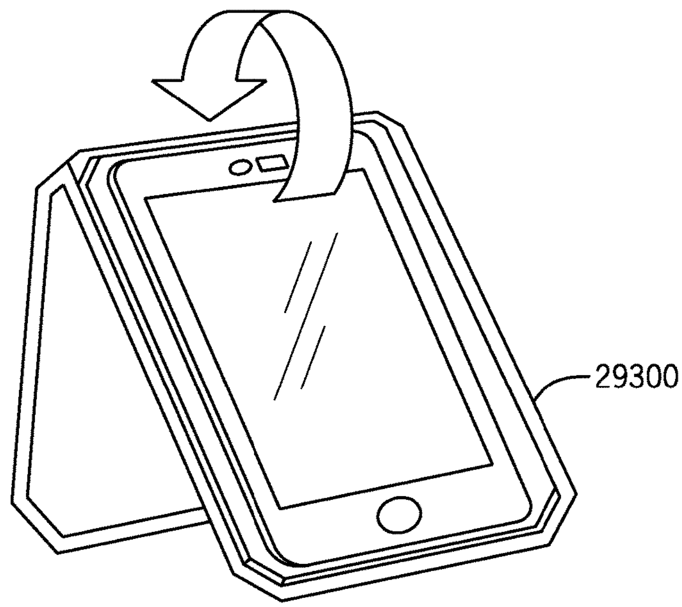
Figure 293B:
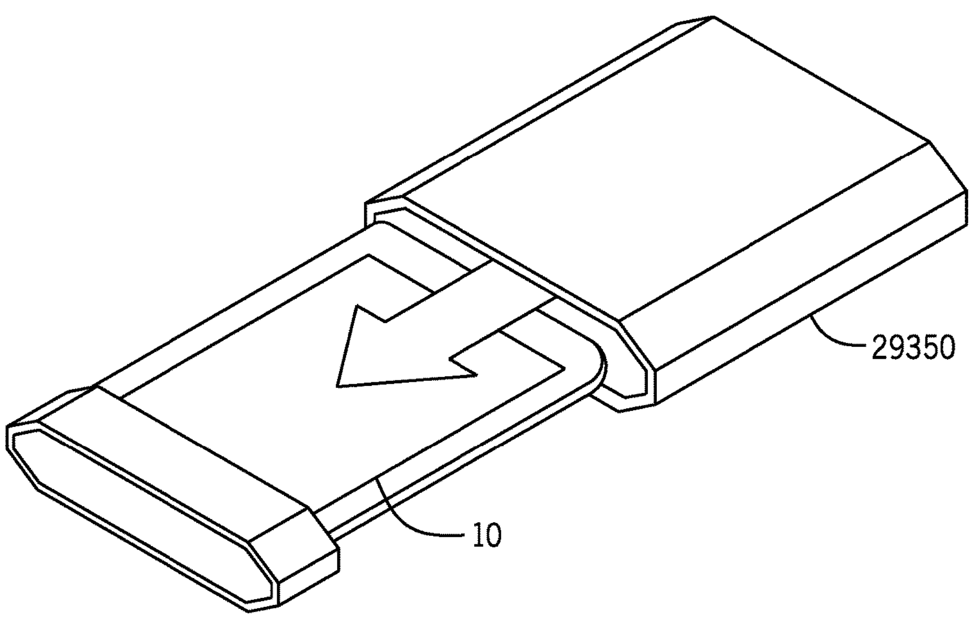

FIGS. 293A-293B illustrate perspective views of a privacy/security enclosure and method of use in accordance with some embodiments of the invention.

Figure 294A:
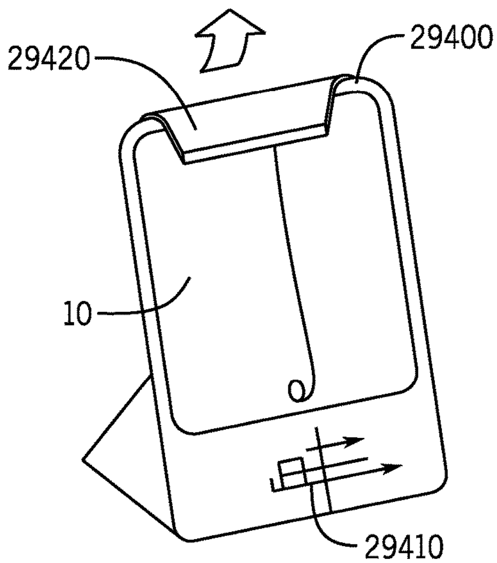
Figure 294B:
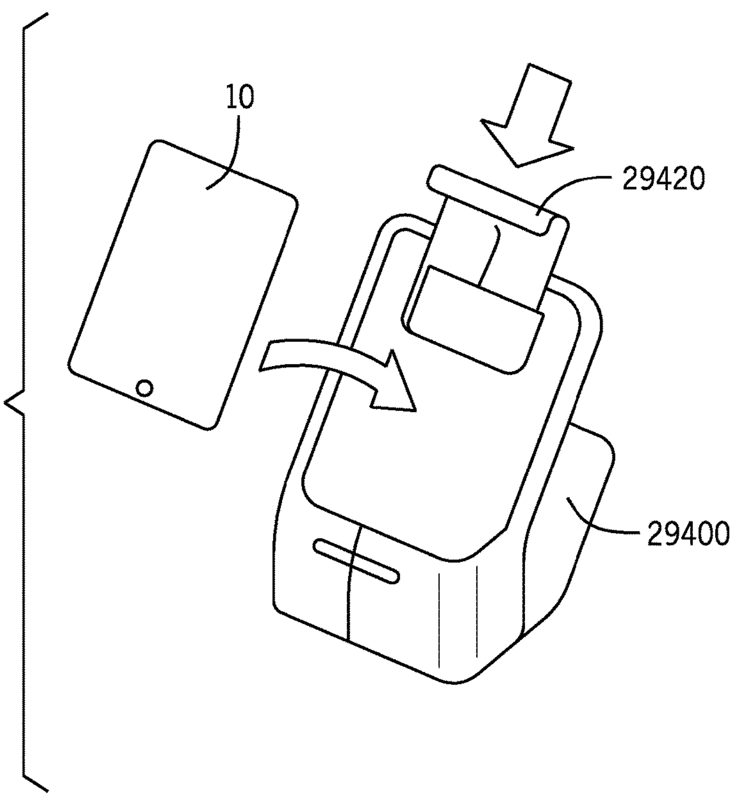

FIGS. 294A-294B illustrate privacy/security enclosures for docked devices in accordance with some embodiments of the invention.

FIGS. 295A-295D illustrate privacy/security enclosures for partial cases in accordance with some embodiments of the invention.

Figure 296:
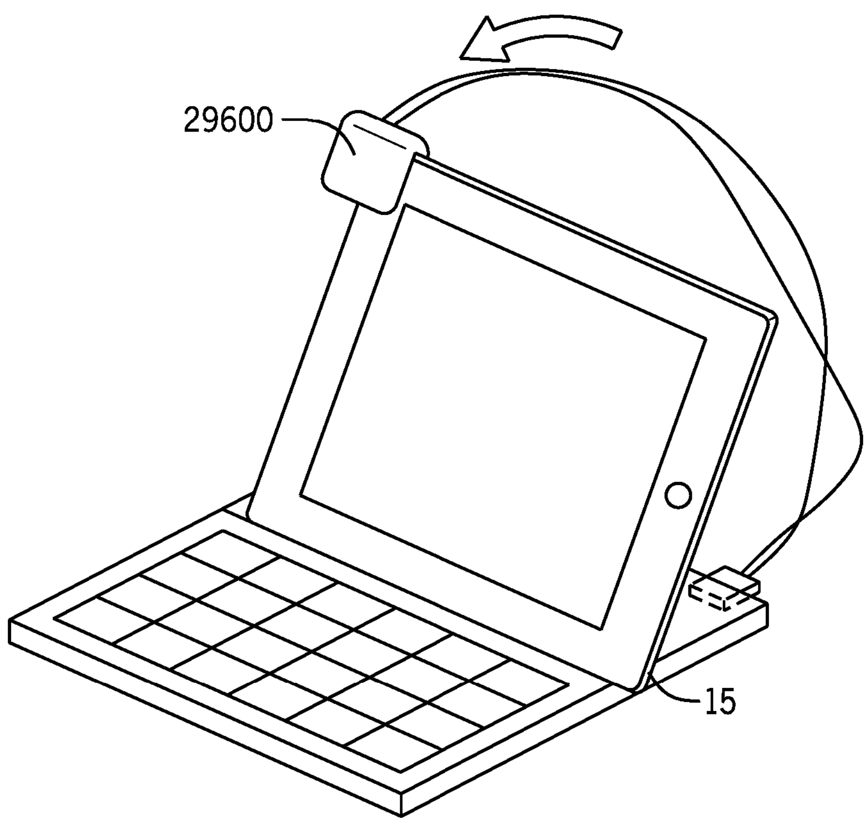

FIG. 296 illustrates a tethered privacy/security enclosure in accordance with some embodiments of the invention.

Figure 297:
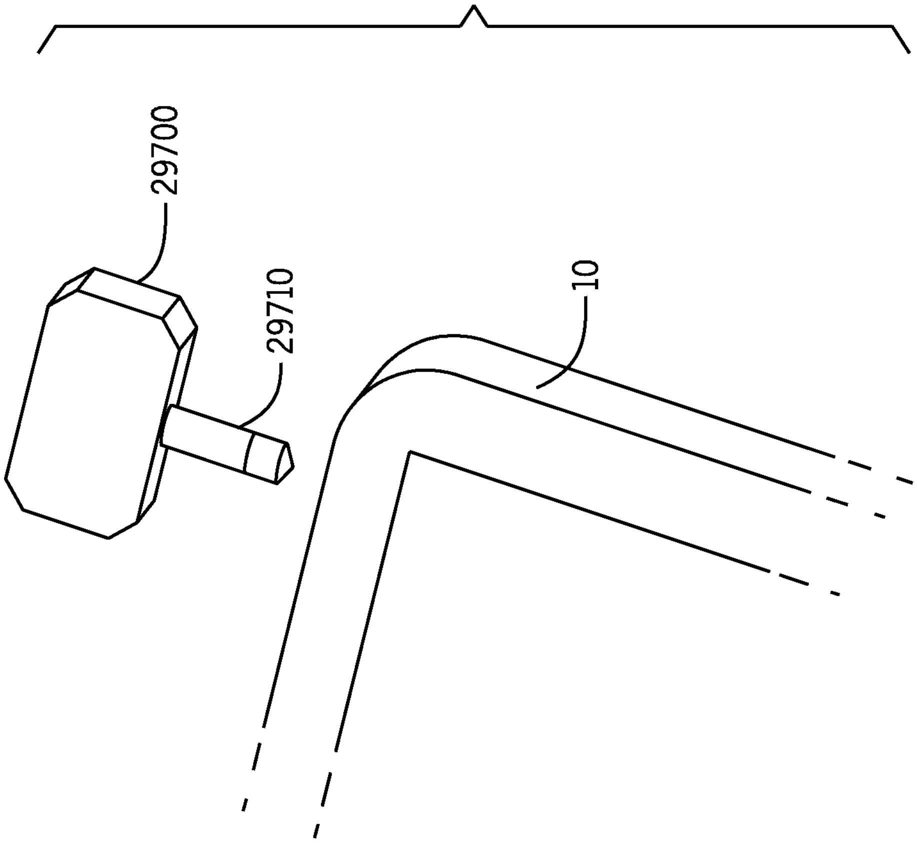

FIG. 297 illustrates a noise emitter in accordance with some embodiments of the invention.

Figure 298:
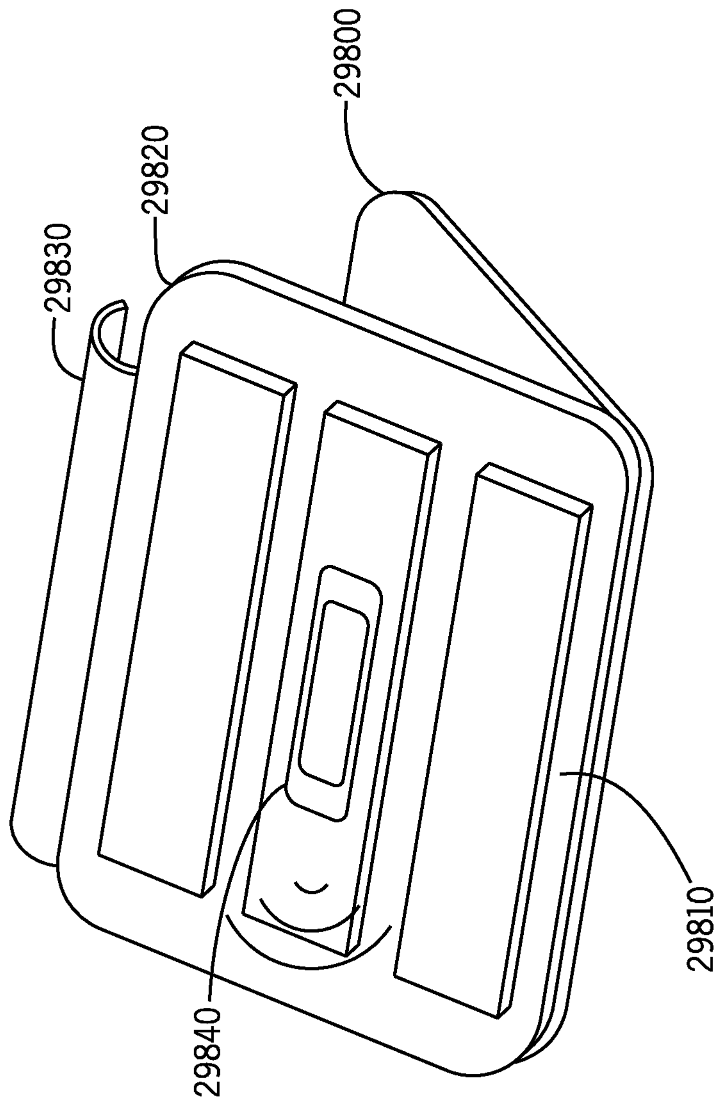
Figure 299D:
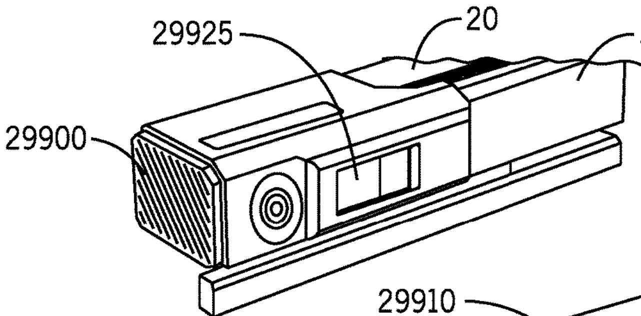
Figure 299C:
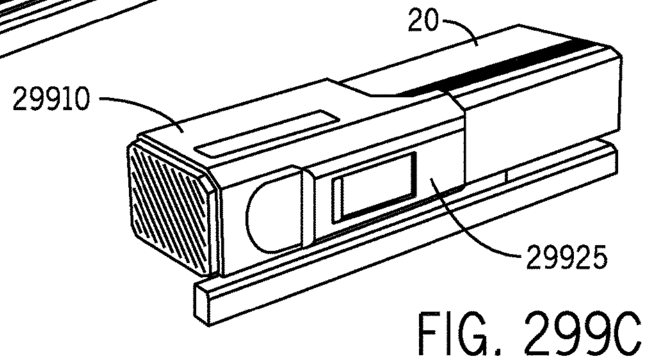
Figure 299B:
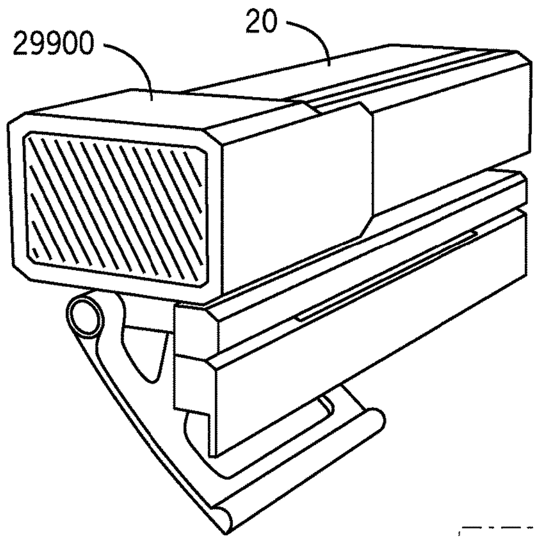
Figure 299A:
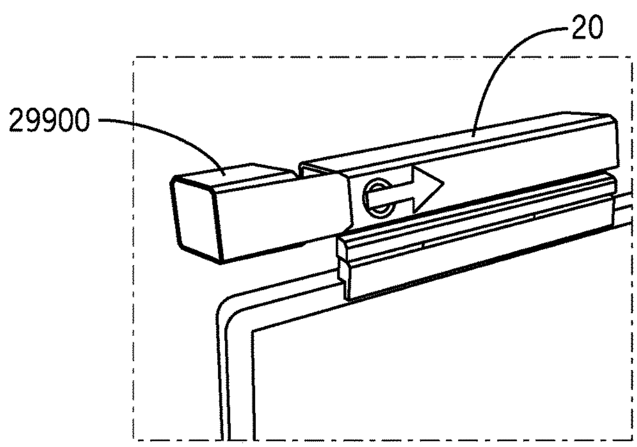

FIG. 298 illustrates a cover add-on privacy/security enclosure in accordance with some embodiments of the invention.

FIGS. 299A-299D illustrate privacy/security enclosures for a Microsoft Kinect™ system in accordance with some embodiments of the invention.

Figure 300B:
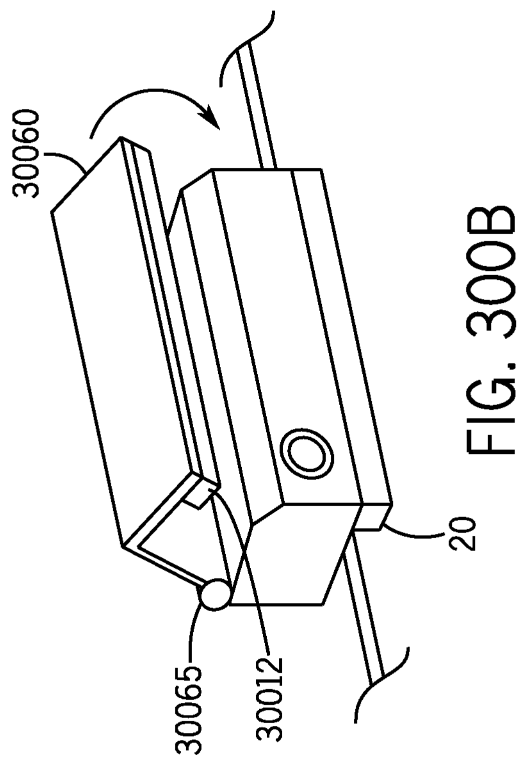
Figure 300A:
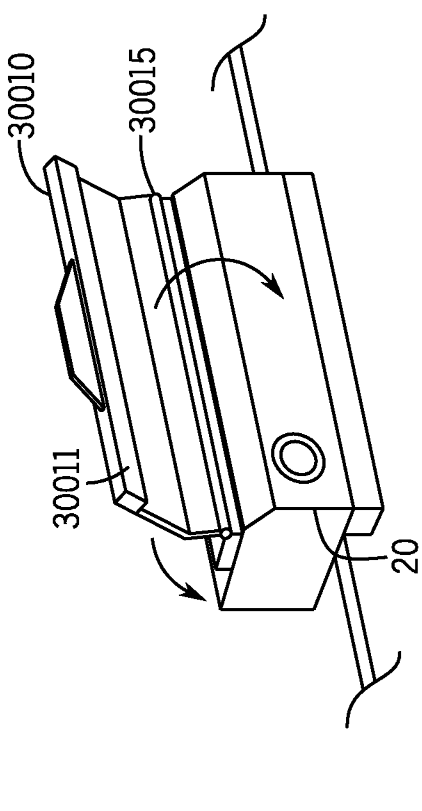

FIGS. 300A-300B illustrate a fold-down cover privacy/security enclosure for a Microsoft Kinect™ system in accordance with some embodiments of the invention.

Figure 301:
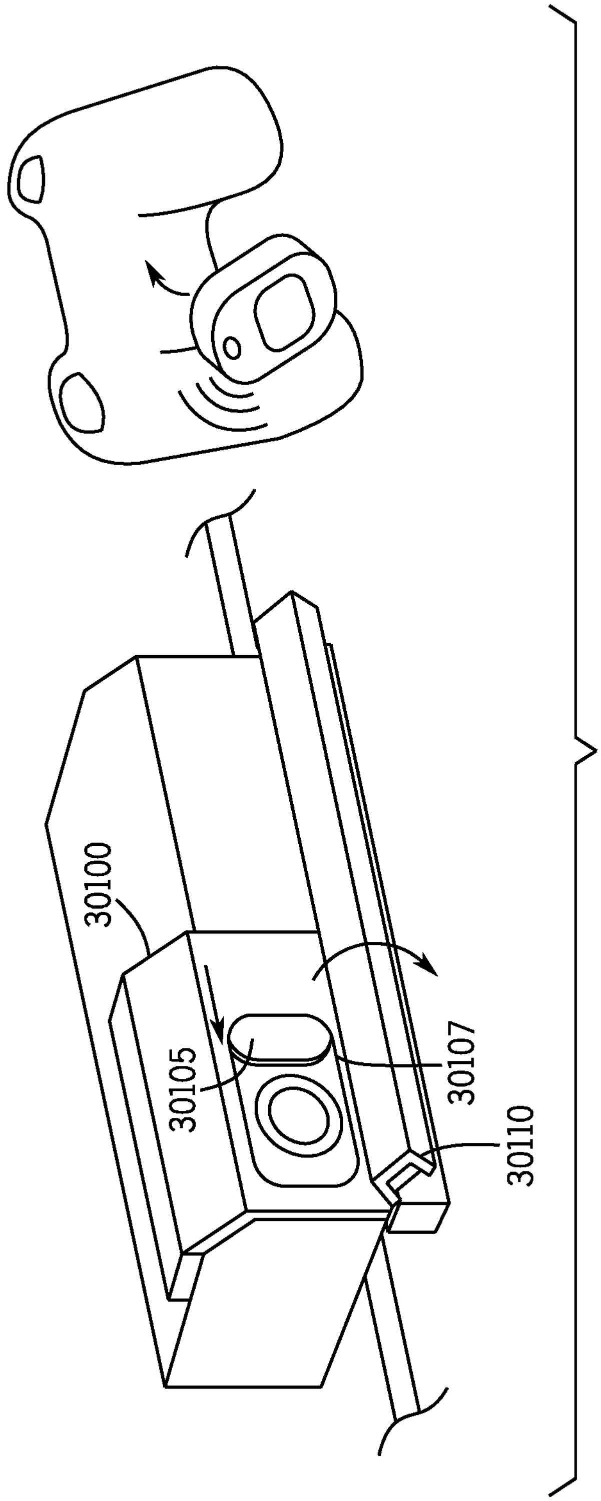

FIG. 301 illustrates a remote cover privacy/security enclosure for a Microsoft Kinect™ system in accordance with some embodiments of the invention.

Figure 302A:
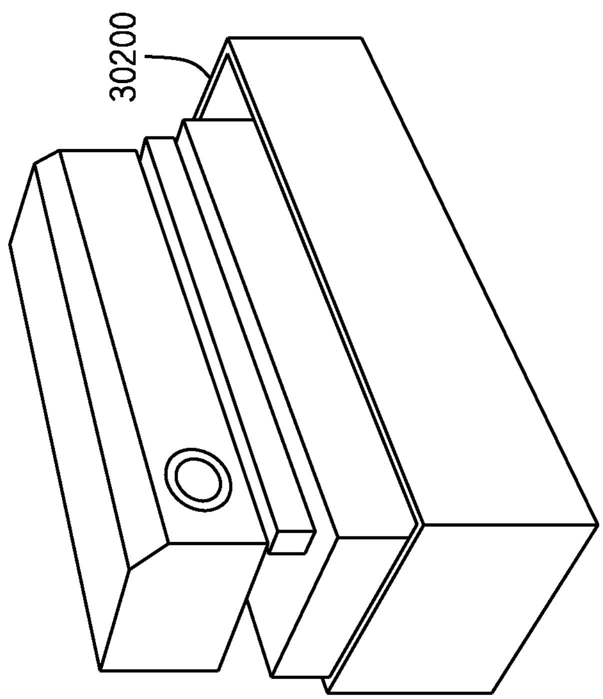
Figure 302B:
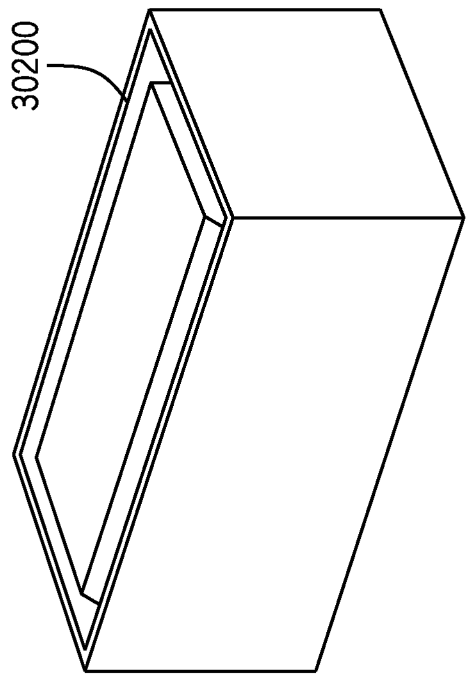

FIGS. 302A-302B illustrate an elevator recess cover privacy/security enclosure for a Microsoft Kinect™ system in accordance with some embodiments of the invention.

Figure 303:
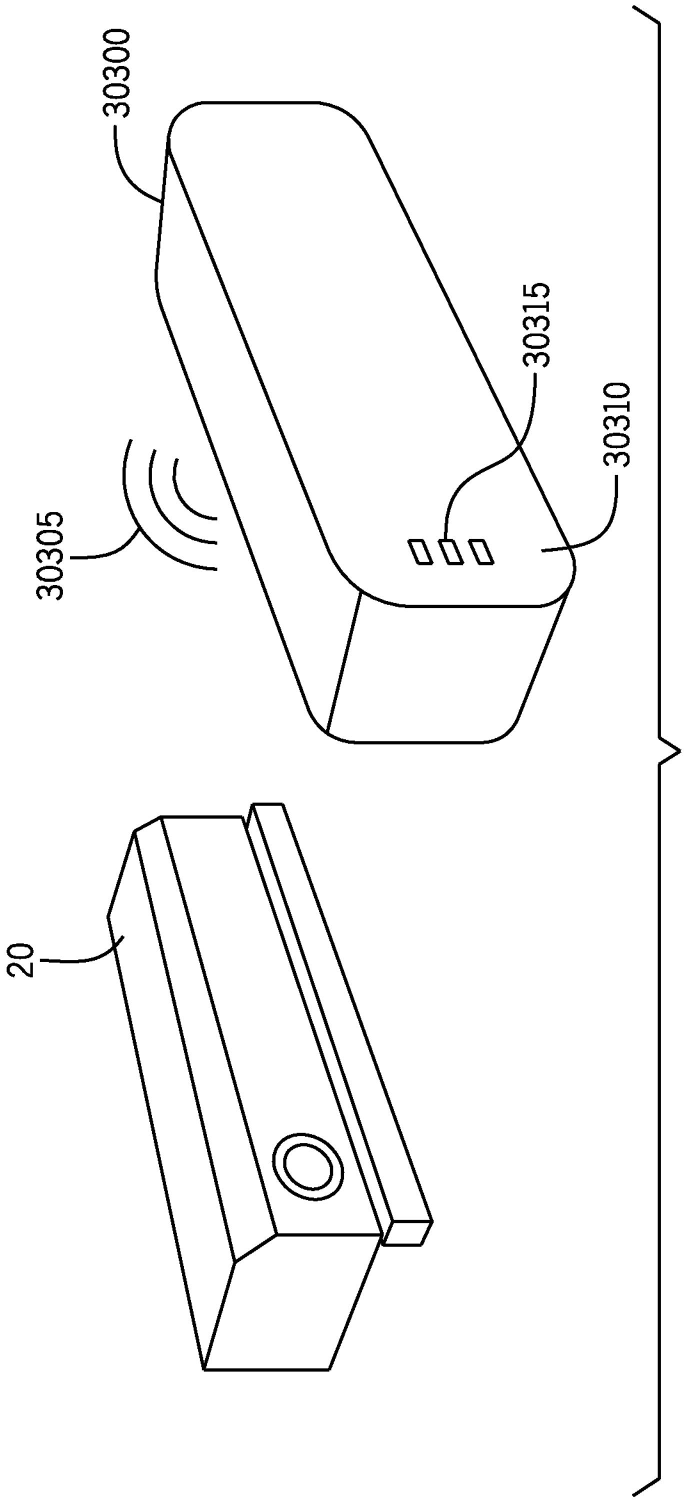

FIG. 303 illustrates an attachable cover privacy/security enclosure for a Microsoft Kinect™ system in accordance with some embodiments of the invention.

Figure 304:
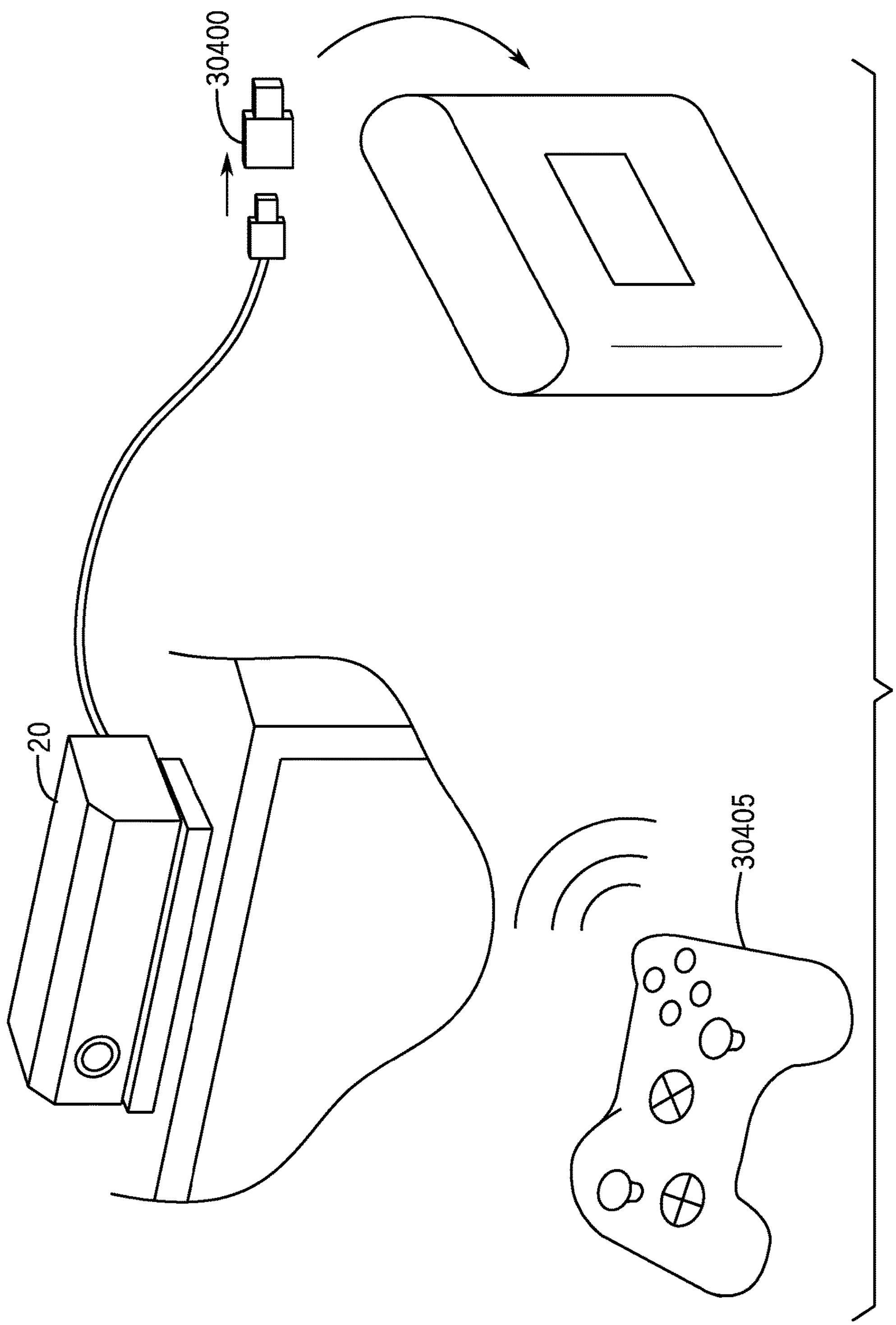

FIG. 304 illustrates a power interruption privacy/security device in accordance with some embodiments of the invention.

Figure 305B:
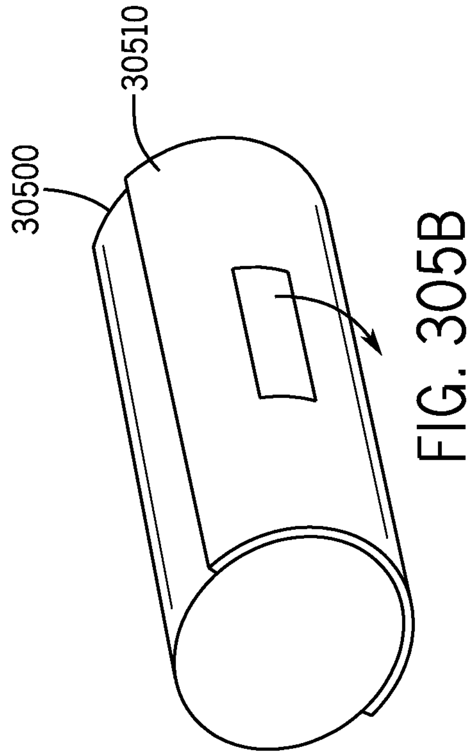
Figure 305A:
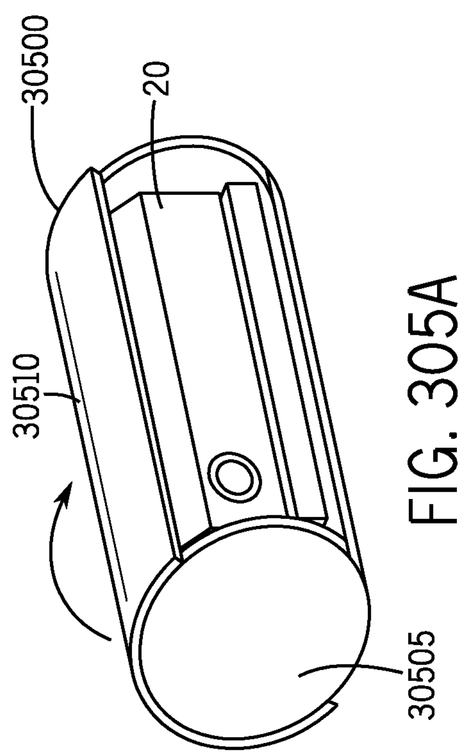

FIGS. 305A-305B illustrate a Faraday cylinder privacy/security enclosure in accordance with some embodiments of the invention.

Figure 306:
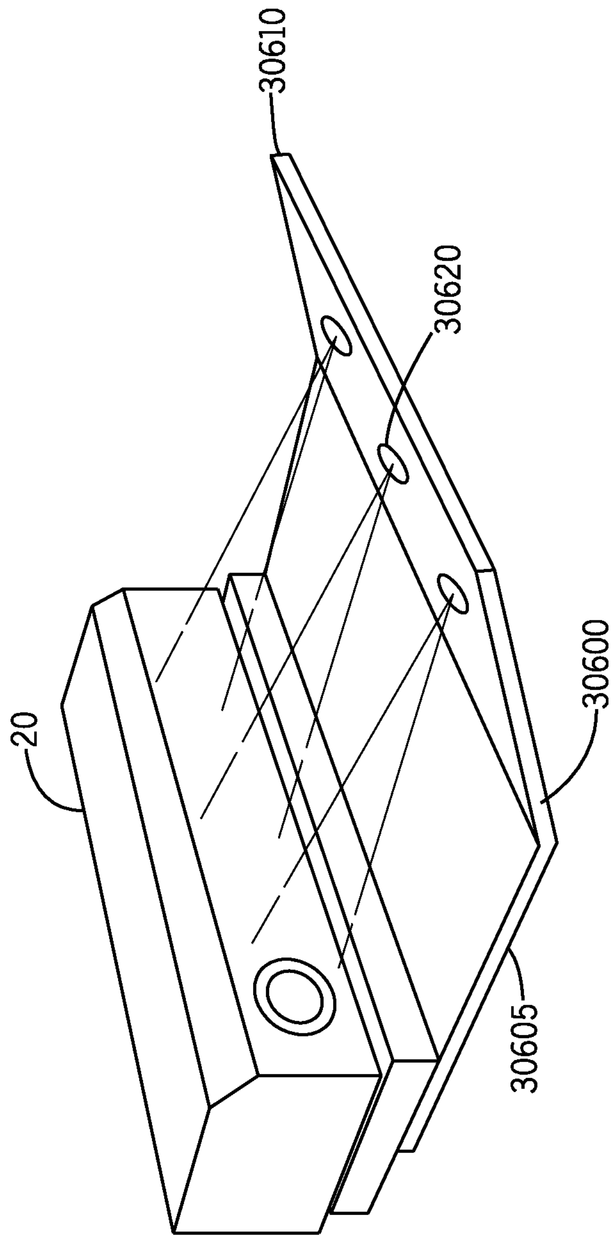

FIG. 306 illustrates a privacy/security enclosure including optical blinding in accordance with some embodiments of the invention.

Figure 307:
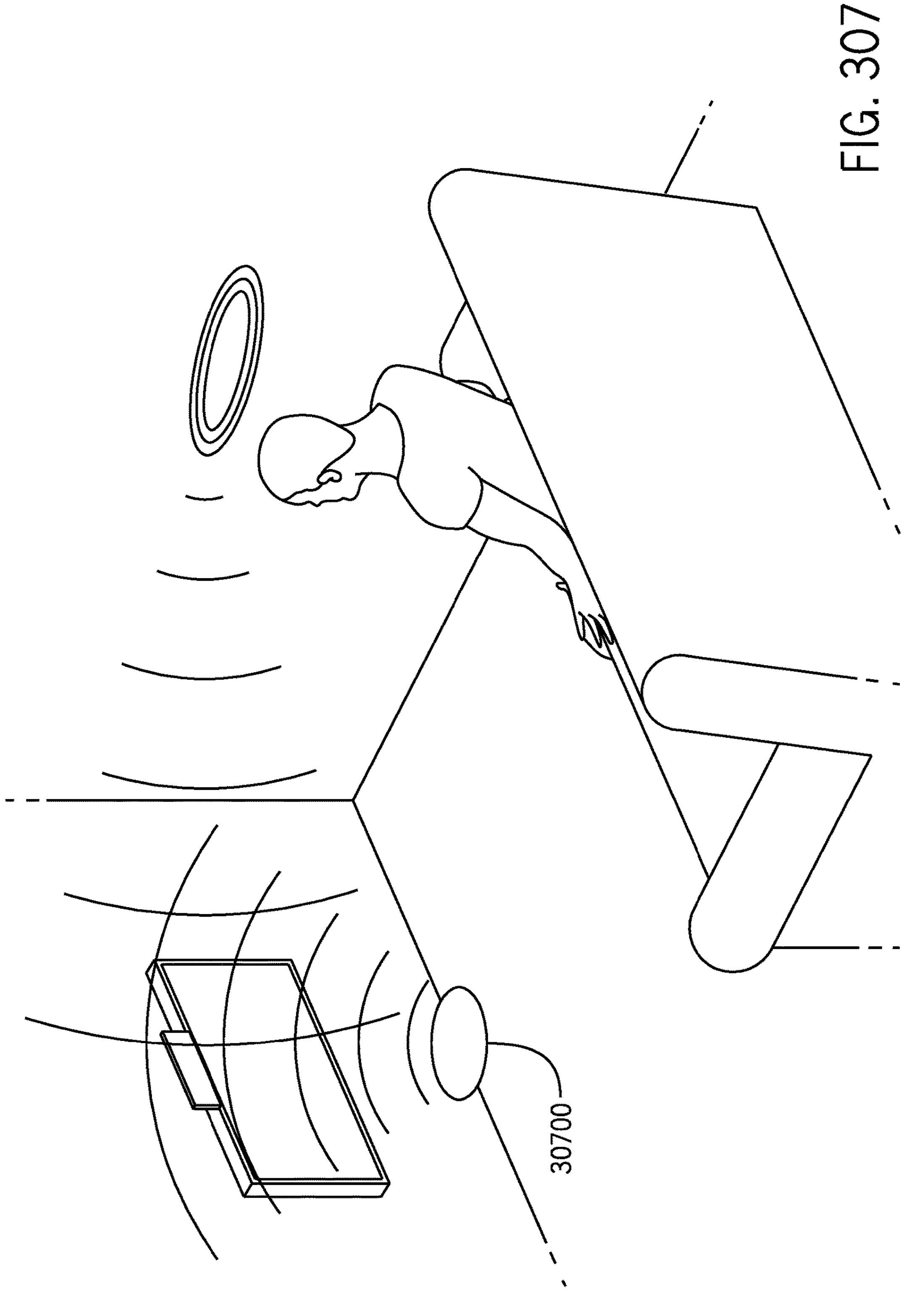

FIG. 307 illustrates a Microsoft Kinect™ system audio interference system in accordance with some embodiments of the invention.

Figure 308:
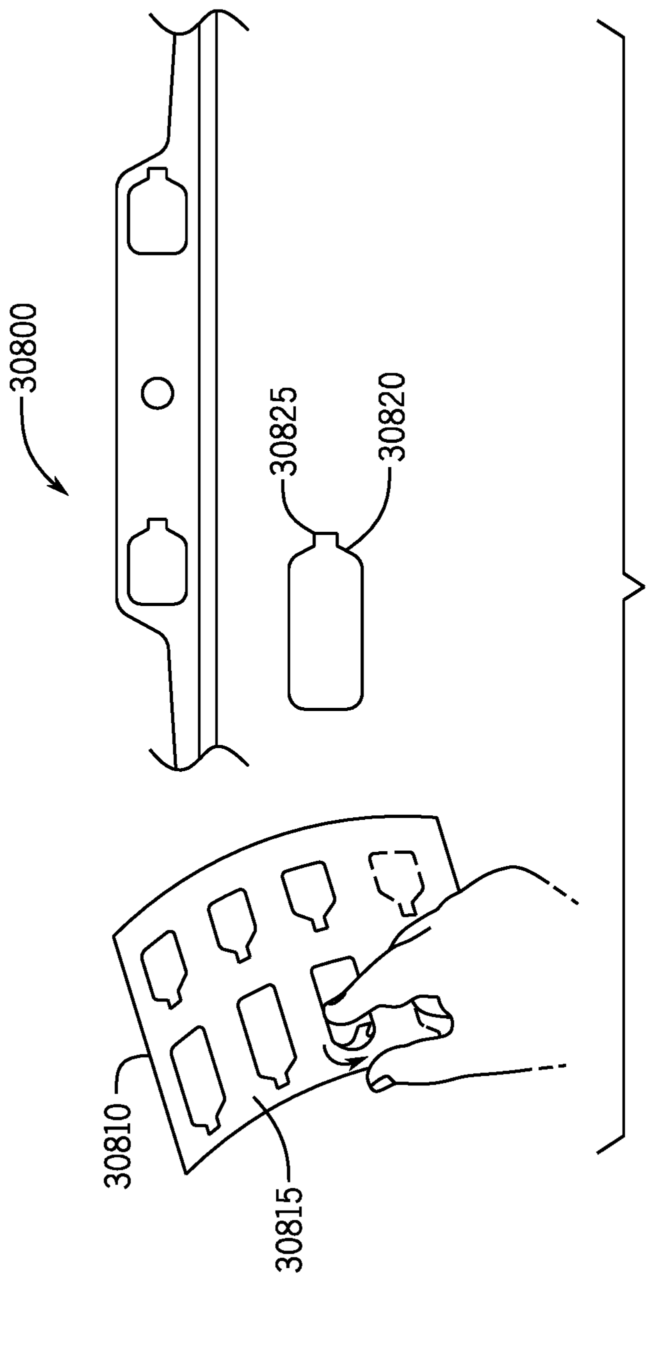

FIG. 308 illustrates an IR sticker privacy/security system in accordance with some embodiments of the invention.

Figure 309B:
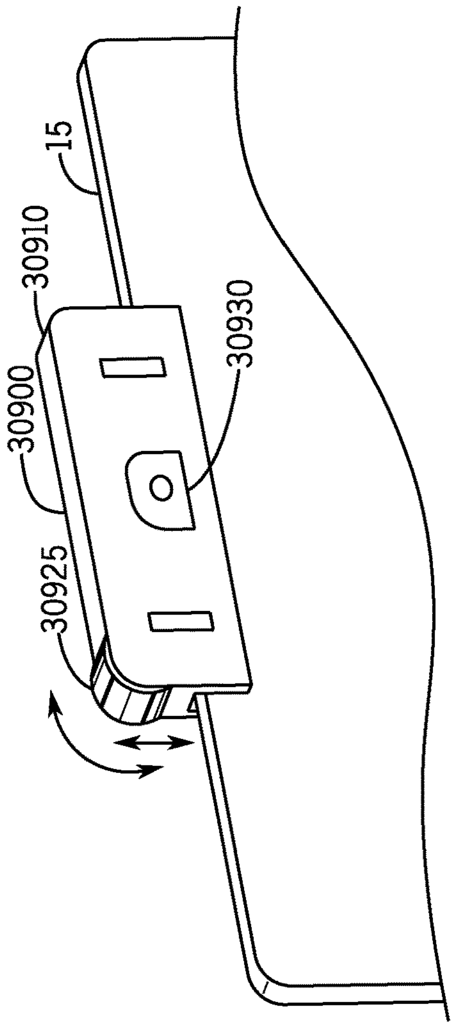
Figure 309A:
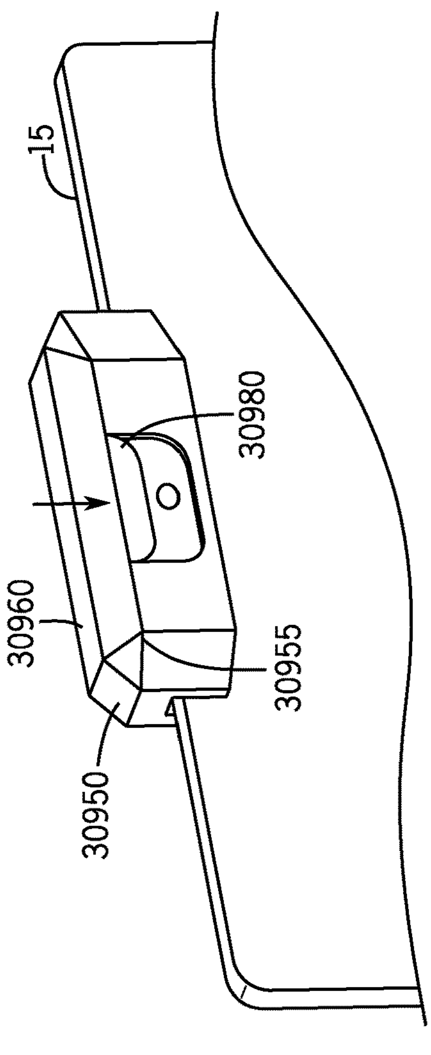

FIGS. 309A-309B illustrate manually operated privacy/security enclosures in accordance with some embodiments of the invention.

Figure 310A:
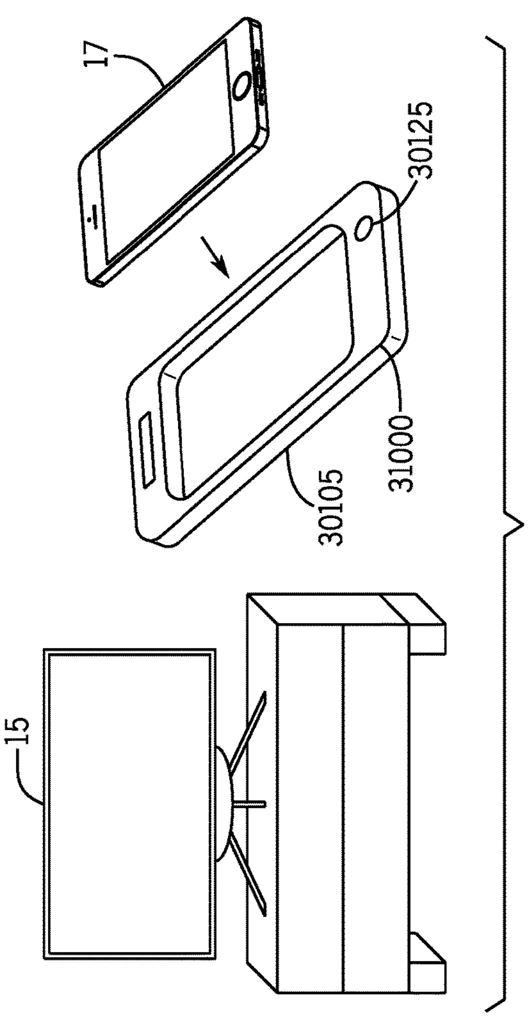
Figure 310B:
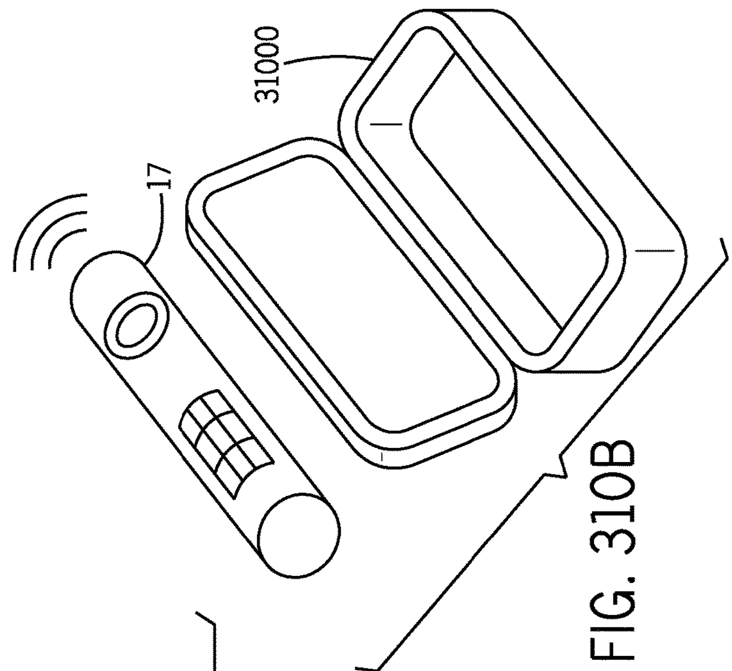

FIGS. 310A-310B illustrate privacy/security protection of a remote control in accordance with some embodiments of the invention.

Figure 311B:
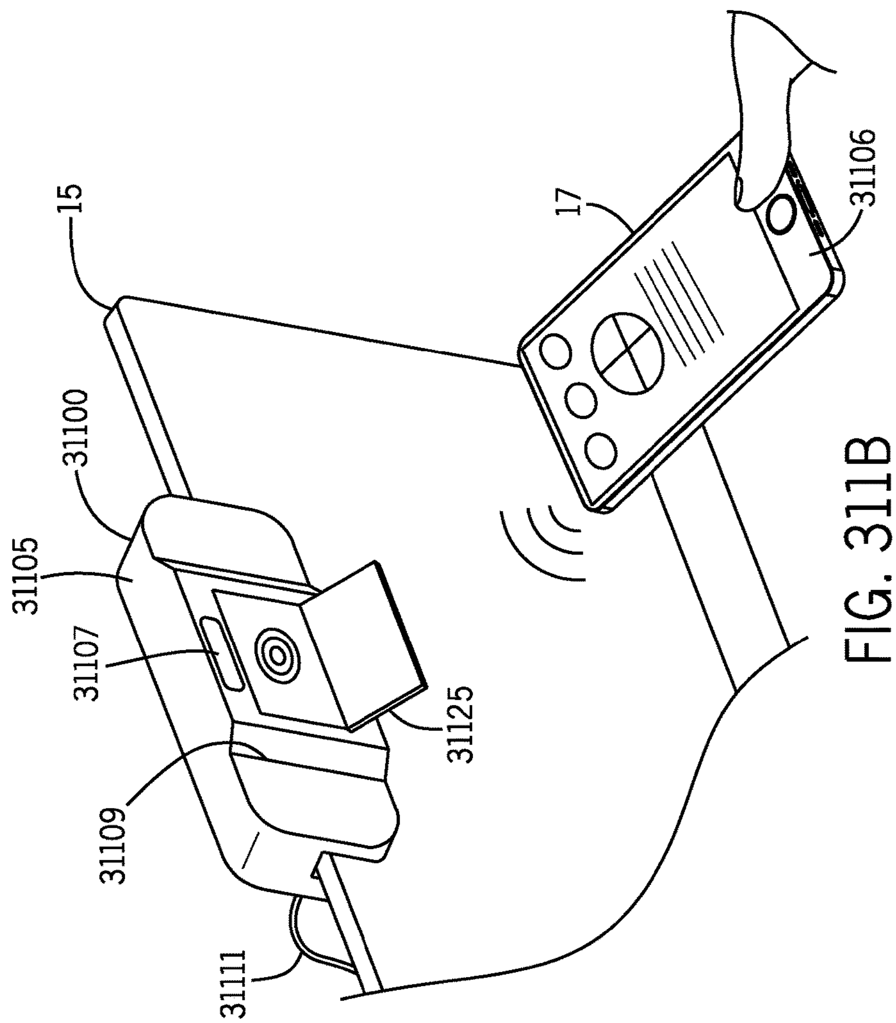
Figure 311A:
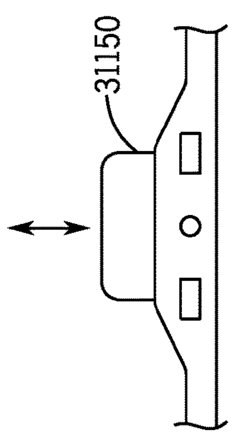

FIGS. 311A-311B illustrate a remote controlled cove privacy/security enclosure in accordance with some embodiments of the invention.

Figure 312:
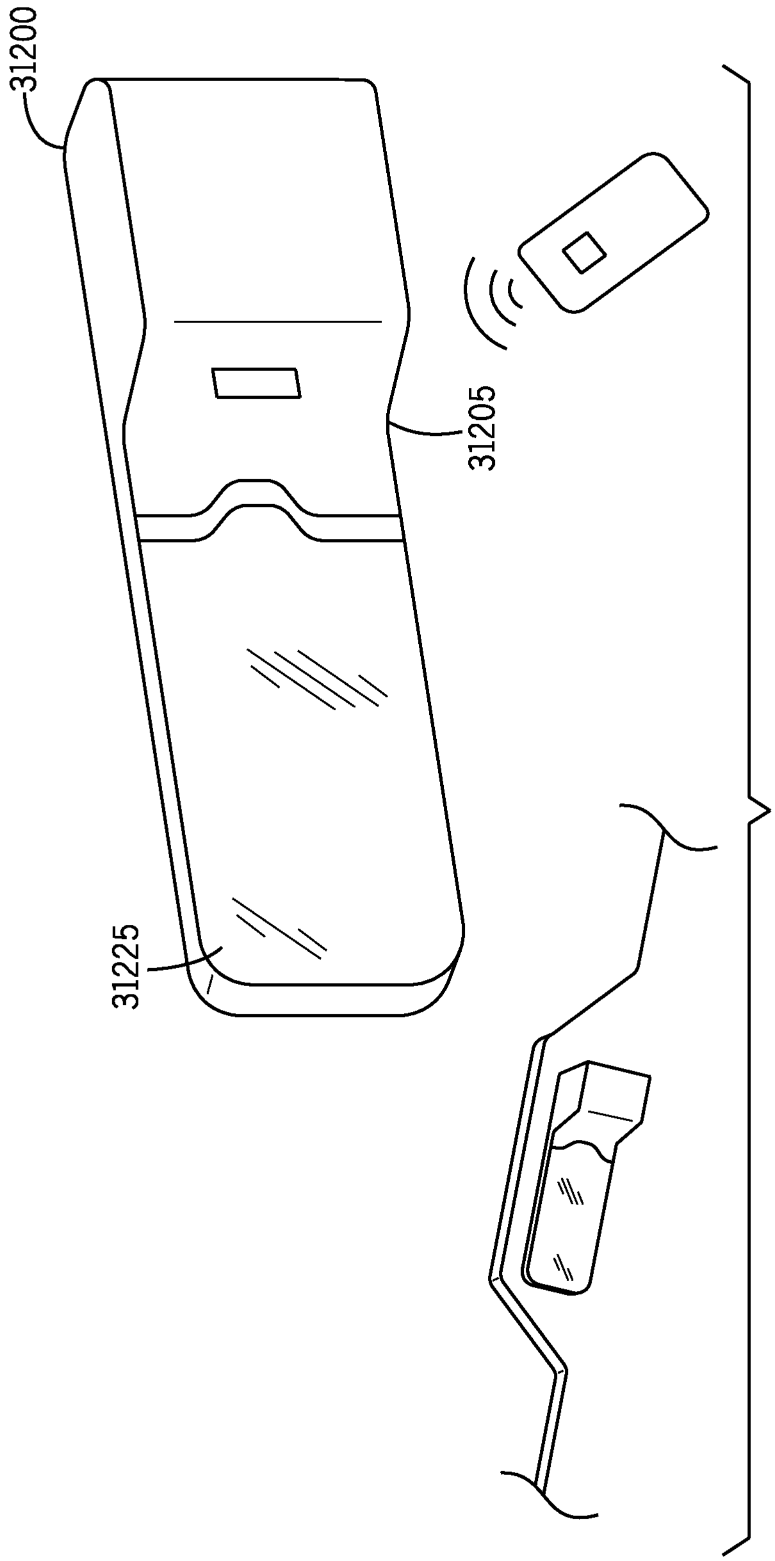

FIG. 312 illustrates a smart glass privacy/security enclosure in accordance with some embodiments of the invention.

Figure 313:
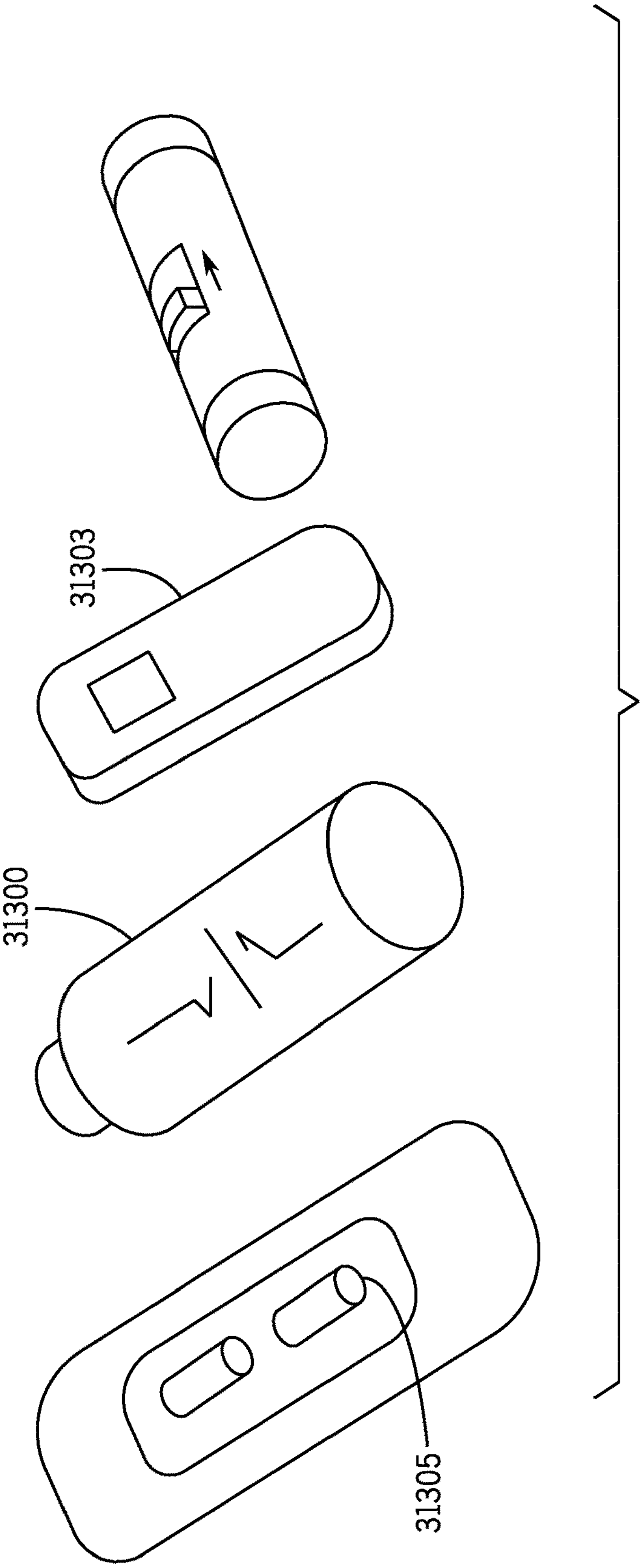
Figure 314:
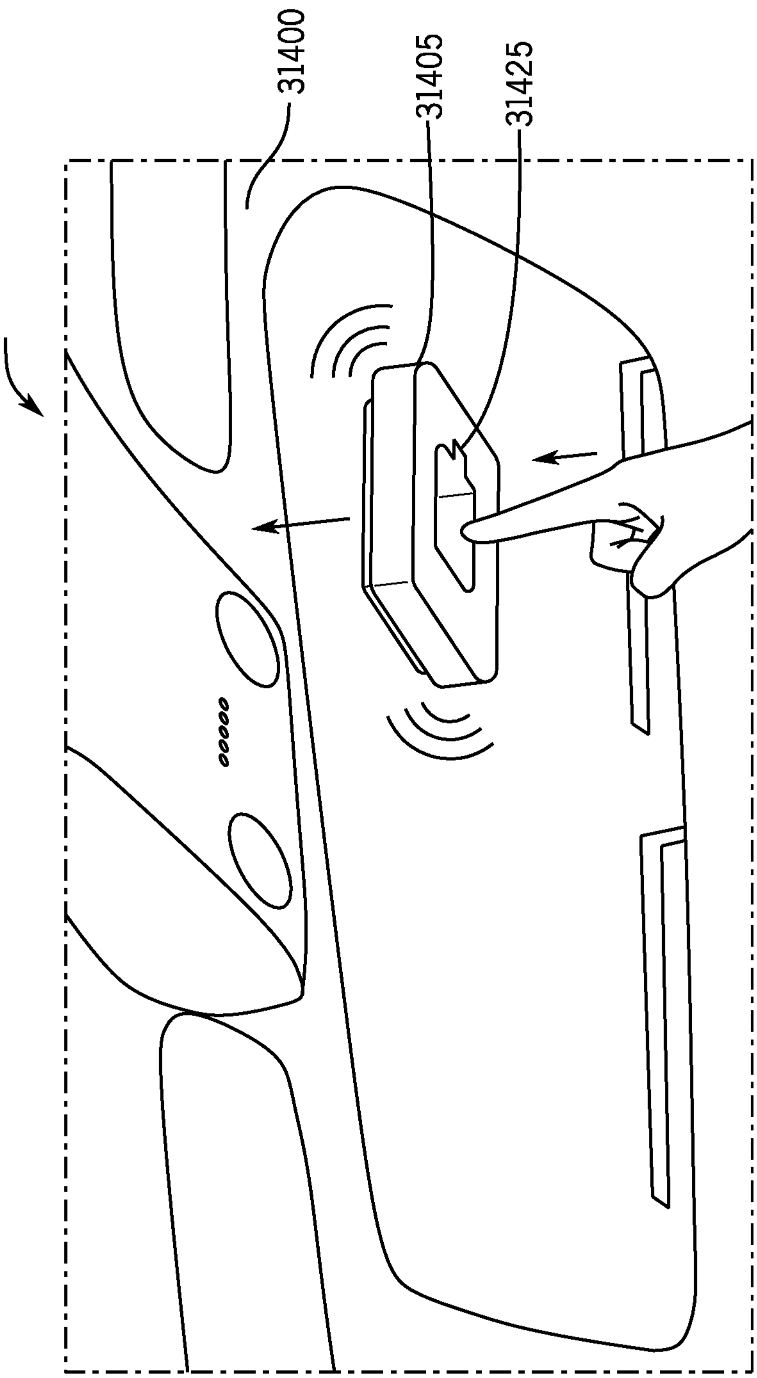
Figure 315:
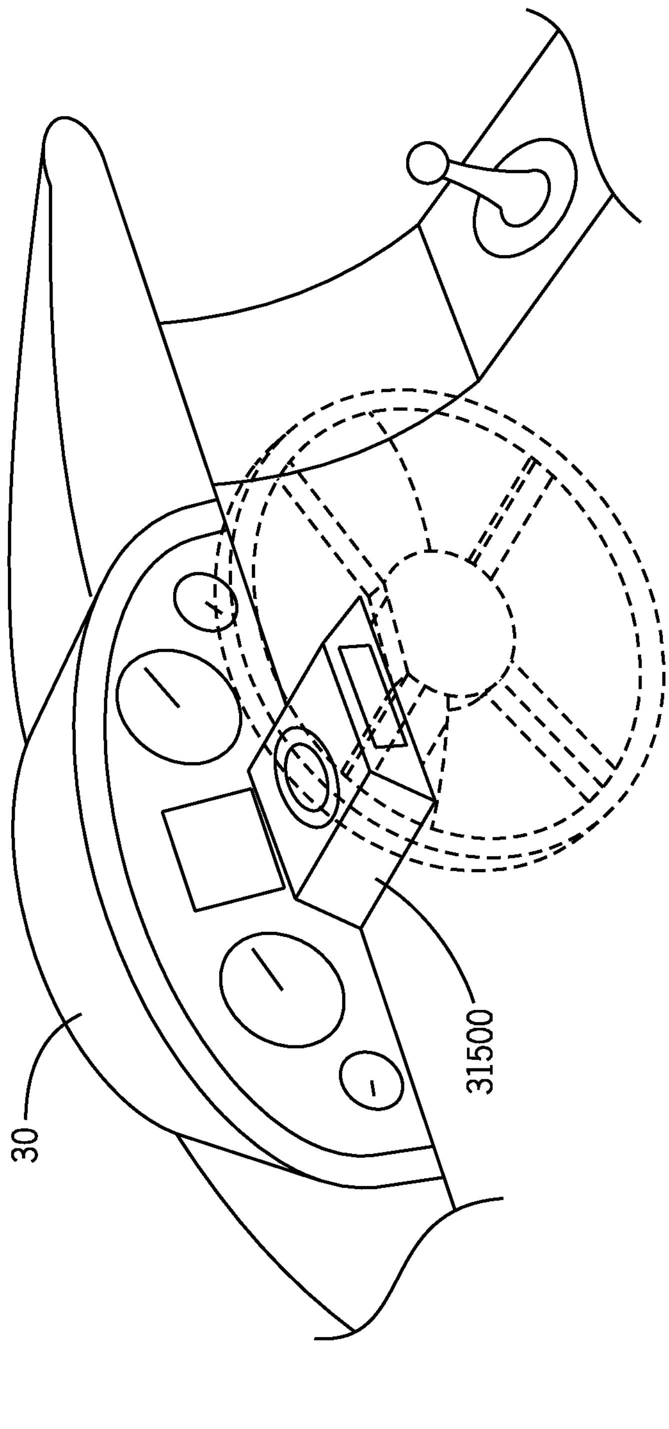
Figure 316B:
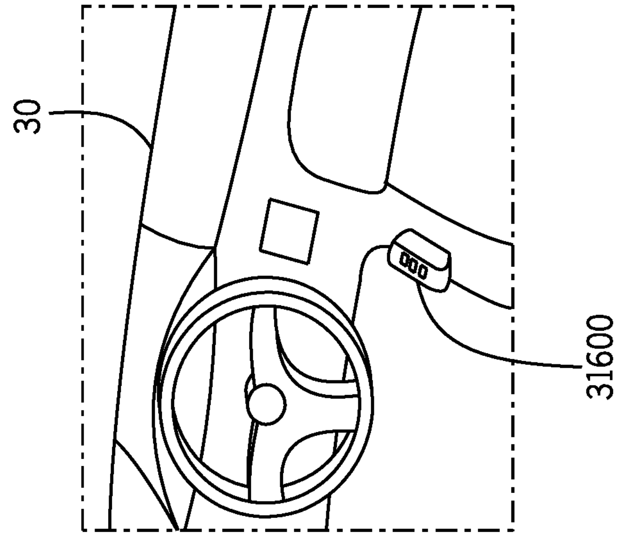
Figure 316A:
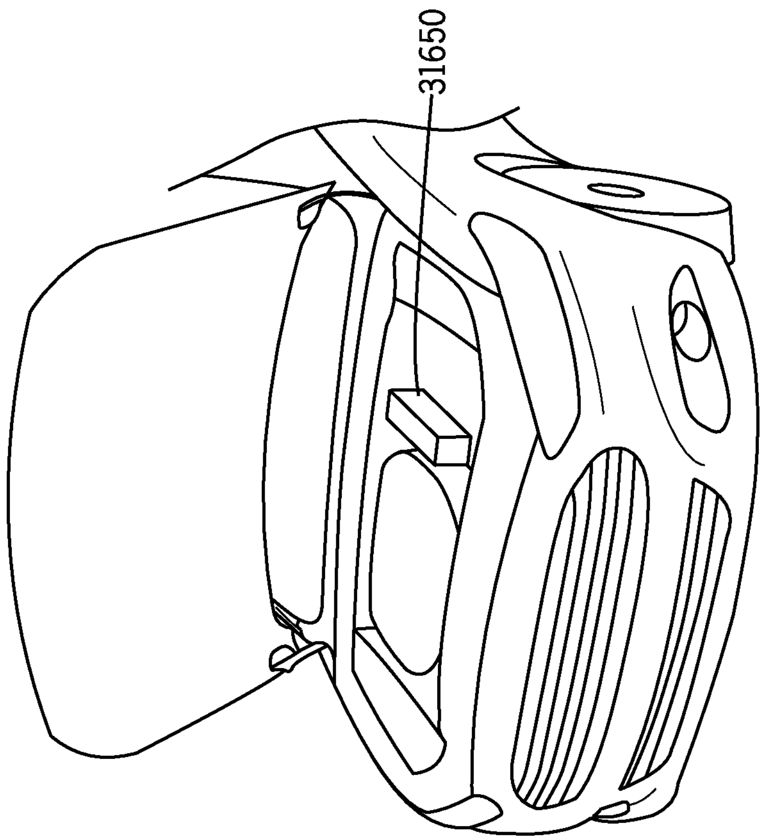

FIG. 313 illustrates an on-off remote battery circuit breaker in accordance with some embodiments of the invention.

FIGS. 314-315, 316A-316B, and 317A illustrate an automobile privacy/security enclosure in accordance with some embodiments of the invention.

Figure 317A:
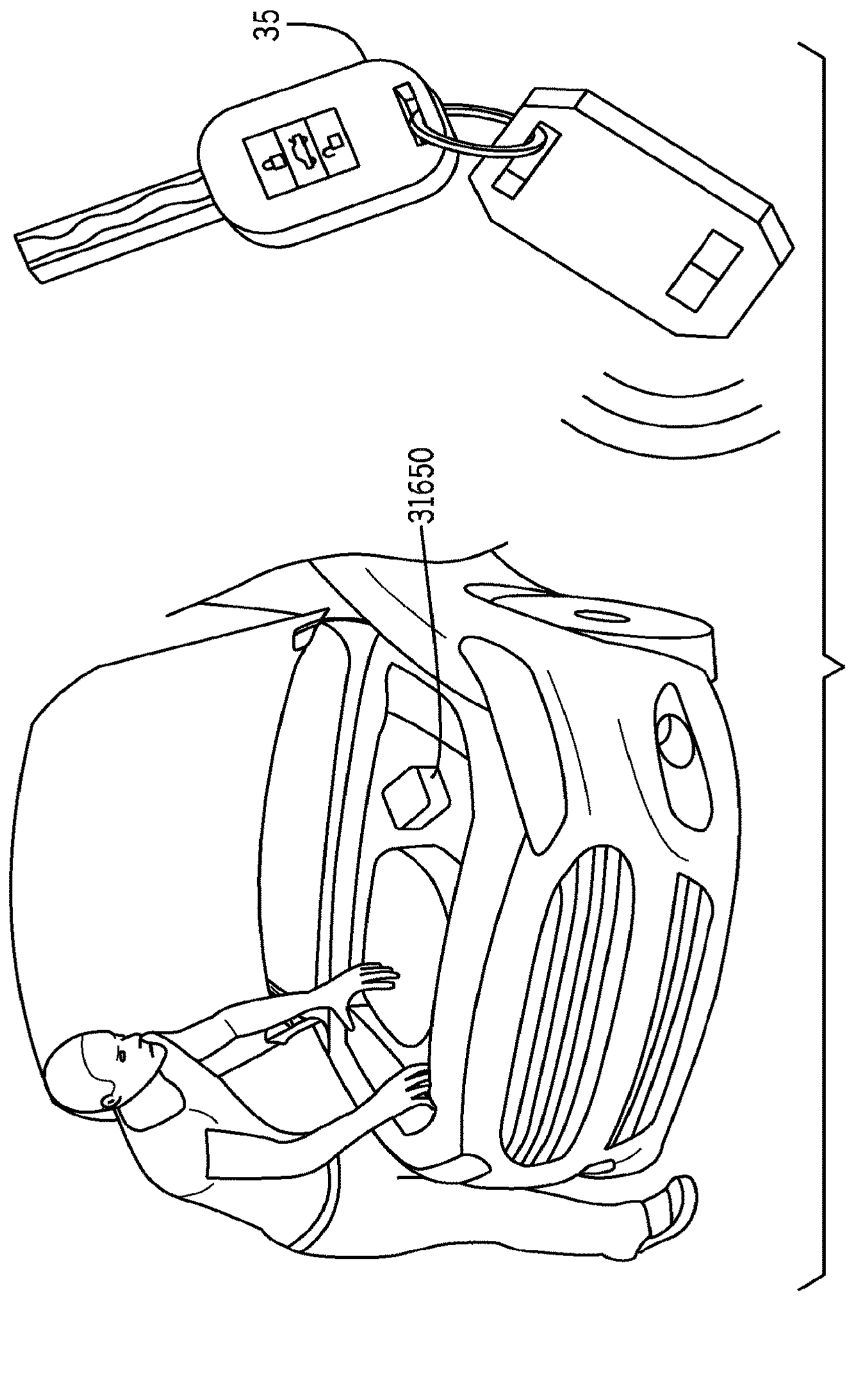
Figure 317B:
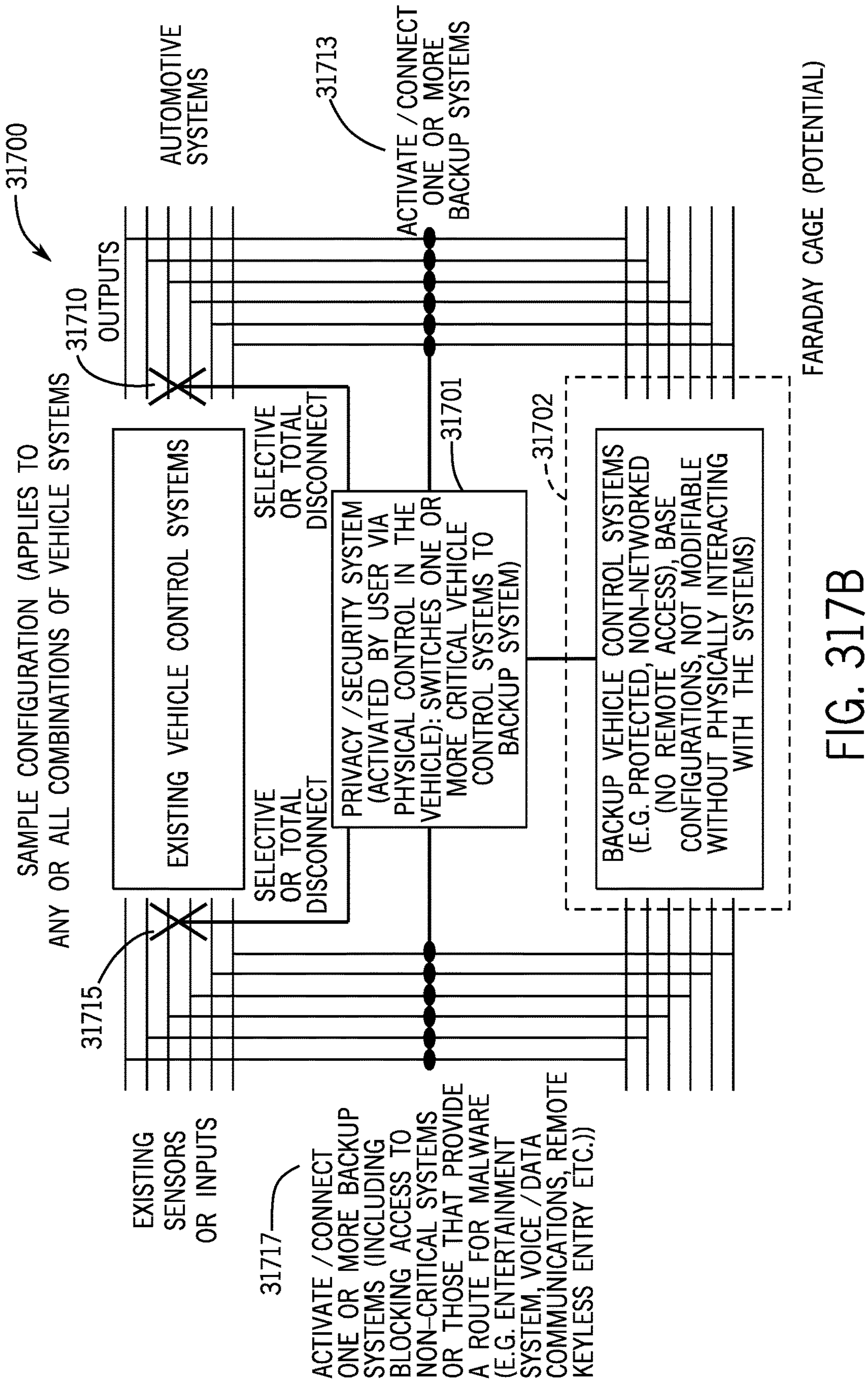

FIG. 317B illustrates a privacy/security system in accordance with some embodiments of the invention.

Figure 317C:
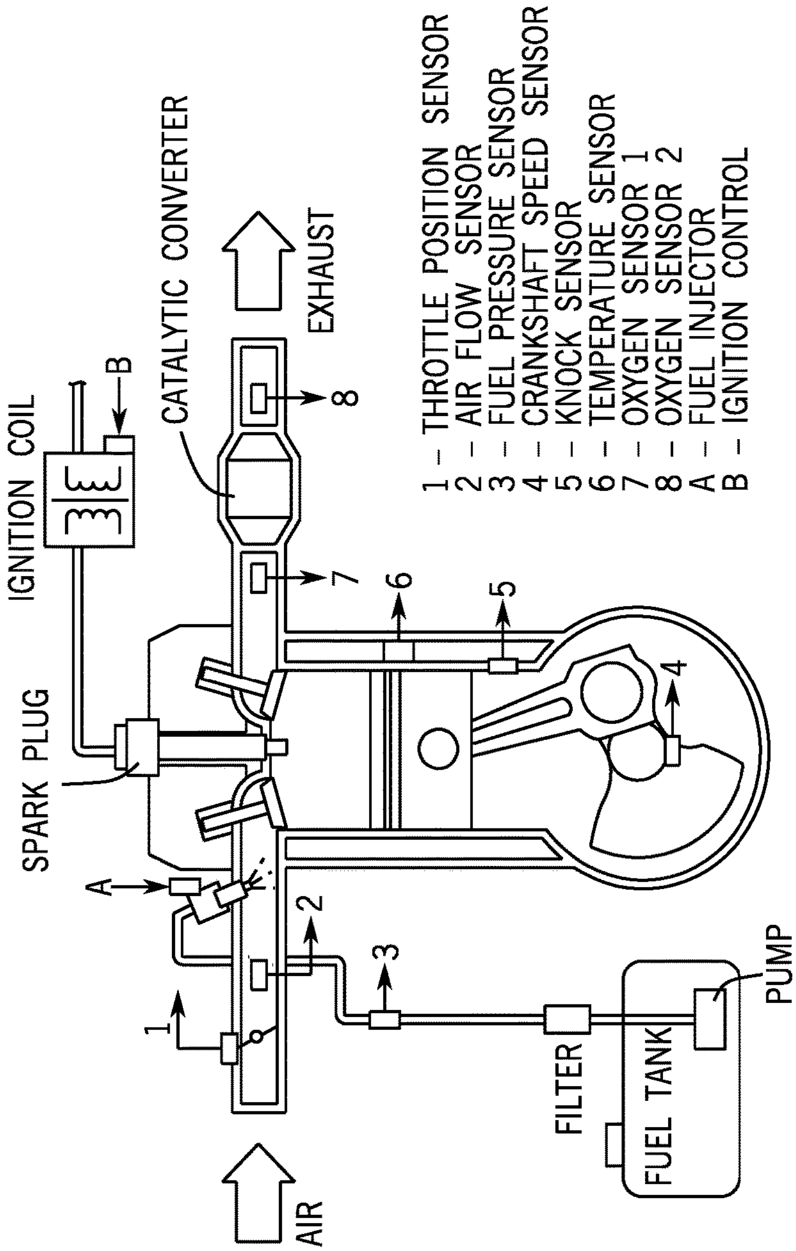
Figure 317D:
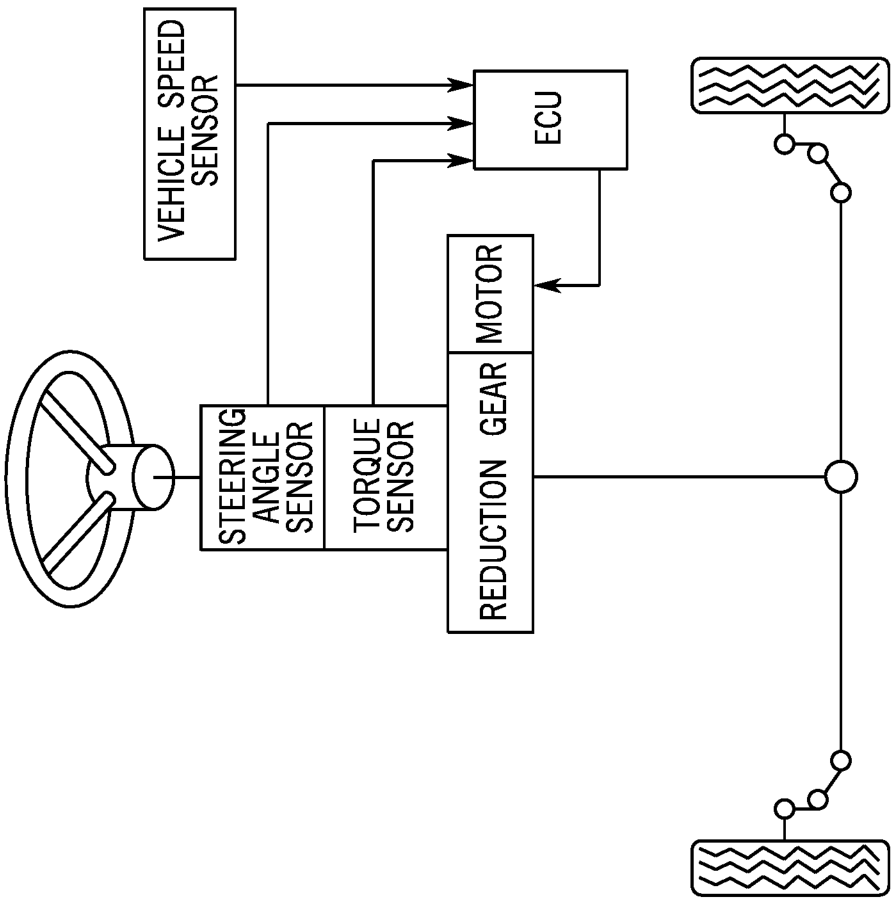

FIGS. 317C and 317D illustrate mechanical, electrical, and electromechanical systems of a vehicle that can be controlled by the privacy/security system of FIG. 317B in accordance with some embodiments of the invention.

Figure 318B:
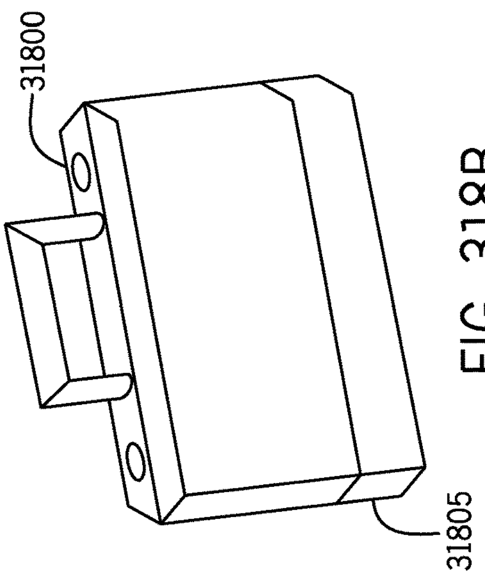
Figure 318C:
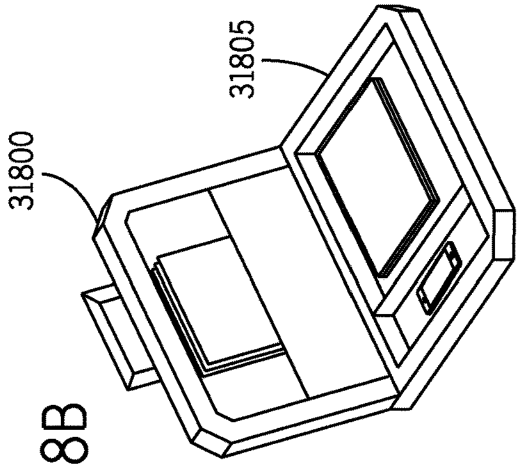
Figure 318A:
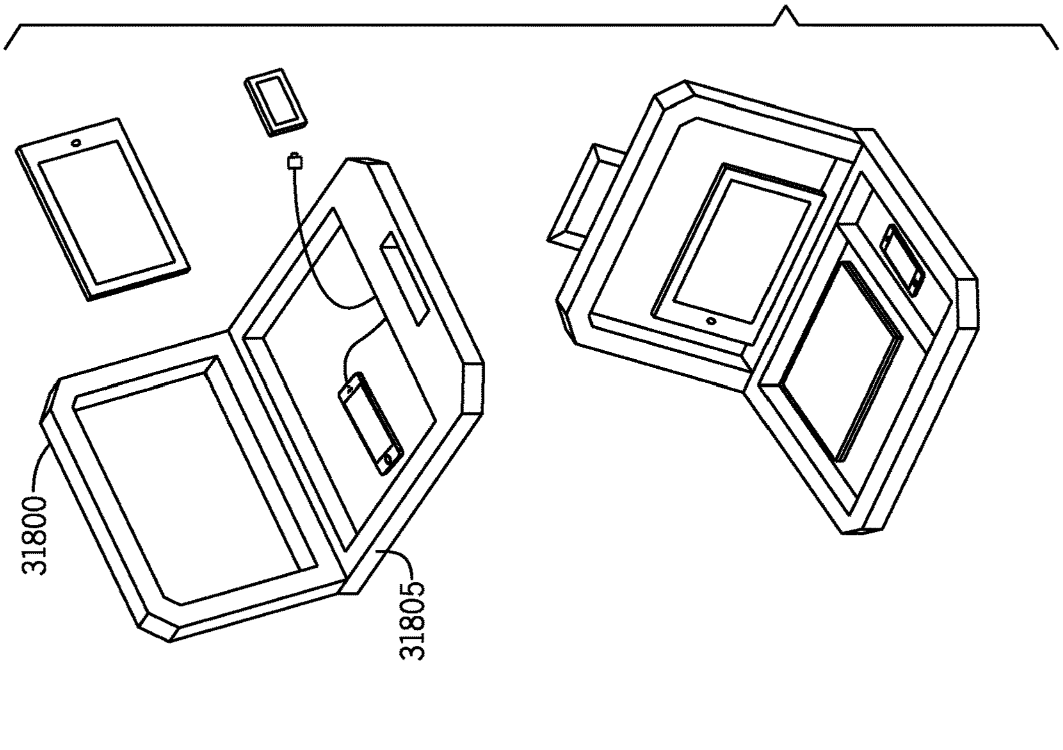

FIGS. 318A-318C illustrates a travel case privacy/security system in accordance with some embodiments of the invention.

Figure 319B:
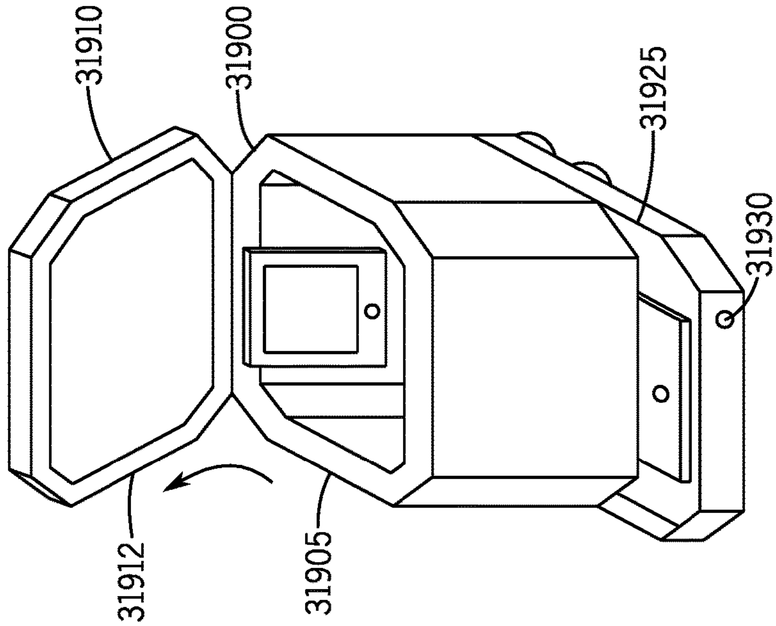
Figure 319A:
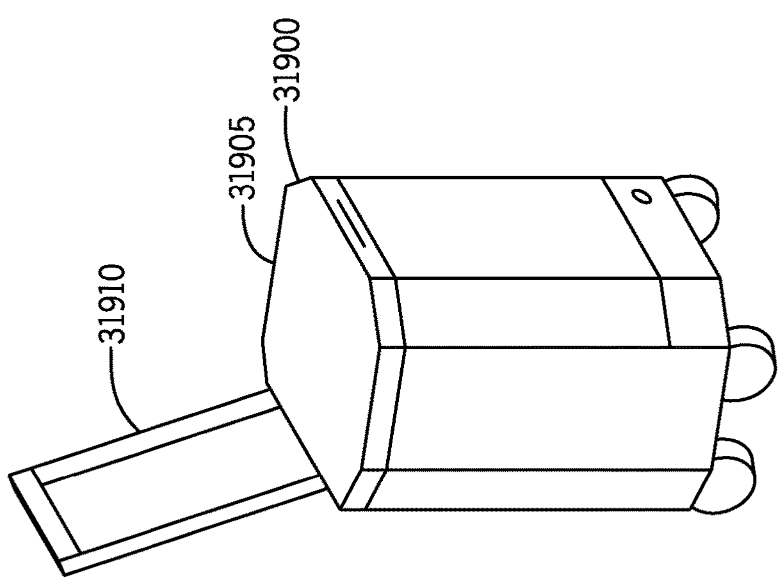

FIGS. 319A-319B illustrate a protective suitcase privacy/security system in accordance with some embodiments of the invention.

Figure 320:
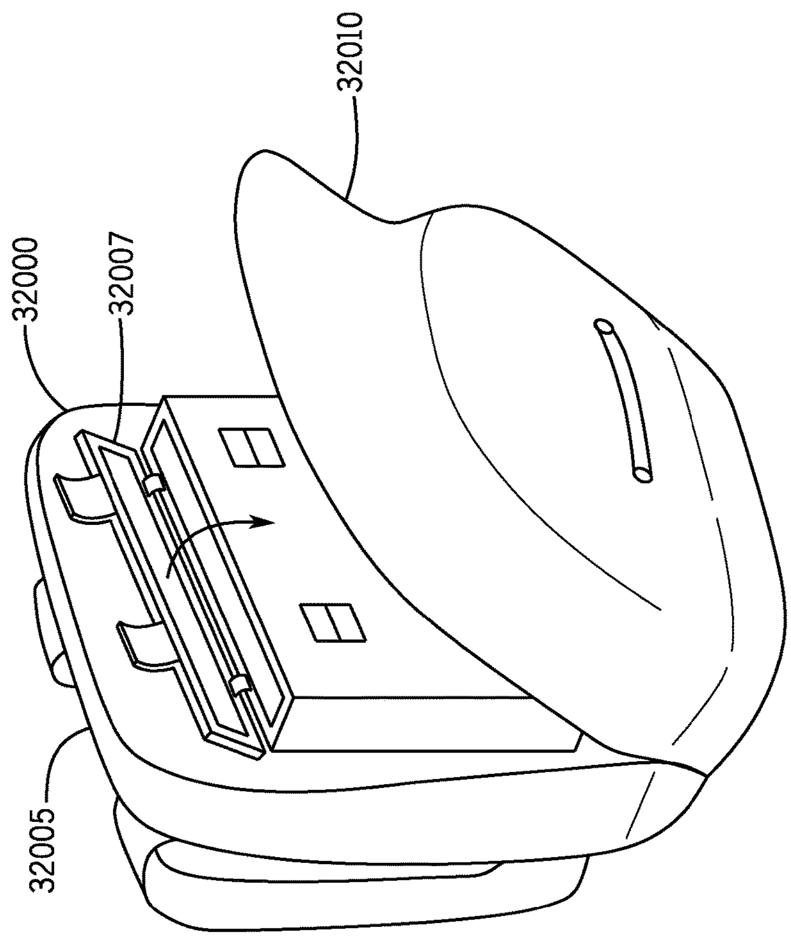

FIG. 320 illustrates a Faraday cage in bag privacy/security system in accordance with some embodiments of the invention.

Figure 321:
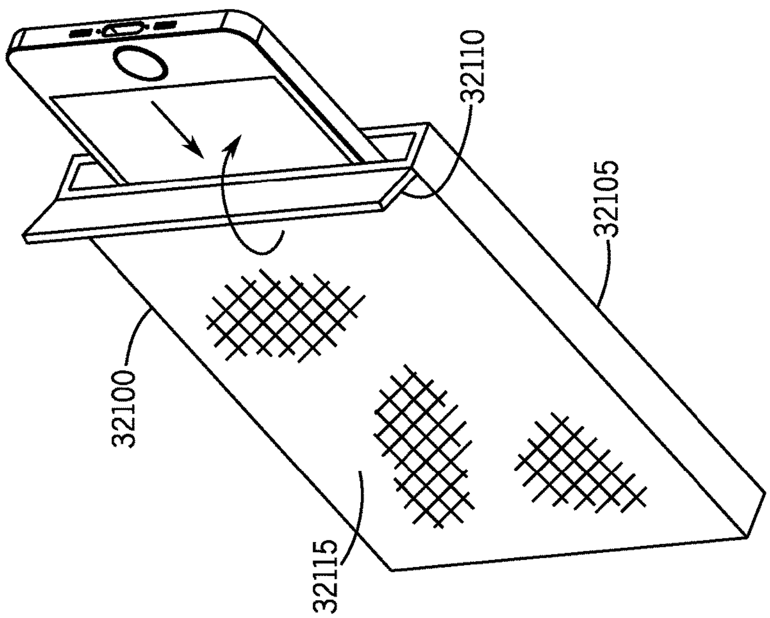

FIG. 321 illustrates a Faraday sleeve privacy/security system in accordance with some embodiments of the invention.

Figure 322:
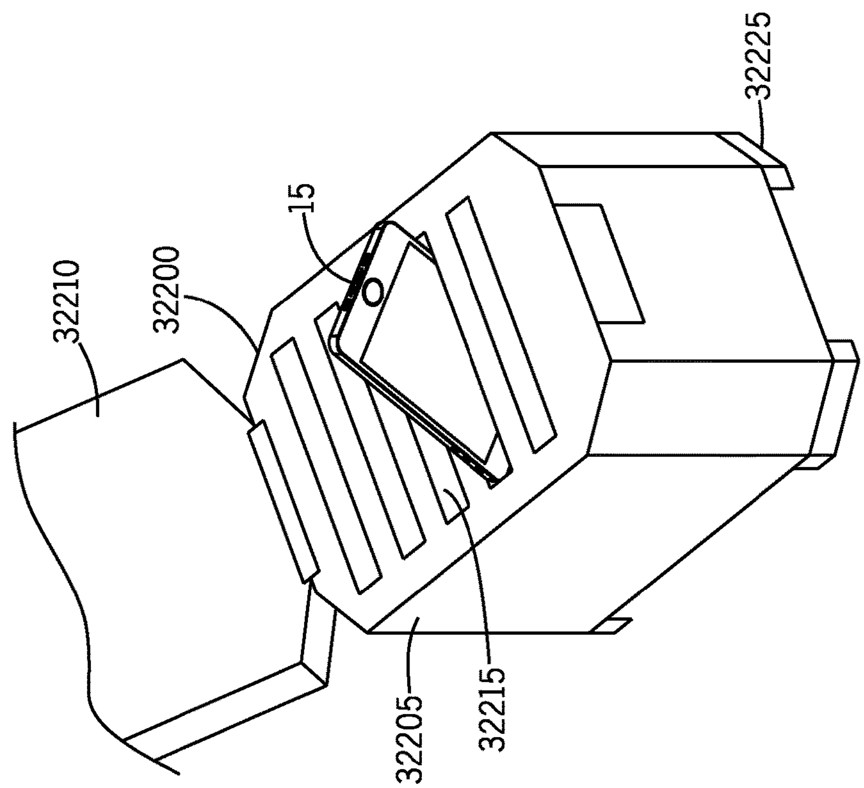

FIG. 322 illustrates a lockbox privacy/security enclosure in accordance with some embodiments of the invention.

Figure 323:
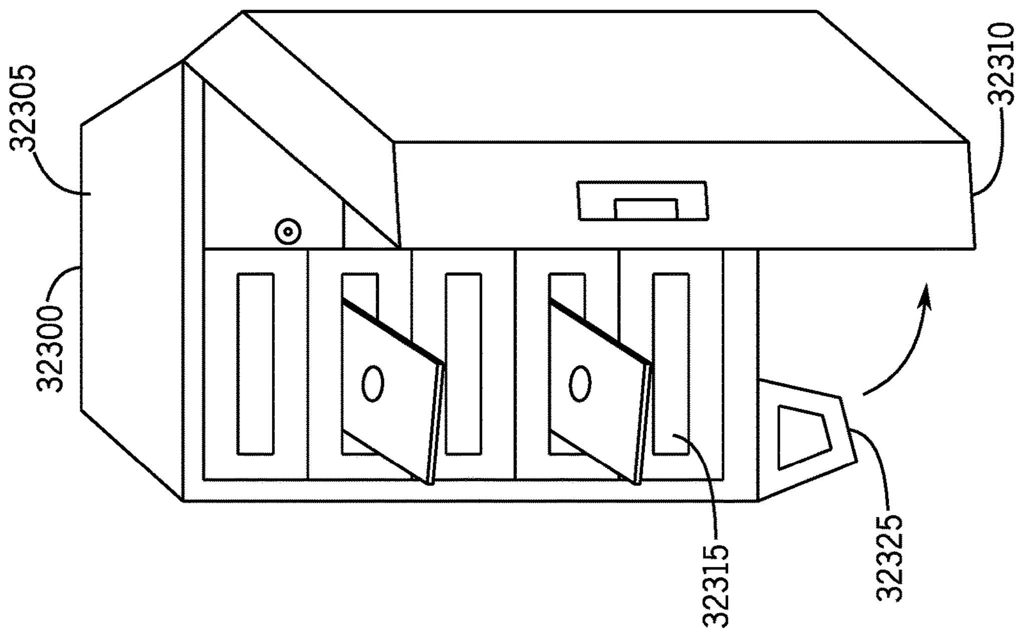

FIG. 323 illustrates a safe-type privacy/security enclosure in accordance with some embodiments of the invention.

Figure 324:
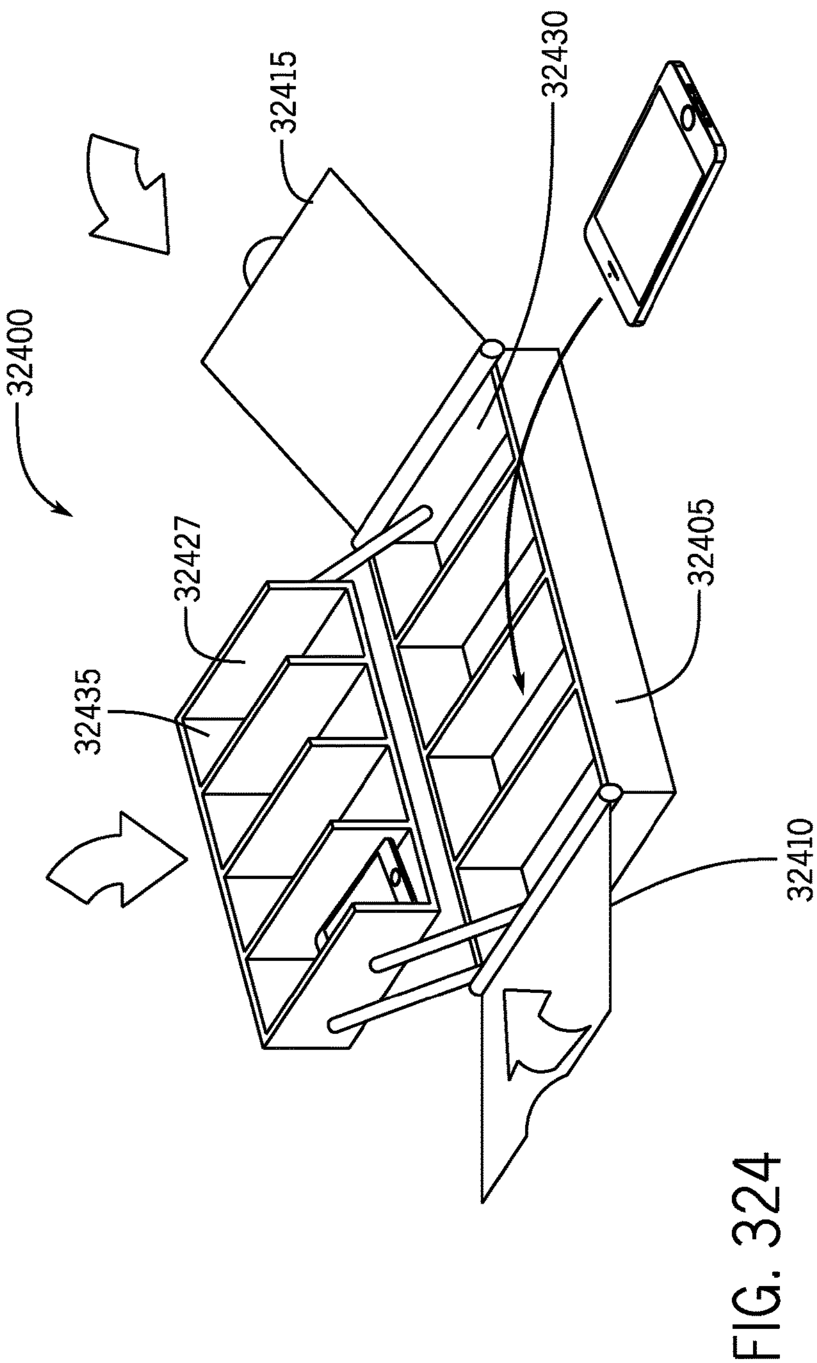

FIG. 324 illustrates a tackle box privacy/security enclosure in accordance with some embodiments of the invention.

Figure 325:
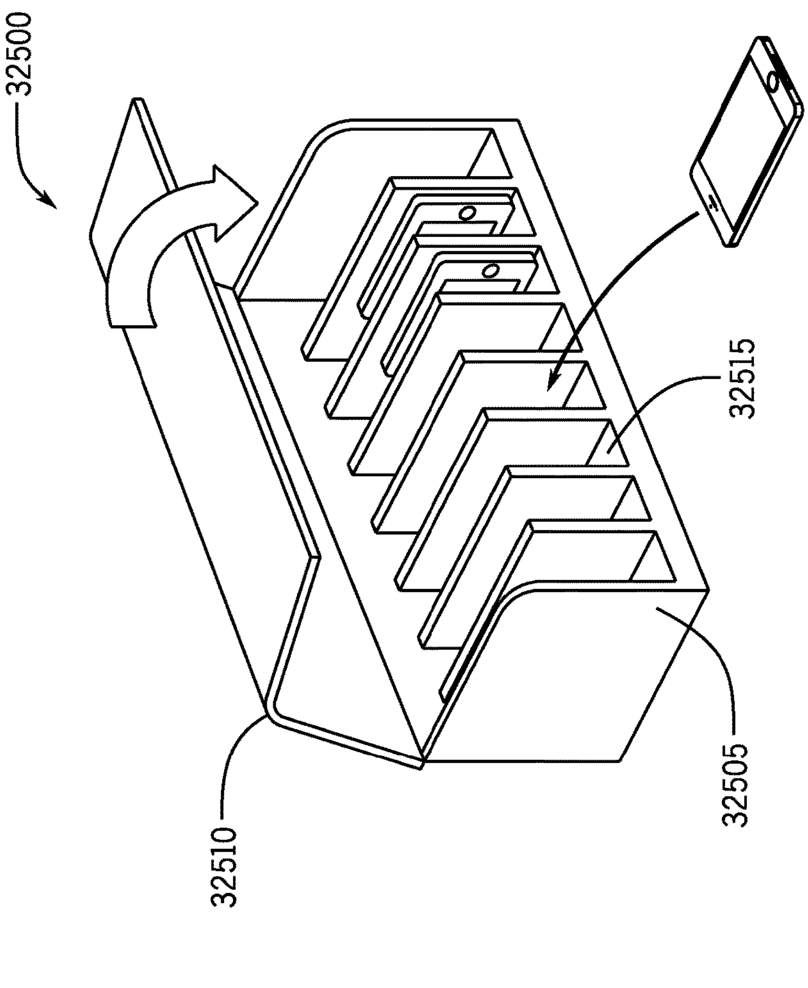

FIG. 325 illustrates a letter box privacy/security enclosure in accordance with some embodiments of the invention.

Figure 326:
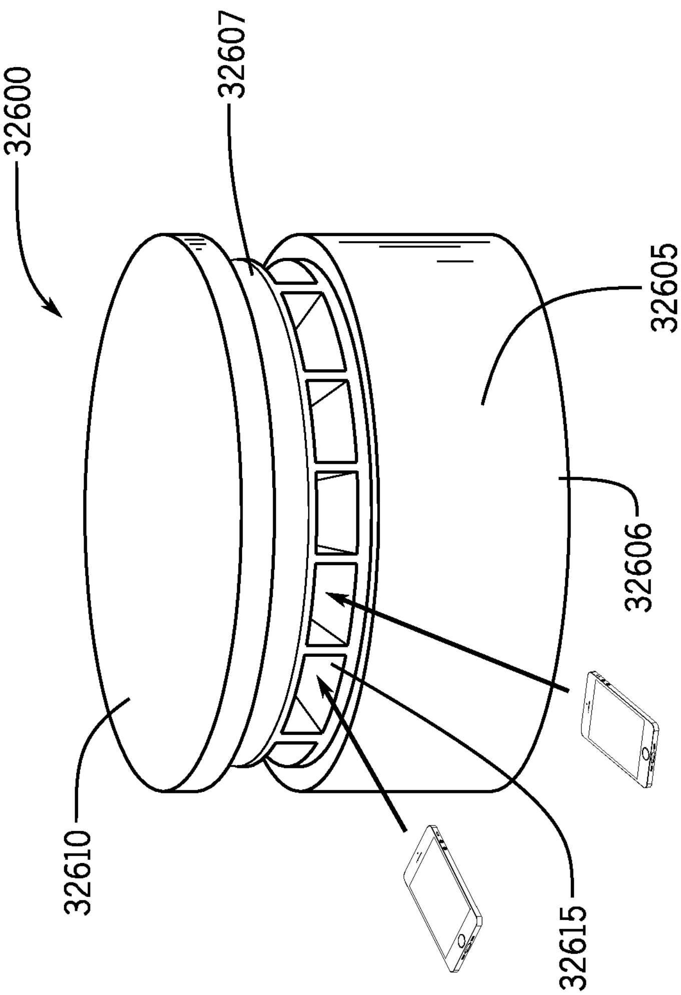

FIG. 326 illustrates a roundabout cage-type privacy/security enclosure in accordance with some embodiments of the invention.

Figure 327:
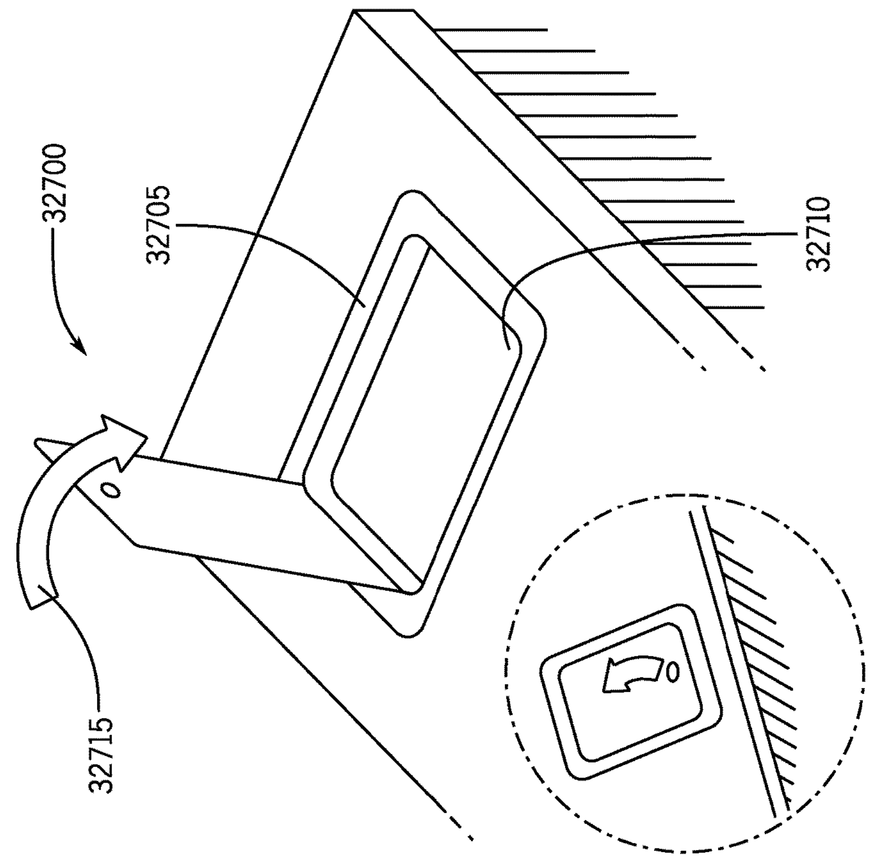
Figure 328A:
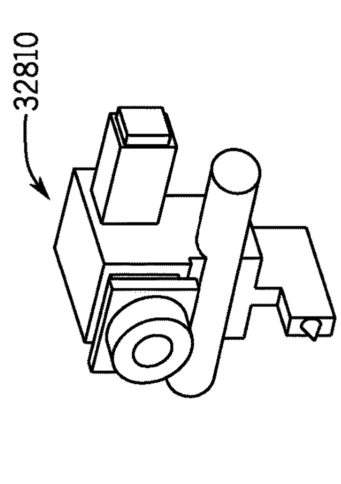
Figure 328B:
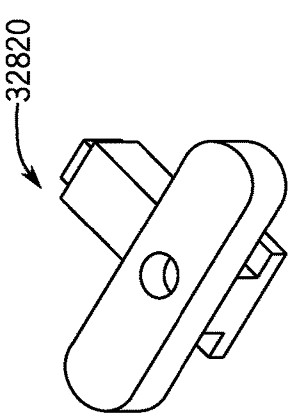
Figure 328C:
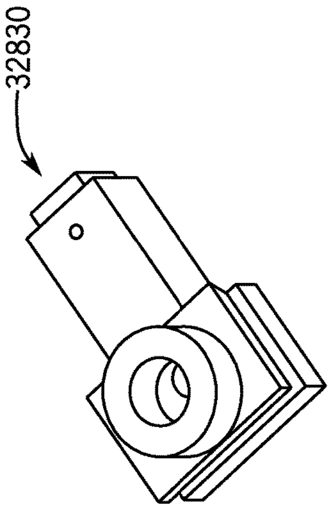
Figure 328D:
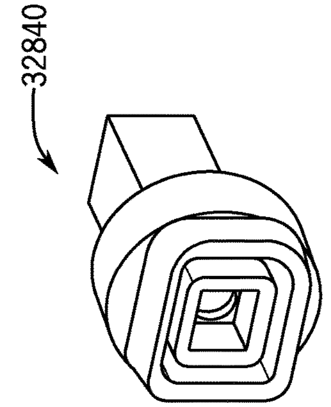
Figure 328E:
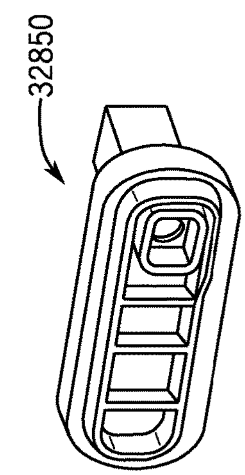
Figure 328F:
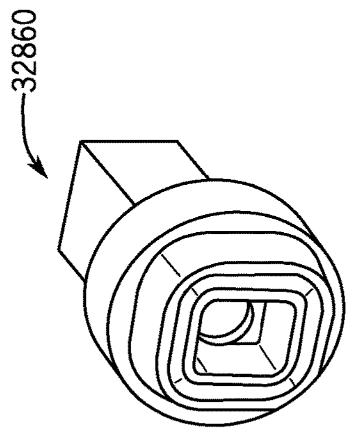

FIG. 327 illustrates a built-in type privacy/security enclosure in accordance with some embodiments of the invention.

FIGS. 328A-328F illustrate seals and seal structures in accordance with some embodiments of the invention.

Figure 329:
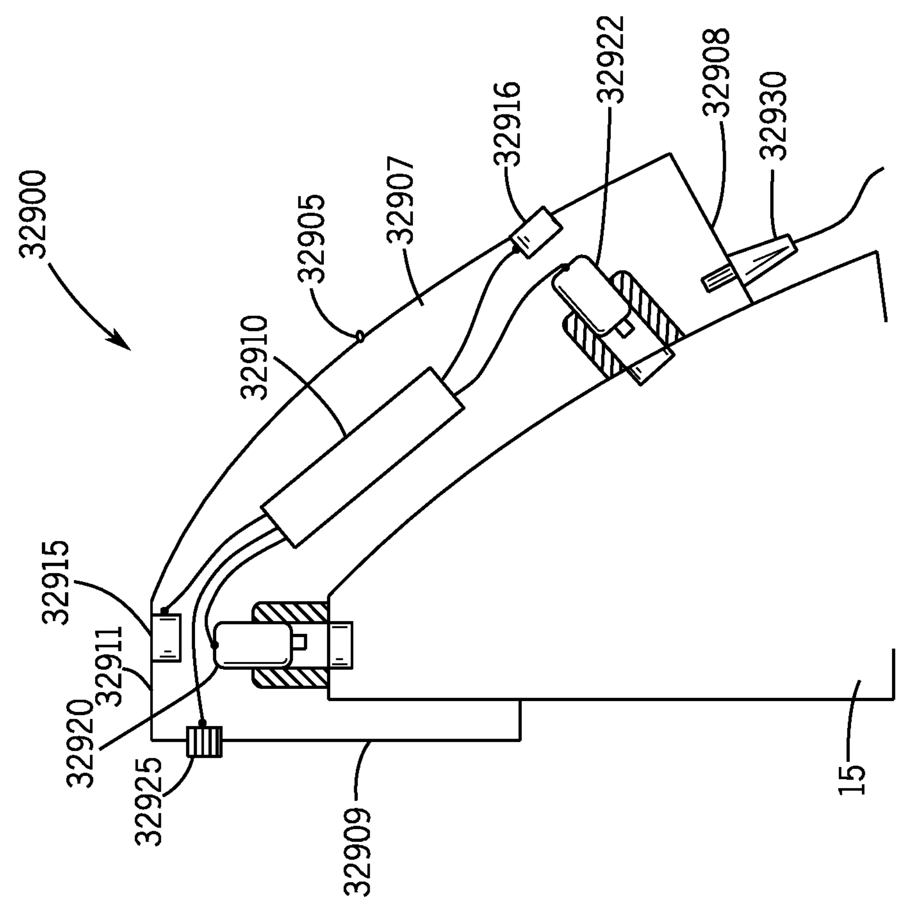

FIG. 329 illustrates privacy/security enclosure in accordance with some embodiments of the invention.

Figure 330:
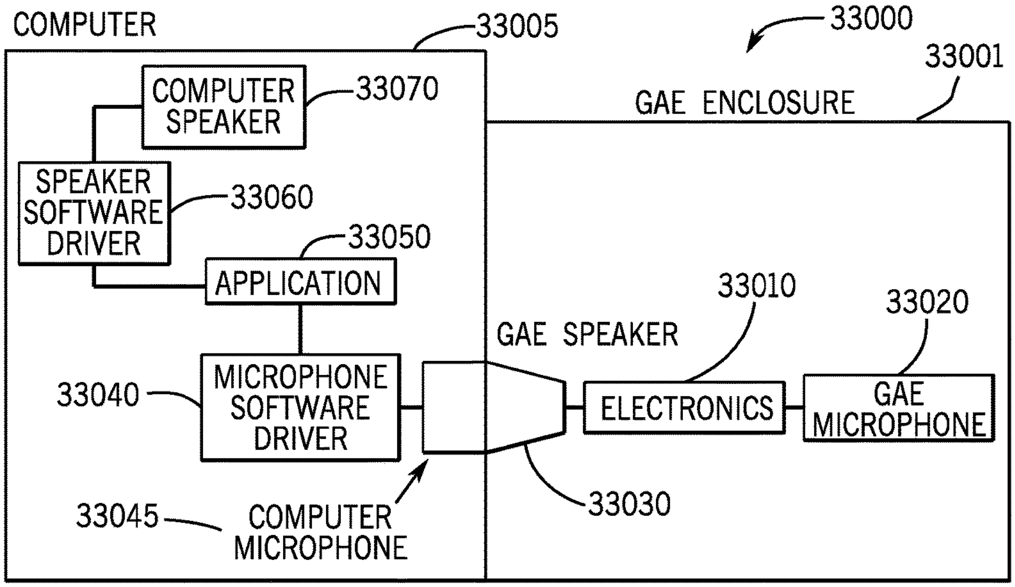

FIG. 330 illustrates a schematic of a privacy/security system in accordance with some embodiments of the invention.

Figure 331:
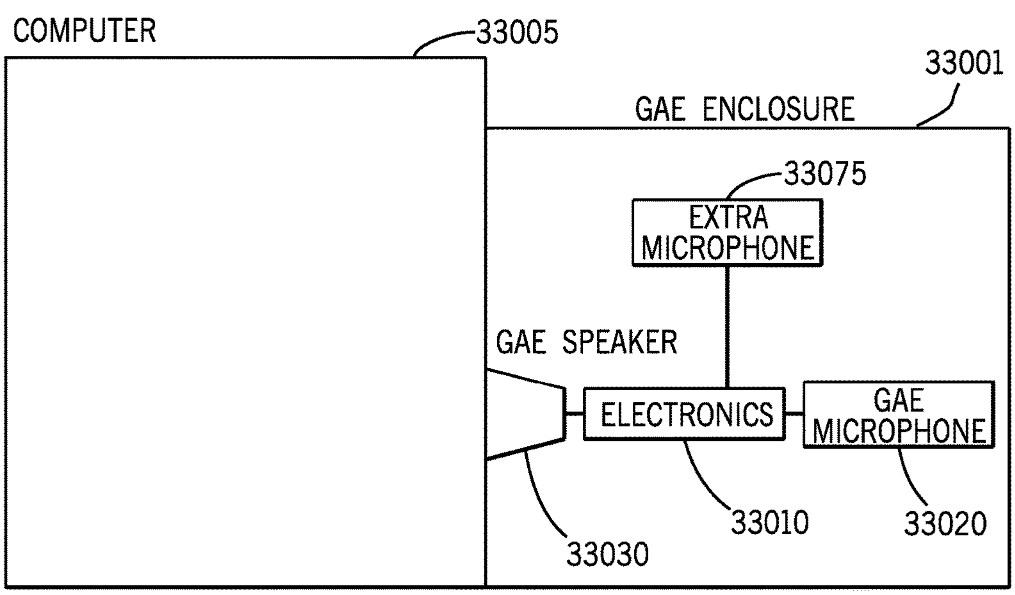

FIG. 331 illustrates a system schematic of a privacy/security enclosure in accordance with some embodiments of the invention.

Figure 332:
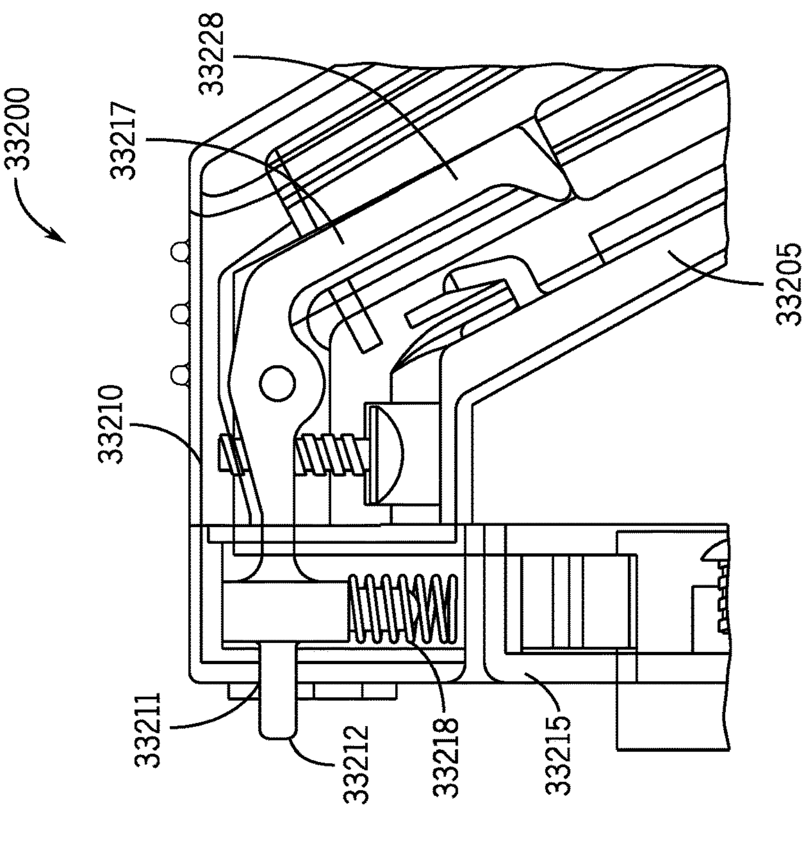

FIG. 332 illustrates a cross-sectional view of a privacy/security enclosure in accordance with some embodiments of the invention.

Figure 333:
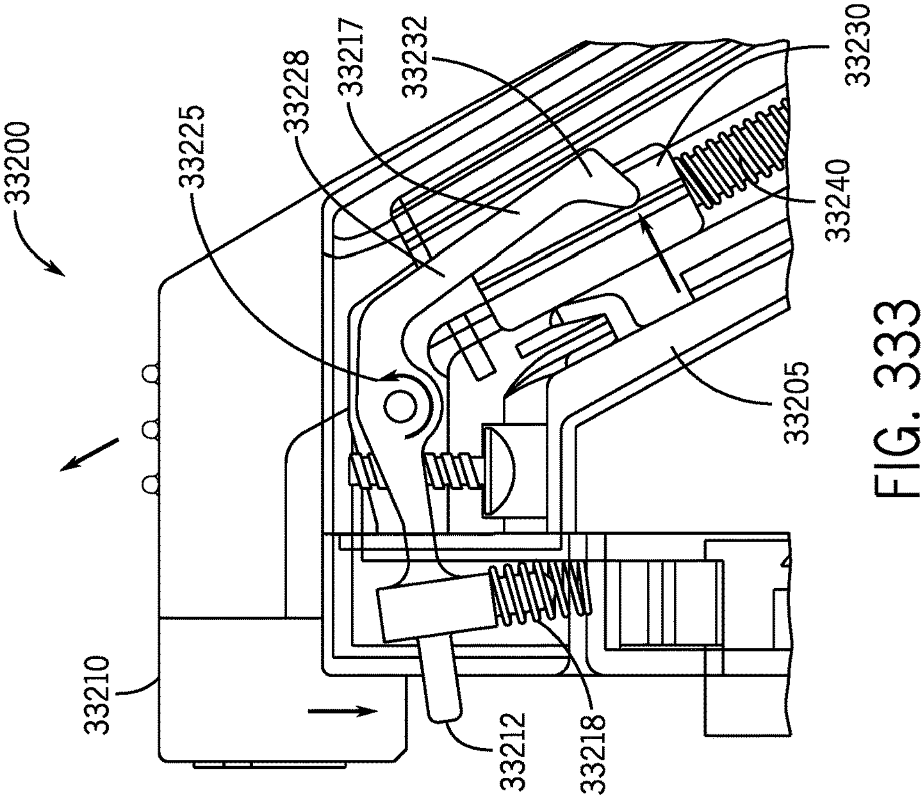

FIG. 333 illustrates a cross-sectional view of a privacy/security enclosure in accordance with some embodiments of the invention.

Figure 334:
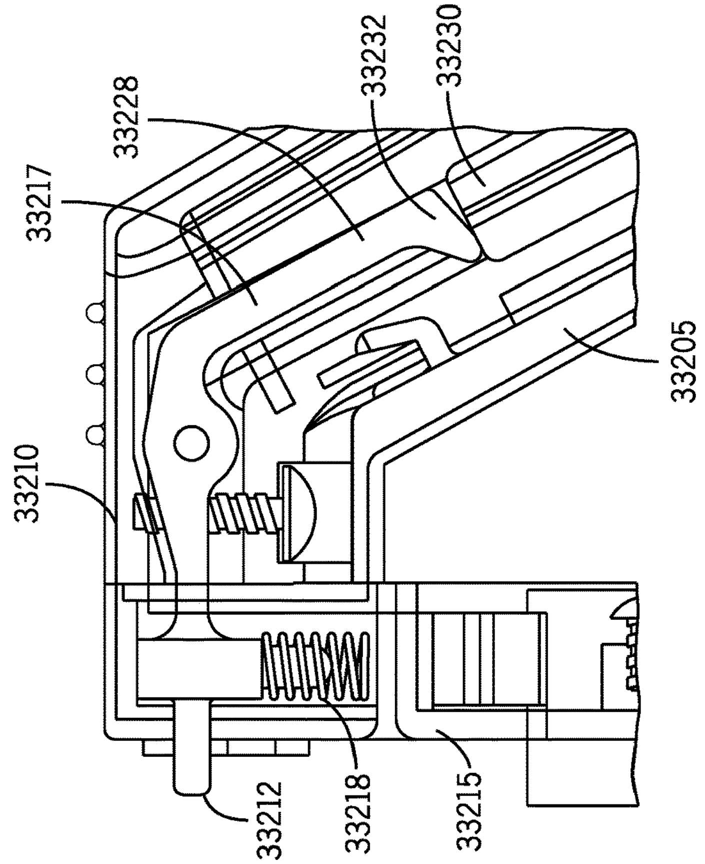

FIG. 334 illustrates a cross-sectional view of a privacy/security enclosure in accordance with some embodiments of the invention.

Figure 335:
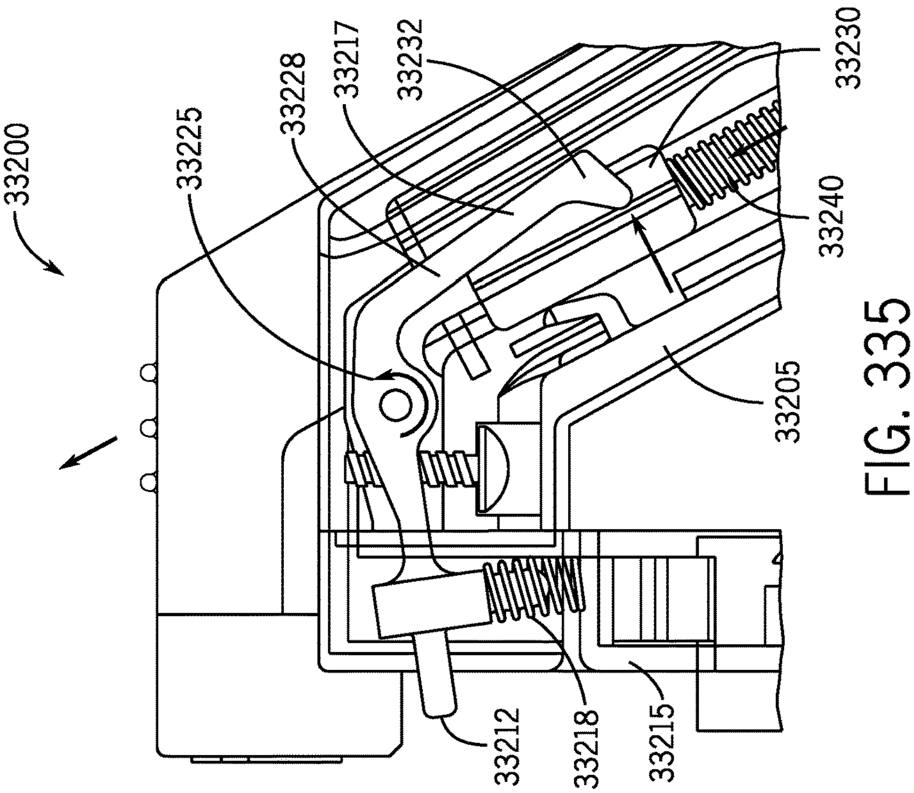

FIG. 335 illustrates a cross-sectional view of a privacy/security system in accordance with some embodiments of the invention.

Figure 336:
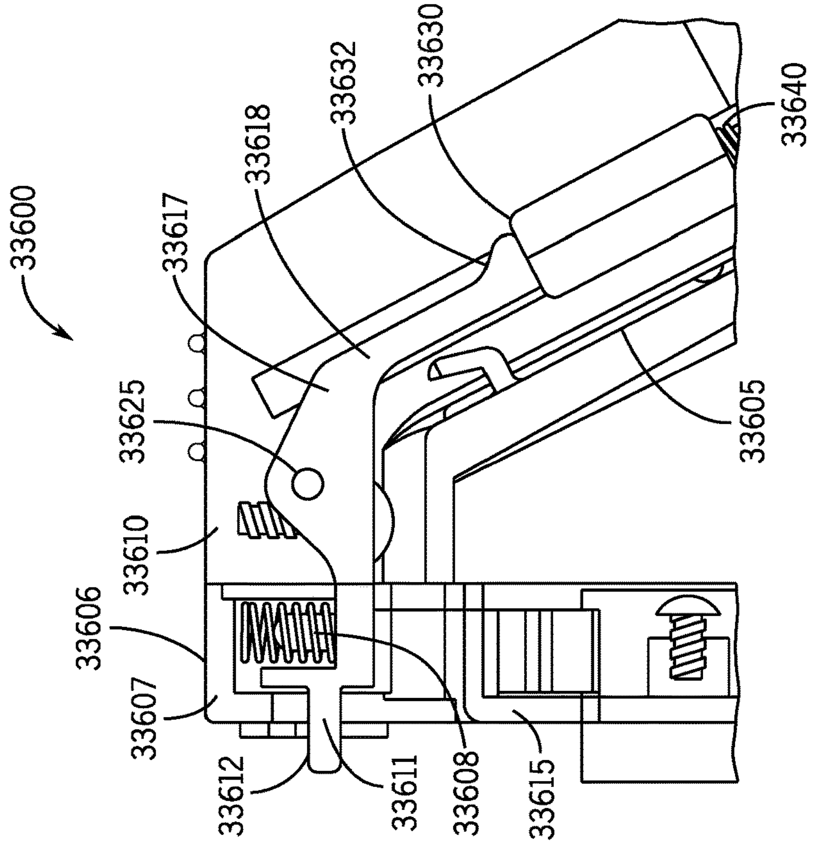

FIG. 336 illustrates a cross-sectional view of a privacy/security enclosure in accordance with some embodiments of the invention.

Figure 337:
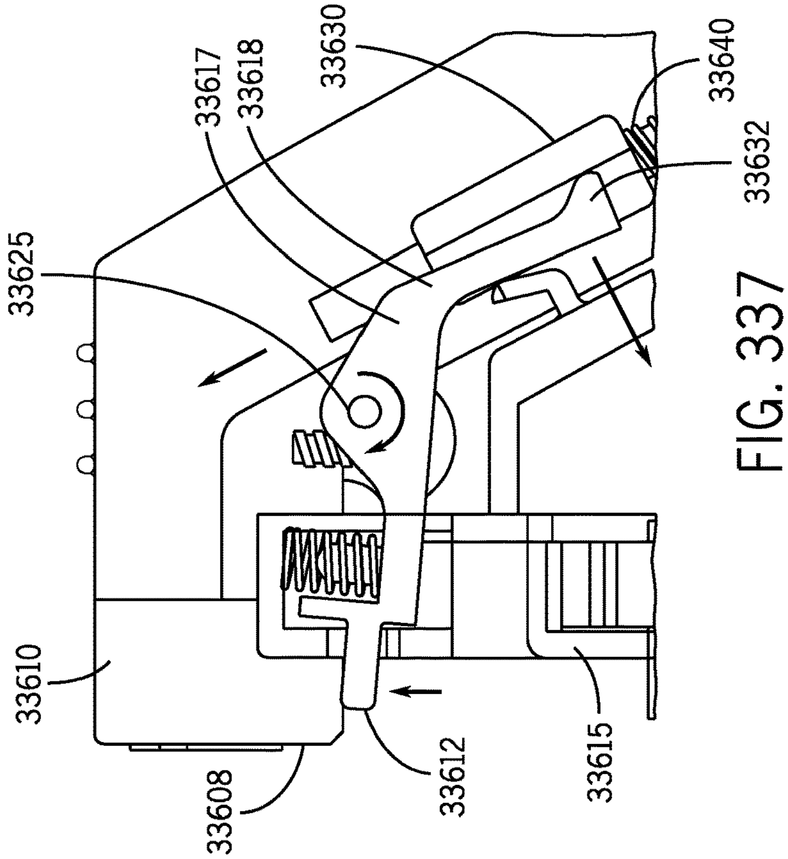

FIG. 337 illustrates a cross-sectional view of a privacy/security enclosure in accordance with some embodiments of the invention.

Figure 338:
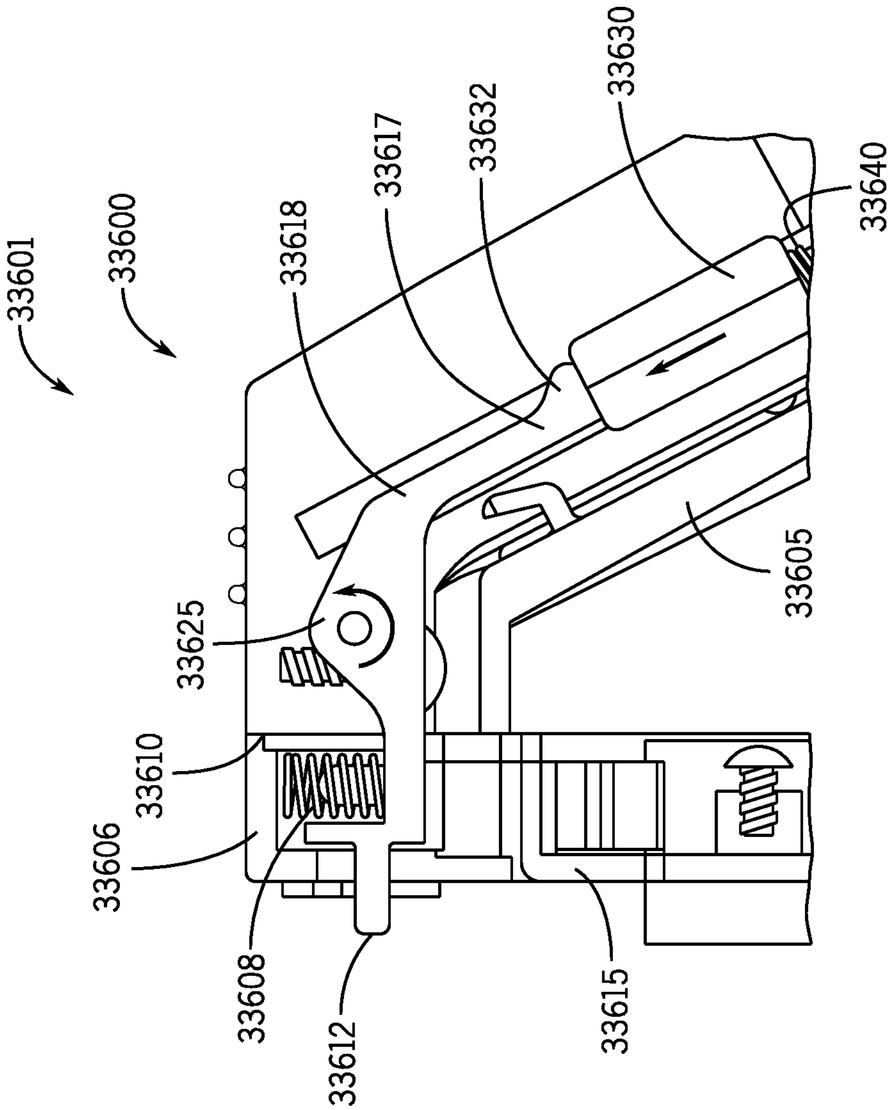

FIG. 338 illustrates a cross-sectional view of a privacy/security enclosure in accordance with some embodiments of the invention.

Figure 339:
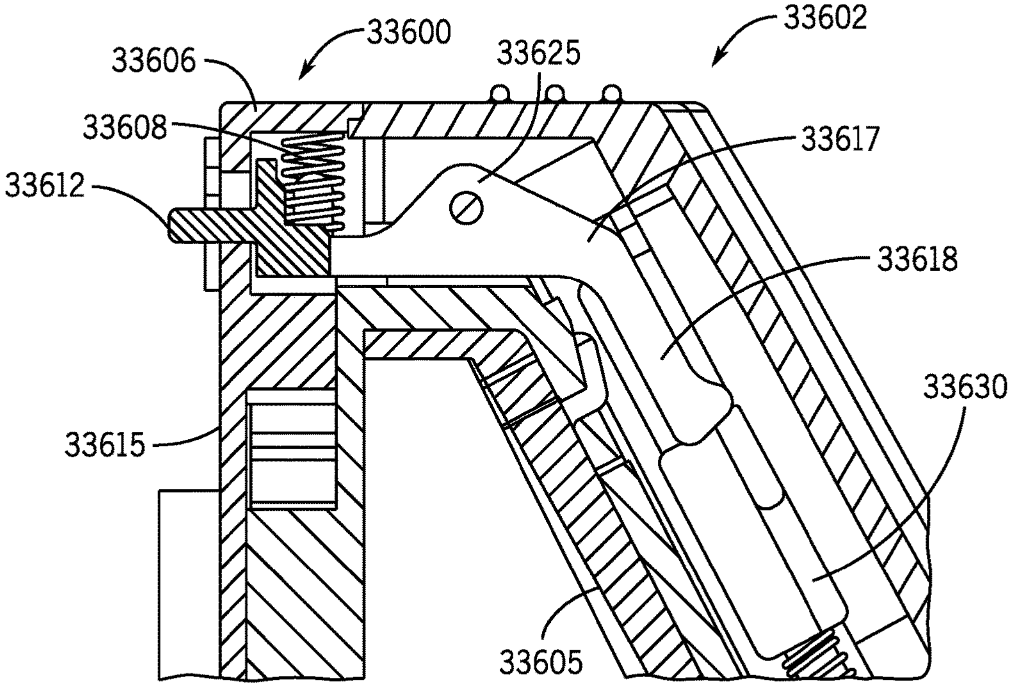

FIG. 339 illustrates a cross-sectional view of a privacy/security enclosure in accordance with some embodiments of the invention.

Figure 340:
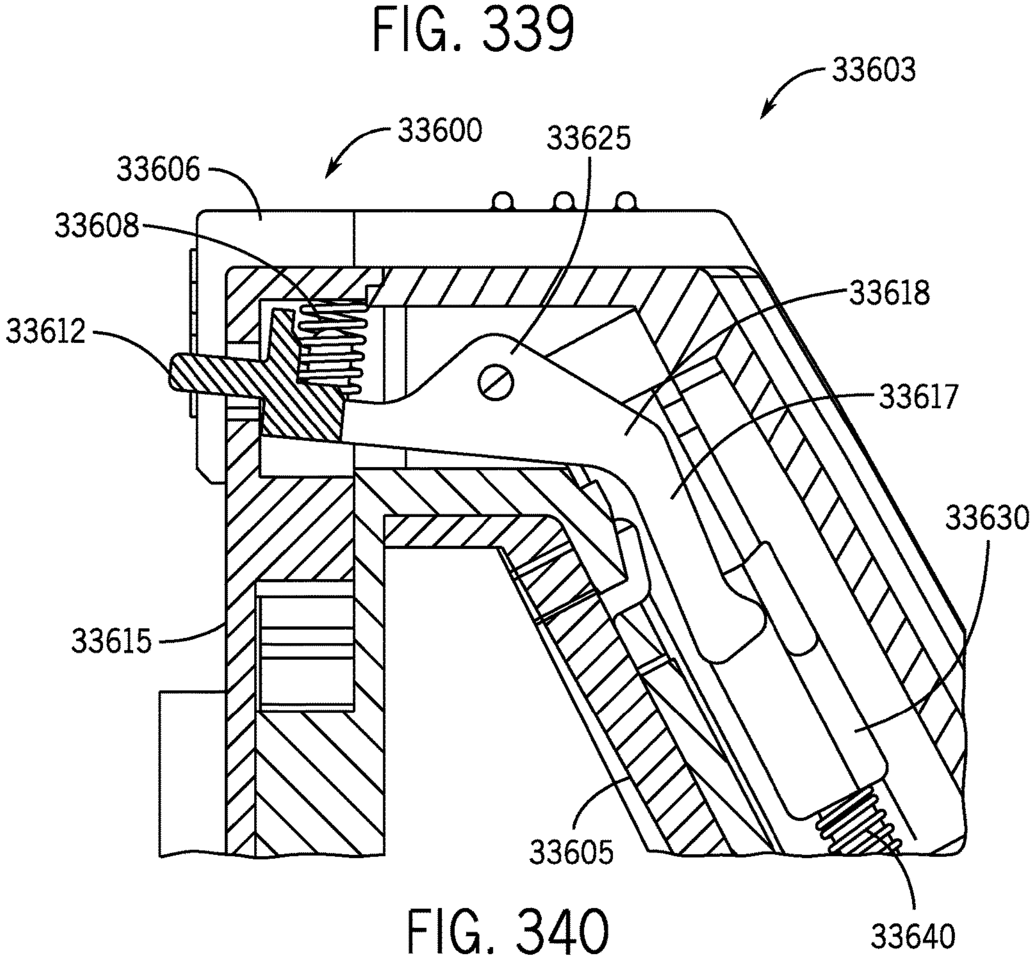

FIG. 340 illustrates a cross-sectional view of a privacy/security enclosure in accordance with some embodiments of the invention.

Figure 341:
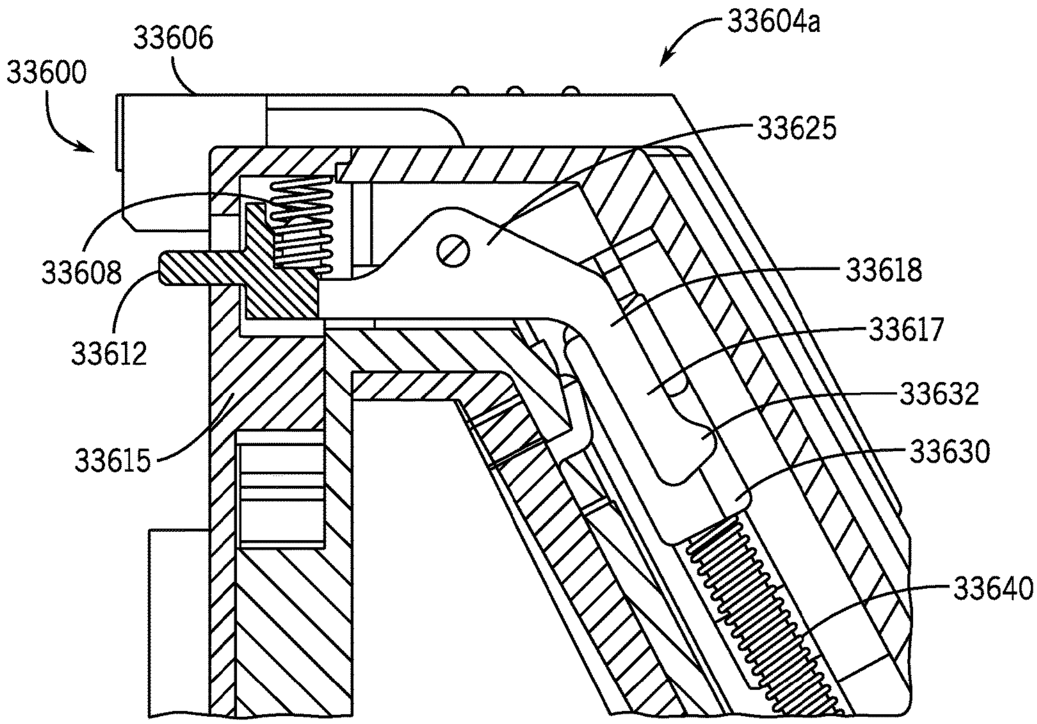

FIG. 341 illustrates a cross-sectional view of a privacy/security enclosure in accordance with some embodiments of the invention.

Figure 342:
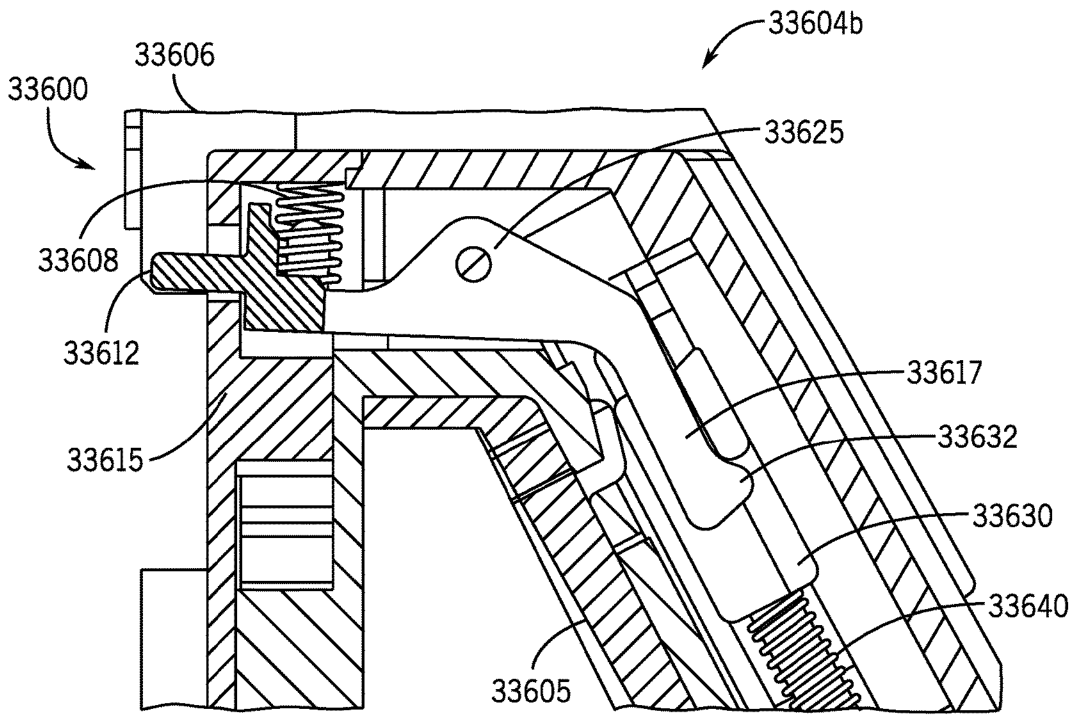

FIG. 342 illustrates a cross-sectional view of a privacy/security enclosure in accordance with some embodiments of the invention.

Figure 343:
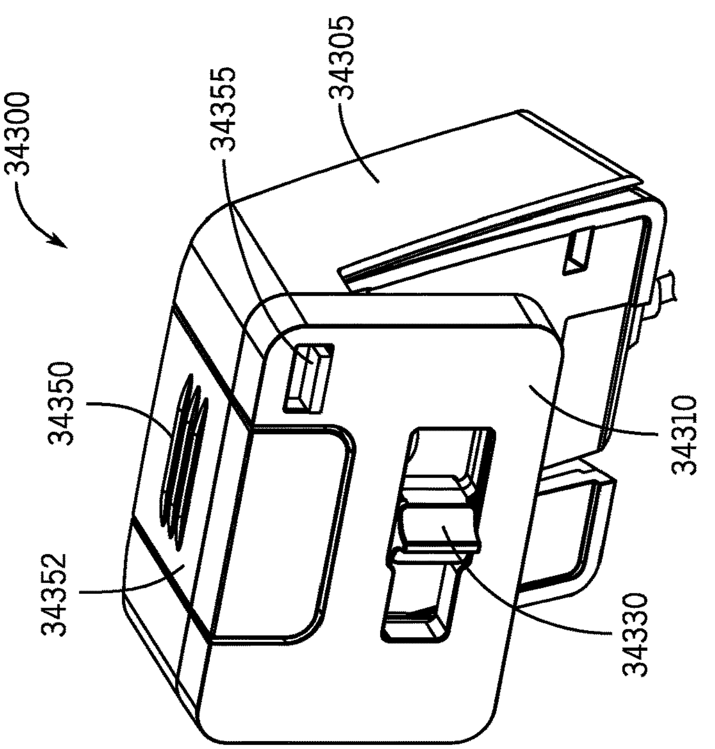

FIG. 343 illustrates a perspective view of a privacy/security enclosure in accordance with some embodiments of the invention.

Figure 344:
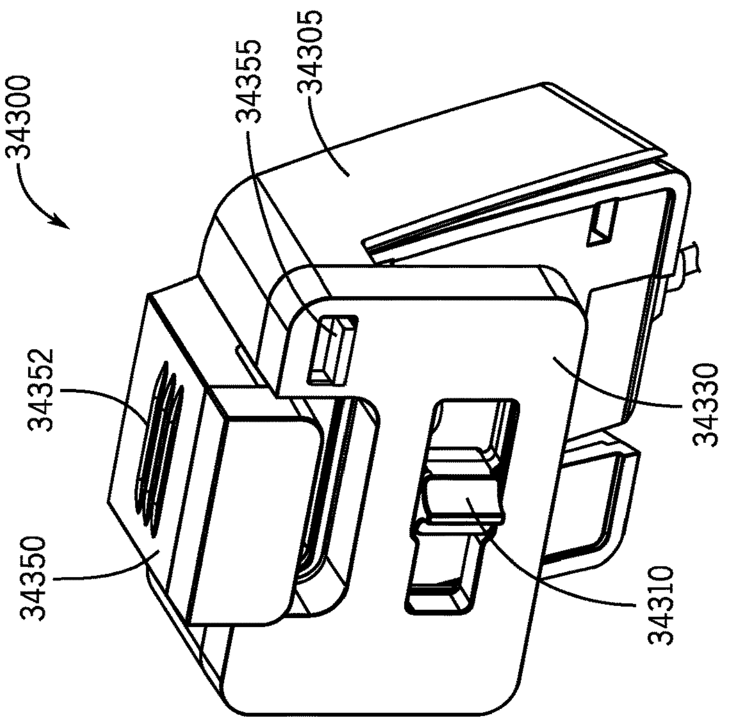

FIG. 344 illustrates a perspective view of a privacy/security enclosure in accordance with some embodiments of the invention.

Figure 345:
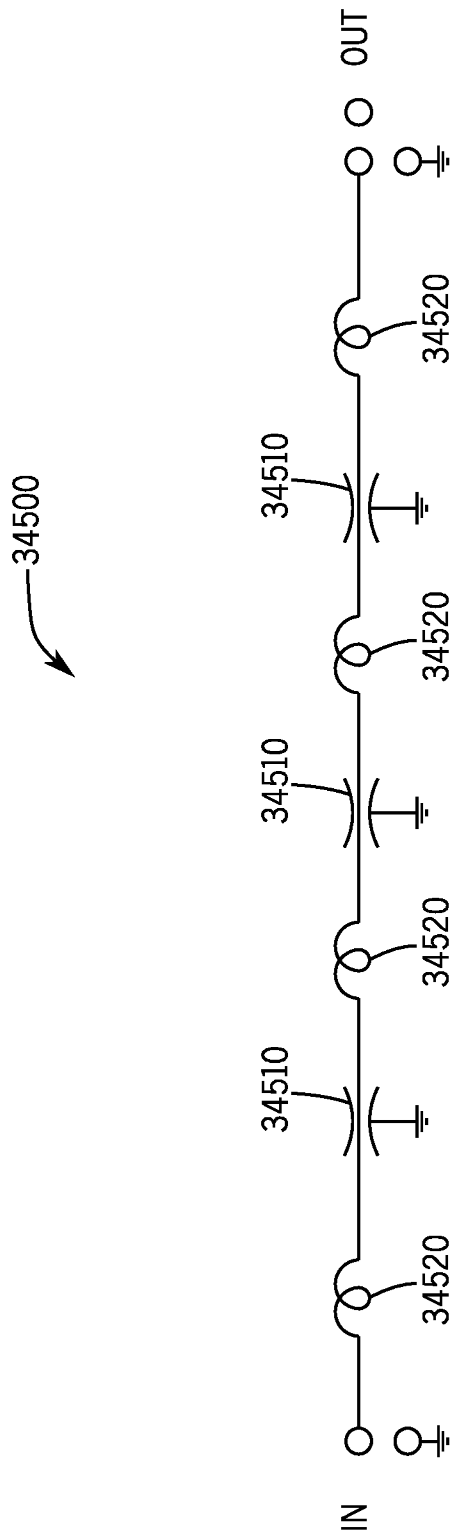

FIG. 345 illustrates a circuit diagram for a DC pass-through in accordance with some embodiments of the invention.

Figure 346:
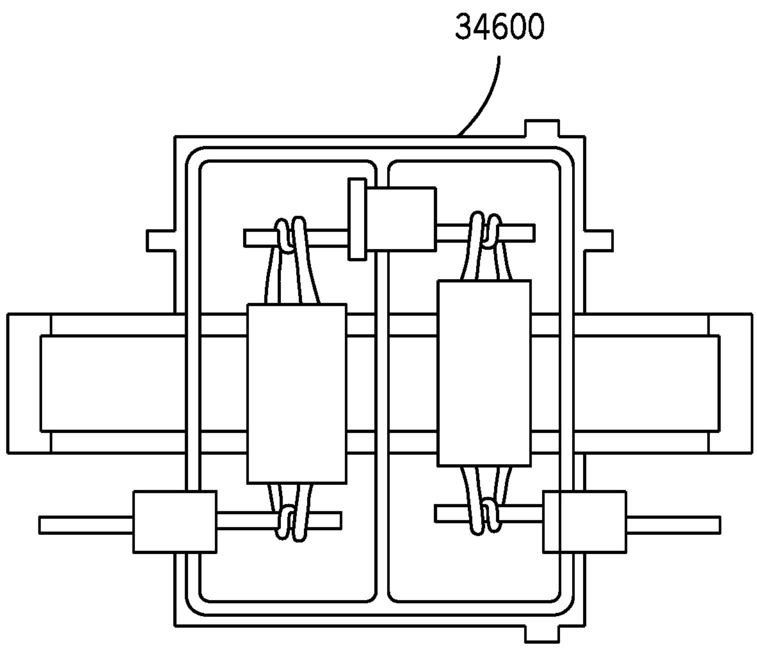

FIG. 346 illustrates a front view of a DC pass-through assembly implementing the circuit of FIG. 345 in accordance with some embodiments of the invention.

Figure 347:
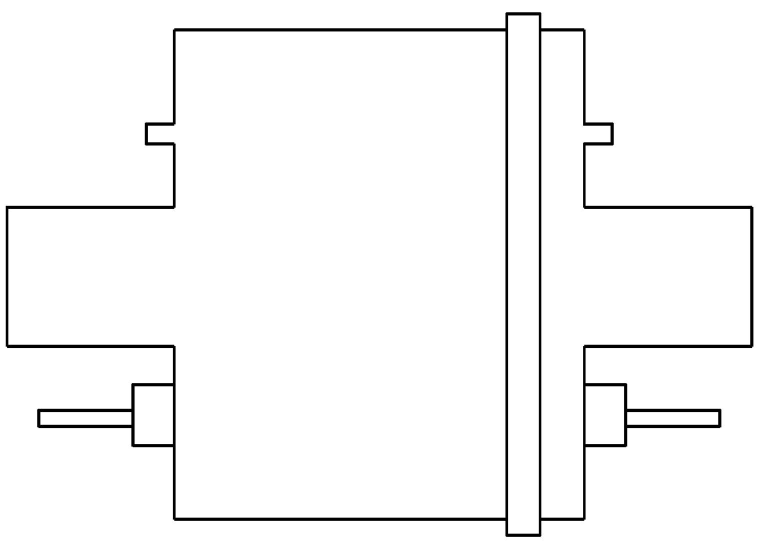

FIG. 347 illustrates a rear view of the DC pass-through assembly of FIG. 346 in accordance with some embodiments of the invention.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings. Unless specified or limited otherwise, the terms "seal," "seals," and "sealed" and variations thereof are used to broadly encompass a range of levels of sealing, from at least some or partial sealing, to substantially complete or full sealing with substantially no leakage through the seal. Unless specified or limited otherwise, the term "phone(s)," "smartphone(s)," "tablet(s)," "computer(s)," and figures depicting such devices are intended to be used generically and interchangeably with each other and for any other such device(s) with one or more microphones and/or camera(s) and/or RF transceiver(s) and/or optical transceivers and/or infrared transceivers and/or wired networking capability and/or other sensor(s). Unless specified or limited otherwise, the terms "USB," and "micro-USB" refer to all standard charging interfaces for consumer electronic devices, including proprietary connectors such as Apple's Lightning™ connector.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Embodiments of the invention described herein include privacy/security devices, privacy/security systems and methods of use of these devices and systems for providing or facilitating a user's privacy/security. Unless specified or limited otherwise, the term "privacy/security enclosure" can be used throughout to describe embodiments of a structure forming at least a partial enclosure, chamber, cover, case, sleeve, channel, conduit, window, and variations thereof to broadly encompass rendering a range of levels of privacy/security to a user, from at least some or partial privacy/security, to substantially complete or complete privacy/security with substantially no private information leakage through the privacy/security enclosure. Further, the term "privacy/security enclosure" can be used throughout to describe embodiments of a system providing privacy/security control to a user.

Figure 1:
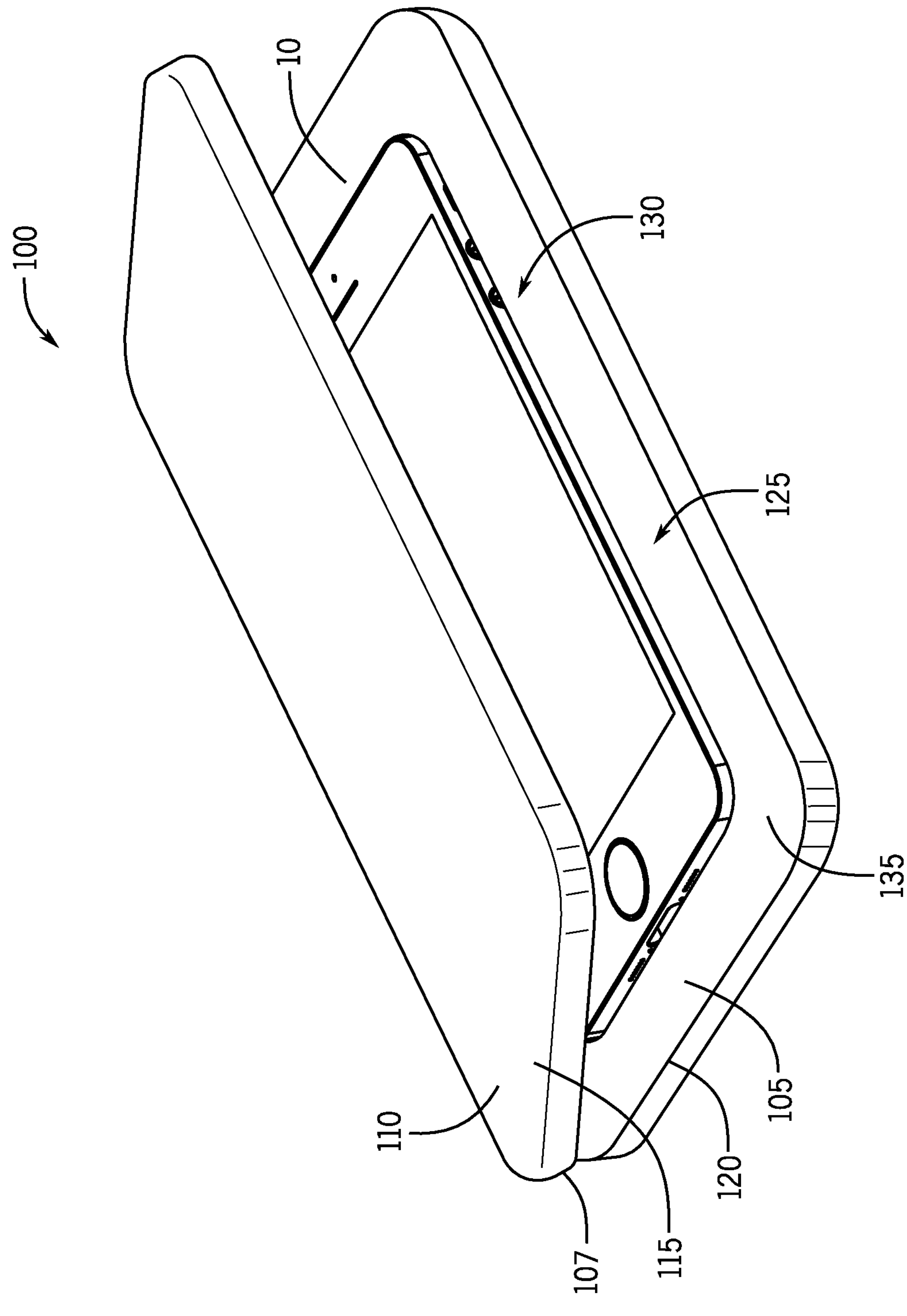
FIG. 1 is a perspective view of a partially open privacy/security enclosure according to one embodiment of the invention.

FIG. 1 is a perspective view of a partially open privacy/security enclosure 100 according to at least one embodiment of the invention. The privacy/security enclosure 100 includes structure and functions as described below that can apply to at least one other privacy/security enclosure described herein, including some or all of the privacy/security enclosures disclosed and described and shown the related figures. In some embodiments, the privacy/security enclosure can comprise a structure that can least partially envelop at least one device comprising an RF transceiver and/or an audio device, and/or a video device, and/or an audio/video/RF protection device(s), and/or a near-field communication (hereinafter "NFC") device, and/or a device comprising a radio-frequency identification (hereinafter "RFID") device. In some embodiments, the privacy/security enclosure can include a structure that can least partially envelop, wrap, or cover at least a portion of a user device. In some embodiments, the privacy/security enclosure can be used to temporarily, semi-permanently, or permanently block or at least partially attenuate audio or video transmission when positioned adjacent to, proximate to, or coupled to at least a portion of a user device. In some embodiments, the devices protected by the privacy/security enclosure can comprise a mobile or stationary communication device, including, but not limited to, a cellular phone, a smart phone, a car microphone, a paging device, a wearable device such as a smartwatch and/or a wearable phone, a computing device such as a computer, tablet or laptop, a portable or stationary gaming device, a portable or stationary video or audio device, and/or a combination of two or more of the devices described.

In some embodiments, the privacy/security enclosure can comprise a device including a housing assembly that can comprise a rigid or semi-rigid, structurally self-supporting privacy/security enclosure that can be at least partially opened or closed by a user, and/or can include a portion that can be moved, adjusted, opened or closed by a user to adjust a level of privacy/security. In some embodiments, at least a portion of the housing assembly can be moved with respect to another portion of the housing assembly. In some embodiments, the privacy/security enclosure can include a structure that can least partially envelop at least one user device comprising an RF transceiver and/or an audio device, and/or a video device, and/or an audio/video/RF protection device(s), and/or a near-field communication (hereinafter "NFC") device, and/or a radio-frequency identification (hereinafter "RFID") device. For example, in some embodiments, the privacy/security enclosure can be used to cradle, and temporarily or permanently store at least one user device such as a smart phone, or other communication device. In some embodiments, the privacy/security enclosure can include at least one gasket or O-ring (hereinafter referred to as an "RF gasket") that is capable of at least partially attenuating or blocking at least one transmission or signal comprising radio frequency radiation (hereinafter referred to as "RF"). Further, in some embodiments, the privacy/security enclosure can be formed of a material capable of at least partially attenuating RF radiation emitted to or from any RF antennas or transceivers positioned inside the privacy/security enclosure (e.g., such as those forming part of the user's smart phone).

In some embodiments, the privacy/security enclosure can comprise a protective enclosure (or shield in other embodiments) that can selectively at least partially block one or more monitoring, sensing and/or surveillance capabilities of the various devices. For example, in some embodiments of the invention, the privacy/security enclosure only covers the audio portion of a desktop computer (or other device with a microphone such as an Xbox Kinect®). In some embodiments, the privacy/security enclosure does not provide RF protection, but reduces or limits the microphone's ability to capture audio content. In some embodiments, a microphone security portion of the shield can be activated using a button. In some further embodiments, the activation of another button can direct an opaque shield to cover the front of a device's camera (such as a camera on the Xbox Kinect®). In some embodiments, the invention minimizes or prevents scanning, information insertion, manipulation or retrieval, code insertion, manipulation or retrieval or hacking of protected devices via RF technologies.

In some further embodiments of the invention, the privacy/security enclosure can suppress the ability of various other sensors when enclosed within the privacy/security enclosure. For example, in some embodiments, the privacy/security enclosure can substantially block and/or damp the signals reaching other sensors such as accelerometers, gyroscopes, magnetometers to name a few. In some embodiments, the enclosure can include materials, structures and/or approaches (for example, foams, fabrics, springs, specific shapes and/or materials, suspension and/or isolation systems, vibration dampening techniques etc.), configured to at least partially mask, block, attenuate, distort, confuse and/or otherwise reduce and/or eliminate the ability of any sensor to perform its primary and/or any other function of which it is capable (for example a gyroscope or accelerometer used to record and/or detect/decipher audio communication). In some embodiments, the enclosure can include active/powered components to at least partially mask, block, attenuate, distort, confuse and/or otherwise reduce and/or eliminate the ability of any sensor to perform its primary and/or any other function of which it is capable (for example, a gyroscope or accelerometer could otherwise be used to record and/or detect/decipher audio communication).

In some embodiments, the privacy/security enclosure can include RF gaskets extending around at least a portion of an interface or housing of the privacy/security enclosure. In some embodiments, the privacy/security enclosure can include RF gaskets extending completely around a region of an upper and/or lower portion of the privacy/security enclosure. In some embodiments, the privacy/security enclosure can comprise a Faraday cage configured to attenuate, or at least partially block, reception or transmission of RF radiation. In some embodiments, the Faraday cage includes and/or is formed by the one or more RF gaskets. In some embodiments of the invention, when used in combination with one or more RF shield layers (coated, embedded, or attached to any portion of the privacy/security enclosure) the combination of the privacy/security seal formed by the one or more of the aforementioned RF gaskets and one or more RF shield layers can form a Faraday cage. In some embodiments, the Faraday cage can substantially attenuate or at least partially block RF transmission into and/or out of the privacy/security enclosure. As used herein, the term RF shield is intended to mean a barrier that is able to partially or substantially attenuate, at least partially prevent transmission through, or at least partially block transmission of RF. For example, in some embodiments, the privacy/security enclosure can include at least one RF gasket positioned within, coupled to, or integrated with the base portion and/or the lid portion of the privacy/security enclosure. In some embodiments, the privacy/security enclosure can include an RF gasket that can attenuate or at least partially block some or all RF transmission including, but not limited to, zero generation wireless signals, first generation wireless signals, second generation wireless signals, third generation wireless signals, fourth generation wireless signals, fifth generation wireless signals, any global positioning satellite signal (such as "GPS" or "GLONASS"), Bluetooth® wireless signals, RFID electromagnetic radiation, WiFi wireless signals, two-way radio RF signals, UHF or VHF signals (such as a citizen's band radio signal or other radio signal emitted from a 'walkie-talkie' type device), high-speed and millimeter wave signals, and/or near-field wireless signals. Bluetooth® is a registered trademark of Bluetooth SIG, Inc.

In some embodiments, the privacy/security enclosure can at least partially attenuate or blocking at least one transmission or signal comprising an optical signal, infrared signal, ultraviolet signal, image or video, and/or acoustic signal. In some embodiments, the privacy/security enclosure can include at least one seal or gasket extending around at least a portion of an interface between the privacy/security enclosure and the user's device that can at least partially block or attenuate an optical signal, image or video, and/or acoustic signal, and/or an RF signal.

In some embodiments of the invention a combination of one or more grooves within a portion of the privacy/security enclosure can be used with one or more o-rings or gaskets to provide various levels of sealing of the privacy/security enclosure. For example, a dual groove structure or a single groove can be implemented with a tongue structure that can be used with or without an o-ring. In some embodiments, any of the o-rings or gaskets can comprise an RF shield (i.e., can function as an RF attenuating gasket) and therefore can enable a ring seal for use in a privacy/security enclosure. In some embodiments, any o-ring or gasket can comprise a polymer-based matrix material including metal filaments dispersed in a matrix to form a polymer composite material. In some embodiments, the polymer matrix can comprise a homopolymer and/or copolymer, and can comprise an elastomeric polymer such as rubber. In some other embodiments, the o-ring or gasket can comprise a carbon fiber-filled matrix material including metal filaments dispersed in a matrix to form a carbon fiber composite material.

In some embodiments, any o-ring or gasket can be capable of forming a compliant privacy seal between portions of the privacy/security enclosure (e.g., between an upper and a lower portion and/or between two halves of the privacy/security enclosure). Further, in some embodiments, the formed seal can be capable of functioning as an environmental barrier in addition to functioning as an RF shield. For example, in some embodiments, the formed seal can be capable of providing a water and/or moisture barrier in addition to functioning as an RF shield. Further in some embodiments, when used in combination with one or more RF shield layers (coated, embedded, or attached to any portion of the privacy/security enclosure) the combination of the privacy seal and the one or more RF shield layers can form a Faraday cage to substantially attenuate or at least partially block substantially all RF transmission into the privacy/security enclosure and/or substantially attenuate or at least partially block substantially all RF transmission out from the privacy/security enclosure.

In some embodiments, more than one type of o-ring or gasket can be used. In some embodiments, each o-ring or gasket type can be optimized for a specific function (either to at least partially block or attenuate RF, sound, light, moisture, etc.). However, any one o-ring or gasket can function to attenuate or at least partially block a combination of RF, sound, light, etc. For example, in some embodiments, one or more o-rings or gaskets can function to attenuate RF, and one or more o-rings or gaskets can function to attenuate sound, and one or more o-rings or gaskets can function as an environmental barrier. Moreover, in some embodiments, one or more of the o-rings or gaskets can be larger or smaller than one or more other o-rings or gaskets. For example, in some embodiments, one or more of the grooves can be larger or smaller than one or more other groove so as to be capable of cradling a complementarily-sized o-ring.

In some embodiments of the invention, RF protection can be accomplished using a labyrinth and one or more gaskets. In some embodiments, rather than using a double labyrinth, a variety of other options can be deployed to improve manufacturability, space consumption etc., without reducing our performance. Some factors impacting gasket and labyrinth design in some embodiments include the use of gaskets that can be compressed by at least 20% to about 50% of their height in order to provide suitable attenuation.

In some embodiments, depending on the physical architecture of the privacy/security enclosure (e.g., size and/or geometry matched to one or more devices), a double labyrinth around the entire diameter of the privacy/security enclosure may be required. In this instance, some embodiments may require significant force to compress the gaskets. Further, some embodiments may require latches with mechanical advantage that can help the user close the case and hold the lid in position, as well as hinges that can support the force constantly being created by the compressed gaskets. Some further embodiments can deploy architectures that enable the labyrinth and gasket to be shorted. Other embodiments can deploy gaskets that are positioned at the bottom of the labyrinth.

In some embodiments, any of the aforementioned RF gaskets can be configured to form a compliant privacy/security seal between any number of portions of the privacy/security enclosure (e.g., between an upper and a lower portion and/or between two halves of the privacy/security enclosure). Further, in some embodiments, the formed seal can be capable of functioning as an environmental barrier in addition to functioning as an RF shield. For example, in some embodiments of the invention, one or more RF gaskets can provide the secondary benefit of minimizing the transmission of air, water, dust and other such substances from passing into the interior of the privacy/security enclosure when it is closed. In some embodiments, other or additional environmental or sealing gaskets can be included that are more specifically designed for this purpose. Furthermore, the environmental or sealing gaskets can be used with one or more RF gaskets as required. In some embodiments of the invention, a combination of one or more grooves within a portion of the privacy/security enclosure can be used with one or more RF gaskets to provide various levels of coupling, seating, and sealing of the privacy/security enclosure. In some embodiments, at least some portion of the upper and/or lower portions of the privacy/security enclosure can comprise at least one form, cavity, or depression (i.e. forming a groove) for coupling to at least one RF gasket.

In some embodiments, at least some portion of the privacy/security enclosure can comprise a metal or metal alloy. In some embodiments, the privacy/security enclosure can comprise a metal core structure. Some embodiments include a metal or metal alloy that can comprise stainless steel, magnesium, aluminum, titanium, or a titanium-magnesium alloy. In some embodiments, one or more components of the enclosed chamber can comprise a metal or metal alloy that is milled from a solid block. In some further embodiments, one or more components of the enclosed chamber can be stamped from raw sheet stock. For example, in some embodiments, components of the enclosed chamber such as a privacy/security enclosure base and/or a privacy/security enclosure lid can comprise stamped aluminum or magnesium alloy. In some other embodiments, the lid can be formed by other conventional manufacturing processes such as molding (e.g. injection molding or thermoforming), die-cutting, laser cutting, or printed using a three dimensional printer, etc.

In some other embodiments, the lid can be formed by other conventional manufacturing processes such as molding (e.g. injection molding or thermoforming), die-cutting, machining, laser cutting, printed using a three dimensional printer, thixo-forming, impact extruded or deep drawn, etc. In some further embodiments, the Faraday enclosure can be formed from conductive fabric or plastic infused with conductive elements or plastic coated or plated with conductive elements. In some embodiments, the Faraday enclosure and/or any portion of the privacy/security enclosure can be anodized and/or can comprise a polymer.

In some embodiments, at least a portion of any of the components, or sub-assemblies, housings and/or interconnects of the privacy/security enclosures herein can comprise a metal or a metal alloy substrate or coating. In some embodiments, the substrate or coating can comprise a base metal (e.g., such as nickel) with varying thicknesses of plated metals, including, but not limited to gold, palladium nickel, and titanium blend plating options. In some embodiments, the substrate or coating can comprise a metal or metal alloy (e.g., such as beryllium copper) that can electrically couple the cover to the base, and when closing the case. In some further embodiments, at least a portion of the substrate or coating can comprise copper or a copper alloy. In some other embodiments, at least a portion of the substrate or coating can comprise nickel or a nickel alloy (e.g., a nickel-copper alloy), or an alloy of copper and tin. In some embodiments, a nickel layer can be used as a diffusion barrier for a contact outer layer or surface that comprises gold. In some embodiments, at least a portion of the substrate or coating can comprise iron or steel. In some embodiments, at least a portion of the substrate or coating can comprise aluminum, magnesium, or mixtures or alloys thereof. Other useful coatings or layers can include silver, tin, or palladium.

In some embodiments, any of the aforementioned metals or metal alloy can be selected and used to form one or more electrical contacts of the privacy/security enclosure depending on the required function and/or performance. Examples of such contacts can include electrical contacts for RF shielding such as a rim or other electrical contact of the Faraday cage of the privacy/security enclosure. In some embodiments, one or more contacts can comprise a gold or gold alloy material. In some further embodiments, the contacts can comprise titanium nitride. In some other embodiments, the contacts can comprise palladium, palladium nickel, or some other pure or blended form of noble metal, which at least partially resists corrosion and oxidation. In some embodiments of the invention, various mated surfaces can use the same or different metals or metal alloy combinations for their contact surfaces, to improve or manage characteristics including, but not limited to, RF shielding performance, durability, longevity, mating sound and/or tactile feel/impression, frictional polymerization, contact resistance, conductivity, appearance, strength, fretting, hardness, and/or cost. For contacts including coatings, or modified surfaces of base metals, formation or deposition can proceed by any conventional technique including plating, cladding, electrolytic deposition, electro-less deposition, or vapor deposition among others.

In some embodiments, the privacy/security enclosure can comprise a metal core structure. Some embodiments include a metal or metal alloy that comprises stainless steel, magnesium, aluminum, titanium, or a titanium-magnesium alloy, or combinations thereof. In some embodiments, one or more components of the chamber can comprise a metal or metal alloy that is milled from a solid block. In some further embodiments, one or more components of the cover can be stamped from raw sheet stock. For example, in some embodiments, portions of the privacy/security enclosure can comprise stamped aluminum or magnesium alloy. In some other embodiments, the cover can be formed by other conventional manufacturing processes such as molding (e.g. injection molding or thermoforming), die-cutting, machining, laser cutting, printed using a three dimensional printer, etc.

In some other embodiments, at least a portion of one or more of the privacy/security enclosures described herein can comprise a material such as a polymer, or polymer composite. For example, in some embodiments, at least a portion of one or more of the privacy/security enclosures described herein can comprise an injection molded, extruded, or thermo-form polymer. In some embodiments, the polymer can comprise polyethylene, polypropylene, or polyethylene-polypropylene copolymers. In some further embodiments, the privacy/security enclosure can comprise at least one polymer comprising aramids (aromatic polyamides), poly (m-xylylene adipamide), poly(p-xylylene sebacamide), poly (2,2,2-trimethyl-hexamethylene terephthalamide), poly(piperazine sebacamide), poly(metaphenylene isophthalamide) (Nomex) and poly(p-phenylene terephthalamide), aliphatic and cycloaliphatic polyamides, including the copolyamide of 30% hexamethylene diammonium isophthalate and 70% hexamethylene diammonium adipate, the copolyamide of up to 30% bis-(-amidocyclohexyl) methylene, terephthalic acid and caprolactam, polyhexamethylene adipamide, poly(butyrolactam), poly(9-aminonanoic acid), poly(enantholactam), poly(caprillactam), polycaprolactam, poly(p-phenylene terephthalamide), polyhexamethylene sebacamide, polyaminoundecanamide, polydodecanolacatam, polyhexamethylene isophthalamide, polyhexamethylene terephthal amide, polycaproamide, poly(nonamethylene azelamide), poly(decamethylene azelamide), poly(decamethylenesebacamide), poly [bis-4-aminocyclohexyl)methane1,10-decanedi-carboxamide](Qiana)(trans), and aliphatic, cycloaliphatic and aromatic polyesters including poly(1,4-cyclohexylidene dimethyl eneterephthalate) cis and trans, poly(ethylene-2,6-naphthalate), poly(1,4-cyclohexane dimethylene terephthalate) (trans), poly(decamethylene terephthalate, poly(ethylene terephthalate), poly(ethylene isophthalate), poly(ethylene oxybenzoate), poly(para-hydroxy benzoate), poly(beta,beta dimethylpropiolactone), poly(decamethylene adipate), or poly(ethylene succinate), or mixtures thereof.

In some further embodiments, at least a portion of any of the privacy/security enclosures described herein can comprise at least one polymer formed of extended chain polymers by the reaction of beta-unsaturated monomers of the formula R1R2-C═CH2, where R1 and R2 are either identical or different, and are hydrogen, hydroxyl, halogen, alkylcarbonyl, carboxy, alkoyxycarbonyl, heterocycle or alkyl or aryl, where the alkyl or aryl can be substituted with one or more substituents including alkoxy, cyano, hydroxyl, akyl or aryl, and extended chain polymers including polystyrene, polyethylene, polypropylene, poly(1-octadecene), polyisobutylene, poly(1-pentene), poly(2-methyl styrene), poly(4-methyl styrene), poly(1-hexene), poly(1-pentene), poly(4-methoxy styrene), poly(5-methyl-1-hexene), poly(4-methylpentene), poly(1-butene), poly(3-methyl-1-butene), poly(3-phenyl-1-propene), polyvinyl chloride, polybutylene, polyacrylonitrile, poly(methyl pentene-1), poly(vinyl alcohol), poly(vinyl-acetate), poly(vinyl butyral), poly(vinyl chloride), poly(vinylidene chloride), vinyl chloride-vinyl acetate chloride copolymer, poly(vinylidene fluoride), poly (methyl acrylate, poly(methylmethacrylate), poly(methacrylonitrile), poly(acrylamide), poly(vinyl fluoride), poly(vinyl formal), poly(3-methyl-1-butene), poly(1-pentene), poly(4-methyl-1-butene), poly(1-pentene), poly(4-methyl-1-pentene), poly(1-hexane), poly(5-methyl-1-hexene),poly(1-octadecene), poly(vinyl cyclopentane), poly (vinylcyclohexane), poly(a-vinylnaphthalene),poly(vinyl methyl ether),poly(vinylethylether), poly(vinyl propylether), poly(vinyl carbazole), poly(vinyl pyrrolidone), poly (2-chlorostyrene), poly(4-chlorostyrene), poly(vinyl formate), poly(vinyl butyl ether), poly(vinyl octyl ether), poly (vinyl methyl ketone), poly(methylisopropenyl ketone), or poly(4-phenylstyrene), or mixtures thereof.

In some further embodiments of the invention, at least a portion of the privacy/security enclosure can comprise a polymer thermoset material. For example, in some embodiments of the invention, the thermosetting polymer can comprise an epoxide-based technology. In some embodiments, epoxies based on saturated or unsaturated aliphatic, cycloaliphatic, aromatic and heterocyclic epoxides can be used to form at least a portion of the privacy/security enclosure. In some further embodiments, useful epoxides can comprise glycidyl ethers derived from epichlorohydrin adducts and polyols, particularly polyhydric phenols. Another useful epoxide is the diglycidyl ether of hisphenol A. Additional examples of useful polyepoxides are resorcinol diglycidyl ether, 3,4-epoxy-6-methylcyclohexylmethyl-9,10-epoxystearate, 1,2,-bis(2,3-epoxy-2-methylpropoxy) ethane, diglycidyl ether of 2,2-(p-hydroxyphenyl) propane, butadiene dioxide, dicyclopentadiene dioxide, pentaerythritol tetrakis(3,4-epoxycyclohexanecarboxylate), vinylcyclohexene dioxide, divinylbenzene dioxide, 1,5-pentadiol bis (3,4-epoxycyclohexane carboxylate), ethylene glycol bis(3, 4-epoxycyclohexane carboxylate), 2,2-diethyl-1,3-propanediol bis(3,4-epoxycyclohexanecarboxylate), 1, 6-hexanediol bis(3,4-epoxycyclohexanecarboxylate),2-butene-1,4-diol-bis(3,4-epoxy-6-methylcyclohexane carboxylate), 1,1,1-trimethylolpropane-tris-(3,4-epoxycyclohexane carboxylate), 1,2,3-propanetriol tris(3,4-epoxycyclohexane carboxylate), dipropylene glycol bis(2-ethylexyl-4,5-epoxycyclohexane-1,2-dicarboxylate), diethyleneglycol-bis(3,4-epoxy-6-methylcyclohexane carboxylate), triethylene glycol bis(3,4-epoxycyclohexanecarboxylate),3,4-epoxycyclohexylmethyl-3,4-epoxycyclohexanecarboxylate,3,4-epoxy-1-methylcyclohexyl methyl-3,4-epoxy-1-methylcyclohexane-carboxylate,bis(3,4-epoxycyclohexylmethyl) pimelate, bis(3,4-epoxy-6-methylenecyclohexylmethyl)maleate, bis(3,4-epoxy-6-methylcyclohexylmethyl) succinate, bis(3,4-epoxycyclohexylmethyl) oxalate, bis(3,4-epoxy-6-methylcyclohexylmethyl) sebacate, bis(3,4-epoxy-6-methylcyclohexylmethyl)adipate, bis(3,4-epoxycyclohexylmethyl) terephtalate, 2,2'-sulfonyldiethanol bis(3,4-epoxycyclohexanecarboxylate), N,N'-ethylene bis(4,5-epoxycyclohexane-1,2-dicarboximide), di(3,4-epoxycyclohexylmethyl)-1,3-tolylenedicarbamate,-3,4-epoxy-6-methylcyclohexane carboxaldehyde acetal, 3,9-bis (3,4-epoxycyclohexyl) spirobi-(methadioxane), and the like.

In some other embodiments of the invention, thermosetting resins based on aromatic vinyl esters can be used to form at least a portion of the privacy/security enclosure. These can include a condensation product of epoxide resins and unsaturated acids usually diluted in a compound having double bond unsaturation such as vinyl aromatic monomer (e.g., styrene and vinyl toluene, and diallyl phthalate). Illustrative of useful vinyl esters are diglycidyl adipate, diglycidyl isophthalate, di(2,3-epoxybutyl) adipate, di(2,3-epoxybutyl) oxalate, di(2,3-epoxyhexy 1) succinate, d(3,4-epoxybutyl) maleate, d(2,3-epoxyoctyl) pimelate, di(2,3-epoxybutyl) phthalate, di(2,3-epoxyocty 1) tetrahydrophthalate, di(4, 5-epoxy-dodecyl) maleate, di(2,3-epoxybutyl) terephthalate, di(2,3-epoxypentyl) thiodipropionate, di(5,6-epoxy-tetradecyl) diphenyldicarboxylate, di(3, 4-epoxyheptyl) sulphonyldibutyrate, tri(2,3-epoxybutyl) 1,2,4 butanetricarboxylate, di(5,6-epoxypentadecyl) maleate, di(2,3-epoxybutyl) azelate, di(3,4-epoxybutyl) citrate, di(5,6-epoxyoctyl) cyclohexane-1,3-dicarboxylate, di(4,5-epoxy octadecyl) malonate, bisphenol-A-fumaric acid polyester and the like.

In some embodiments, at least a portion of the privacy/security enclosure can include a filler material. For example, some embodiments can include a thermoplastic or thermosetting resin that includes at least some filler material dispersed through at least a portion of the privacy/security enclosure. In some embodiments, the filler material can be dispersed substantially homogenously through at least a portion of at least one layer of the privacy/security enclosure. In some other embodiments, the filler material can be substantially unevenly distributed through at least a portion of the privacy/security enclosure. For example, in some embodiments, the filler material can be dispersed substantially unevenly through at least a portion of at least one layer of the privacy/security enclosure. In some embodiments, the filler material can be amorphous or crystalline, organic or inorganic material. In some other embodiments, the particle size of the filler material can be between 1-10 microns. In some other embodiments, at least some portion of the filler material can be sub-micron. In some other embodiments, at least a portion of the filler can comprise a nano-sized particle filler material. In some embodiments, the filler can comprise a fibrous material. In some embodiments, at least a portion of the filler can be oriented in a preferred direction.

In some further embodiments of the invention, at least a portion of one or more of the privacy/security enclosures described herein can comprise an animal-based material such as leather or suede, and/or a plant derived material cellulosic material such as wood, cork, and/or a wood-based composite material.

Some embodiments of the invention can include one or multiple rows of fingerstock bonded into a cover assembly or any interface between at least two portions of the privacy/security device. In some embodiments, in some or each row of fingerstocks, a hollow or solid conductive elastomer can be used. In some embodiments of the invention, in some or each row of fingerstocks, conductive elastomer can comprise a generally circular cross-section. In some further embodiments of the invention, in some or each row of fingerstocks, conductive elastomer can comprise a generally oval cross-section. In some other embodiments of the invention, in some or each row of fingerstocks, conductive elastomer can comprise a generally square or rectangular cross-section. In some embodiments, the bearing surface on the base can be nickel-plated for conductivity and surface hardness.

In some embodiments, at least some portion of the structurally self-supporting enclosed chamber can comprise a metal or a metal alloy. Some embodiments include a metal or metal alloy that can comprise stainless steel, magnesium, aluminum, titanium, or a titanium-magnesium alloy. In some embodiments, one or more components of the enclosed chamber can comprise a metal or metal alloy that is milled from a solid block. In some further embodiments, one or more components of the enclosed chamber can be stamped from raw sheet stock. For example, in some embodiments, components of the enclosed chamber such as a privacy/security enclosure base and/or a privacy/security enclosure lid can comprise stamped aluminum or magnesium alloy. In some other embodiments, the lid can be formed by other conventional manufacturing processes such as molding (e.g., injection molding or thermoforming), die-cutting, laser cutting, or printed using a three dimensional printer, etc.

In some embodiments, at least some portion of the privacy/security enclosure including the structurally self-supporting enclosed chamber can comprise a polymer or polymer composite. In some other embodiments, at least some portion of the structurally self-supporting enclosed chamber can comprise a composite. In some further embodiments, at least some portion of the structurally self-supporting enclosed chamber can comprise a polymer or polymer composite that includes a metal (such as a metal flake, metal powder, or a metal alloy coating, or other metal dispersion). Some embodiments include a metal or metal alloy that can comprise stainless steel, aluminum, or magnesium. In some embodiments, numerous other materials can be incorporated into various embodiments of the privacy/security enclosure.

For example, some embodiments can use injection molded plastic portions, and a wide variety of other conventional product materials such as wood, composite and/or ceramic. Moreover, in some embodiments, the privacy case can comprise a finished surface such as a polished surface. In some embodiments, the privacy/security enclosure can comprise a box for corporate boardrooms that would encompass multiple devices (similar to any commercial cigar box). In some embodiments, metallic meshes/fabrics and/or conductive metallic paints and finishes can be applied to one or more portions of the privacy/security enclosure (internally or externally) to create the RF shield and/or Faraday cage.

Some embodiments of the invention include a privacy/security enclosure with an inner shell coupled to an outer shell. In some embodiments, the inner shell and outer shell can comprise the same material (e.g., the inner and outer shells can each comprise a metal, or a polymer or a composite, and so on). In some other embodiments, the inner shell and outer shell can comprise different materials. For example, in some embodiments, components of the enclosed chamber such as a privacy/security enclosure base inner shell and/or a privacy/security enclosure lid inner shell can comprise a stamped metal or metal alloy (e.g., such as an aluminum and/or magnesium alloy), and a privacy/security enclosure base outer shell and/or a privacy/security enclosure lid outer shell can comprise a non-metal material such as an injection molded polymer or polymer composite material. In this instance, the inner and outer shells of the base and lid can be coupled by a variety of conventional coupling methods including but not limited to a snap-fit, a latch, a hinge, or combinations thereof.

In some other embodiments, at least some portion of the structurally self-supporting chamber can comprise a flexible and/or compliant material. In some embodiments, the material can include at least one of a cloth or fabric, a polymer or polymer composite film or sheet, or other flexible material. In this instance, the privacy/security enclosure can be structurally supported by one or more enclosed user devices, such as a mobile or stationary communication device. For example, in some embodiments, the privacy/security enclosure can comprise a flexible bag that can lay flat or be folded when empty, but can be configured to expand to accommodate at least one RF transceiver such as a mobile or stationary communication device.

Referring now to FIG. 1, in some embodiments, the privacy/security enclosure 100 can comprise a rigid, structurally self-supporting enclosed chamber. For example, in some embodiments, the privacy/security enclosure 100 can comprise a clam-shell type enclosure including an inner region 105 formed by coupling a lower portion, and an upper portion of a main housing 110. Some embodiments include at least one user device (such as the RF transceiver comprising a smart phone as depicted, and shown as device 10) positioned in the inner region 105. The privacy/security enclosure 100 can cradle the user device, and the upper portion can at least partially enclose one or more devices by at least partially moving and closing a base portion 120 and a lid portion 115.

In some embodiments, the privacy/security enclosure 100 can include a base portion 120 and a lid portion 115 coupled by at least one pivot. For example, in some embodiments, the privacy/security enclosure 100 can include a base portion 120 and a lid portion 115 coupled by at least one conventional hinge mechanism 107. In some embodiments, the base portion or the lid portion can be shaped to accommodate at least a portion of a hinge mechanism 107. In some embodiments, one or more edges of the base portion 120 can include at least one notch capable of providing clearance for a pivot mechanism. In some embodiments, the base portion 120 or lid portion 115 or both can include a plurality of notches for providing clearance or for attachment of various portions of a pivot mechanism. Further, in some embodiments, the base portion 120 or lid portion 115 or both can include a plurality of apertures for providing attachment of various portions of a pivot mechanism. For example, in some other embodiments, one or more surfaces of the base portion 120 and/or one or more surfaces of the lid portion 115 can include at least one aperture capable of securing one or more components of the privacy/security enclosure 100. In some embodiments, any one of the above-mentioned apertures can include an attachment member (e.g., a screw, rivet or other coupling structure).

Some embodiments include a liner 130 positioned in the base portion 120 and/or the lid portion (not shown). As shown in FIG. 1, in some embodiments, the privacy/security enclosure 100 can include a liner 130 that can be shaped to fit substantially seamlessly from the outer periphery of the base, and can include at least one inner storage cavity. For example, in some embodiments, the liner 130 can include a storage cavity 135 shaped to cradle an RF transceiver (device 10). The example embodiments shown in FIG. 1 includes a storage cavity 130 positioned substantially centrally within the base portion 120, and shaped to cradle and at least partially surround the device 10. In some embodiments, the liner 130 can comprise RF and/or acoustic shielding material forming a sealing interface 125.

Figure 2:
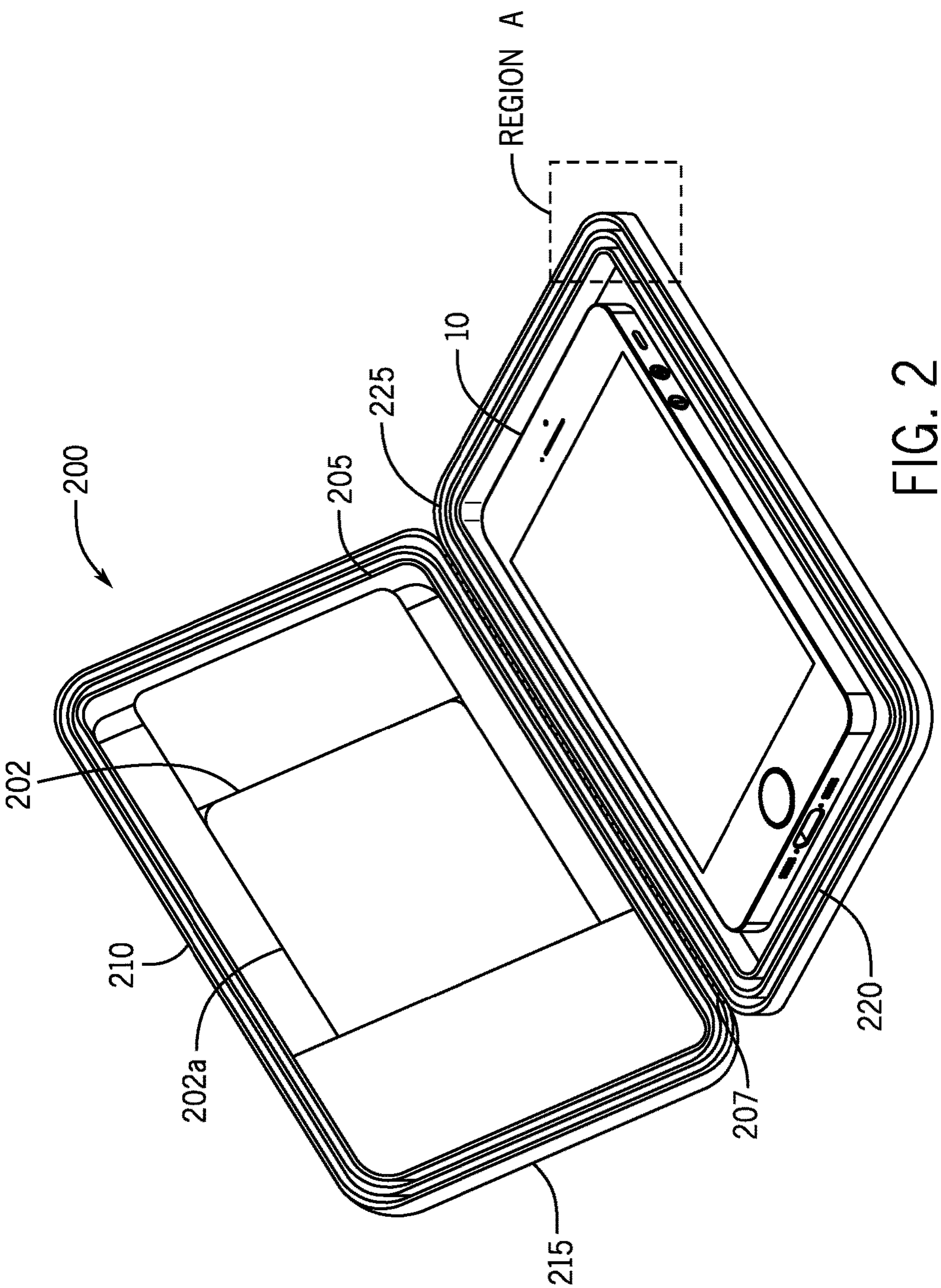
FIG. 2 is a perspective view of an open privacy/security enclosure according to one embodiment of the invention.

In some embodiments, the base portion 120 and lid portion 115 can be coupled and pivoted with respect to each other to enable at least partial access to an inner region 105 of the privacy/security enclosure 100 by opening to an angle of between about 0° to about 90°. Referring to FIG. 2, some embodiments include a privacy/security enclosure 200 that opens to an angle of between about 90° and about 180°.

The privacy/security enclosure 200 comprises a main housing 210 including a base portion 220, and a lid portion 215 coupled by a hinge mechanism 207 shown coupled along a one edge of the base portion 220 and the lid portion 215. The base portion 220 and lid portion 215 can be coupled and pivoted with respect to each other to enable at least partial access to an inner region 205 of the privacy/security enclosure 200 by opening to an angle of between about 90° and about 180°. In some other embodiments, the base portion 220 and lid portion 215 can be pivoted with respect to each other and angled at an angle of greater than about 180° (not shown). For example, in some embodiments, the base portion 220 and lid portion 215 can be pivoted with respect to each other and angled at an angle of about 190°. In some embodiments, this can allow the privacy/security enclosure 200 to lay substantially fully open on a surface (e.g., such as a desk) and accommodate a base portion 220 that is thicker than the lid portion 215. In some embodiments, the privacy/security enclosures 100, 200 can be closed, providing no access to the inner regions 105, 205 and effectively shielding the contents of the privacy/security enclosures 100, 200 from RF signals, and/or preventing sounds outside the enclosure from being monitored. For example, as shown in FIGS. 10-15, showing various views of numerous embodiments of a closed privacy/security enclosures 1000, 1100, 1200, 1300, 1400, 1500, the privacy/security enclosures can include a base and lid portions where the base portion is substantially parallel to the lid portion, and the base portion and lid portion are substantially matingly coupled and/or engaged.

In some embodiments, the hinge mechanisms 107, 207 can comprise a conventional friction hinge (such as a conventional friction hinge found in a conventional laptop computer). In some other embodiments, the hinge mechanism can comprise an open hinge mechanism, such as the hinges distributed by Taili Glasses Parts Co., ltd. (http://www.tailiglassesparts.com/eyeglasses_hinges.html). In some other embodiments, the hinge mechanisms 107, 207 can comprise a closed hinge mechanism, and can be sourced through Alibaba.com (http://www.alibaba.com). ALIBABA" and "ALIBABA.COM" and related icons and logos are registered trademarks or trademarks or service marks of Alibaba Group Holding Limited. In other embodiments, the hinge mechanisms 107, 207 can comprise other types of coupling members capable of allowing the pivoting portions of the privacy/security enclosures 100, 200 to pivot and/or rotate with respect to each other. For example, in some embodiments, the hinge mechanisms 107, 207 can comprise a conventional spring-clip.

In some further embodiments, the base and lid portions of the privacy/security enclosures 100, 200 can be decoupled. For example, in some embodiments, the privacy/security enclosures 100, 200 can be configured to enable a user to separate the base and lid portions. For example, in some embodiments, the privacy/security enclosures 100, 200 can include separate base and lid portions that can be matingly coupled and/or engaged by the user. Consequently, in some embodiments, a user can then choose to open the privacy/security enclosures 100, 200 by decoupling the base and lid portions.

In some embodiments, at least some portion of the privacy/security enclosure can include a radio-frequency shield (hereinafter referred to as an "RF shield"). As used herein, the term "RF shield" is intended to mean a barrier that is able to substantially attenuate, at least partially prevent transmission through, or at least partially block transmission of RF radiation (hereinafter referred to "RF"). For example, in some embodiments of the invention, the RF shield can attenuate (i.e. reduce in signal strength) an RF signal by about 100 dB. In some other embodiments, the RF shield can provide greater than about 100 dB signal attenuation. In some embodiments, the RF shield can attenuate an RF signal by less than about 100 dB while still disrupting effective communication.

In some embodiments, any privacy/security enclosure described herein can include an RF shield that can be capable of attenuating or at least partially blocking RF radiation from entering or exiting the privacy/security enclosure. In some embodiments, this can allow for bandwidth selectable pass-through capabilities. In some embodiments, the privacy/security enclosure can form a Faraday cage capable of substantially attenuating RF signals (whether emitted from one or more mobile or stationary communication devices, or whether emitted from another source). For example, in some embodiments, at least a portion of the privacy/security enclosure is formed of a material substantially attenuating to RF radiation emitted from one or more mobile or stationary communication devices. In some other embodiments, the privacy/security enclosure can be formed of a material including at least a portion that is capable of substantially attenuating radio-frequency radiation emitted from outside of the privacy/security enclosure. For example, in some embodiments, at least a portion of the RF shield and/or Faraday cage can comprise aluminum. magnesium, copper, steel, or other conductive metal, metallic paints or coatings, wire mesh fabrics in one or more layers or orientations etc., or plastics infused with conductive elements, conductive compounds, and/or conductive mixtures. In some embodiments, at least a portion of the Faraday cage can be optically translucent or transparent. Some embodiments can include a screen emulator. For example, in instances where the privacy/security enclosure includes substantial portions that are not optically transparent, a screen emulator can be used to replicate the enclosed device's screen on a screen that is outside of the privacy/security enclosure.

In some embodiments, one or more slots, windows, or openings can be formed in any portion of the privacy/security enclosure Faraday cage. In some embodiments, this can allow for features such as connecting internal and external antennas, each or all of which can provide varying levels of attenuation or gain at various frequencies. Further, in some embodiments, this can allow cables or wires to pass into the privacy/security enclosure for various purposes including charging the battery of internal devices, or the battery of the privacy/security enclosure, or to access any other internal component from the outside of the enclosure. Further, in some embodiments, the one or more slots, windows, or openings can be used to allow certain RF transmissions through based on the size and location of the slot/opening (e.g. such as in the case of the use of a slot antenna). Some embodiments of the invention can pass certain frequency ranges (with or without attenuation or gain) while attenuating other frequencies. In some embodiments, this can be achieved using one or more slots, windows, or openings that are configured in an open or partially open position. In some embodiments, when the one or more slots, windows, or openings that are configured in a closed configuration, some or all RF frequencies can be attenuated (thereby minimizing leakage).

Further, some embodiments can comprise mechanical or electro-mechanical switches and cut-offs, band pass filters, and other technologies, alone or in combination with each other and/or with antennas, repeaters, amplifiers and other such technologies.

Figure 3:
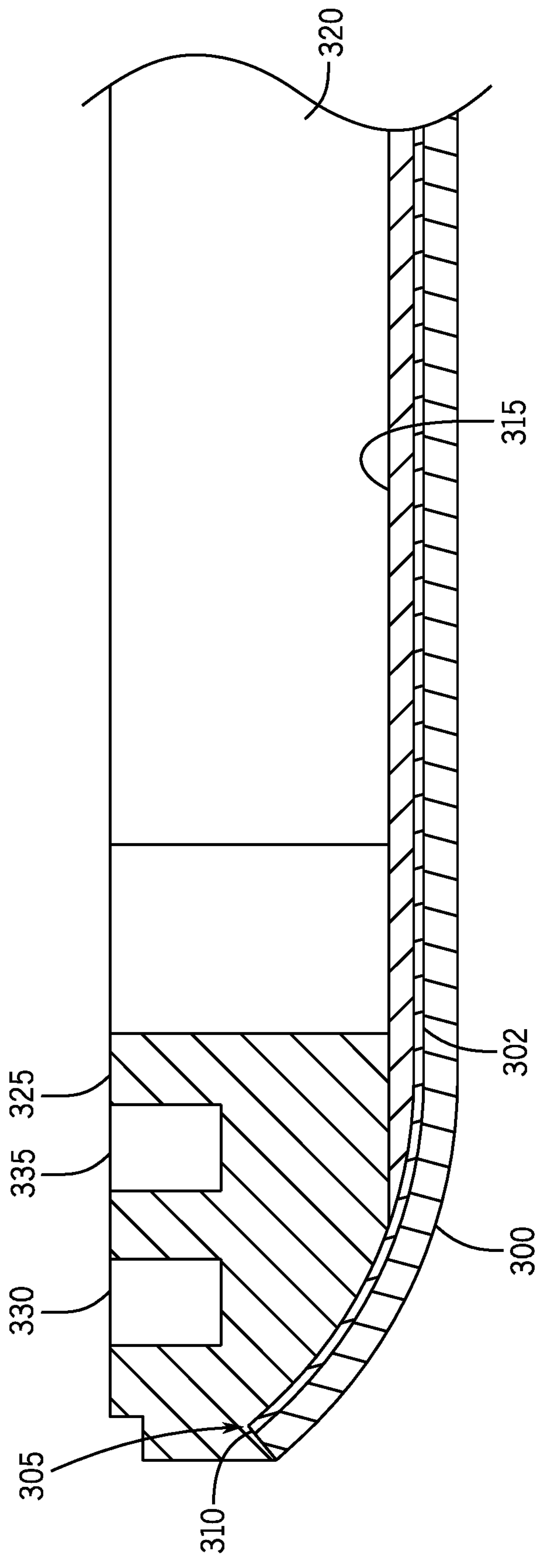
FIG. 3 is a partial cross-sectional view of a privacy/security enclosure according to one embodiment of the invention.

In some embodiments, at least a portion of the privacy/security enclosure is formed of a material substantially attenuating RF radiation emitted to or from any RF antennas or transceivers when they are positioned inside the privacy/security enclosure. In some embodiments, the privacy/security enclosure can comprise a Faraday cage to substantially attenuate, or at least partially block reception of RF radiation. Some embodiments of the invention can comprise an RF shield layer positioned within or on at least a portion of a base portion, or a lid portion, or both. For example, FIG. 3 shows a partial cross-sectional view of a privacy/security enclosure 300 according to one embodiment of the invention that includes an RF shield layer 305.

The privacy/security enclosure 300 shown includes an enclosure shell or housing 310 that encloses an inner region 320. Attached to the housing 310 is an RF shield layer 305. At least some portion of the RF shield layer 305 can be placed between the enclosure shell 310 (i.e., where the enclosure shell 310 as shown could be at least some portion of the base and/or at least some portion of the lid) and an enclosure liner 315. In other embodiments, the RF shield layer 305 can be placed in other regions of the privacy/security enclosure 300. For example, the RF shield layer 305 could be placed on the outside of the enclosure shell 310 (e.g., as a cover material) or embedded in the enclosure shell 310. In some embodiments, the enclosure shell layer 305 can include layers of metal, alloy, wire, a wire mesh, a pure metallic casing, or some other electrically conductive material. In other embodiments, the enclosure liner 315 can comprise the RF shield (i.e., the enclosure liner 315 performs a function of providing a physical lining of the enclosure and also functions as an RF shield). As shown in FIG. 3, in some embodiments, the RF shield layer 305 can extend across an entire inner surface of the enclosure shell 310 of the privacy/security enclosure 300. The view as shown includes a partial cross-sectional view of a privacy/security enclosure according to some embodiments of the invention. The view is not meant to limit the scope of the invention, and one of ordinary skill in the art would recognize that the view would also be representative of an opposite side of the privacy/security enclosure (i.e., a base portion or a lid portion or both). In this instance, the enclosure shell 310 as shown can be either a base portion or a lid portion (e.g., such as base portion 220 or a lid portion 215 of privacy/security enclosure 200), and the RF shield layer 305 can extend across an entire inner surface of the privacy/security enclosure 300 (wherein the portion 302 as shown could function as a base portion or a lid portion). In some embodiments, the RF shield layer 305 can be substantially continuous. In other embodiments, the RF shield layer 305 can be discontinuous (i.e., it can be patterned and/or can contain gaps or apertures of various sizes).

In some embodiments, materials useful for fabricating an RF shield for at least one embodiment of the invention described herein can include materials comprising of metal, metal alloys, or any other conductive material including ultra-conductive film or coating. For example, some embodiments can include a polymer and/or carbon-fiber based layer (e.g., a film, coating or cover) that can include at least one conductive layer. Some embodiments can utilize LORD® "UltraConductive Film and Coatings for Lightning Strike Protection" products with 121 dB attenuation (found at the following web address: http://www.lord.com). In some embodiments, tests have shown that a carbon composite coated with the LORD® "UltraConductive Film" achieved 121 dB of EMI shielding, equivalent to that of a solid 1-mm thick aluminum layer.

Other materials useful for fabricating an RF shield for at least one embodiment of the invention can include materials comprising Lessemf.com, Y-Shield paint with 30 to 40 dB attenuation @ 1 to 18 GHz, http://www.lessemf.com/paint-.html, an EMP Faraday Bag with 40 db @ 1 to 10 GHz, http://www.lessemf.com/cellphon.html, and shielding fabric with 50 to 80 dB @ 10 MHz to 3 GHz, http://www.lessmf.com/fabric.html Still other materials useful for fabricating an RF shield for at least one embodiment of the invention can include materials comprising lbagroup.com RF paint with 30 to 40 dB attenuation, see http://www.lbagroup.com/products/shielding-paints, and fabric with 80 to 100 db attenuation @ 200 MHz to 10 GHz, see http://www.lbagroup.com/products/rf-shielding-fabrics.

Other materials useful for fabricating an RF shield for at least one embodiment of the invention can include materials comprising an Aaronia RFI shield fabric with 80 to 100 db attenuation @ 1 GHz to 10 GHz, such as those available from Kaltman Creations, llc, see http://www.kaltmancreationsllc.com/rf-test-equipment-html/rf-sensitive-html/.

Other materials useful for fabricating an RF shield for at least one embodiment of the invention include 3M™ Dri-Shield (metalized polyester and polyethylene with 45 dB attenuation) available from 3M Company.

Still other materials useful for fabricating an RF shield for at least one embodiment of the invention include nickel coated graphite mats, nickel coated steel foils and copper mesh with 70 to 93 dB @ 10 MHz to 17 GHZ, available from Fiberforge (http://www.fiberforge.com).

In some further embodiments of the invention, materials useful to form an RF shield in one or more embodiments of the invention include a layer of material comprising a polymer-based matrix material including metal filaments dispersed in a matrix to form a polymer composite material. In some embodiments, the polymer matrix can comprise a homopolymer and/or copolymer, and can include at least one ceramic, and/or at least one polymer-ceramic mixture. For example, in some embodiments, the RF shield can comprise a layer of material comprising nickel filaments dispersed in polyethersulfone ("PES") as disclosed in "Nickel Filament Polymer-Matrix Composites With Low Surface Impedance and High Electromagnetic Interference Shielding Effectiveness", Xiaoping Shui and D. D. L. Chung, Journal of Electronic Materials, Vol. 26, No. 8, 1997.

In some other embodiments, materials useful in one or more embodiments of the invention include a layer of material comprising a carbon fiber-based matrix material including metal filaments dispersed in a matrix to form a carbon fiber composite material. In some embodiments, the carbon fiber matrix can comprise a homopolymer and/or copolymer, and can include at least one ceramic, and/or at least one polymer-ceramic mixture. In some embodiments, the metal filaments can comprise nickel filaments. In some further embodiments, the metal filaments can include copper filaments and/or stainless steel filaments.

Some embodiments of the invention can include using fabrics with copper or metallic wire/wire mesh woven into base fabric, with layering and/or crossed fabric layers. In some embodiments, an RF shield can be placed between layers of cloth fabric. For example, in some embodiments, an RF shield layer as described earlier can be formed into or embedded in a cloth fabric. In this example embodiment, the cloth layer can then be used to line at least some portion of the inner region (e.g., the inner region of the base portion, or lid portion or both, and/or at least some portion of the outside of the privacy/security enclosure).

As described earlier, FIGS. 10-15 show perspective views of privacy/security enclosures in which the base portion and lid portion are substantially matingly coupled and/or engaged to form a closed privacy/security enclosure. The mobile communication device (device 10) shown in FIGS. 1-2 or FIGS. 13-15 would be shielded from view by the enclosures shown in FIGS. 10-15. Further, in some embodiments, the shell of the privacy/security enclosure can be non-transparent (i.e., substantially attenuating to visible light) and capable of shielding the inner region of the privacy/security enclosure from view. For example, the privacy/security enclosures 1000, 1100, 1200, 1300, 1400, 1500 shown in FIGS. 10-15 and described herein can completely prevent direct viewing of any enclosed communication device, and can prevent video cameras or other visible light sensors from imaging the enclosed communication device.

In some embodiments, the privacy/security enclosure can include a cover that is capable of at least partially covering at least one video camera within at least one user device. In some embodiments, the cover can be the base or lid portion, and/or can comprise a further structural component integrated within, coupled with, or included within the privacy/security enclosure. For example, in some embodiments, at least some portion of the privacy/security enclosure can comprise a material that is at least partially or substantially fully attenuating to visible light radiation. For example, in some embodiments, the lid portion can comprise a translucent region or "window", capable of allowing some light to enter and exit the privacy/security enclosure. In this instance, a user can be able to view the presence or absence of any mobile or stationary communication device within a closed privacy/security enclosure (i.e., the user can understand the presence of the device without opening the privacy/security enclosure). However, in this instance, the translucent region would not enable a user or another individual or imaging device to read and comprehend a visual display of the communication device, or read and comprehend any information printed or inscribed on the communication device. In some other embodiments, other portions of the privacy/security enclosure can include at least one region capable of at least partially attenuating visible light radiation. For example, some embodiments include a base portion and/or a lid with one or more translucent regions. In some embodiments, one or more cameras (i.e., still or moving picture recording apparatus sensitive to the visible light, infra-red light and/or UV light) will be attenuated to an extent that renders video recording devices enclosed within the privacy/security enclosure incapable of recording images outside of the enclosure. In some other embodiments of the invention, other sensors of enclosed devices such as light, proximity, heat/thermal, biometric and other such sensors will be partially or substantially fully blocked by the privacy/security enclosure.

In some further embodiments of the invention, the privacy/security enclosure can suppress sound to substantially eliminate eavesdropping. In some embodiments, the privacy/security enclosure can substantially block and/or damp the signals reaching audio sensors and microphones. For example, in some embodiments, the privacy/security enclosure can include audio blocking so that typical conversation-level audio outside the privacy/security enclosure will not be intelligible or discernible by the enclosed device's microphone. In some embodiments, the enclosure can include sound dampening layers/materials. For example, in some embodiments, at least a portion of the privacy/security enclosure is formed of a material substantially attenuating sound emitted from one or more mobile or stationary communication devices. In some other embodiments, at least a portion of the privacy/security enclosure is formed of a material substantially attenuating sound emitted from outside of the privacy/security enclosure.

In some further embodiments of the invention, the privacy/security enclosure can suppress the ability of various other sensors when enclosed within the privacy/security enclosure. For example, in some embodiments, the privacy/security enclosure can substantially block and/or damp the signals reaching other sensors such as accelerometers, gyroscopes, magnetometers. In some embodiments, the enclosure can include materials configured to at least partially block or attenuate a signal that would normally be sensed by any accelerometers, gyroscopes, or magnetometers that may be coupled to one or more enclosed devices.

In some embodiments, the privacy/security enclosure can comprise a structure that includes at least one sound attenuation layer. For example, in some embodiments, the privacy/security enclosure can include a sound attenuation layer coupled with the enclosure liner 315 shown in FIG. 3. Further, in some embodiments, the enclosure liner 315 can comprise a sound attenuation layer. In some embodiments, the privacy/security enclosure can include a sound attenuation layer positioned within the privacy/security enclosure so that it is immediately adjacent to a microphone and/or a loudspeaker of a device 10.

In some embodiments, sound attenuation can be accomplished by increasing the thickness of one or more regions of the privacy/security enclosure. For example, in some embodiments, the privacy/security enclosure can comprise a base portion and/or a lid portion with increased thickness to provide a level of sound attenuation that is greater than that provided for base portion and/or a lid portions that are thinner. In some embodiments, when the base portion and/or lid portion comprises an inner and outer shell, either the inner shell or outer shell or both can be made thicker in order to provide increased sound attenuation. Increasing the thickness of any portion of the privacy/security enclosure can increase the mass of the privacy/security enclosure in some embodiments.

By definition, every frequency has a corresponding wavelength (impacted by phase velocity). In some embodiments, for any privacy/security enclosure, there can be a frequency that resonates based at least in part on its dimensions, material of construction, and mass. If the resonant frequency falls within the audible frequency spectrum, it is more likely that the sound pressure wave will pass to the interior of the privacy/security enclosure. However, in some embodiments, the stiffness or shape of the privacy/security enclosure can push these resonant frequencies away and/or out of the audible voice range. In some embodiments, the material used, its mass, formed shape, and any reinforcing structures such as internal ribbing can increase the stiffness for a particular dimension and modify sound resonance within the privacy/security enclosure.

In some embodiments, sound attenuation can be accomplished using at least one low pressure or vacuum region or pocket within the privacy/security enclosure. For example, one or more vacuum pockets can be integrated in a base portion and/or a lid portion of a privacy/security enclosure to provide a sound attenuation function. In some embodiments, the vacuum pocket can be integrated into a wall of the base portion or the lid portion, integrated within an inner shell coupled to an outer shell of the base or lid portions, or formed by coupling an inner shell to an outer shell to form a vacuum pocket between the inner and outer shells. In some embodiments, a vacuum pump can create at least a partial vacuum in at least a portion of the interior of the privacy/security enclosure. In some embodiments, the vacuum pump can be a separate unit or integrated into the privacy/security enclosure in some embodiments, and can be actuated in various known ways including a motor or a manual actuator.

Some embodiments include other sound attenuation that can be used alone, or with those described previously. Some embodiments of the invention can include at least one vibration dampener. For example, in some embodiments, the privacy/security enclosure can include at least one material and/or at least one component capable of attenuating a vibration. In some embodiments, the privacy/security enclosure can include a vibration dampening coating. The coating can be applied to at least some region of a base portion and/or a lid portion (including for example be applied to one or more metal regions or components). In some further embodiments, the vibration dampening coating can comprise a lead-impregnated vinyl. In some other embodiments, the vibration dampening can be achieved using an aerogel material in the form of a coating, sheet, or one or more layers. In other embodiments, the vibration dampening coating can include at least one conventional acoustical dampening material.

In some embodiments, sound attenuation can be enabled using at least one vibration damping structural feature capable of coupling with any surface of any enclosed device.

For example, in some embodiments, sound attenuation can be enabled using at least one structural feature capable of coupling with one or more microphones of an enclosed device. In some embodiments, the privacy/security enclosure can include at least one structural sound attenuator (e.g., such as a cap or header or footer) positioned inside the privacy/security enclosure that is capable of pressing against one or more microphones of any enclosed device in order to reduce, muffle, and/or substantially block sound from being picked-up by the one or more microphones.

Some embodiments include a vibration damping structural feature comprising an isolation cage. For example, in some embodiments, one or more regions of the privacy/security enclosure can include a suspended vibration isolation cage. In some embodiments, at least one user device can be placed within the vibration isolation cage, and suspended within the privacy/security enclosure in order to attenuate vibrations reaching or being emitted from one or more enclosed devices. Some embodiments include a suspended vibration isolation cage coupled to an inner surface of the privacy/security enclosure using a conventional suspension mount. For example, in some embodiments, the vibration isolation cage can be coupled to an inner surface of the privacy/security enclosure using a coupler comprising an elastomeric material. In other embodiments, the coupler can comprised a fluid-filled chamber in which the fluid is selected for its attenuation of certain vibration frequency ranges.

Figure 4:
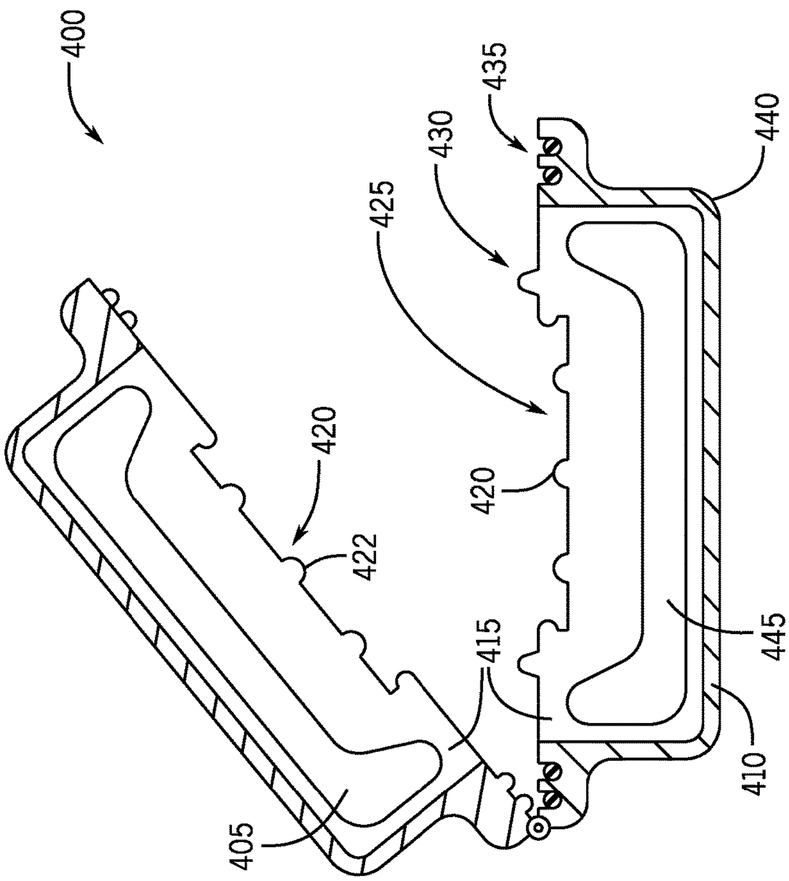
FIG. 4 shows a cross-sectional view of passive acoustical attenuation technology according to at least one embodiment of the invention.

FIGS. 4, 5, 6A-6C, and 7A-7D show perspective views of passive acoustical attenuation technology according to at least one embodiment of the invention. For example, FIG. 4 shows one example of a privacy/security enclosure 400 that is filled with vibration damping foam 415 that can exclude (i.e., displace) sound carrier air, while also providing damping of enclosure vibration caused by exterior sound. As shown, in some embodiments, each portion 405, 410 of the privacy/security enclosure 400 can be at least partially filled with vibration damping foam 415 with at least one deformation seal 430 and at least one o-ring seal 435. Further, in some embodiments, the phone side surface of each half of the damping foam can be shaped or otherwise contoured with one or more features 420. For example, in some embodiments, the phone side surface can include a trough and/or depression 425 to accommodate and/or cradle at least a portion of a phone. Some embodiments can include one or more ridges 422 to support and/or suspend a phone. In some embodiments, at least a portion of the phone side surface of the foam 415 can comprise a high deformation material. In some further embodiments, at least some of one or more foam portions 415 can comprise a gel-like material 445 comprising sound absorbing materials.

Some embodiments can include passive acoustical protection using multiple air-to-enclosure boundaries. In this instance, each successive boundary can provide additional attenuation. For example, as depicted in the assembly view of FIG. 5, in some embodiments, at least one enclosure boundary can include an acoustical reflective outer layer with a "dead" inner layer (shows as 550) including latch 555. Some embodiments include an enclosure 500 comprising an adsorptive shell half 510 and shell half 514 with gasket labyrinth interface 575, fuzzy interior 570, and suspension hooks 585. Some embodiments include a suspended frame 515 including an elastomeric enclosure forming an aperture 530 and extension inserts 525 for coupling with the suspension hooks 585. In some embodiments, the device 10 can be inserted into the frame 515 and supported within the enclosure 500.

Figure 5:
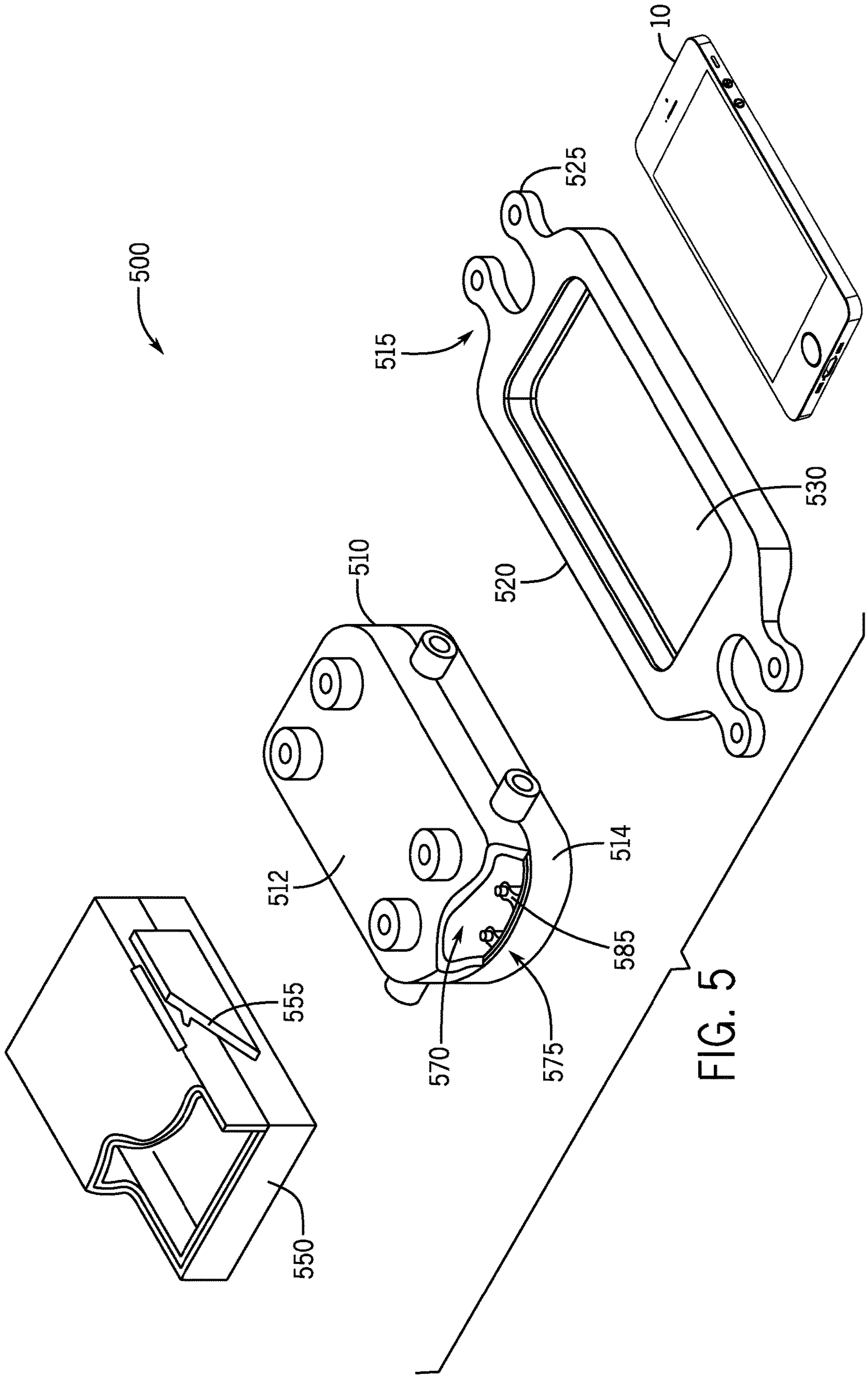
FIG. 5 shows an assembly view of passive acoustical attenuation technology according to at least one embodiment of the invention.

In some embodiments, while the assembly shown in FIG. 5 provides a substantially airtight seal (which also provides protection against water and dust etc.), the primary reason for the gasket labyrinth interface 575 is for RF attenuation. In some embodiments, the gasket labyrinth interface 575 can comprise a conductive gasket that can form at least a portion of a Faraday cage capable of providing RF protection. For example, some embodiments can include a gasket portion comprising a soft elastomer that can be shaped to extend at least a partial distance around the interface between two portions of the privacy/security enclosure. In some embodiments, the gasket portion can include inserts that comprise sound dampening foam and/or the aforementioned gel comprising sound dampening foam. In some embodiments, at least some portion of the privacy/security enclosure 500 (e.g., such as at least one enclosure boundary) can include suspension hooks 585, and in some embodiments, at least part of the gasket portion 515 can couple with one or more of the hooks 585. In some further embodiments, the one or more of the inner enclosures (forming a boundary between an outer enclosure) can comprise a sound absorbing shell. In some embodiments, the outer surface of one or more inner enclosures can comprise at least one suspension damper capable of attenuating and isolating one internal enclosure from another (internal or outer) enclosure. In some embodiments, the target microphone can be excited by vibrations caused by sound pressure waves. In some embodiments, an internal suspension system for one or more communication devices (such as a phone) can reduce the amount of vibration that reaches the microphone. Other benefits can include drop and shock protection.

Figure 6B:
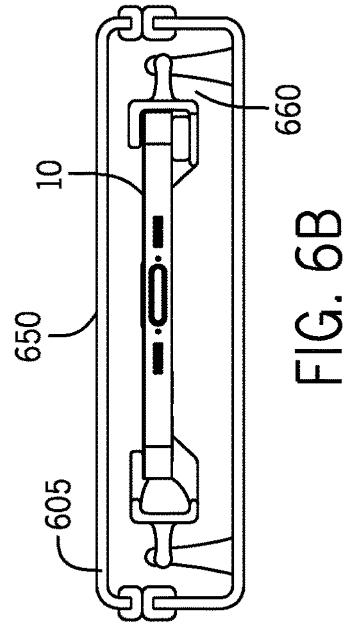
FIGS. 6B, 7A, 7B, 7C, and 7D show perspective views of passive acoustical attenuation technology according to at least one embodiment of the invention.

Some embodiments of the invention can enable a user to upgrade and/or customize and/or maintain the acoustical dampening of the privacy/security enclosure. For example, as shown in FIG. 6B, some embodiments of the invention can include a privacy/security enclosure 650 comprising one or more assemblies including an installable microphone sealing material (with assembly 600 shown in FIG. 6A and an embodiments of a seal of the privacy/security enclosure 650 shown in FIG. 6C). In some embodiments, a tight seal applied directly to any microphone within the privacy/security enclosure 650 can further reduce the sound pressure waves that reach the microphone(s). As shown in FIG. 6B, some embodiments include a privacy/security enclosure 650 including an elastomeric trampoline-type suspension assembly 660. In some embodiments, the suspension assembly 660 can be coupled to one portions of the privacy/security enclosure 650, and can be configured to be coupled to a grip an enclosure portion. For example, referring to the assembly view 600 of FIG. 6A, some embodiments include a case 605, trampoline suspension 610, and grip case 615. Further, auxiliary microphone plug 625, foam 620, and main microphone plug 630 can be assembled into the case 605 for sealing one or more microphones of a user's device. In some embodiments, a main microphone plug 630 can be coupled to the grip enclosure portion (grip case 615), and in some further embodiments, the auxiliary microphone plug 625 can be coupled to the grip case 615. In some embodiments, the main microphone plug 630 and/or the auxiliary mic plug 625 can attenuate sound to prevent it being sensed by one or more microphones in the device 10 (shown in FIG. 6B).

Figure 6C:
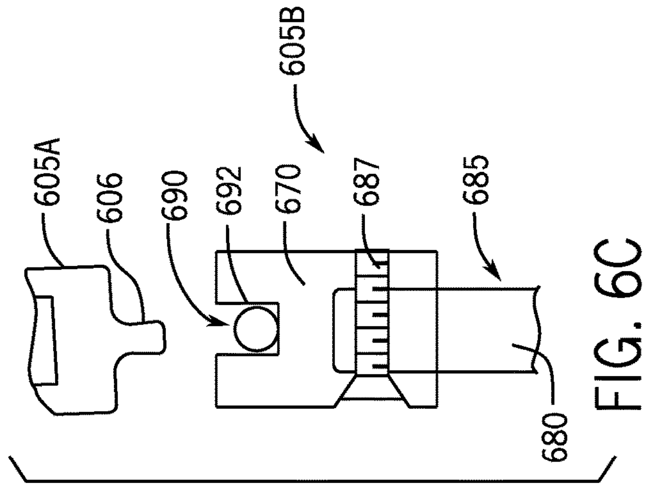
FIGS. 6A and 6C shows an assembly view of passive acoustical attenuation technology according to at least one embodiment of the invention.
Figure 6A:
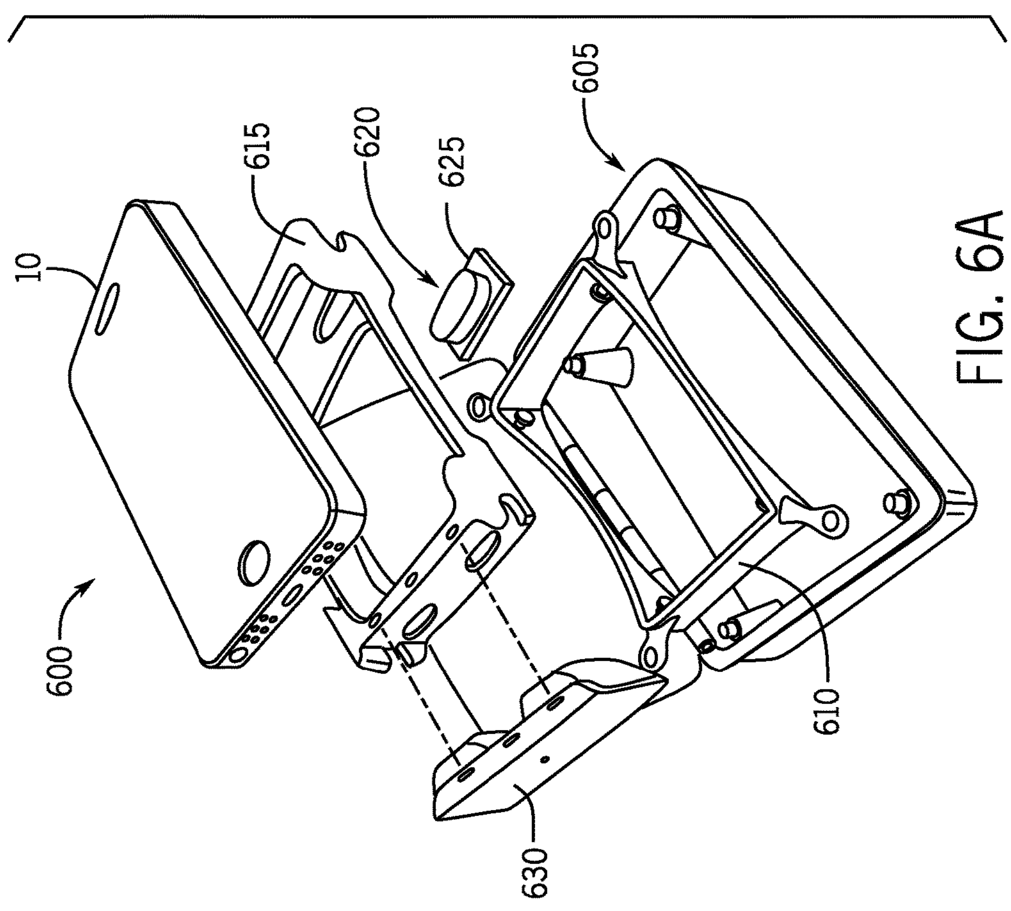

In some embodiments, two portions of the privacy/security enclosure 650 can include at least one o-ring capable of sealing at least a portion of the privacy/security enclosure 650. Further, in some embodiments, the at least one sealing o-ring can comprise a substantially airtight or near airtight seal formed substantially around the seam of the privacy/ security enclosure 650. In this instance, when the privacy/security enclosure 650 is closed, the airtight seal reduces the sound waves reaching the target microphone. Other benefits include air, water and dust protection. Further, in some embodiments, at least a portion of one or more portions of the privacy/security enclosure can include a copper plated lining and/or layer. For example, FIG. 6B shows a cross-sectional view of the privacy/security enclosure 650 showing a device 10 held within the suspension assembly 660 formed by the assembly 600 shown in FIG. 6A. FIG. 6C shows a partial assembly view of a section of the case 605. For example, the wall section 670 coupled to wall section 680 (forming a case half 605*b*) can be coupled to the case half 605*a* as shown. The case half 605*b* can comprise the sections 670, 680 coupled using a screw 687. The wall section 680 can include a copper plate 685 in some embodiments. Further, the wall section 670 can include a groove 692 containing a sealing o-ring 690 into which a tongue portion 606 of the case half 605*a* is inserted to form the privacy/security enclosure 650.

Figure 7B:
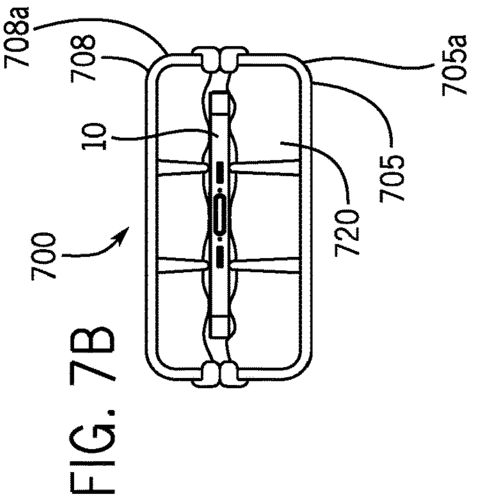
Figure 7D:
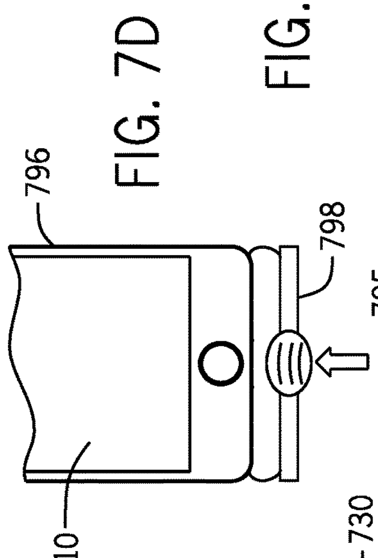
Figure 7C:
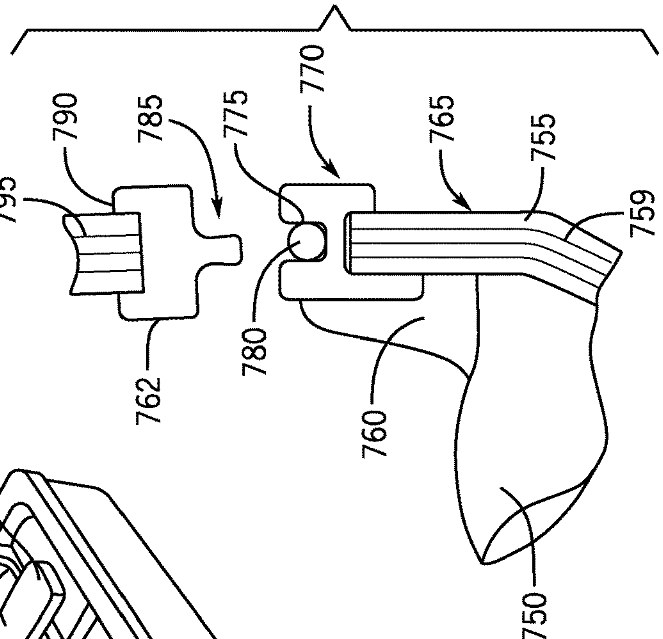
Figure 7A:
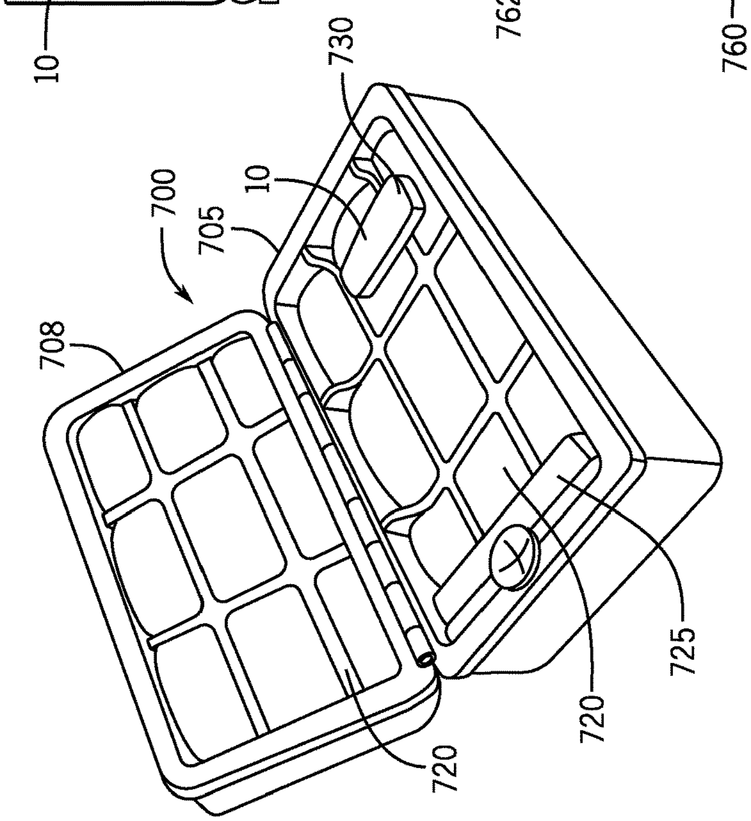

Some embodiments of the invention can include a combination of sound attenuation technologies. For example, as shown in FIGS. 7A-7D, some embodiments can utilize elastomeric webs to suspend the phone and vibration damping inserts. In some embodiments, the privacy/security enclosure 700 can include sound dampening foam distributed between one or more elastomeric ribs. For example, FIG. 7A shows the privacy/security enclosure 700 including a case shell form by a base half 705 and a lid half 708. In some embodiments, a foam web 720 can be positioned in one or more of the halves 705, 708. Soft foam 725, 730 can also be integrated as shown. FIG. 7C shows a partial assembly view of a section of the case 705. For example, the wall section 762 (forming a portion of the case half 708*b*) can be coupled to a wall section 759 (forming a portion of a case half 705*a*). The wall section 759 is shown including an outer wall 755, which in some embodiments includes a multi-layer steel wall 765. Further, in some embodiments, foam section 750 and rib section 760 can be coupled to the wall section 759. At least one Faraday gasket 770 with air and water tight seal 775 can be coupled to a tongue 785 of the wall section 762 by coupled with the seal formed from gasket or o-ring 780. The wall section 762 can comprise a gasket 790 coupled to an outer wall 795. FIG. 7D shows a close-up view of a device 10 coupled with a portion of the foam frame 796, 798 when positioned in the privacy/security enclosure 700 as described. In some embodiments, the foam 725, 730, 750 can comprise a soft, open cell memory foam that utilizes elastomeric webs (ribs 760) to suspend the phone and vibration damping inserts between the webs that also act as shock absorbers in the case of severe impact. In some embodiments, the case shell (e.g., formed by outer walls 755, 795 shown in FIG. 7C) can also be a composite structure designed for sound blocking, damping, and RF shielding characteristics (as well as video and other shielding characteristics). Further, in some embodiments, foam-faced plungers can be positioned to compress against the microphone ports of a communication device when the enclosure is closed.

Figure 8B:
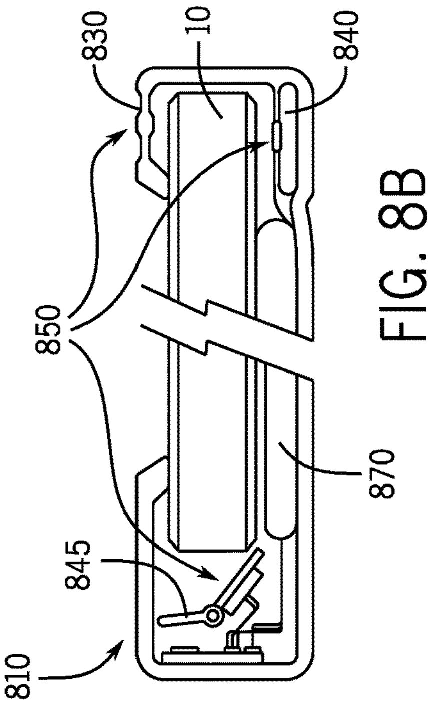
FIGS. 8A, 8B, 9A, 9B, and 9C show perspective views of active acoustical attenuation technology according to at least one embodiment of the invention.
Figure 8A:
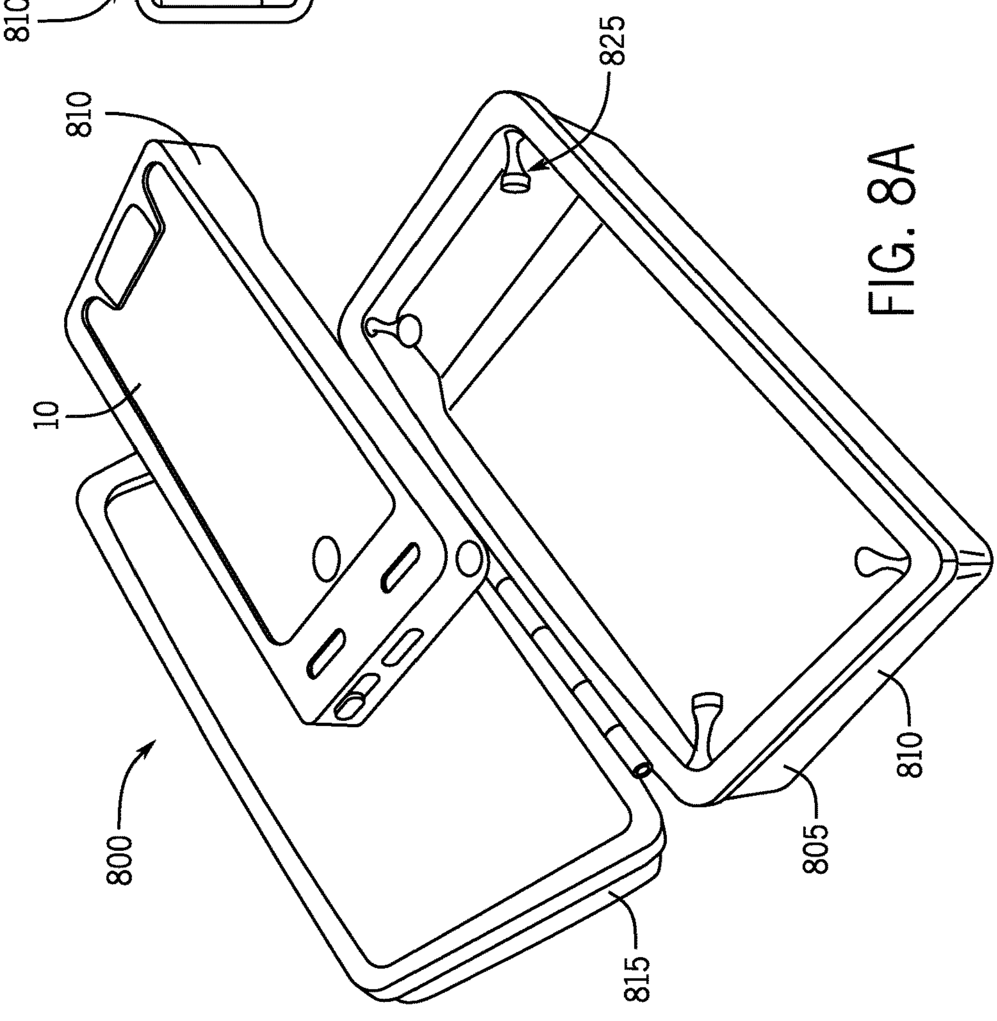

Some embodiments of the invention include active acoustical control. For example, some embodiments include active masking of audio listening devices using at least one audio masking device. In some embodiments, active acoustical control can comprise at least one sound generator (such as a speaker) transmitting audio masking signals such that any enclosed microphone and/or microphone recording of one or more targeted devices is not able to distinguish the masking signals from other audio content that may or may not have been present at the time of the broadcast of the masking signal. In some embodiments, the audio content can comprise babble, chirps, pink noise, or white noise. Thus, in some embodiments sound is recorded but audibly buried with the signals that are broadcast so that the sounds are substantially indistinguishable from the masking signal. A variety of masking sounds can be used for this purpose including, but not limited to high or low frequency sounds (including those outside of unassisted human perception). In some instances, the audio masker can be a standalone feature or device, and can include a powered speaker option. For example, FIGS. 8A-8B show one embodiment of the invention including a privacy/security enclosure 800 comprising an elastomeric suspension portion (810 coupled with 825), and at least one speaker that can emit sound in the general area of one or more communication devices (e.g., such as a phone). In some embodiments, the privacy/security enclosure 800 comprising a housing including a base portion 810 and a lid portion 815. Further, the privacy/security enclosure 800 can include an active sound system 850 positioned within the housing 805 that can utilize one or more piezoelectric transducers 830, 840, 845. In some embodiments, a battery 870 is provided for powering the active sound system 850, and optionally for use as an auxiliary power supply for a phone via conventional electromechanical or inductive coupling technologies.

Figure 9A:
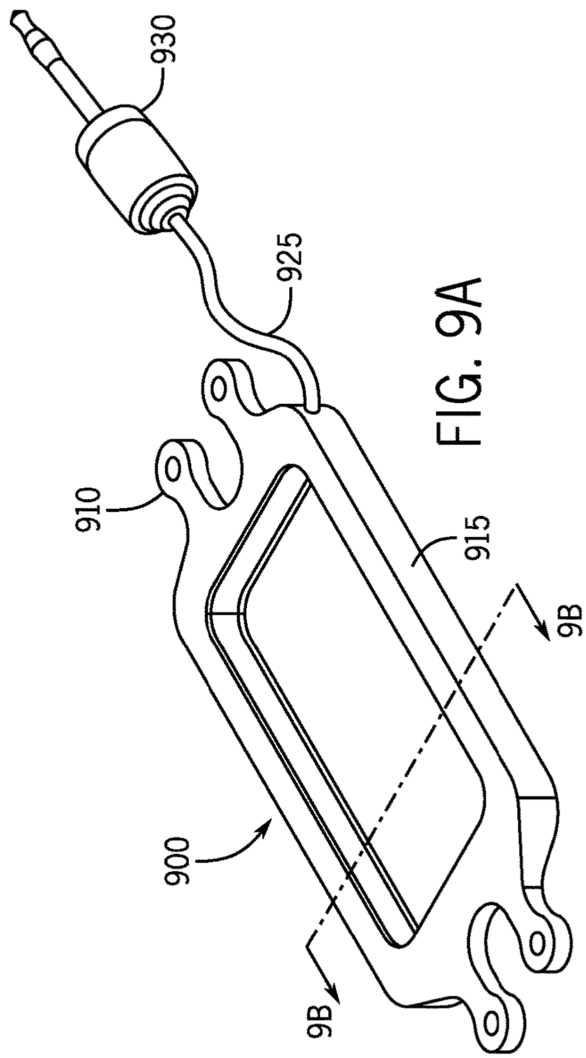
Figure 9C:
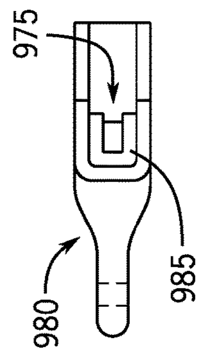
Figure 9B:
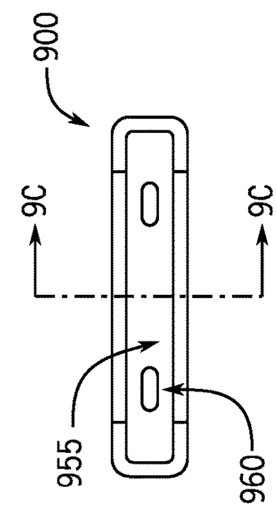

In some further embodiments, the privacy/security enclosure can include an acoustical attenuation comprising an elastomeric suspension that is removable from the privacy/security enclosure to allow easy fitting of the phone. As illustrated in FIGS. 9A-9C, in some embodiments, the elastomeric suspension 900 can include a vibration isolating portion 955 comprising sound dampening foam that can be located at the microphone ports. Further, some embodiments can also include active/powered acoustical transmission via a speaker 930 coupled through a port 925. For example, in some embodiments, a portion of the foam 960 directly adjacent to the microphone port can include at least one embedded speaker 975 within the foam 985 coupled to a silicone frame portion 980 of the elastomeric suspension 900 (shown in FIG. 9C) capable of introducing noise within the vicinity of the microphone port of a communication device. In some embodiments, embedded speakers 975 can be included based on the geometry of one or more enclosed devices in order to offer the flexibility to be used with different communication devices that can vary in size, quantity, and shape. Moreover, in some embodiments, embedded speakers 975 can be included based on the quantity and/or sizes of microphones. In some embodiments, the broadcast of noise can create a signal that can limit or prevent a microphone in the privacy/security enclosure from detecting the presence and/or intelligibility of voices. In some embodiments, the noise can be deterministic, partly-deterministic, or a random sound envelope. In some embodiments, the noise signal could be chirping (a single tone starting from some frequency and shifting to another frequency that can go over an audible frequency range and repeat). In some embodiments, the noise can comprise a random chirping (e.g., a sequence of random chirps played serially). Further, in some embodiments, each chirp can cover some portion of the audible range. Some further embodiments include a crowd noise and/or babble (e.g., multiple, substantially simultaneous speaking voices). Some other embodiments can include random and/or colored noise (e.g., random noise with a specific shape in the frequency domain including white noise, pink noise, brown noise, blue noise, gray noise, or other). Some embodiments of the invention can include a speaker driver to produce any one of the above mentioned noise sound envelopes within the privacy/security enclosure 900 or some portion of the privacy/security enclosure 900 (e.g. a sock or other mechanism holding one or more devices). In some embodiments, the sound driver (e.g., a speaker) can be configured for low power consumption, accuracy in reproducing the desired random noise source, and one or more front and back driver volume controls.

Some embodiments include selective activation of acoustical masking. For example, in order to conserve power or to minimize obtrusive noise, some embodiments include a microphone capable of detecting the presence of speech. In some embodiments, when speech is detected, noise is broadcast to at least partially mask the speech (through a process of listening and responding). In some further embodiments, a broadcast tail (e.g. some time period, which may vary based on goal) can be used when speech is no longer detected (to accommodate pauses in conversation). Further, some embodiments include varying the power level of the noise signal being broadcasted based on the volume of speech detected. Further, some embodiments of the invention include broadcasting a low volume of sound substantially all of the time. Some embodiments of the invention can also include various controls (e.g., buttons or some other such interface) that can allow users to either activate or bypass the listen and response and/or other features. In some embodiments, a user can use the controls to selectively broadcast noise continuously at varying power levels, or to turn the device off entirely to allow for calls, or for some other such purpose, including those in which no audio masking is desired.

Some embodiments of the invention include access ports. For example, in some embodiments, the privacy/security enclosure can include at least one slot or aperture configured to allow access to a device port. In some embodiments, at least some portion of the base and/or the lid of the privacy/security enclosure can include one or more apertures or slots that can enable access to an enclosed device. In some embodiments, one or more access ports can enable power, audio, video, or other signals to be transmitted into and out of the privacy/security enclosure. Further, in some embodiments, a power supply, an audio signal, and/or a video signal can be transferred into or from any device within the privacy/security enclosure while substantially attenuating or substantially blocking receipt and transmission of RF signals to and from the privacy/security enclosure.

In some embodiments, the privacy/security enclosure can include at least one accessory pouch. For example, as shown in FIG. 2, in some embodiments, the privacy/security enclosure 200 can include at least one accessory pouch 202 such as an internal sleeve or pocket capable of securing documents, credit or debit cards, driver's license, etc. In some embodiments as shown, the lid portion 215 can include the accessory pouch 202 including a plurality of pockets or compartments 202*a*. In some other embodiments, the privacy/security enclosure 200 can include at least one accessory pouch capable of securing an accessory selected from a group consisting of a pen, a pencil, coin currency, paper or plastic currency notes, USB memory sticks, and keys (e.g., house or automobile keys and key fobs). In some embodiments, the pouch 202, 202*a* can comprise a metal mesh wallet.

In some embodiments, at least some portion of the privacy/security enclosure can include a colored covering. For example, in some embodiments, at least some portion of the base portion or lid portion of the privacy/security enclosure can be colored (e.g., the base or lid can be red in color). In some embodiments, at least some portion of the privacy/security enclosure can include a multiple colored covering. For example, in some embodiments, at least some portion of the base or the lid of the privacy/security enclosure can comprise multiple colors.

Some embodiments include a privacy/security enclosure that can include a patterned surface. For example, in some embodiments, at least some portion of the base or the lid of the privacy/security enclosure can include a patterned surface. In some embodiments, at least some portion of the base or the lid of the privacy/security enclosure can include printed text. In some embodiments, at least some portion of the base or the lid of the privacy/security enclosure can be textured.

In some embodiments, the privacy/security enclosure can include a covering layer. For example, in some embodiments, the privacy/security enclosure can comprise a substantially structurally supporting member including for example a base and lid portion, and at least some portion of the base or the lid of the privacy/security enclosure can be covered by at least one covering layer. In some embodiments, the covering layer can comprise carbon fiber. In other embodiments, the covering layer can comprise a polymer film or a fabric-based material. In some embodiments, the shape of the outer surface of the privacy/security enclosure can dictate the material used for the covering layer and the process used to couple the covering layer to the outer surface of the privacy/security enclosure shell (e.g., by coupling to either the base portion or the lid portion).

In some further embodiments, colors, patterns, textures, prints, or inserted materials can be applied to inside of the privacy/security enclosure (e.g., to liners, accessories, socks, and/or blocking foams etc.,) as well as to hinges and/or latches on the outside of the privacy/security enclosure.

Figure 10:
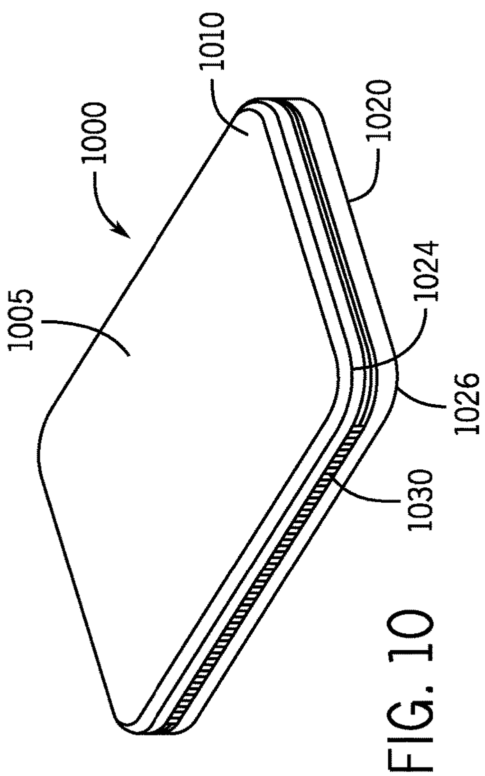
FIG. 10 illustrates a perspective view of a privacy/security enclosure according to one embodiment of the invention.

FIG. 10 illustrates a perspective view of a privacy/security enclosure 1000 according to one embodiment of the invention including filleted corners. The privacy/security enclosure 1000 can comprise a housing 1005 including a base portion 1020 and lid portion 1010 coupled by a hinge 1030. As shown, in some embodiments, the corners of the base portion and the lid portion base portion 1020 (shown as 1026) and lid portion 1010 (shown as 1024) can be filleted so that the corners are curved, and the outer edge of the base portion and the lid portion can comprise a curved surface.

Figure 11:
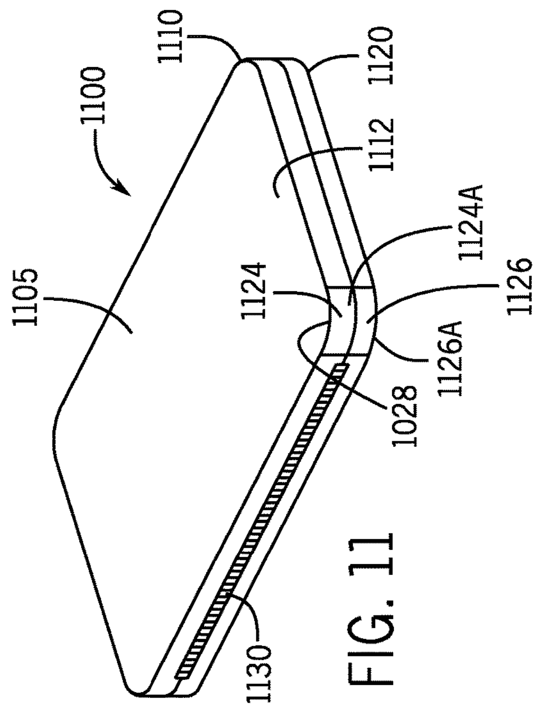
FIG. 11 illustrates a perspective view of a privacy/security enclosure according to another embodiment of the invention.

FIG. 11 illustrates a perspective view of a privacy/security enclosure 1100 according to another embodiment of the invention. The privacy/security enclosure 1100 can comprise a housing 1105 including a base portion 1120 and lid portion 1110 coupled by a hinge 1130. As shown, in some embodiments, the corners (1126) of the base portion 1120 and the corners (1124) of the lid portion 1110 can be curved. Further, the edge interfaces of the corners of the base portion and the lid portion can be substantially flat as they meet with the top surfaces of the portions 1110, 1120. For example, the edge interface 1128 formed with the top surface 1112 can be substantially flat proximate the corner 1124). Further, the transition from the top surface of the base portion and to the wall surface 1126*a* of the base portion 1120, and the transition from the top surface 1112 to the wall surface 1124*a* of the lid portion 1110 can include a sharp or abrupt edge. Moreover, in some embodiments, the edge can be at least partially curved.

Figure 12:
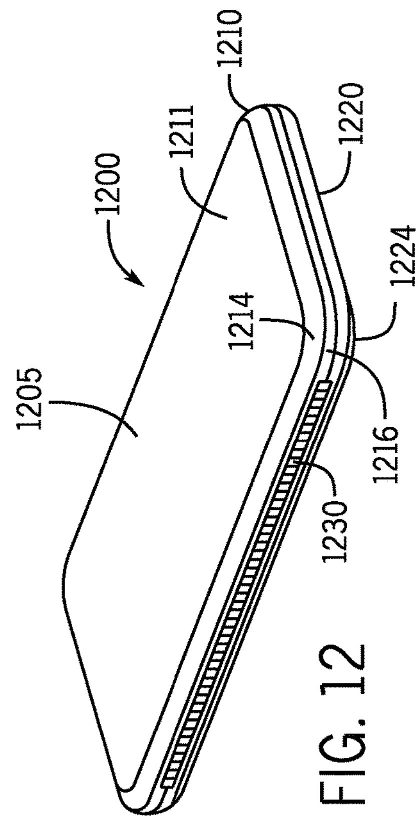
FIG. 12 illustrates a perspective view of a privacy/security enclosure according to a further embodiment of the invention.

FIG. 12 illustrates a perspective view of a privacy/security enclosure according to a further embodiment of the invention. As shown, in some embodiments, the corners of the base portion 1220 (shown as 1224) and the corners of the lid portion 1210 (shown as 1214) can be curved. Further, the base portion 1220 and the lid portion 1210 can include a curved transition region from their respective top surface (top surface 1211 of the lid portion 1210 being visible in the view of FIG. 12) to the wall surface 1216. In some embodiments as shown, the corners 1224, 1214) can include a reduction in the radius of curvature of the corners 1224, 1214 (as compared with the embodiments of FIGS. 10 and 11). In some embodiments, the reduced radius in the corners 1224, 1214 can reduce distortion and wear of the surfaces of the privacy/security enclosure 1200.

Figure 13:
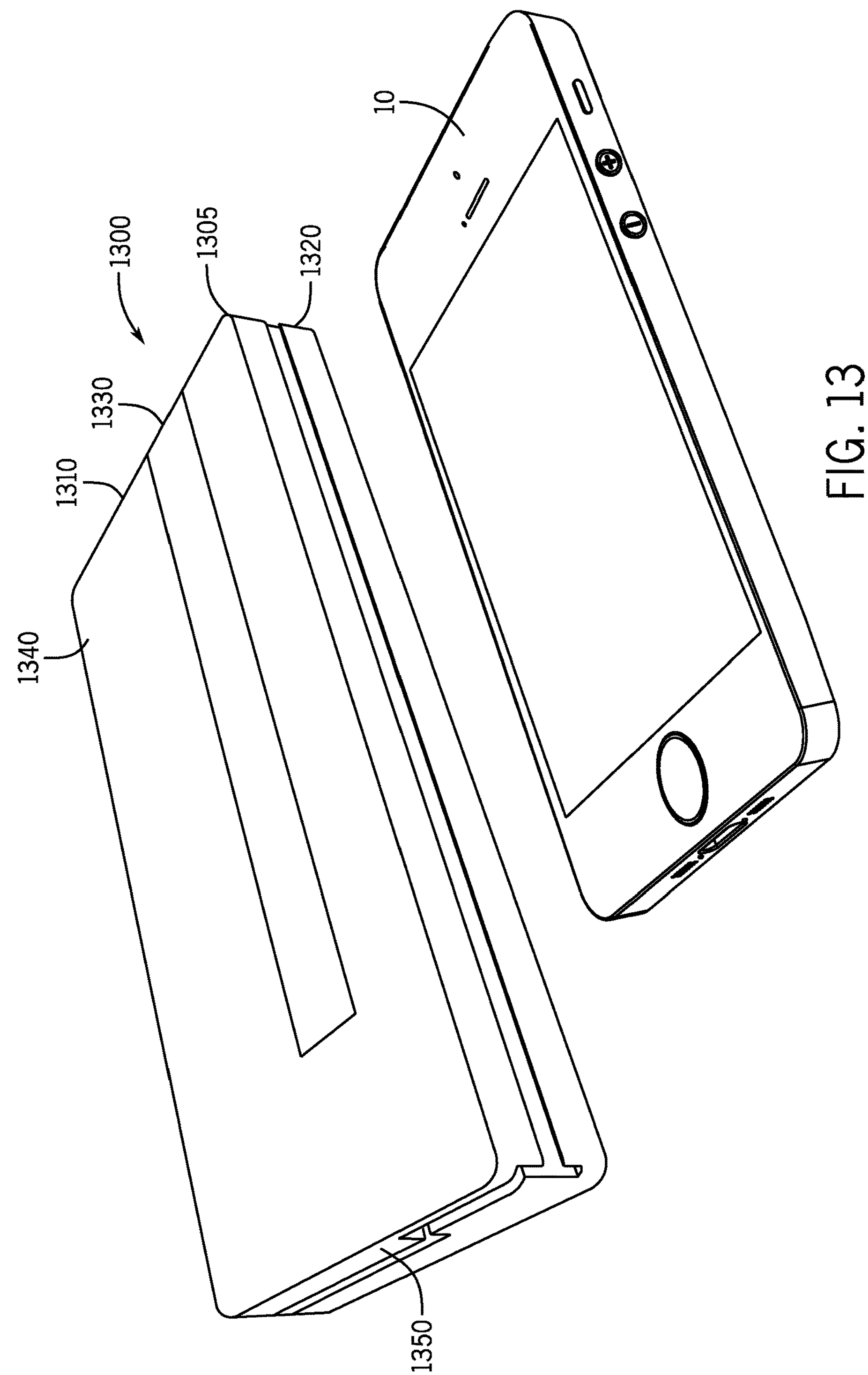
FIG. 13 illustrates a perspective view of a privacy/security enclosure adjacent to smart phone according to one embodiment of the invention.
Figure 14:
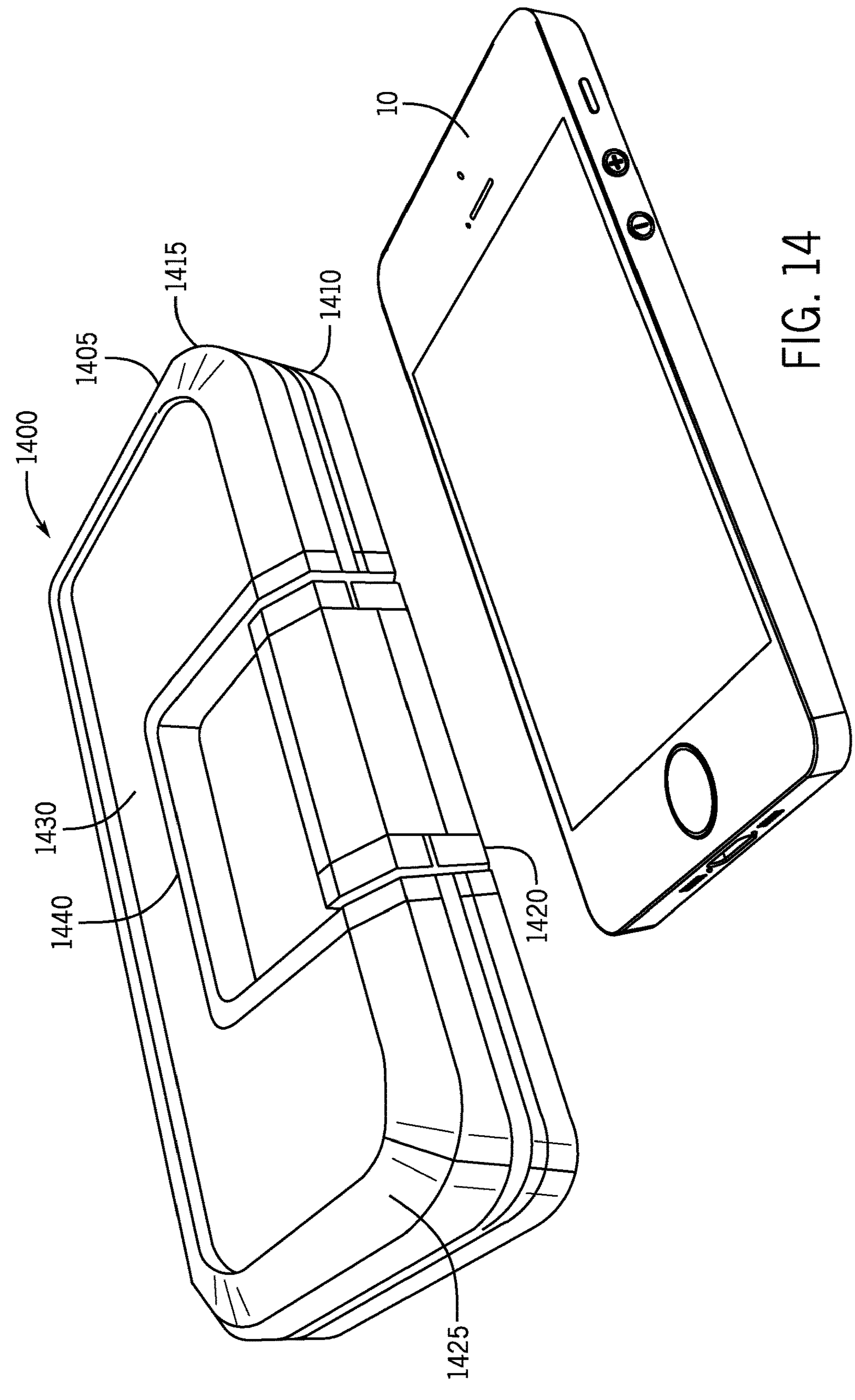
FIG. 14 illustrates a perspective view of a privacy/security enclosure adjacent to smart phone according to one embodiment of the invention.
Figure 15:
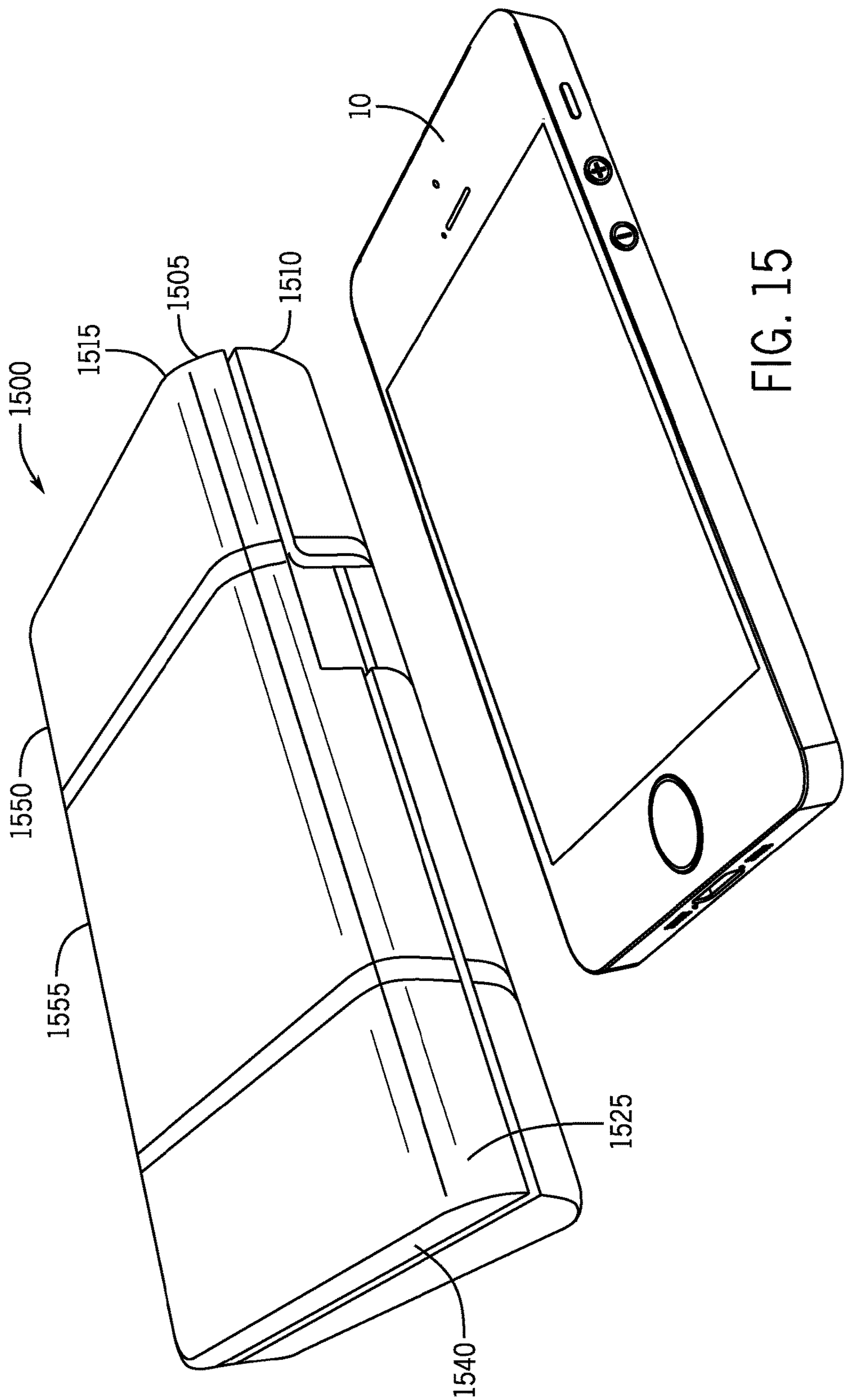
FIG. 15 illustrates a perspective view of a privacy/security enclosure adjacent to smart phone according to one embodiment of the invention.

Some further embodiments of the invention include a privacy/security enclosure design comprising at least one outside cover feature. For example, FIGS. 13-15 show perspective views of various embodiments of a privacy/security enclosure. FIG. 13 illustrates a perspective view of a privacy/security enclosure 1300 adjacent to user device 10 in which the outer cover 1340 comprises a longitudinal feature 1330. The housing 1305 can comprise a base portion 1320 and lid portion 1310 including an outer cover 1340. The outer cover 1340 can include the feature 1340 that can extend at least a partial length of the housing 1305. In some embodiments, the feature 1340 can comprise any color or texture as described earlier. Further, in some embodiments, the feature 1340 can comprise a window, layer, logo, emblem, display, or other functional or aesthetic feature.

FIG. 14 illustrates a perspective view of a privacy/security enclosure adjacent to smart phone according to one embodiment of the invention in which the outer cover comprises a central feature, and FIG. 15 illustrates a perspective view of a privacy/security enclosure adjacent to smart phone according to one embodiment of the invention that includes a central feature extending across the width of the privacy/security enclosure. For example, referring to FIG. 14, the housing 1405 can comprise a base portion 1410 and lid portion 1415 including an outer cover 1430. The portions 1410, 1415 are shown coupled by a pivot or hinge assembly 1420. The outer cover 1430 can include the centrally located feature 1440 that can extend at least a partial length of the housing 1405. In some embodiments, the feature 1440 can comprise any color or texture as described earlier. Further, in some embodiments, the feature 1440 can comprise a window, layer, logo, emblem, display, or other functional or aesthetic feature. Further, referring to FIG. 15, the housing 1505 can comprise a base portion 1510 and lid portion 1515 including an outer cover 1550. The outer cover 1550 can include the centrally located feature 1555 that can extend at least a partial length of the housing 1505. In some embodiments, the feature 1555 can comprise any color or texture as described earlier. Further, in some embodiments, the feature 1555 can comprise a window, layer, logo, emblem, display, or other functional or aesthetic feature. Further, in some embodiments, a side 1540 of the privacy/security enclosure 1500 can comprise any color or texture as described earlier. The embodiments shown in FIGS. 13-15 depict a user device 10 (e.g., a smart phone) positioned adjacent to the closed privacy/security enclosures, and in each enclosure represent one embodiment of a user device that can be enclosed by the adjacent privacy/security enclosure.

Figure 16:
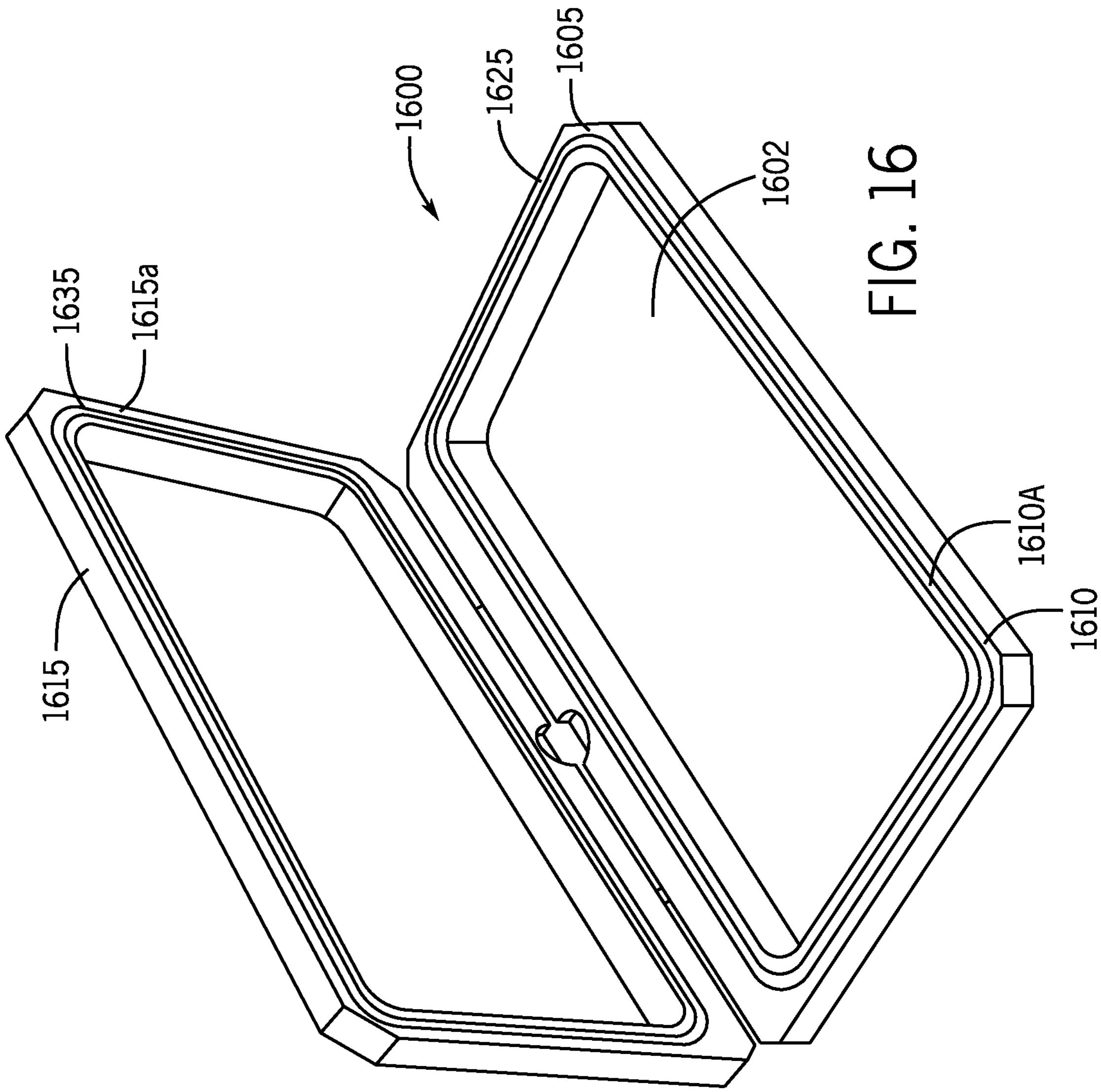
FIG. 16 is a perspective view of an open privacy/security enclosure according to one embodiment of the invention.

As described earlier, in some embodiments, the privacy/security enclosure can be closed. In some instances, closure and sealing of a base and lid portion of a privacy/security enclosure can be facilitated by the use of at least one tongue and groove. As discussed earlier, FIG. 3 shows a cross-sectional view of at least a portion of an outer rim of a shell enclosure of a privacy/security enclosure that can include a tongue and groove ring (shown as 325). In other embodiments, the privacy/security enclosure can include single tongue and groove architecture. Some embodiments can include a groove positioned on a base portion and a single tongue positioned on a lid portion, configured and arranged to matingly engage when the privacy/security enclosure is closed. In some embodiments, either one or both of a base portion and a lid portion can include an inner surface comprising a tongue and groove structure. Moreover, in some embodiments, the use of a plurality of tongue and grooves, with each tongue and groove including a conductive gasket, can add incremental RF shielding based at least in part on the number of tongues, grooves, and conductive gaskets. For example, FIG. 16 is a perspective view of an open privacy/security enclosure 1600 according to one embodiment of the invention. The privacy/security enclosure 1600 can comprise a main housing 1605 including a base portion 1610 and a lid portion 1615 enclosing an inner region 1602. In some embodiments, a groove 1625 can extend at least partially around the edge **1610*a* of the base portion 1610, and a groove 1635 can extend at least partially around the edge 1615*a* of the lid portion 1615**.

Figure 17:
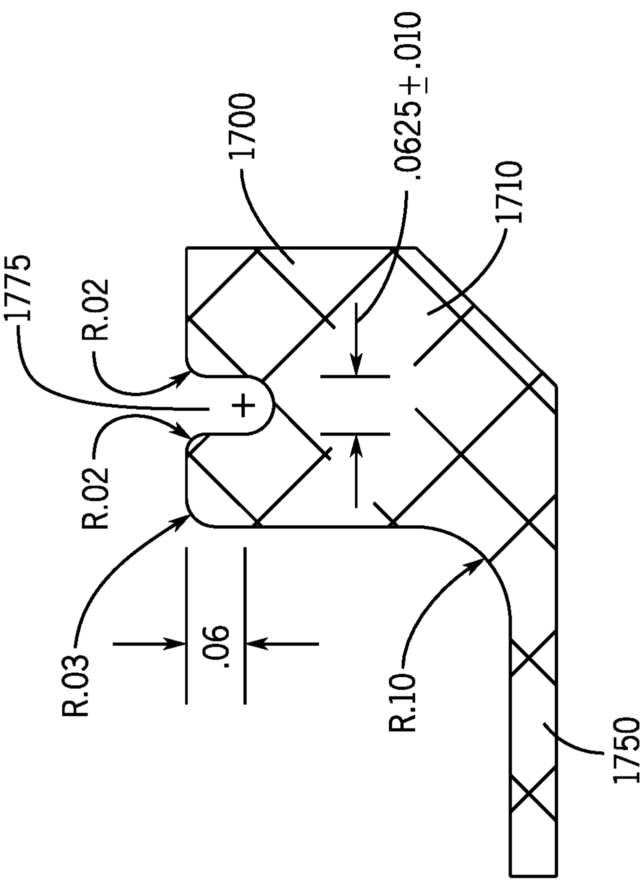
FIG. 17 is a cross-sectional view of a privacy/security enclosure lid portion of FIG. 16 according to one embodiment of the invention.

FIG. 17 is a cross-sectional view of a privacy/security enclosure lid portion 1615 or base portion 1620 of the privacy/security enclosure 1600 of FIG. 16 according to one embodiment of the invention. The wall section 1700 can be coupled to wall section 1710, and surface 1750. The groove 1775 (representing either of the grooves 1625 or 1635 of FIG. 16) is shown at least partially extending into the wall section 1700.

Figure 18:
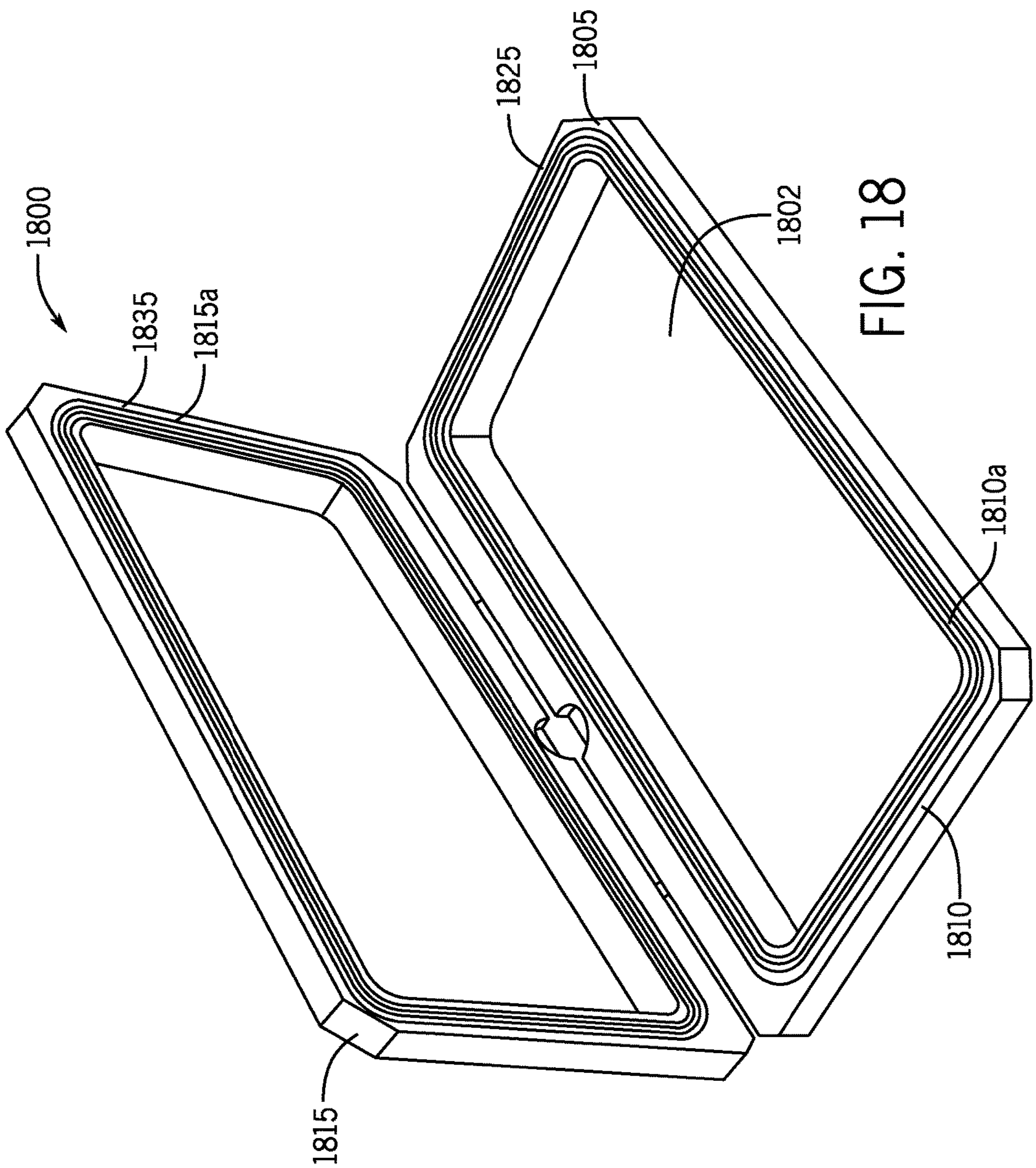
FIG. 18 is a perspective view of an open privacy/security enclosure according to another embodiment of the invention.

In some embodiments, any privacy/security enclosure described herein can include two closely spaced tongue and groove structures (e.g., as represented by the cross-sectional view of FIG. 3). For example, FIG. 18 is a perspective view of an open privacy/security enclosure 1800 according to another embodiment of the invention. The privacy/security enclosure 1800 can comprise a main housing 1805 including a base portion 1810 and a lid portion 1815 enclosing an inner region 1802. In some embodiments, a groove 1825 can extend at least partially around the edge **1810*a* of the base portion 1810, and a groove 1835 can extend at least partially around the edge 1815*a* of the lid portion 1815**.

Figure 19:
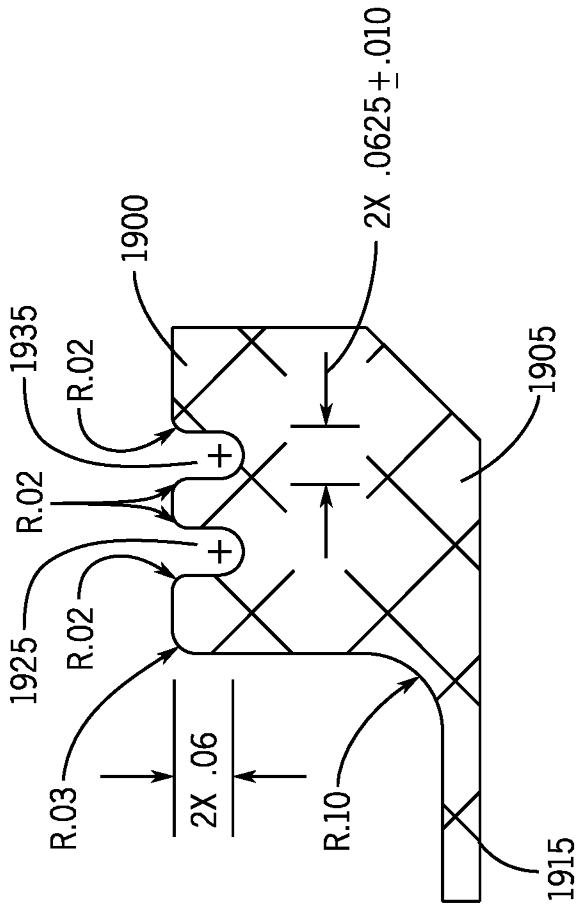
FIG. 19 is a cross-sectional view of a privacy/security enclosure lid portion of FIG. 18 according to one embodiment of the invention

FIG. 19 is a cross-sectional view of a privacy/security enclosure lid portion 1815 or base portion 1820 of the privacy/security enclosure 1800 of FIG. 18 according to one embodiment of the invention. The wall section 1900 can be coupled to wall section 1905, and surface 1915. The grooves 1925, 1935 (representing either of the grooves 1825 or 1835 of FIG. 18) are shown at least partially extending into the wall section 1900.

In some embodiments, the one or more grooves can extend around an outer perimeter of the inner region (e.g., as shown in the example embodiment of FIG. 16), and can be positioned immediately adjacent to the inner region. In some other embodiments, the one or more grooves can extend around an outer perimeter of the inner region (e.g., as shown in FIG. 16), and can be located immediately adjacent to the outer surface of the base or lid portion. In some further embodiments, the one or more grooves can extend around an outer perimeter of the inner region (e.g., as shown in FIG. 16), and can be substantially centrally positioned between the inner region surface and the outer surface.

In some embodiments, any privacy/security enclosure disclosed herein can include an upper ring and a lower ring, in which the upper ring is capable of engaging the lower ring to form a seal. The upper ring can include at least two members capable of engaging a plurality of slots or grooves within the lower ring, and the lower ring can include a plurality of members capable of engaging a plurality of slots or grooves within the upper ring. In some further embodiments, the lower ring can include at least two members capable of engaging a plurality of slots or grooves within the upper ring, and the upper ring can include a plurality of members capable of engaging a plurality of slots or grooves within the lower ring. In some other embodiments, the upper ring can include at least one member capable of engaging a plurality of slots or grooves within the lower ring, and the lower ring can include one or more members capable of engaging one or more slots or grooves within the upper ring. In some further embodiments, the lower ring can include at least one member capable of engaging one or more slots or grooves within the upper ring, and the upper ring can include a plurality of members capable of engaging one or more slots or grooves within the lower ring.

Figure 20B:
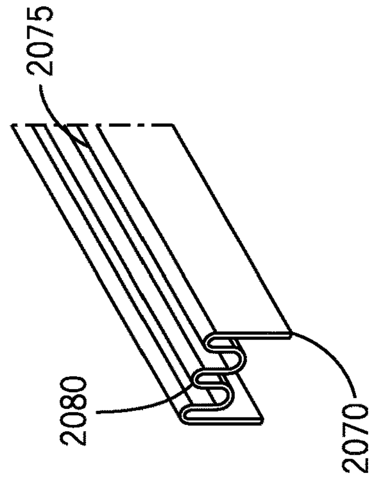
FIG. 20B is a perspective view of ring seal for use in a privacy/security enclosure according to one embodiment of the invention.
Figure 20A:
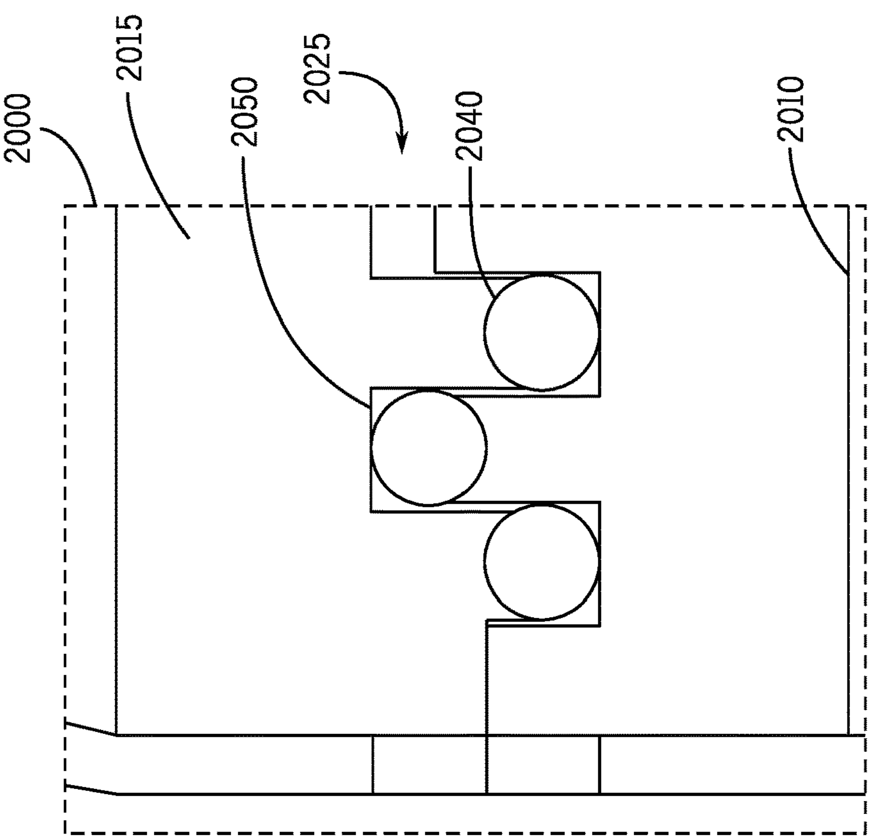
FIG. 20A is a cross-section view through region A of the privacy/security enclosure of FIG. 2 according to one embodiment of the invention.

FIG. 20A is a cross-section view through region A of the privacy/security enclosure of FIG. 2 according to one embodiment of the invention. The section 2000 can comprise a lower ring 2010 and an upper ring 2015. The groove assembly 2050 (shown comprising ring seal 2070 in FIG. 20B) can comprise a seal 2025 position in the upper ring 2015, and at least one seal 2040 positioned in the lower ring 2010. The seals 2025, 2040 can comprise an RF or EMI o-ring seal in some embodiments. FIG. 20B is a perspective view of ring seal 2070 for use in a privacy/security enclosure according to one embodiment of the invention. The ring seal 2070 can comprise a corrugated frame comprising at least one groove 2080 bounded by at least one extension 2075. In some embodiments, the at least one groove 2080 can be used to house a gasket or o-ring.

Various numbers of grooves can be used in some embodiments. For example, one embodiment of a dual groove structure can be seen in FIG. 19, and a single groove example is illustrated in FIG. 17. In some embodiments, any of these groove structures can be implemented with a tongue structure such as the tongue architecture illustrated in FIG. 20A, and can be used with or without an o-ring. For example, in some embodiments, one or more o-rings can be placed between any of the upper members of the upper ring and the slots of the lower ring, and/or between any of the members of the lower ring and the slots of the upper ring. In some embodiments, any one of the plurality of o-rings (e.g., any one of the o-rings seals 2040, 2050 shown in FIG. 20A) can comprise an RF shield (i.e., can function as an RF attenuating gasket) and therefore, can enable a ring seal for use in a privacy/security enclosure. In some embodiments, any one of the plurality of o-rings can comprise a polymer-based matrix material including metal filaments dispersed in a matrix to form a polymer composite material. In some embodiments, the polymer matrix can comprise a homopolymer and/or copolymer, and can comprise an elastomeric polymer such as rubber. In some other embodiments, any one of the plurality of o-ring can comprise a carbon fiber-filled matrix material including metal filaments dispersed in a matrix to form a carbon fiber composite material. In some embodiments, any one of the plurality of o-rings seals 2050, 2050 shown in FIG. 20A can be capable of forming a compliant privacy seal between an upper ring and lower ring of a privacy/security enclosure.

In some embodiments, the formed seal can be capable of functioning as an environmental barrier in addition to functioning as an RF shield. For example, in some embodiments, the formed seal can be capable of providing a water and/or moisture barrier in addition to function as an RF shield. In some embodiments, the plurality of o-rings seals 2040, 2050 shown in FIG. 20A can be capable of forming a substantially water-resistant or substantially water-proof privacy seal between an upper ring and lower ring of a privacy/security enclosure. Further in some embodiments, when used in combination with the RF shield layer described earlier and shown in FIG. 3, the combination of the privacy seal form by the structure of FIG. 20A and the RF shield layer 305 of FIG. 3 can form a Faraday cage to substantially attenuate or at least partially block substantially all RF transmission into the privacy/security enclosure, and/or substantially attenuate or at least partially block substantially all RF transmission out from the privacy/security enclosure. In this instance, at least a portion of the o-ring seals 2040, 2050 can be electrically conductive.

In some embodiments, more than one type of o-ring can be used with any of the upper members of the upper ring and the slots of the lower ring, and/or between any of the members of the lower ring and the slots of the upper ring structures described above. In some embodiments, each o-ring type can be optimized for a specific function (either to at least partially block or attenuate RF, sound, light, moisture, etc.). However, any one o-ring can function to attenuate or at least partially block a combination of RF, sound, light, etc. For example, in some embodiments, one or more of the o-rings can function to attenuate RF, and one or more o-rings can function to attenuate sound, and one or more o-rings can function as an environmental barrier. Moreover, in some embodiments, one or more of the o-rings can be large or smaller than one or more other o-rings. For example, in some embodiments, one or more of the grooves can be larger or smaller than one or more other groove so as to be capable of cradling a complementarily-sized o-ring.

Figure 21:
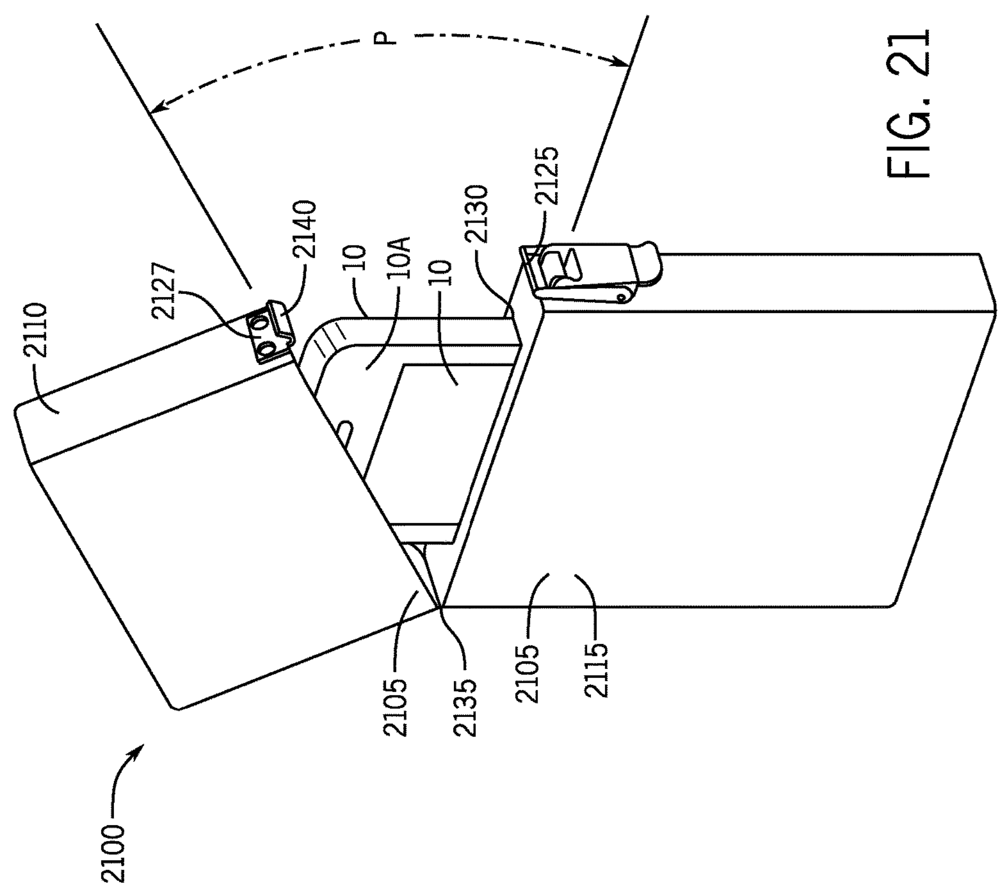
FIG. 21 is a perspective view of a privacy/security enclosure according to another embodiment of the invention.

Some embodiments include alternative arrangements and geometries for providing a configurable privacy/security enclosure. For example, FIG. 21 is a perspective view of a privacy/security enclosure 2110 according to another embodiment of the invention. In some embodiments, the privacy/security enclosure 2110 can include a housing 2105 comprising a bottom enclosure portion 2115 including an inner region 2130, and a lid portion 2110 coupled by at least one hinge mechanism 2105. The lid portion 2110 can also include an inner region 2135 to accommodate an upper portion 10*a* of a device 10. As depicted in FIG. 21, in some embodiments, the bottom enclosure portion 2115 and the lid portion 2110 can be pivoted with respect to each other by the at least one hinge mechanism 2105. Moreover, as shown, in some embodiments, the privacy/security enclosure 2100 can include a bottom enclosure portion 2115, and a lid portion 2110 coupled along one edge proximate the at least one hinge mechanism 2105. The bottom enclosure portion 2115 and the lid portion 2110 can be pivoted can be positioned and pivoted with respect to each other to enable at least partial access to the inner regions 2130, 2135 of the privacy/security enclosure 2100. Moreover, in some embodiments, the bottom enclosure portion 2115 and the lid portion 2110 can be coupled along one longitudinal side, and angled at an angle of between about 0° and about 90° (shown as pivot angle P). In some further embodiments, the bottom enclosure portion 2115 and the lid portion 2110 can be coupled along one longitudinal side, and angled at an angle greater than about 90°.

In some embodiments, the bottom enclosure portion 2115 and the lid portion 2110 can at least partially enclose and/or cradle one or more mobile or stationary communication devices within their respective inner regions 2130, 2135. Moreover, in some embodiments, at least some portion of at least one mobile or stationary communication device can be enclosed by the bottom enclosure portion 2115, and at least some portion (e.g., an upper portion 10*a*) of the mobile or stationary communication device can extend outwardly from the inner region 2130 defined by the bottom enclosure portion 2115.

In some embodiments, the lid portion 2110 can include a latching mechanism 2127, and the bottom enclosure portion 2115 can include a latch 2125 coupled to the at least one side of the bottom enclosure portion 2115 of the privacy/security enclosure 2100. Further, the lid portion 2110 can include a latch coupling 2140 coupled to at least one side of the lid portion 2110 of the privacy/security enclosure 2100. In some embodiments, the coupling 2140 can be coupled with the latch 2125. For example, in some embodiments, when the bottom enclosure portion 2115 and the lid portion 2110 are pivoted so as to be coupled together (i.e., the pivot angle P between the bottom enclosure portion 2115 and the lid portion 2110 is about zero), the privacy/security enclosure 2100 is closed and at least some portion of the latch 2125 can couple with the latch coupling 2140 to secure the bottom enclosure portion 2115 to the lid portion 2110. In some other embodiments, the latch 2125 can include other structures suitable for engaging and securing the bottom enclosure portion 2115 to the lid portion 2110, including conventional clips, magnetic latches, Velcro latches, etc.

Figure 22:
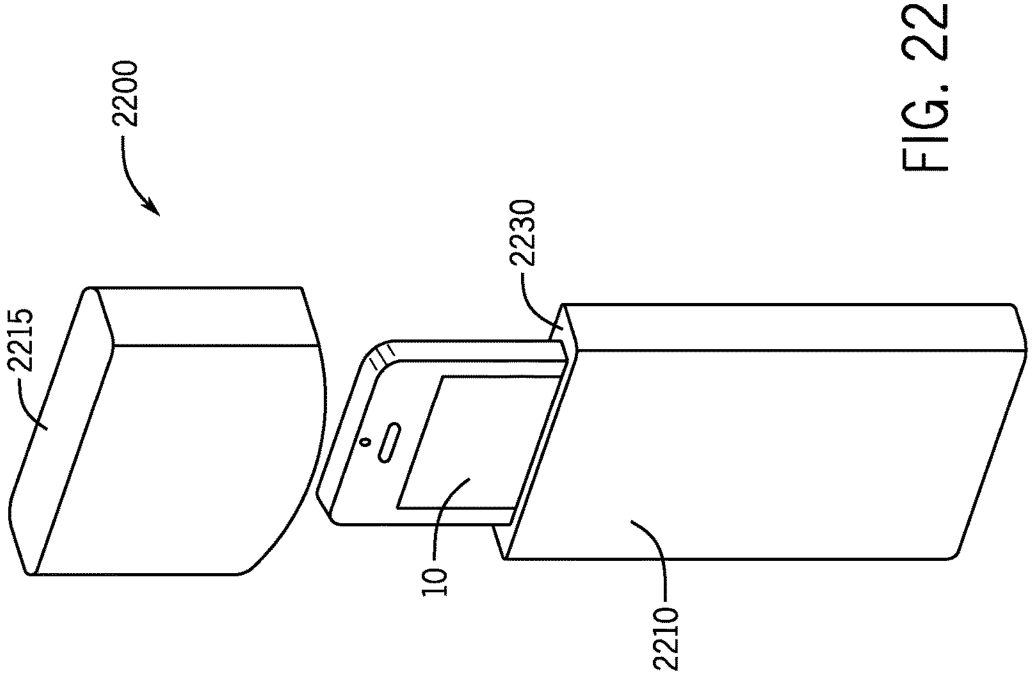
FIG. 22 is a perspective view of a privacy/security enclosure according to another embodiment of the invention.

Some embodiments include an alternative arrangement and geometry for providing a configurable privacy/security enclosure. For example, FIG. 22 is a perspective view of a privacy/security enclosure 2200 according to another embodiment of the invention. In some embodiments, the privacy/security enclosure 2200 can include a bottom enclosure portion 2210 including an inner region 2230, and a lid portion 2215 capable of being coupled to the bottom enclosure portion 2210. As depicted in FIG. 22, in some embodiments, the bottom enclosure portion 2210 and the lid portion 2215 can be separated with respect to each other. Moreover, as shown, in some embodiments, the privacy/security enclosure 2200 can include the bottom enclosure portion 2210 and a separate lid portion 2215 capable of being positioned and aligned to allow a user to close the privacy/security enclosure 2200 (to substantially enclosing a mobile or stationary communication device such as the device 10 shown) by sliding the lid portion 2215 onto the bottom portion 2210 (e.g., similar to the operation of a conventional memory stick enclosure). In some embodiments, a user can grasp the lid portion 2215 to slide off and remove the lid portion 2215 from the bottom enclosure portion 2210 so as to enable at least partial access to the inner region 2230 of the privacy/security enclosure 2200. As illustrated in FIG. 22, in some embodiments, the bottom enclosure portion 2210 can at least partially enclose and cradle a mobile or stationary communication device or devices (with upper portion 10 extending out of the inner region 2230). Moreover, in some embodiments, at least some portion of the mobile or stationary communication device can be enclosed by the bottom enclosure portion 2210 and at least some portion (an upper portion 10*a*) of the mobile or stationary communication device can extend outwardly and away from the bottom enclosure portion 2210 and into the lid portion 2110 when the lid portion 2110 is position coupled to the bottom enclosure portion 2210.

In some other embodiments, the bottom enclosure portions 2115, 2210 can be longer or shorter than shown. For example, in some embodiments, the bottom enclosure portions 2115, 2210 can be longer to enable a greater proportion of a mobile or stationary communication device to be enclosed and cradled, and to allow a lesser proportion of a mobile or stationary communication device to extend outwardly and away from the bottom portion. In some embodiments, this can provide a user or casual observer reduced access to one or more displays or one or more controls of one or more mobile or stationary communication devices. Conventional optical filters can also be used to limit casual observer observation in some embodiments.

In some other embodiments, at least a portion of the bottom portion or the lid portion of any of the privacy/security enclosures shown in FIGS. 1, 2, and 8A, and 10-12, can include an access window. In some embodiments, the access window can enable direct viewing access to the inner region of the privacy/security enclosure. In some other embodiments, the access window can comprise RF signal opacity. In some embodiments, one or more mobile or stationary communication devices can be positioned in the privacy/security enclosure so that any conventional antenna can be immediately adjacent to the access window. In some other embodiments, the access window can enable a user to access one or more controls of any mobile or stationary communication device within the privacy/security enclosure.

Some embodiments include an alternative arrangement and geometry for providing a configurable privacy/security enclosure. For example, in some embodiments, the privacy/security enclosure can include an inner region, capable of extending or retracting one or more mobile or stationary communication devices. In some embodiments, a device cradled within the inner region of the privacy/security enclosure can be extended out of the inner region and/or retracted into the inner region.

Some embodiments include other arrangements and geometry for providing a configurable privacy/security enclosure. In some embodiments, the lid portion can be a telescoping and retracting lid. For example, in some embodiments, the lid portions 115, 215 as shown in FIGS. 1 and 2 can comprise a telescoping and/or retractable lid. In this instance, at least a portion of the telescoping and/or retractable lid can be extended or retracted to at least partially cover or uncover the mobile or stationary communication device.

Some embodiments of the invention include an onboard power source. For example, in some embodiments, the privacy/security enclosure can include at least one power source capable of providing power to the privacy/security enclosure and/or one or more devices within the privacy/security enclosure. Some embodiments of the invention include a rechargeable and/or replaceable battery capable of powering enclosure components such as microcontrollers and processors, speakers, and sound drivers, one or more light sources (such as LED's), switches, power amplifiers, signal generators, and any of numerous other electronic components. Some embodiments of the invention include a rechargeable and/or replaceable battery or another rechargeable and/or replaceable power source such as a power storage capacitor. For example, in some embodiments, any one of the privacy/security enclosures described herein can comprise or include a rechargeable and/or replaceable battery or other rechargeable and/or replaceable power source capable of charging a user device while positioned in the privacy/security enclosure. In this example embodiment, power can be delivered by plugging into an external power socket such as a wall socket or a car adapter socket. Further, some embodiments include an onboard power source such as a rechargeable and/or replaceable battery or other power source (such as a power storage capacitor) as a sole power source that can be capable of charging a user device while positioned in the privacy/security enclosure. In this instance, the onboard power source can be capable of charging the user device and/or can be capable of powering the user device.

Any of the embodiments depicted in the figures and description above can include passive attenuation or at least partial blocking of at least one of RF, sound, and/or light as described earlier and/or signals detectable by sensors within targeted devices (e.g. gyroscopes, accelerometers, magnetometers, light sensors, proximity sensors, cameras, thermal sensors etc.) Some further embodiments can include an active/powered attenuating, at least partially blocking, interfering and/or masking of at least one of RF, sound, light and/or signals detectable by sensors within contained devices, some of which are illustrated in FIGS. 23A, 23B, 23C, 24A, 24B, 25A, 25B, 25C, 25D, 26A, 26B, 27A, 27B, 28A, and 28B, and FIGS. 29-33.

In some embodiments, the privacy/security enclosure includes at least one system capable of active/powered attenuation. In some embodiments, since regulatory requirements may not allow transmission of interfering RF signals at the desired level, positioning one or more RF transmitters along or inside of an RF shield may reduce transmissions to acceptable levels outside of the privacy/security enclosure. In some embodiments, while not a regulatory constraint, the same concept applies to active audio masking, with a benefit of any active audio transmission being less obtrusive because it is attenuated by the passive audio attenuation characteristics of the privacy/security enclosure.

In some further embodiments, the privacy/security enclosure can include at least one system capable of actively attenuating and/or substantially masking or blocking sound and/or vibration. Other embodiments include at least one system capable of passively or actively attenuating or substantially blocking video and/or video or imaging (e.g., by passively or actively blocking a video camera). Other embodiments include at least one system capable of passively or actively attenuating, confusing, altering or substantially blocking data gathered by other sensors contained on a device targeted/within the privacy/security enclosure including, but not limited to, sensors such as thermometers, motion sensors, compass, proximity sensors, magnetic sensors, gyroscopes, gravitational sensors, thermal imaging sensors, humidity sensors, barometric sensors, UV sensors, step counters, orientation sensors, gaming sensors, rotational sensors, molecular sensors, olfactory sensors, accelerometers and others.

In some embodiments, the privacy/security enclosure can actively substantially block or interfere with an electronic communication. For example, the electronic communication can comprise an RF signal (such as a cellular, WiFi, a GPS signal, and a Bluetooth® signal), and/or an RFID or other RF tracking device. In some other embodiments, the privacy/security enclosure can include a conventional RF jammer. In some embodiments of the invention, the privacy/security enclosure can include or comprise a rechargeable and/or replaceable battery enclosure capable of providing power to an RF jammer. In some embodiments, the privacy/security enclosure can passively and/or actively attenuate and/or interfere with or at least partially block substantially all RF transmission including, but not limited to, a zero generation wireless signal, a first generation wireless signal, a second generation wireless signal, a third generation wireless signal, a fourth generation wireless signal, a fifth generation wireless signal, a global positioning satellite signal, (such as "GPS" or "GLONASS"), a Bluetooth wireless signal, RFID electromagnetic radiation, a WIFI wireless signal, a two-way radio RF signal, a UHF or VHF signal (such as a citizen's band radio signal or other radio signal emitted from a 'walkie talkie' type device), high-speed and millimeter wave signals, and a near-field wireless signal. In some embodiments of the invention, the privacy/security enclosure can include at least one transmitter capable of emitting a blocking or interfering signal. In some embodiments, the blocking or interfering signal can be capable of attenuation, interfering with and/or at least partially blocking a signal from passing through the privacy/security enclosure, and can at least partially block, interfere and/or attenuate a signal confined to an area proximity of device, including inside and outside of the privacy/security enclosure. Further, in some embodiments, the privacy/security enclosure can at least partially block and/or attenuate a signal when the privacy/security enclosure is closed (i.e., when the enclosure is enclosing one or more user devices, or when the privacy/security enclosure is open). In some embodiments, the privacy/security enclosure can emit a blocking or interfering signal when the enclosure is open or when the enclosure is closed.

In some embodiments, noise and/or a ripple is added to the DC power supply or ground inside the communication device. Some embodiments can include capacitive, inductive coupling, antenna coupling, or direct connection introduction of noise. In some embodiments, single tone swept signal sources, band filtered white noise, multiple tones with modulation, or some combination of these techniques across some or all frequency bands can be used. In some embodiments, various tone types or noise sources (or combination thereof) can be generated in non-regulated frequency bands (or within the transmission limits of regulated frequency bands) such that the sources interweave to create interfering signals in restricted regulatory bands. In some embodiments, induced noise and/or a ripple can affect RF subsystems of some communication devices (e.g., such as the frequency synthesizers). In some embodiments, noise and/or a ripple is added that can defeat multiple DC regulators within the communication device.

Figure 23A:
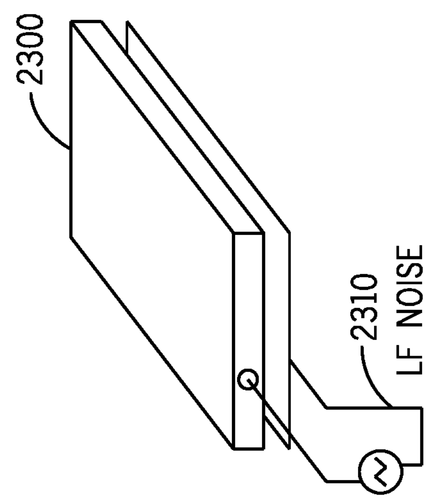
FIGS. 23A, 23B, 23C, 24A, 24B, 25A, 25B, 25C, 25D, 26A, 26B, 27A, 27B, 28A, and 28B illustrate active RF attenuating privacy/security enclosure devices in accordance with some embodiments of the invention.
Figure 23B:
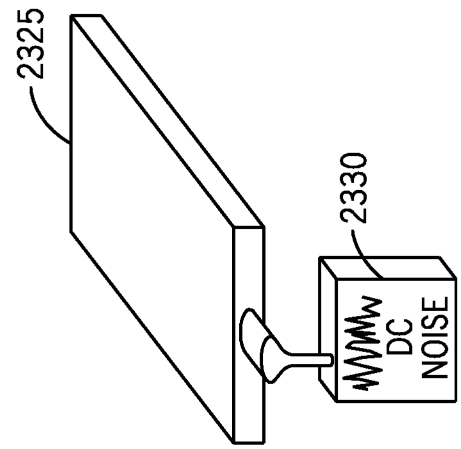
Figure 23C:
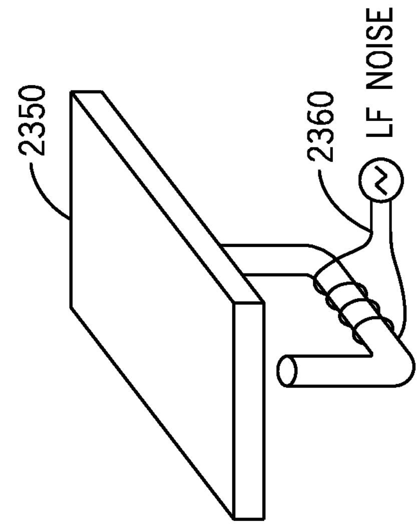

FIGS. 23A-23C illustrate an active RF attenuation privacy/security enclosure according to another embodiment of the invention. For example, some embodiments can include an interfering signal that can be coupled capacitively to the phone's circuits (e.g., FIG. 23A, showing privacy/security enclosure 2300 with active noise circuit 2310). In this instance, no wired electrical connection is needed in some embodiments. In some other embodiments, a ground connection can be made through the headphone jack or charging port (FIG. 23B, showing privacy/security enclosure 2325 with active noise circuit 2330). Some further embodiments can include an inductive interference of one or more circuits within the communication device (FIG. 23C with privacy/security enclosure 2350 and active noise circuit 2360). For example, in some embodiments, an interfering signal can be coupled inductively to the phone's circuits. In this instance, no electrical connection is needed, and various selected areas of the communication device can be targeted. In some other embodiments, a direct connection can relay an interfering signal via the charging port, test ports or multiple ports (headphone and charging port, battery contacts) of a communication device.

Figures 24A, 24B:
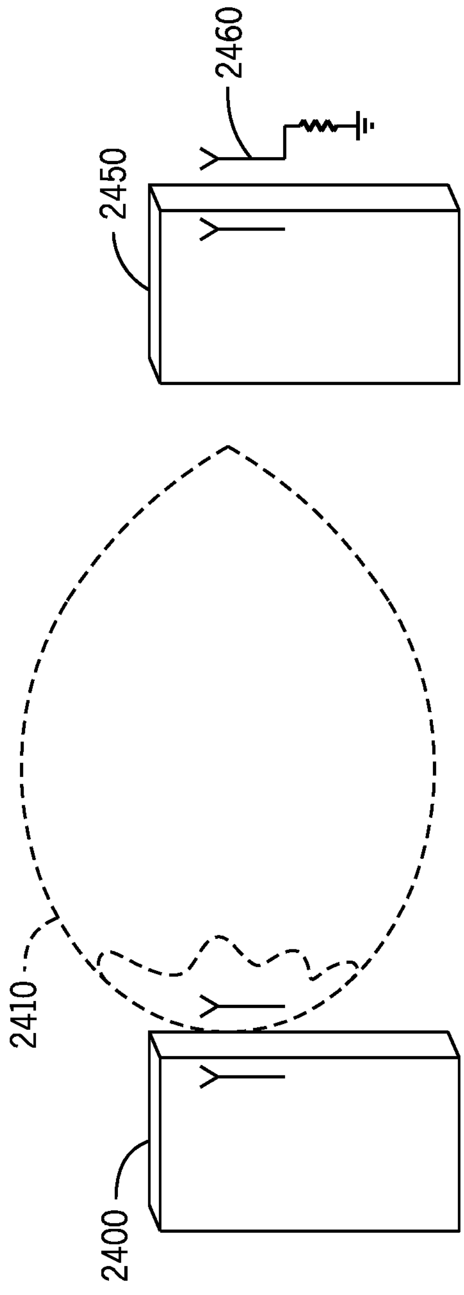
Figure 25A:
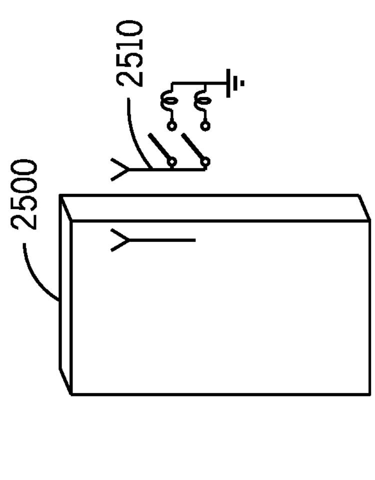
Figure 25B:
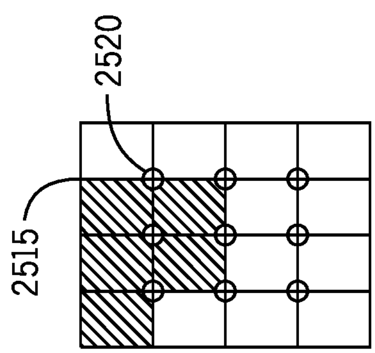
Figure 25C:
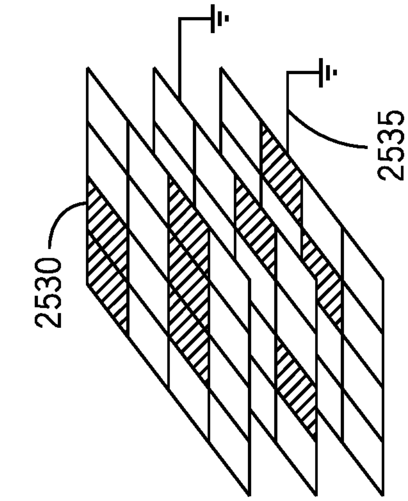
Figure 25D:
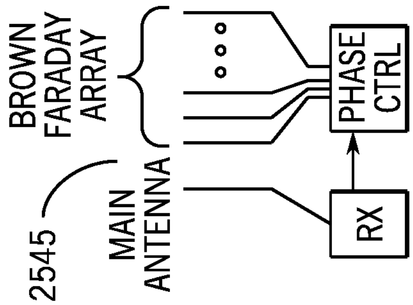

In some embodiments, passive components designed to alter a phone's antenna behavior are placed in strategic locations near the phone's antennas. For example, FIGS. 24A-24B illustrates an active RF attenuation using a device positioned adjacent to the phone. In this instance, the phone's antenna efficiency can be reduced so that reception and transmission of signals is disrupted. In some other embodiments, the active components can be positioned near the phone's antenna. For example, as illustrated in FIGS. 24A-24B, including user devices 2400 and 2450, in some embodiments, a parasitic antenna (2410 in FIG. 24A and 2460 in FIG. 24B) can be placed near the phone's antenna (s). In this instance, the parasitic antenna can couple with the phone's antenna. In some embodiments, the parasitic antenna can at least partially change the resonant frequencies and circuit matching of the phone's antenna, and the parasitic antenna can intercept RF power and channel it into a resistor. Some embodiments include a movable/switchable antenna. For example, in some embodiments, in order to disable or enable individual phone functions at will, an external antenna system can be either electrically controllable, or physically moveable so that its functionality can be turned on or substantially turned off.

Some embodiments include the addition of electronic switches or phase shifters that allow more complex antenna structures to be configurable electronically. As depicted in FIGS. 25A-25D, showing systems 200, 2515, 2530, and 2545, in some embodiments, the resonant frequency, spatial layout, and directionality of the phone's antenna can be controlled automatically. In this instance, individual phone systems can be affected, and can provide the ability optimize and/or enhance the antenna's attenuation in a given direction. In some embodiments, a parasitic antenna can be switchable (e.g., electronically), and a parasitic antenna can be tuned for various frequency bands (device 2500 including switchable antenna 2510, shown as antenna 2515 with switch 2520 in FIG. 25B). In some further embodiments, an array of antenna elements (shown as 2545 using the array 2530 shown in FIG. 25C with one or more antennas 2535) can be electrically reconfigured or tuned in order to vary its effect on the phone.

Figure 26A:
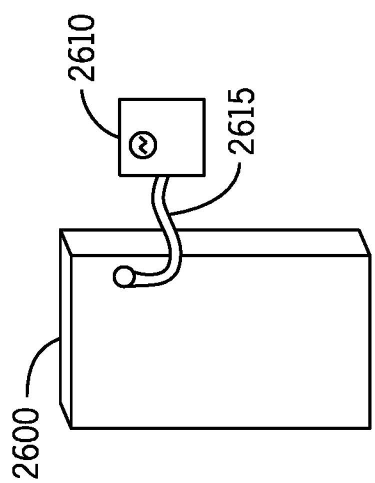
Figure 26B:
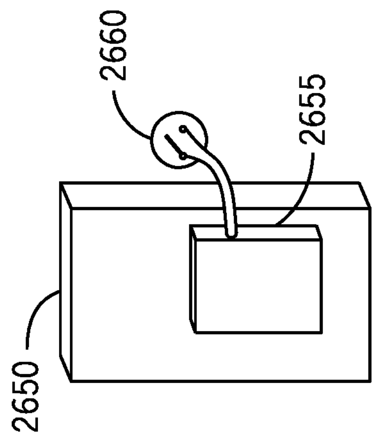

In some embodiments, one or more features of one or more communication devices can be modified. For example, FIGS. 26A-26B illustrate an active RF attenuation privacy/security enclosures 2600, 2650 according to another embodiment of the invention. In some embodiments, an internal RF test port can be used to directly introduce RF signals into one or more receivers of the device (shown as 2610 coupled through port 2615). In some further embodiments, it can be possible to attenuate a received signal by shorting the internal antenna lead at a test port. In some embodiments, it can be possible to connect to RF test points inside the device. For example, in some embodiments, an external RF interference generator can be directly connected to a phone's RF subsystem via a cable that, in some embodiments, can reduce the amount of radiated interference (shown as 2655 with switch 2660). Some further embodiments include modification of the battery of the device to ensure that the device is powered off when desired.

Figure 27B:
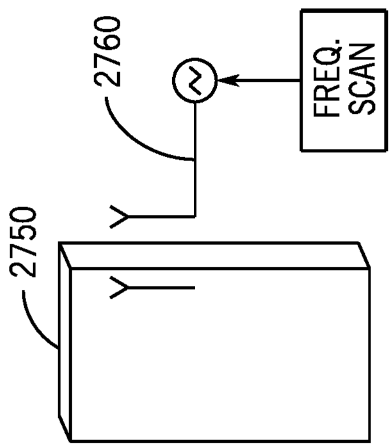
Figure 27A:
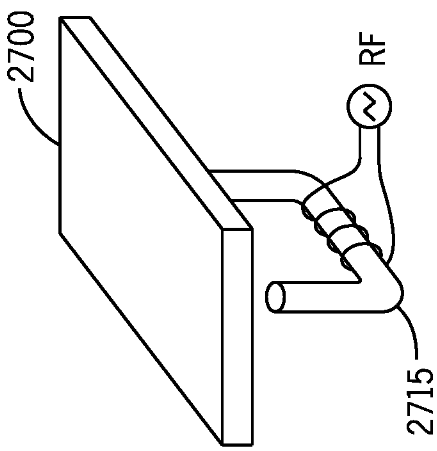

Some embodiments include inductive coupling interference directly into critical circuits inside the communication device. For example, FIGS. 27A-27B illustrate an active RF attenuation privacy/security enclosures 2700, 2750 according to another embodiment of the invention. Using the circuit 2715, it can be possible transmit RF interference through the phone's antenna. In some embodiments, this can be achieved by adding an electromagnetic structure outside the phone. This structure can induce concentrated and targeted RF interference into vulnerable circuits in the phone. In some further embodiments, an antenna coupling can be utilized to disrupt one or more functions of a communication device. For example, in some embodiments, RF interference can be injected into the phone via an external antenna (shown as 2760 in FIG. 27B) that is designed to optimize coupling to the phone's internal antenna. In some embodiments, inductive coupling is likely to cause less electromagnetic interference than antenna coupling.

Figure 28B:
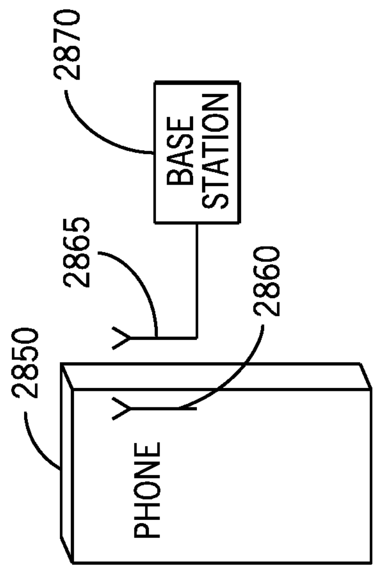
Figure 28A:
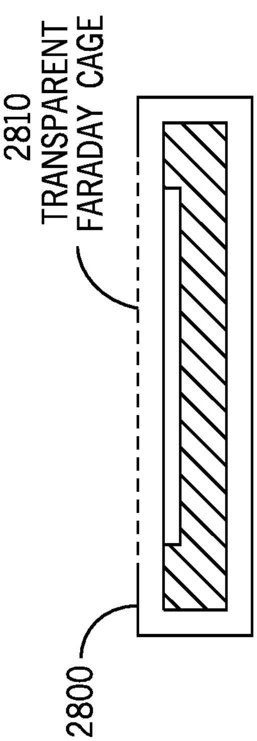

Some further embodiments can include the use of a transparent Faraday cage (e.g., as depicted in FIG. 28A showing privacy/security enclosure 2800 including transparent Faraday cage 2810). Referring to FIG. 28B, in some further embodiments, the privacy/security enclosure 2850 can include a very low power base station 2870 coupled to external antenna 2865, and transmitting to/from antenna 2860, which in some embodiments can prevent the communication device from logging or connecting to actual base stations.

Some embodiments include an option to enhance communication when the privacy/security enclosure and/or any enclosed user device is not in a blocking mode. In some embodiments, the privacy/security enclosure and/or the user's device(s) can be controlled to enable or disable communication of RF, sound, and/or light or other signals detectable by sensors within the targeted device. In some embodiments, these features can be activated directly by a control on or within the privacy/security enclosure and/or within the user's device(s), or by a remote device.

Further, in some embodiments, the privacy/security enclosure can include an option to selectively at least partially block or unblock one or more communication frequencies. In this instance, the communication frequency can be an RF frequency, an audio frequency, or a light frequency. In some embodiments, the privacy/security enclosure and/or the user's device(s) can be controlled to partially or substantially fully enable or disable communication of one or more frequencies of RF, sound, light and/or other signals detectable by sensors within the targeted device(s). In some embodiments, these features can be activated directly by a control within the privacy/security enclosure, and/or on or within the user's device, or by a remote device. In some embodiments, attenuation and/or masking and interference of all RF, sound, and/or light frequencies can be turned off or turned on. Further, in some embodiments, frequency selection can be used to control the passage and emission of RF, sound or light frequencies to and from the enclosed user device(s) without affecting other internal functions of the user device (e.g., no disruption of internal function of devices such as smart phones, tablets, or laptops are affected, and calendars, MP3 players, readers, apps, games etc. that do not require the interfered with, masked or blocked signal to function), while positioned within an inner region of the privacy/security enclosure.

Some embodiments of the invention include one or more systems to measure ambient field levels. For example, in some embodiments, ambient field levels of RF, sound, and/or light can be measured for purposes of actively interfering with, masking or blocking RF, sound or light. In some embodiments, measurements can be made by at least one component of the privacy/security enclosure and/or by one or more user devices coupled to the privacy/security enclosure. In some embodiments, ambient field levels can be provided as a function of strength of various frequencies.

In some embodiments, the privacy/security enclosure can include at least one active interfering, masking and/or blocking control of RF, sound and/or light or other signal whose output is impacted by one or more variables provided by one or more systems to measure ambient field levels. For example, in some embodiments, ambient field levels of RF, sound, and/or light can be measured for purposes of actively interfering, masking and/or at least partially blocking RF, sound or light at an interfering, masking and/or blocking power level required for a specific effect.

In some further embodiments of the invention, a privacy/security enclosure can comprise at least one component or device for active blocking of video devices. For example, in some embodiments, the privacy/security enclosure can include at least one device capable of blinding a camera to prevent unauthorized view. In some embodiments, the privacy/security enclosure can include at least one light source capable of overdriving a camera and/or imaging chip. For example, in some embodiments, at least one light emitting diode can be configured to overdrive an imaging device of a user's device(s) with the privacy/security enclosure. In other embodiments, other light or optical sources can be used to blind and/or overdrive an imaging device.

Figure 29:
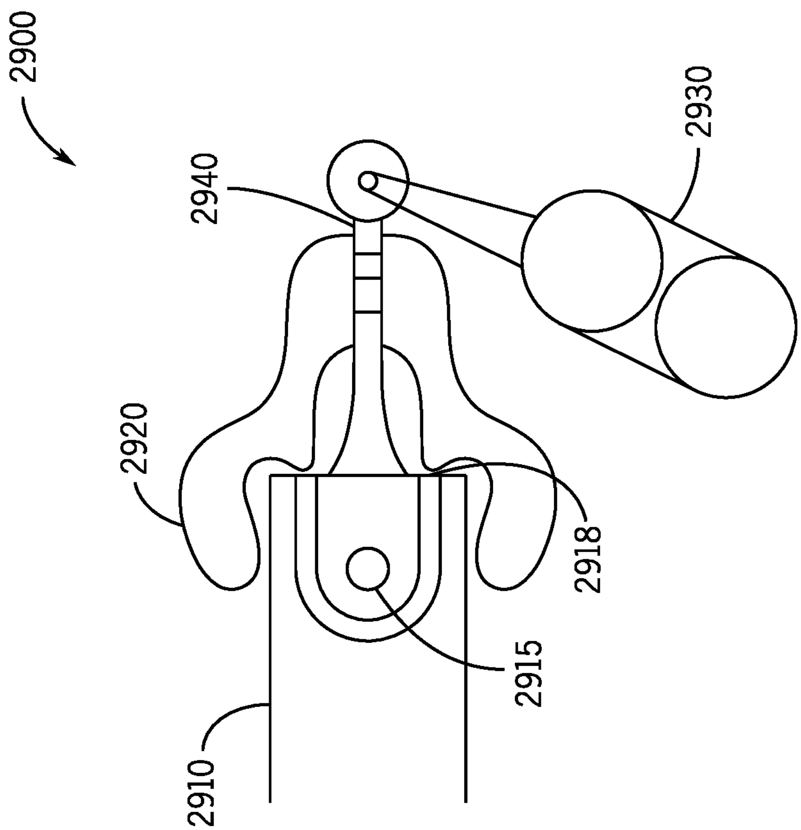
FIGS. 29, 30A-30B, 31-32, and 33A-33B illustrate active acoustical attenuating privacy/security enclosure devices in accordance with some embodiments of the invention.

Some embodiments can include active attenuating, interfering, masking and/or substantially blocking of sound. Further, in some embodiments, active attenuation can be configured to modify how sound is received, processed, and transmitted by the communication device. For example, FIGS. 29, 30A-30B, and 31-33 illustrate active acoustical attenuating privacy/security enclosure devices in accordance with some embodiments of the invention. For example, some embodiments can de-correlate the pressure the microphones see from the sound pressure created by the speech that has to be masked. For example, as shown in FIG. 29 depicting the system 2900, in some embodiments, a sealing gasket 2920 can be installed around each microphone 2915 that creates a sealed chamber 2918 around each microphone 2915. In some embodiments, a gasket or enclosures/shield attached to the gasket can be equipped with at least one speaker in order to generate a masking sound. In some further embodiments, a pneumatic piston 2940 coupled to a motor 2930 can be used. For example, in some embodiments, a gasket 2920 is installed around each microphone 2915 that can create a sealed chamber around each microphone 2915. In some embodiments, each chamber created in part by the gasket 2920 can be coupled to or equipped with a pump that can pressurize and/or depressurize the microphone chamber, thereby degrading microphone capability/performance.

Figure 30B:
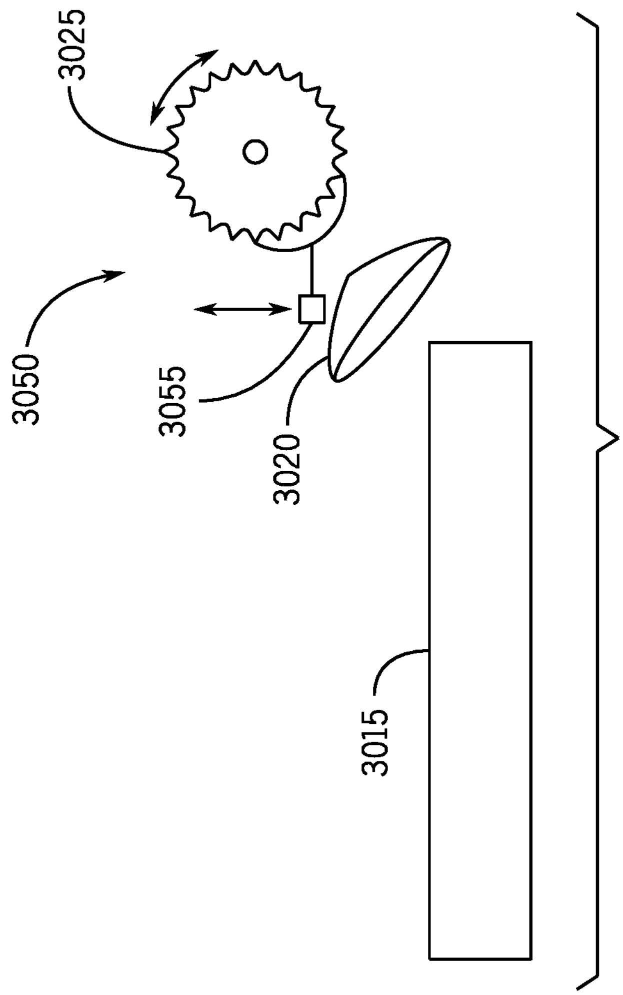
Figure 30A:
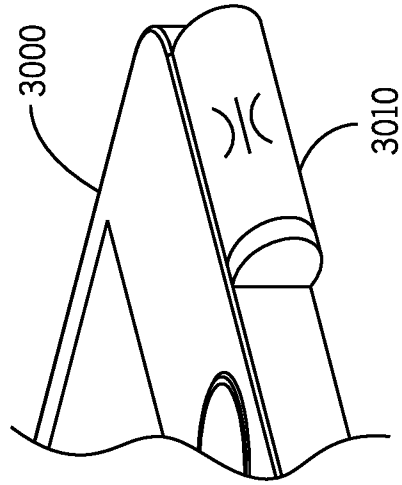

Some embodiments of the invention can utilize parasitic noise. For example, FIG. 30A illustrates an active acoustical attenuation privacy/security enclosure 3000 according to another embodiment of the invention. In this instance, mechanical motion can be used to create a noise that will be superimposed to the speech that has to be masked. If the level of this parasitic noise is high enough compared to the speech level, the resulting sound will not be understandable. The parasitic noise can be induced using a variety of methods. For example, in some embodiments, a vibrator 3010 can be leaned against the phone (e.g., close to each microphone) and a parasitic sound can be produced by vibration of the vibrator through impacts against a surface coupled to the microphone. Referring to FIG. 30B, in some further embodiments, a cymbal or a bell assembly 3050 can be used adjacent to the microphones. In this instance, sound can be directed to the microphone (within privacy/security enclosure 3015) from the cymbal or a bell 3020 and/or from sound produced by impact of the cymbal or a bell with an adjacent structure 3055. In some further embodiments, the vibrator can be an electromechanical component (piezoelectric actuator) or a clock-style wind up mechanism (shown as 3025). In some other embodiments, the vibrator can be a brush with multiple hairs that are pushed and rotated against a hard surface to create multiple friction sounds.

Figure 31:
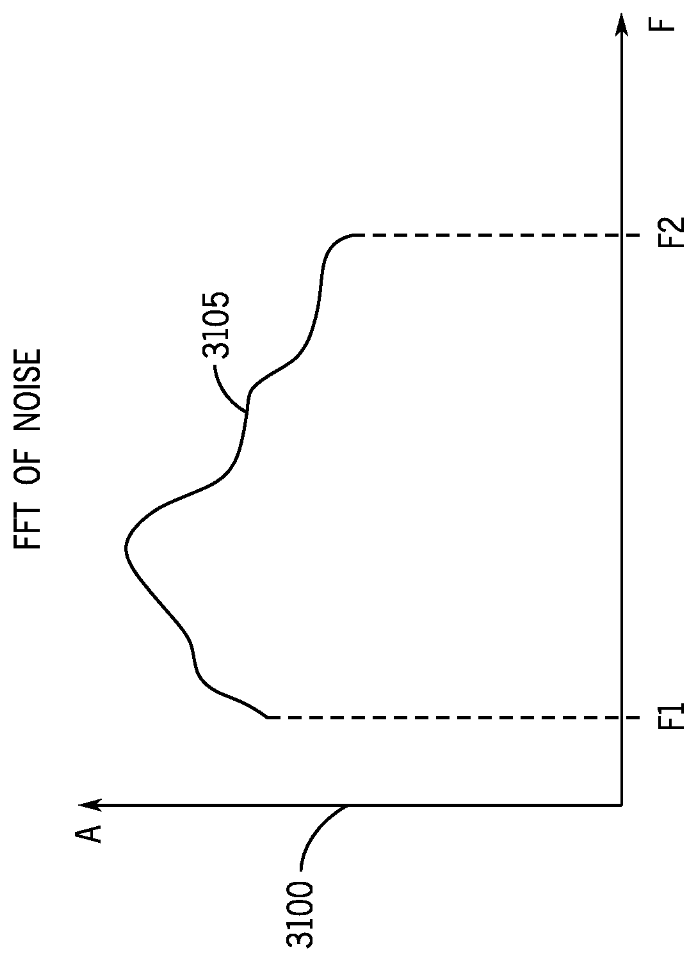

Some embodiments of the invention can deploy electrically produced noise. Some embodiments can use electrically produced noise (via a speaker for example) to mask the sound picked up by the microphone. For example, some embodiments include a chirp or warble noise that can be a single tone with a frequency that evolves with time (see for example FIG. 31 showing a plot 3100 including noise profile 3105). Some other embodiments can include an envelope of noise, where the noise's frequency content is shaped to the typical human speech frequency content in order to efficiently mask it. Some embodiments include a self-babble. In this instance, speech is recorded with the enclosure, then processed (played backwards, mixed, filtered, etc.). Some further embodiments include a speech shaped noise. In this instance, the noise's frequency content is real-time amplitude shaped to the speech to match in order to efficiently mask it. Some other embodiments include saturating noise. In this instance, a single frequency tune is played at the most sensitive frequency of the microphones in order to saturate the signal.

Figure 32:
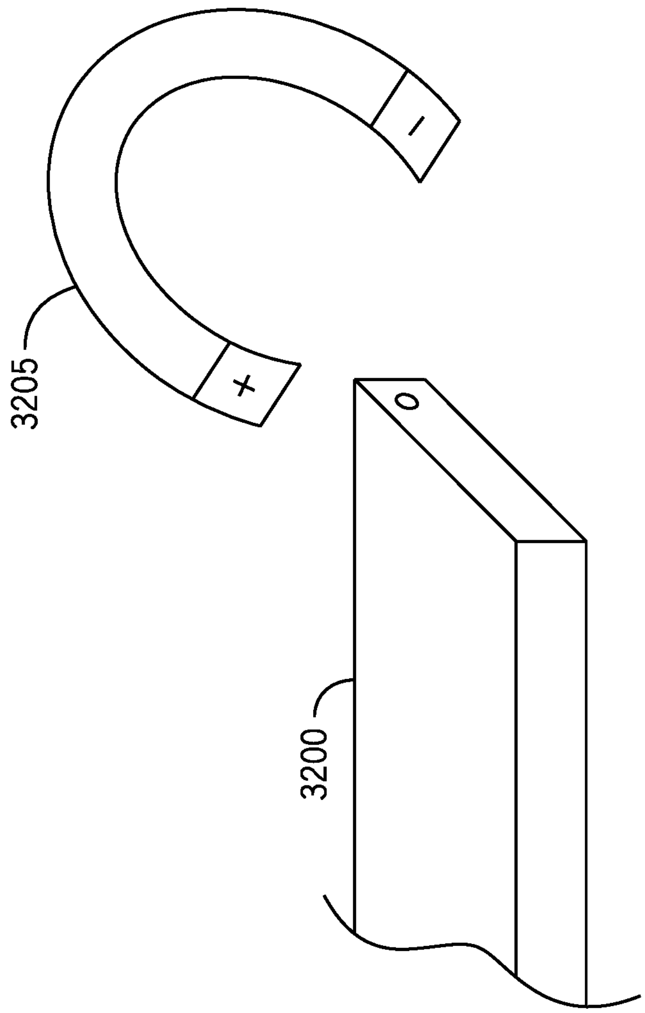

Some embodiments include an electromagnetic source to produce a parasitic signal close to the phone (source 3205 directed to privacy/security enclosure 3200 depicted in FIG. 32). This signal will induce an electrical signal in the system which will be superposed to the electrical signal given by the microphones (depending on the susceptibility of the system).

Figure 33B:
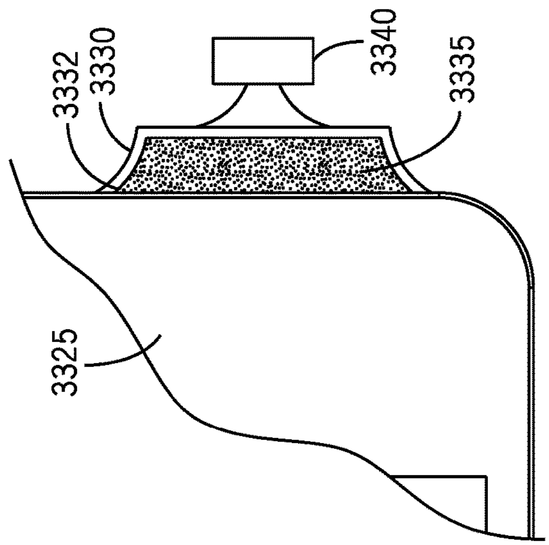
Figure 33A:
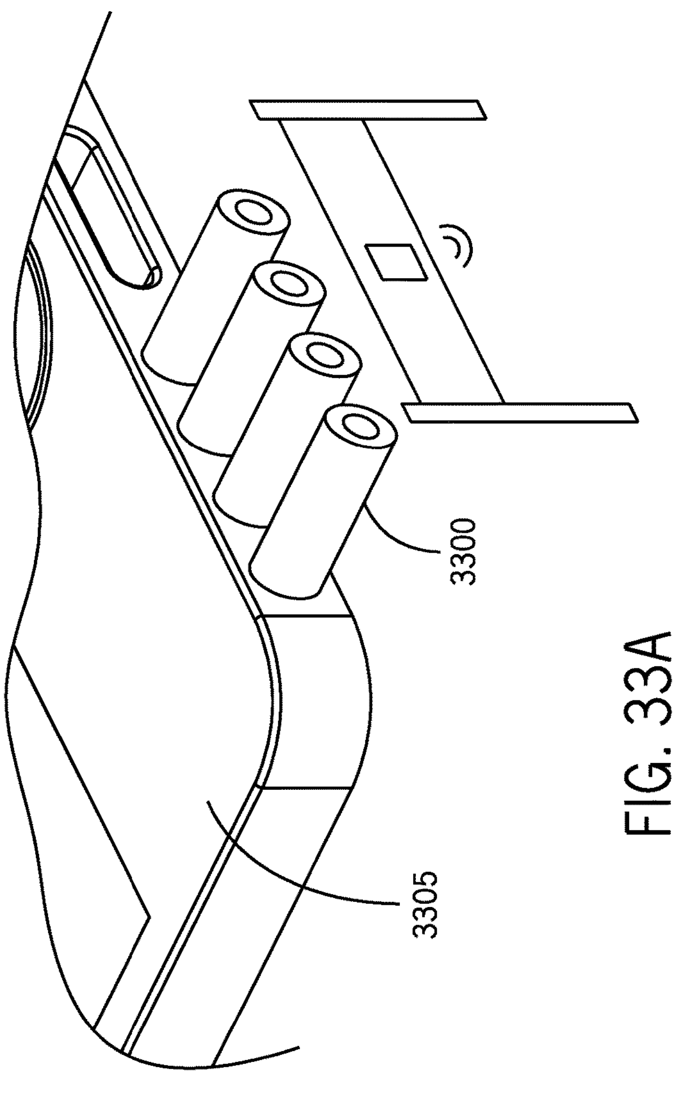

In some further embodiments, a physical barrier can be used to attenuate sound. For example, FIG. 33A-B illustrates active acoustical attenuation privacy/security enclosures 3300, 3325 according to another embodiment of the invention. Referring to FIG. 33A, in this example, a physical shield 3300 can be positioned very close the microphones in order to attenuate the sound and pressure at the microphones. In some embodiments, the physical barrier can comprise a switchable shield. In this example, a shield can be mounted on rails, and can be placed in front of the microphones whenever sound masking is required. Some embodiments can include a horn, or trumpet, or pipe shaped shield. In this example, a shield is shaped to attenuate external speech signal and to amplify a generated parasitic signal. Some other embodiments can include an audio conductive material. Referring to FIG. 33B, showing a cross-section of a privacy/security enclosure 3325, in some embodiments, a conduit 3330 can be installed between an additional speaker and the microphones. The conduit 3330 can be filled with a sound conductor, and one of its extremities can be mechanically coupled to the speaker 3340. The other extremity can be placed as closed as possible to the microphones of a user's device within the privacy/security enclosure 3325 in order to deliver a parasitic sound as efficiently as possible. The shell 3332 of the conduit 3330 can act as a physical shield, while the sound conductor material 3335 can act as an amplifier for the parasitic sound. In this instance, the sound conductor 3335 can be aluminum, brass, glass, or other material that can conduct sound to a greater degree than air.

Figure 34C:
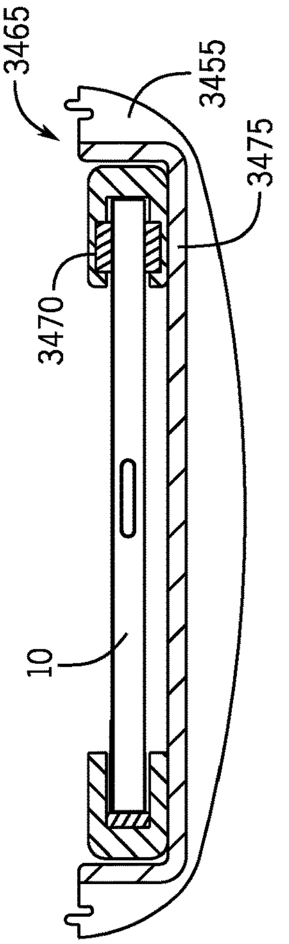
FIGS. 34A-34D depict assembly and perspective views of a sock assembly and components for a privacy/security enclosure in accordance with some embodiments of the invention.
Figure 34A:
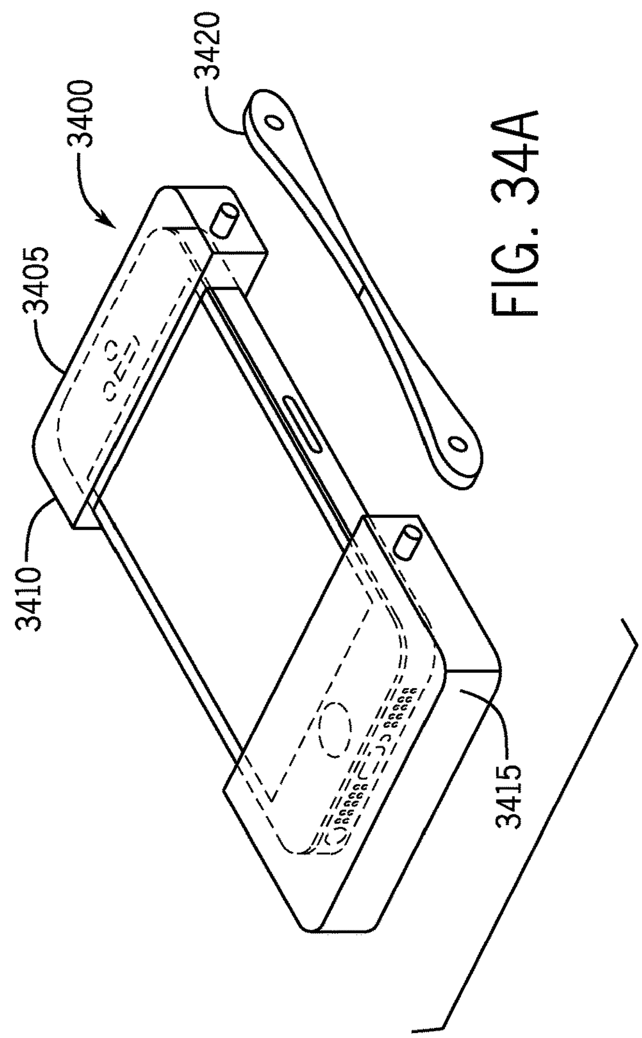
Figure 34B:
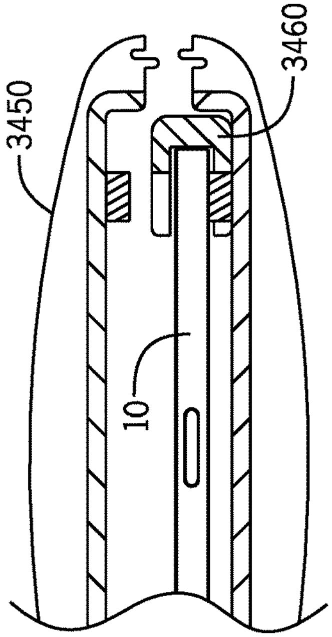
Figure 34D:
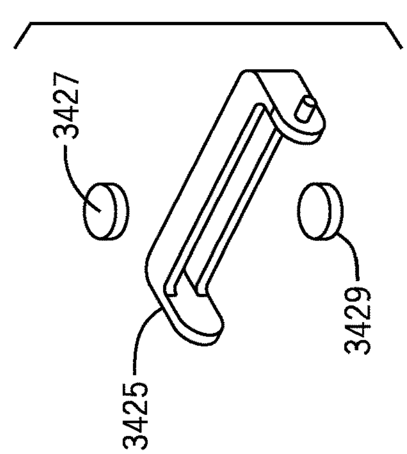
Figure 35:
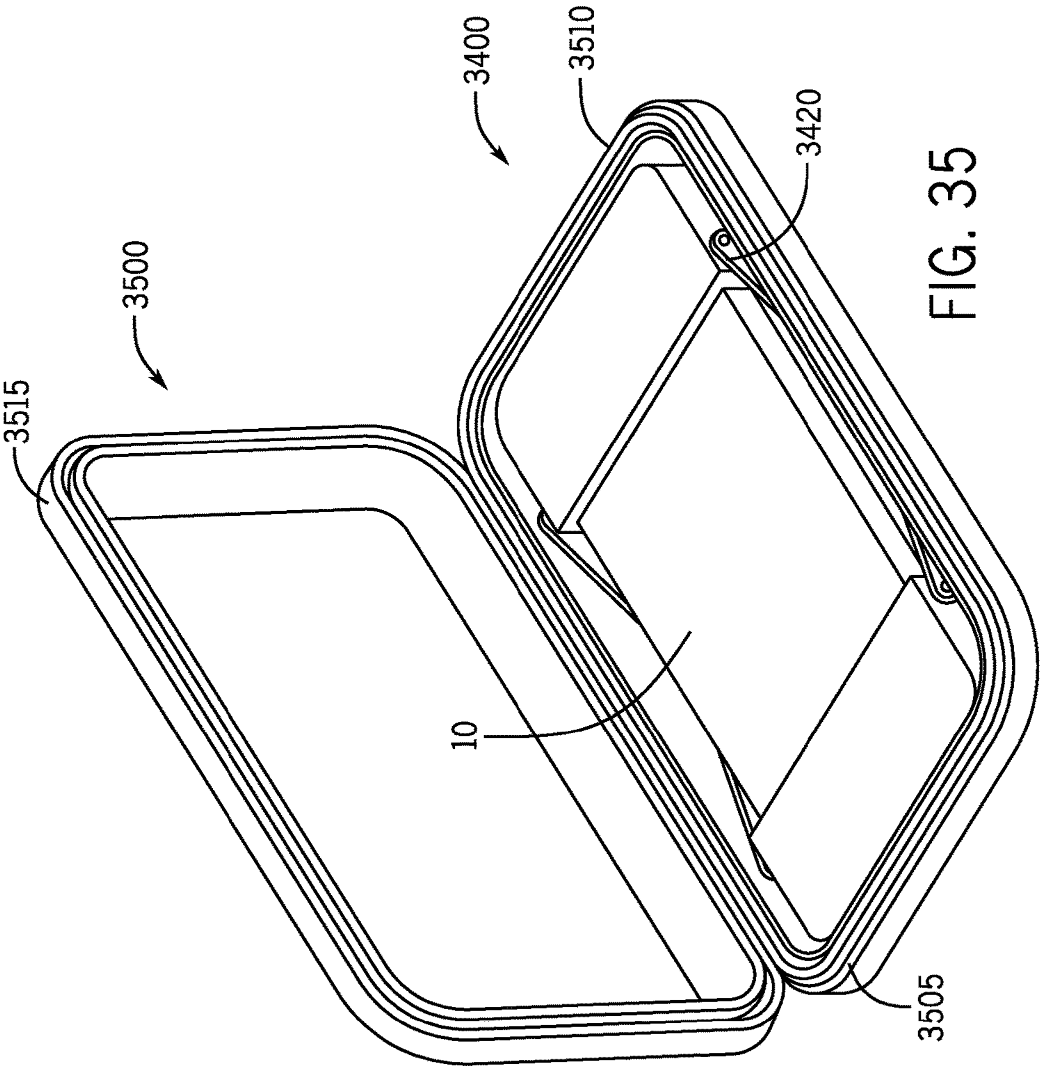
FIG. 35 depicts the sock assembly of FIGS. 34A-34C within a privacy/security enclosure in accordance with some embodiments of the invention.

In some embodiments, an assembly of acoustical attenuation covers can form an envelope covering a portion of one or more communication devices (such as a smart phone). For example, some embodiments can comprise a sock-like enclosure that can cover all or a partial portion of one or more communication devices. In some embodiments, the sock-like enclosure can include or be coupled to one or more acoustical attenuation materials or structures capable of muffling one or more microphones within the communication device. For example, FIGS. 34A-34D illustrates assembly and perspective views of a sock assembly 3400 and components for a privacy/security enclosure in accordance with some embodiments of the invention, and FIG. 35 depicts the sock assembly 3400 of FIGS. 34A-34C within a privacy/security enclosure 3500 in accordance with some embodiments of the invention. For example, FIG. 34A depicts a sock assembly 3400 including an enclosure 3405 comprising a base cap 3415, hood cap 3410, and a strap 3420 for coupling the caps 3415, 3410. FIG. 34B shows a cross-section of a privacy/security enclosure 3450 that includes a sock assembly portion 3460 supporting a user device 10, and FIG. 34C shows a cross-section of a privacy/security enclosure 3465 including an enclosure 3455 that includes a sock assembly portion 3475 including blocking foam pads 3470 supporting a user device 10. In some embodiments, the end cap assembly 3425 including upper and lower blocking foam pads 3427, 3429 shown in FIG. 34D can be used for sock assembly portion 3460 shown in FIG. 34B and/or sock assembly portion 3475 shown in FIG. 34C. Referring to FIG. 35, the privacy/security enclosure 3500 is shown comprising 3505 including a base portion 3510 and lid portion 3515. The sock assembly 3400 is shown position in the base portion 3510 of the privacy/security enclosure 3500 enclosing user device 10.

Some embodiments of the invention can comprise a double sock design that uses two end covers that are connected with an elastic band. Further, in some embodiments, the upper and/or lower sock covering can apply blocking material (such as a foam material) against microphone ports covered by or adjacent to the respective sock. In this instance, an axial force applied by the elastic band and the upper sock can force the blocking material against the lower microphone port to increase sound attenuation. In other embodiments, the axial force applying the blocking material to microphones covered by or adjacent to a respective sock can be generated by springs, friction springs, ratchets, or any of a variety of other mechanisms. In some further embodiments, the upper sock or interior linings or other portions of the interior of the enclosure (or blockers attached to or part of the base or lid of the enclosure) can apply the blocking material to one or more microphone ports located on the top and bottom of the enclosed device(s). In this instance, the sock assembly enclosing one or more communication devices can float inside the enclosure or can include clearance holes. In this instance, blocking material pads located on the top and bottom covers can squeeze the phone between the privacy/security enclosure halves only when the privacy/security enclosure is closed, nearly closed or when the sock is in a down position (regardless of the open/close status of the enclosure itself). Moreover, in this configuration, the upper and lower sock can provide vibration isolation to one or more enclosed communication devices.

Figure 36:
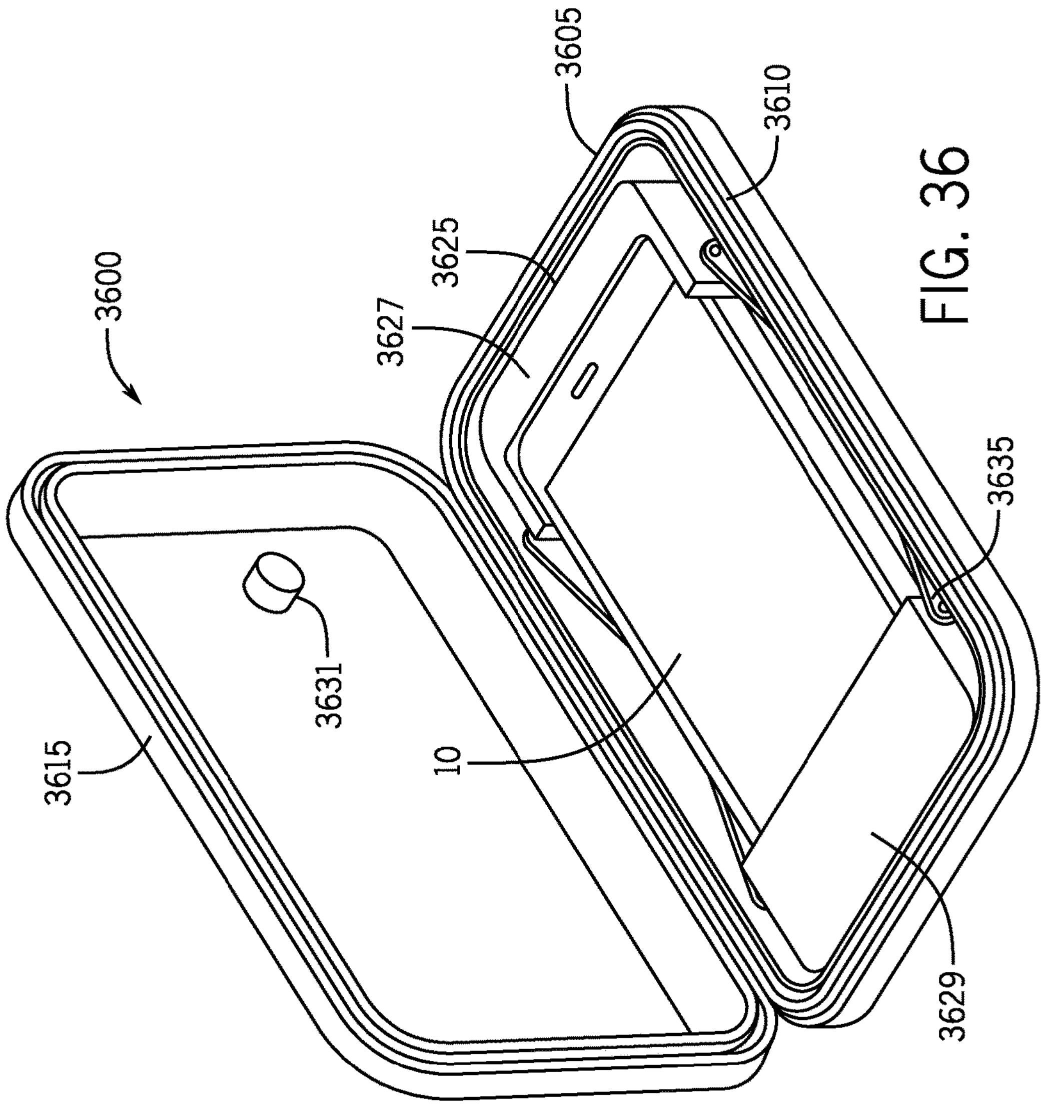
FIG. 36 depicts another embodiment of a sock assembly within a privacy/security enclosure in accordance with some embodiments of the invention.

In some embodiments, the sock-like enclosure can comprise a single piece, and in other embodiments, the sock-like enclosure can comprise a plurality of coupled pieces. Some embodiments can include one or more gaps or apertures in the sock. In some embodiments, the sock-like enclosure can include portions that are disposable or re-useable. In some embodiments, various portions of the sock-like enclosure can be approximately equal in size. In other embodiments, portions of the sock-like enclosure can be smaller or larger than other portions. For example, FIG. 36 depicts another embodiment of a sock assembly 3625 within a privacy/security enclosure 3600 in which the upper sock portion (shown as 3627) has a reduced size over the example provided in FIGS. 34A-34D and 35. This example embodiments shows the privacy/security enclosure 3600 comprising a main housing 3605 including a base portion 3610 coupled to a lid portion 3615. The sock assembly 3625 is shown enclosing a user device 10 and positioned in the base portion 3610. In this instance, the smaller upper sock portion 3627 can apply clamping force to the lower microphone blocking foam (not shown), and in some embodiments, can be positioned in the privacy/security enclosure so that the blocking foam pads in the two enclosure portions (i.e., halves) can be positioned against the front and rear microphone ports on the communication device (i.e., such as on an Apple iPhone (ID). In this example, the upper blocking foam pad 3631 is shown coupled to the lid portion 3615, and can be positioned to couple or cover a microphone of the user device 10 when the lid portion 3610 is closed. iPhone® is a trademark of Apple Inc., registered in the U.S. and other countries.

Figure 37C:
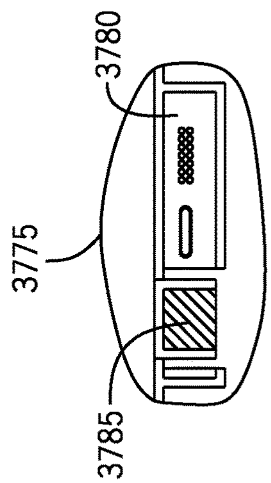
FIGS. 37A-37C depicts a gel-piston assembly for acoustical control within a privacy/security enclosure in accordance with some embodiments of the invention.
Figure 37B:
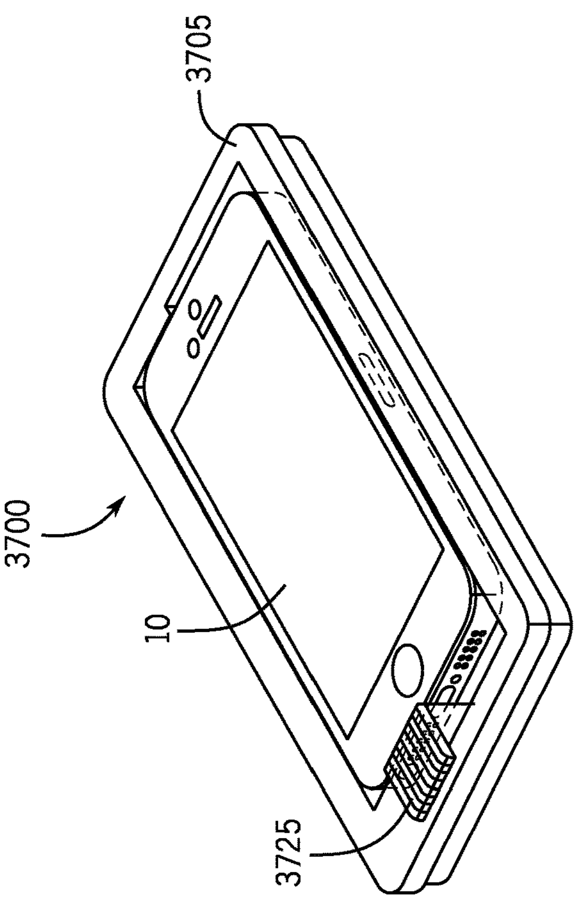
Figure 37A:
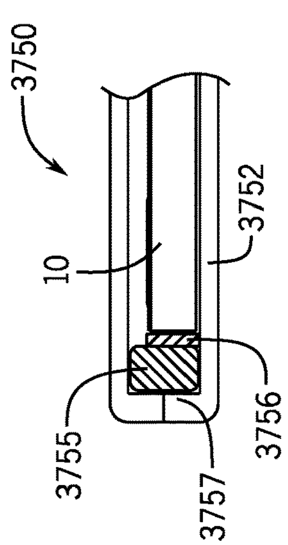

Some embodiments of the privacy/security enclosure can include other vibration and/or acoustical attenuation materials such as gels and gel-like materials. For example, FIGS. 37A-37C depict a gel-piston assembly for acoustical control within a privacy/security enclosure 3700 in accordance with some embodiments of the invention. In some embodiments, the privacy/security enclosure 3700 (shown as including main housing 3705 enclosing user device 10) can include a gel-like material 3725 constrained on at least five sides which, when deformed by the top enclosure half during closure, can press blocking foam against the bottom microphone port. In some embodiments, the gel-like material 3725 can be gel like in that it is incompressible, cohesive, viscous, and mechanically robust, capable of repeated opening and closing operations of the privacy/security enclosure. This can allow the gel-like material 3725 to perform its own foam retraction function when the privacy/security enclosure is opened. For example, in some embodiments, the user can set the phone in a pocket with clearance, and the gel-like material 3725 can then remove that clearance and compress the blocking foam when the enclosure is closed. FIG. 37B shows a cross-sectional view of a privacy/security enclosure 3750 including the gel-like material portion 3755 coupled at an interface 3756 with an end of the user device 10 and an interface 3757 at the end of the main housing 3752.

Figure 38C:
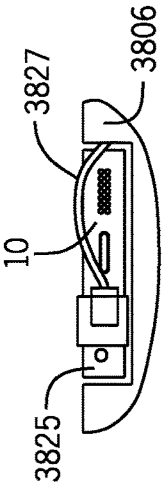
FIGS. 38A-38C depict a cover actuated acoustical control assembly in accordance with some embodiments of the invention.
Figure 38A:
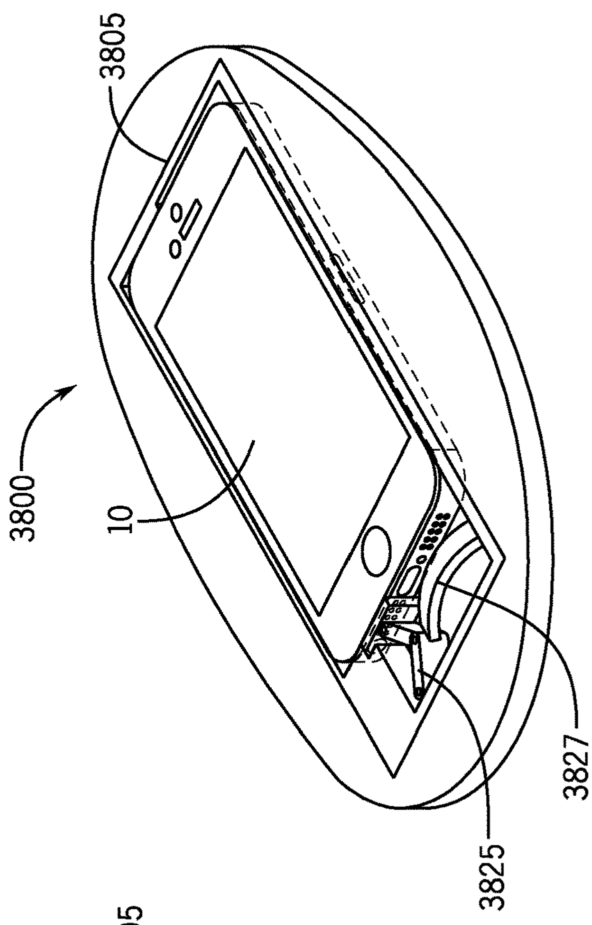
Figure 38B:
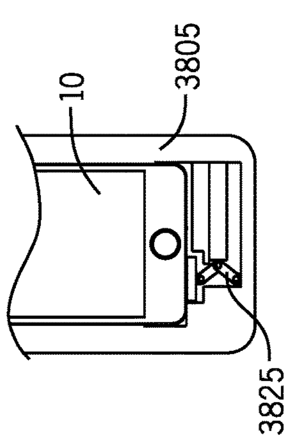

Some embodiments include other mechanical assemblies to assist in one or more sealing operations within the privacy/security enclosure. For example, FIGS. 38A-38C depict a cover actuated acoustical control assembly 3800 in accordance with some embodiments of the invention. FIG. 38*a* shows a perspective view of the cover actuated acoustical control assembly 3800 with a main housing 3805 enclosing a user device 10. In this example embodiment, a privacy/security enclosure 3800 cover mechanism 3825 can comprise a leaf spring or two-link assembly 3827 which can be displaced in a downward direction by the closing upper portion of the privacy/security enclosure (not shown). FIG. 38B shows a partial front view of the privacy/security enclosure 3800 cover mechanism 3825, and FIG. 38C shows a partial cross-sectional view of the privacy/security enclosure 3800 cover mechanism 3825. In some embodiments, the structure can act on another leaf or linkage pair to translate the lateral force to a longitudinal force thus removing clearance between the communication device and blocker, and can apply sealing force against the bottom microphone port. In some embodiments, the privacy/security enclosure cover mechanism 3825 can comprise a leaf spring or two-link assembly 3827 which can include a controllable stroke. In some further embodiments, the privacy/security enclosure cover mechanism 3825 can comprise a leaf spring or two link assembly 3827 which can include force cover actuation or a user button actuation.

Figure 39C:
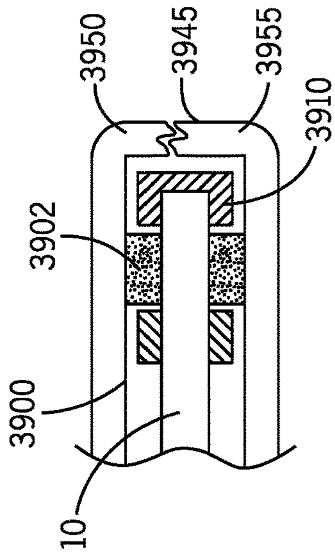
FIGS. 39A-C show different views of a mechanized foldable sock assembly for a privacy/security enclosure in accordance with some embodiments of the invention.
Figure 39A:
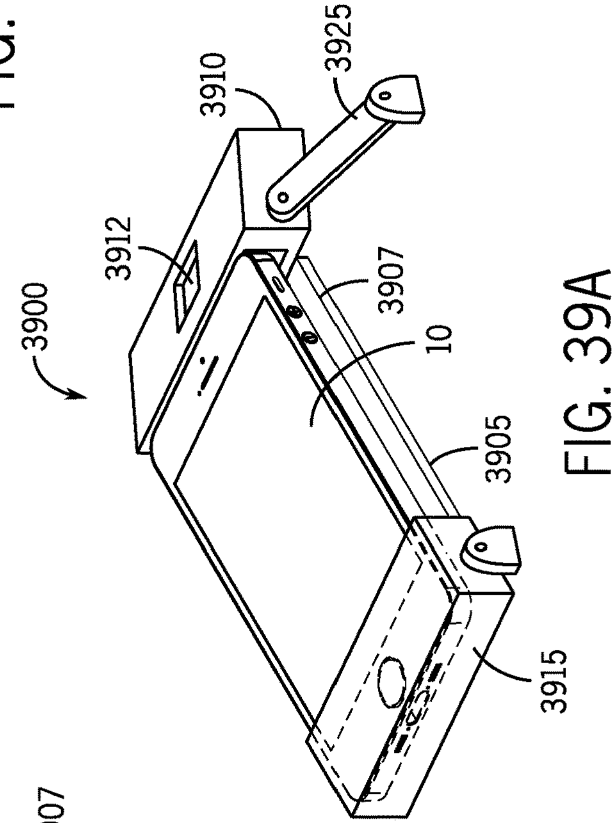
Figure 39B:
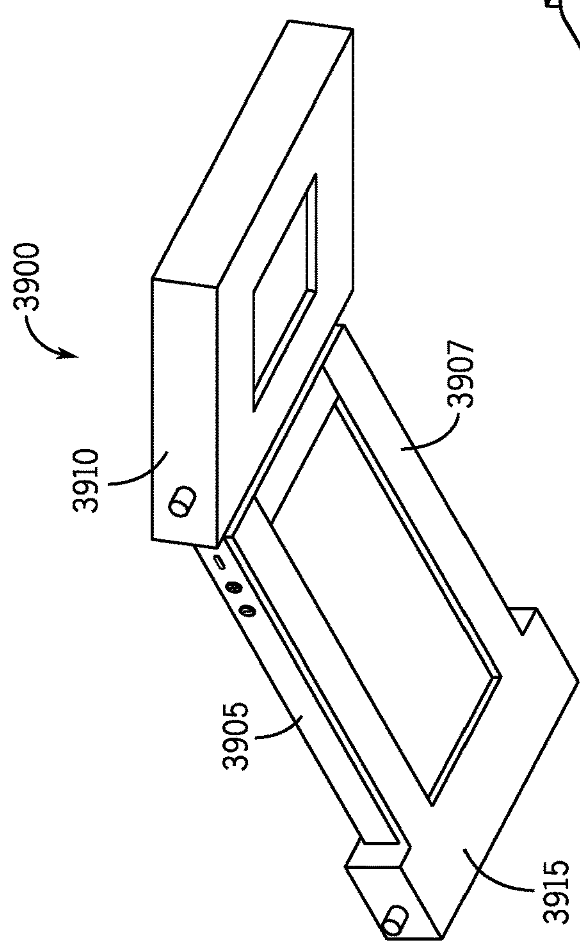

In some embodiments, the privacy/security enclosure can include at least one sock-like enclosure that is at least partially mechanized. For example, FIGS. 39A-C show different views of a mechanized foldable sock assembly 3900 for a privacy/security enclosure in accordance with some embodiments of the invention. In some embodiments, one or more communication devices (user device 10) can be placed in the mechanized foldable sock assembly 3900 that includes one or more articulating members 3925 that can be configured to move a portion 3910 of a sock-like enclosure 3905 to at least partially enclose at least one communication device (such as a user device 10). In some embodiments, the user can press down on the upper portion 3910 of the mechanized foldable sock assembly 3900 to induce the collapsing of the cradle 3907 in a longitudinal direction as well as a folding of the cradle 3907 down into the lower enclosure half (3915). In some embodiments, the mechanized foldable sock assembly 3900 can latch in this state with the privacy/security enclosure closed. Further, in some embodiments, the upper portion 3910 can include clearance holes 3912 for blocking foam to be attached to the top and bottom portions of the privacy/security enclosure. Moreover, the mechanized foldable sock assembly 3900 can enable a controlled force to be applied to the blocking foam. FIG. 39C shows a partial cross-section of the mechanized foldable sock assembly 3900 enclosed within a case or shell 3945 including case halves 3950, 3955. The cross-sectional view of the upper portion 3910 shows blocking foam 3902 in position. In some embodiments, the mechanized foldable sock assembly 3900 can enable a user to control the position of one or more sock-like enclosures, and control any portion of the communication device that can extend from and/or be visible from any vantage point.

Figure 40C:
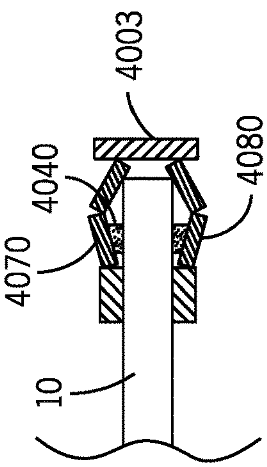
FIGS. 40A-40C depict a mechanized foldable sock assembly for a privacy/security enclosure in accordance with some embodiments of the invention.
Figure 40A:
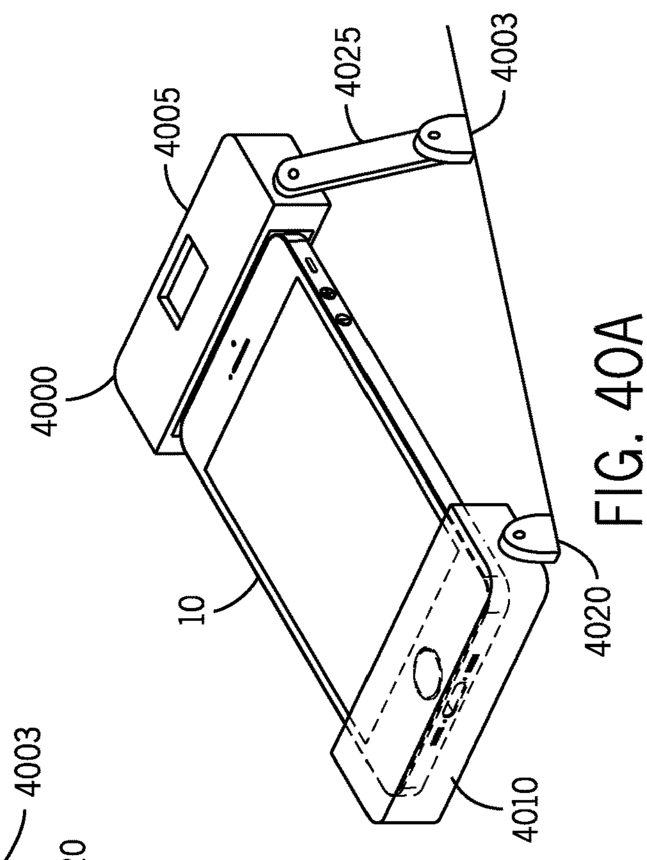
Figure 40B:
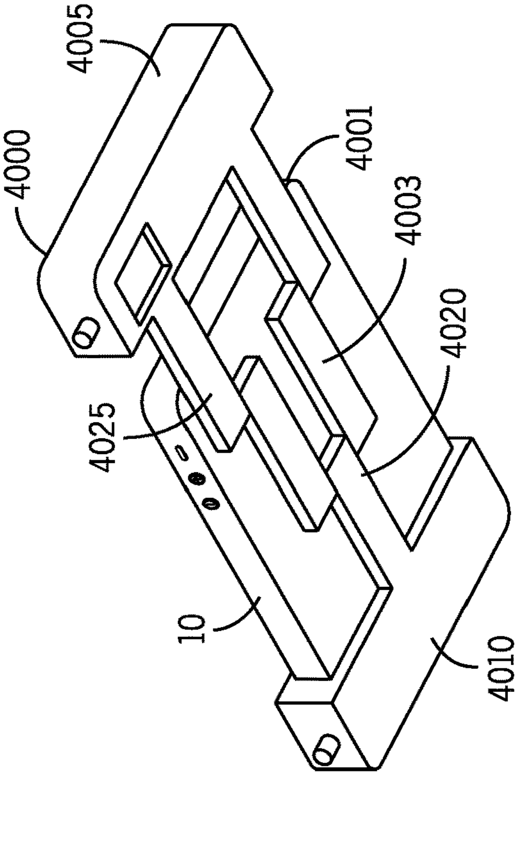

FIGS. 40A-40C illustrates further embodiments of the invention including a mechanized foldable sock assembly 4000 for a privacy/security enclosure in accordance with some embodiments of the invention. FIG. 40B shows the cradle assembly 4001 with upper and lower enclosure portions 4005, 4010 and articulating assembly 4003 including upper and lower rocker arms 4025, 4020. FIG. 40A shows a partial view of the mechanized foldable sock assembly 4000 in an upright configuration. As shown, in some embodiments, as the communication device (user device 10) reaches its final location within the cradle assembly 4001, two rockers 4070, 4080 can actuate which in turn press blocking foam 4040 against microphone ports (shown in FIG. 40C). In some embodiments, the block foam mechanism can include a vibration isolation feature because the communication device lacks direct contact with either of the privacy/security enclosure portions. Further, by using an articulating cradle and/or integrated rockers, the blocking foam application force can be relatively high with little effort from the user due to the trigonometric advantage of the linkage arrangement.

Figure 48:
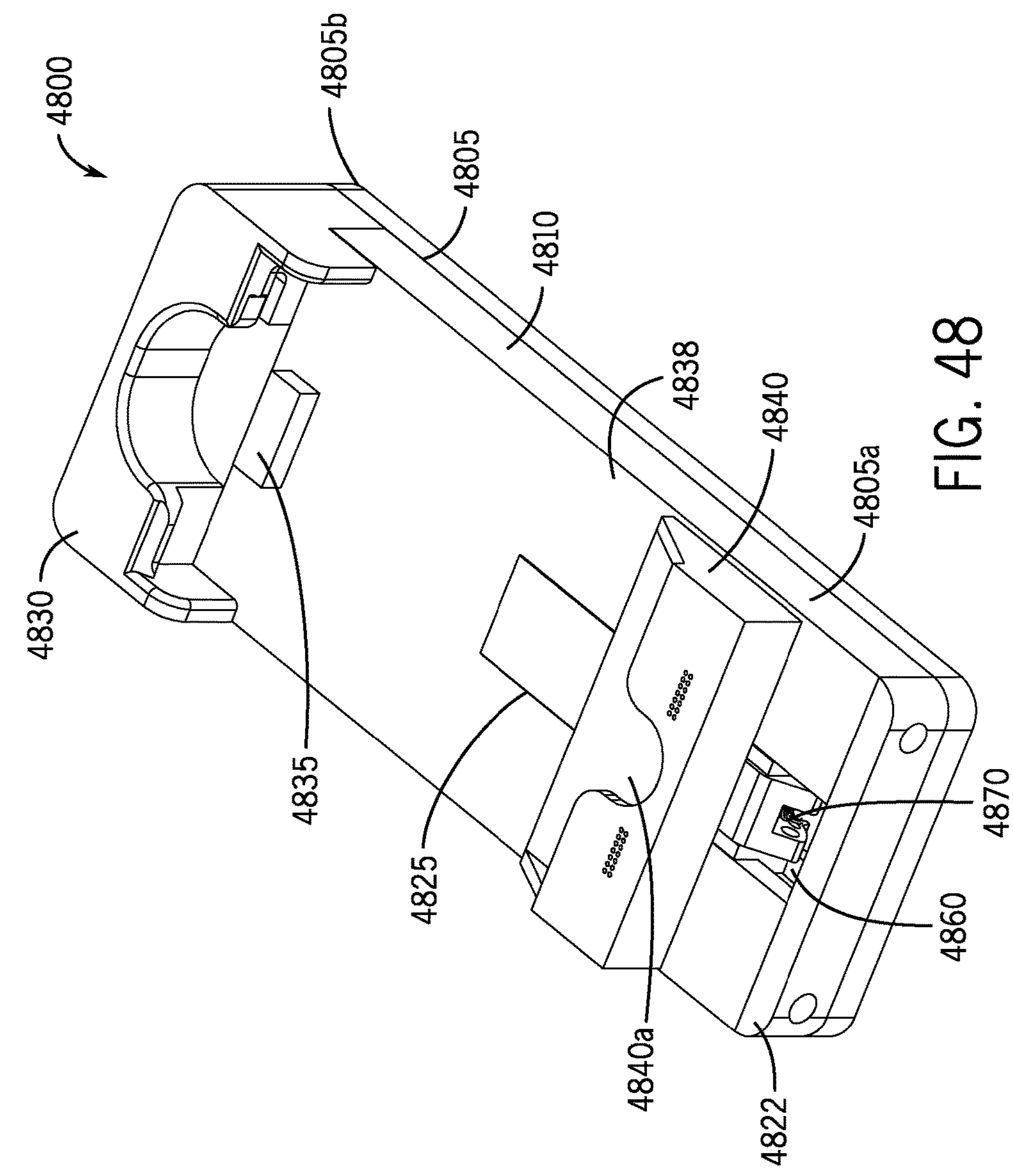
FIG. 48 illustrates a perspective view of a sock assembly for a privacy/security enclosure in accordance with some embodiments of the invention.
Figure 49:
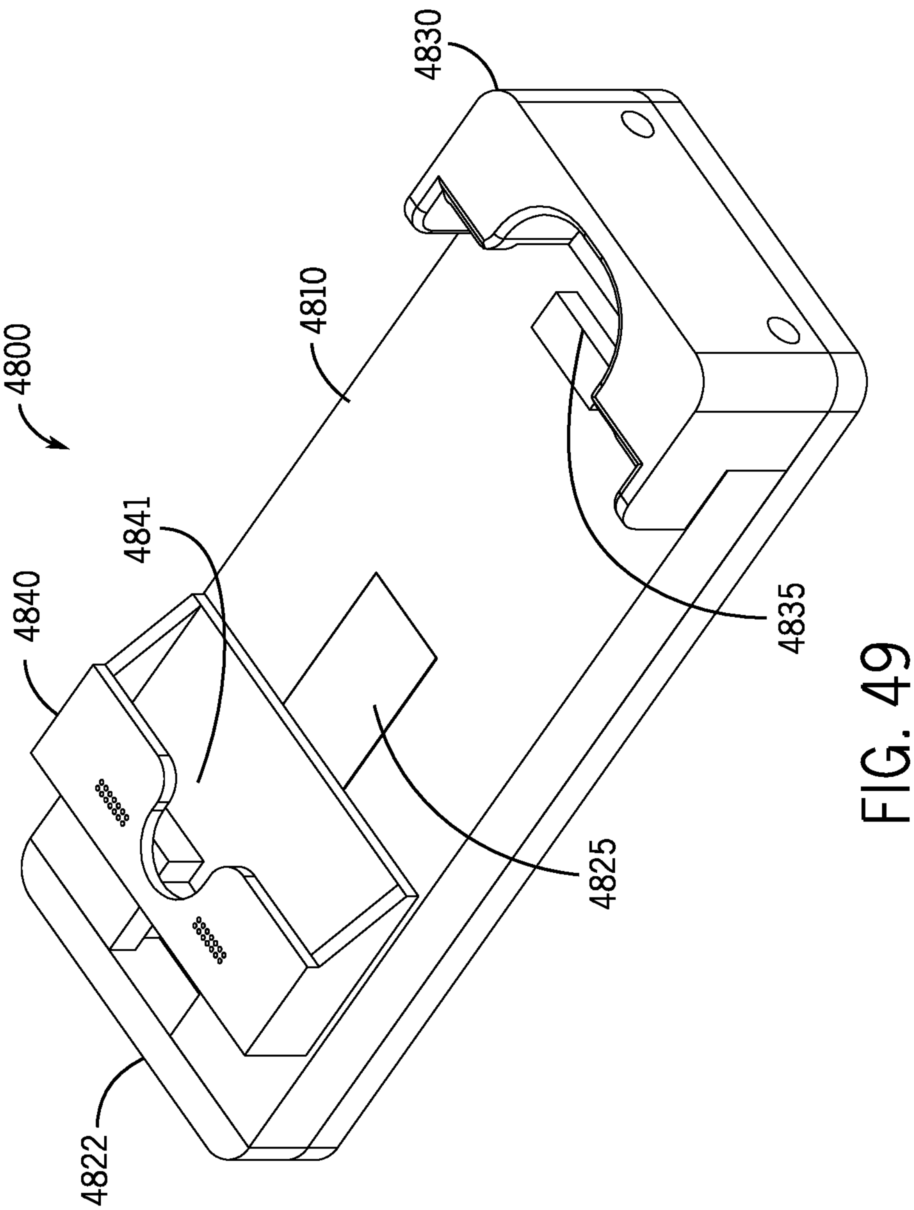
FIG. 49 illustrates a perspective view of a sock assembly for a privacy/security enclosure in accordance with some embodiments of the invention.
Figure 52:
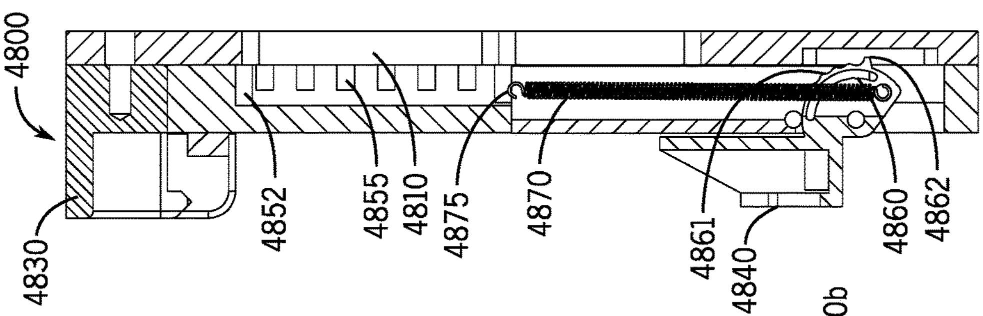
FIG. 52 illustrates a cross-sectional view of a sock assembly for a privacy/security enclosure in accordance with some embodiments of the invention.
Figure 53:
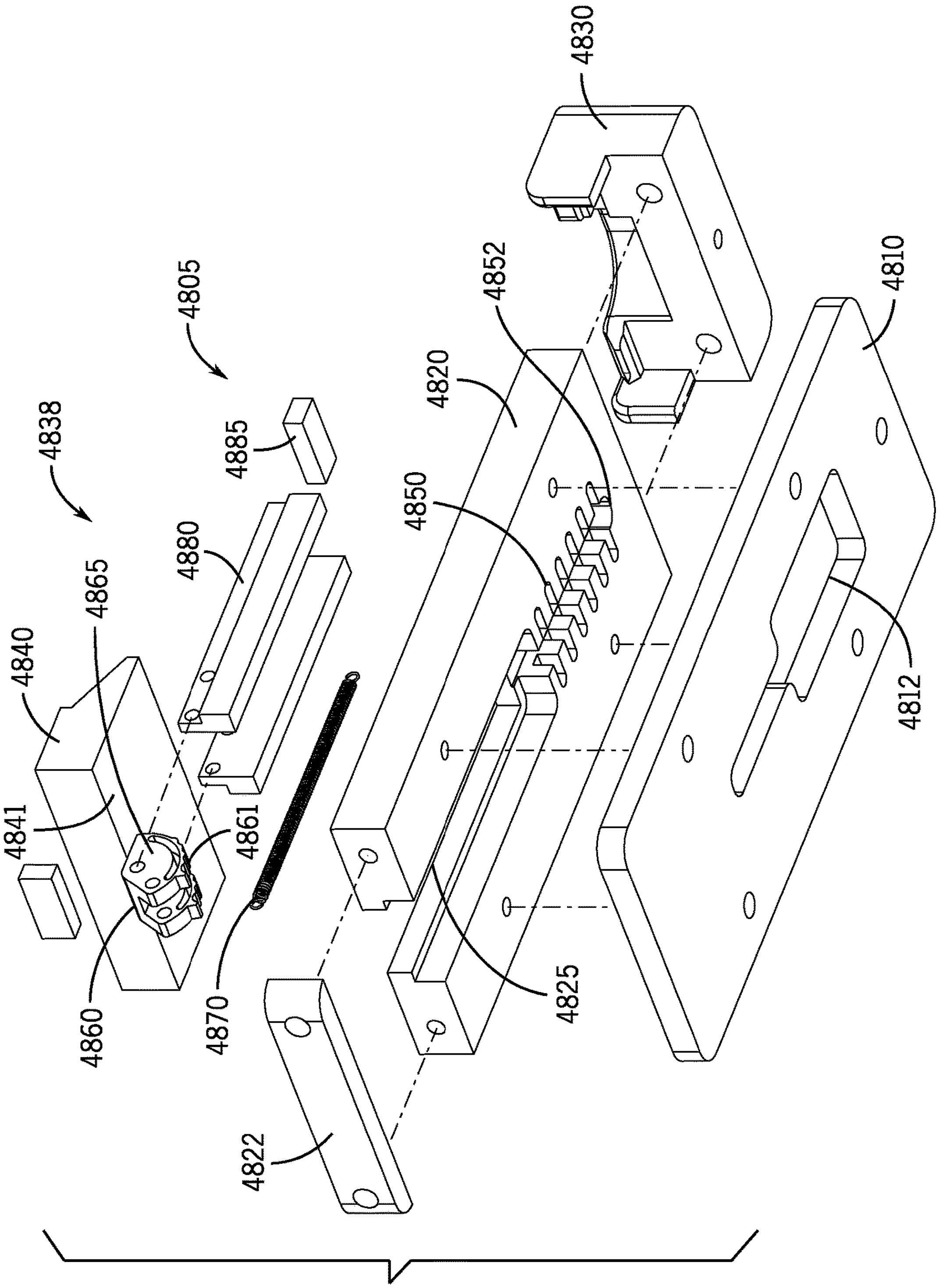
FIG. 53 illustrates an exploded assembly view of a sock assembly for a privacy/security enclosure in accordance with some embodiments of the invention.

FIGS. 48-52 illustrate various views of a sock assembly 4800 including a device cradle assembly 4805 and various device positioning assemblies for raising and lowering the position of at least one device within the cradle assembly 4805. FIG. 53 depicts an assembly view of the sock assembly 4800 of FIGS. 48-52. For example, FIGS. 48 and 49 illustrate perspective views of a sock assembly 4800 for a privacy/security enclosure in accordance with some embodiments of the invention. In some embodiments, the sock assembly 4800 can comprise a cradle assembly 4838 comprising a moveable cradle 4840 and a fixed cradle 4830 coupled to a base portion 4810. In some embodiments, the base portion 4810 can include one or more elements 4835 for interfacing with a cradled device (such as a user device 10). In some embodiments, the element 4835 can comprise a foam, or other suspension component. Some embodiments of the invention include a cradle assembly 4805 structured to guide and facilitate capture and fixation of a cradle device. In some embodiments, the moveable cradle 4840 can be slidably positioned in the sock assembly 4800 from a first end 4805*a* towards a second end 4805*b* of the sock assembly 4800. In some embodiments, the moveable cradle 4840 can include a cavity 4841 for positioning at least one device (such as a user device 10) within the sock assembly 4800. Further, in some embodiments, when positioned in the cavity 4841 of the moveable cradle 4840, any cradled device can be moveably positioned within the sock assembly 4800 by slidably moving the moveable cradle 4840 in the sock assembly 4800 from the first end towards 4805*a* the second end 4805*b* of the sock assembly 4800. Movement of the cradle 4840 can be facilitated using a guide cavity 4825 positioned in the guide base 4820 that is coupled to the fixed cradle 4830 and the base 4810 (see FIG. 53).

In some embodiments, the moveable cradle 4840 can include one or more apertures or slotted portions to facilitate access to one or more functions of a cradled device. For example, as shown in at least FIGS. 48 and 49, in some embodiments, an upper side of the moveable cradle 4840 can include a slot portion 4840*a*. In some embodiments, a user can reach into the sock assembly 4800 to access one or more functions of a cradled device by accessing the device through the slot portion 4840*a*. Moreover, in some embodiments, the slot portion 4840*a* can facilitate a user creating grip and/or leverage to position the cradle 4840 and any cradled devices in a fixed position.

In further embodiments, the moveable cradle 4840 can comprise one or more holes 4840*b* (and clustered into groups in some embodiments) in specific areas of the upper and/or lower sock assembly 4800. In some embodiments, this can allow sound to pass to or from the interior of the sock assembly 4800 (i.e. to allow use of the speakerphone microphone and speaker while the phone or other device is in the sock assembly 4800). In some embodiments, a device positioned in the cradle and sock assembly 4800 while it is in a fixed position may have audio blocking material applied to a microphone(s) enclosed by or adjacent to a sock. In some embodiments, when the device is released from the fixed position, mechanisms to push the device away from such audio blocking material can be included in the sock assembly 4800. For example, in some embodiments, the mechanisms can be one or more springs or material that reverts to an expanded volume when not under some level of pressure or any other such typical mechanism. In some embodiments, a construct attached to a portion of the interior, interior lining or privacy/security enclosure base or lid can be used to ensure that sock assemblies 4800 are pushed to a downward position (regardless of whether or not they are enclosing a transmission device), when the enclosure is being closed. In some embodiments, this configuration can prevent damage occurring to interior mechanisms, assemblies, and other such contents by the closing and/or latching of the enclosure. In some embodiments of the invention, the privacy/security enclosure can include one or more mating plugs for headphone, power, and other such ports can be included in various sock mechanisms to assist users with the proper orientation of their device in the sock. In some further embodiments, privacy/security enclosure sock assemblies can provide pass through holes for charging cables or other features, enabling charging or other functions while the communication device is in the sock and the enclosure is open or closed. Other embodiments of the invention can comprise a privacy/security enclosure that can provide for charging devices (or other such functions) while one or more devices are in the sock (regardless of whether open or closed). In some embodiments, this can be achieved via mating connectors (i.e. male connectors on the interior of the sock assembly 4800 plugged into the device itself while in the sock). In some embodiments, the male connectors can then be connected through the sock assembly 4800 to female connectors on the exterior of the sock assembly 4800. In some embodiments, native power and other such cables (e.g. for headsets etc.) can be plugged, mimicking the functionality of being plugged directly into the device itself), and enabling power cables (or other functions) to connect to the sock (and thus through to the enclosed device) at angles and in positions no longer constrained by the device's position within the sock or privacy/security enclosure.

In some embodiments of the invention, the privacy/security enclosure including a sock assembly 4800 can have the ability to handle multiple makes, models, and types of devices, while still providing levels of audio, video, RF and other forms of protections. For example, in some embodiments, the sock assembly 4800 can be sized to house the largest of the supported devices and have mechanisms that guide and/or secure or grip a varying number of smaller devices via clamping, springing, elastic or other such mechanisms.

In some embodiments of the enclosure, the positioning of blocking foams, tuning of speaker volumes, and placement of active audio protection speakers and/or microphones can be tuned to be able to handle multiple supported devices within the same enclosure. In some embodiments of the invention, the privacy/security enclosure can include active audio components broadcasting masking sounds into a sock assembly 4800, regardless of whether the enclosure is open or closed, and adjustable seals can be used at the entry of the sock assembly 4800 in order to reduce masking audio sounds leaving the interior of the sock.

In some embodiments, the cradle assembly 4805 can be slidably moved in the sock assembly 4800. FIG. 53 illustrates an exploded assembly view of a sock assembly 4800 for a privacy/security enclosure in accordance with some embodiments of the invention. In some embodiments, the sock assembly 4800 can comprise at least one rail 4880 and at least one rail slot 4825. In some embodiments, the cradle assembly 4805 can be coupled to the at least one rail 4880. In some embodiments, the at least one rail 4880 can couple to the at least one rail slot 4825. Further, in some embodiments, the cradle assembly 4805 can be slidably moved in the sock assembly 4800 by sliding the cradle assembly 4805 coupled to the at least one rail 4880 that is slideaby coupled to the at least one rail slot 4825 by a pivot 4860.

Figure 50:
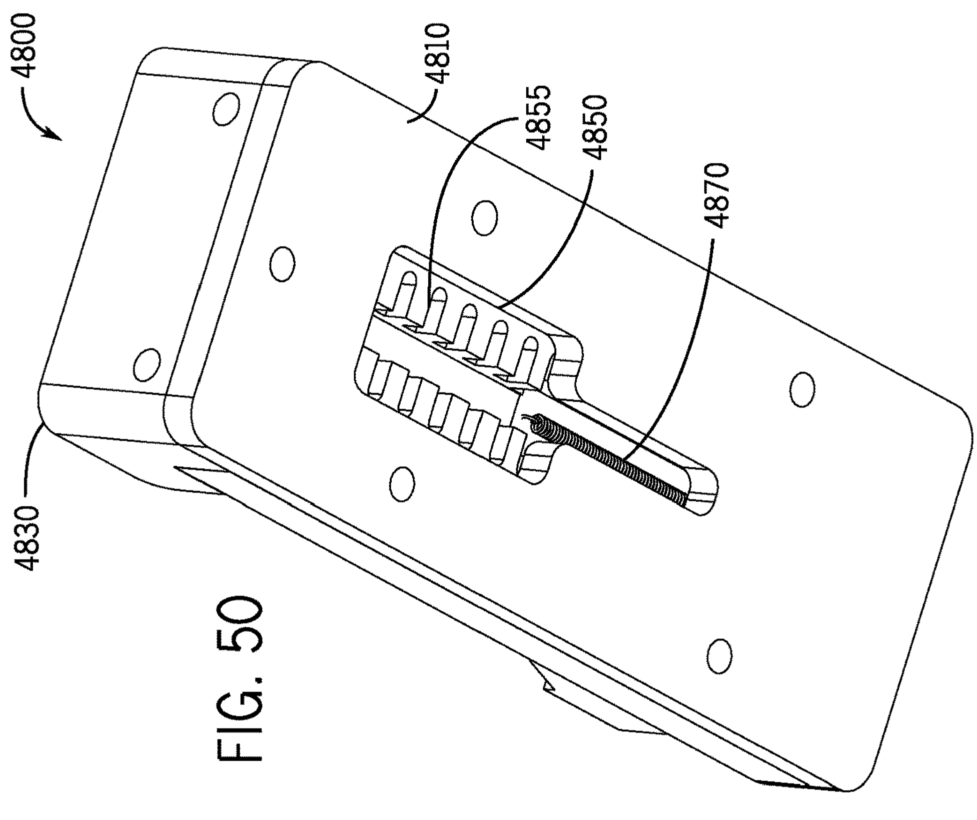
FIG. 50 illustrates a rear perspective view of a sock assembly for a privacy/security enclosure in accordance with some embodiments of the invention.

In some embodiments, the cradle assembly 4805 can be slidably moved between defined positions defined a position ladder 4850 within the guide base 4820 of the sock assembly 4800. For example, FIG. 50 illustrates a rear perspective view of a sock assembly 4800 for a privacy/security enclosure showing a plurality of position notches 4855 within the position ladder 4850, and FIG. 52 illustrates a cross-sectional view of a sock assembly 4800 for a privacy/security enclosure taken through the cross-section line shown in FIG. 52 showing the position notches 4855 in accordance with some embodiments of the invention. In some embodiments, the position notches 4855 can be formed within a portion of the guide base 4820. For example, in some embodiments, the position notches 4855 can be formed in a lower side of the sock assembly 4800 as part of the position ladder 4850. In some embodiments, the base portion 4810 can comprise a notch aperture 4812. In some embodiments, the notch aperture 4812 can be positioned adjacent one or more of the position notches 4855 so that the notches 4855 are visible through the rear of the sock assembly 4800. In some embodiments, a spring 4870 can be coupled to the pivot 4860 at one end and to a fixed point 4875 of the guide base 4820. To enable movement of the cradle 4840, a stop 4885 coupled to the at least one rail 4880 can incrementally move between one or more of the notches 4855 under tension of the spring 4870. The movement of the cradle 4840 is bounded by the end 4822 coupled to the guide base 4820 at the first end **4805*a* of the sock assembly 4800, and towards a second end 4805*b* of the sock assembly 4800 by coupling of the stop 4885 to the end 4852 of the position ladder 4850**.

Some embodiments of the previously mentioned sock assembly 4800 can include one or more defined positions, which in some embodiments can enable an enclosed device to be positioned up to an angle of about 90° with a level surface. In some embodiments, the device can be moved from an elevated position in the sock assembly 4800 to a substantially flat position (i.e., substantially parallel with the surface that is supporting the privacy/security enclosure). Some embodiments can use a tensioner such as a spring 4870, multiple springs, a dampened spring, a spring-loaded or biased peg, or other conventional biasing element to apply a force to the device in one or more elevated or angled positions and when moving the device from one defined position to another defined position.

Figure 51:
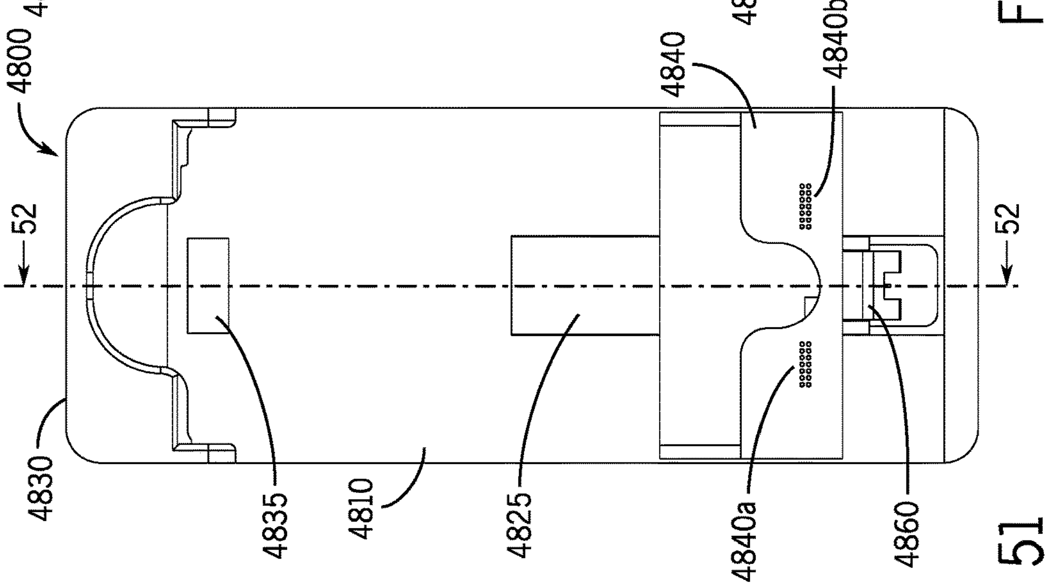
FIG. 51 illustrates a top view of a sock assembly for a privacy/security enclosure in accordance with some embodiments of the invention.

For example, in some embodiments, the cradle 4840 can be pivotally positioned in the sock assembly 4800. In some embodiments, the cradle 4840 can include a pivot mechanism (pivot 4860) for pivotally positioning at least one device within the sock assembly 4800. Further, in some embodiments, when pivotally positioned in the cavity of the sock assembly 4800, a cradled device can be pivotally positioned toward or away and/or at least partially out of the sock assembly 4800 by pivotally moving the cradle 4840 in the sock assembly 4800 using the pivot mechanism 4860. For example, FIG. 51 illustrates a top view of a sock assembly 4800 for a privacy/security enclosure in accordance with some embodiments of the invention, and shows a pivot mechanism 4860 positioned at the base 4841 of the cradle 4840 within the sock assembly 4800. Further, the cross-sectional view and exploded assembly view shown in FIGS. 52 and 53 illustrate the pivot mechanism 4860 coupled the cradle 4840 in accordance with some embodiments of the invention. As shown, in some embodiments, the pivot mechanism 4860 can comprise a plurality of position ridges 4861 positioned on a pivot gear 4865 and configured to couple with a position stop 4862. Furthermore, in some embodiments, the pivot mechanism 4860 can be coupled to at least one tensioner, such as a spring 4870, multiple springs, a dampened spring, a spring-loaded or biased peg, or other conventional biasing element to apply a force to the cradle assembly and any object nestled within the cradle assembly.

In some embodiments, the cradle 4840 can be pivotally rotated using the pivot mechanism 4860 by rotating the pivot gear 4865 to engage at least one of the plurality of position ridges 4861 with the position stop 4862. In some embodiments, as the cradle 4840 is pivoted out away from the sock assembly 4800, the tensioner (spring 4870) can extend and store potential energy. Moreover, in some embodiments, any stored potential energy within the tensioner can be used to at least partially move the cradle 4840. For example, in some embodiments, an extended tensioner can be used to reversibly pivot the cradle 4840 and move the cradle 4840 towards the sock assembly 4800 housing and/or return the cradle 4840 to a prior position adjacent or within the sock assembly 4800 housing. Further, in some embodiments, at least a portion of the tensioner can be viewed and/or accessed through the rear of the sock assembly 4800.

In some embodiments, any device positioned within the cradle assembly can be rotated away from the sock assembly 4800 and/or rotated towards the sock assembly 4800. For example, in some embodiments, a device (such as a phone) can be positioned into the cradle 4840 and pivoted towards and away from the sock assembly 4800 using the pivot mechanism 4860 as described above. In some embodiments, a user can rotate the cradle 4840 to facilitate positioning or using a device within the cradle 4840. For example, in some embodiments, the cradle 4840 can be pivoted away from the sock assembly 4800 housing using the pivot mechanism, and a device (such as a phone) can be positioned into the cradle 4840. In some embodiments, a user can use the pivot gear 4865 to engage at least one of the plurality of position ridges/position stops (or infinite positions with pivot mechanisms using a tensioned spring or other such mechanism) such that a device can be more easily loaded into the cradle 4840 or used/operated while within the cradle 4840. In some embodiments, the position (flat or elevated to any degree) of the device (such as a phone) can modify the security level applied by the privacy/security enclosure. For example, in some embodiments, when the device is lying flat in the privacy/security enclosure, a basic level of audio security can include the device operating normally except for using one or more of the microphones enclosed by or adjacent to any of the sock assemblies (e.g. via the application of attenuating technologies such as blocking foam or speakers transmitting a masking signal) or being compressed against blocking foam on the bottom side of the enclosure or enclosure liner or interior. In other embodiments of the invention, the privacy/security enclosure can be configured so that one or more microphones covered by any portion of the sock mechanism can include an audio masking signal applied within or near to the sock, and interfering with the microphone's ability to record and recover non-masking audio content, regardless of sock position/elevation.

In some embodiments, one or more antennas can be positioned on the outside of the Faraday cage of a privacy/security enclosure, and tuned to one or more frequencies (e.g., wideband frequencies). In some embodiments, the one or more antennas can be coupled to one or more antennas internal to the Faraday cage. In some embodiments, the antennas can be permanent or switchable (e.g., switchable using a mechanical or electro-mechanical switch). The antenna gain, directionality, radiation pattern, and coupling characteristics to other antennas can be changed and modified to meet any specific performance standard.

In some embodiments, the performance characteristics can be modified by a variety of parameters including the distance to the Faraday cage (which can detune antennas), the type of dielectric material used in the antenna, and the choice of electromagnetic band gap structures or other such materials or devices to optimize antenna performance. In some embodiments, the combination of these capabilities are used to allow all or a specific subset of frequencies into the privacy/security enclosure, and through to the housed device. In some embodiments, examples of selective frequency antenna use can include for example, allowing Bluetooth® through to play music in the car on the car's speakers, allowing cellular signals through to receive calls, allowing NFC/RFID through for mobile payments/checkout while at least partially blocking all other frequencies etc., and not attenuating WiFi, GPS or Bluetooth® such that retail stores or other entities, devices, or people cannot or have more difficulty tracking movement and/or location.

Some embodiments of the invention include a privacy/security enclosure including one or more external antennas that can comprise of one more antennas with a wide bandwidth to cover cellular, GPS, WIFI/BT (700M-2.7 GHz+margin) and/or one or more antennas to operate within narrow, more specific frequency bands (e.g. Bluetooth). In some embodiments, the external antenna(s) can include a high antenna gain (to compensate for coupling and connection loss). In some further embodiments, the external antenna(s) can preserve the cellular antenna pattern, and in some embodiments, the antenna(s) can be omni-directional. In some embodiments, the external antenna(s) can be configured to function near a metal surface (e.g., such as a shield box).

Some embodiments of the invention include a privacy/security enclosure including one or more internal/coupling antenna. In some embodiments, the one or more internal/coupling antenna can be capable of operating at a wide bandwidth to cover cellular, GPS, WIFI/BT (700M-2.7 GHz+margin) and/or be tuned to best operate within narrow, more specific frequency bands (e.g. Bluetooth® etc.). In some embodiments, the internal/coupling antenna can include a high coupling efficiency, and be capable of functioning near a metal surface (e.g., such as a shield box). In some embodiments, the internal/coupling antenna can be compatible with multiple cell phones. In some embodiments, the internal/coupling antenna can enable selectivity options for cellular and connectivity (GPS, WIFI/BT) (i.e. through filtering technologies, antenna tuning, etc.)

Figure 41:
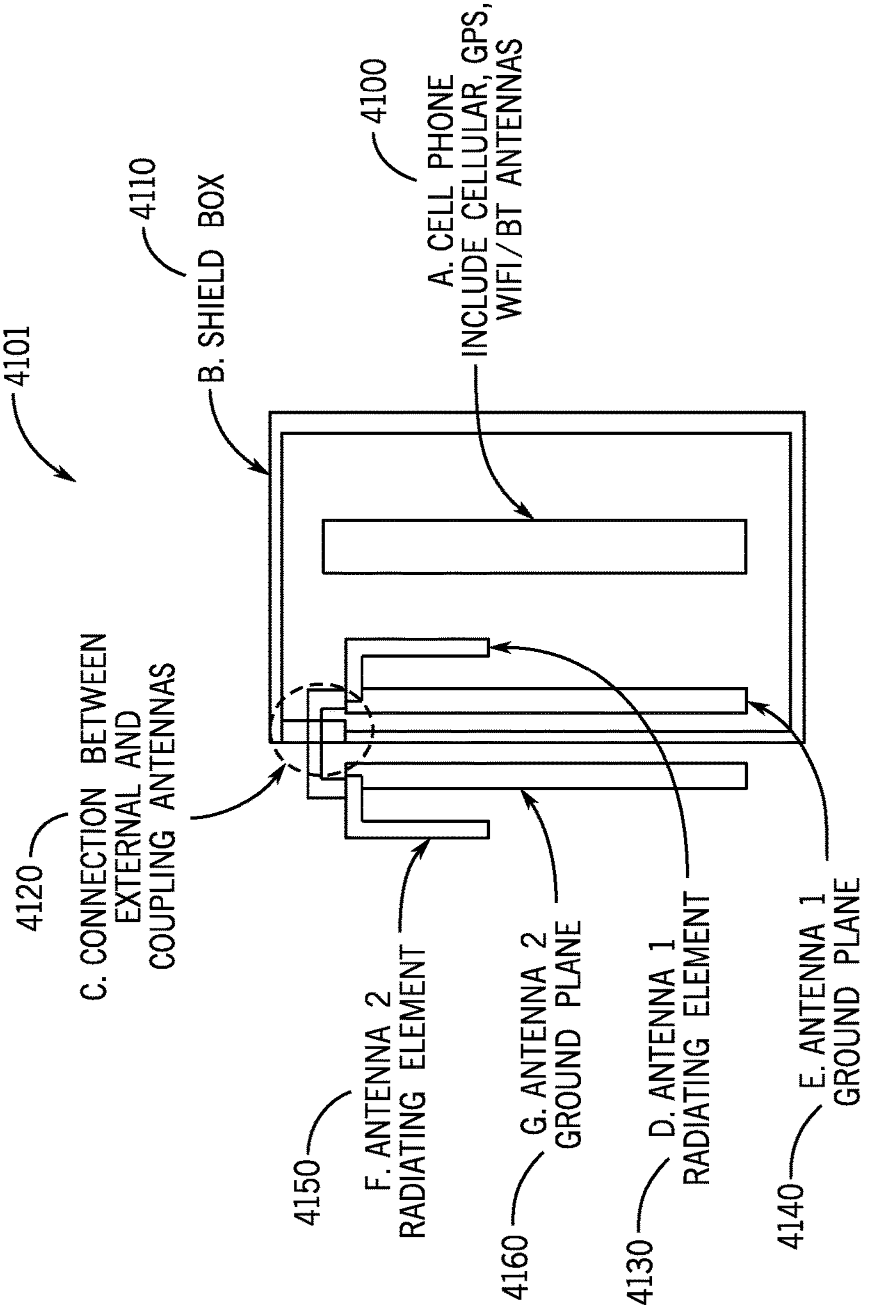
FIG. 41 illustrates an internal/external antenna design for a privacy/security enclosure in accordance with some embodiments of the invention.
Figure 42:
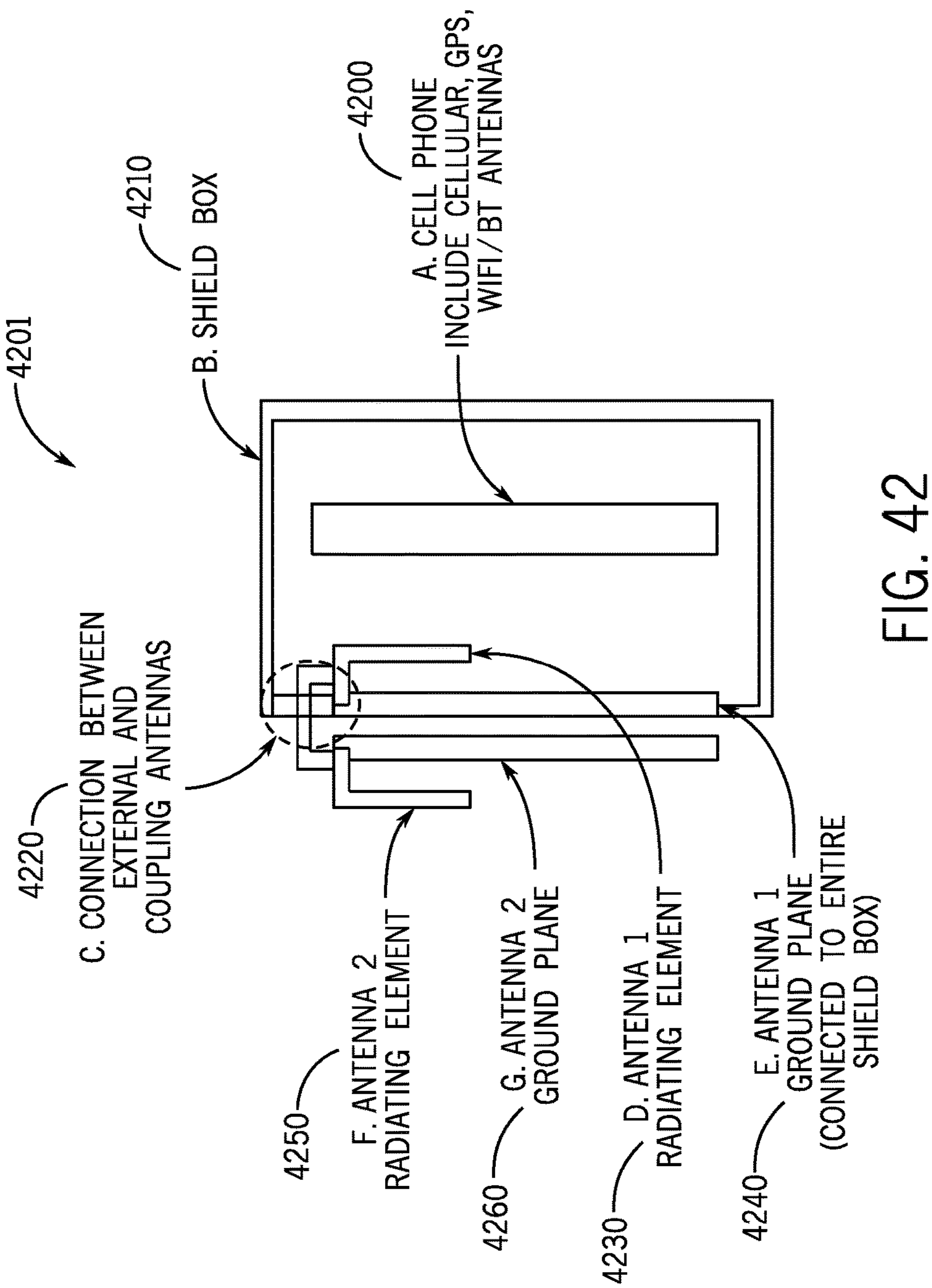
FIG. 42 illustrates an internal/external antenna design for a privacy/security enclosure including an internal antenna ground plane connected to the shield box in accordance with some embodiments of the invention.
Figure 43:
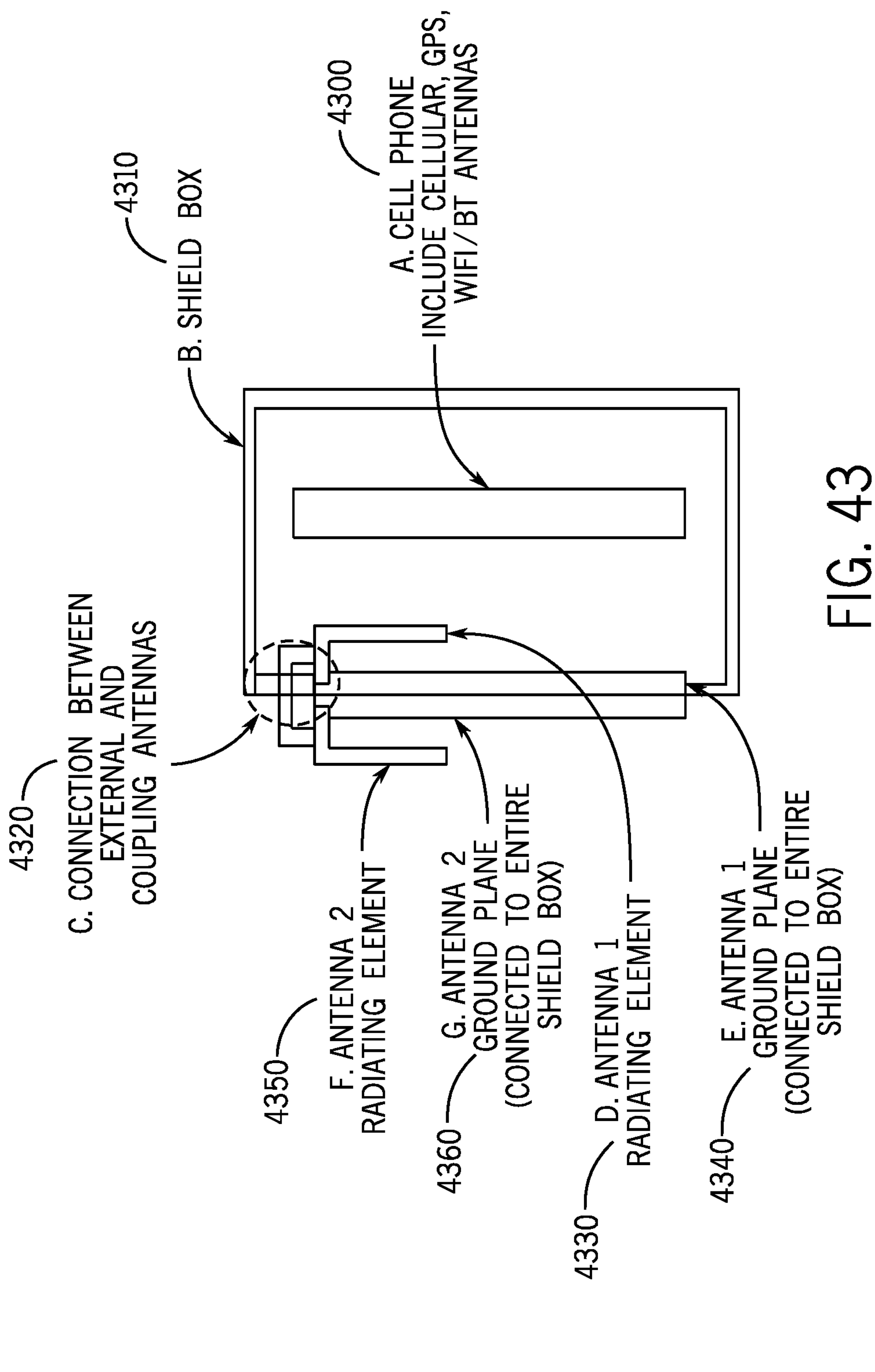
FIG. 43 illustrates an internal/external antenna design for a privacy/security enclosure including an internal and external antenna ground plane connected to the shield box in accordance with some embodiments of the invention.

Some embodiments of the invention can include a privacy/security enclosure comprising an internal/coupling antenna(s) and an external antenna(s). For example, FIG. 41 illustrates an internal/external antenna design for a privacy/security enclosure in accordance with some embodiments of the invention. Further, FIG. 42 illustrates an internal/external antenna design for a privacy/security enclosure including an internal antenna ground plane connected to the shield box, and FIG. 43 illustrates an internal/external antenna design for a privacy/security enclosure including an internal and external antenna ground plane connected to the shield box in accordance with some embodiments of the invention. As illustrated in FIG. 41, in some embodiments, the privacy/security enclosure 4101 can enclosed a cell phone comprising cellular, GPS, and/or WIFI/BT antennas (shown as 4100). The privacy/security enclosure 4101 can comprise a shield box 4110 enclosing the device, and two coupled antennas. Further, in some embodiments, the privacy/security enclosure 4101 can comprise a ground plane externally coupled to the external antenna, and a ground plane enclosed within the shield box, coupled to the internal antenna. For example, FIG. 41 shows the privacy/security enclosure 4101 with an internal and an external antenna radiating element (shown as antenna radiating element 4150 with antenna ground plane 4160, and antenna radiating element 4130 with antenna ground plane 4140) including a coupling 4120 between the antennas.

As illustrated in FIG. 42, in some embodiments, the privacy/security enclosure 4201 can enclosed a cell phone comprising cellular, GPS, and/or WIFI/BT antennas (shown as 4200). The privacy/security enclosure 4201 can comprise a shield box 4210 enclosing the device, and two coupled antennas. In some embodiments, the internal ground plane of the internal antenna can be coupled to the shield box. The privacy/security enclosure 4201 includes an internal and an external antenna radiating element (shown as antenna radiating element 4250 with antenna ground plane 4260, and antenna radiating element 4230 with antenna ground plane 4240), with a coupling 4220 between the antennas.

Further, as shown in FIG. 43, in some embodiments, both the external ground plane and the internal ground plane can be coupled to the shield box. As illustrated in FIG. 43, in some embodiments, the privacy/security enclosure 4301 can enclosed a cell phone comprising cellular, GPS, and/or WIFI/BT antennas (shown as 4300). The privacy/security enclosure 4301 can comprise a shield box 4310 enclosing the device, and two coupled antennas each coupled to the shield box 4310. In some embodiments, the internal ground plane of the internal antenna and the external antenna can be coupled to the shield box. For example, the privacy/security enclosure 4301 includes an internal and an external antenna radiating element (shown as antenna radiating element 4350 with antenna ground plane 4360, and antenna radiating element 4330 with antenna ground plane 4340), with a coupling 4320 between the antennas.

Figure 44:
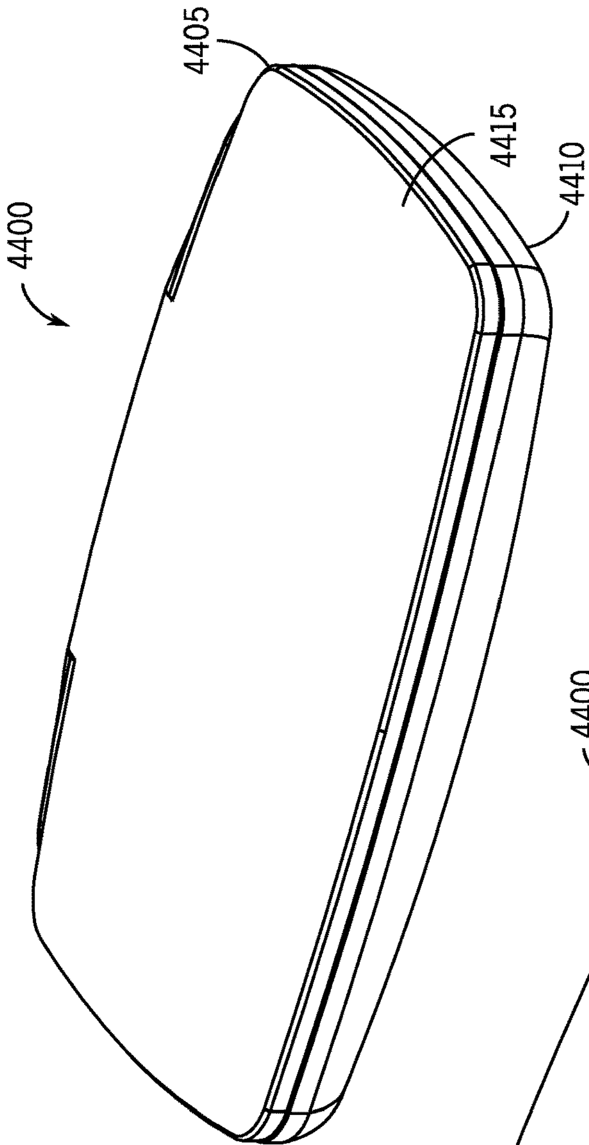
FIG. 44 illustrates a front perspective view of a privacy/security enclosure in a closed position in accordance with some embodiments of the invention.
Figure 45:
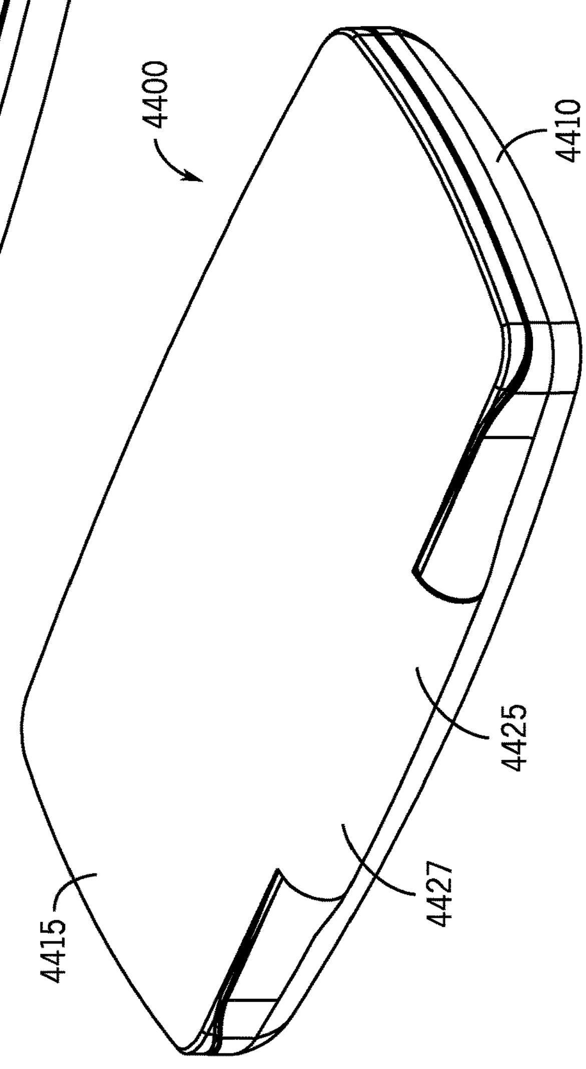
FIG. 45 illustrates a rear perspective view of a privacy/security enclosure in a closed position in accordance with some embodiments of the invention.

In some embodiments, any number of the features described earlier can be implemented in the privacy/security enclosure 4400 illustrated in FIGS. 44-47. Further, in some embodiments, any number of the features described earlier can function based at least in part on the relative position of the base portion 4410 with respect to the lid portion 4415 of the main housing 4405. In some embodiments, the base portion 4410 and/or lid portion 4415 or both can include at least one extended portion for at least partially housing and providing attachment for various portions of a pivot mechanism. For example, FIG. 44 illustrates a front perspective view of a privacy/security enclosure 4400 in a closed position (i.e., the base portion 4410 and lid portion 4415 are coupled, and positioned substantially parallel with respect to each other. As can be seen in FIG. 45, illustrating a rear perspective view of the privacy/security enclosure 4400 of FIG. 44, in some embodiments, the privacy/security enclosure 4400 can include a contoured region 4427 comprising an outward extension of the lid portion 4415 coupling to an outward extension of the base portion 4410. In some embodiments, at least a portion of the outwardly extending portions of the base and lid portion 4415 can at least partially house a pivot mechanism 4425. In some embodiments of the invention, the privacy/security enclosure 4400 can comprise an extended portion formed from portions of an outward extension of the lid portion 4415 coupling to an outward extension of the base portion 4410.

In some embodiments, the extended portion can be comprise a substantially rounded and contoured shape, extending gradually outward from each end of the privacy/security enclosure 4400 to generally centrally positioned region extending along at least a partial length of the privacy/security enclosure 4400. In some embodiments as shown, the central region of the extended portion can be positioned substantially equidistant from each end of the privacy/security enclosure 4400. Further, in some embodiments as shown, the extended central portion can be comprise a substantially rounded and contoured shape, generally smoothly integrated with portions of the extended portion at each end of the privacy/security enclosure 4400, In some other embodiments, the extended portion can comprise other shapes than those illustrated. For example, in some embodiments, the extended portion can comprise substantially rounded and contoured portions, and/or angular, square, or rectangular portions.

In some embodiments of the invention, the base and lid portions 4410, 4415 of the privacy/security enclosure 4400 shown in FIGS. 44-45 can be moved with respect to each to provide access to the inner region 4402 of the privacy/security enclosure 4400. Moreover, as shown, in some embodiments, the privacy/security enclosure 4400 can include a bottom enclosure portion (comprising the base portion 4410), and a lid portion 4415 coupled along one edge. In some embodiments, each portion 4410, 4415 can be positioned and pivoted with respect to each other to enable at least partial access to the inner region 4402 of the privacy/security enclosure 4400. For example, in some embodiments, the base portion 4410 and a lid portion 4415 can be pivotally moved with respect to each other to open and close the privacy/security enclosure 4400. In some embodiments, the privacy/security enclosure 4400 can include a base portion 4410 and a lid portion 4415 coupled by at least one pivot mechanism 4425. For example, in some embodiments, the privacy/security enclosure 4400 can include a base portion 4410 and a lid portion 4415 coupled by at least one conventional hinge mechanism 4425. In some embodiments, the hinge mechanism 4425 can comprise any of the aforementioned hinge mechanisms. Further, in some embodiments, the base portion 4410 or lid portion 4415 or both can include one or more apertures for providing attachment of various portions of a pivot mechanism within the extended portion (not shown). Moreover, in some embodiments, the hinge mechanism 4425 can be at least partially shielded from view by integrating at least partial portions of the hinge mechanism within portions of the extended portion (e.g., the outwardly extending portions of the base and lid portions 4110, 4115 can at least partially housing a pivot mechanism as described earlier). In some embodiments, the inner region 4402 can include a base enclosure 4430 that can be used to cradle or enclose a user's device.

Figure 46:
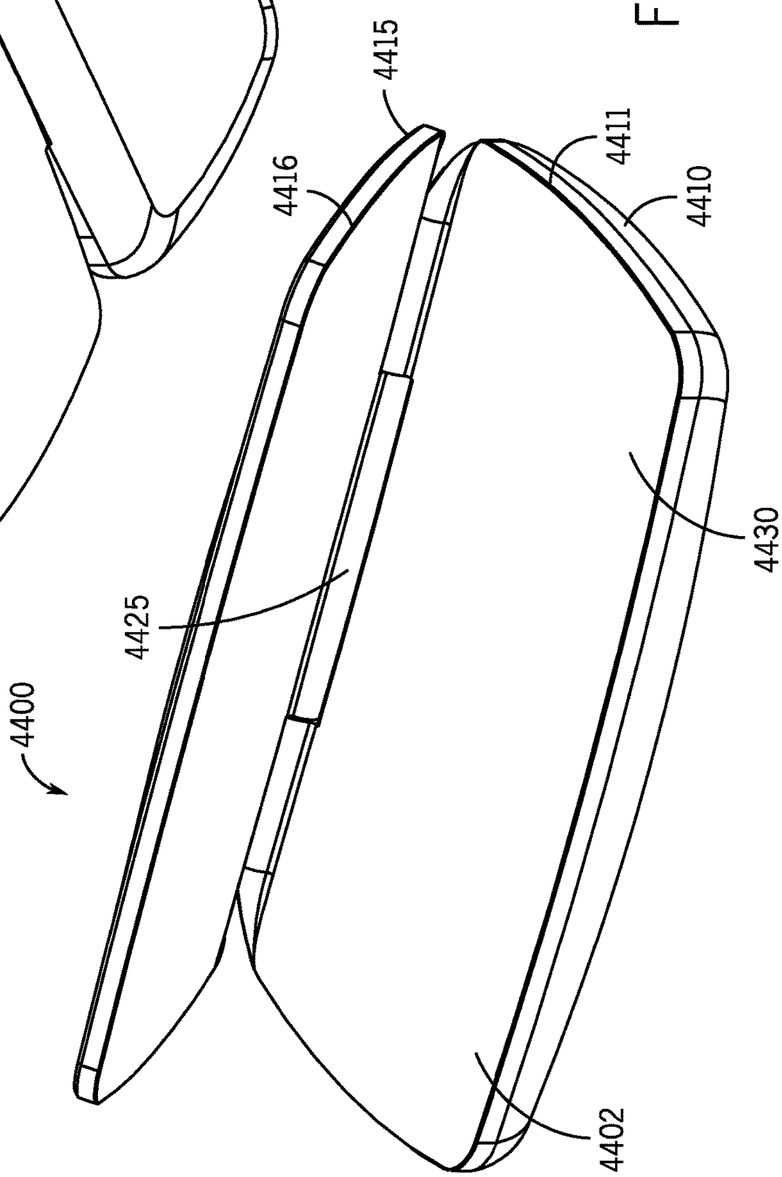
FIG. 46 illustrates a front perspective view of a privacy/security enclosure in a partially open position in accordance with some embodiments of the invention.

In some embodiments, the lid portion 4415 can be moved to a partially open position. For example, FIG. 46 illustrates a front perspective view of a privacy/security enclosure 4400 in a partially open position. In some embodiments, the lid portion 4415 can be moved to a partially open position so that the lid portion 4415 is pivoted about the base portion 4410 and positioned to about 45° with respect to the base portion 4410. In some further embodiments, the lid portion 4415 can be pivoted about the base portion 4410 and positioned between about a 0° (i.e., the lid is closed) to about 190° or higher with respect to the base portion 4410.

In some further embodiments, the lid portion 4415 can be moved so that the lid portion 4415 is pivoted about the base portion 4410 and positioned at other angles with respect to the base portion 4410. For example, in some further embodiments, the lid portion 4415 can be moved to a partially open position so that the lid portion 4415 is pivoted about the base portion 4410 and positioned to about 90° with respect to the base portion 4410.

Figure 47:
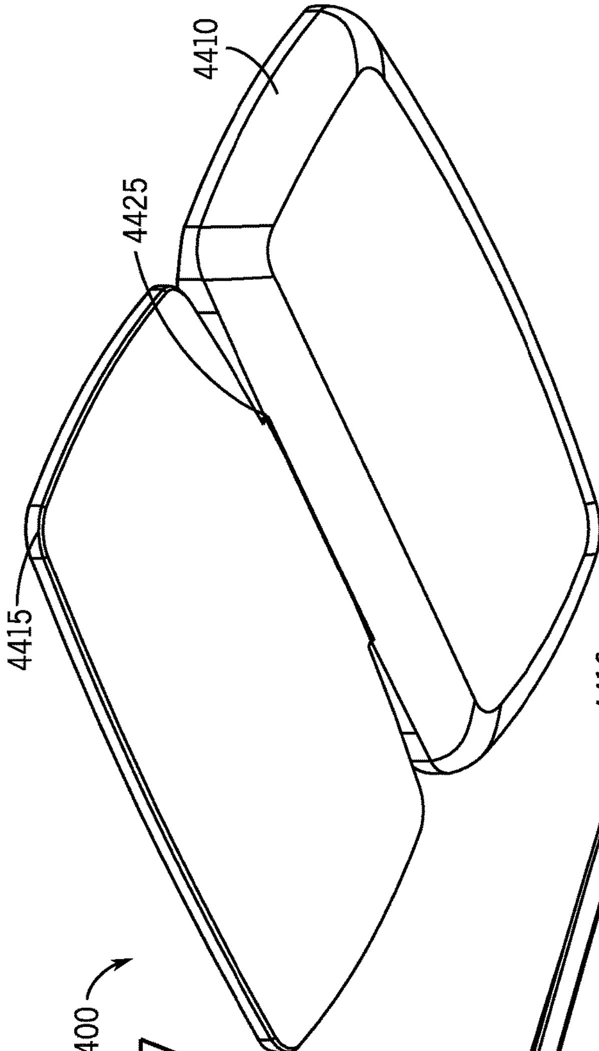
FIG. 47 illustrates a rear perspective view of a privacy/security enclosure in an open position in accordance with some embodiments of the invention.

In some other embodiments, the lid portion 4415 can be moved further from the aforementioned partially open positions so that the lid portion 4415 is pivoted about the base portion 4410 and positioned to other angles with respect to the base portion 4410. For example, in some other embodiments, the lid portion 4415 can be moved further from the aforementioned partially open positions so that the lid portion 4415 is pivoted about the base portion 4410 and positioned to about 190° so that the privacy/security enclosure 4400 lid portion 4415 can rest against a supporting surface when substantially fully open and be stable (i.e., not tip) with respect to the base portion 4410. Further, FIG. 47 illustrates a bottom rear perspective view of a privacy/security enclosure 4400 in a similar open position.

In some other embodiments, the lid portion 4415 can be moved to other positions from the aforementioned partially open positions so that the lid portion 4415 is pivoted about the base portion 4410 and positioned to other angles with respect to the base portion 4410. For example, in some embodiments, the lid portion 4415 can be moved by a user to open positions so that the lid portion 4415 is pivoted about the base portion 4410 and positioned to at angles between greater than about 0° and less than about 45° with respect to the base portion 4410. In some embodiments, the lid portion 4415 can be moved to open positions so that the lid portion 4415 is pivoted about the base portion 4410 and positioned to at angles between greater than about 45° and less than 90° with respect to the base portion 4410. In some embodiments, the lid portion 4415 can be moved to open positions so that the lid portion 4415 is pivoted about the base portion 4410 and positioned to at angles greater than about 90° and less than about 180° with respect to the base portion 4410. In some other embodiments, the lid portion 4415 can be moved to extended open positions so that the lid portion 4415 is pivoted about the base portion 4410 and positioned to at angles greater than about 180° and less than about 360° with respect to the base portion 4410.

In some embodiments, the base portion 4410 of the privacy/security enclosure 4400 shown in FIGS. 44-47 can comprise a base housing 4411 comprising a bottom side coupled to four base sides. In some embodiments as shown, the base sides can comprise a generally curved side wall extending from the bottom side to a generally curved outer base edge. Further, in some embodiments, the lid portion 4415 can comprise a lid housing 4416 comprising a top side coupled to four lid sides. In some embodiments as shown, the lid sides can comprise a generally curved side wall extending from the top side to a generally curved outer lid edge. In some embodiments, the lid side can comprise a generally curved surface. In some other embodiments, at least a portion of the lid side can be generally flat. Further, in some embodiments, the generally curved outer lid edge can be shaped to generally or substantially complement the generally curved outer base edge. Therefore, in some embodiments, when the privacy/security enclosure 4400 in closed so the privacy/security enclosure 4400 can include the base portion 4410 and the lid portion 4415 coupled substantially continuous along one edge by coupling the generally curved outer lid edge to substantially complement the generally curved outer base edge to form a substantially sealed enclosure.

In some embodiments, privacy can be enhanced by disabling or making less effective one or more of the following sensors or systems through the use of motors, magnets or known signal blocking or attenuating techniques: accelerometers, magnetometers, gyroscopes, Near Field Communication systems, humidity sensors, infrared or other light sensors, orientation sensors, pressure sensors, force sensors, proximity sensors, rotational or vector sensors, significant motion sensors, pedometers and any other sensors or systems.

Figure 54:
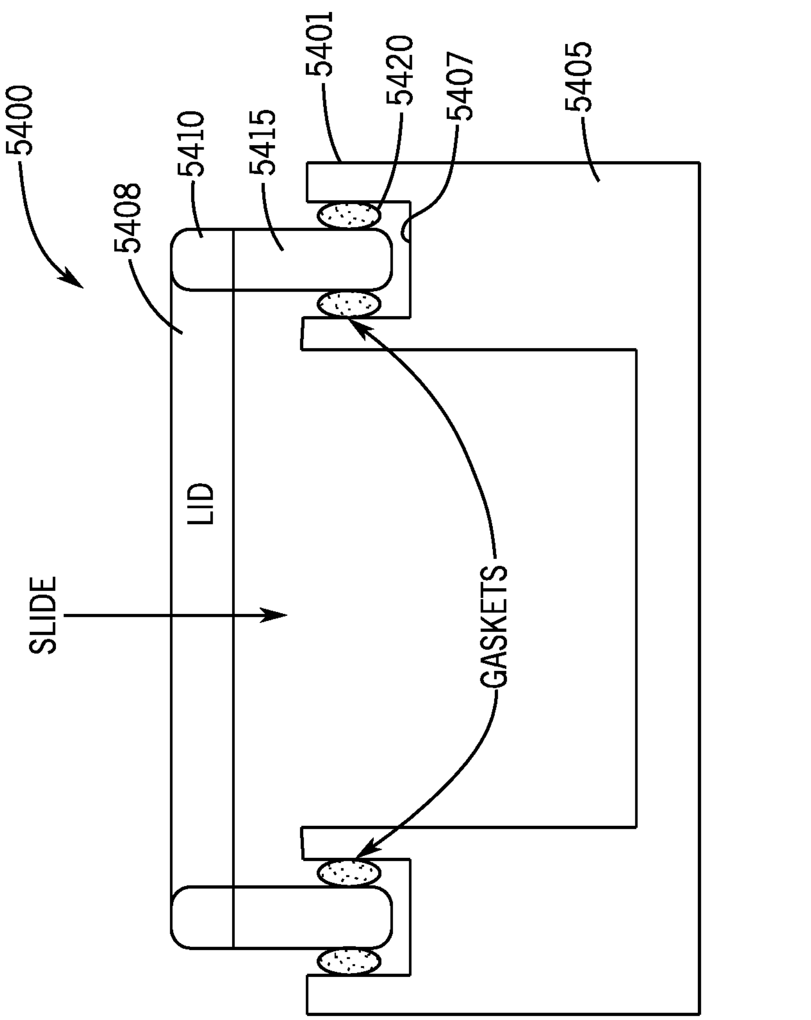
FIG. 54 illustrates a cross-sectional view of a privacy/security enclosure showing gasket seals according to one embodiment of the invention.
Figure 128G:
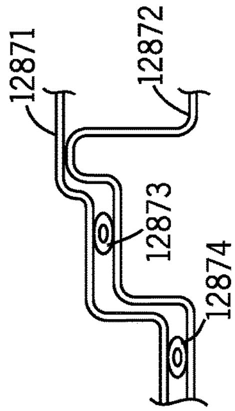
Figure 128H:
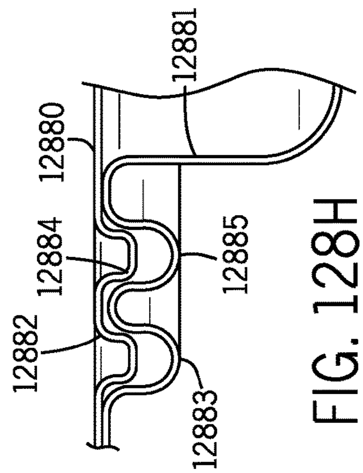

Within the FIGS. 54-128H, details of various labyrinth and gasket architectures are provided. For example, as shown, in FIG. 54, the privacy/security enclosure 5400 include a "knife edge" 5415 where the edge 5410 of the lid portion 5408 of the privacy/security enclosure 5400 can be positioned and wedged between two or more gaskets 5240 positioned within a groove 5407 of a base portion 5405 of the privacy/security enclosure 5400.

Some further embodiments of the invention include privacy/security enclosures that allow RF pass through capabilities, where specific frequencies can be allowed to pass through the Faraday cage while maintaining protection against other frequencies (i.e. while maintaining privacy protection of the device). Some embodiments include privacy/security enclosures that allow an RF pathway to be closed to reinstate a RF protection via an RF/Antenna cut-off switch.

Some embodiments of the invention include privacy/security enclosures that include RF filtering and/or RF band selection. In some embodiments, RF bands that can pass through the enclosures are adjacent to other bands that can be blocked or attenuated. For example, band 40 and 41 of the cellular spectrum are adjacent to the bands that carry WiFi and Bluetooth (which overlap). In order to pass WiFi and Bluetooth while still providing protection against cellular bands, some embodiments include a series of filter that allow this to happen.

Some embodiments of the invention include a privacy/security enclosure that includes at least one external to internal interface and communication apparatus. In some embodiments, the privacy/security enclosure can enable passing certain types of information from inside to outside the Faraday cage without compromising its protection (i.e., information can be transmitted from the enclosed device while maintaining privacy protection of the device).

Some embodiments of the invention include privacy/security enclosures that enable DC power pass-through. In some embodiments, the privacy/security enclosure can enable charging of one or more batteries within the privacy/security enclosure. Further, some embodiments also enable charging of batteries of one or more enclosed devices. Moreover, in some embodiments, charging of one or more batteries in the privacy/security enclosure and one or more batteries of at least one enclosed device can occur substantially at the same time. In some embodiments, the privacy/security enclosure can comprise one or more charging conductors or wires that pass through the Faraday cage of the privacy/security enclosure for purposes such as charging. Prior art designs would be akin to putting one or more antennas through the Faraday cage, but some embodiments of the invention allows charging to take place without materially degrading the enclosure's RF protection. Further, in some embodiments, the privacy/security enclosure can comprise one or more charging conductors or wires that pass through the Faraday cage of the privacy/security enclosure for purposes such as charging that do not require a user to connect and disconnect separate leads on the inside and/or outside of the privacy/security enclosure.

Some embodiments of the invention include privacy/security enclosures that comprise one or more optical pass-through components, regions, or structures. In some embodiments, the privacy/security enclosure can include one or more micro-controllers on both the inside and outside of the Faraday cage. In some embodiments, in order to allow the microcontrollers to communicate with each other without including additional holes for additional conductors/wires, holes can be included to allow communication via optical signaling without materially degrading the performance of the Faraday cage.

In some embodiments, power (e.g., for one or more LED's), data, or other information and/or electromagnet radiation can be passed through the Faraday cage while maintaining privacy protection for the enclosed device.

Some embodiments of the invention can enable a head set pass-through. For example, in some embodiments, a user can plug a headset into the outside of the privacy/security enclosure (through the Faraday cage) to access a corresponding feature or port on the device enclosed inside the Faraday cage in the privacy/security enclosure while maintaining privacy protection of the enclosed device.

Some embodiments of the invention include at least one form of audio protection. Some embodiments of the invention include an open case audio protection" ("OCAP"). For example, in some embodiments, audio protection can be enabled while the privacy/security enclosure is open. In this instance, a user can use at least a portion of the functionality of the device while maintaining audio protection. For example, where the enclosed device is a phone, the privacy/security enclosure can provide a user with at RF functionality (e.g., to check if calls are coming in and/or to receive and/or respond to text messages). The privacy/security enclosure can also provide a user with screen access (e.g. to send and/or receive emails, check calendars, notes, To Do's, play games, use apps etc.). Further, the privacy/security enclosure can provide a user with access to the use of a front and rear facing camera, and use of various buttons and device functions requiring physical access by the user.

Some embodiments of the invention include listen and respond capabilities. Some embodiments enable a user to use one or more microphones to listen to the environment and play one or more masking signals when sound is detected. Some embodiments include a privacy/security enclosure that comprises one or more microphones that are band limited to specific frequencies that are associated with voice. In this instance, the microphones have a lowered noise floor that is below the threshold of microphones in enclosed user devices (e.g. the enclosed, phone, computer, tablet etc.) For example, in some embodiments, the privacy/security enclosure can comprise one mic in the middle of the low frequency of the common voice frequency band and another in the middle of the medium frequency voice band. In some embodiments, by being very deep (in terms of noise floor) in each of these areas, the presence of speech can be detected (while not capturing the voice content) while ensuring privacy/security enclosure protection is activated.

Some embodiments of the invention include speaker and/or speaker driver selection specifically for masking. Some embodiments include a privacy/security enclosure that can produce one or more specific waveforms to mask human speech. Moreover, some embodiments include speakers that can produce the masking signal with minimal power consumption.

In some embodiments, the privacy/security enclosure can change and/or delay a starting time for the masking signal. For example, in some embodiments, the privacy/security enclosure includes a control system that enables the system and/or the user to select and vary the amount of time between speech detection and masking signal activation.

In some embodiments, the privacy/security enclosure can change the masking signal tail time. For example, after speech ceases, the control system can stop the transmission of the masking signal substantially immediately. In some further embodiments, after speech ceases, the control system can include a transmission of the masking signal that comprises a tail (i.e. a transmission for a certain period of time after speech ceases). In some embodiments, this can minimize obtrusiveness as testing indicates that a constant start/stop is more obtrusive than continuous transmission. In some embodiments, tuning the tail can allow substantially continuous broadcast through the normal starts and stops and pauses that are a part of human conversation. Further, in some other embodiments, the volume of the masking signal can be varying. In some embodiments, the control system or the user can vary the volume of the masking signal based on the volume of the detected sound (e.g. such as a human voice).

In some embodiments of the invention, the privacy/security enclosure can include an obfuscation and/or randomness setting. In some embodiments, for a variety of reasons, the privacy/security enclosure can prevent an unauthorized listener from detecting the presence of speech. In some embodiments, in the obfuscation and/or randomness mode, the privacy/security enclosure can randomly broadcast to simulate protection even if no one is speaking, thereby diminishing the ability of an unauthorized listener of detecting when there is actual speech by a user using the system.

Some embodiments of the invention include an always on mode. In this instance, the privacy/security enclosure includes active audio masking that is always on. In this mode, the privacy/security enclosure can maintain privacy protection substantially constantly.

Some embodiments of the invention include user signaling. In some embodiments, the privacy/security enclosure can include one or more LED's or other forms of communication to indicate when the privacy/security enclosure is providing protection, which mode the privacy/security enclosure is in (always on, obfuscation and/or randomness mode setting, etc.), and/or can be configured to flash anytime the privacy/security enclosure is broadcasting.

Some embodiments of the invention include remote activation. In some embodiments of the invention, a privacy/security enclosure can include audio technologies that can be used independently of RF and other protection technologies. For example, some embodiments include the capability to remotely activate various modes of audio protection. For example, some embodiments can include a remote control that activates audio protection in the privacy/security enclosure that can attach to a smart TV or gaming console that can include built-in microphones. Other examples include cars and any other electronic device with a microphone. This can capture three concepts: 1) The audio protection can be used/applied independent of any other type of protection (RF, etc.); 2) The audio protection can be packaged to protect against any device that has microphone (car, TV, etc.) and 3) Any audio protection can be activated in one or more ways: a.) automatically by some sensing and/or control mechanism built into the product; b.) by physical user interaction/activation (some type of physical button or switch etc.) and c.) a remote activation capability that uses a non-physical interface (RF, infrared/light based, sound (perhaps voice or sound activated by saying a keyword, clapping or something similar.)

Some embodiments of the invention include a noise delivery system that takes the masking signal generated by one or more speakers within the privacy/security enclosure and delivers it to the various microphones that are being protected by the privacy/security enclosure. Some embodiments of the invention include a privacy/security enclosure that comprises a collection point. This is the point at which signals generated by the speakers are captured and are coupled to the delivery system. Some example embodiments include an open port near a privacy/security enclosure speaker or a shaped capture point that changes or impacts capture and delivered signals.

Some embodiments of the invention include a delivery system. In some embodiments, the privacy/security enclosure can comprise a system that channels a signal through at least a portion of the physical architecture of the privacy/security enclosure and delivers it proximate the microphones of the device against which are being protected. Some example embodiments can include tubes (e.g. similar to tubes used to deliver sound to the ear in a conventional hearing aid). Some example embodiments include channels or paths that are built into the privacy/security enclosure. In some embodiments, depending on the location and proximity of the microphones being delivered a signal, the transmission of the speaker can be propagated to the microphone. In some embodiments, the length, diameter, shape, material and stiffness of the tubes and channels can vary and can impact the signal that is being delivered by the privacy/security enclosure.

Some embodiments of the invention can include one or more microphone attachment and/or sealing mechanisms. In some embodiments, a physical element of the privacy/security enclosure architecture can be placed against the surface of the device against microphones that are being protected. In some embodiments, this physical element can comprise a seal or gasket that minimizes the escape of our masking signal to the surrounding environment, and thereby can reduce the noise detected by people nearby. For example, in some embodiments, the tube delivering the sound can open to a hole which is greater than the location of the microphone so that when it is sealed and/or attached, a substantial majority of the signal can be delivered to the microphone rather than to the environment.

Some embodiments of the invention include an extensible design. In some embodiments, in order to facilitate reusing one design to be able to protect against multiple devices, embodiments of the invention include a privacy device that includes be the ability to slide or move the delivery point in order to accommodate devices with different microphone locations.

Some embodiments of the invention include an audio pass-through. In some embodiments, if a user receives a phone call that they want to take, they can be provided with the option to remove the sealed delivery element such that they can take the call (including if they want to do so on speakerphone, for a video call etc.) Some embodiments can improve audio clarity depending on the physical architecture of the privacy/security enclosure. Some embodiments include holes that are placed on the mechanism that holds the protected device in place. In this instance, if the holding mechanism overlaps with a microphone and/or speaker, audio pass-through applies in both directions, listening to the caller and passing through the audio content of the speaker. In some embodiments, the sealing can attenuate an external audio signal coming from outside the seal to the microphone as well as attenuate a masking signal going from inside the seal to outside (that can reduce obtrusiveness). In some embodiments, depending on the degree of external audio attenuation, the level of the masking signal can be lower on one microphone position versus another.

In some embodiments, using any of the previously mentioned protection technologies, other sensor protection can be provided by a privacy/security enclosure. Some embodiments can provide protection and/or degradation of the performance of all sensors contained within various electronic devices as disclosed herein.

Some embodiments of the invention include shock absorption features. These features help protect against falls, but also can act as a shock absorber that helps minimize vibrations caused by sound from reaching the IMU's within specific devices.

In some embodiments of the invention, RF gasketing can provide the secondary benefit of minimizing the transmission of air, water, dust and other such substances from passing into the interior of the case when it is closed. In some embodiments, other environmental gaskets can be added to that are more specifically designed for this purpose.

Some embodiments of the invention enable the user to select different levels or types of protection provided any given time. Some embodiments provide multiple selectable states, each of which provides different types or levels of protection.

For embodiments of the invention that include cases that can close, ramps or other features can be provided that prevent damage to interior portions of the case in the event the user is closing the case without having put at least one portion of the interior in the optimal state. In some embodiments of the invention that do not include a sock or lifting mechanism that allows the enclosed device to be elevated, kickstands can be built into or on top of the back of such products to provide similar functionality. Tacky or soft elements can be added to cases or housings to minimize slipping and sliding of products when they are on slippery surfaces.

Some embodiments of the invention allow users to use as much of their native device functionality as possible. Accordingly, some embodiments of the invention provide access to both front and rear facing cameras, side buttons, and other device controls.

Some embodiments of the invention do not use the previously described sock mechanisms. Accordingly, some embodiments utilize different ways of loading, unloading and holding protected devices within the case. Some embodiments include different ways to interface with various ports and plugs on the phone (i.e. power, headset etc.) In some embodiments, access is not provided to some or all of these capabilities while the device is within the case (even if the case is closed to provide RF protection).

Some embodiments of the invention include passive RF protection and passive audio protection. Some of these embodiments include a microphone blocker and a corresponding release function. In some embodiments, when a user takes a sock out of down mode (wherein passive audio protection is provided while the case is open) and the phone is sprung up to an angled position within the case, ready for use, a lift mechanism lifts the phone from the audio sealing material inside the bottom of the sock. These embodiments allow speakerphone and video calls to be made without muffling the clarity of the speaker at the other end of the call as well as the clarity of the speaker using the case. Some of these embodiments use foam (or springs or other such mechanisms) that lift the phone when the phone is not in the compressed or “down” mode. Some embodiments include holes drilled or otherwise formed into the bottom of the sock (or include a grill or some other such pass through method) that allow sound to pass through more easily.

Some embodiments of the invention include passive RF protection and active audio protection. Some of these embodiments of the invention can include shapes that are dissimilar from a bathtub type of design. These alternative embodiments can leverage knife edge labyrinth and gasket designs etc. in order to provide a compact and effective device.

Some embodiments of the invention include different Faraday cage designs. While some embodiments include one piece cases with a book-type of hinge, other embodiments use vertical hinges, two-piece or multi-piece products with removable pieces that both do and do not attach to the pieces that were not removed from the protected or enclosed device.

Some embodiments of the invention include a user interface comprising controls and status indicators. The user interface can display different modes and status using LED's or other visual or audio features. Embodiments of the invention that use active audio masking technology can include a user interface which users to turn the device on/off and/or activate different modes, provide battery and other status, etc.

Figure 55C:
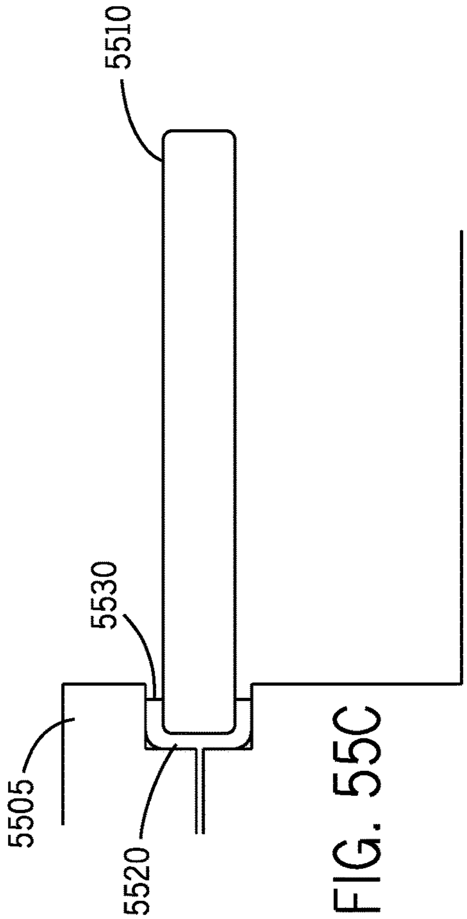
FIGS. 55A-55C illustrate views of a privacy/security enclosure lid with a U-channel gasket according to another embodiment of the invention.
Figure 55A:
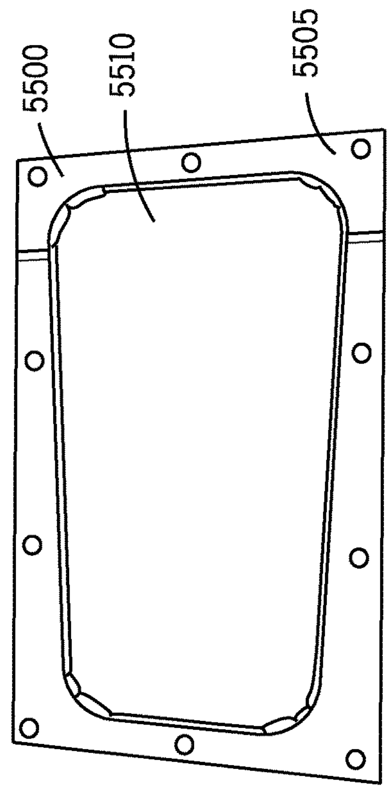
Figure 55B:
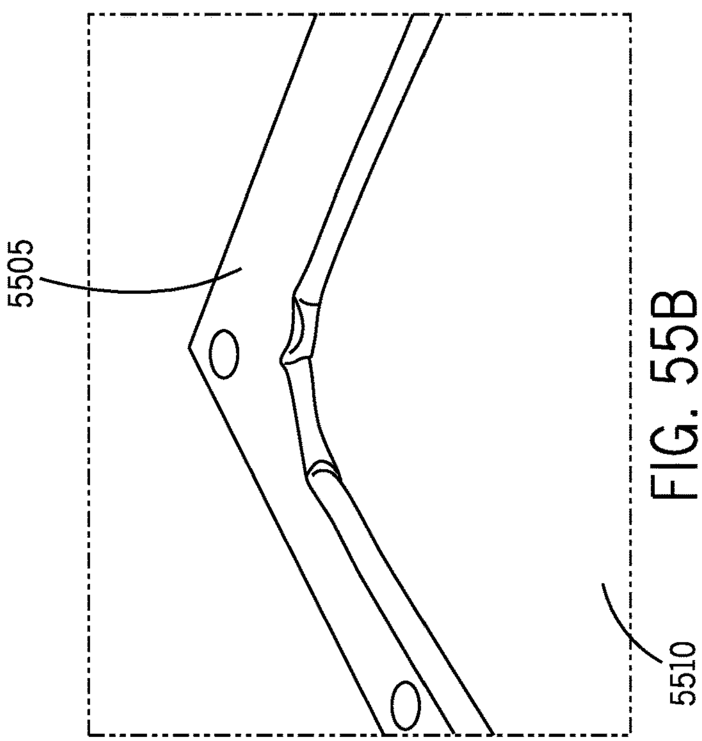

Further embodiments of privacy/security enclosures including components, assemblies, and methods of use are shown in FIGS. 55A-128H. For example, FIGS. 55A-55C illustrates views of a privacy/security enclosure lid with a U-channel gasket according to another embodiment of the invention. The main housing 5505 can include at least one peripheral u-shaped channel or groove 5520 into which a portion of a lid 5510 can be inserted. The u-shaped channel or groove 5520 can include a gasket 5530 that at least partially fills the u-shaped channel or groove 5520 and the enclosed portion of the lid 5510.

Figure 56:
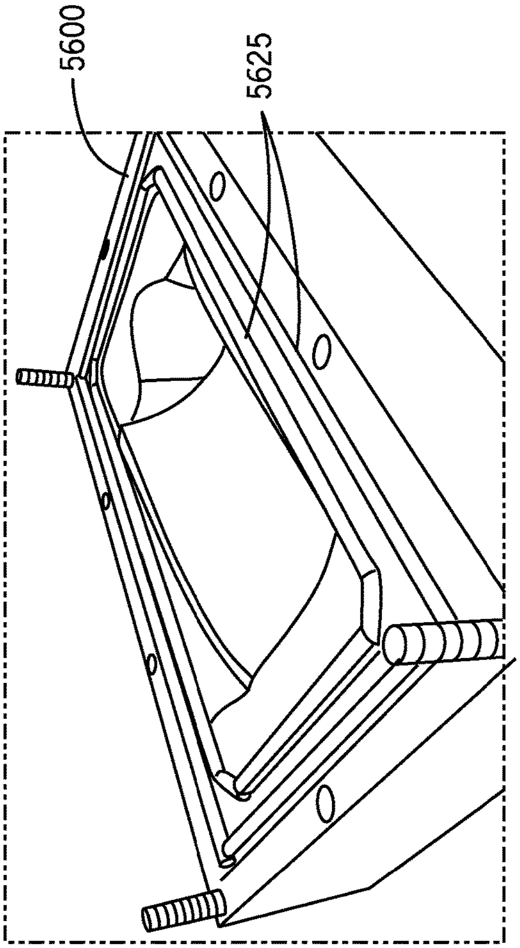
FIG. 56 illustrates a perspective view of a privacy/security enclosure with mesh fabric gaskets according to a further embodiment of the invention.
Figure 57B:
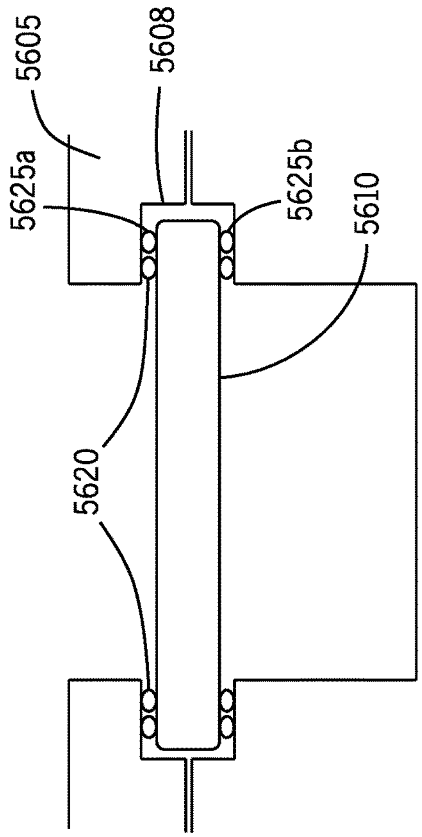
FIGS. 57A-57B illustrate a perspective view of a privacy/security enclosure with mesh fabric gaskets according to a further embodiment of the invention.
Figure 57A:
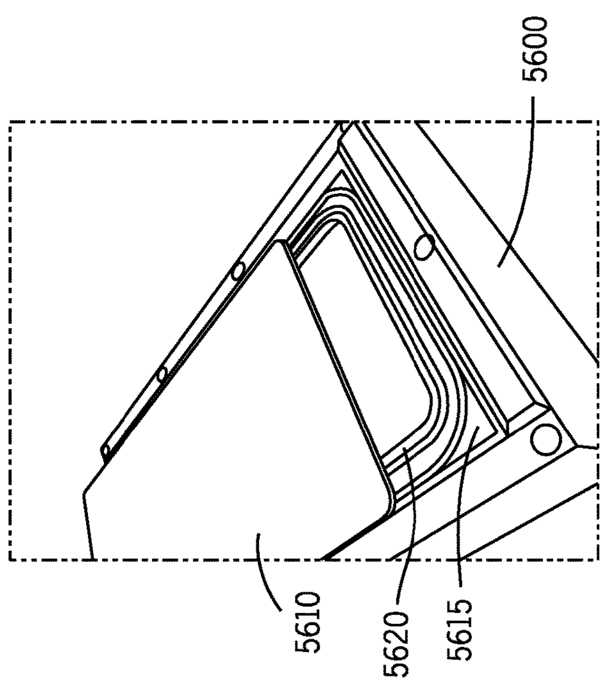

FIG. 56 illustrates a perspective view of a privacy/security enclosure 5600 with mesh fabric gaskets 5625 according to a further embodiment of the invention. In some embodiments, two rows of mesh fabric gaskets 5625 can be formed into a u-shaped channel or groove of the privacy/security enclosure 5600. FIGS. 57A-57B illustrates a perspective view of a privacy/security enclosure 5600 with mesh fabric gaskets according to a further embodiment of the invention. For example, the main housing 5605 can include at least one channel 5608 into which a lid portion 5610 can be inserted between gaskets 5620 comprising an upper gasket 5625*a* and a lower gasket 6525*b*.

Figure 58:
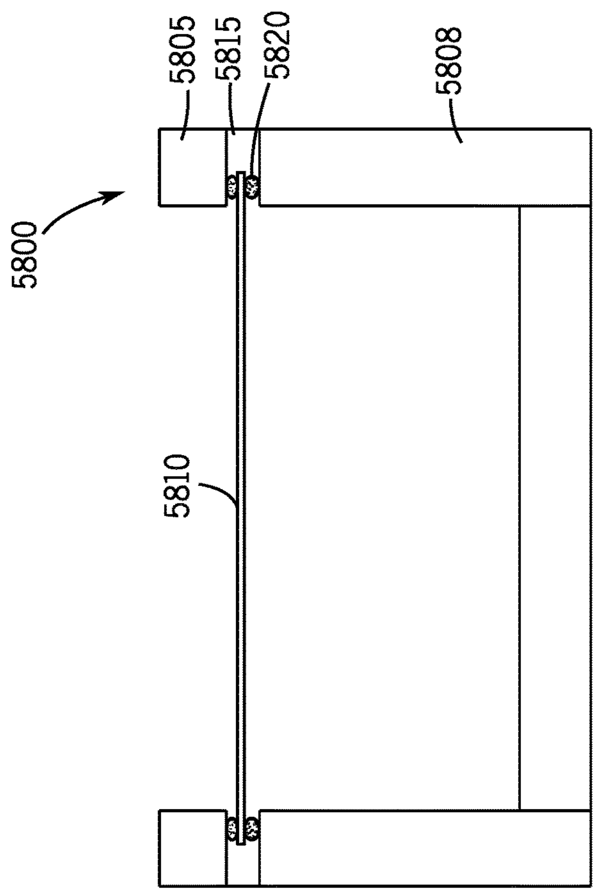
FIG. 58 illustrates a cross-sectional view of a privacy/security enclosure according to one embodiment of the invention.

Further gasket configurations can be seen in FIG. 58 illustrating a cross-sectional view of a privacy/security enclosure 5800 according to one embodiment of the invention. A lid or gasket portion 5810 can be positioned between an interface 5815 formed between an upper portion 5805 and lower portion 5808 of the privacy/security enclosure 5800. In some embodiments, gaskets 5820 can be positioned in the interface 5815 between the upper and lower portions 5805, 5808. In some embodiments, a single gasket can be used placed in the interface 5815 between the lid or gasket portion 5810 and the upper portion 5805, or between the lid or gasket portion 5810 and the lower portion 5805.

Figure 59:
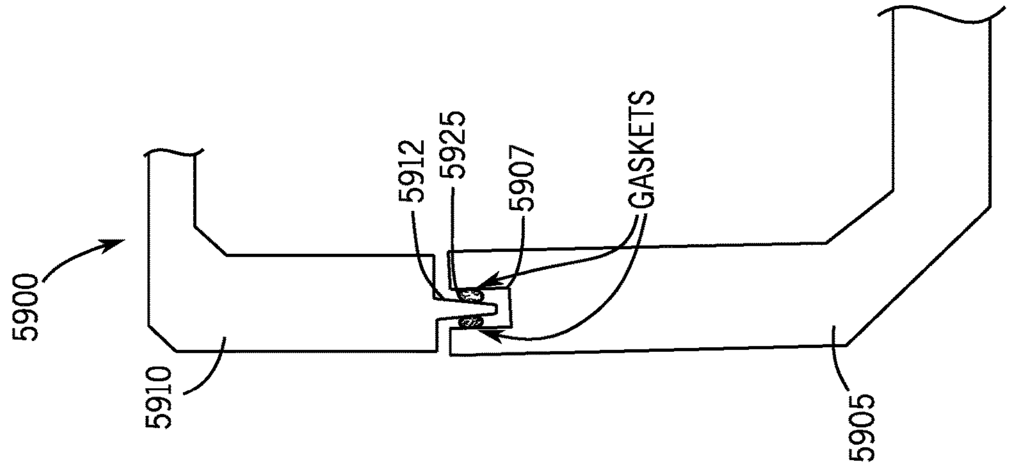
FIG. 59 illustrates a cross-sectional view of an edge of a privacy/security enclosure according to one embodiment of the invention.

FIG. 59 illustrates a cross-sectional view of an edge of a privacy/security enclosure 5900 according to one embodiment of the invention. In some embodiments, the privacy/security enclosure 5900 can comprise a lower portion 5905 including a groove 5907, and an upper portion 5910 including a tongue 5912. In some embodiments, tongue 5912 can be positioned in the groove 5907 and one or more gaskets 5925 can be place between the tongue 5912 and the lower portion 5905 (e.g., on one or both sides of the tongue 5912 as described for the example embodiment of FIG. 58).

Figure 60B:
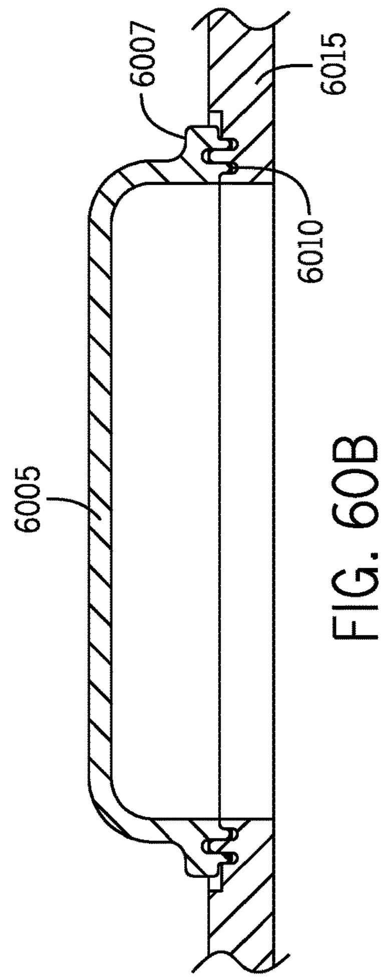
FIG. 60B shows a cross-sectional view of a privacy/security enclosure according to one embodiment of the invention.
Figure 60C:
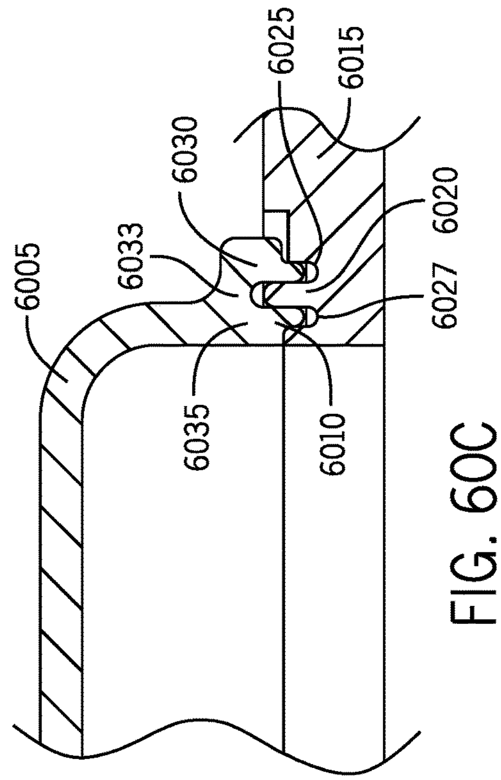
FIG. 60C shows a cross-sectional view of an edge of the privacy/security enclosure shown in FIGS. 60A-60B according to one embodiment of the invention.
Figure 60A:
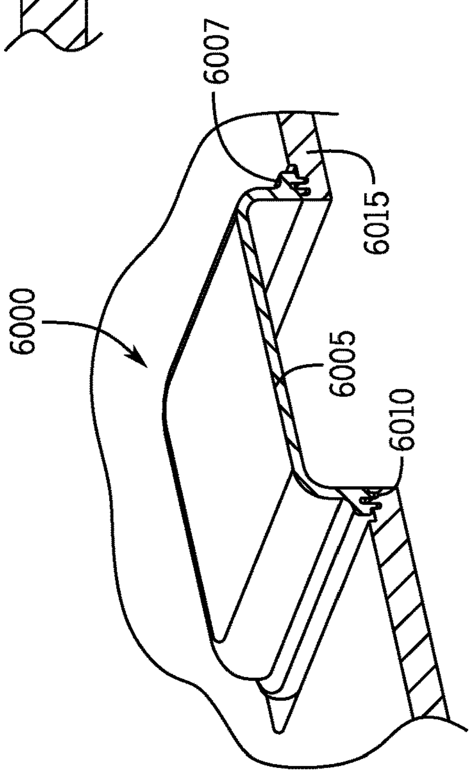
FIG. 60A shows a perspective view of a portion of a privacy/security enclosure according to one embodiment of the invention.

FIG. 60A shows a partial perspective view of a portion of a privacy/security enclosure 6000 according to one embodiment of the invention. FIG. 60B shows a cross-sectional view of a privacy/security enclosure 6000 according to one embodiment of the invention. FIG. 60C shows a cross-sectional view of an edge of the privacy/security enclosure 6000 shown in FIGS. 60A-60B according to one embodiment of the invention. In some embodiments the privacy/security enclosure can comprise lid portion 6005 positioned engaged with a base portion 6015 with a gasket 6010. Referring to FIGS. 60B and 60C, in some embodiments, the base portion 6015 can comprise first groove 6025 and second groove 6027, and the lid portion 6005 can comprise first tongue 6030 and second tongue 6035. The base portion can also comprise a base tongue 6020 between the grooves 6025, 6027, and the lid portion 6005 can comprise a groove 6033 between the tongues 6030, 6035. In some embodiments, the privacy/security enclosure 6000 can comprise a gasket seal 6007 including gasket 6010 comprising the second tongue 6035 positioned in the second groove 6027, the tongue 6020 positioned in the groove 6033, and the first tongue 6030 positioned in the first groove 6025.

Figures 61A, 61B, 61C, 61D, 61E, 61F:
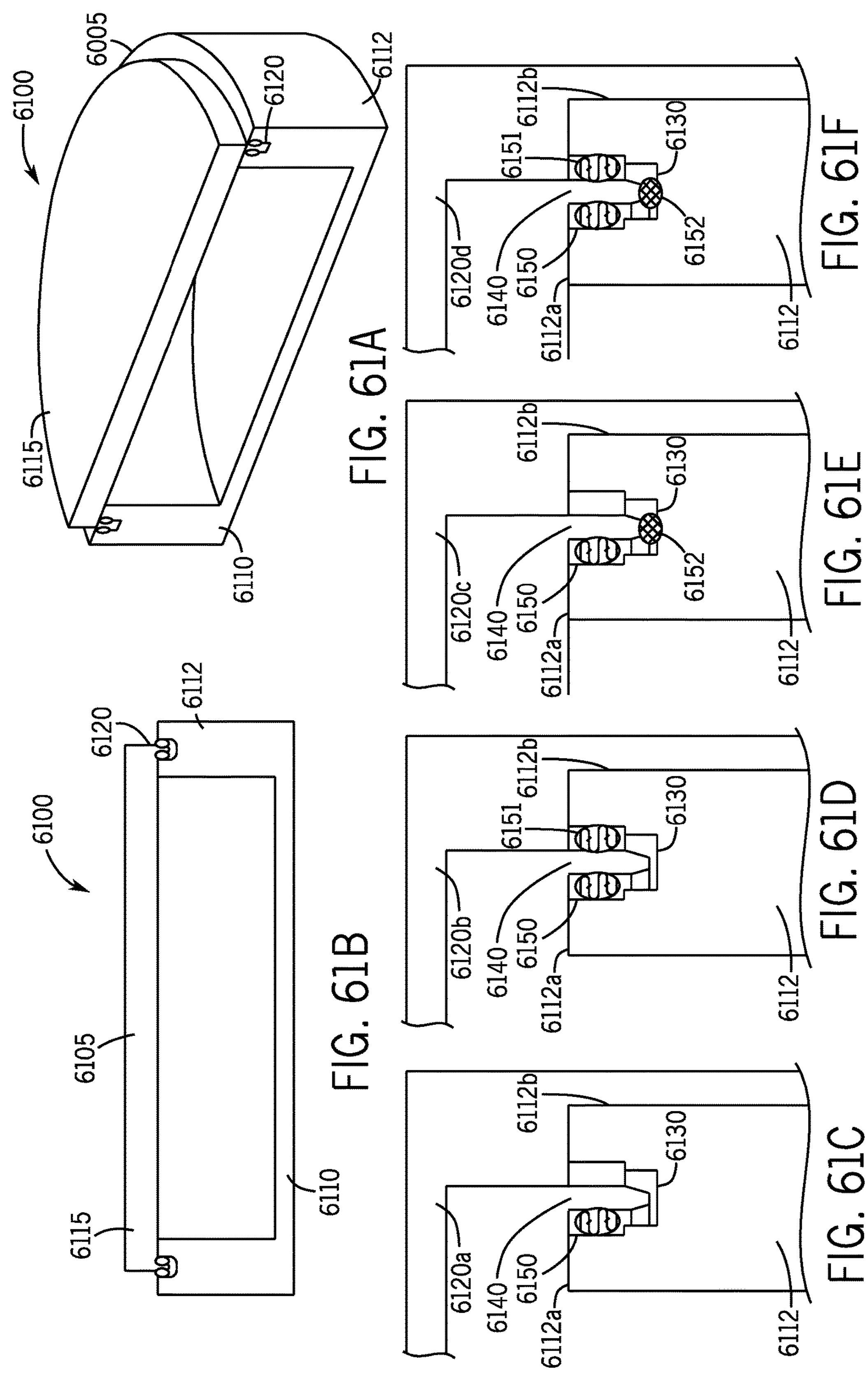
FIG. 61A illustrates a cross-sectional view of a privacy/security enclosure according to one embodiment of the invention.
FIG. 61B illustrates a cross-sectional perspective view of a privacy/security enclosure according to one embodiment of the invention.
FIGS. 61C-61F illustrate various alternative embodiments of gasket seals for a privacy/security enclosure according to one embodiment of the invention.
Figure 62F:
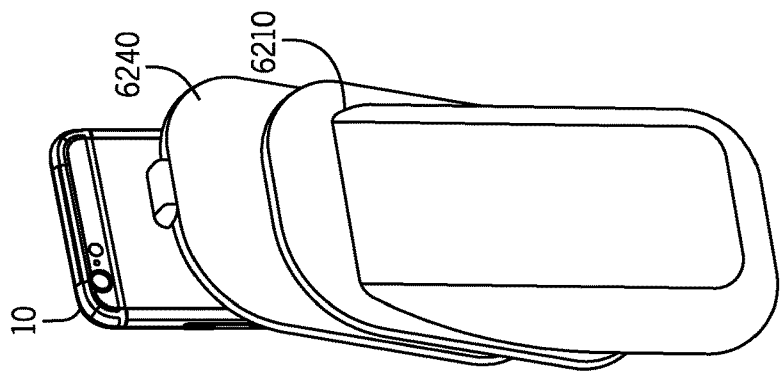
FIGS. 62A-62F illustrate various views of a privacy/security enclosure in progressive stages of opening and device insertion or removal according to one embodiment of the invention.
Figure 62E:
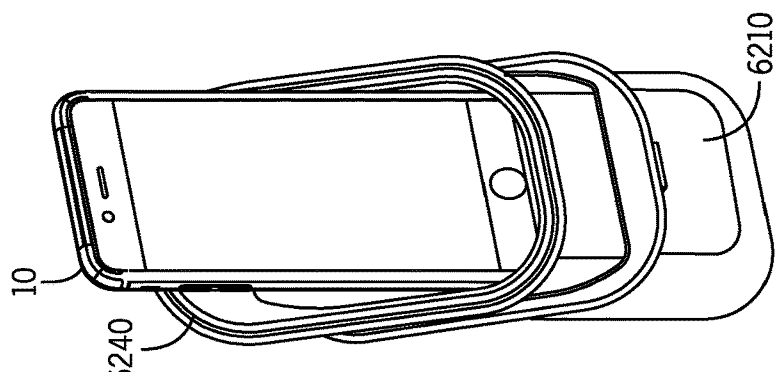
Figure 62D:
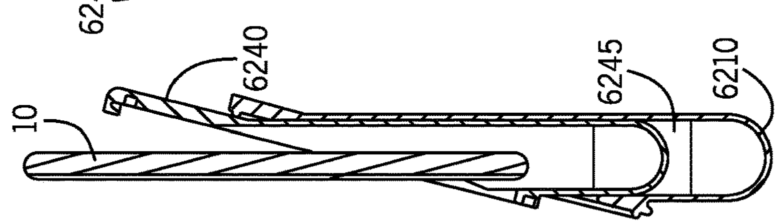
Figure 62C:
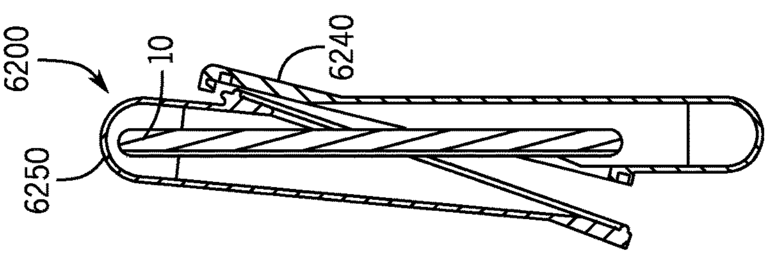
Figure 62B:
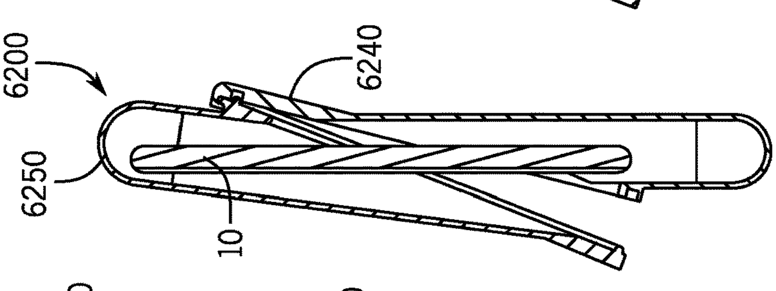
Figure 62A:
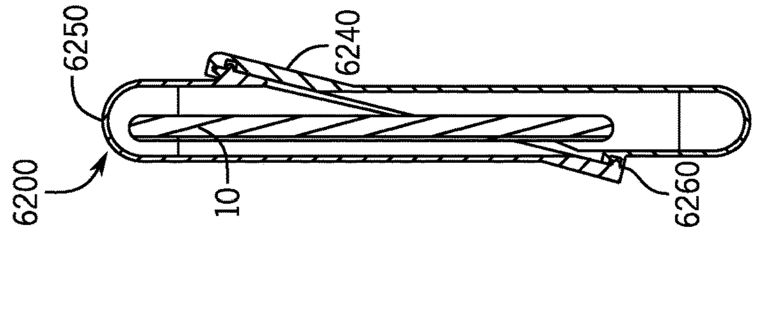

FIG. 61A illustrates a cross-sectional view of a privacy/security enclosure 6100 according to one embodiment of the invention. FIG. 61B illustrates a cross-sectional perspective view of a privacy/security enclosure 6100 according to one embodiment of the invention. Referring to FIGS. 61A-61B, in some embodiments, the main housing 6105 of a privacy/security enclosure 6100 can comprise a base portion 6110 coupled to a lid portion 6115, and a gasket seal 6120 can be formed within the wall 6112 of the base portion 6110. FIGS. 61C-61F illustrate various alternative embodiments of the gasket seals 6120 for a privacy/security enclosure 6100 according to one embodiment of the invention. For example, referring to FIG. 61C, some embodiments include a gasket seal 6120*a* comprising a tongue and groove architecture comprising a groove 6130 and a tongue 6140 at least partially inserted in the groove 6130. In some embodiments, an inner gasket 6150 (e.g., such as a fabric gasket as described earlier) can be positioned in the groove 6130 between the inner wall 6112*a* of the wall 6112 and the tongue 6140. Referring to FIG. 61D, in some embodiments, the gasket seal 6120 can comprise a gasket seal 6120*b*. In this example embodiments, groove 6130 can include tongue 6140 positioned between an inner and outer gasket 6150, 6151. In this instance, the inner gasket 6150 can be positioned in the groove 6130 between the inner wall 6112*a* of the wall 6112 and the tongue 6140, and the outer gasket 6151 can be positioned in the groove 6130 between the outer wall 6112*b* of the wall 6112 and the tongue 6140.

Referring to FIG. 61E, some embodiments include a gasket seal 6120*c* comprising a tongue and groove architecture comprising a groove 6130 and a tongue 6140 at least partially inserted in the groove 6130. In some embodiments, an inner gasket 6150 can be positioned in the groove 6130 between the inner wall 6112*a* of the wall 6112 and the tongue 6140, and a base gasket 6152 (e.g., such as a mesh gasket) can be positioned at the bottom of the groove 6130 between the tip of the tongue and the bottom of the groove 6130. Referring to FIG. 61F, in some embodiments, the gasket seal 6120 can comprise a gasket seal 6120*d*. In this example embodiments, groove 6130 can include tongue 6140 positioned between an inner and outer gasket 6150, 6151. In this instance, the inner gasket 6150 can be positioned in the groove 6130 between the inner wall 6112*a* of the wall 6112 and the tongue 6140, and the outer gasket 6151 can be positioned in the groove 6130 between the outer wall 6112*b* of the wall 6112 and the tongue 6140. Further, an inner gasket 6150 can be positioned in the groove 6130 between the inner wall 6112*a* of the wall 6112 and the tongue 6140, and a base gasket 6152 (e.g., such as a mesh gasket) can be positioned at the bottom of the groove 6130 between the tip of the tongue and the bottom of the groove 6130.

Some embodiments include pivoting and/or articulating privacy/security enclosures that can enable functional and elegant options for a user to insert or remove a device (e.g., such as user device 10). For example, FIGS. 62A-62F various views of a privacy/security enclosure 6200 in progressive stages of opening and device insertion or removal according to one embodiment of the invention. In some embodiments, the privacy/security enclosure 6200 can comprise a lower case 6210, coupled to an inner enclosure 6245 and an articulating enclosure 6240. In some embodiments, an outer case or shell 6250 can at least partially enclosure the inner enclosure 6245. In some embodiments, a user can use a latch 6260 to open the privacy/security enclosure 6200 enabling the articulating enclosure 6240 to pivot, and for the case or shell 6250 to be removed (shown progressively in FIGS. 62A-62D.

Figure 63A:
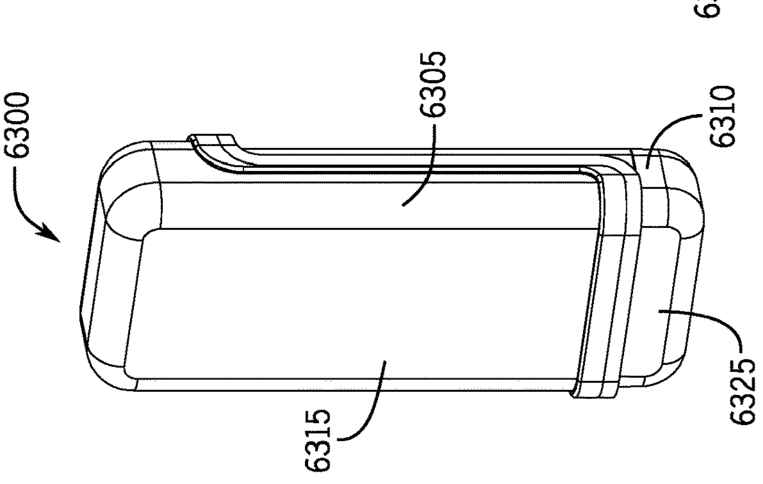
FIG. 63A illustrates a perspective view of a closed privacy/security enclosure according to one embodiment of the invention.
Figure 63B:
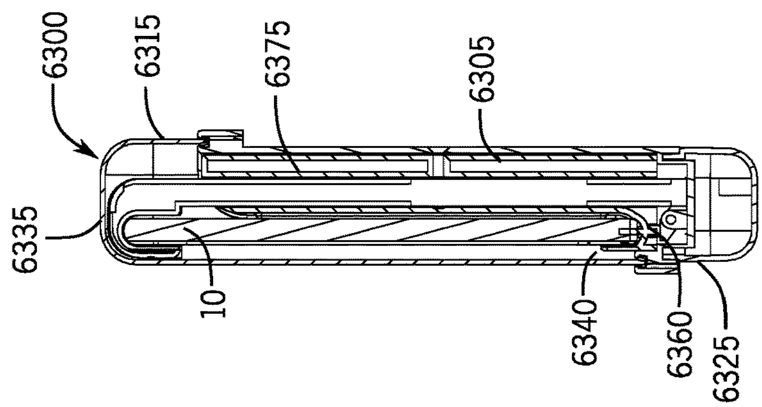
FIG. 63B illustrates a cross-sectional view of the privacy/security enclosure of FIG. 63A according to one embodiment of the invention.
Figure 63C:
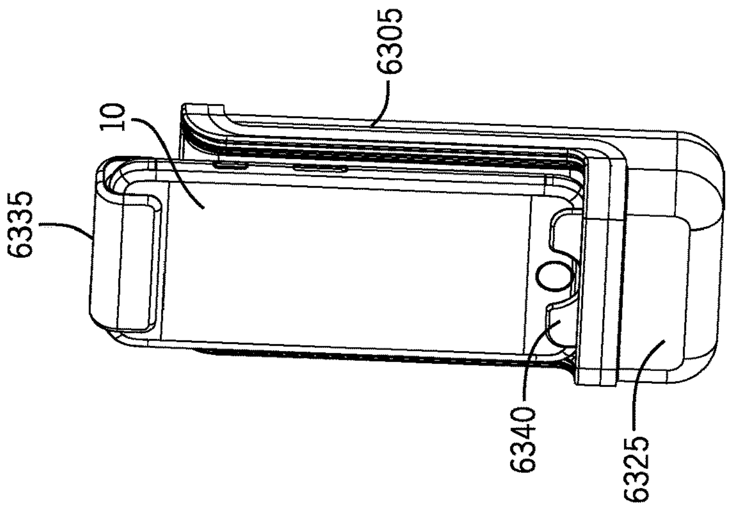
FIG. 63C illustrates the privacy/security enclosure of FIG. 63A in an open configuration according to one embodiment of the invention.
Figure 63D:
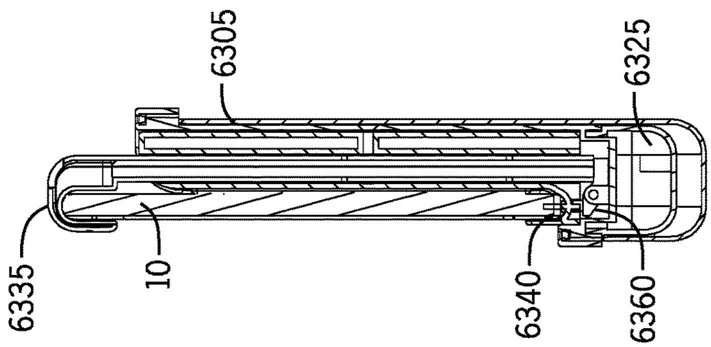
FIG. 63D illustrates a cross-sectional view of the privacy/security enclosure of FIG. 63C according to one embodiment of the invention.

FIG. 63A illustrates a perspective view of a closed privacy/security enclosure 6300 according to one embodiment of the invention. FIG. 63B illustrates a cross-sectional view of the privacy/security enclosure of FIG. 63A according to one embodiment of the invention. FIG. 63C illustrates the privacy/security enclosure of FIG. 63A in an open configuration according to one embodiment of the invention. FIG. 63D illustrates a cross-sectional view of the privacy/security enclosure of FIG. 63C according to one embodiment of the invention. Some embodiments include a main housing 6305 comprising a base assembly 6310, a case or cover 6315, a base cover 6325, and a hood 6335. In some embodiments, an articulation assembly 6360 can be used to extend the enclosure 6340 including an inside RF shield 6375 from the base assembly 6310.

Figure 64A:
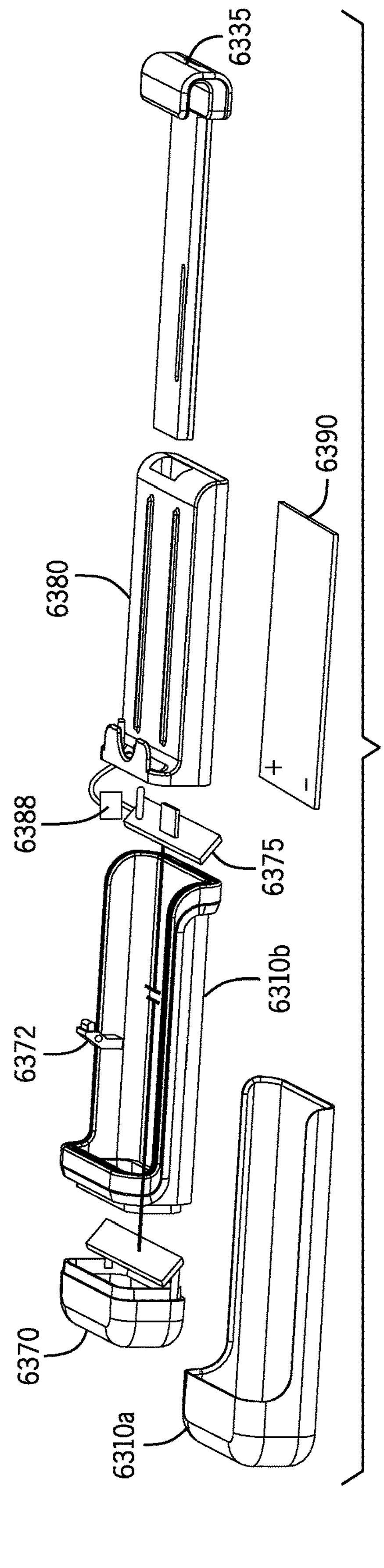
FIG. 64A illustrates an assembly view of a privacy/security enclosure according to one embodiment of the invention.
Figure 64B:
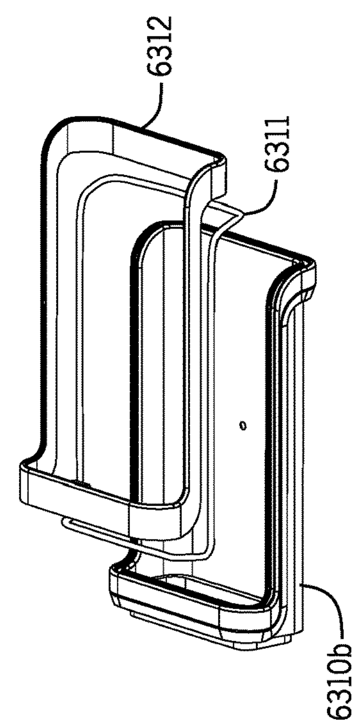
FIG. 64B illustrates a base shell assembly view of a privacy/security enclosure according to one embodiment of the invention.
Figure 64C:
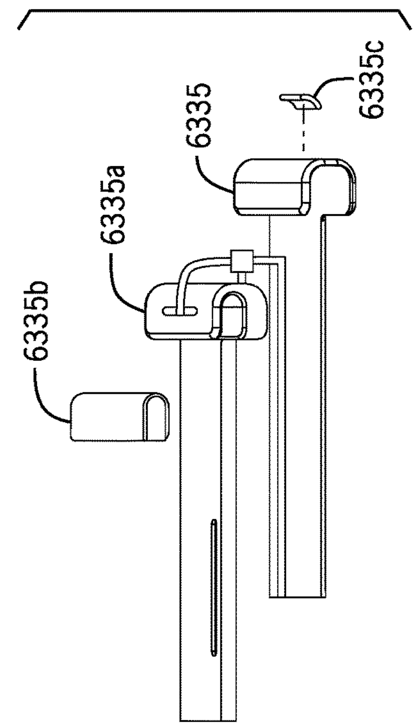
FIG. 64C illustrates a hood sub-assembly view of a privacy/security enclosure according to one embodiment of the invention.
Figures 65A, 65B, 65C, 65D, 65E:
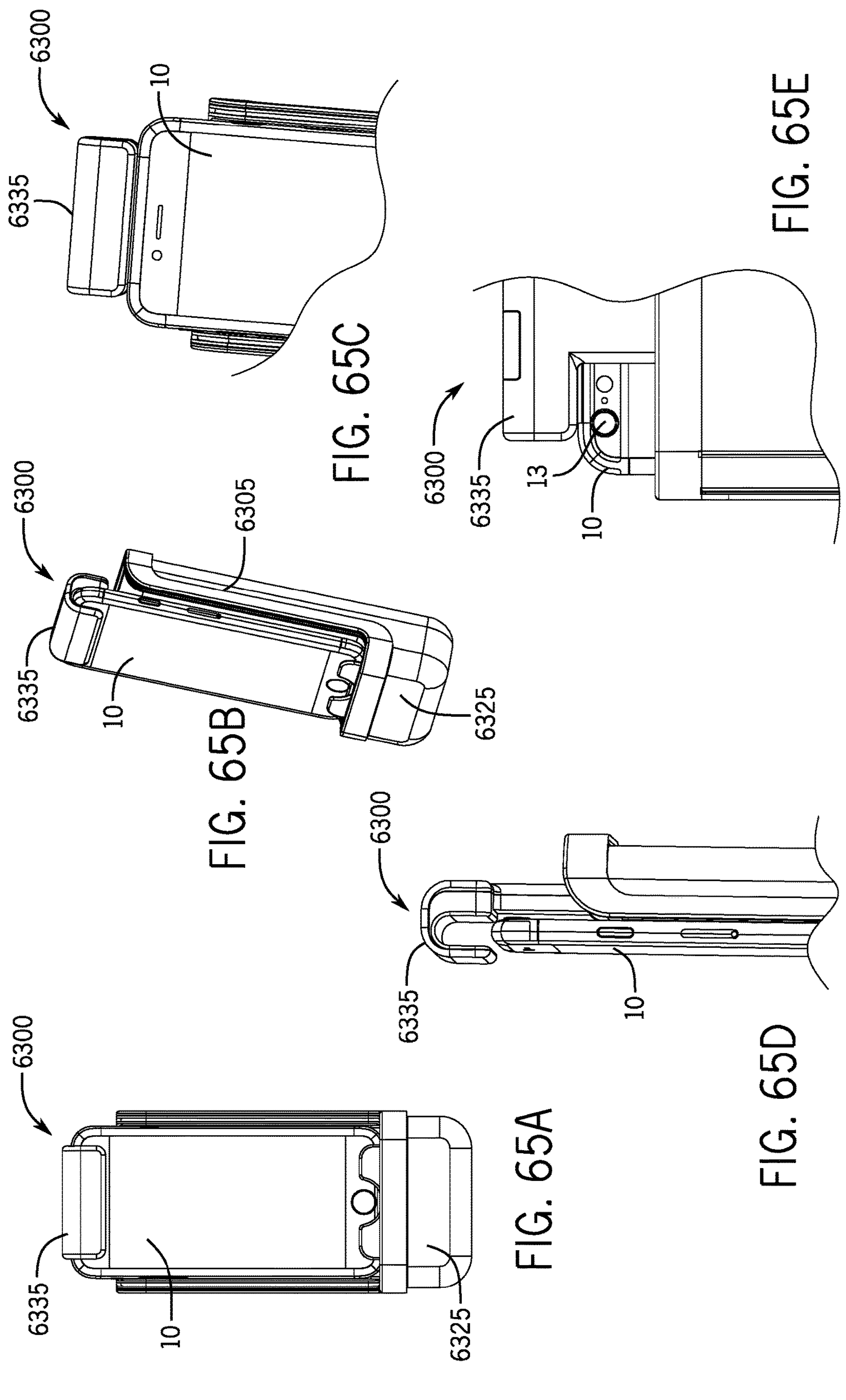
FIGS. 65A-65E depict various views of a privacy/security enclosure in use according to one embodiment of the invention.

FIG. 64A illustrates an assembly view of an example embodiment of a privacy/security enclosure according to one embodiment of the invention. FIG. 64B illustrates a base shell assembly view of a privacy/security enclosure according to one embodiment of the invention. Some embodiments include a cover 6310*a* and a base shell 6310*b* including a gasket 6311 coupled to a base shell bezel 6312. Some embodiments include a base assembly 6370 coupled to base shell 6310*b*. Embodiments of the assembly can comprise a lower gasket lever 6372, electronics/PCB (inside RF case) 6375. Some embodiments include phone bed 6380, hood 6385, and masking speaker 6388. Referring to FIG. 64C illustrating a hood sub-assembly view of a privacy/security enclosure according to one embodiment of the invention, some embodiments include a hood exterior 6335 coupled to a hood interior 6335*a*, with coupled gasket 6335*b*. Some embodiments include one or more indicators of function and/or privacy such as an integrated hood—LED beacon 6335*c*. FIGS. 65A-65E depicts various views of a privacy/security enclosure 6300 in use according to one embodiment of the invention. For example, some embodiments include a privacy/security enclosure 6300 including a base assembly 6325 coupled to a user device 10. As shown in FIG. 65E, the hood exterior 6335 can enable a device camera 13 of the user device 10 to have viewing access when extended from the main housing.

Figure 66C:
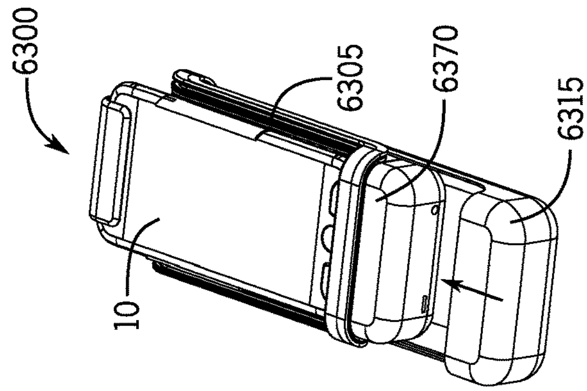
FIGS. 66A-66C depict various views of a privacy/security enclosure in use according to one embodiment of the invention.
Figure 66B:
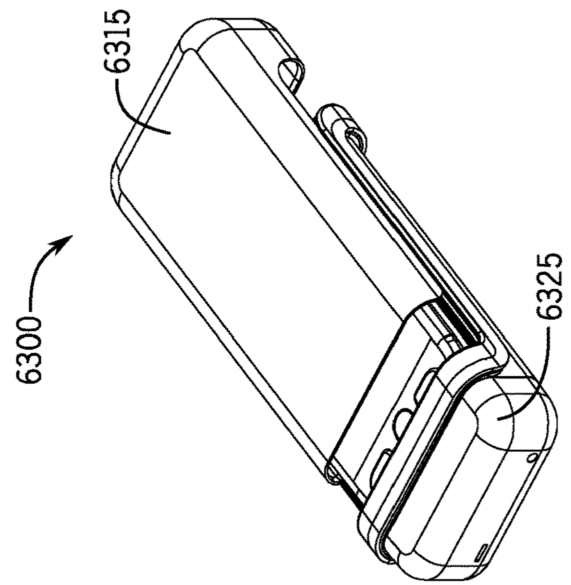
Figure 66A:
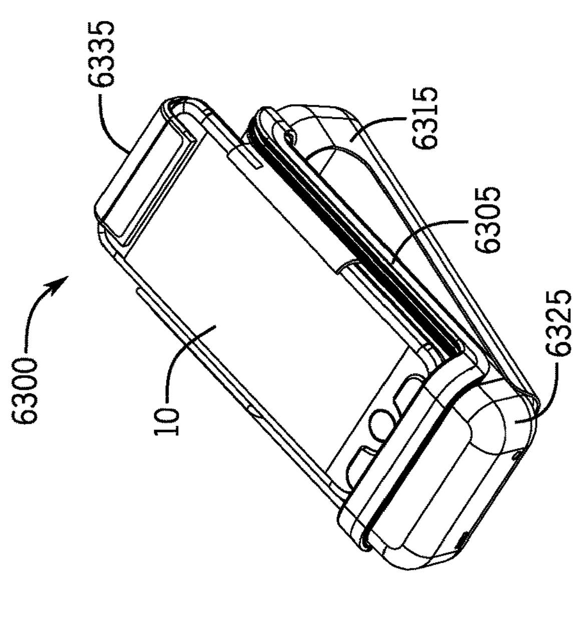
Figure 67C:
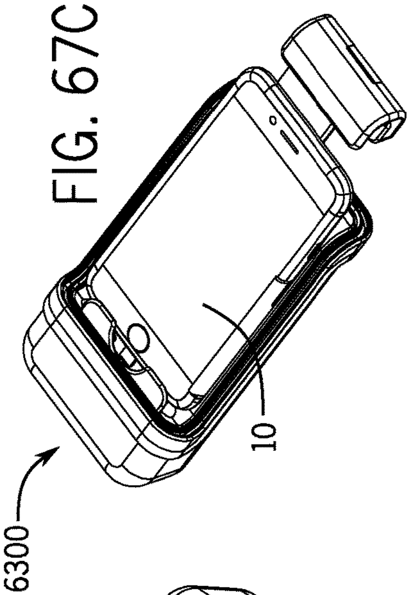
FIGS. 67A-67F depict various views of a privacy/security enclosure in use according to one embodiment of the invention.
Figure 67F:
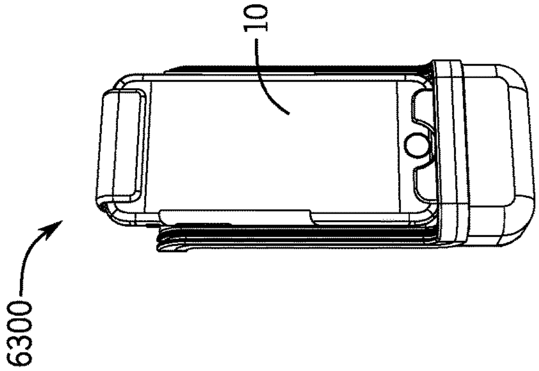
Figure 67B:
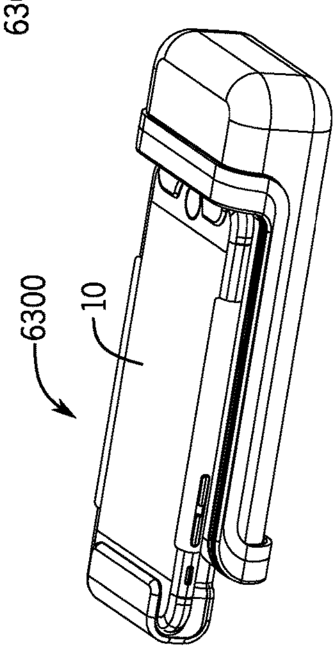
Figure 67E:
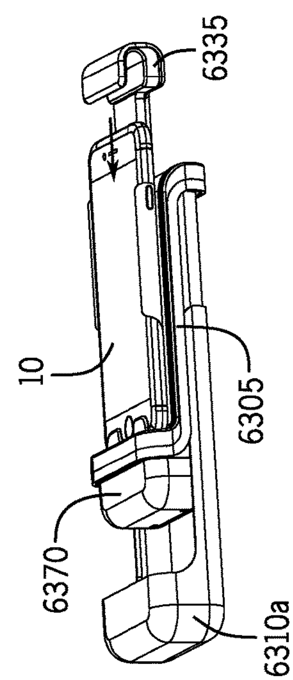
Figure 67A:
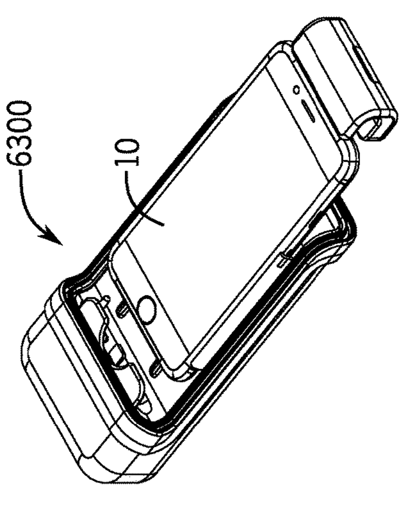
Figure 67D:
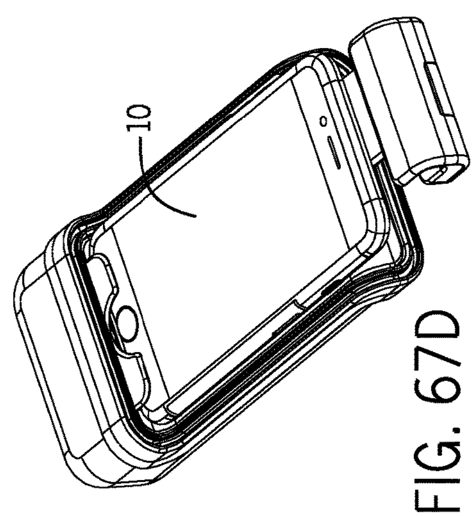

Referring to FIGS. 66A-66C depicts various views of a privacy/security enclosure 6300 in use according to one embodiment of the invention. In some embodiments, the enclosure 6305 can be positioned in or on the case or shell 6315. For example, in some embodiments, the enclosure 6305 including hood 6335 and Faraday base 6370 can be removed from the case or shell 6315 (shown in removal process FIG. 66B and FIG. 66C), and turned over and reversed in position to enable the enclosure 6305 including hood 6335 and Faraday base 6370 to be placed in an elevated position on the case or shell 6315. FIGS. 67A-67F depicts various views of a privacy/security enclosure 6300 in use according to one embodiment of the invention, and show views of the interaction between the enclosure 6305 and the case or shell 6315 (shown as 6310*a* in FIG. 67E). Further, as shown in FIG. 67E, the hood 6335 can be extended away from the user device 10 to enable insertion and removal of the user device 10.

Figure 69:
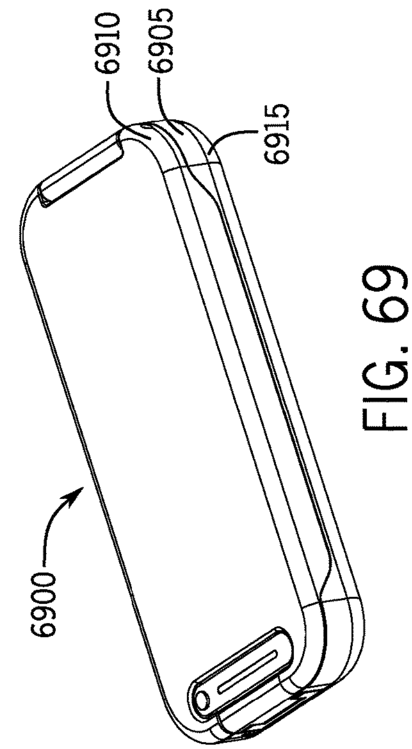
FIG. 69 shows a privacy/security enclosure according to another embodiment of the invention.
Figure 70:
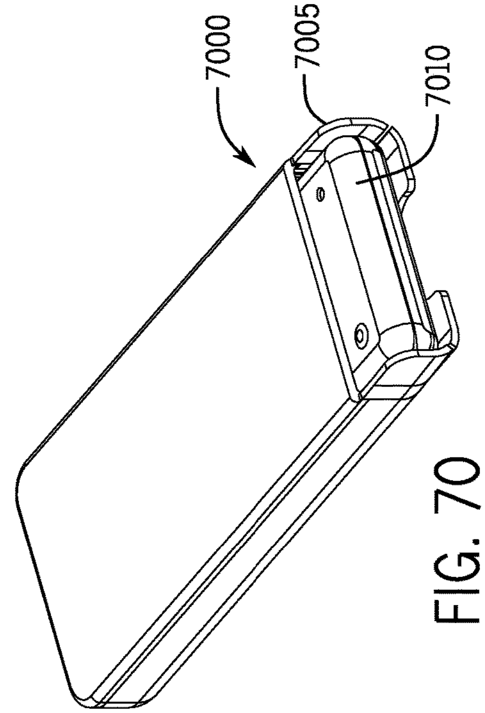
FIG. 70 shows a privacy/security enclosure according to another embodiment of the invention.
Figure 68:
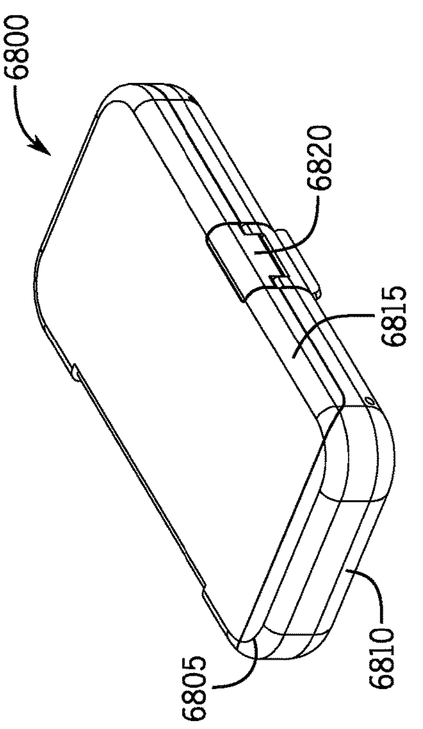
FIG. 68 shows a privacy/security enclosure according to another embodiment of the invention.

FIG. 68 shows a privacy/security enclosure 6800 according to another embodiment of the invention. Some embodiments include a main housing 6805 comprising a base portion 6810 and lid portion 6815. In some embodiments, the hinge mechanism 6820 main housing 6805 can be pivoted with respect to the base portion 6810. FIG. 69 shows a further example of a privacy/security enclosure 6900 according to another embodiment of the invention. Some embodiments include a main housing 6905 comprising a lid portion 6910 and base portion 6915. FIG. 70 shows another example of a privacy/security enclosure 7000 according to another embodiment of the invention. Some embodiments include a case or shell 7005 enveloping an enclosure 7010. In some embodiments, the main housing 7010 can be removed from the case or shell 7005 to enable access to a user's device.

Figures 71A, 71B, 71C, 71D:
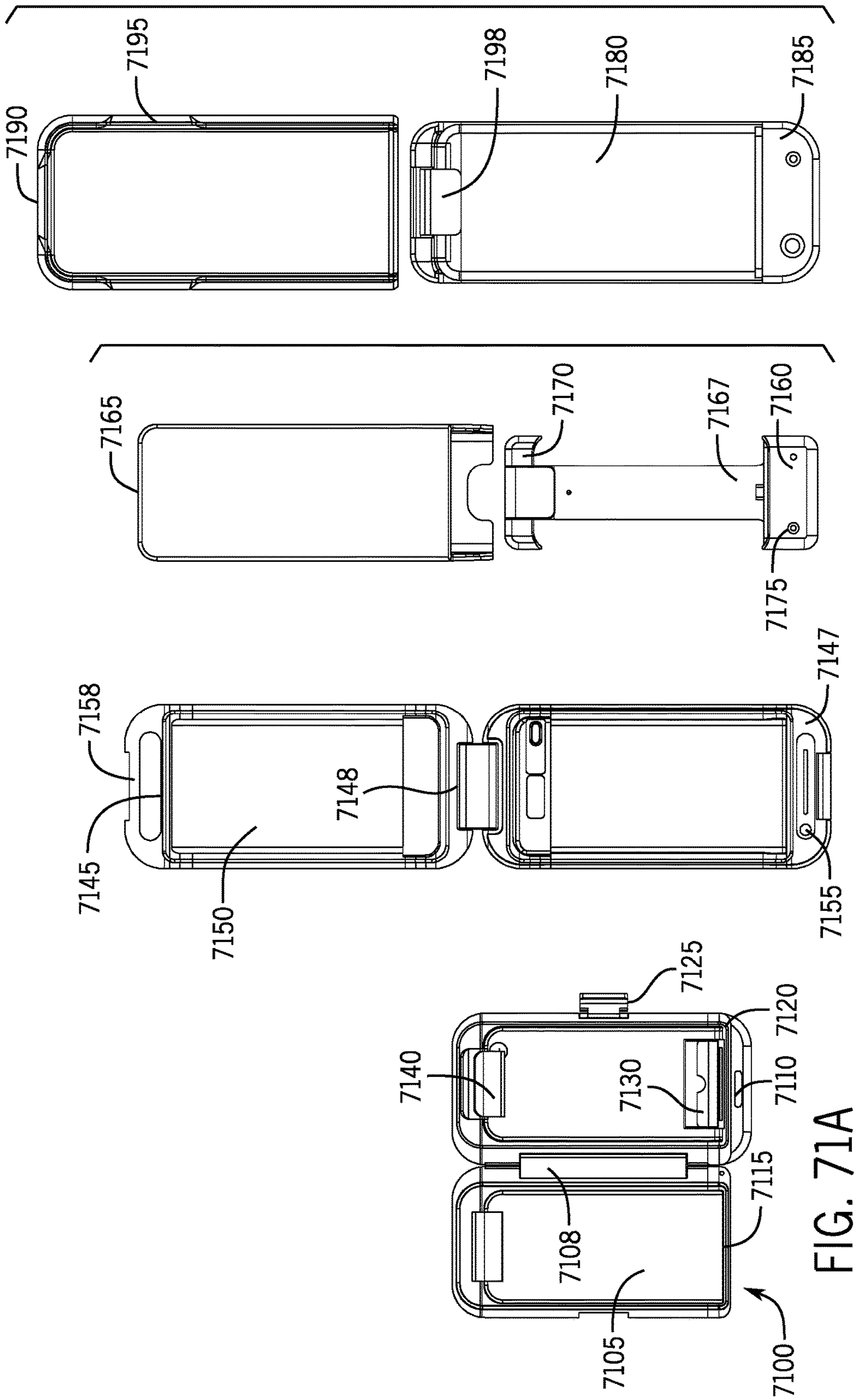
FIGS. 71A-71D show privacy/security enclosures according to various embodiments of the invention.

FIGS. 71A-71D shows privacy/security enclosures according to various embodiments of the invention. FIG. 71A shows a privacy/security enclosure 7100 comprising a main housing 7105 including a base portion 7110 pivotably coupled to a lid portion 7115 using a hinge 7108. The enclosure 7120 shown within the privacy/security enclosure 7100 can comprise a base enclosure 7130 and hood enclosure 7140 that can be accessed by opening the privacy/security enclosure 7100 using a latch 7125. Further, FIG. 71B shows a privacy/security enclosure 7150 including a base portion 7147 coupled to a lid portion 7145 using a hinge 7148. The base enclosure 7155 shown can be accessed by opening the privacy/security enclosure 7150 using a latch 7158. FIG. 71C shows enclosure 7160 comprising a main cover or shell 7165 that can enclose enclosure 7167 comprising a base enclosure 7175 and hood enclosure 7170. FIG. 71D shows enclosure 7180 including base enclosure 7185 and hood enclosure 7198, and a cover or shell 7190 comprising an inner region 7195 into which the enclosure 7180 can be inserted.

Figure 72B:
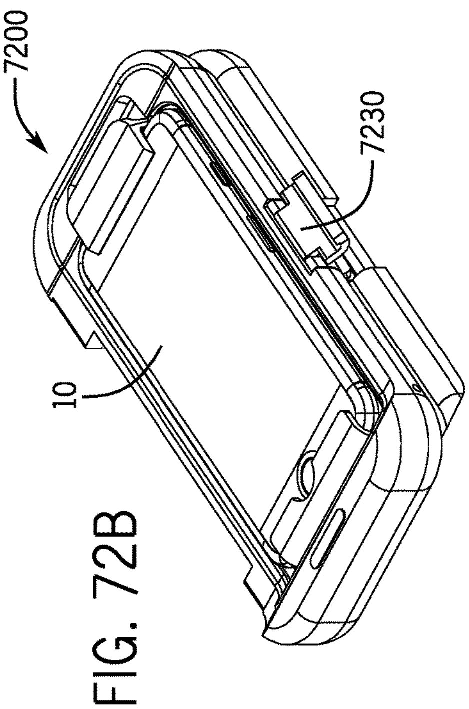
FIGS. 72A-72D depict a privacy/security enclosure in use in accordance with some embodiments of the invention.
Figure 72D:
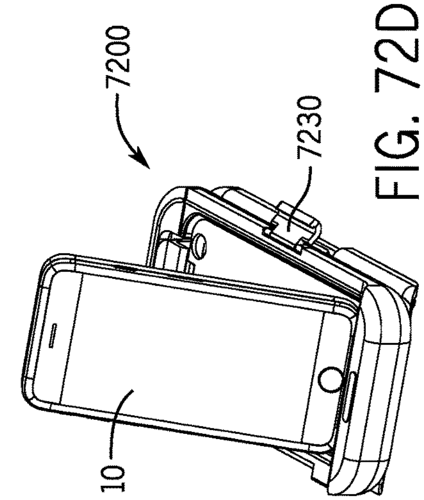
Figure 72A:
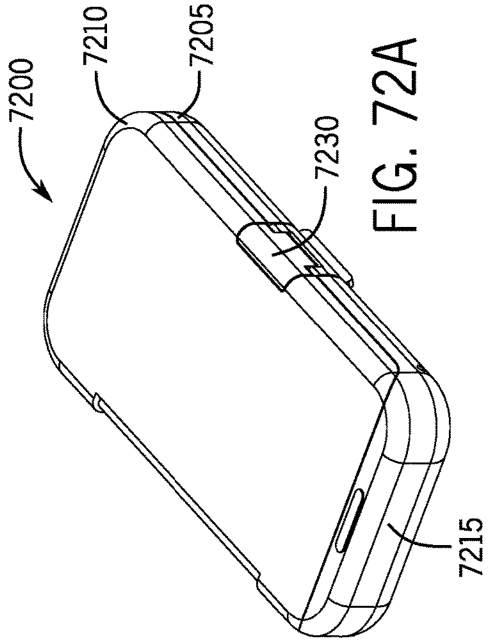
Figure 72C:
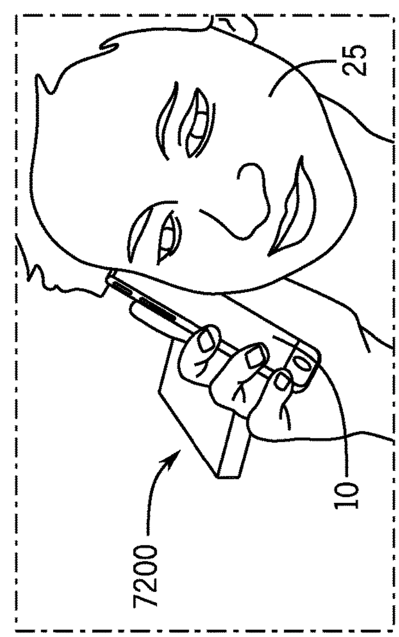
Figure 73B:
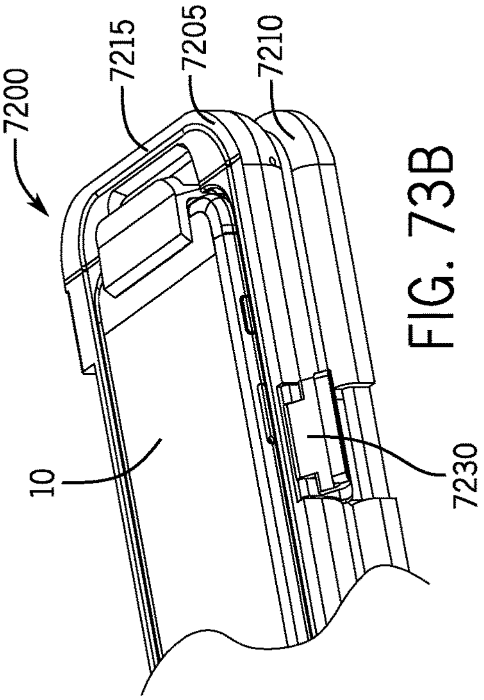
FIGS. 73A-73C depict a privacy/security enclosure in use in accordance with some embodiments of the invention.
Figure 73C:
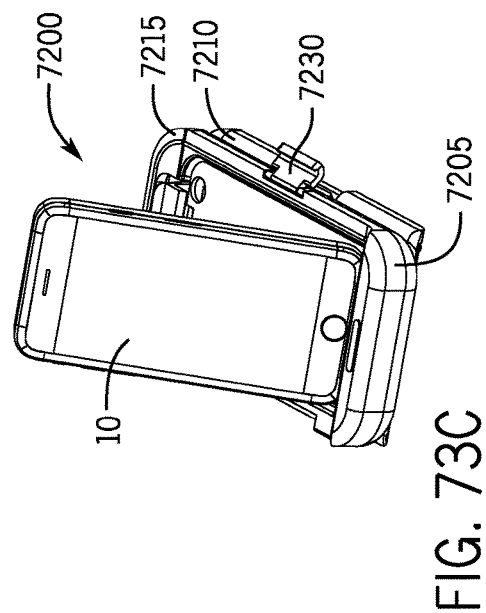
Figure 73A:
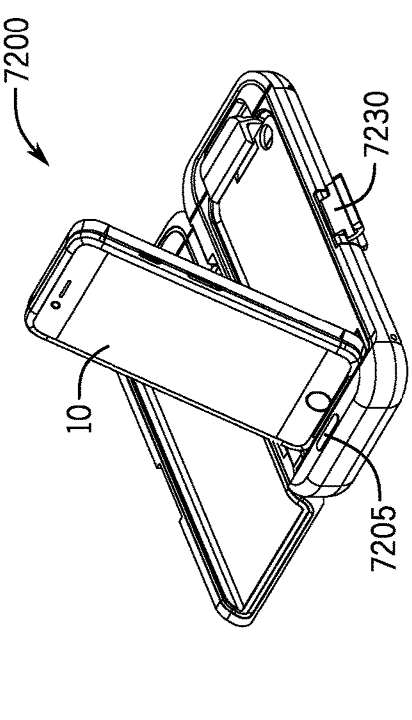
Figure 74A:
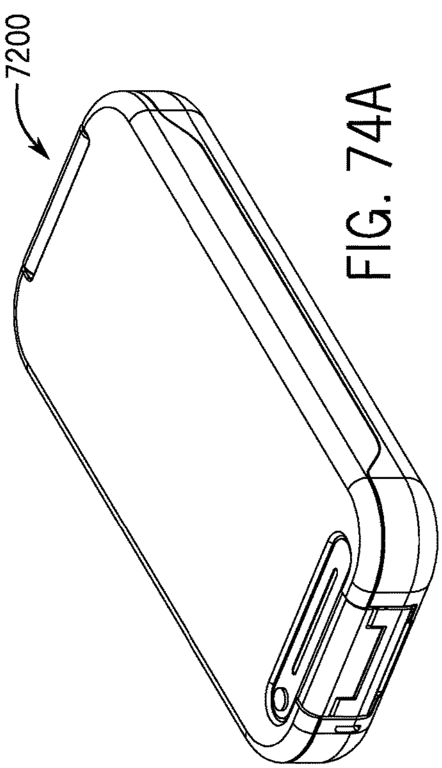
FIGS. 74A-74D depict a privacy/security enclosure in use in accordance with some embodiments of the invention.
Figure 74B:
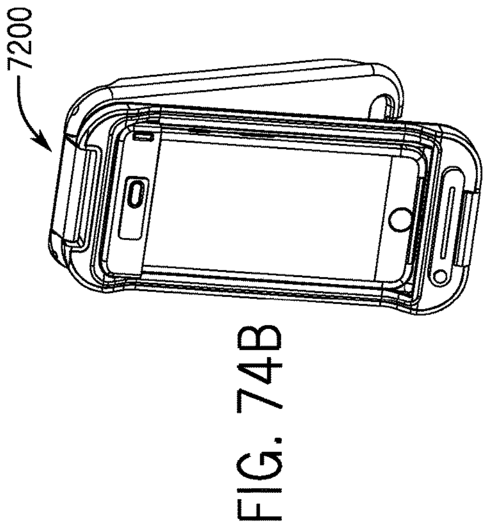
Figure 74C:
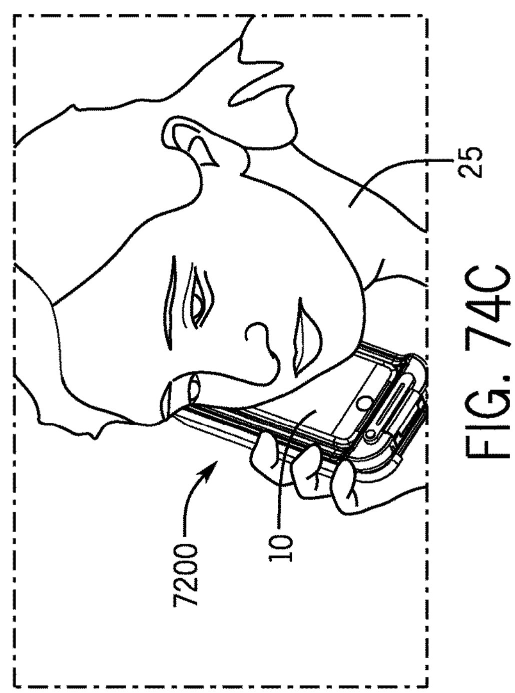
Figure 74D:
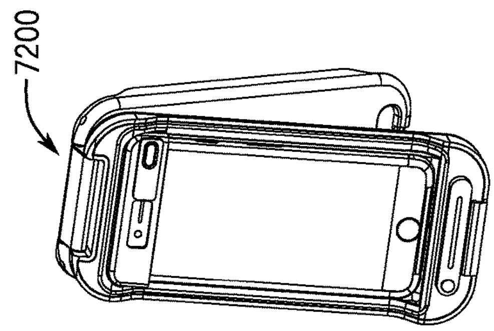
Figure 75A:
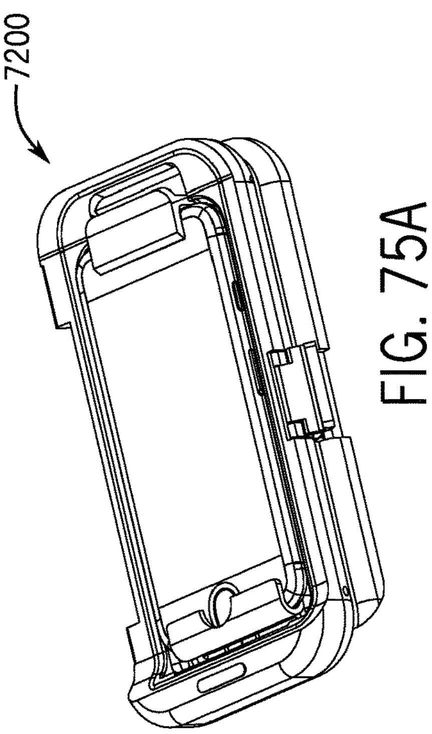
FIGS. 75A-75F depict a privacy/security enclosure in use in accordance with some embodiments of the invention.
Figure 75B:
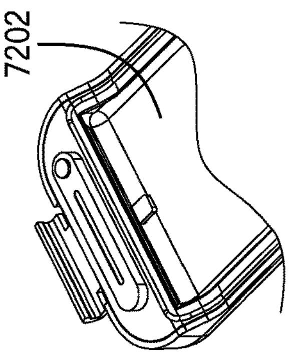
Figure 75C:
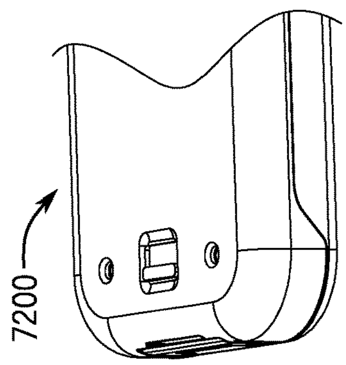
Figure 75D:
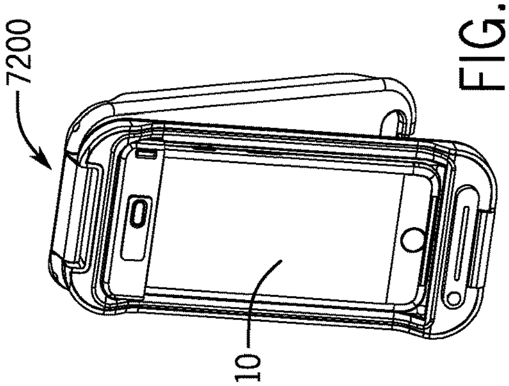
Figure 75E:
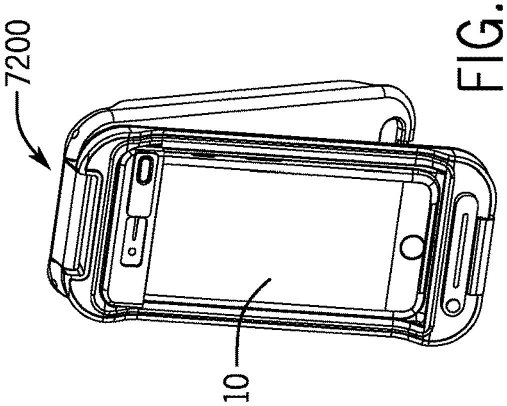
Figure 75F:
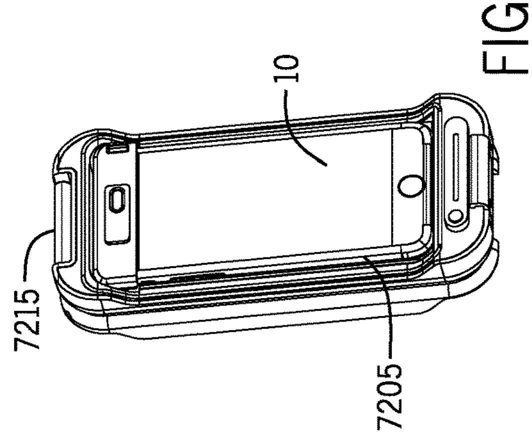
Figure 76A:
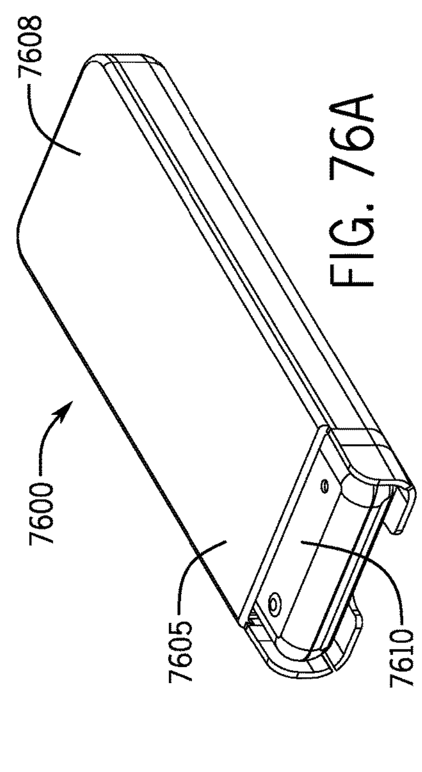
FIGS. 76A-76D depict a privacy/security enclosure in use in accordance with some embodiments of the invention.
Figure 76B:
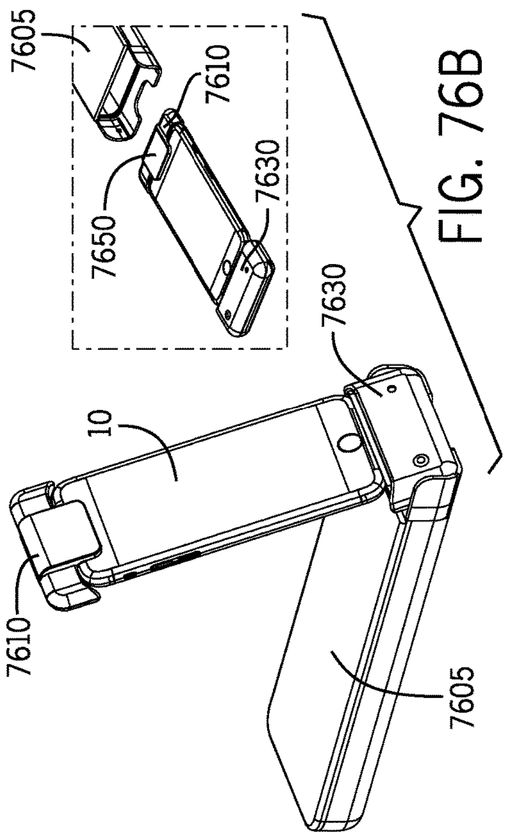
Figure 76C:
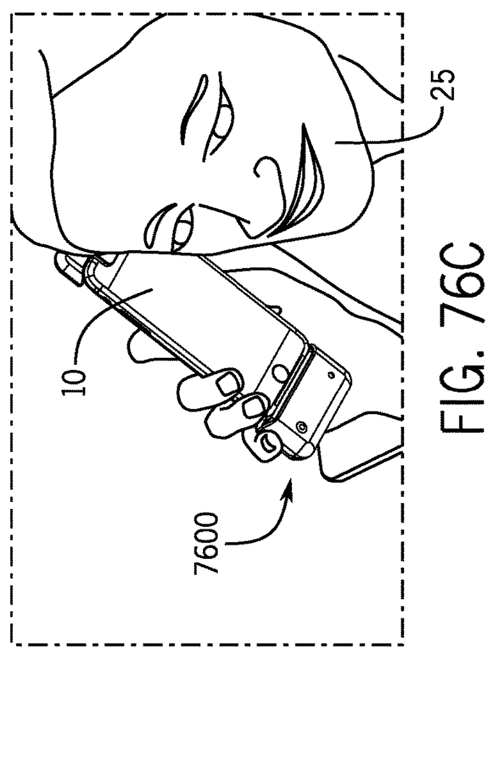
Figure 76D:
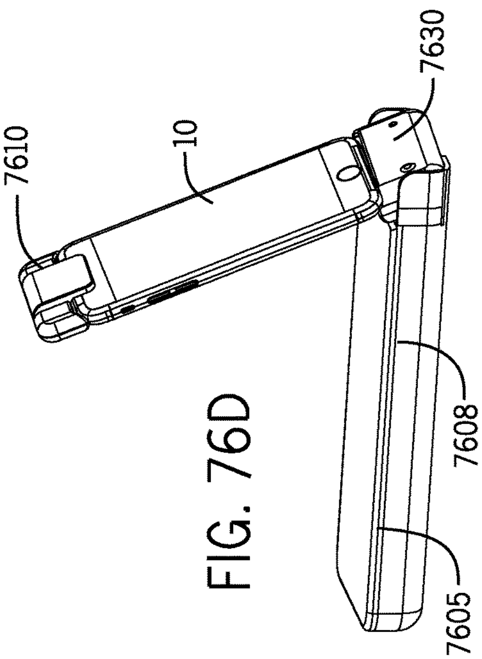

FIGS. 72A-72D depicts a privacy/security enclosure 7200 in use in accordance with some embodiments of the invention. Referring to FIG. 72A, the privacy/security enclosure 7200 can comprise a main housing 7205 including a cover or shell 7210 enclosing an enclosure 7215 and including a latch 7230. As shown in FIG. 72B, the user device 10 can be positioned in the enclosure 7215 to provide some privacy while the cover or shell is removed and/or folder away from the enclosure 7215. The user device 10 can be removed from the privacy/security enclosure 7200 for use by a user (as depicted in FIG. 72C showing user 25). The user device 10 can also be mounted in the privacy/security enclosure 7200 using a standing feature (shown in FIG. 72D). Further views of the privacy/security enclosure 7200 are shown in FIGS. 73A-73C, FIGS. 74A-74D, and FIGS. 75A-75F depicting a privacy/security enclosure 7200 in use in accordance with some embodiments of the invention.

Figures 77A, 77B, 77C:
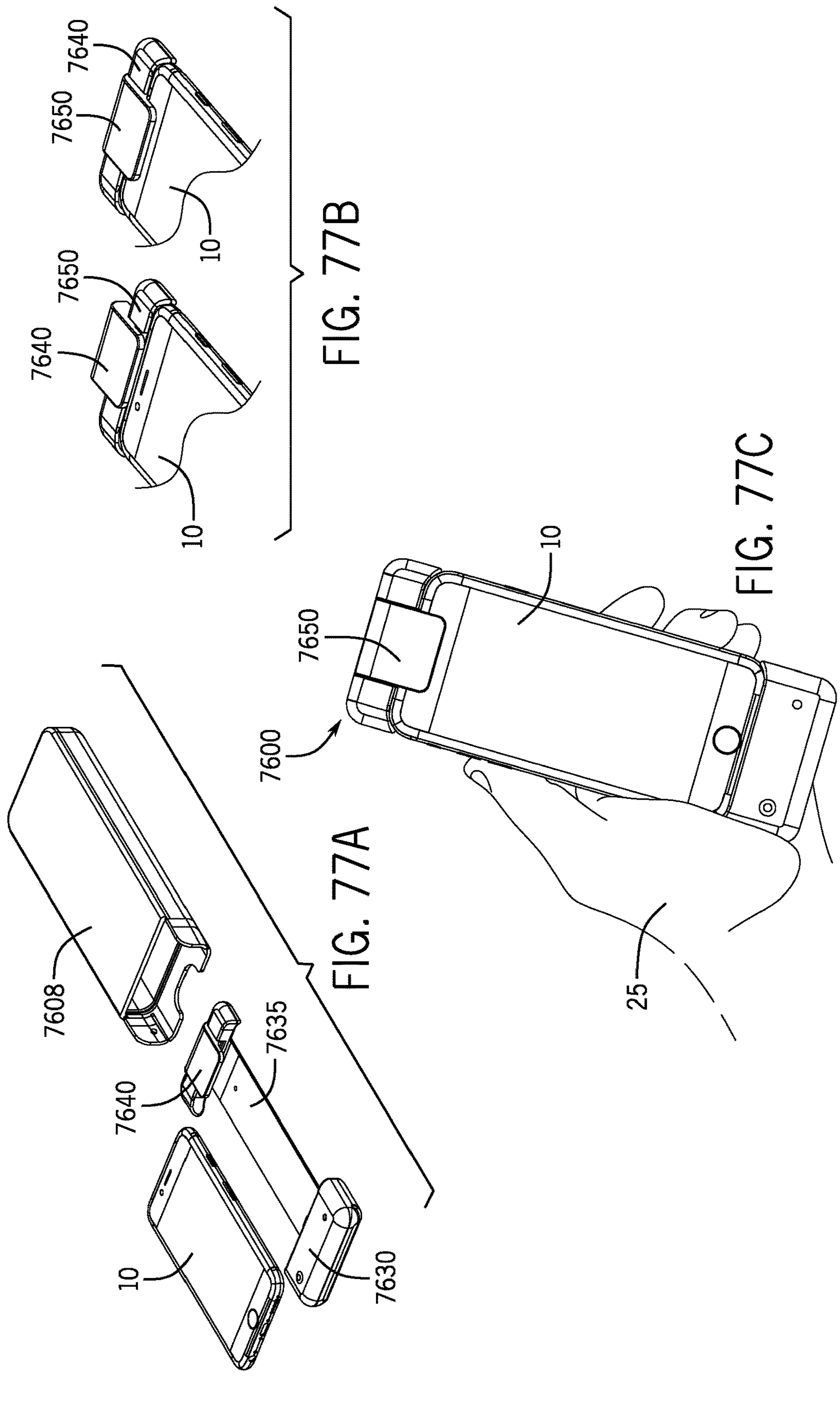
FIGS. 77A-77C depict a privacy/security enclosure in use in accordance with some embodiments of the invention.

FIGS. 76A-76D depicts a privacy/security enclosure 7600 in use in accordance with some embodiments of the invention, and FIGS. 77A-77C depicts a privacy/security enclosure 7600 in use in accordance with some embodiments of the invention. In some embodiments, the privacy/security enclosure 7600 includes main housing 7605, cover or shell 7608, and enclosure 7610 including base enclosure 7630, enclosure support 7635, hood cap 7640, and hood 7650. In some embodiments, the enclosure 7610 can be removed from the cover or shell 7608. Further, in some embodiments, the hood 7650 and/or hood cap 7640 can be extend and retracted to facilitate insertion and removal of a user device 10.

Figure 78B:
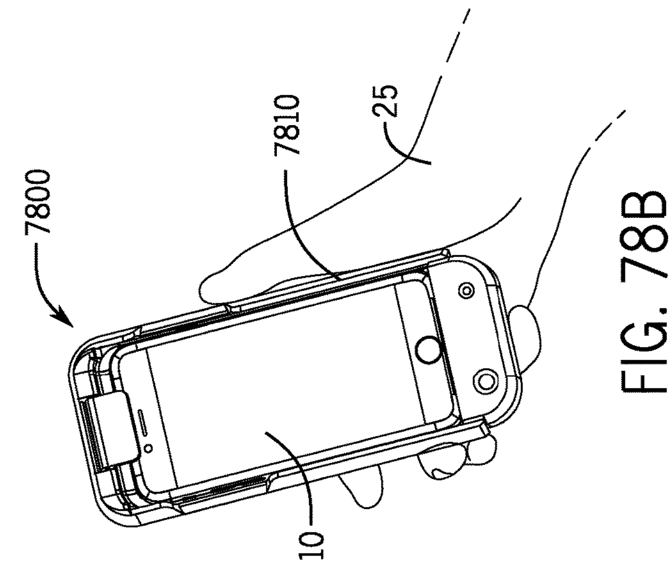
FIGS. 78A-78C depict a privacy/security enclosure in use in accordance with some embodiments of the invention.
Figure 78C:
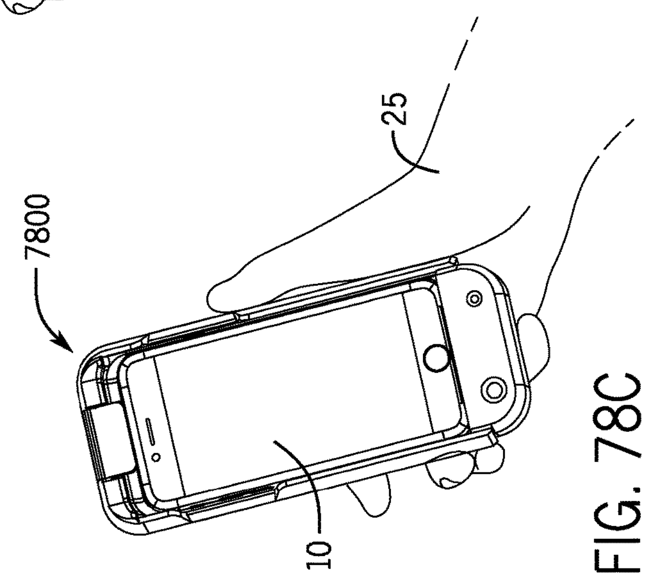
Figure 78A:
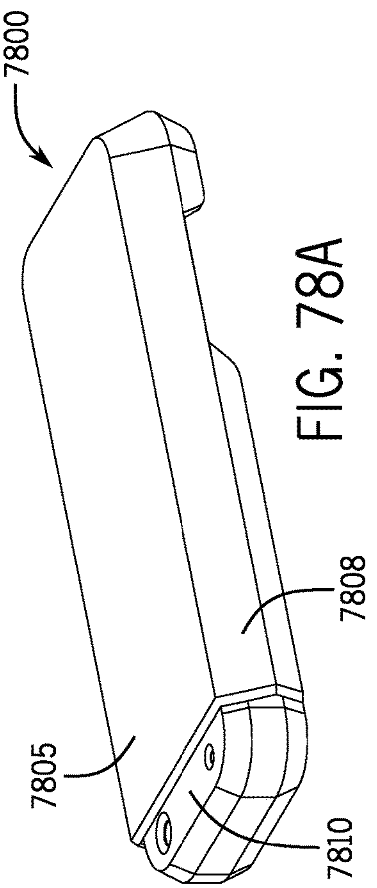
Figures 79A, 79B, 79C:
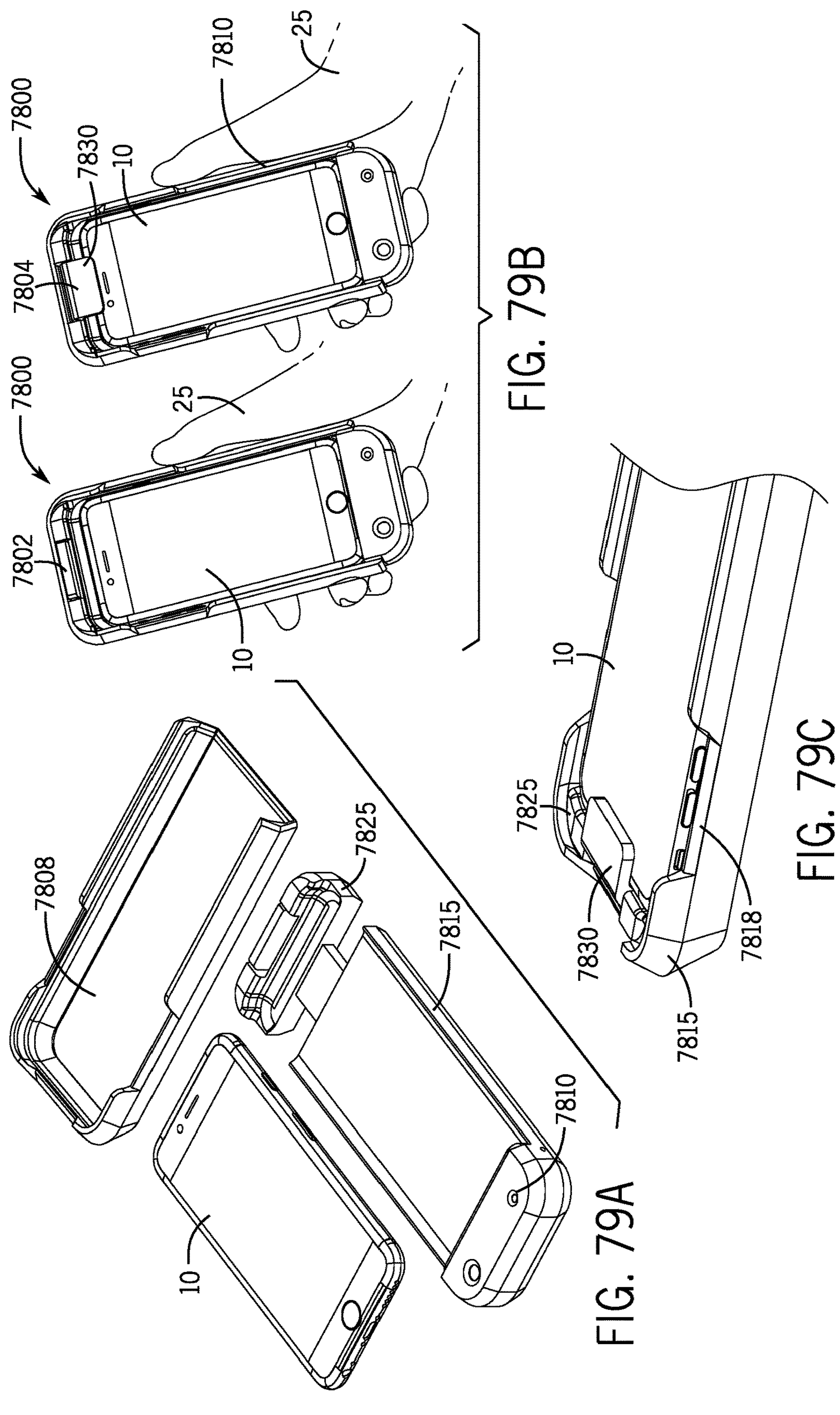
FIGS. 79A-79C depict a privacy/security enclosure in use in accordance with some embodiments of the invention.
Figures 80A, 80B, 80C, 80D, 80E, 80F:
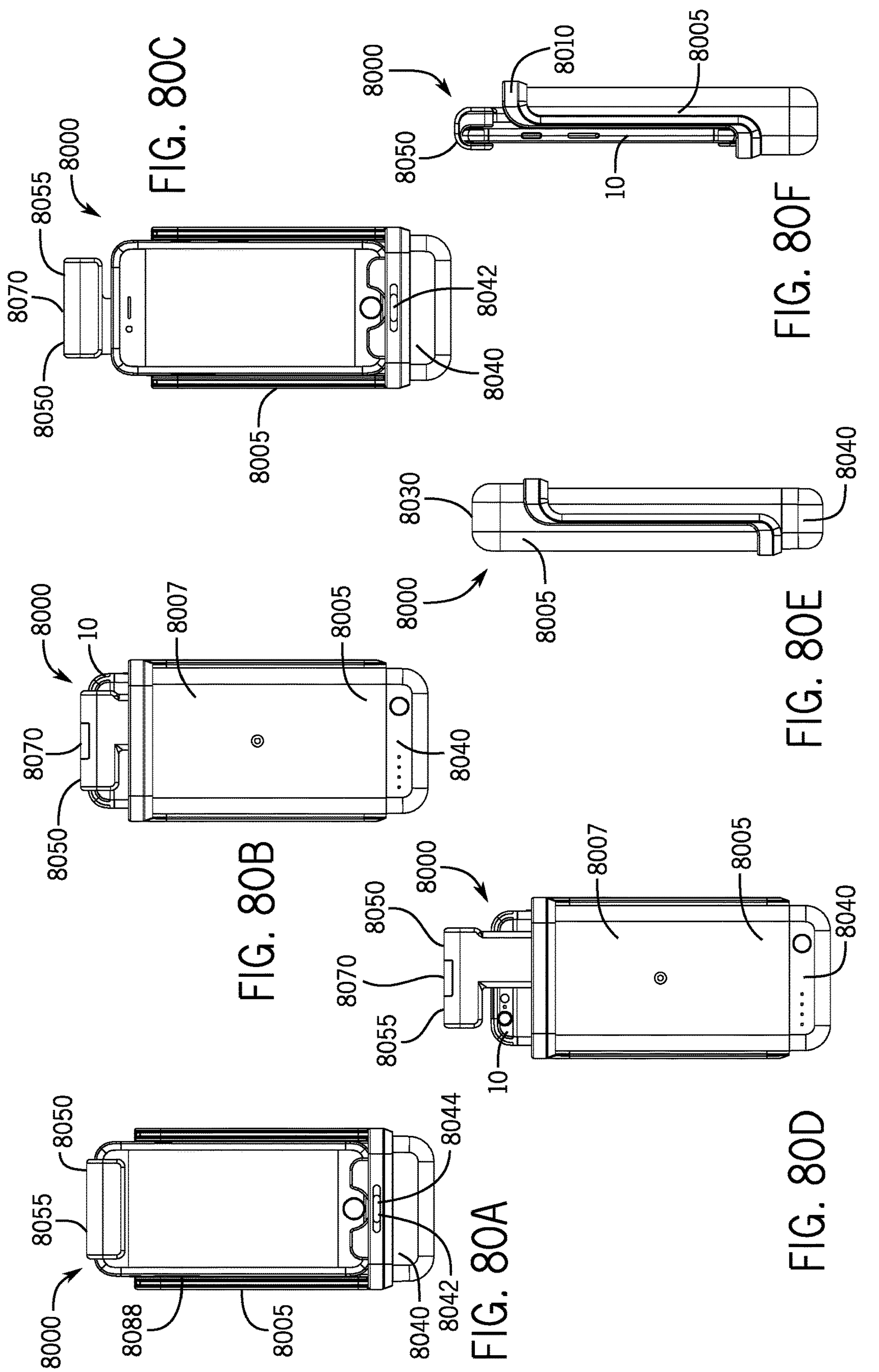
FIGS. 80A-80F illustrate various views of a privacy/security enclosure according to at least one embodiment of the invention.

FIGS. 78A-78C depicts a privacy/security enclosure 7800 in use in accordance with some embodiments of the invention, and FIGS. 79A-79C depicts a privacy/security enclosure 7800 in use in accordance with some embodiments of the invention. Some embodiments include main housing 7805 including a cover or shell 7808 and enclosed enclosure 7810 comprising an enclosure base 7815 and hood 7825. Referring to FIG. 79C, in some embodiments, proximate the hood wall 7815, and aperture 7818 can be included to enable access to one or more controls of the user device 10. Further, referring to FIG. 79B, in some embodiments, the hood cap 7830 can be pivoted from an open position (shown as 7802) to a closed position (shown as 7804) to enable the enclosure 7810 to enclose and clasp the user device 10.

FIGS. 80A-80F illustrate various views of a privacy/security enclosure 8000 according to at least one embodiment of the invention. Some embodiments include a main housing 8005 including a removable outer cover 8007, a rear outer enclosure 8010, a front outer enclosure 8030, and a base enclosure 8040. Some embodiments include an LED or button 8042 positioned in the base enclosure. Some embodiments include an extendible hood 8050 including a hood cap 8055. In some embodiments, the hood cap 8055 can comprise at least one function, status, and/or privacy indicator comprising an indicator LED 8070. In some embodiments, logo 8088 can be including on at least a portion of the main housing.

Figure 81B:
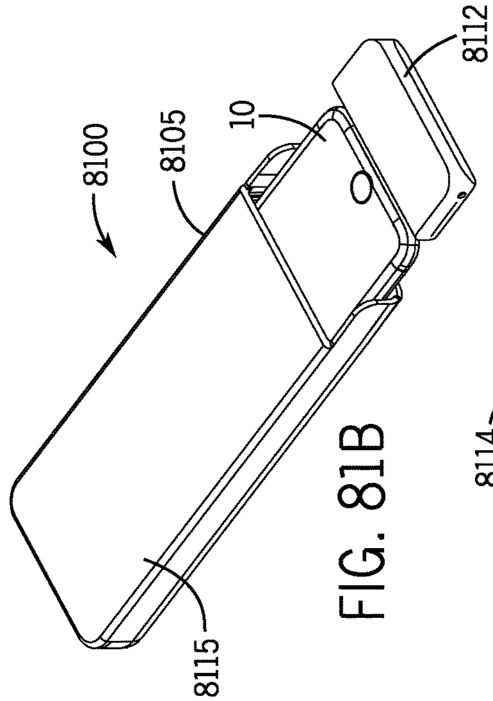
FIGS. 81A-81D illustrate various views of a privacy/security enclosure according to at least one embodiment of the invention.
Figure 81D:
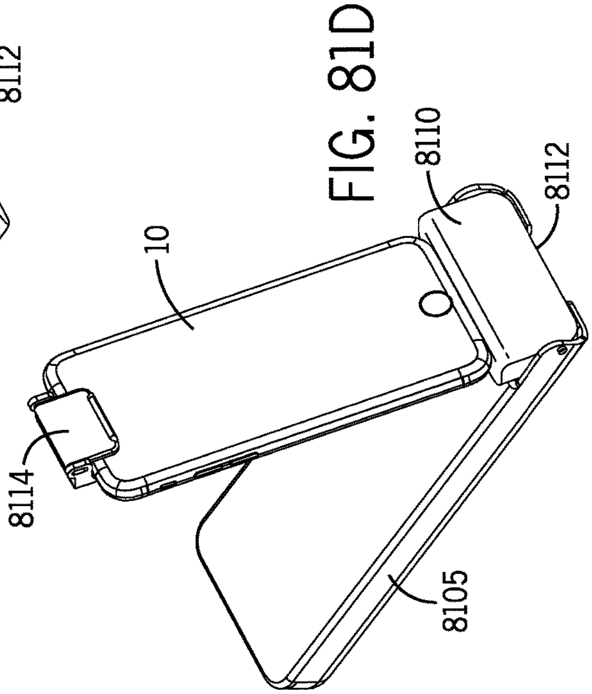
Figure 81A:
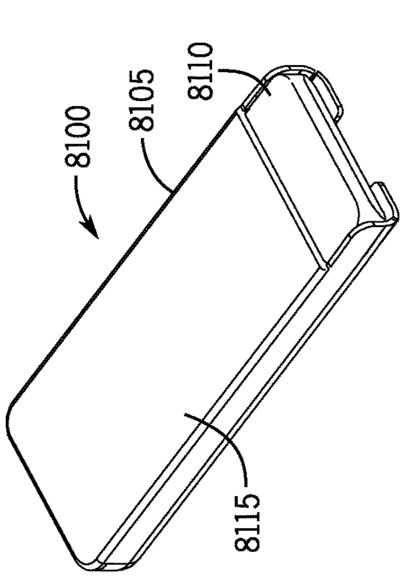
Figure 81C:
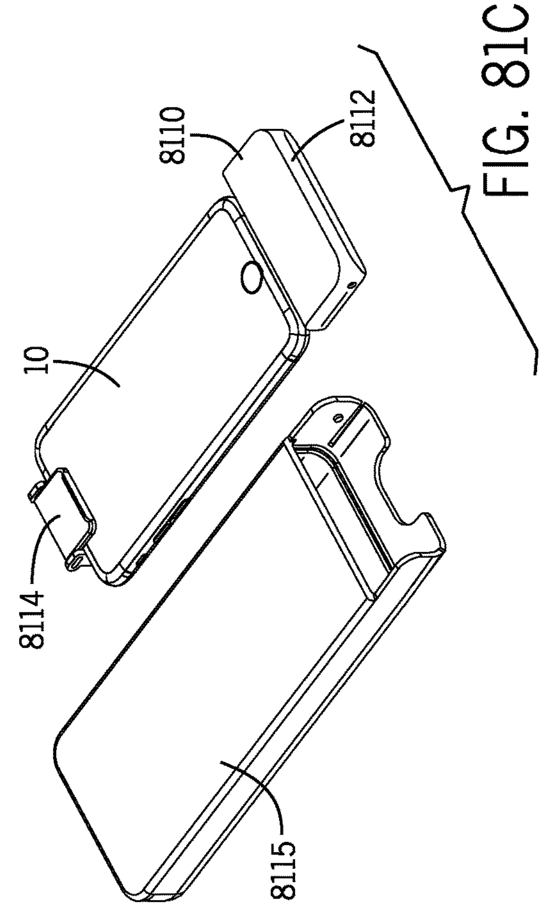
Figure 82B:
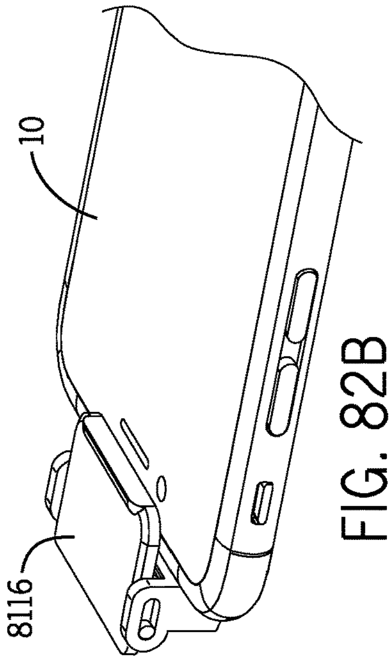
FIGS. 82A-82D illustrate various views of a privacy/security enclosure according to at least one embodiment of the invention.
Figure 82D:
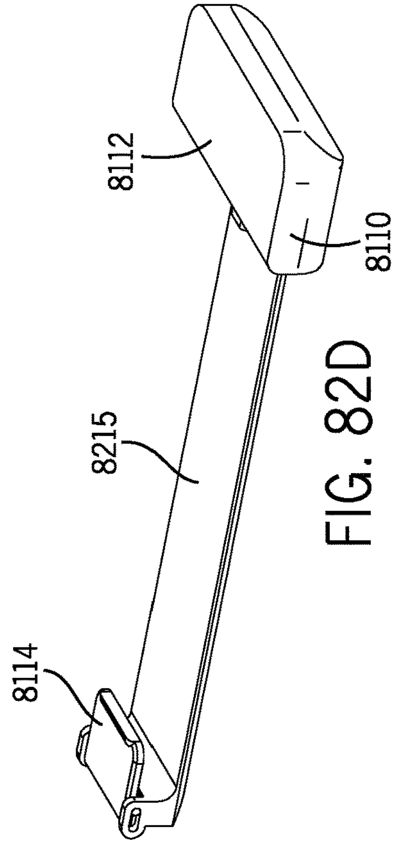
Figure 82A:
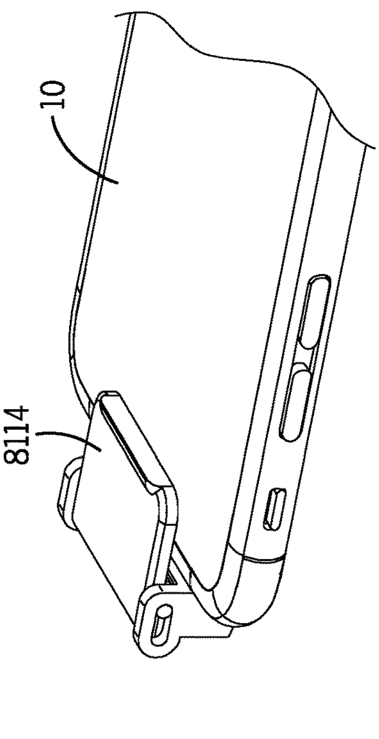
Figure 82C:
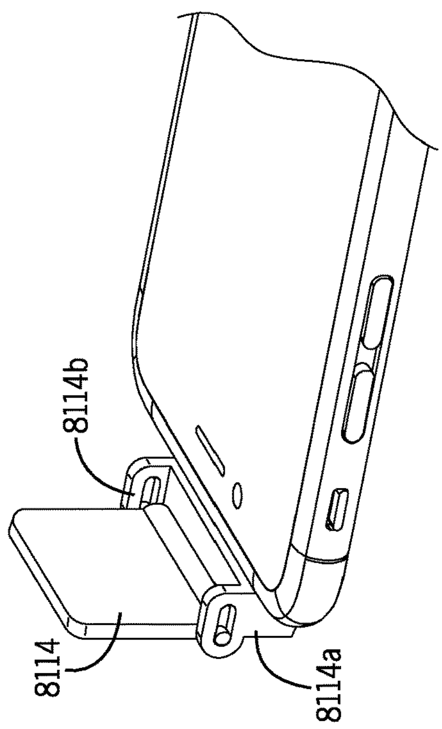

FIG. 81A-81D illustrate various views of a privacy/security enclosure 8100 according to at least one embodiment of the invention. In some embodiments, the privacy/security enclosure 8100 can include a main housing 8105 comprising an enclosure 8110, cover or shell 8115, base enclosure 8112, and hood 8114. In some embodiments, the enclosure 8110 can be removed from the cover or shell 8115. FIG. 81D shows a user device 10 in a standing mode. FIGS. 82A-82D illustrate various views of a privacy/security enclosure 8100 according to at least one embodiment of the invention. In some embodiments, the enclosure 8110 can comprise a support 8215 coupled to the base enclosure 8112 and hood 8114. As shown in FIG. 82C, in some embodiments, the hood 8114 can comprise a clip portion 8114*b* that can be pivoting about a pivot 8114*a* to enable the clip portion 8114*b* to grip a user device 10 or to enable a user to remove a user device 10 from the enclosure 8110.

Figures 83A, 83B, 83C, 83D:
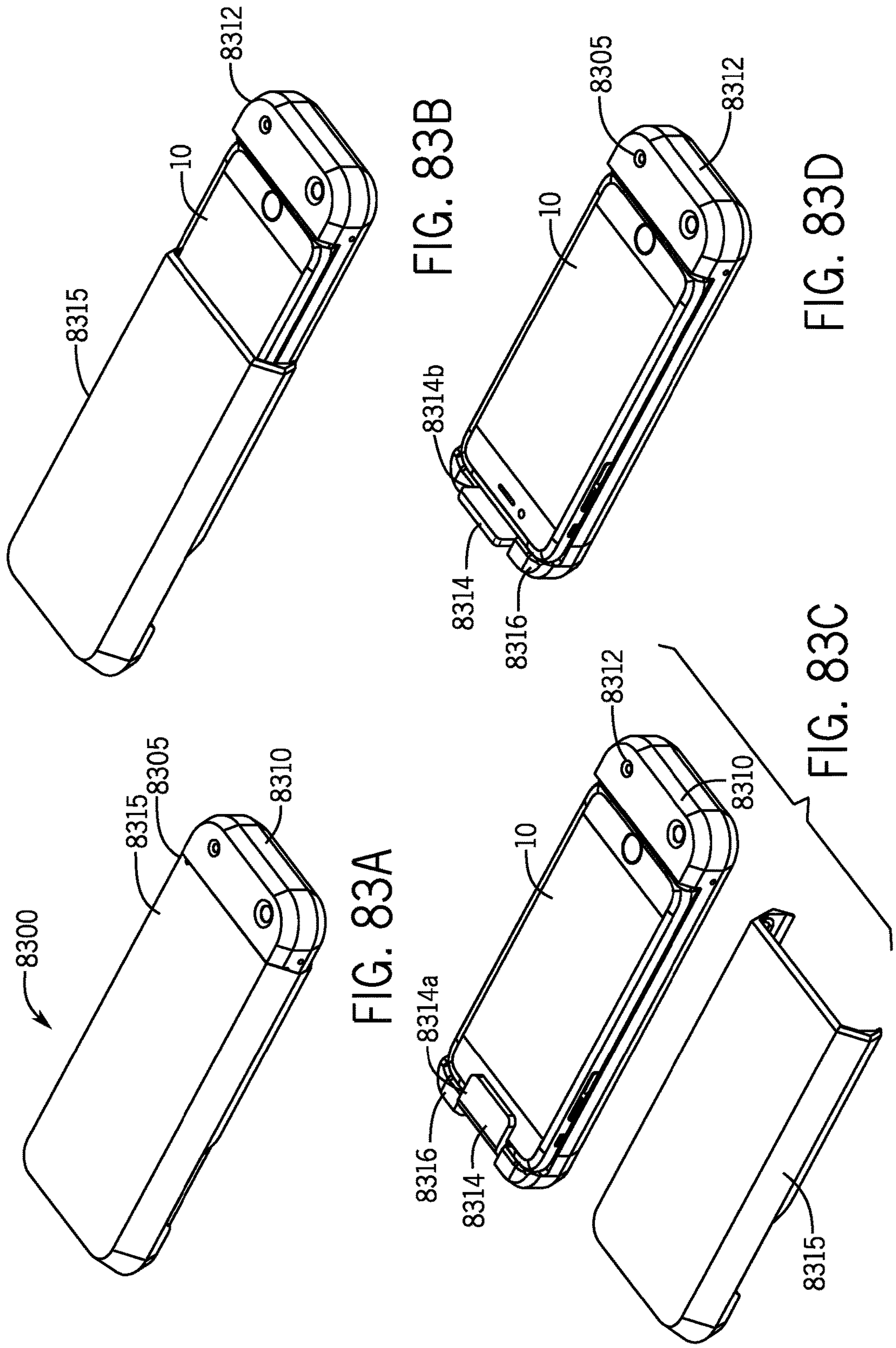
FIGS. 83A-83D illustrate various views of a privacy/security enclosure according to at least one embodiment of the invention.
Figures 84A, 84B, 84C, 84D:
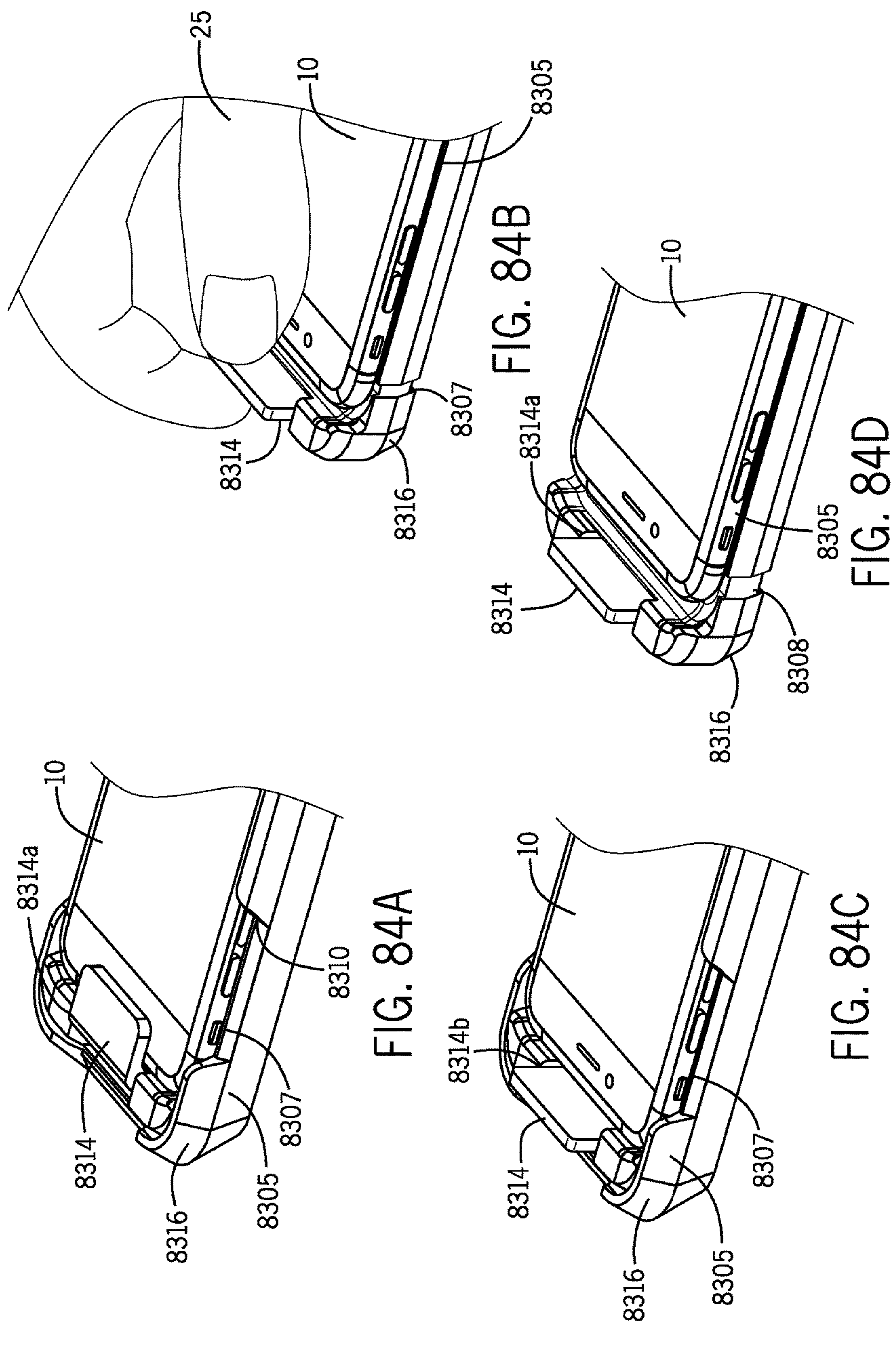
FIGS. 84A-84D illustrate various views of a privacy/security enclosure according to at least one embodiment of the invention.

FIGS. 83A-83D illustrate various views of a privacy/security enclosure 8300 according to at least one embodiment of the invention. Some embodiments include a main housing 8305 comprising an enclosure 8310 and a cover or shell 8315, and base enclosure 8312. In some embodiments, the enclosure 8310 can be removed from the cover or shell 8315 (removal process shown in FIG. 83B and removed cover or shell 8315 shown removed in FIG. 83C). Referring to FIG. 83D, some embodiments, the hood 8316 with a hood clip 8314 can be moved from a closed position (shown as 8314*a* in FIG. 83C) to an open position (shown as 8314*b* in FIG. 83D). This is further illustrated in FIGS. 84A-84D, illustrating various views of a privacy/security enclosure 8300 according to at least one embodiment of the invention. FIG. 84A shows the closed position 8314*a*, and FIG. 84B shows a user 25 in the process of opening the hood 8314. FIG. 84C shows the open position 8314*b* of the hood 8314. This view also shows the aperture 8307 enabling access to the user device 10 as described for another embodiment earlier. Further, FIG. 84D shows the hood 8316 can be extended away from the enclosed user device 10 forming a gap 8303 and enabling access to one end of the user device 10.

Figure 85C:
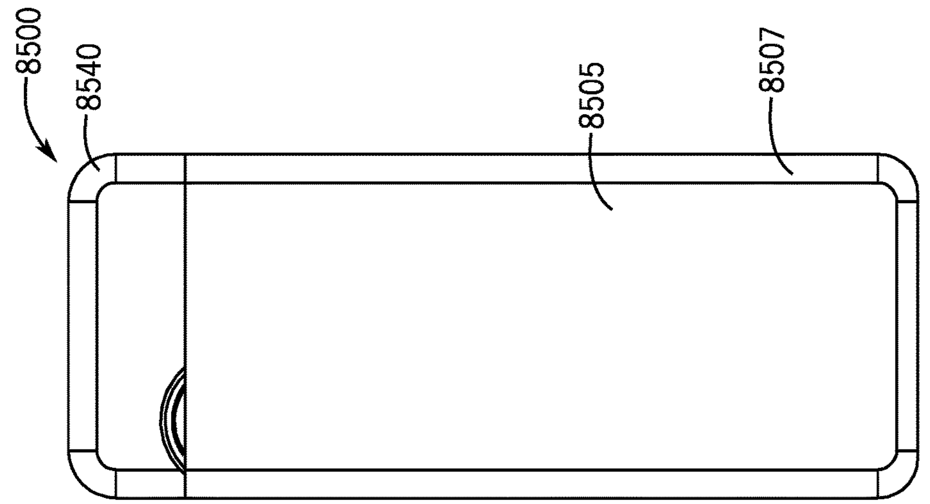
FIGS. 85A-85C illustrate various views of a privacy/security enclosure according to at least one embodiment of the invention.
Figure 85B:
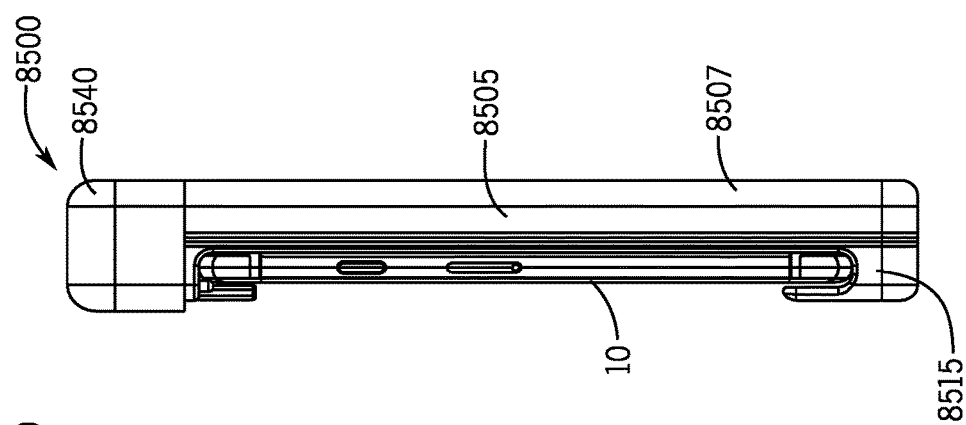
Figure 85A:
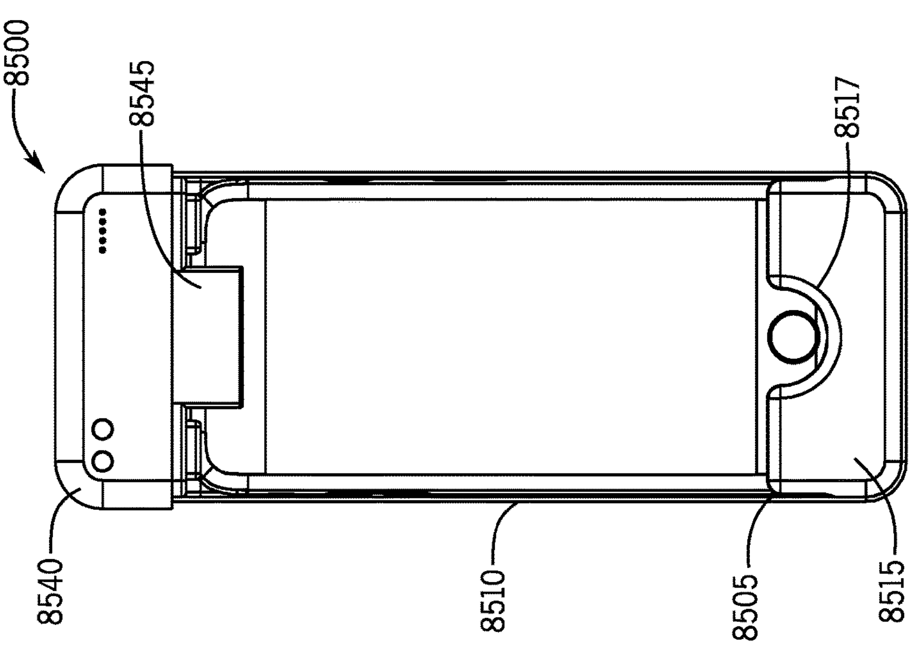
Figure 86A:
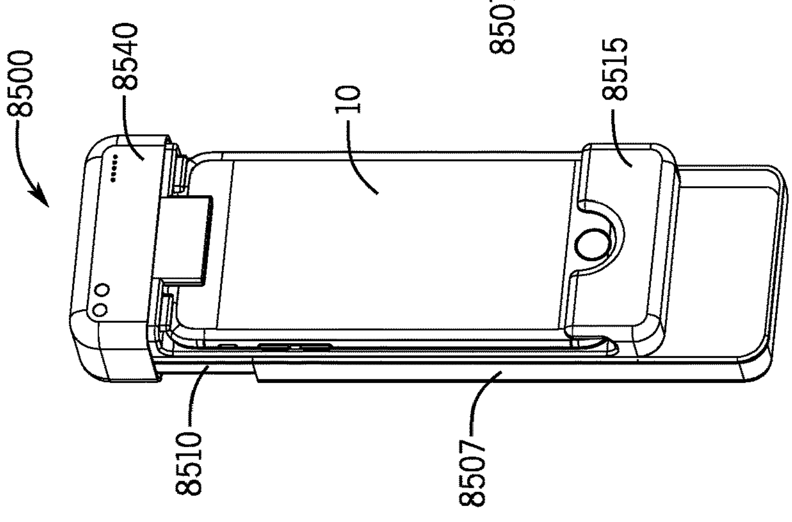
FIGS. 86A-86D illustrate various views of a privacy/security enclosure according to at least one embodiment of the invention.
Figure 86B:
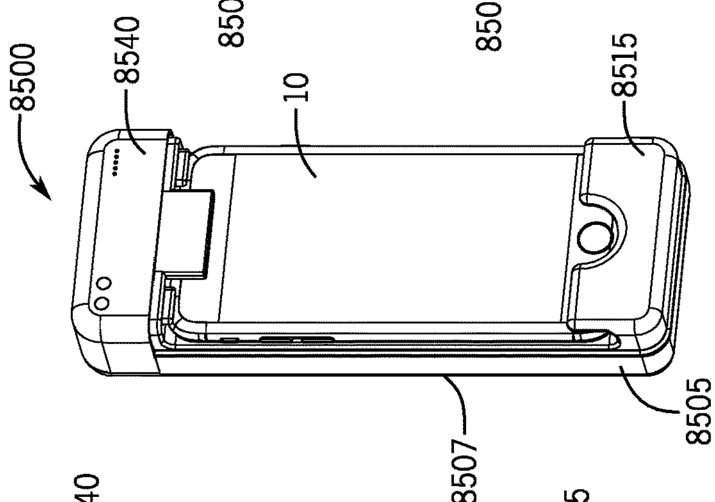
Figure 86C:
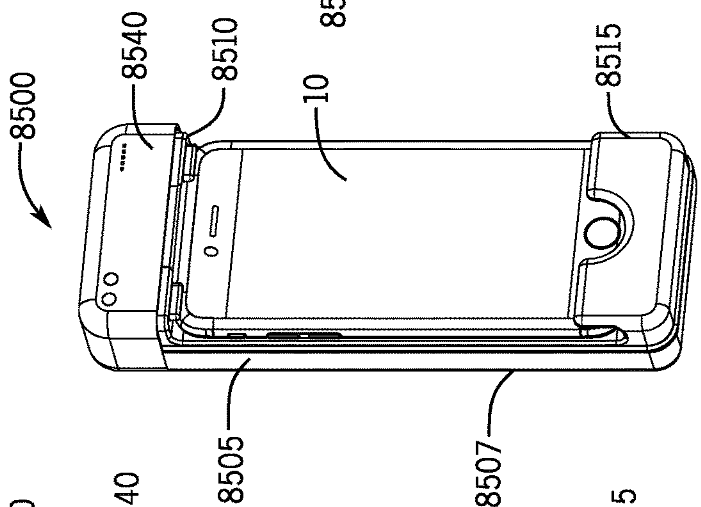
Figure 86D:
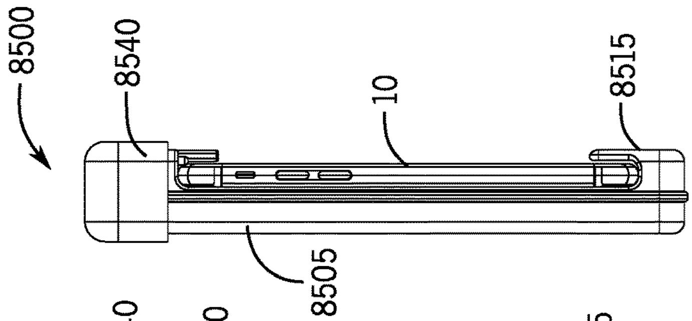

FIGS. 85A-85C illustrate various views of a privacy/security enclosure 8500 according to at least one embodiment of the invention. In some embodiments of the invention, the privacy/security enclosure 8500 can include a main housing 8505 comprising a cover 8507, enclosure 8510, coupled base enclosure 8515 and hood 8540 including hood cap 8545. A user device 10 is shown cradled in the enclosure 8510 with one end positioned in the base enclosure 8515, and another end clasped in the hood 8540 with the hood cap 8545. An access aperture 8517 is shown in the base enclosure 8515 to enable user access to one or more controls of the user device 10. Further views of the privacy/security enclosure 8500 are shown in FIGS. 86A-86D including various positions of the cover 8507 with respect to the enclosure 8510 in accordance with some embodiments of the invention.

Figure 87A:
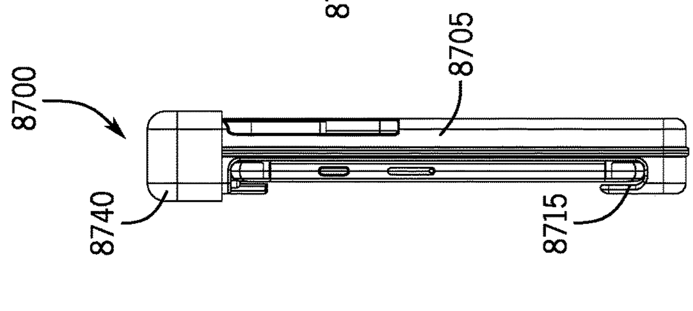
FIGS. 87A-87E illustrate various views of a privacy/security enclosure according to at least one embodiment of the invention.
Figure 87B:
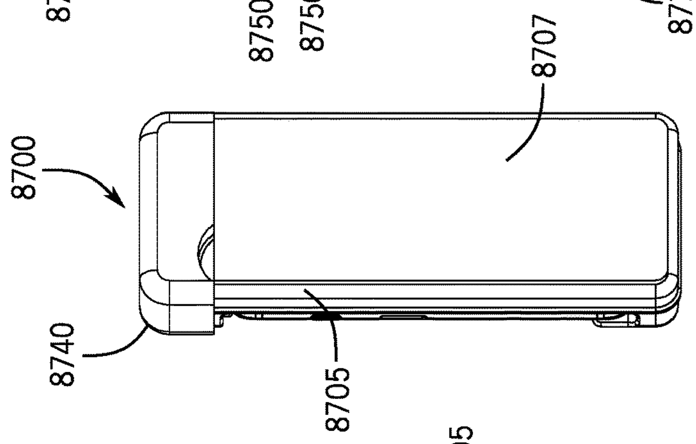
Figure 87C:
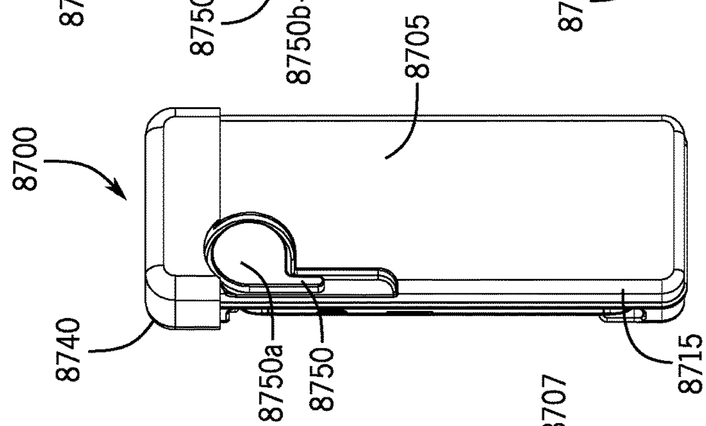
Figure 87D:
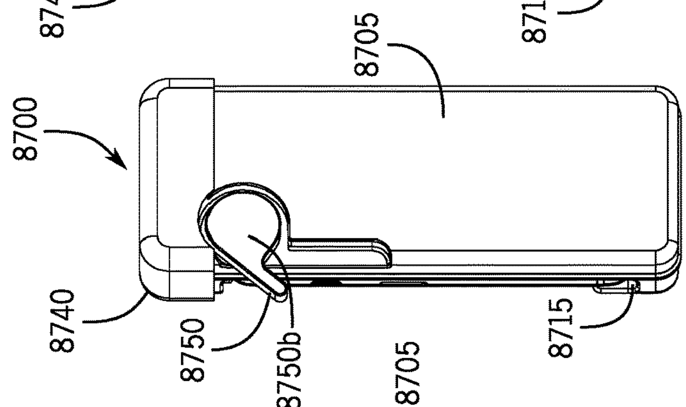
Figure 87E:
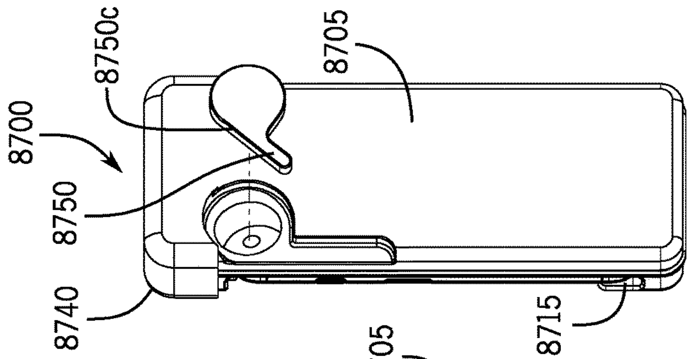

FIGS. 87A-87E illustrate various views of a privacy/security enclosure 8700 according to at least one embodiment of the invention. The privacy/security enclosure 8700 is shown comprising a main housing 8705 including a cover 8707, base enclosure 8715, hood enclosure 8740, and removable cover 8750*a*. As depicted in FIGS. 87C-87E, the removable cover 8750 positioned coupled to the base enclosure 8715 can be rotated to a rotated position 8750*b*, and removed (shown as removed cover 8750*c*)

Figure 88C:
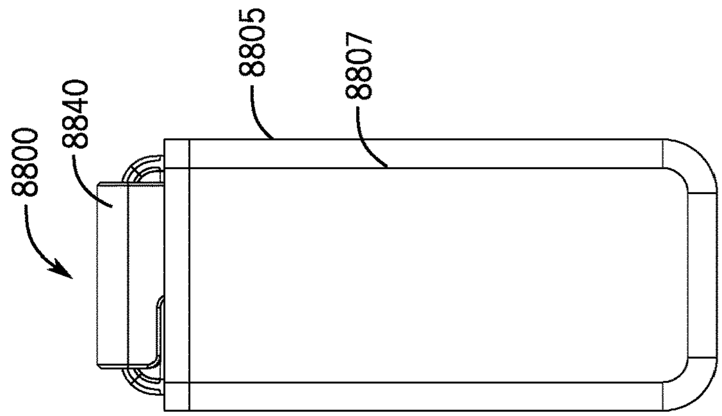
FIGS. 88A-88C illustrate various views of a privacy/security enclosure according to at least one embodiment of the invention.
Figure 88B:
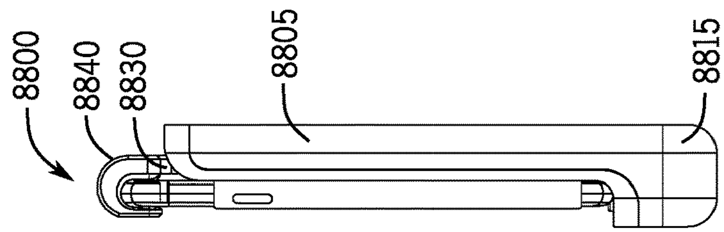
Figure 88A:
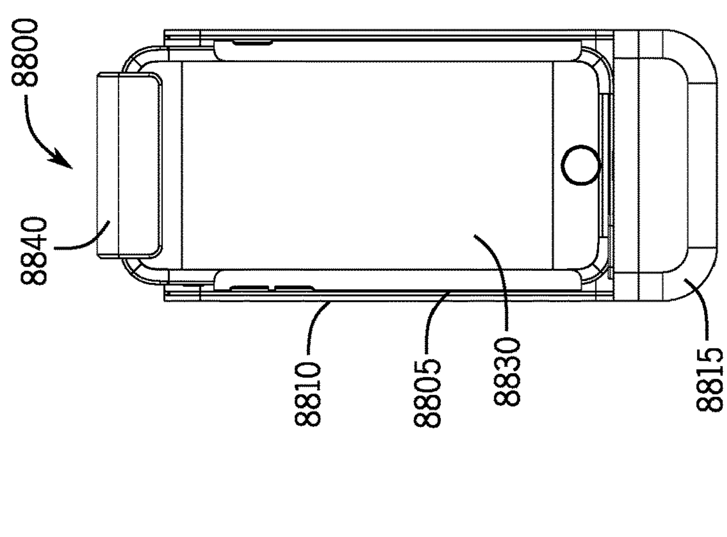
Figures 89A, 89B, 89C, 89D, 89E:
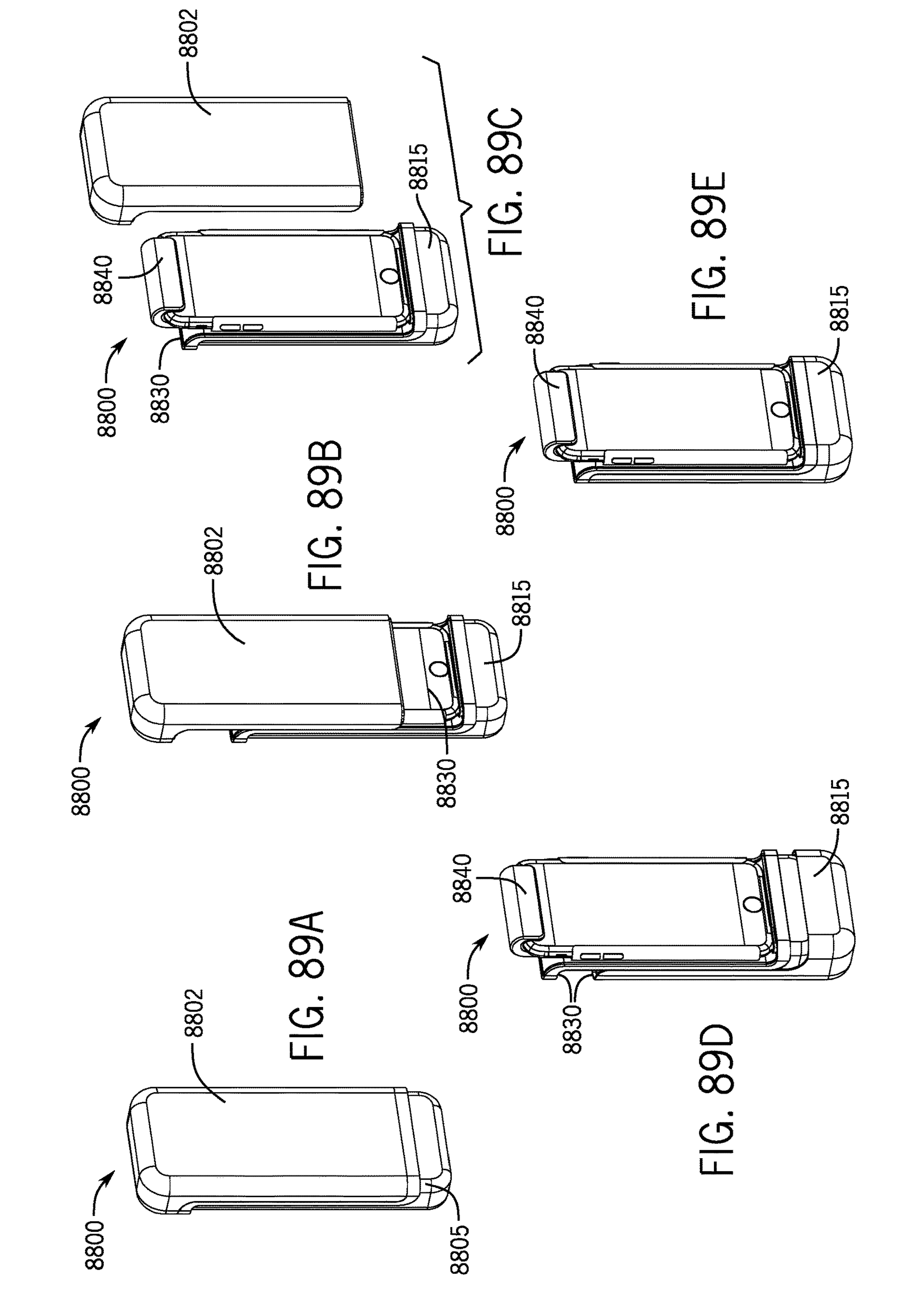
FIGS. 89A-89E illustrate various views of a privacy/security enclosure according to at least one embodiment of the invention.
Figure 90E:
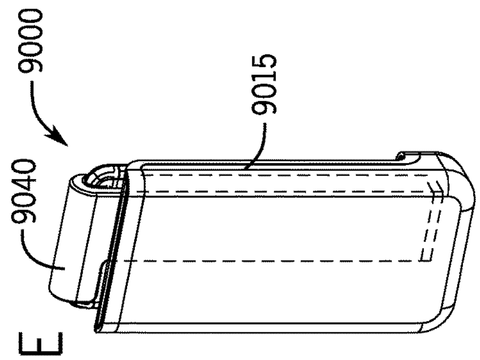
FIGS. 90A-90F illustrate various views of a privacy/security enclosure according to at least one embodiment of the invention.
Figure 90F:
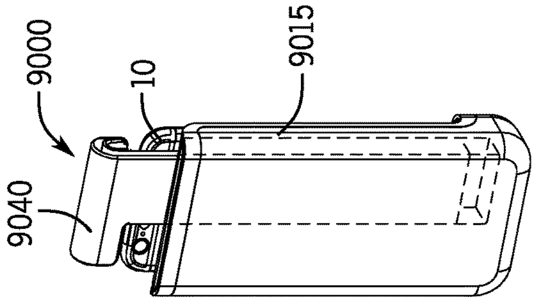
Figure 90D:
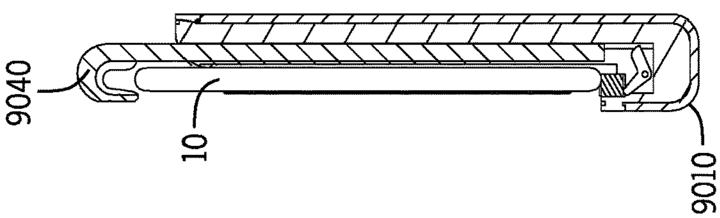
Figure 90C:
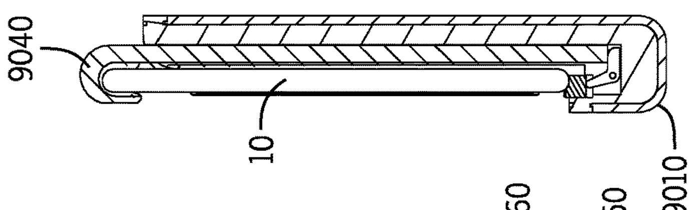
Figure 90B:
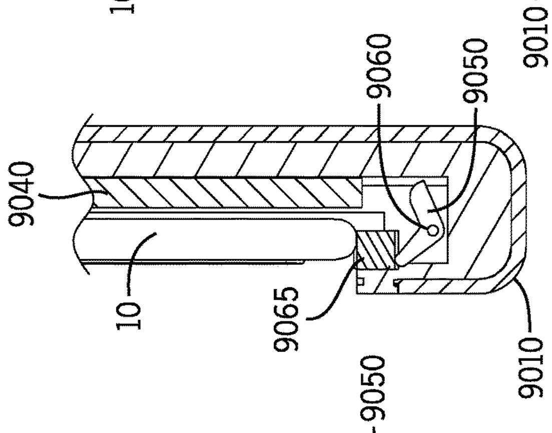
Figure 90A:
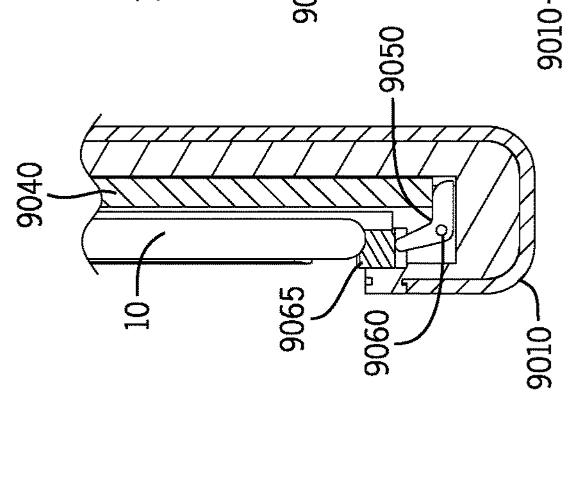

FIGS. 88A-88C illustrate various views of a privacy/security enclosure 8800 according to at least one embodiment of the invention. Some embodiments include a privacy/security enclosure 8800 comprising a main housing 8805 including a cover 8807 positioned at least partially covering an enclosure 8810 and coupled to a base assembly 8815. The enclosure 8810 can comprise a hood 8830 including a cap 8840. FIGS. 89A-89E illustrate various views of a privacy/security enclosure 8800 including some an assembly view (shown in FIG. 89C). In some embodiments, a removable cover 8802 can couple to the main housing 8805 including base enclosure 8815, hood 8830, and cap 8840.

FIGS. 90A-90F illustrate various views of a privacy/security enclosure 9000 according to at least one embodiment of the invention. In some embodiments, the privacy/security enclosure 9000 can comprise a cover or shell 9010 at least partially enclosing an enclosure assembly 9015 including enclosure 9040, pivot assembly 9050, pivot 9060, and blocker 9065. In some embodiments, the enclosure 9040 can pivot using the pivot assembly 9050 about the pivot to couple the blocker 9065 with a microphone, speaker, camera, or other sensor of the user device.

Figure 91C:
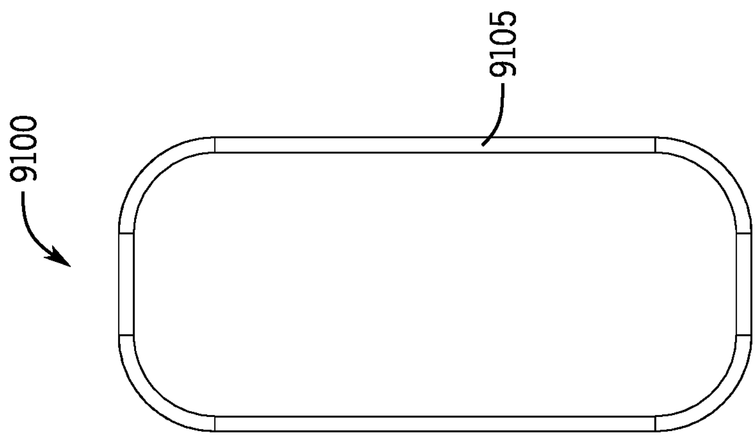
FIGS. 91A-91C illustrate various views of a privacy/security enclosure according to at least one embodiment of the invention.
Figure 91B:
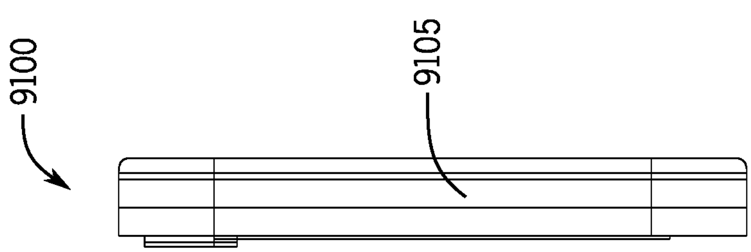
Figure 91A:
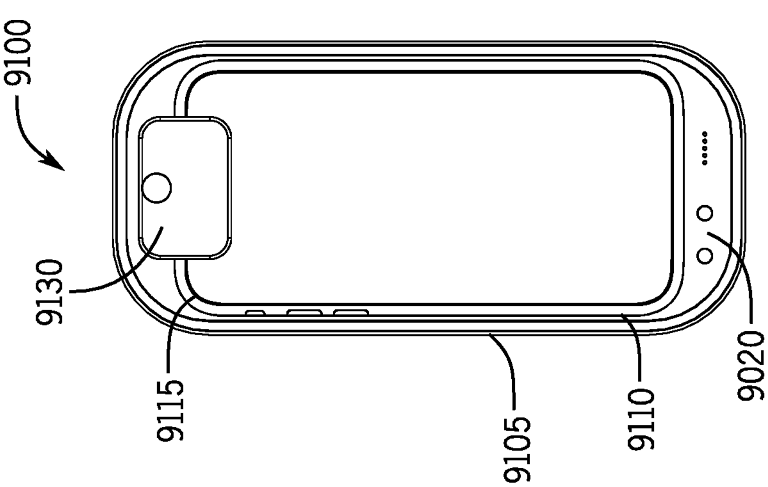

FIGS. 91A-91C illustrate various views of a privacy/security enclosure 9100 according to at least one embodiment of the invention. In some embodiments, the privacy/security enclosure 9100 can include the main housing 9105 comprising the enclosure 9110 and frame 9115, hood 9130, and base assembly 9020.

Figure 92C:
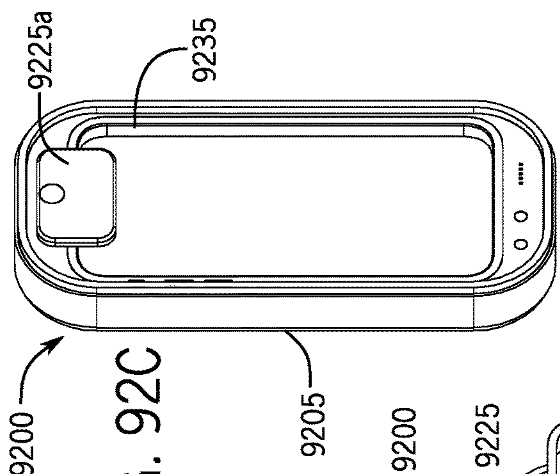
FIGS. 92A-92E illustrate various views of a privacy/security enclosure according to at least one embodiment of the invention.
Figure 92B:
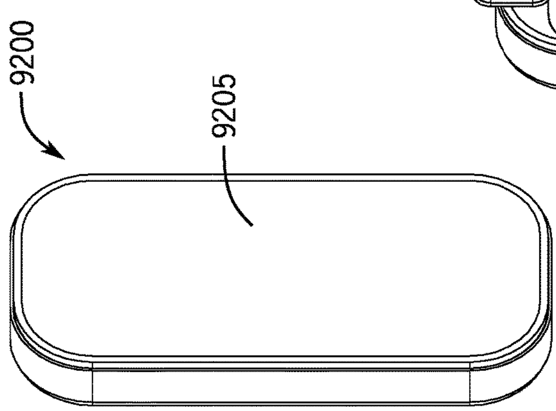
Figure 92A:
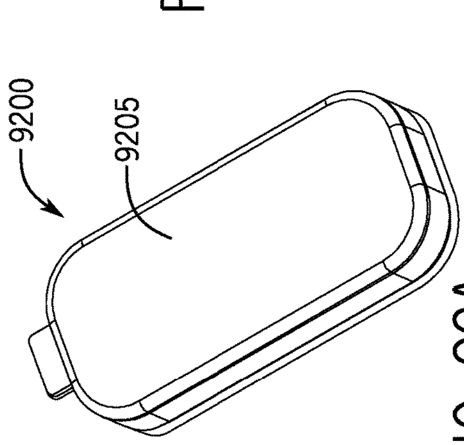
Figure 92E:
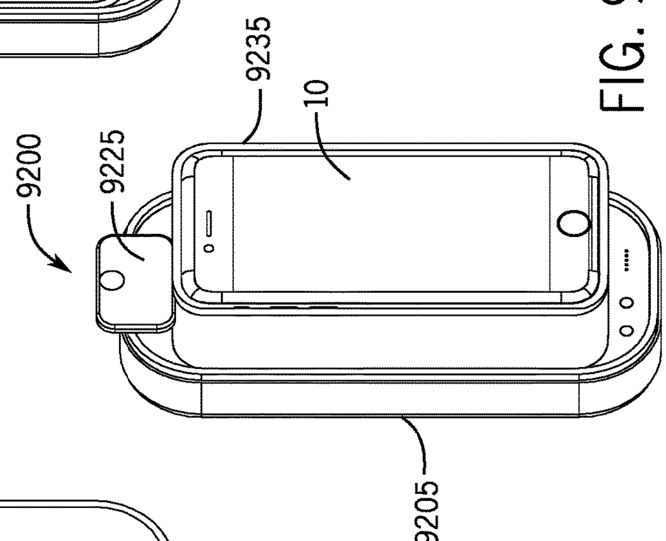
Figure 92D:
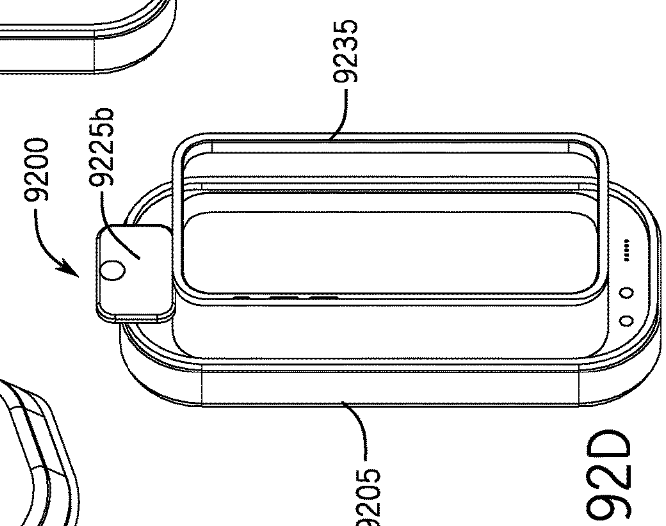
Figure 93C:
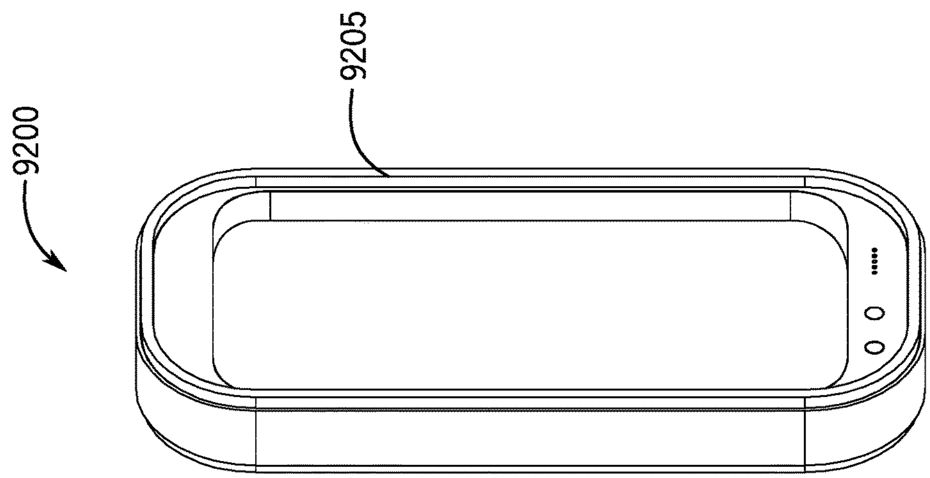
FIGS. 93A-93C illustrate various views of a privacy/security enclosure according to at least one embodiment of the invention.
Figure 93B:
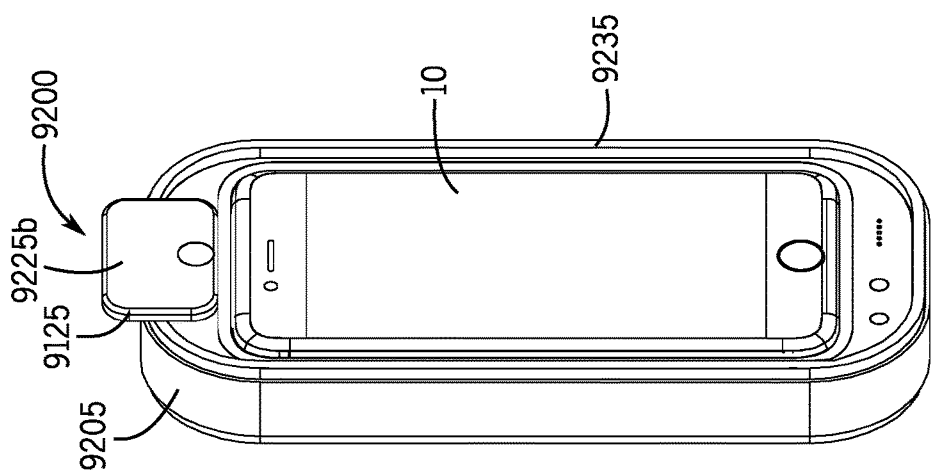
Figure 93A:
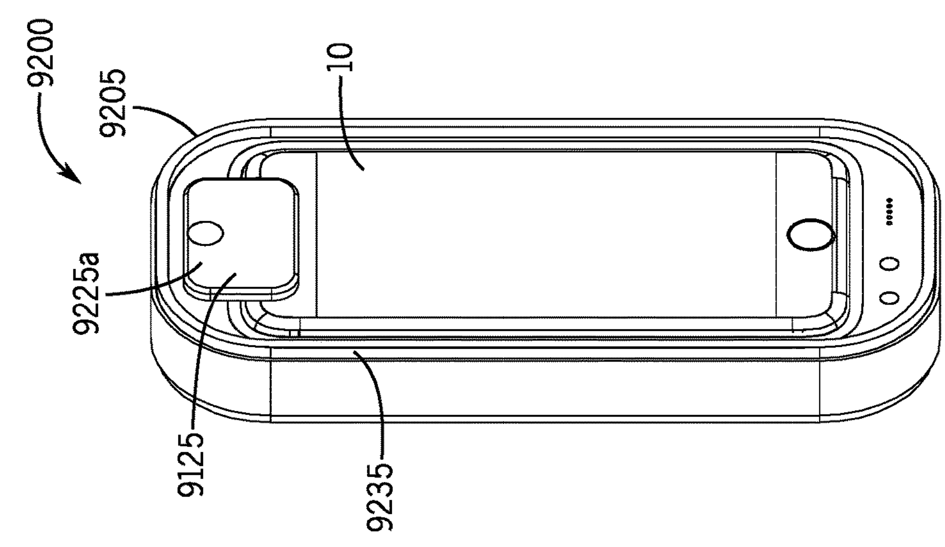
Figures 94A, 94B, 94C, 94D:
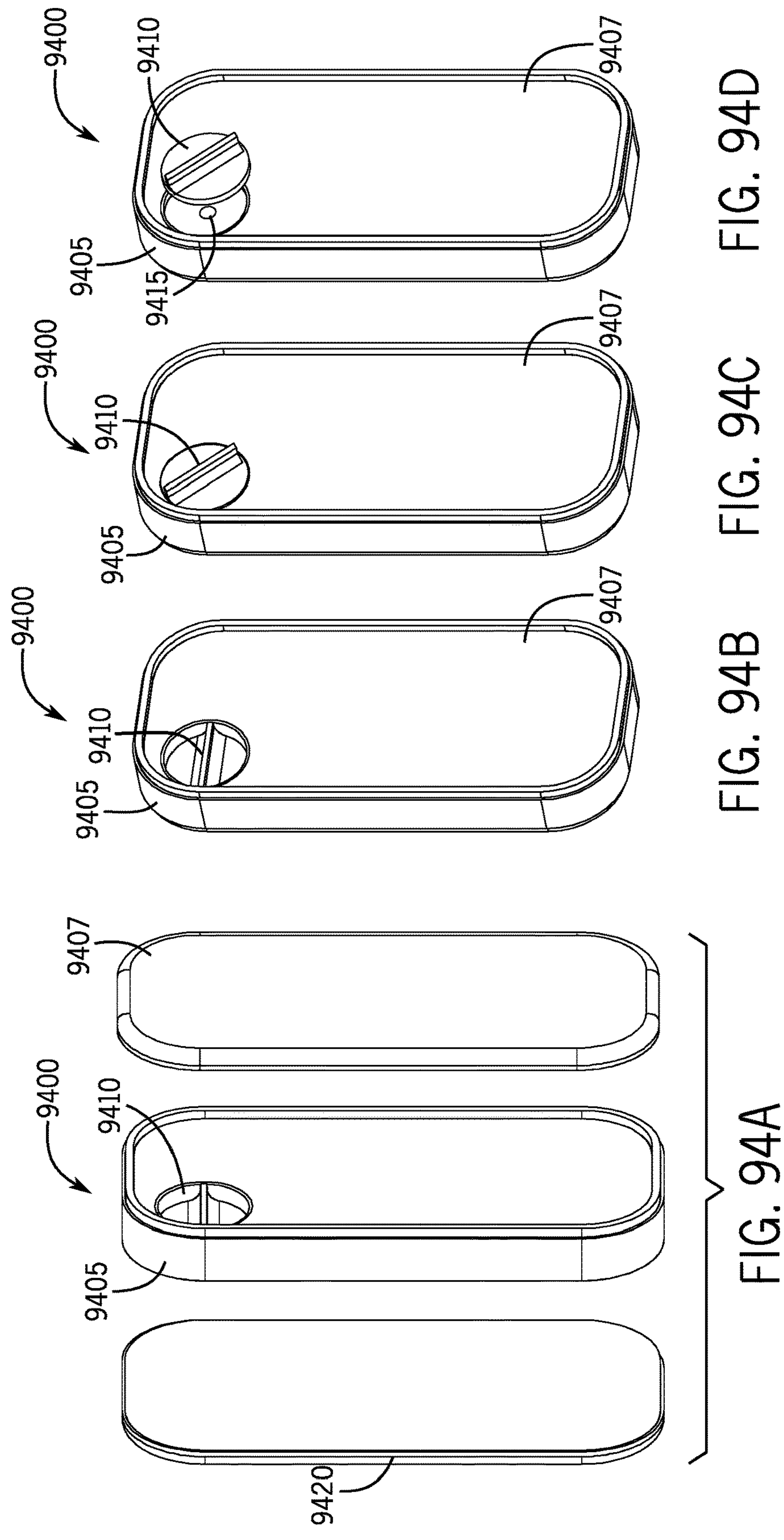
FIGS. 94A-94D illustrate various views of a privacy/security enclosure according to at least one embodiment of the invention.

FIGS. 92A-92E illustrate various views of a privacy/security enclosure 9200 according to at least one embodiment of the invention. In some embodiments, the privacy/security enclosure 9200 can include main housing 9205 comprising enclosure 9215 and frame 9235, hood 9225. FIG. 92D shows an assembly view showing frame 9235 positioned to accept a user device 10 and/or for insertion into the main housing 9205. FIG. 92C shows the hood 9225 in a closed position 9225*a*, and FIG. 92D shows the hood 9225 in an open position 9225*b*. FIGS. 93A-93C illustrate various views of a privacy/security enclosure 9200 according to at least one embodiment of the invention, where FIG. 93A shows the closed position 9225*a* of the hood 9225 (enclosing a user device 10) and FIG. 93B shows the hood 9225 in an open position 9225*b* in preparation for a user 25 to remove the user device.

FIGS. 94A-94D illustrate various views of a privacy/security enclosure 9400 according to at least one embodiment of the invention. In some embodiments, the privacy/security enclosure 9400 includes main housing 9405 with covers 9407, 9420 (shown in the assembly view of FIG. 94A), removable cover 9410, aperture 9415 (shown in FIG. 94D with cover 9410 removed). In some embodiments, removable cover 9410 can be separated from the privacy/security enclosure 9400 to change the privacy of an enclosed device.

Figures 95A, 95B, 95C:
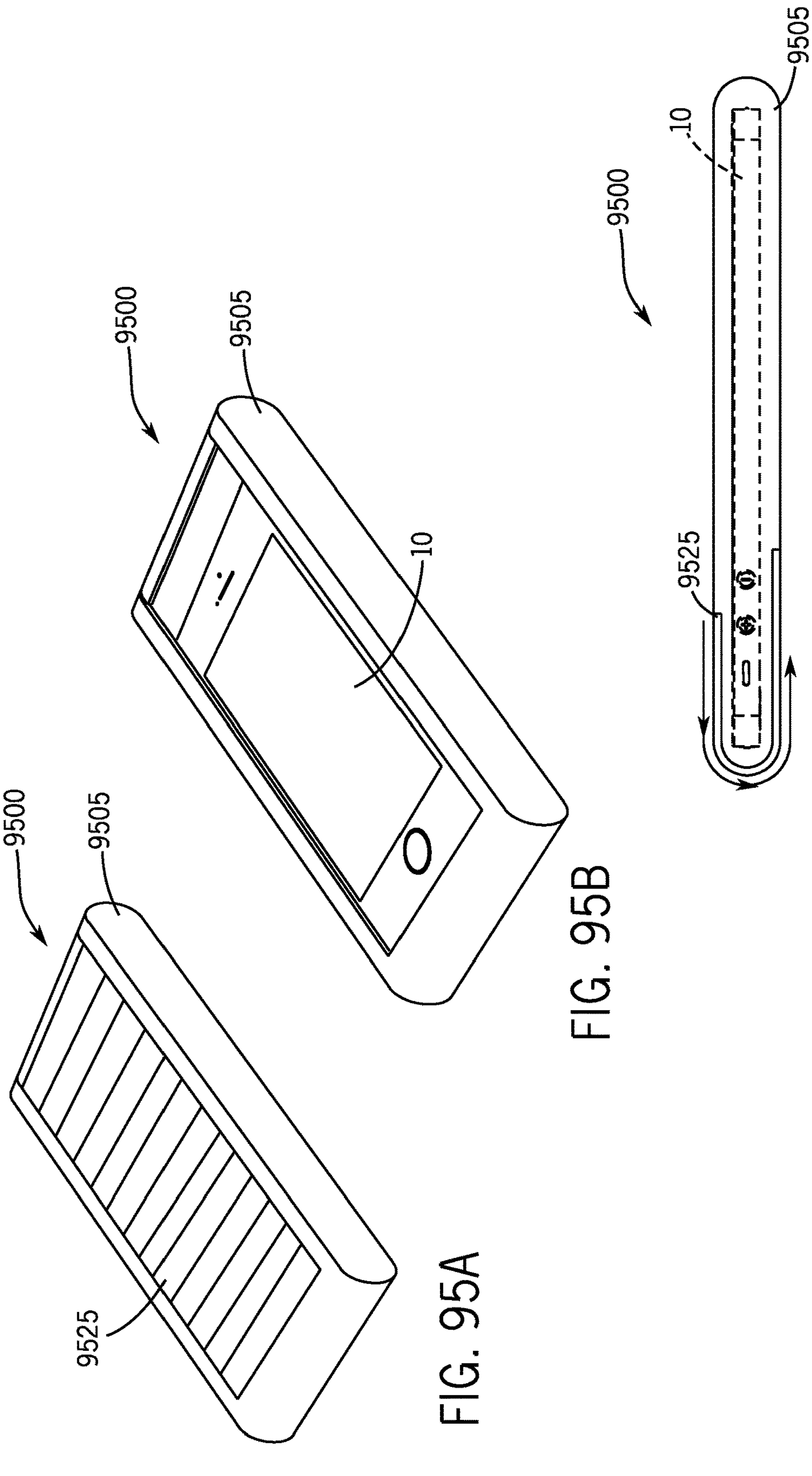
FIGS. 95A-95C illustrate various views of a privacy/security enclosure according to at least one embodiment of the invention.

FIGS. 95A-95C illustrate various views of a privacy/security enclosure 9500 according to at least one embodiment of the invention. Some embodiments include a main housing 9505 with slidable cover 9525. In some embodiments, the cover 9525 can be rolled beneath the main housing 9505 to uncover an enclosed user device 10 (shown depicted in FIG. 95C).

FIGS. 96A-96B illustrate various views of a privacy/security enclosure 9600 according to at least one embodiment of the invention. Some embodiments include a housing 9605 enclosing an enclosure 9610 and base enclosure 9615. The assembly view of FIG. 96A shows the removal of a user device 10 within enclosure 9610 by removal from the housing 9605, and assembly of the enclosure 9610 on the exterior of the housing 9605. Further, FIG. 96B shows the separation of the housing 9605 and the enclosure 9610.

Figure 97C:
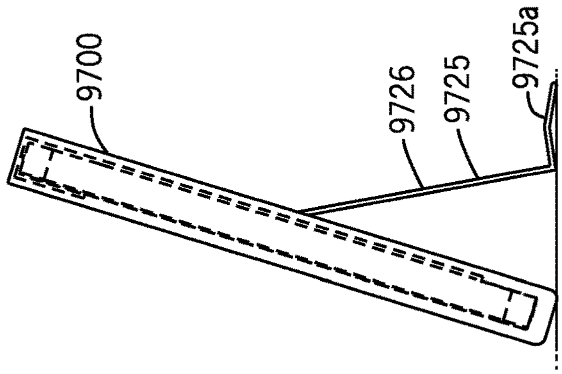
FIGS. 97A-97C illustrate various views of a privacy/security enclosure according to at least one embodiment of the invention.
Figure 97B:
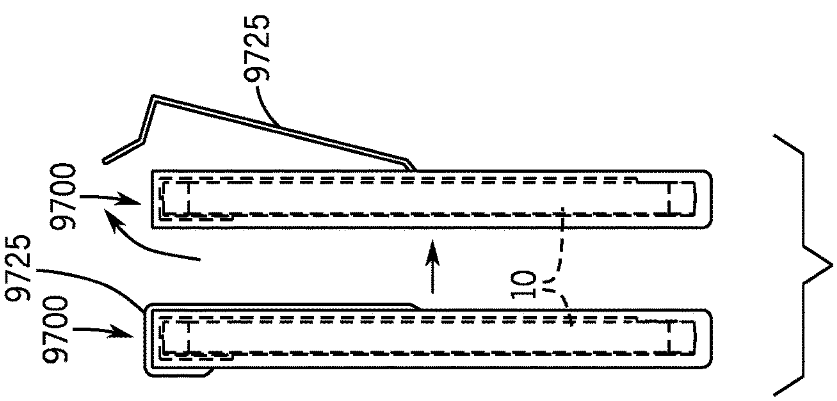
Figure 97A:
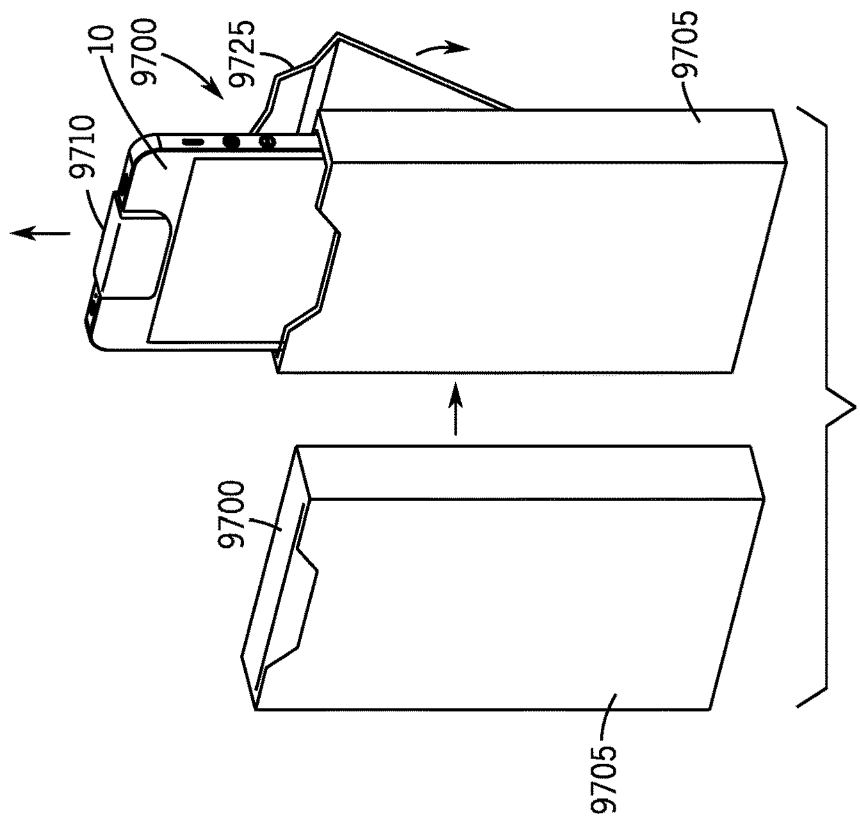

FIGS. 97A-97C illustrate various views of a privacy/security enclosure 9700 according to at least one embodiment of the invention. Some embodiments include a housing 9705 and enclosure 9710 with hood cover 9725. The assembly view of FIG. 97A shows the partial removal of a user device 10 within enclosure 9710 by partial separation of the cover portion 9725 from the housing 9705. Further, FIG. 97B shows the assembly view of the separation of the cover portion 9725, and FIG. 97C shows the stand configuration 9726 using fold 9725*a* of the cover portion 9725.

Figure 98C:
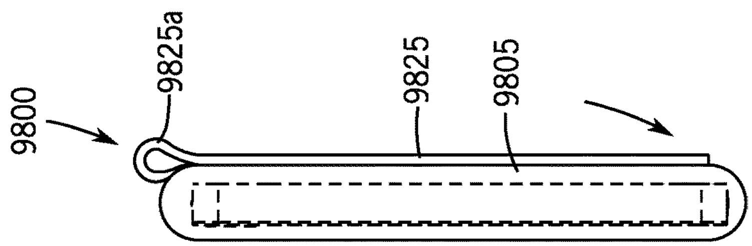
FIGS. 98A-98C illustrate various views of a privacy/security enclosure according to at least one embodiment of the invention.
Figure 98B:
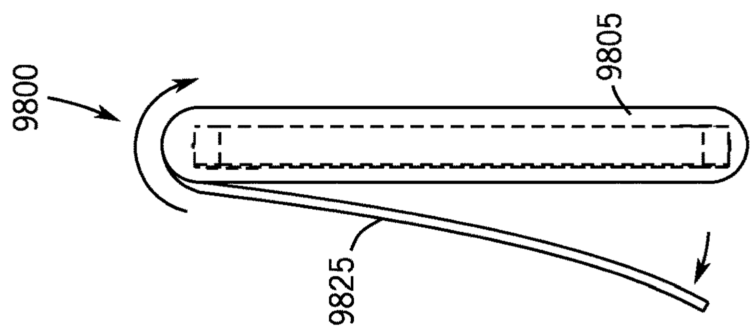
Figure 98A:
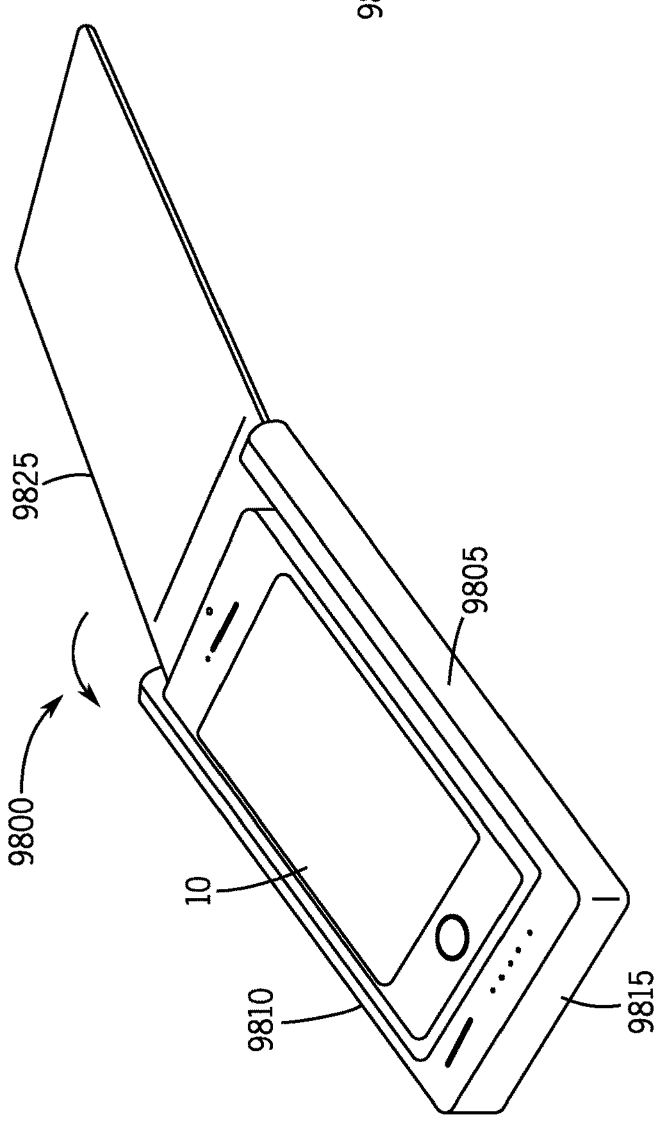

FIGS. 98A-98B illustrate various views of a privacy/security enclosure 9800 according to at least one embodiment of the invention. In some embodiments, the privacy/security enclosure 9800 can comprise a main housing 9805, enclosure 9810, coupled base assembly 9815, and foldable cover 9825. FIG. 98B shows the separation and folding or flipping of the cover 9825, and FIG. 98C shows the flipped cover 9825 with bend 9825*a*.

Figures 99A, 99B, 99C:
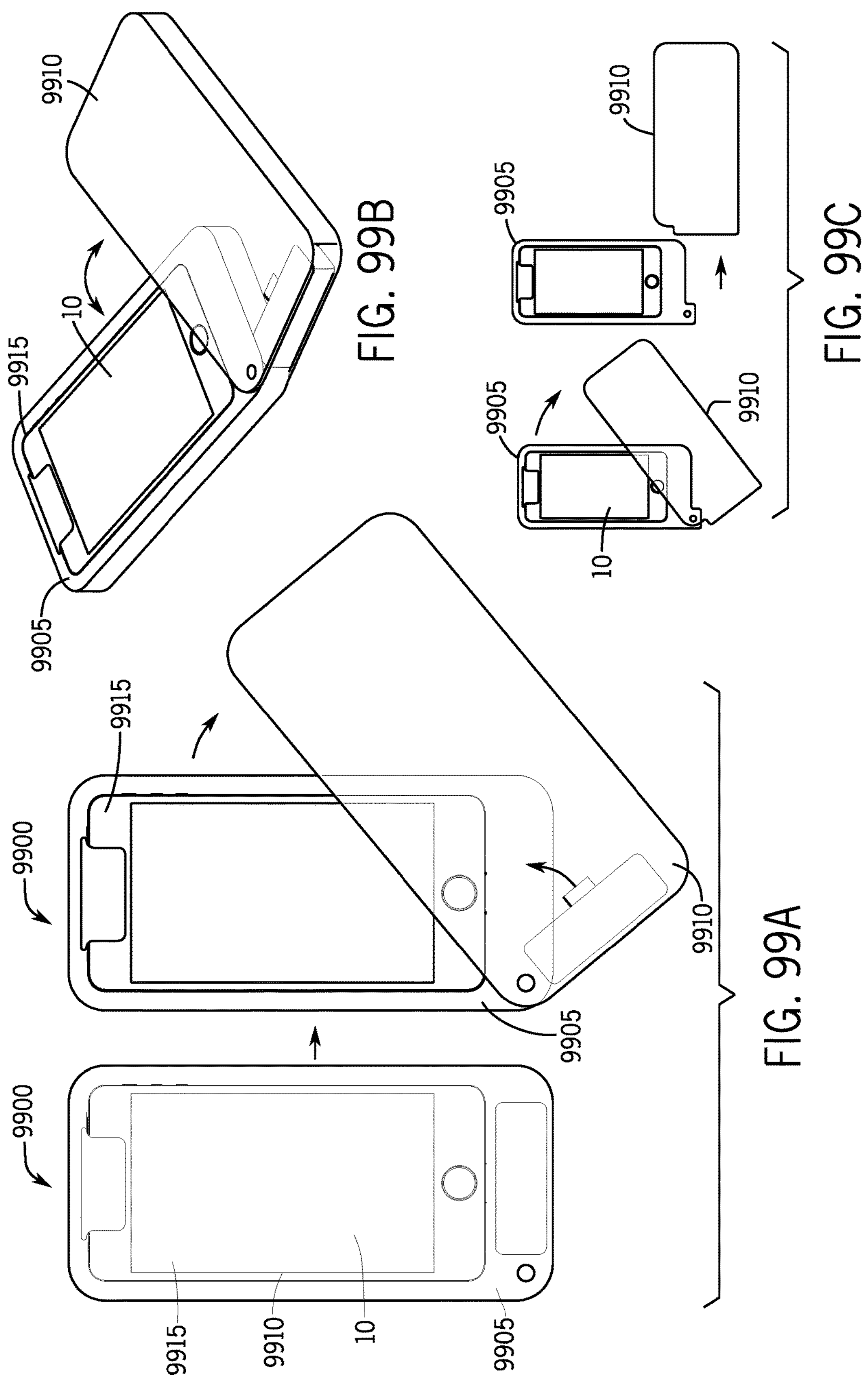
FIGS. 99A-99C illustrate various views of a privacy/security enclosure according to at least one embodiment of the invention.

FIGS. 99A-99C illustrate various views of a privacy/security enclosure 9900 according to at least one embodiment of the invention. In some embodiments, the privacy/security enclosure 9900 can comprise a main housing 9905 including a pivoting cover 9910 and enclosure 9915. FIG. 99A shows the assembly view of the pivoting cover 9910, FIG. 99B shows the privacy/security enclosure 9900 with the pivoting cover 9910 at least partially rotated from the user device 10, and FIG. 99C shows the assembly view with removal of the cover 9910.

Figure 100A:
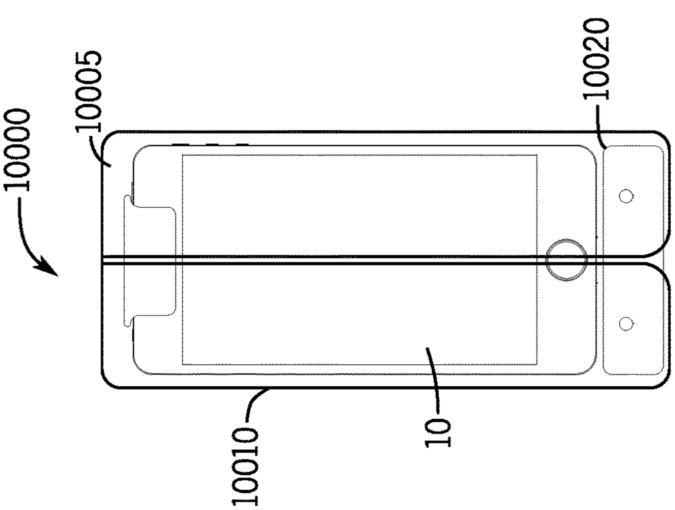
FIGS. 100A-100C illustrate various views of a privacy/security enclosure according to at least one embodiment of the invention.
Figure 100B:
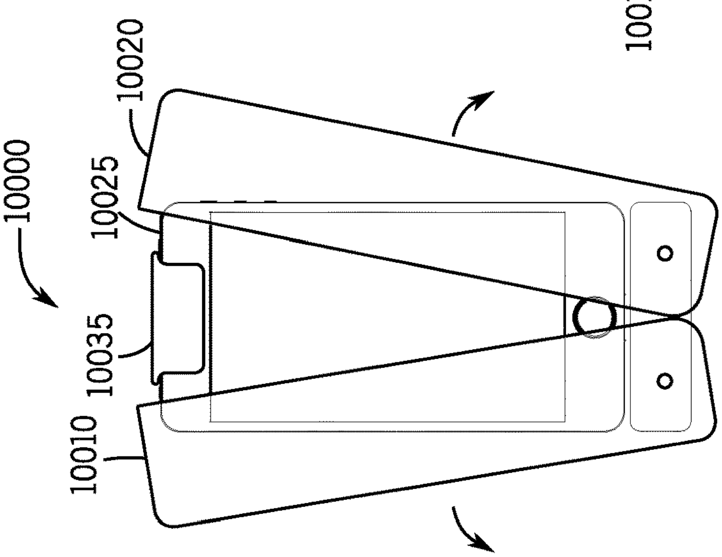
Figure 100C:
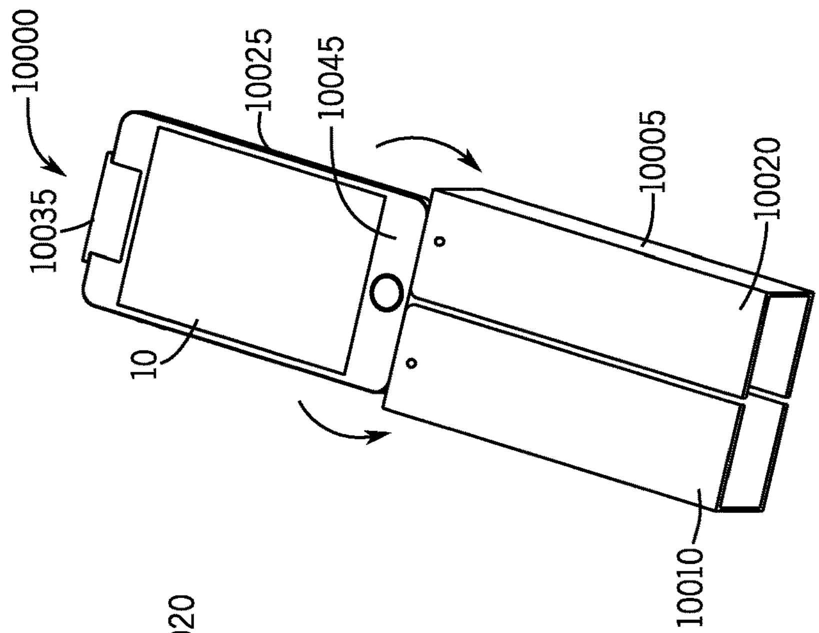

FIGS. 100A-100C illustrate various views of a privacy/security enclosure 10000 according to at least one embodiment of the invention. In some embodiments, the privacy/security enclosure 10000 can comprise main housing 10005 including a first half 10010 and a second half 10020 that can enclose an enclosure 10025 comprising a base assembly 10045 and hood 10035. FIG. 100B shows the action view of the halves 10010, 10020 pivoting apart from each other. Further, FIG. 100C shows an assembly view of the insertion or removal of the enclosure 10025 including user device 10 from the main housing 10005.

Figure 101B:
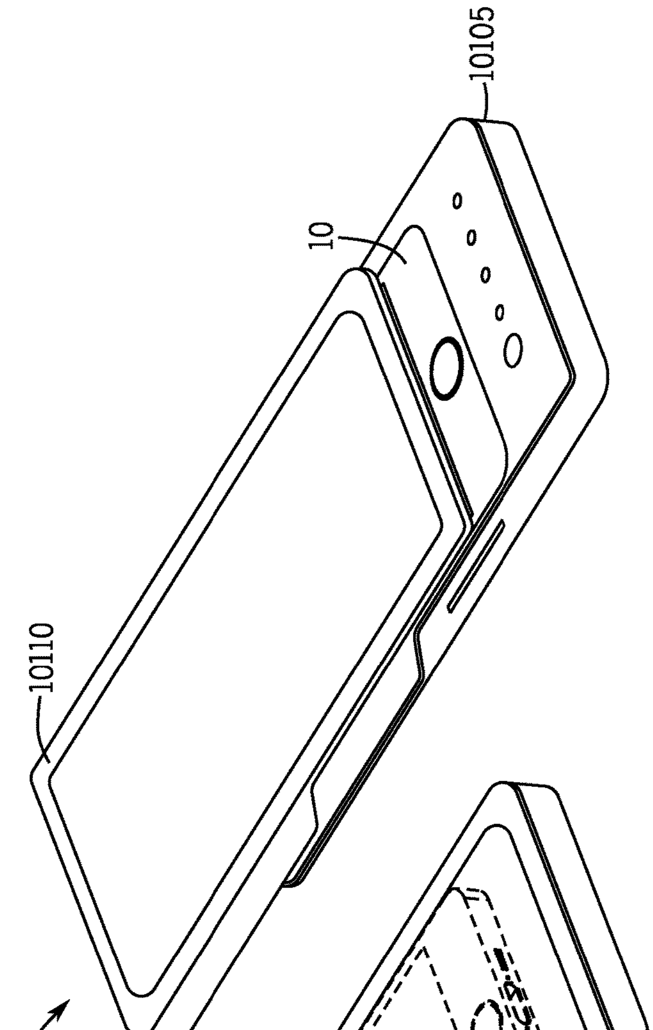
FIGS. 101A-101C illustrate various views of a privacy/security enclosure according to at least one embodiment of the invention.
Figure 101A:
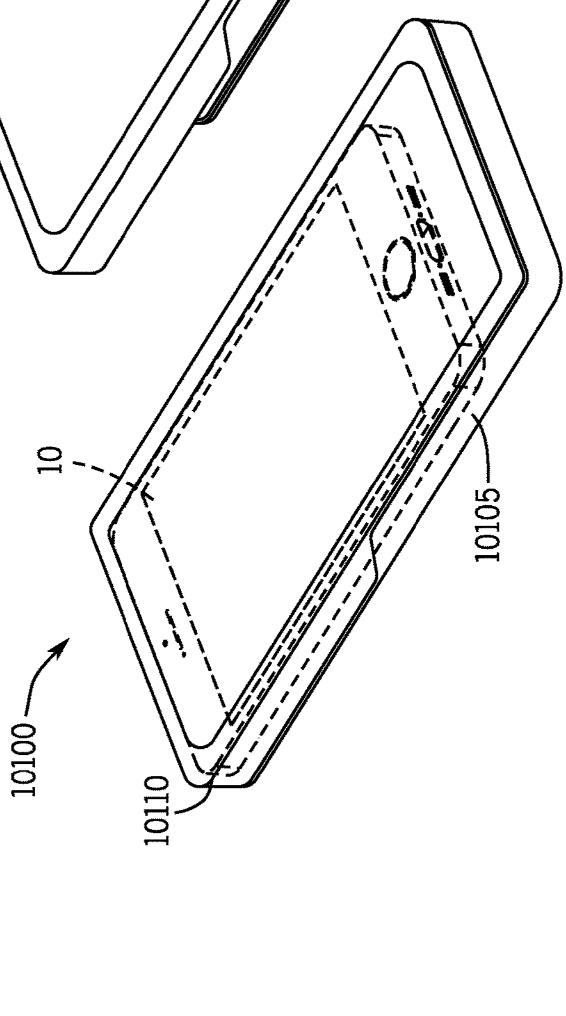
Figure 101C:
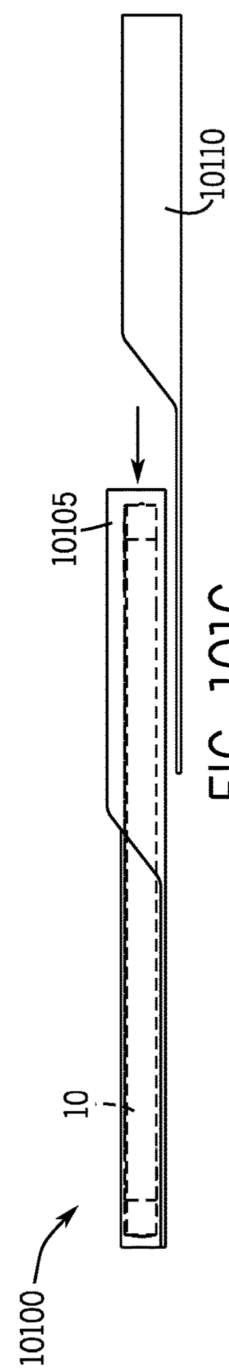

FIGS. 101A-101C illustrate various views of a privacy/security enclosure 10100 according to at least one embodiment of the invention. In some embodiments, the privacy/security enclosure 10100 can include an enclosure 10105 and reversible removable cover 10110. For example, FIG. 101A shows the reversible removable cover 10110 coupled to the enclosure 10105. FIG. 101B depicts separation of the reversible removable cover 10110 from the enclosure 10105. FIG. 101C shows removal of the enclosure 10105 from the reversible removable cover 10110 that has been reversed to function as a tray or holder.

Figure 102C:
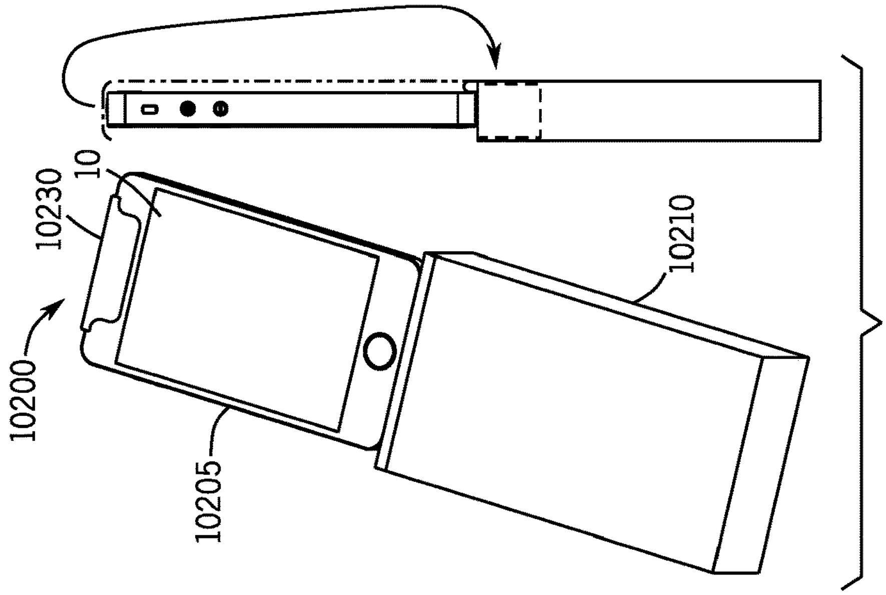
FIGS. 102A-102C illustrate various views of a privacy/security enclosure according to at least one embodiment of the invention.
Figure 102B:
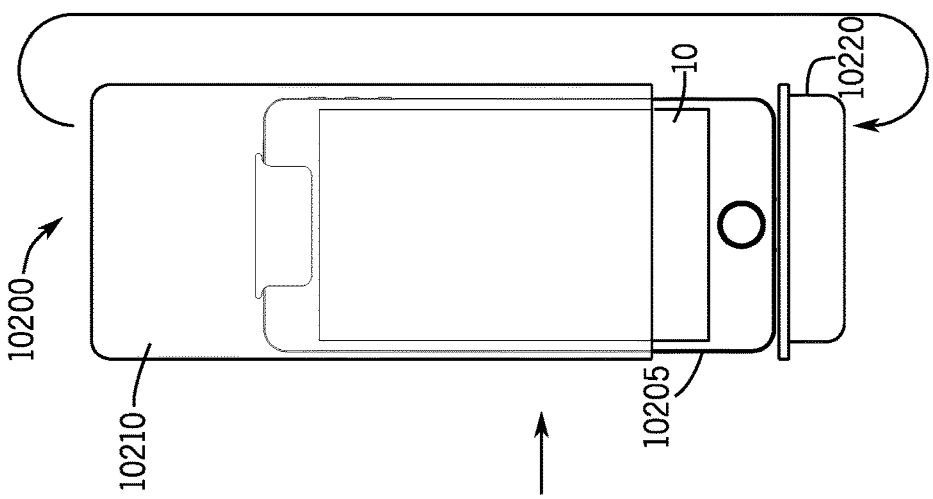
Figure 102A:
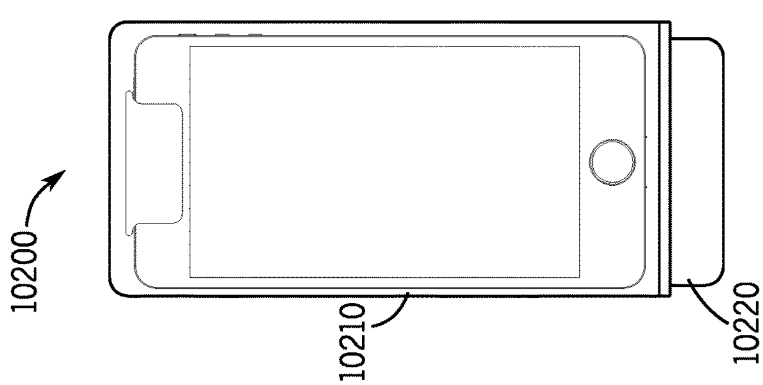

FIGS. 102A-102C illustrate various views of a privacy/security enclosure 10200 according to at least one embodiment of the invention. In some embodiments, the privacy/security enclosure 10200 can include an enclosure 10205 with base portion 10220 and hood 10230 and reversible removable cover 10210. For example, FIG. 102A shows the reversible removable cover 10210 on the enclosure 10205. FIG. 102B depicts separation of the reversible removable cover 10210 from the enclosure 10205. FIG. 102C shows removal or insertion of the enclosure 10205 from or to the reversible removable cover 10210.

Figure 103B:
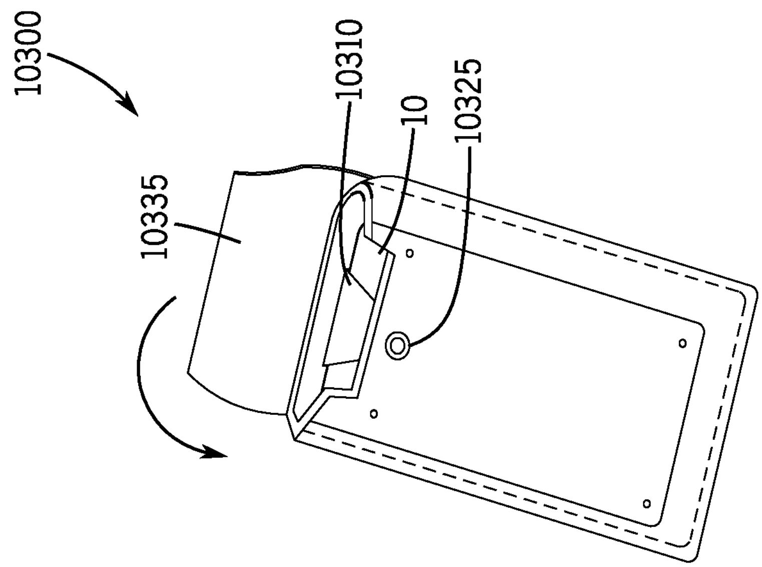
FIGS. 103A-103B illustrate various views of a privacy/security enclosure according to at least one embodiment of the invention.
Figure 103A:
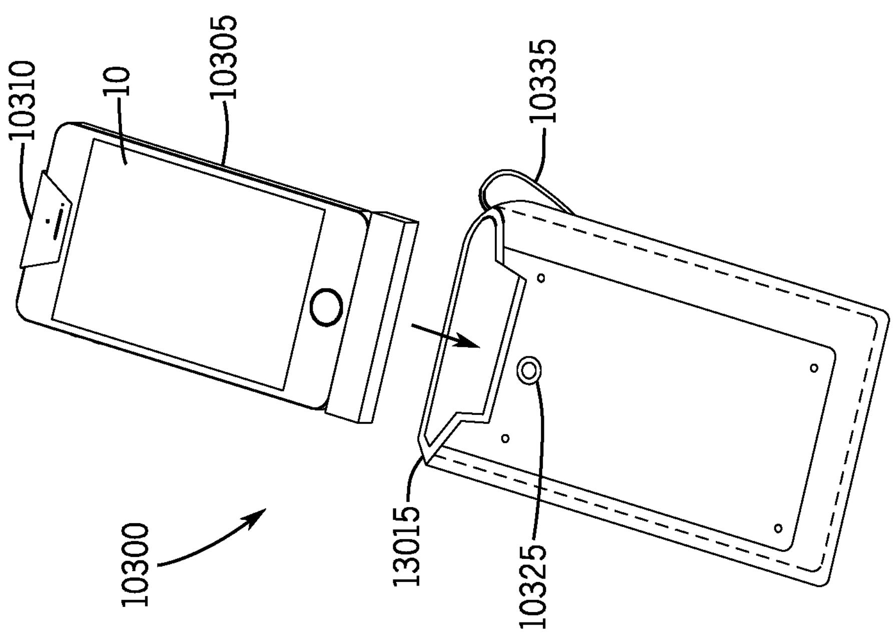

FIGS. 103A-103B illustrate various views of a privacy/security enclosure 10300 according to at least one embodiment of the invention. The enclosure 10305 includes hood 10310 and a removable wallet enclosure 10315. In some embodiments, the latch 10325 can coupled or decoupled the foldable access flap 10335 portion of the removable wallet enclosure 10315 to enable insertion, removal, or access to a user device 10.

Figure 104A:
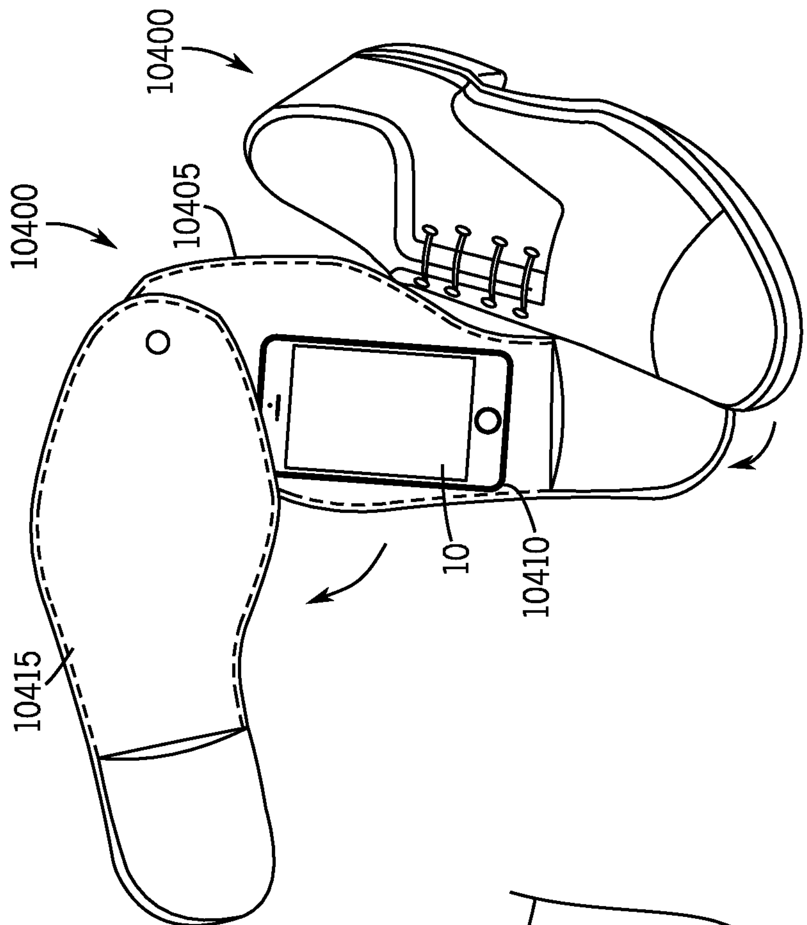
FIGS. 104A-104B illustrate various views of a privacy/security enclosure according to at least one embodiment of the invention.
Figure 104B:
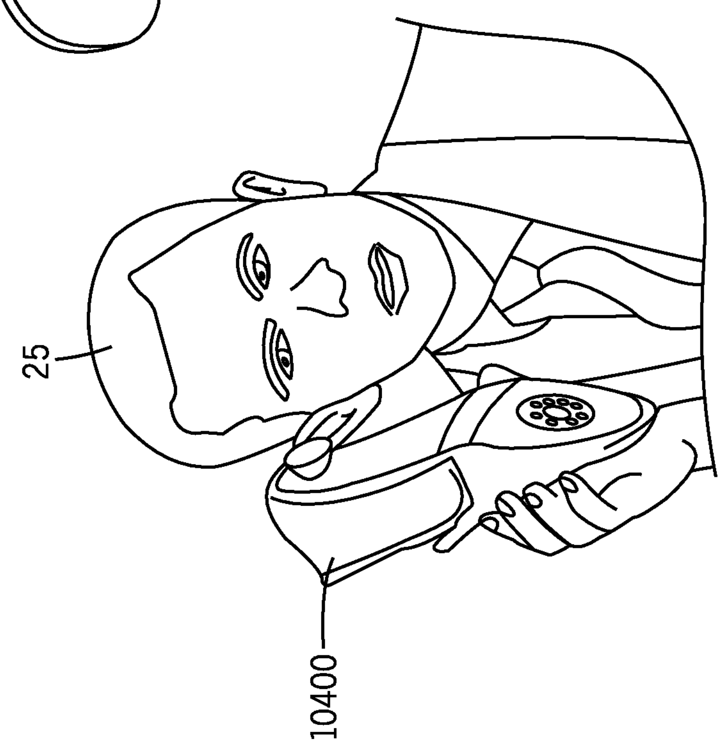

FIGS. 104A-104B illustrate various views of a privacy/security enclosure 10400 according to at least one embodiment of the invention. In some embodiments, the privacy/security enclosure 10400 can comprise a main housing 10405 appearing and/or functioning as a shoe. In some embodiments, the privacy/security enclosure 10400 can comprise an enclosure 10410 with a pivoting shoe cover 10415 (shown in action view from closed to open in FIG. 104A, and in use in FIG. 104B).

Figure 105C:
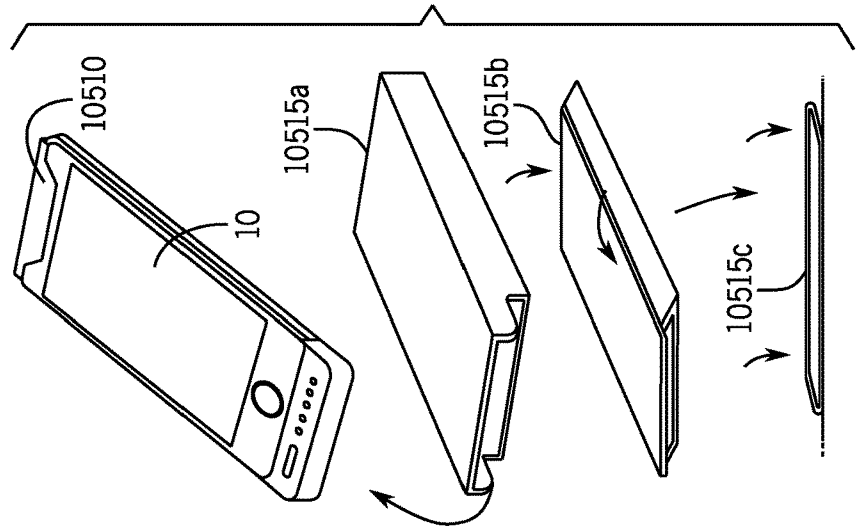
FIGS. 105A-105C illustrate various views of a privacy/security enclosure according to at least one embodiment of the invention.
Figure 105B:
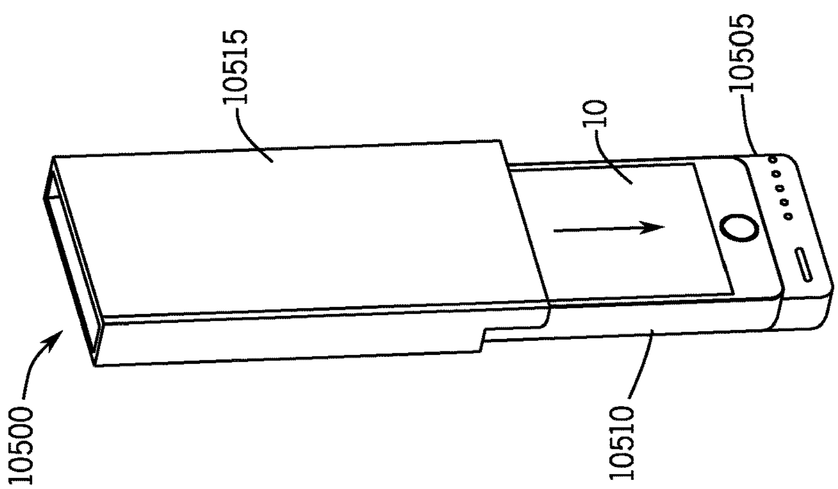
Figure 105A:
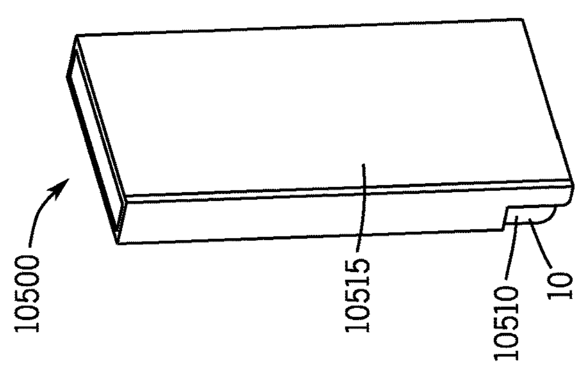

FIGS. 105A-105C illustrate various views of a privacy/security enclosure 10500 according to at least one embodiment of the invention. For example, privacy/security enclosure 10500 can comprise main housing 10505 with enclosure 10510 as shown in FIG. 105A. The assembly view of FIG. 105B shows the removal or insertion of the enclosure 10510 from the main housing 10505. FIG. 105C shows the removal of the enclosure 10510 from the main housing 10505 and the subsequent partial collapse of the main housing 10505 to a lower profile (shown progressively as 10515*a* to 10515*b* to 10515*c*.)

Figure 106C:
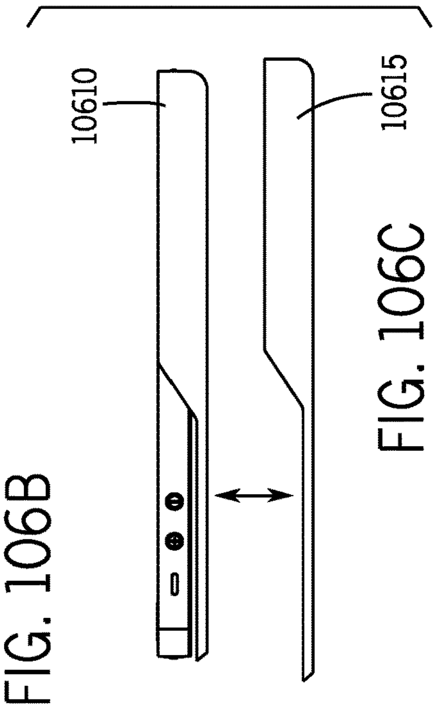
FIGS. 106A-106C illustrate various views of a privacy/security enclosure according to at least one embodiment of the invention.
Figure 106B:
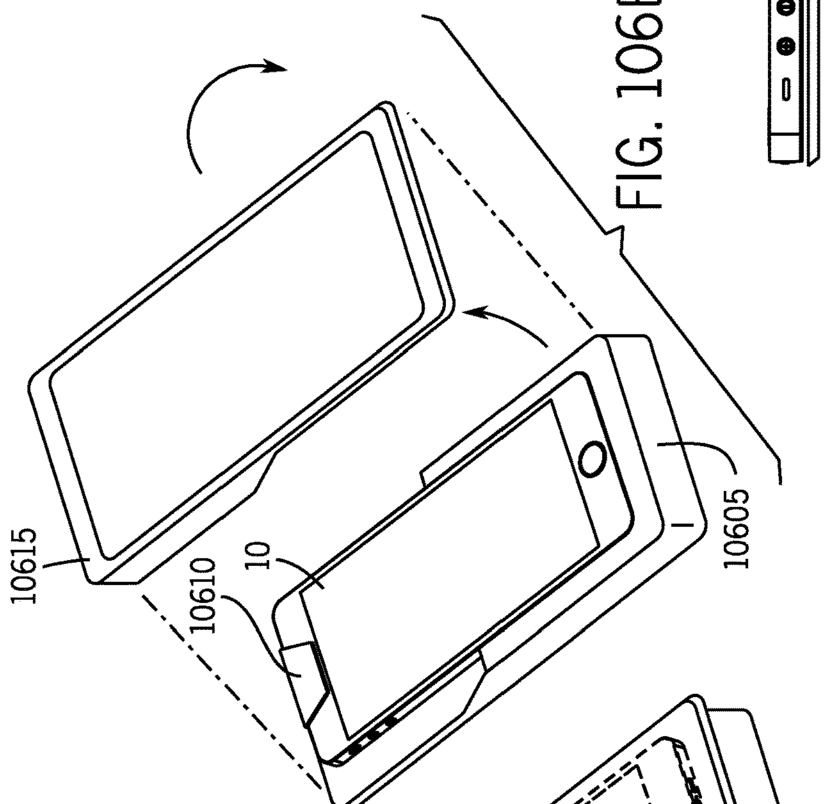
Figure 106A:
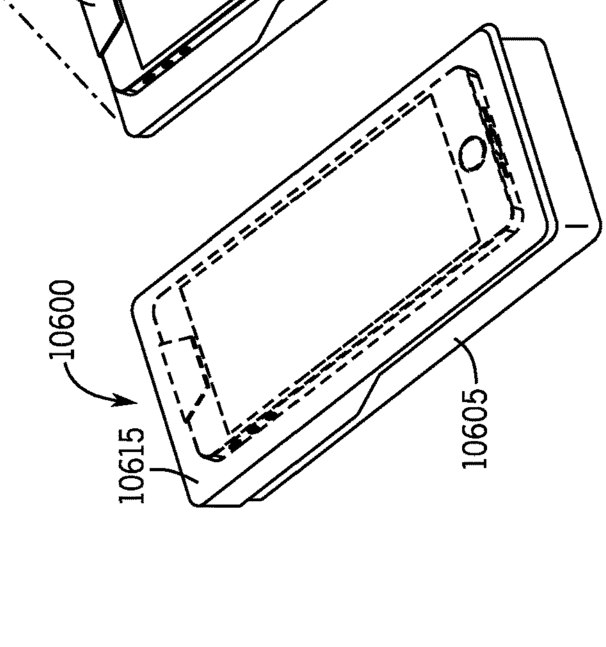

FIGS. 106A-106C illustrate various views of a privacy/security enclosure 10600 according to at least one embodiment of the invention. In some embodiments, the privacy/security enclosure 10600 can include an enclosure 10605 and reversible removable cover 10615. For example, FIG. 106A shows the reversible removable cover 10615 coupled to the enclosure 10605. FIG. 106B depicts separation of the reversible removable cover 10610 from the enclosure 10605. FIG. 106C shows removal of the enclosure 10605 from the reversible removable cover 10610 that has been reversed to function as a tray or holder.

FIGS. 107A-107D illustrate various views of a privacy/security enclosure 10700 according to at least one embodiment of the invention. In some embodiments, the enclosure

Figures 107A, 107B, 107C, 107D:
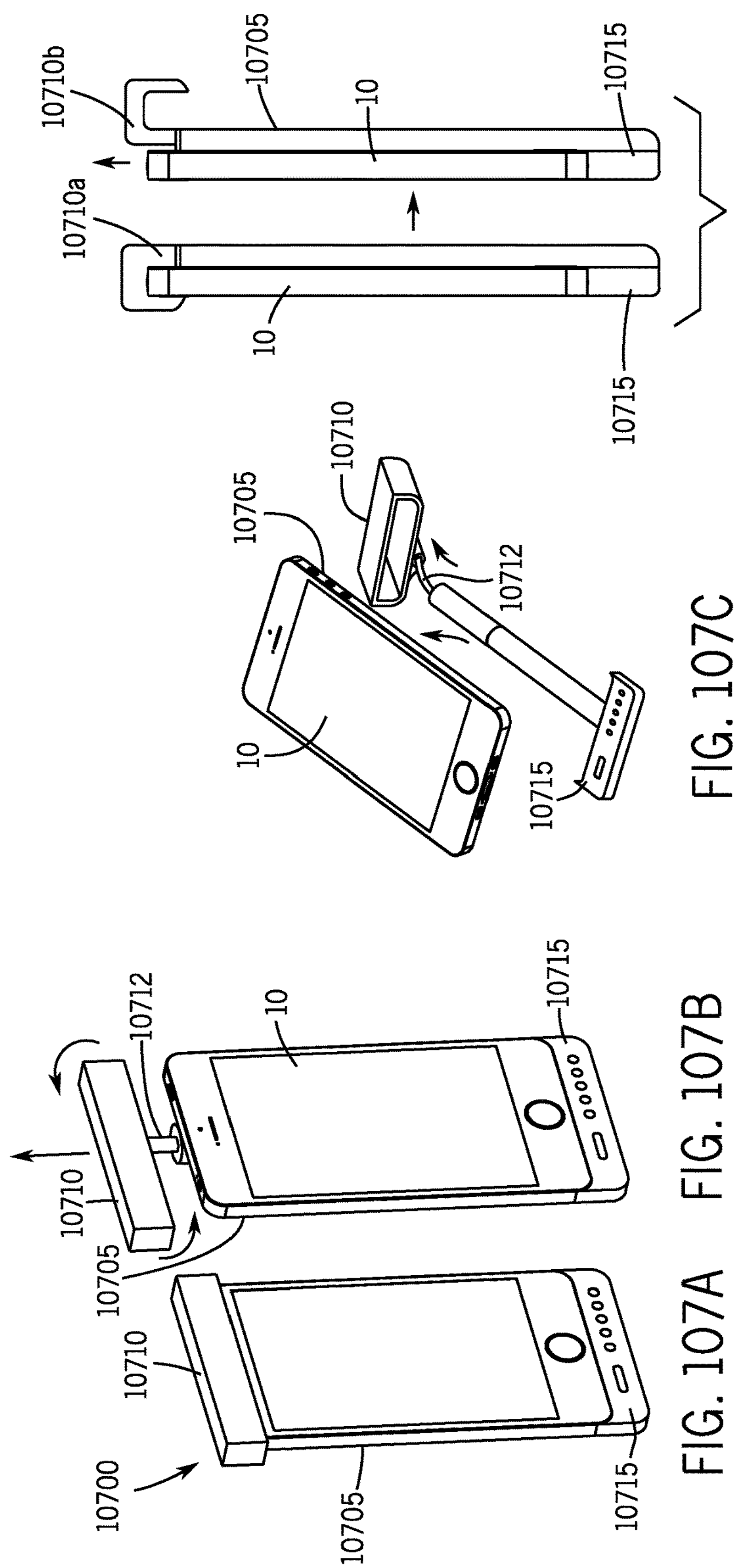
FIGS. 107A-107D illustrate various views of a privacy/security enclosure according to at least one embodiment of the invention.

10705 can comprise a base assembly 10715 and rotatable hood 10710. Referring to FIG. 107B, in some embodiments, the rotatable hood 10710 can be extended and rotated via a tensioner 10712. Referring to FIG. 107C, in some embodiments, the rotatable hood 10710 can be extended and rotated from a first or closed position 10710*a* (clasping a user device 10) to a second or open position 10710*b* to enable a user to access and/or remove the user device 10 from the enclosure 10705.

Figure 108C:
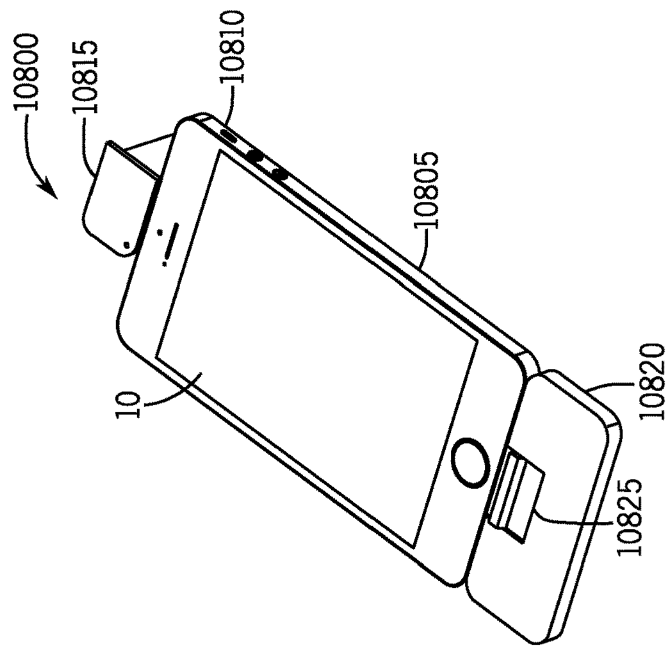
FIGS. 108A-108C illustrate various views of a privacy/security enclosure according to at least one embodiment of the invention.
Figure 108B:
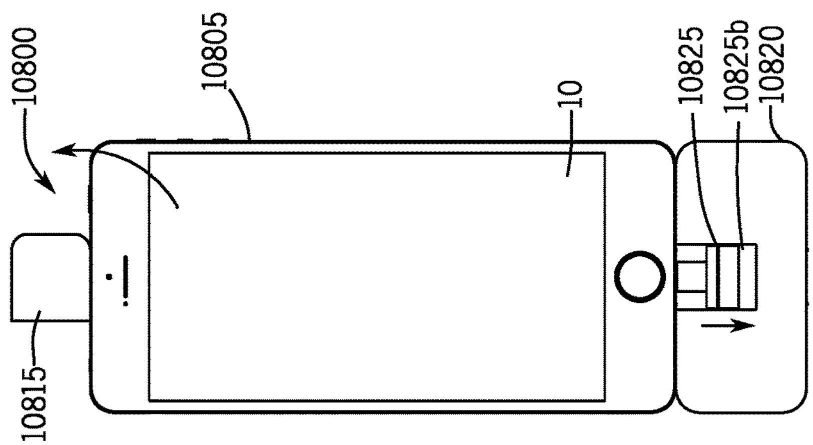
Figure 108A:
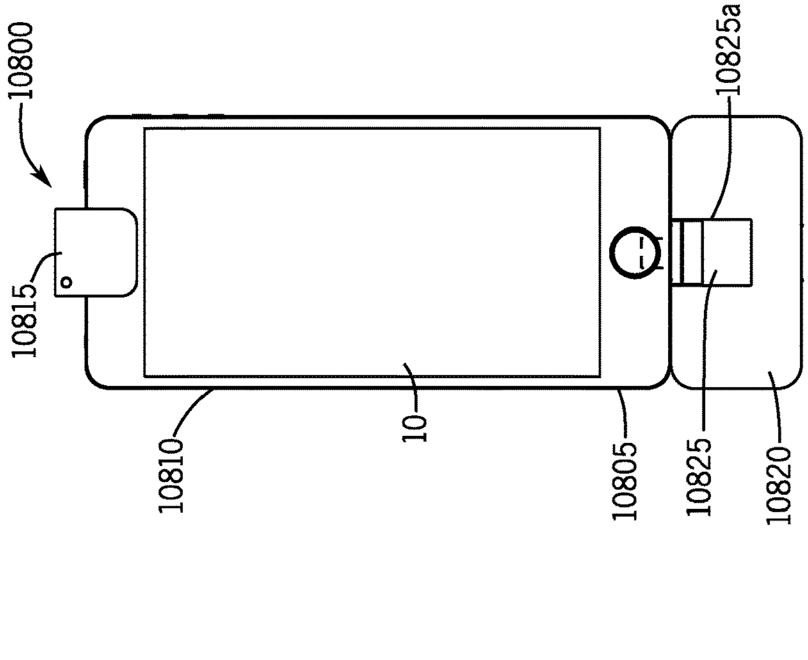

FIGS. 108A-108C illustrate various views of a privacy/security enclosure 10800 according to at least one embodiment of the invention. In some embodiments, the privacy/security enclosure 10800 comprises a main housing 10805 including an enclosure 10810, coupled hood 10815, and base enclosure 10820. In some embodiments, the base enclosure 10820 can include a sliding plug 10825 movable from a first position (shown as 10825*a* in FIG. 108A) to a second position (shown as 10825*b* in FIG. 108B). In some embodiments, the sliding plug 10825 can be used to modify the privacy of an enclosed user device 10.

Figure 109A:
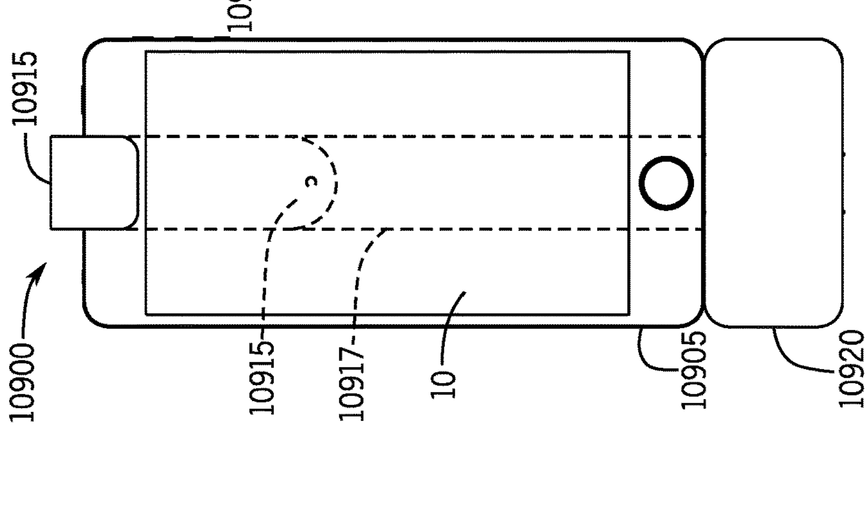
FIGS. 109A-109C illustrate various views of a privacy/security enclosure according to at least one embodiment of the invention.
Figure 109B:
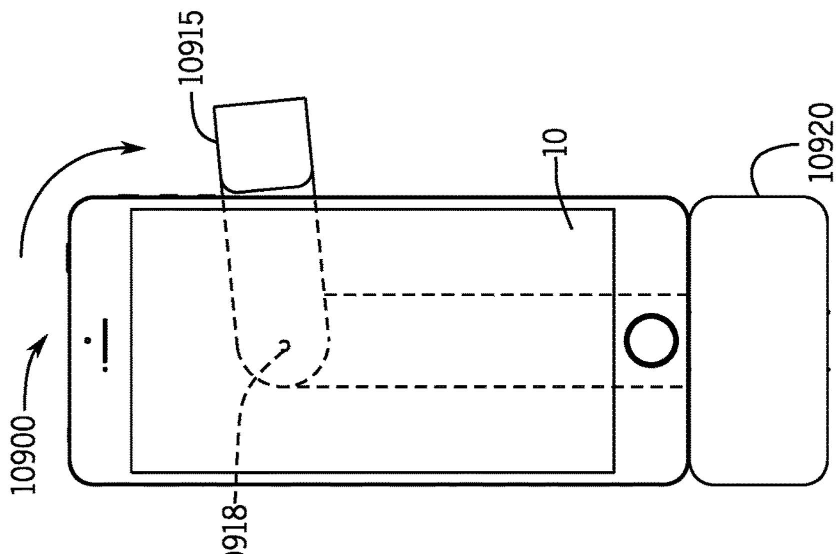
Figure 109C:
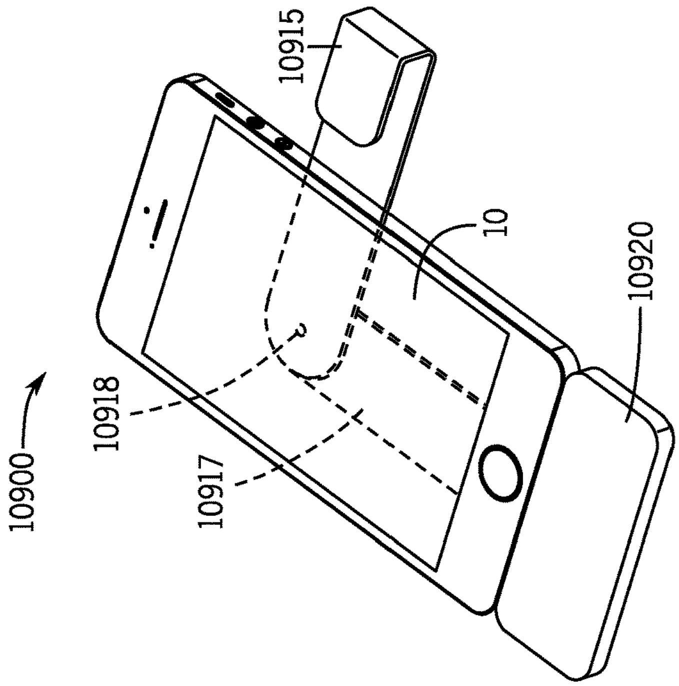

FIGS. 109A-109C illustrate various views of a privacy/security enclosure 10900 according to at least one embodiment of the invention. Some embodiments of the invention include a main housing 10905 comprising a rotatable hood 10915 pivotably coupled to a base support 10917 about a pivot 10918. The base support 10917 is further coupled to a base enclosure 10920. In some embodiments, a user can open and remove a user device by rotating the rotatable hood 10915 by pivoting the hood 10915 from the base support 10917 about the pivot 10918 (show rotated in FIGS. 109B-109C).

Figures 110A, 110B, 110C:
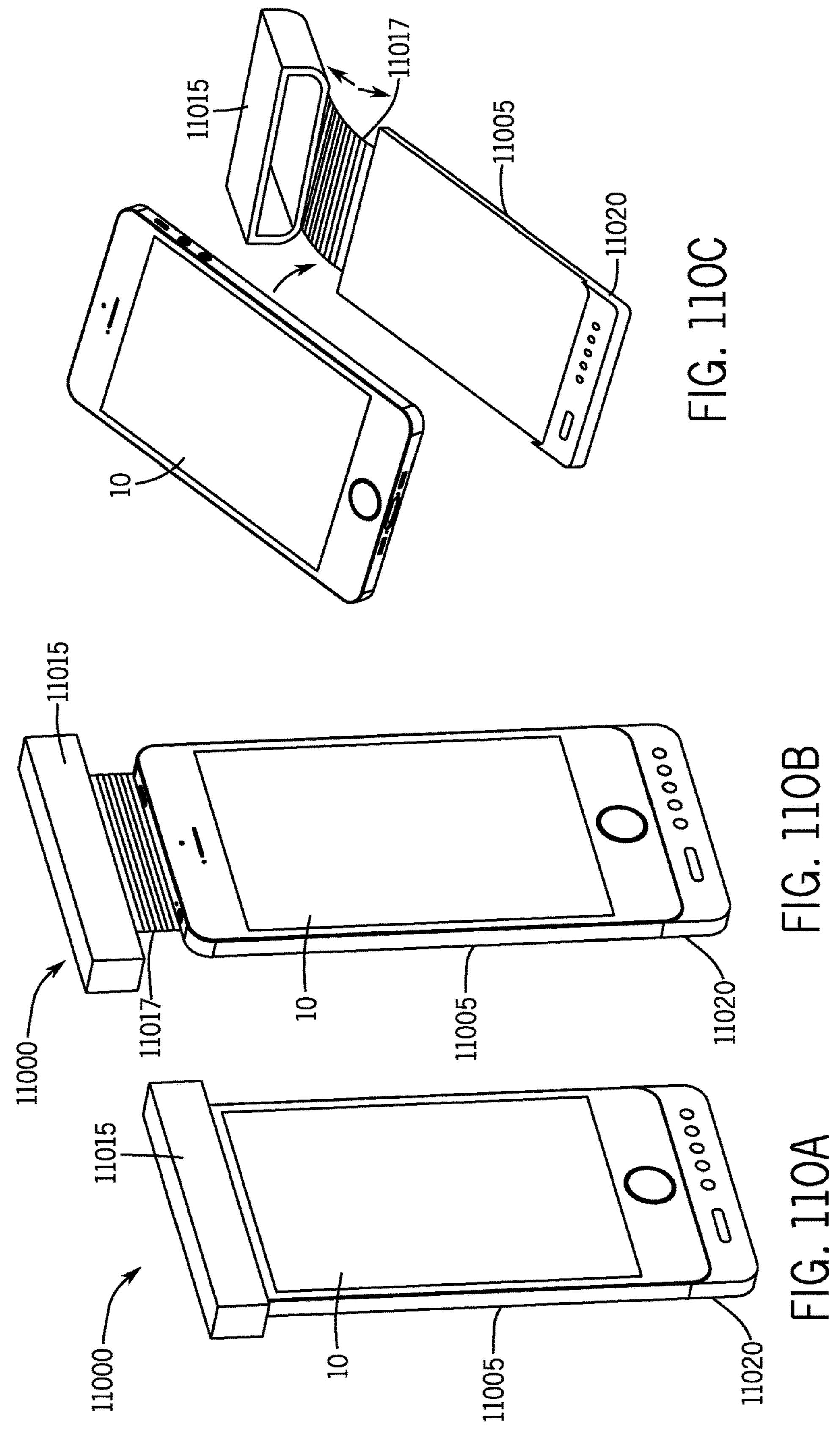
FIGS. 110A-110C illustrate various views of a privacy/security enclosure according to at least one embodiment of the invention.

FIGS. 110A-110C illustrate various views of a privacy/security enclosure 11000 according to at least one embodiment of the invention. In some embodiments, the privacy/security enclosure 11000 can comprise an enclosure 11005 including a base assembly 11020, and including an extendible hood 11015 coupled to an extender 11017. In some embodiments, the hood 11015 can be extended or moved upwards away from the base assembly 11020 to enable access to an enclosed user device 10, or to enable a user to insert a user device 10 in the enclosure 11005 (see FIG. 110B). Referring to FIG. 110C, in some embodiments, the user device 10 can be inserted or removed into or from the enclosure 11005 with the hood 11015 extended outward coupled to the extender 11017.

Figure 111B:
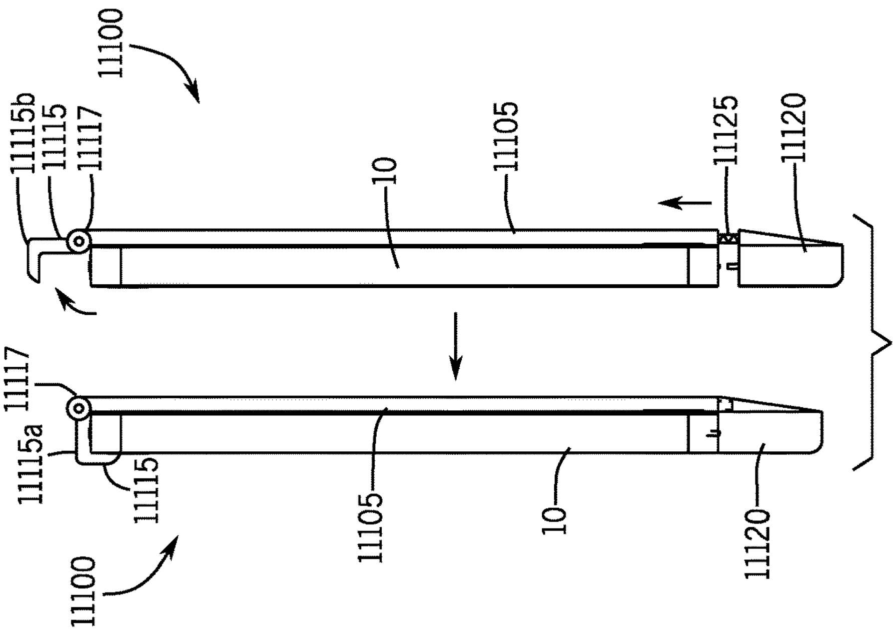
FIGS. 111A-111B illustrate various views of a privacy/security enclosure according to at least one embodiment of the invention.
Figure 111A:
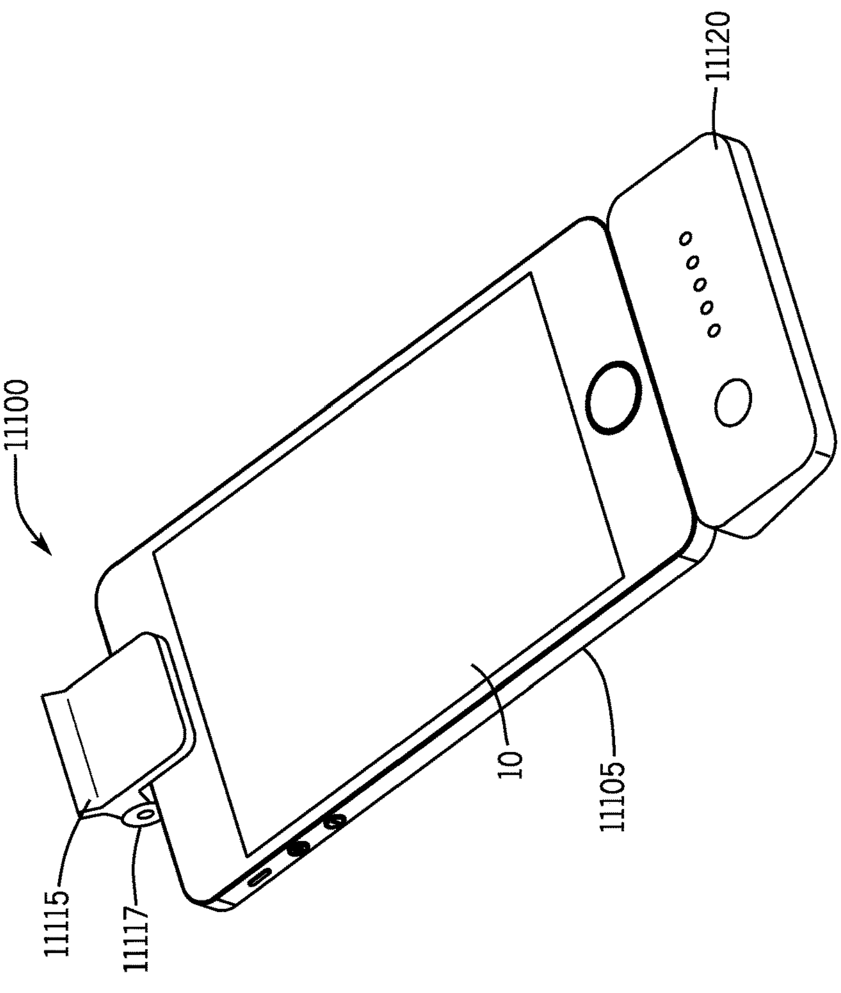

FIGS. 111A-111B illustrate various views of a privacy/security enclosure 11100 according to at least one embodiment of the invention. In some embodiments, the enclosure 11105 can comprise a base assembly 11120 with a base extension spring 11125, and a rotatable hood 11115 coupled to a hood pivot 11117. In some embodiments, access to a user device 10 and/or insertion or removal of the user device 10 can be facilitated by rotating the hood 11115 about the pivot 11117 to move the hood 11115 from a closed position (11115*a*) to an open position (11115*b*), and/or by extending the base assembly 11120 on the base extension spring 11125 (see the assembly view of FIG. 111B).

Figure 112B:
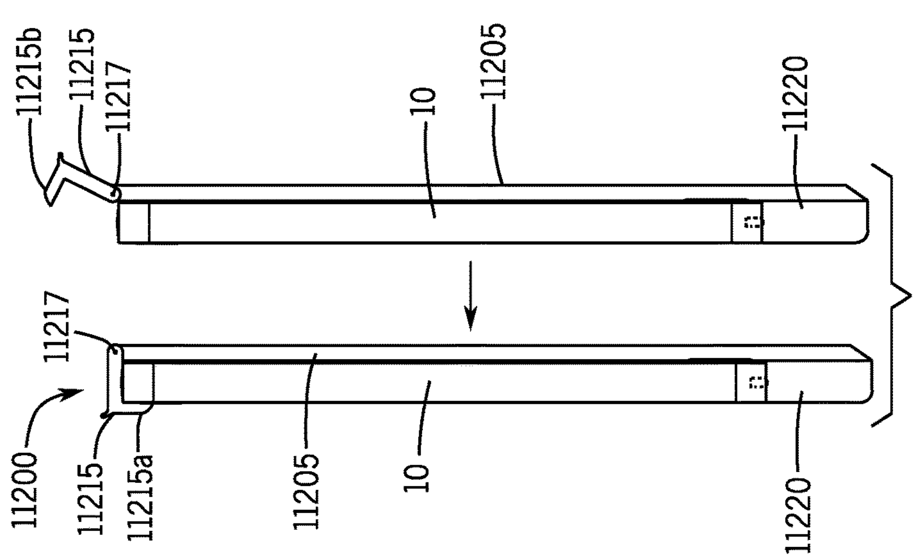
FIGS. 112A-112B illustrate various views of a privacy/security enclosure according to at least one embodiment of the invention.
Figure 112A:
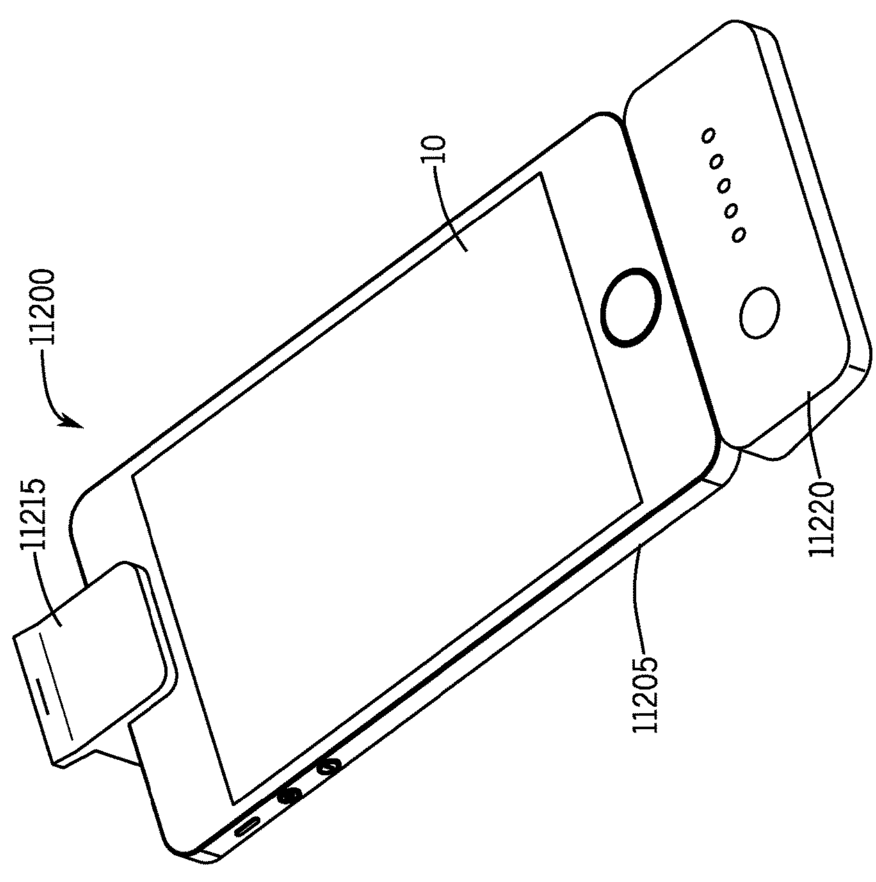

FIGS. 112A-112B illustrate various views of a privacy/security enclosure 11200 according to at least one embodiment of the invention. In some embodiments, the enclosure 11205 can comprise a base assembly 11220, and a rotatable hood 11215 coupled to a hood pivot 11217. In some embodiments, access to a user device 10 and/or insertion or removal of the user device 10 can be facilitated by rotating the hood 11215 about the pivot 11217 to move the hood 11215 from a closed position (11215*a*) to an open position (11215*b*) (see the assembly view of FIG. 112B).

Figure 113B:
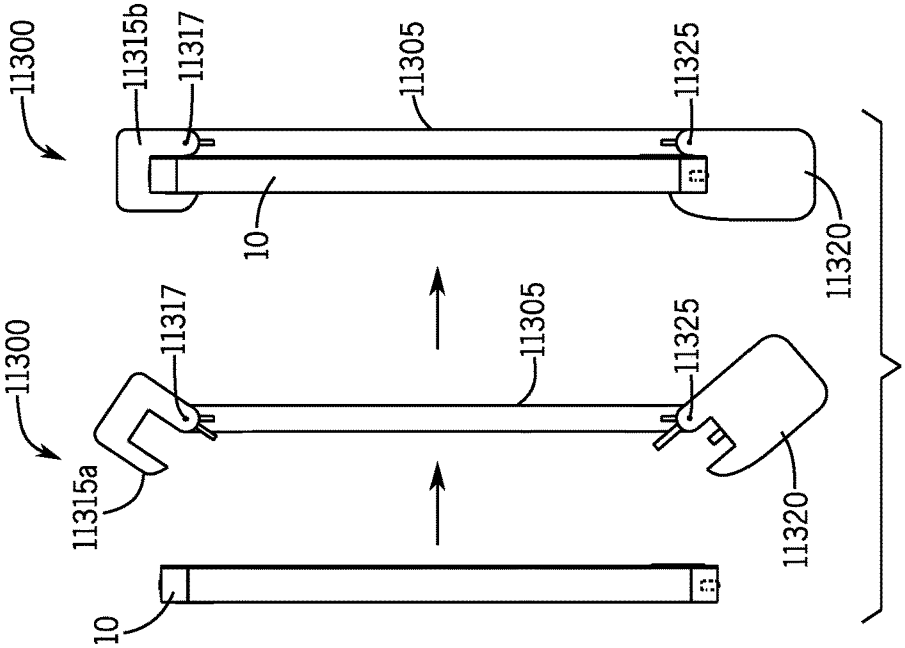
FIGS. 113A-113B illustrate various views of a privacy/security enclosure according to at least one embodiment of the invention.
Figure 113A:
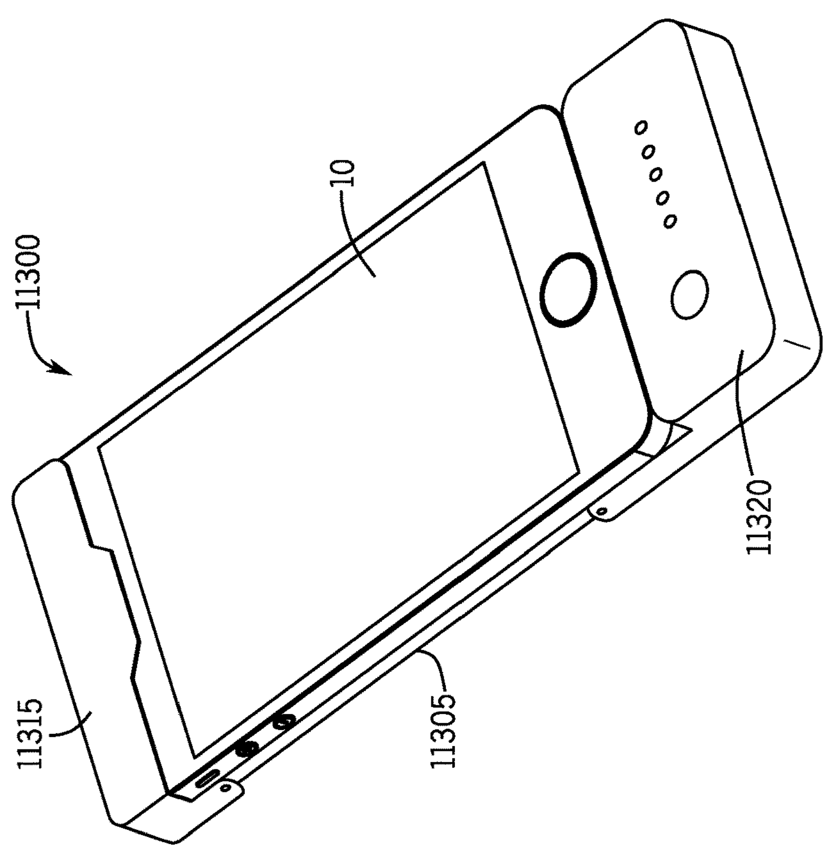

FIGS. 113A-113B illustrate various views of a privacy/security enclosure 11300 according to at least one embodiment of the invention. In some embodiments, the enclosure 11305 can comprise a base assembly 11320 with a base pivot 11325, and a rotatable hood 11315 coupled to a hood pivot 11317. In some embodiments, insertion or removal of the user device 10 can be facilitated by rotating the hood 11315 about the pivot 11317 to move the hood 11315 from a an open position (11315*a*) to a closed position (11315*b*), and/or by rotating a portion of the base assembly 11320 and/or a clamp on the base pivot 11325 (see the assembly view of FIG. 113B).

Figure 114B:
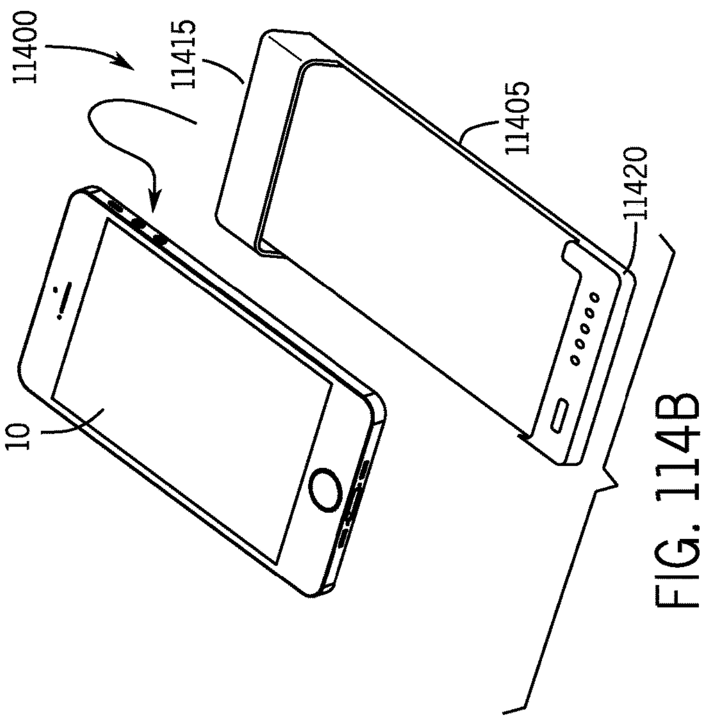
FIGS. 114A-114B illustrate various views of a privacy/security enclosure according to at least one embodiment of the invention.
Figure 114A:
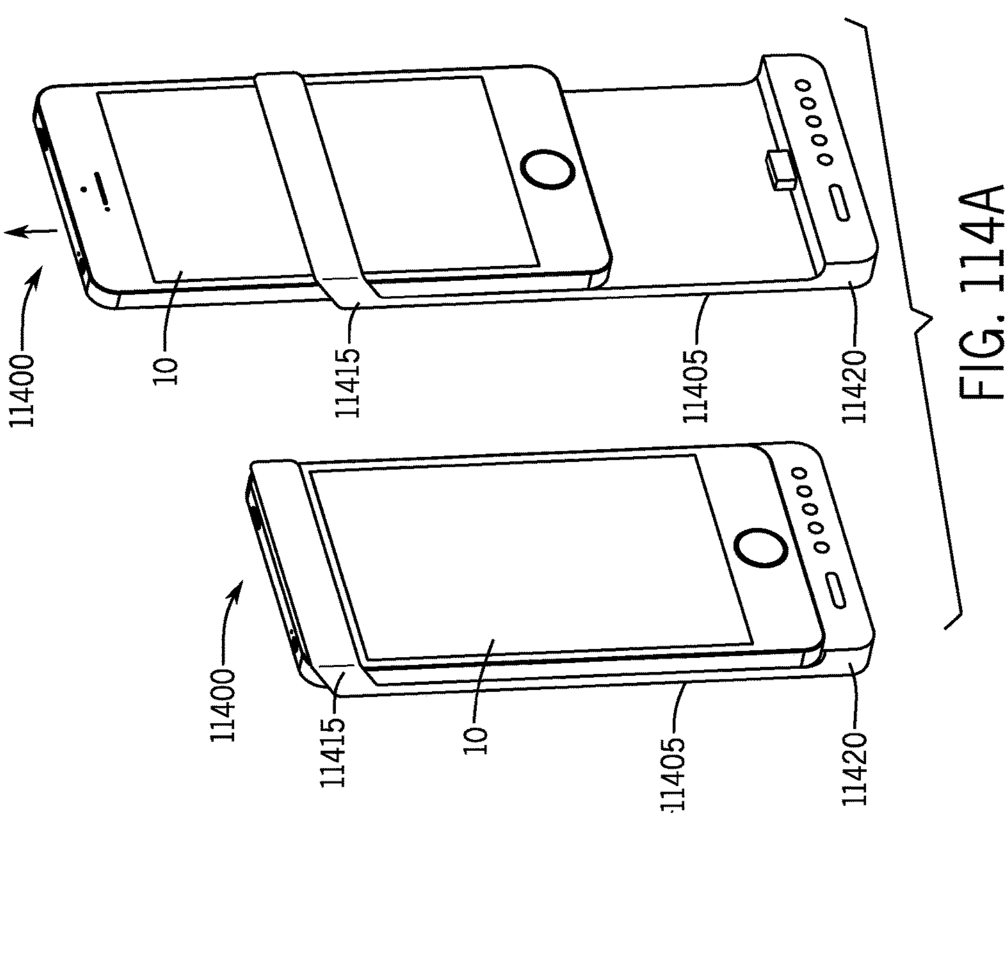

FIGS. 114A-114B illustrate various views of a privacy/security enclosure 11400 according to at least one embodiment of the invention. In some embodiments, the privacy/security enclosure 11400 can include the enclosure 11405 comprising a hood 11415 and base assembly 11420. In some embodiments, the user device 10 can be removed from the privacy/security enclosure 11400 (shown in the assembly view of FIGS. 114A and 114B).

Figure 115B:
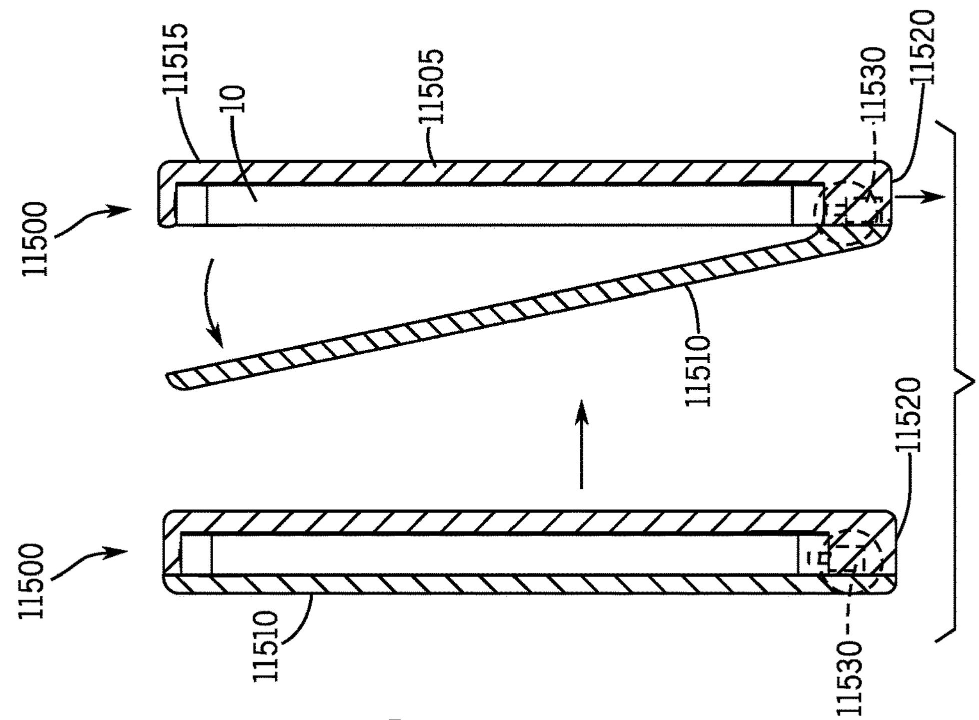
FIGS. 115A-115B illustrate various views of a privacy/security enclosure according to at least one embodiment of the invention.
Figure 115A:
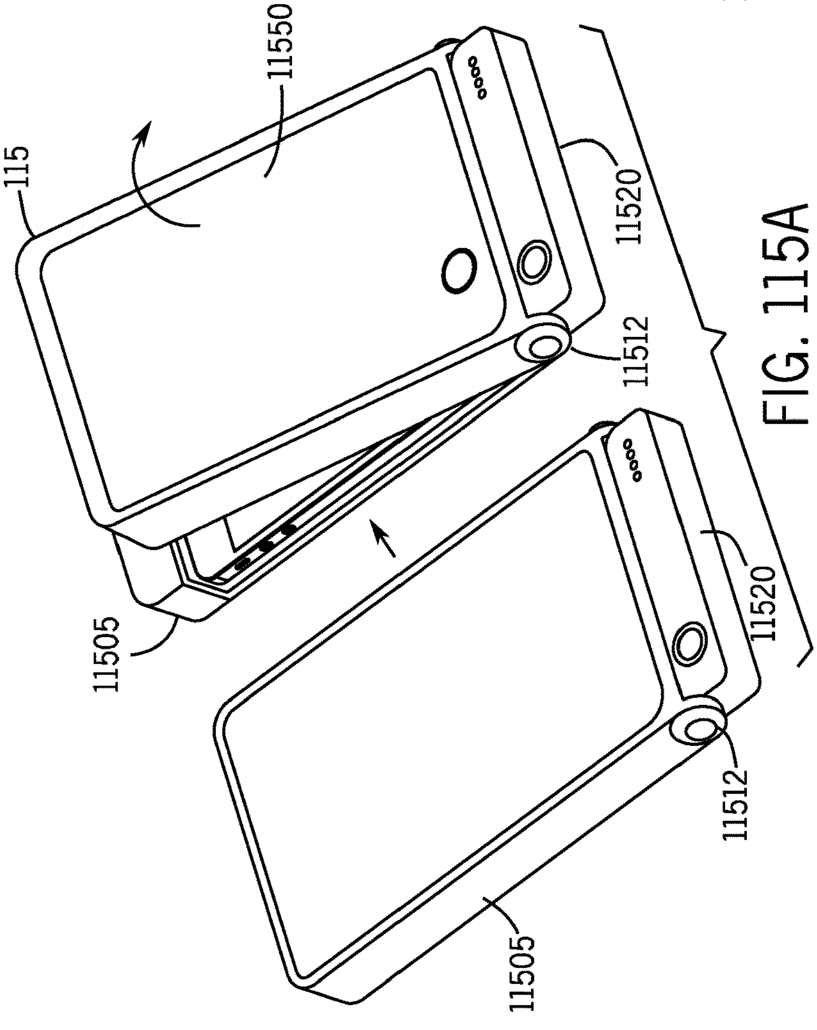

FIGS. 115A-115B illustrate various views of a privacy/security enclosure 11500 according to at least one embodiment of the invention. In some embodiments, the privacy/security enclosure 11500 comprises a main housing 11505, a coupled flip cover 11510, pivotable coupled to an enclosure 11515 including a base assembly 11520 and lever assembly 11530. In some embodiments, the upper cover 11550 of the flip cover 11510 can pivot about the pivot 11512 to open or close the cover 11510. In some embodiments, the lever assembly 11530 can into and out of the base assembly as the upper cover 11550 is opened and closed.

Figure 116B:
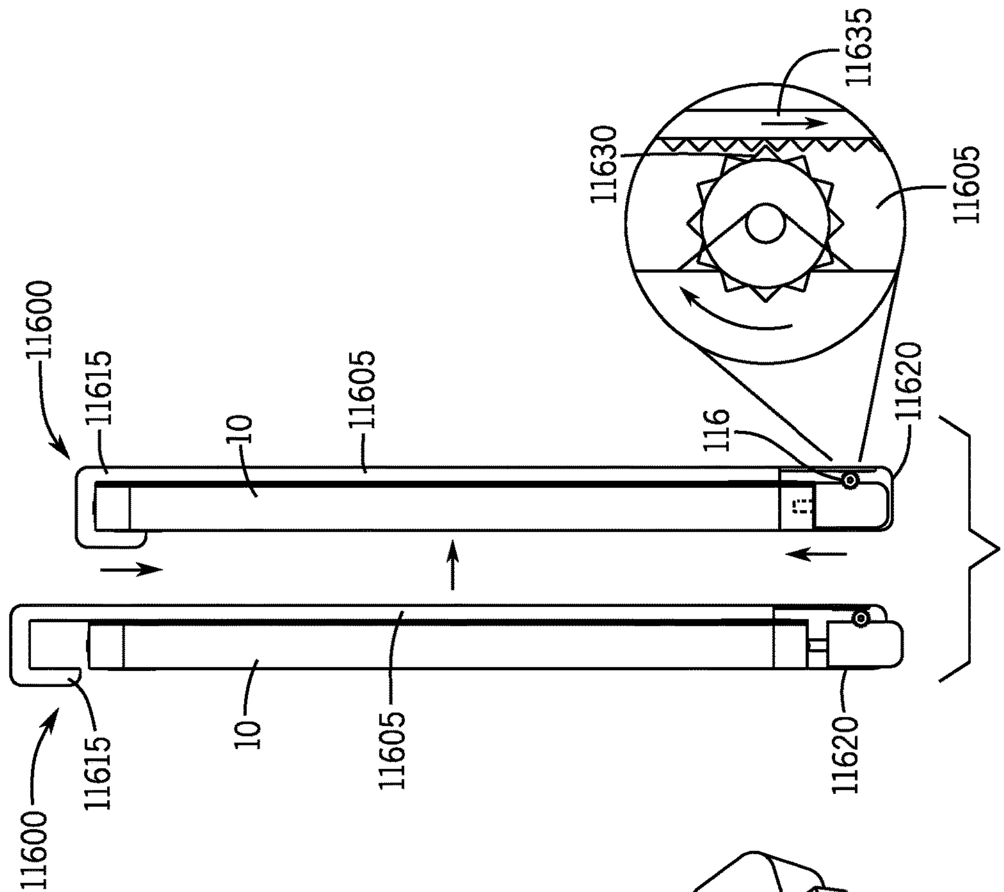
FIGS. 116A-116B illustrate various views of a privacy/security enclosure according to at least one embodiment of the invention.
Figure 116A:
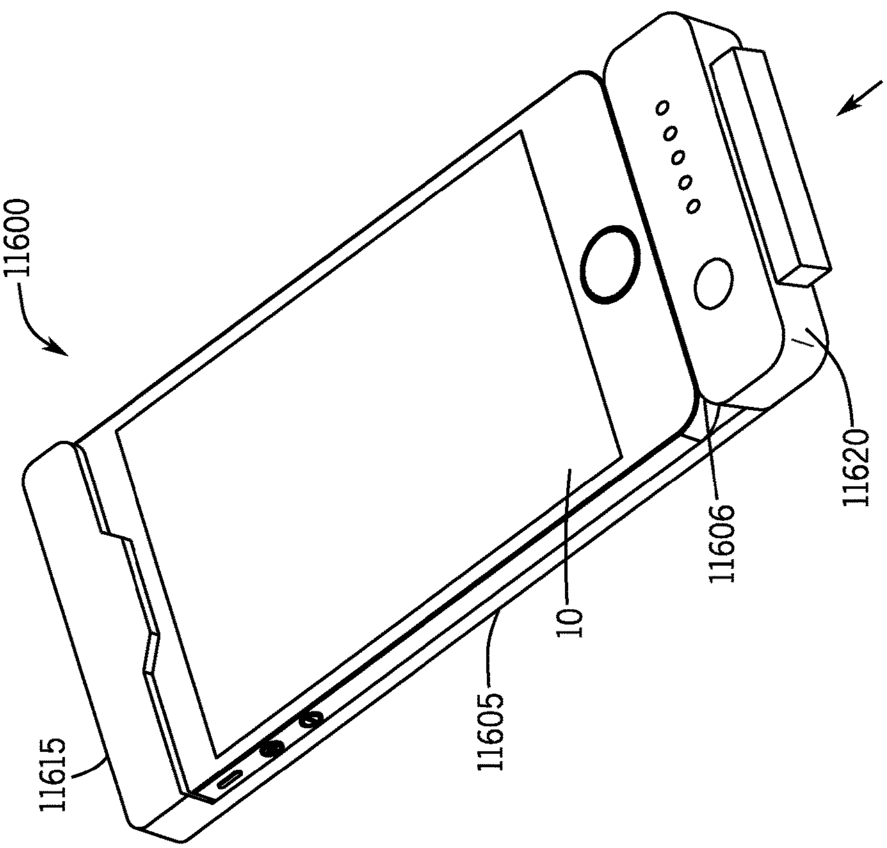

FIGS. 116A-116B illustrate various views of a privacy/security enclosure 11600 according to at least one embodiment of the invention. In some embodiments, the privacy/security enclosure 11600 can comprise an enclosure 11605 including a hood 11615 and base assembly 11620. In some embodiments, the enclosure 11605 including the hood 11615 can be extended or retracted using a gear 11630 coupled to teeth 11635. Using the action shown in FIG. 116B, the inner region 11606 can be enlarged (to enable a user to access a user device 10 or to place a user device 10 in the enclosure 11605).

Figure 117B:
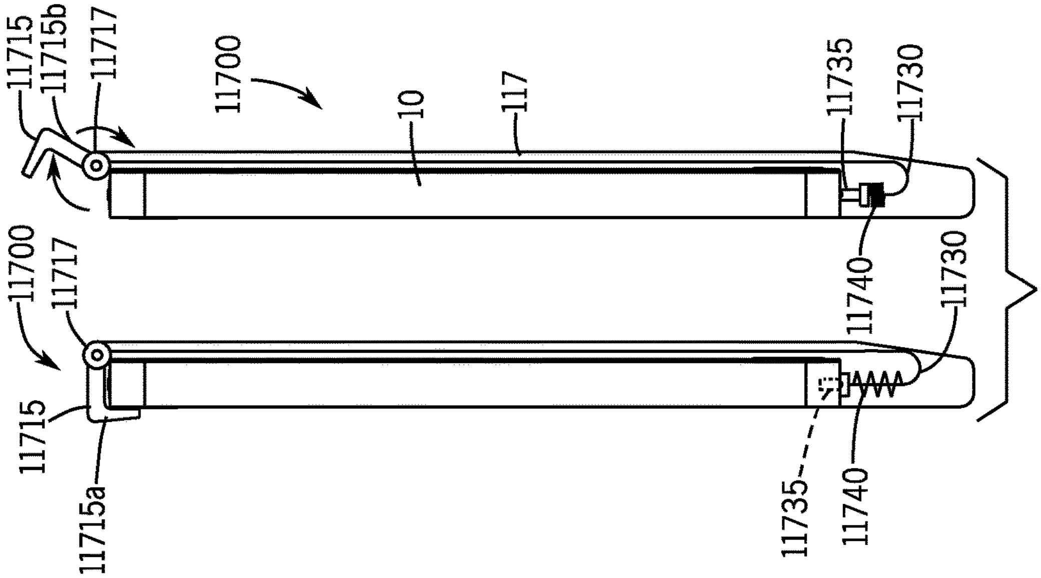
FIGS. 117A-117B illustrate various views of a privacy/security enclosure according to at least one embodiment of the invention.
Figure 117A:
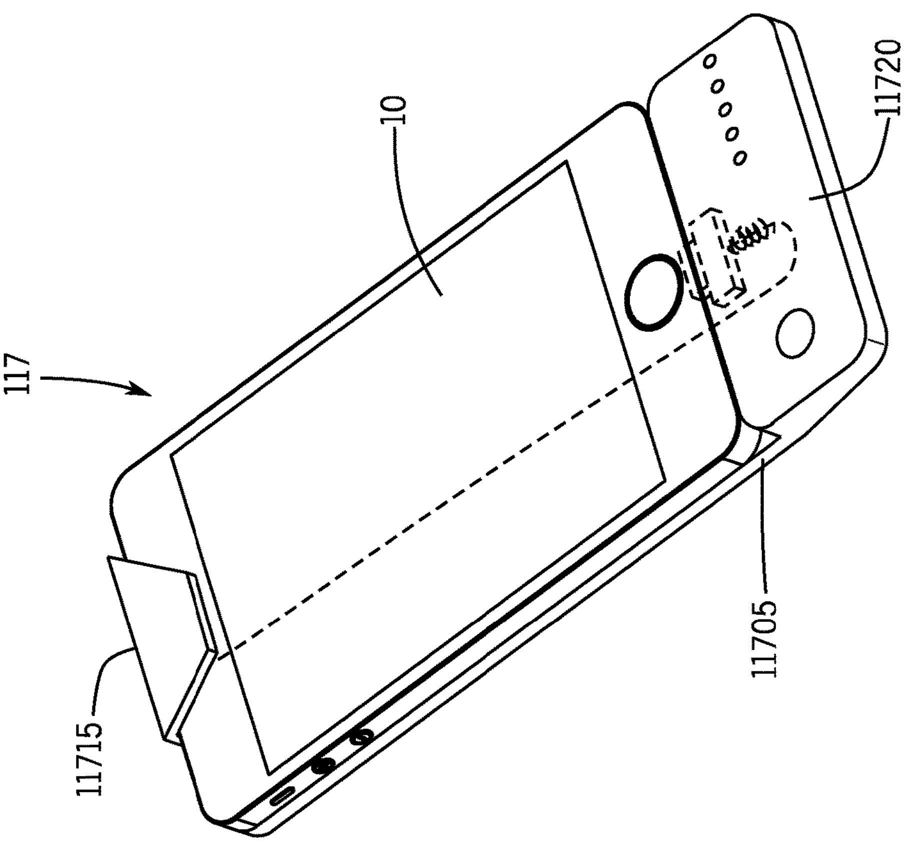

FIGS. 117A-117B illustrate various views of a privacy/security enclosure 11700 according to at least one embodiment of the invention. In some embodiments, the privacy/security enclosure 11700 can comprise an enclosure 11705 including a hood 11715 movable from a closed hood 11715*a* to an open hood 11715*b* using a pivot 11717 (show in action view of FIG. 117B). Further, in some embodiments, the base assembly 11720 can include a lever or plug 11735 coupled to the hood 11715 by a cable 11730 and spring or tensioner 11740. In some embodiments, actuation of the hood 11715 to a closed position (11715*a*) can cause the lever or plug 11735 to extend into or against a portion of the user device 10. Further, actuation of the hood 11715 to an open position (11715*b*) can cause the lever or plug 11735 to extend out of or away from a portion of the user device 10.

Figure 118:
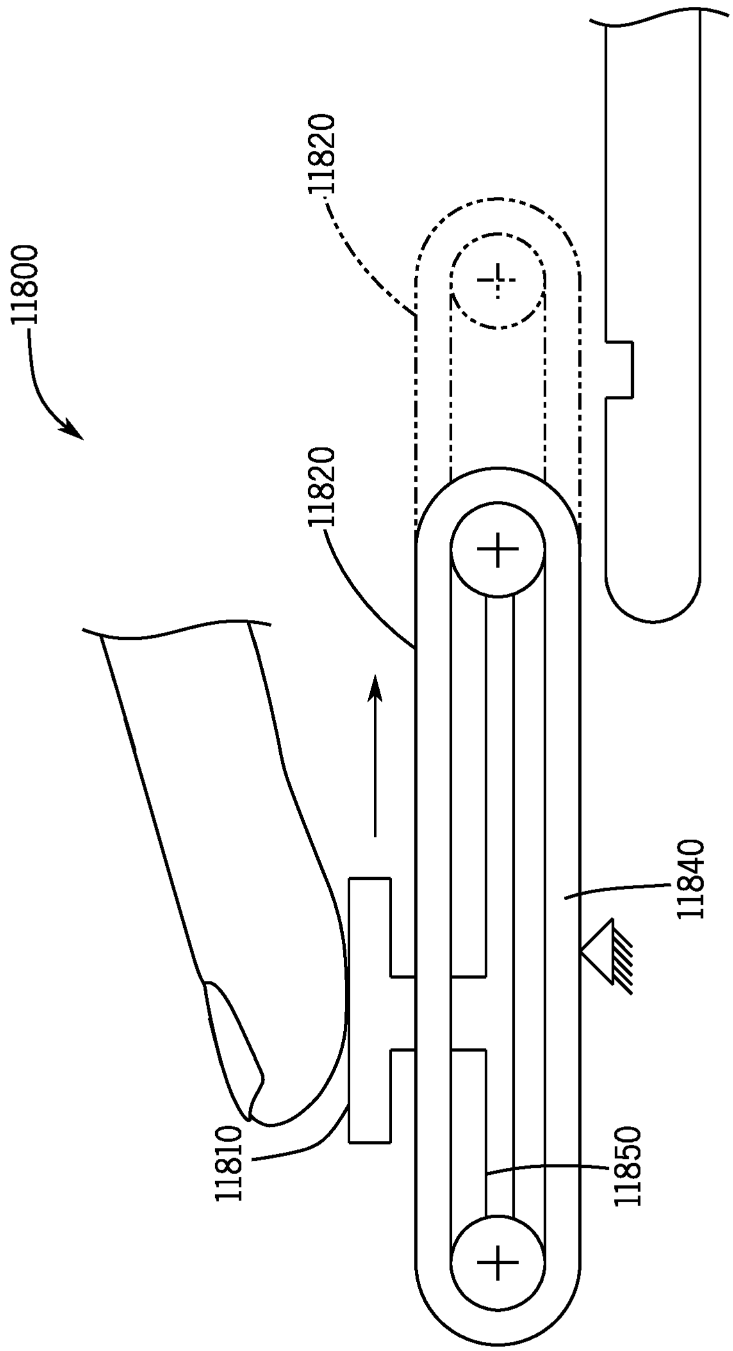
FIG. 118 depicts a microphone blocking assembly according to one embodiment of the invention.

FIG. 118 depicts a microphone blocking assembly 11800 according to one embodiment of the invention. In some embodiments, a user can use a switch 11810 coupled to a belt assembly 11820 including a belt 11840 and pulley assembly 1850 to block (sealing position 11830) or unblock a microphone of a user device 10.

Figure 119:
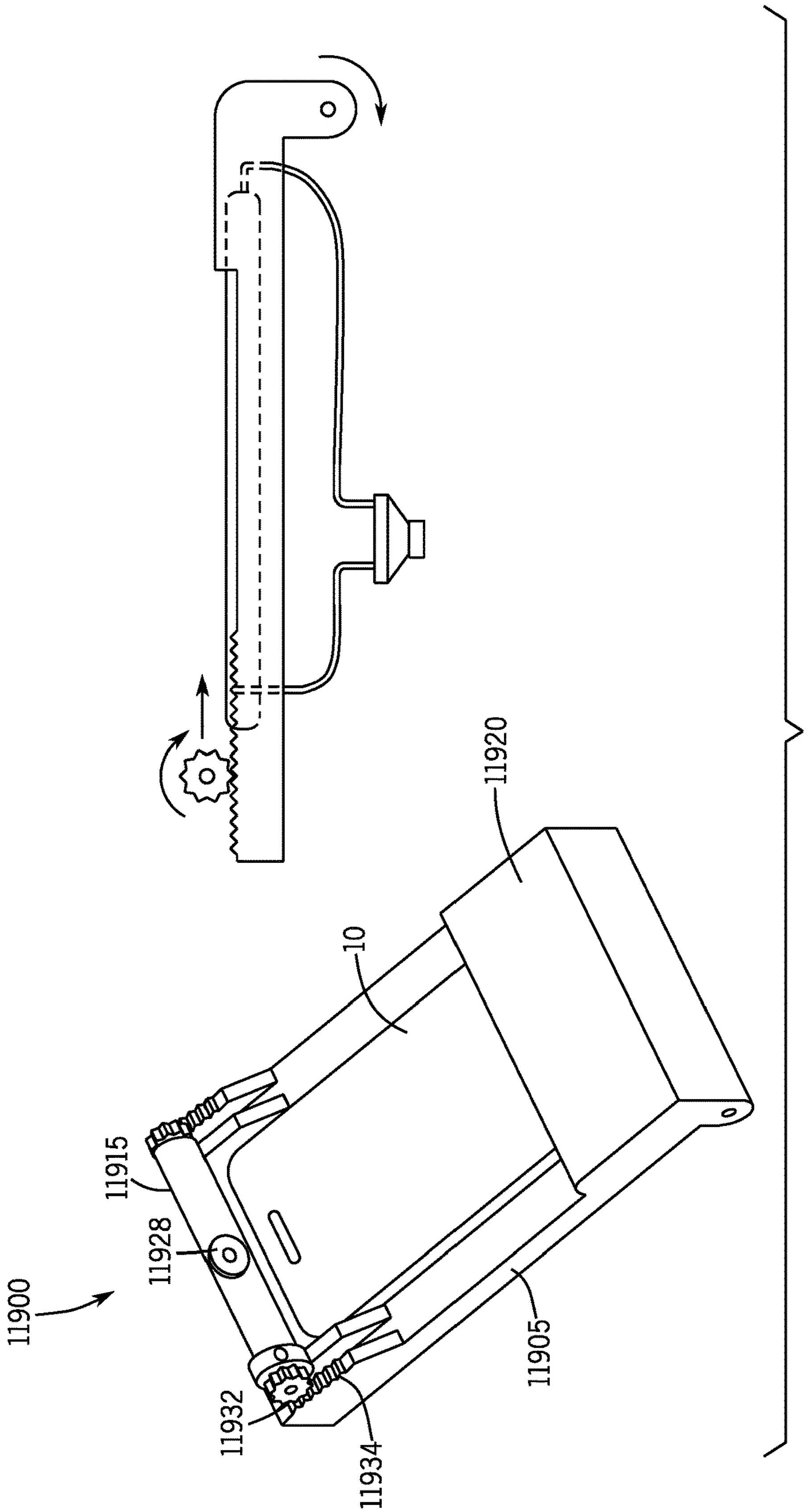
FIG. 119 depicts a microphone blocking assembly according to one embodiment of the invention.

FIG. 119 depicts a microphone blocking assembly 11900 according to one embodiment of the invention. In some embodiments, the enclosure 11905 can comprise a roller 11915, base enclosure 11920, microphone blocker 11928, gear assembly 11932, and teeth 11934. In some embodiments, the microphone blocker 11928 can be rotated onto one or more microphones of an enclosed user device 10 by rotation of the gear assembly 11932 on the teeth 11934.

Figure 120:
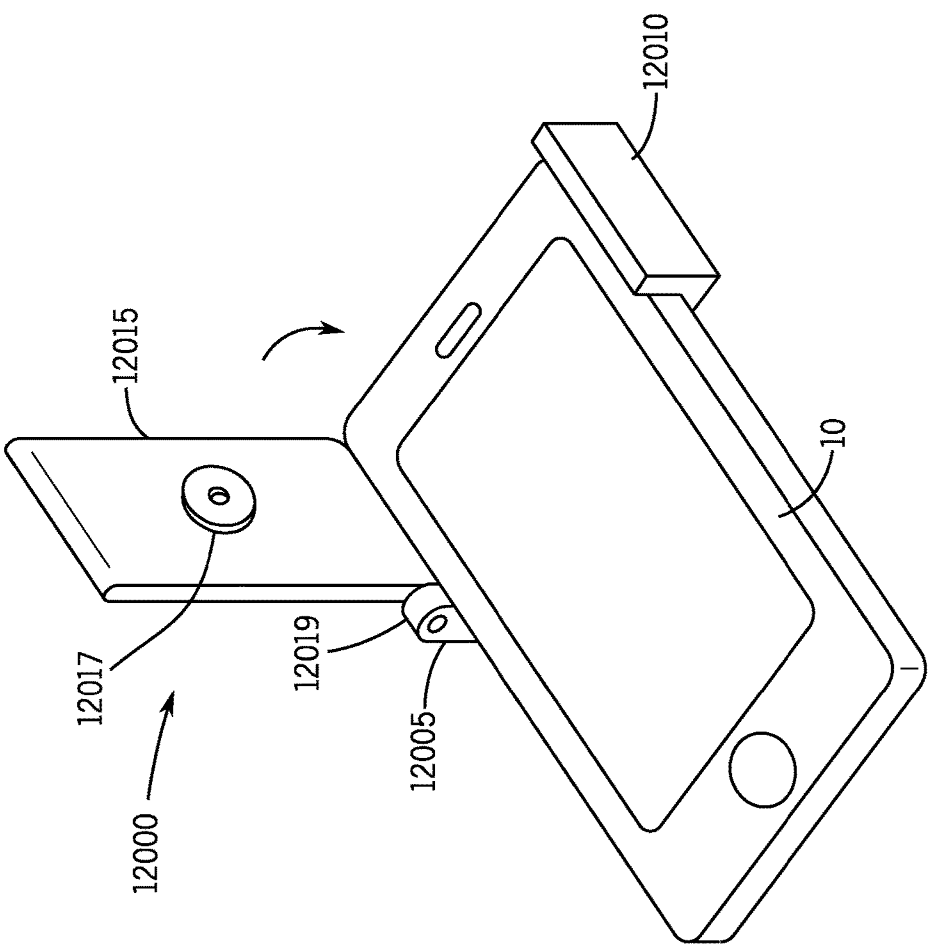
FIG. 120 depicts a microphone blocking assembly according to one embodiment of the invention.

FIG. 120 depicts a microphone blocking assembly 12000 according to one embodiment of the invention. In some embodiments, a main housing 12005 can comprise an enclosure 12010 with coupled door 12015 including a coupled microphone blocker 12017. In some embodiments, the door 12015 can be rotated on the pivot 12019 to couple the microphone blocker 12017 with one or more microphones of a user device.

Figure 121:
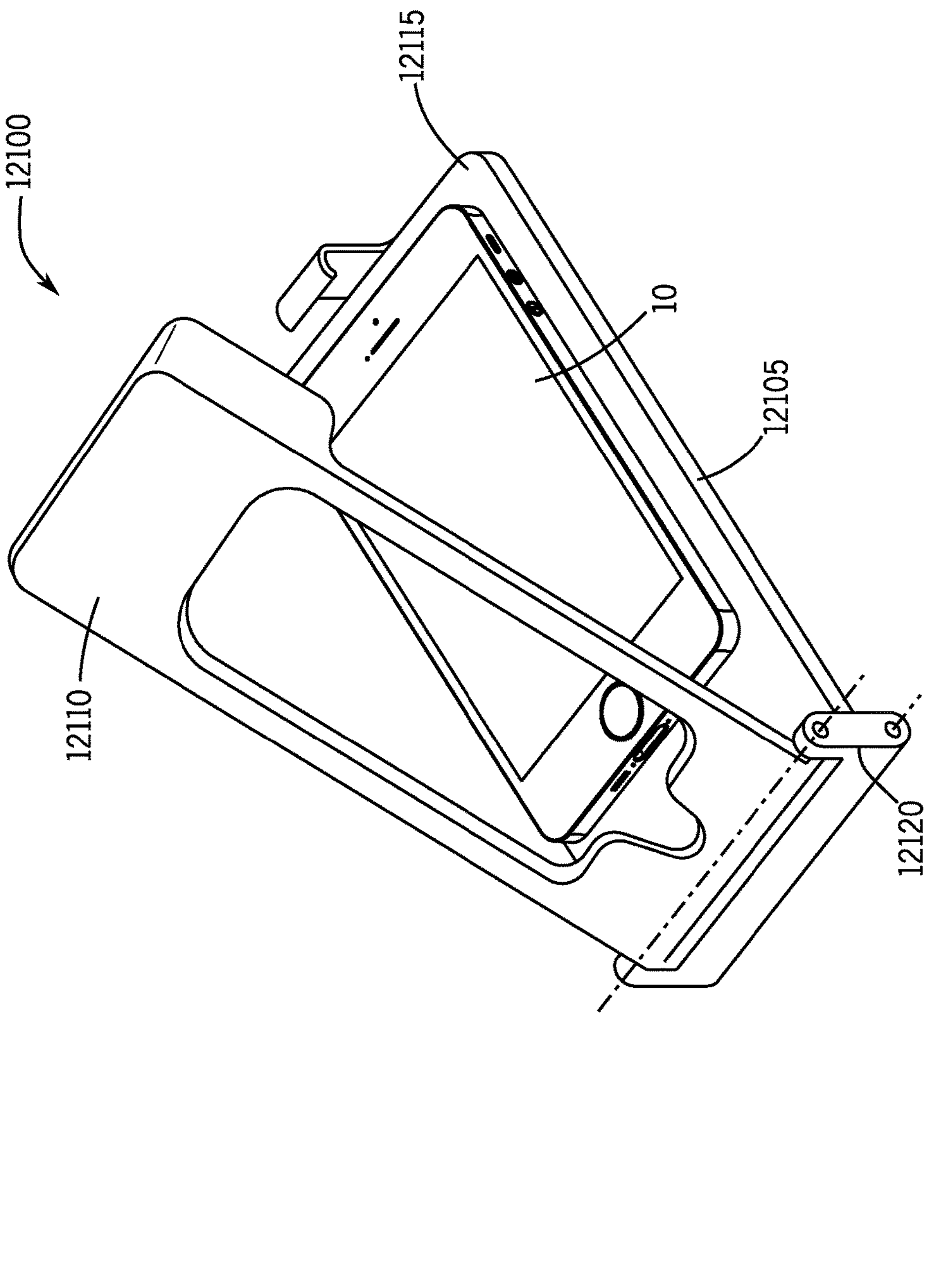

FIG. 121 depicts a microphone blocking assembly 12100 according to one embodiment of the invention. Some embodiments include a main housing 12105 comprising a rear entry frame 12110, enclosure 12115, and pivot 12120. In some embodiments, the rear entry frame 12110 can be pivoted about the pivot 12120 to couple with a user device 10 and to seal at least one microphone of the user device 10.

Figure 122:
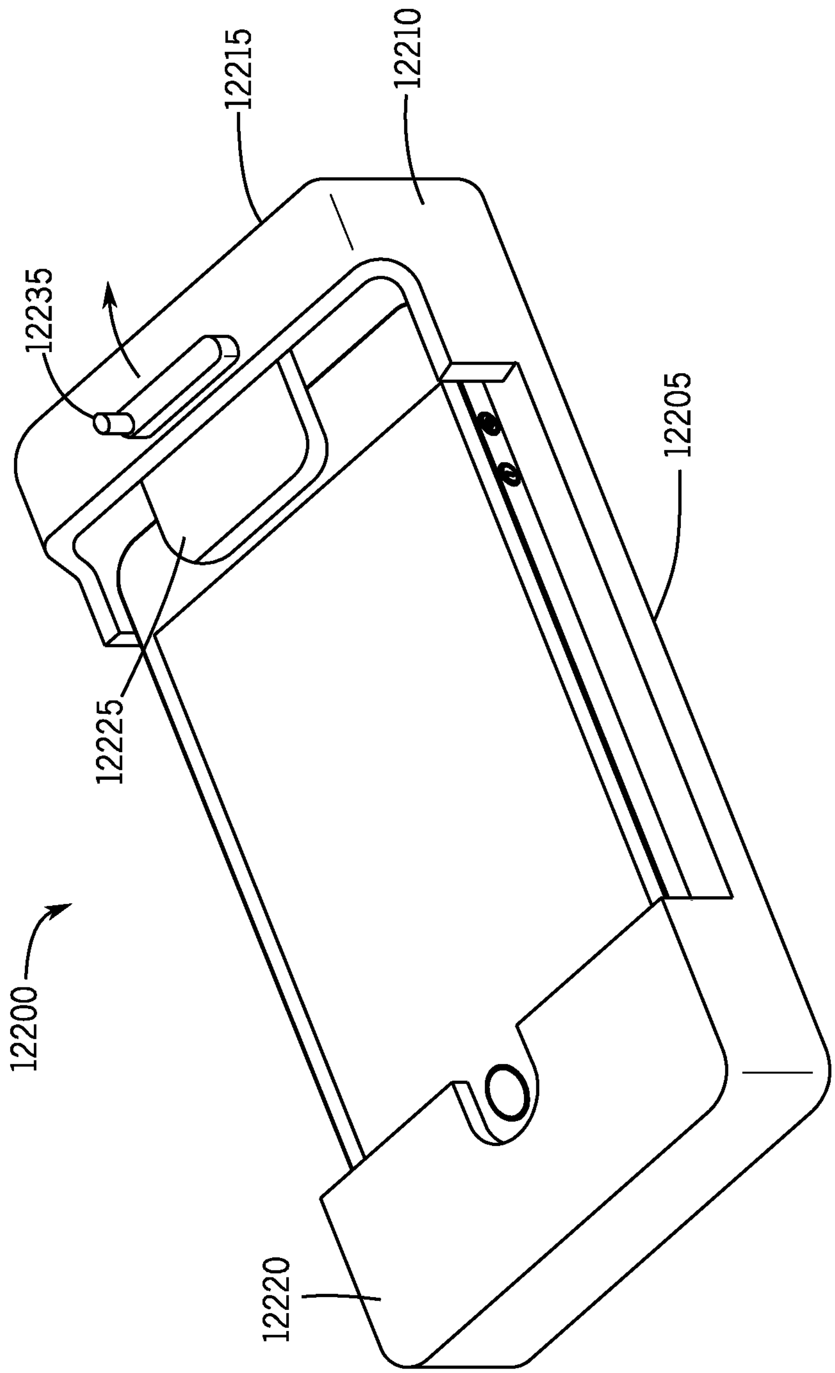

FIG. 122 depicts a microphone blocking assembly 12200 according to one embodiment of the invention. Some embodiments of the invention include a main housing 12205 comprising an enclosure 12210, hood 12215, base enclosure 12220, movable microphone blocker 12225, and control lever 12235. In some embodiments, the movable microphone blocker 12225 can be moved by a user using the control lever 12235.

Figures 123A, 123B, 123C:
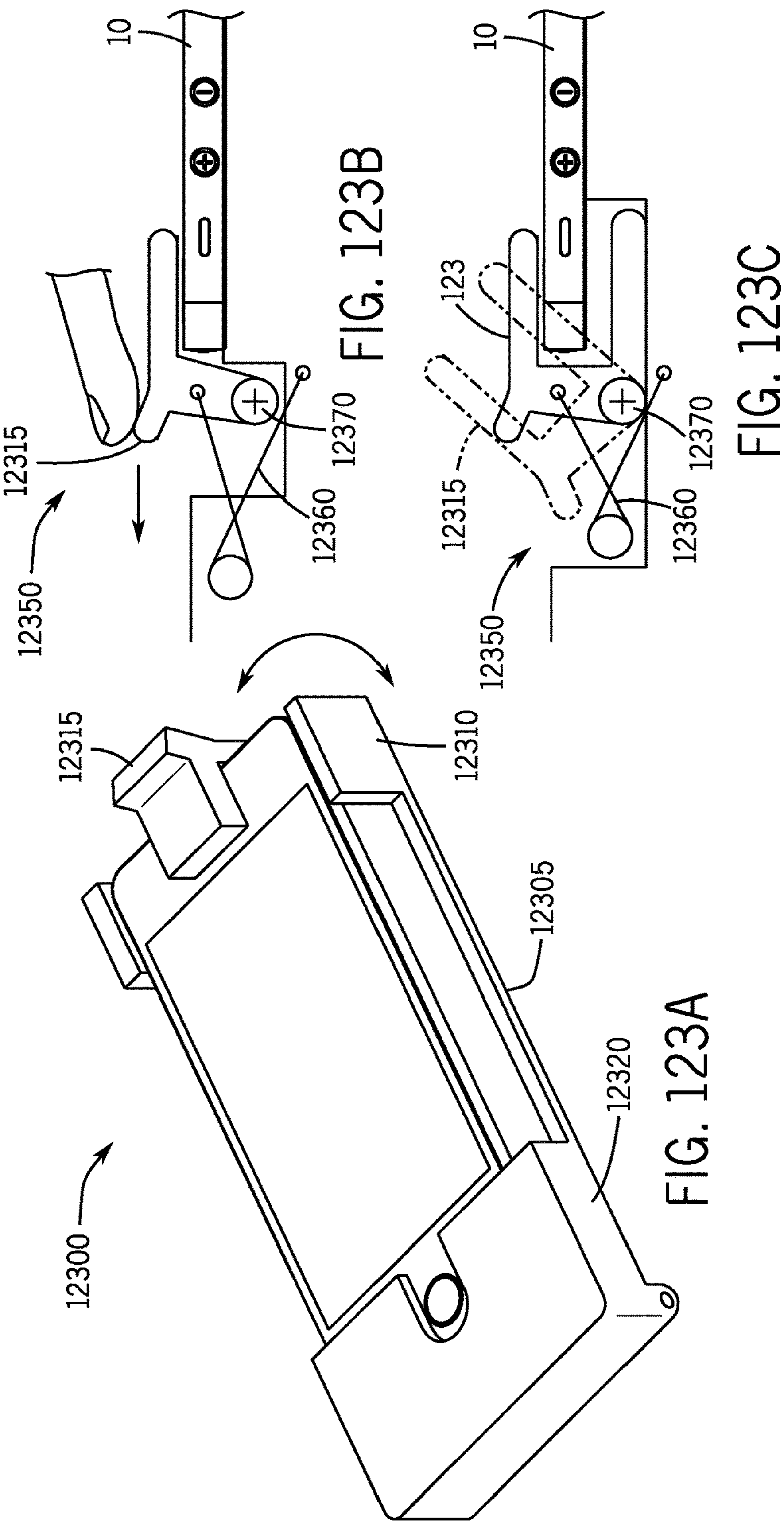

FIGS. 123A-123C depicts views of a microphone blocking assembly 12350 according to one embodiment of the invention. Some embodiments include a main housing 12305 comprising an enclosure 12310 base enclosure 12320 latch assembly 12350 including a microphone blocker latch 12315, tensioner assembly 12360, and pivot 12370. Referring to FIG. 123B, in some embodiments, a user can move the microphone blocker latch 12315 by rotating the pivot 12370 under tension by the tensioner assembly 12360. FIG. 123C shows the reverse action to cover a microphone of a user device 10.

Figure 124B:
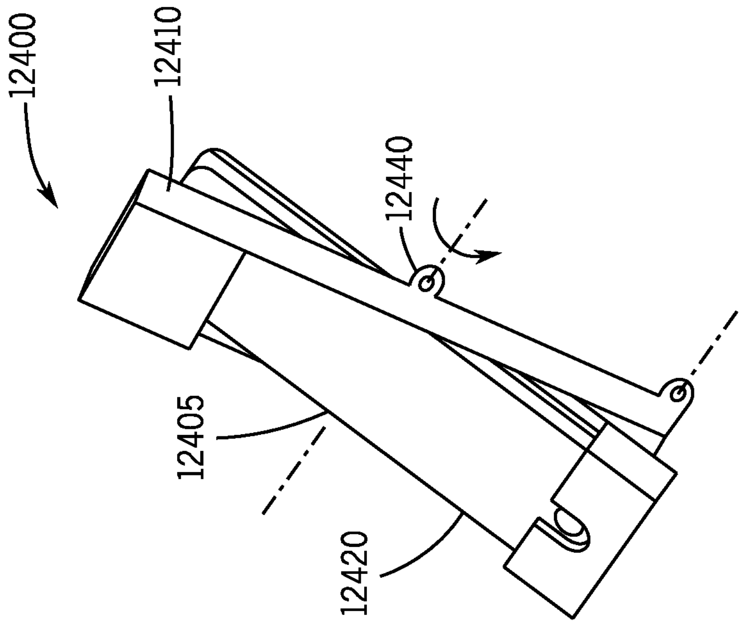
Figure 124A:
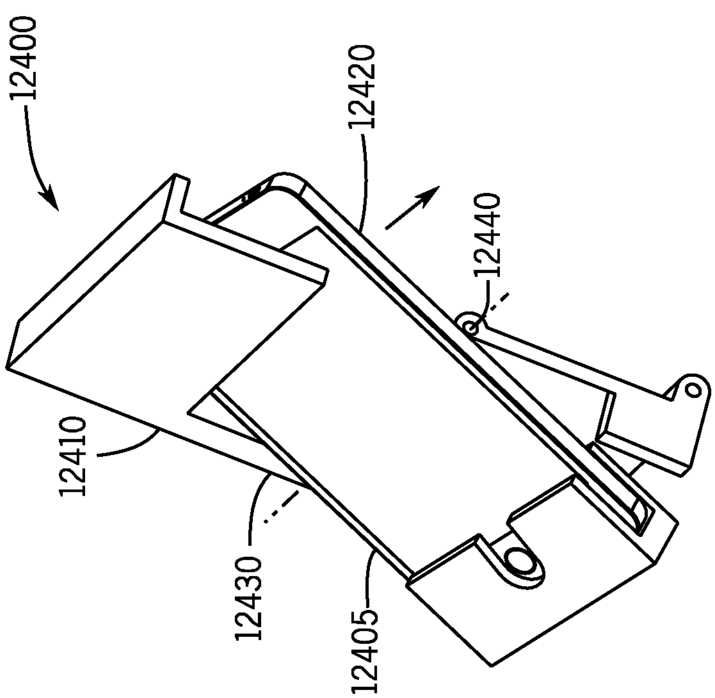

FIGS. 124A-124B depicts views of a microphone blocking assembly 12400 according to one embodiment of the invention. Some embodiments include a main housing 12405 including enclosure 12420, pivotably coupled to a base 12430 including a microphone blocker portion 12410. In some embodiments, the base 12430 including microphone blocker portion 12410 can be rotated with respect to the enclosure 12420 about the pivot 12440 to block or unblock a microphone of a user device 10.

Figure 125E:
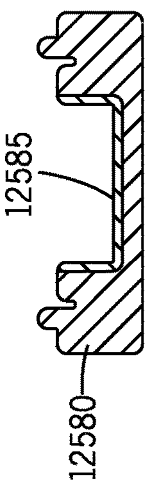
Figure 125F:
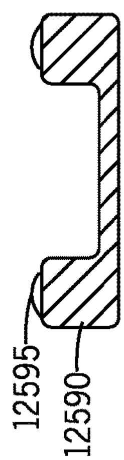
Figure 125G:
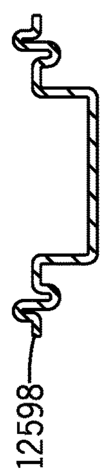
Figure 125A:
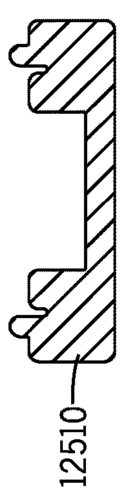
Figure 125B:
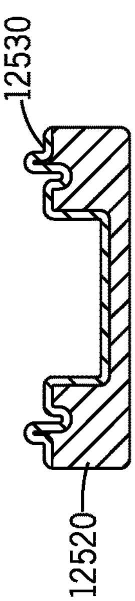
Figure 125C:
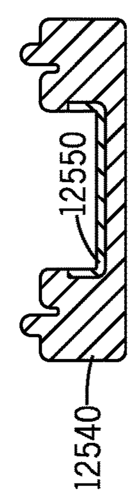
Figure 125D:
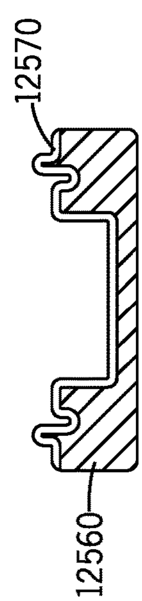

FIGS. 125A-125G show privacy/security enclosure housing cross-sections according to one embodiment of the invention. For example, FIG. 125A shows an example embodiments of a Faraday shell 12510. FIG. 125B depicts a Faraday shell 12520 layer 12530 comprising a full RF layer with non-RF shielding. FIG. 125C shows a Faraday shell 12540 including an inner layer 12550 comprising an RF layer with RF shield plastic insert. FIG. 125D depicts a Faraday shell 12560 with layer 12570 comprising a non-RF shielding plastic with a conductive spray/mesh/cloth layer. FIG. 125E shows a Faraday shell 12580 including a layer 12585 comprising an RF shielding plastic layer and conductive spray/mesh/cloth layer. FIG. 125F shows a Faraday shell 12590 layer including a fingerstock 12595. FIG. 125G depicts a Faraday layer 12598 comprising a metal injection molded RF layer (e.g., a magnesium thixo-molding).

Figure 126A:
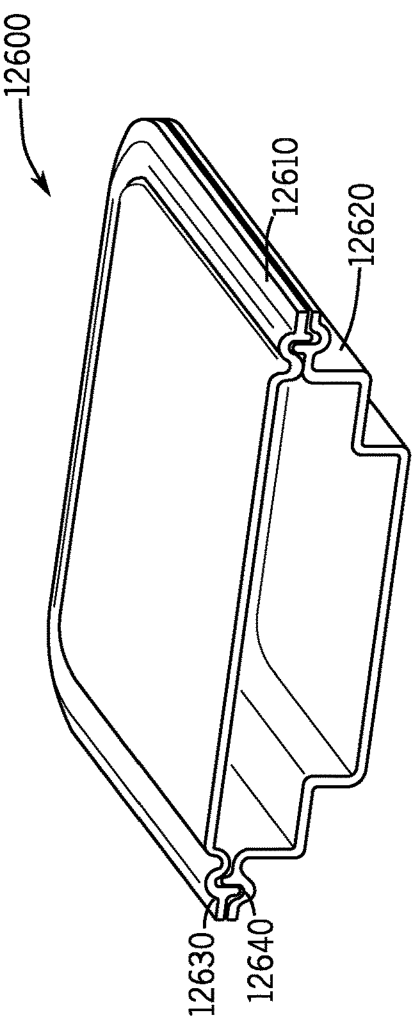
Figure 126C:
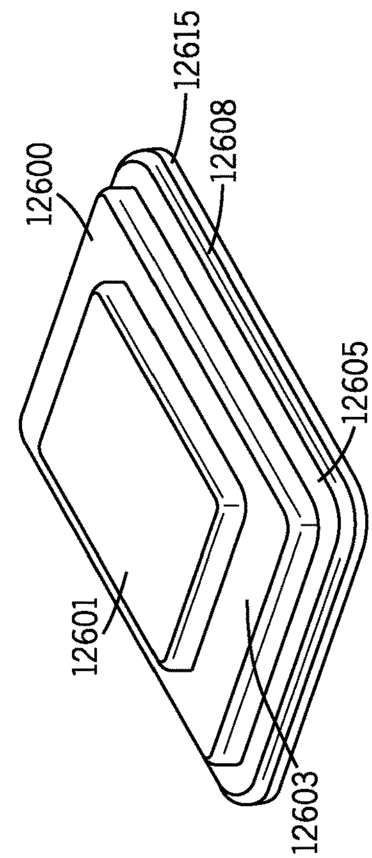
Figure 126B:
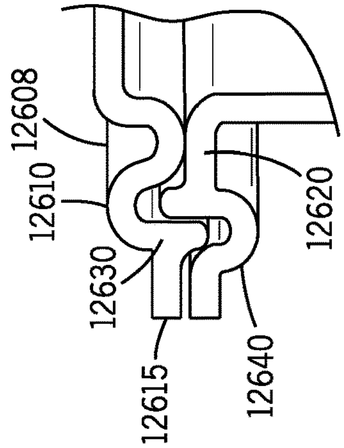

FIGS. 126A-126C illustrate various views of a privacy/security enclosure 12600 housing according to one embodiment of the invention. Some embodiments include base portion 12601, shelf portion 12603, rim 12605, and gasket seal 12608. Referring to FIG. 126B, in some embodiments, the gasket seal 12608 can comprise an upper layer 12610 with tongue and groove gasket 12615. A lower layer 12620 including groove 12640 can couple with tongue 12630 as shown to form the gasket seal 12608.

Figure 127B:
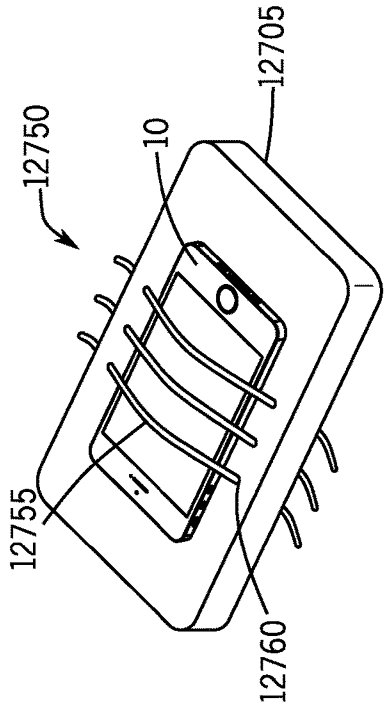
Figure 127D:
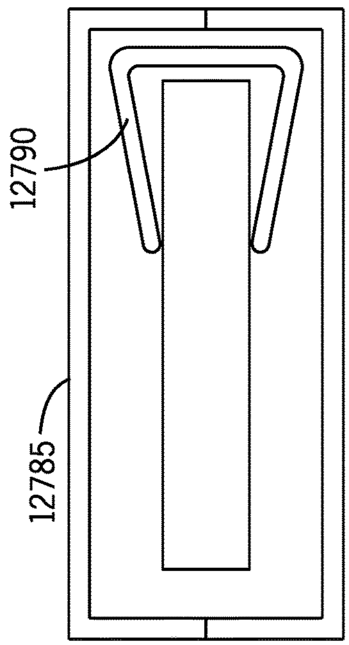
Figure 127A:
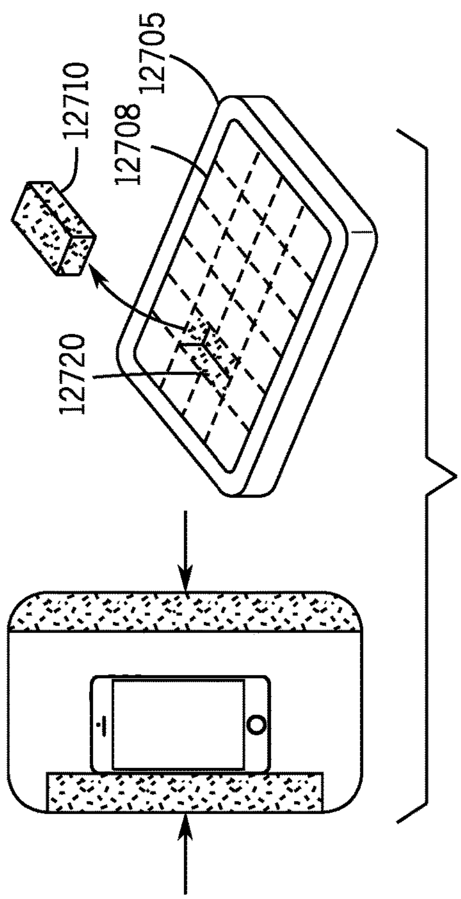
Figure 127C:
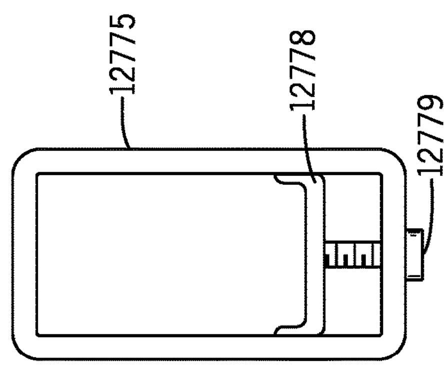

FIGS. 127A-127D illustrate user device insertion and positioning into a privacy/security enclosure according to one embodiment of the invention. Some embodiments include enclosure 12705 comprising removable foam blocks 12708 and at least one removable foam block 12710 forming a cavity 12720 for insertion of a user device 10. FIG. 127B shows a privacy/security enclosure 12750 comprising a housing 12705 including straps 12755 threaded though apertures 12760 enclosing a user device 10. FIG. 127C shows an enclosure frame 12775 including an adjustable clamp 12778 with adjuster 12779 for clamping a user device 10 in the frame 12775. Further. FIG. 127D shows a privacy/security enclosure 12785 comprising a clip 12790 for positioning a user device 10.

Figure 128D:
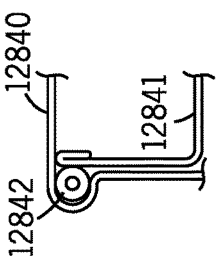
Figure 128E:
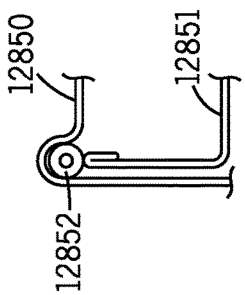
Figure 128F:
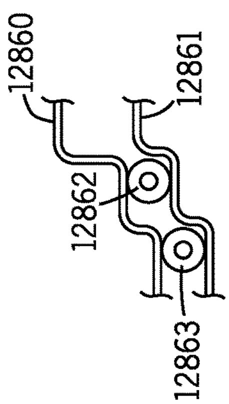
Figure 128A:
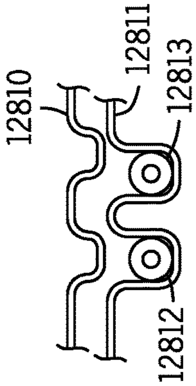
Figure 128B:
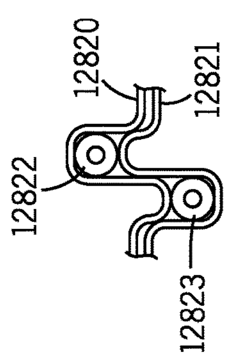
Figure 128C:
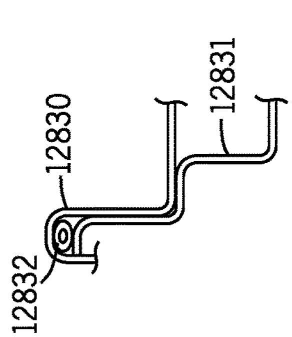

FIGS. 128A-128F illustrate cross-sectional detail views of privacy/security enclosure housing gasket seals according to one embodiment of the invention. For example, FIG. 128A shows upper layer 12810 and lower layer 12811 with first o-ring 12812 and second o-ring 12813. FIG. 128B shows upper layer 12820 with lower layer 12821 and upper o-ring seal 12822 and lower o-ring seal 12823. FIG. 128C shows upper layer 12830, lower layer 12831, and o-ring seal 12832. FIG. 128D shows upper layer 12840, lower layer 12841, and o-ring seal 12842. FIG. 128E shows upper layer 12850, lower layer 12851, and o-ring seal 12852. FIG. 128F shows upper layer 12860, lower layer 12861, first o-ring seal 12862, and second o-ring seal 12863. FIG. 128G shows upper layer 12871, lower layer 12872, first o-ring seal 12873, and second o-ring seal 12784. FIG. 128H shows upper layer 12880, lower layer 12881, first tongue 12882, second tongue 12883, and second groove 12884, and first groove 12885. Any of the gasket seals shown in FIGS. 128A-128H can be used in any of the privacy/security enclosures disclosed herein.

Some embodiments of the invention include a charging interface comprising at least one microcontroller that can determine the power that can be drawn by a power source into which the interface is plugged. Some embodiments of the charging interface include logic regarding the sequence and priority of charging masking technology as well as an enclosed device and any other desired accessories.

In some embodiments, the privacy/security enclosure can comprise a rigid, structurally self-supporting chamber that can be opened and closed by a user. Further, the chamber can be formed of a material which attenuates RF radiation emitted to or from any RF antennas or transceivers positioned inside the privacy/security enclosure.

In some embodiments, the privacy/security enclosure can comprise one or more separable and/or moveable portions. For example, some embodiments include a privacy/security enclosure comprising a lower portion (i.e. a base portion) and an upper portion (i.e., a lid portion). In some embodiments, the privacy/security enclosure can comprise a Faraday cage configured to attenuate, or at least partially block, reception or transmission of RF radiation. In some embodiments, the Faraday cage includes and/or is formed by the one or more RF gaskets. In some embodiments of the invention, the RF gasket can attenuate (i.e. reduce in signal strength) an RF signal. In some embodiments, the RF gasket can attenuate a portion of an RF signal while still disrupting effective communication. In some embodiments, the RF gasket can attenuate or at least partially block RF radiation from entering or exiting a privacy/security enclosure to which it is coupled. In some embodiments, this can provide bandwidth selectable pass-through capabilities.

In some embodiments, at least a portion of the RF gasket can be formed of a material which at least partially attenuates RF radiation emitted from one or more mobile or stationary communication devices. In some embodiments, the RF gasket can be formed of a material including at least a portion that substantially attenuates RF. In some embodiments, at least a portion of the RF gasket can at least partially attenuate RF radiation emitted from outside of the privacy/security enclosure. In some embodiments, at least a portion of the RF gasket can at least partially attenuate RF radiation emitted from within the privacy/security enclosure.

Figure 130:
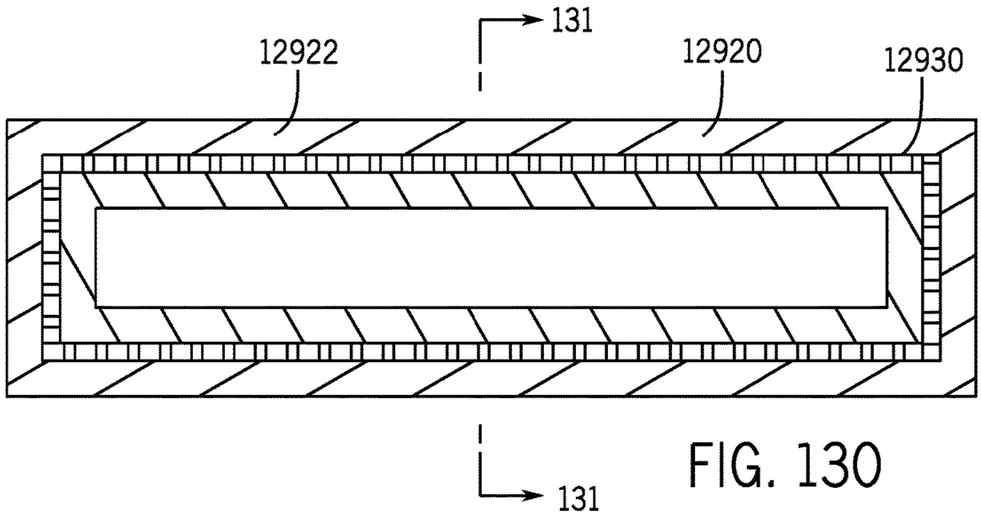

Referring to FIG. 129, illustrating a perspective view of a privacy/security enclosure 12900 including a partial cutaway interior view, of some embodiments of the invention. In some embodiments of the invention, the privacy/security enclosure 12900 can comprise an upper portion 12910 that can be coupled to the base portion 12920 to at least partially enclose a user device. Further, the upper portion 12910 and base portion 12920 can be at least partially uncoupled and/or separated to enable a user to access the privacy/security enclosure 12900 (e.g., to insert or remove one or more user devices). Further, FIG. 130 illustrates an interior view from line 2 of the privacy/security enclosure of FIG. 129 according to some embodiments of the invention, and FIG. 131 illustrates a cross-sectional view of the privacy/security enclosure of FIG. 129 through cut line 3 of FIG. 130 according to at least some embodiments of the invention. As shown in FIG. 130, the RF gaskets 12930 can extend completely and/or continuously around the interface 12922. In some other embodiments of the invention, the RF gaskets 12930 can partially extend around the interface 12922.

In some embodiments, the privacy/security enclosure can include one or more RF gaskets extending around at least a portion of an interface 12922 between the upper portion 12910 and base portion 12920 of the privacy/security enclosure (e.g., such as the privacy/security enclosure 12900 or any other privacy/security enclosure disclosed herein). In some embodiments, the privacy/security enclosure can include one or more RF gaskets that can extend completely around a region of the upper and/or lower portion of the privacy/security enclosure (e.g., such as the interface 12922 between the upper portion 12910 and base portion 12920).

In some embodiments of the invention, the privacy/security enclosure 12900 can include a conventional or custom fingerstock assembly. Referring to FIG. 131 and FIG. 133 illustrating a close up cross-sectional view of the privacy/security enclosure of FIG. 129 through cut line 5 of FIG. 131, as well as FIG. 132 illustrating a fingerstock assembly in accordance with some embodiments of the invention, the privacy/security enclosure can include at least one fingerstock 13200. In some embodiments, the fingerstock assembly 13200 can comprise a plurality of fingers 13225 comprising generally C-shaped, angular and/or curved extensions or tabs extending from a base or mounting surface 13210. The fingers 13225 can comprise contact areas 13325*a* that can be used to couple with one or more portions of the upper and/or lower portions for the privacy/security enclosure 12900 such as the upper portion 12910 and base portion 12920. For example, in some embodiments, the plurality of fingers 13225 can comprise contact areas 13225*a* that can be used to couple with one or more inner walls of the upper portion 12910 to provide an electromagnetic seal. The base or mounting surface 13210 and the individual fingers themselves can be flexible enough to enable the fingers 13225 to bend or pivot with respect to the base or mounting surface 13210 using force applied by a user (e.g., to enable two surfaces such as surfaces of the portions 12910, 12920 to be coupled to at least partially prevent passage of electromagnetic radiation).

In some embodiments, the fingers 13225 can be integrally formed with the base portion 12920 as shown. As discussed further below, in some other embodiments, the C-shaped curved fingers 13225 can comprise separate C-shaped curved extensions or tabs. In some embodiments, these can be coupled or mounted directly to a portion of the privacy/security enclosure 12900. In other embodiments, the fingers 13225 can be coupled or mounted to a support and coupled to at least one portion of the privacy/security enclosure 12900. For example, in some embodiments, the fingers 13225 can be coupled or mounted to an inner gasket. Further, in some embodiments, the shape of the extensions or tabs can be varied to accommodate different portions of the privacy/security enclosure 12900, and/or to provide different levels of RF attenuation and/or different levels of seal between portions of the privacy/security enclosure.

In some embodiments, more than one RF gasket can be used within a privacy/security enclosure. For example, in some embodiments, the privacy/security enclosure can include two RF gaskets positioned at an interface between an upper and lower portion of the privacy/security enclosure. In some embodiments, the RF gaskets can be positioned adjacent each other within an inner wall of a lid receiving end of the privacy/security enclosure. In some embodiments, one RF gasket can be positioned coupled to the inner wall of the lid receiving end of the privacy/security enclosure adjacent the top surface of the base, and a second RF gasket can be positioned coupled to the inner wall of the lid receiving end of the privacy/security enclosure proximate the first RF gasket and adjacent the lid receiving wall of the base gasket.

In other embodiments of the invention, the privacy/security enclosure can include three or more fingerstocks and/or a plurality of base gaskets. For example, FIG. 133 illustrates a close up cross-sectional view of the privacy/security enclosure 12900 of FIG. 129 through cut line 5 of FIG. 131 showing a dual fingerstock (comprising fingerstock 13100 and fingerstock 13150), and an RF gaskets 12930 comprising a gasket 13175 according to some embodiments of the invention. The close-up cross-sectional view shows section 12925 of the base portion 12920 and section 12915 of the upper portion 12910, with the dual fingerstocks 13100, 13150 forming a seal between the sections 12915, 12915.

In some embodiments, any of the previously mentioned RF gaskets can be capable of forming a compliant privacy seal between portions of the privacy/security enclosure (e.g., between an upper and a lower portion and/or between two halves of any of the privacy/security enclosures described herein). Further, in some embodiments, the formed seal can be capable of functioning as an environmental barrier in addition to functioning as an RF shield. In some embodiments of the invention, RF gasketing can provide the secondary benefit of minimizing the transmission of air, water, dust and other such substances from passing into the interior of the privacy/security enclosure when the enclosure is closed.

In some embodiments, other or additional environmental or sealing gaskets can be included that are more specifically designed for this purpose. The environmental or sealing gaskets can be used with one or more RF gaskets as required. For example, as shown in at least FIGS. 131 and 133, in some embodiments, at least one base or sealing gasket 13175 can be positioned at or adjacent the interface 12922 between the sections 12915, 12925. In some embodiments, the gasket 13175 can be used with or without one or more fingerstocks (i.e., with one or both or more fingerstocks 13100, 13150).

In some embodiments, the gasket 13175 can be positioned to accommodate and couple with at least a portion of a base end of an upper portion such as a lid. For example, in some embodiments, as the upper portion 12910 is coupled with the base portion 12920, the base end of the upper portion 12910 (show as section 12915) can slide onto or over a portion of the base portion 12920 (shown as 12950*a* in FIG. 133) to couple with the gasket 13175. Further, as shown, the gasket 13175 can couple with the inner surface 12910*a* of the upper portion 12910 as the upper portion 12910 is coupled with the base portion 12920. In some further embodiments, one or more gasket 13175 can be positioned coupled to the inner wall 12920*a* of the base portion 12920 adjacent or proximate to one or more gaskets 13175.

Other combinations of RF gaskets comprising single and/or multiple fingerstock 13400 and gaskets 13175 can be used. For example, FIG. 134 illustrates an example of the view of FIG. 133 including a single fingerstock 13400 and gasket 13175 according to some embodiments of the invention. As shown, some embodiments include a single gasket 13175 positioned as previously described. For example, in some embodiments, the fingerstock 13400 can be positioned generally equally spaced between the top surface 12925*b* of the base portion 12920 and the interface 12922. In some other embodiments, the fingerstock 13400 can be positioned proximate the top surface 12925*b* of the base portion 12920. In some further embodiments, the fingerstock 13400 can be positioned proximate the interface 12922.

In some embodiments of the invention, a combination of one or more grooves formed within one or more surfaces of one or more portions of the privacy/security enclosure (such as privacy/security enclosure 12900) can be used with one or more RF gaskets (e.g., such as fingerstock 13400 and gasket 13175) to provide various levels of coupling, seating, and/or sealing of the privacy/security enclosure. For example, in some embodiments, at least some portion of an upper and/or base portion of a privacy/security enclosure can comprise at least one form, cavity, or depression (i.e. forming a groove) for coupling to at least one or more RF gaskets. In some embodiments, at least one form, cavity, or depression can be formed during any of the aforementioned manufacturing processes. For example, FIG. 135 illustrates an assembly view of FIG. 133 depicting insertion of an upper portion 12918 onto the base portion 12920 (shown as section 12925) of a privacy/security enclosure. This example embodiment includes fingerstock grooves 12918*a*, 12918*b* formed within the upper portion 12918. FIG. 136 illustrates the assembled view of FIG. 135 according to some embodiments of the invention. As shown, in some embodiments, as the upper portion 12918 is coupled with the base portion 12920, the base end 12919 of the upper portion 12918 can slide onto or over an edge wall 12925*a* of the base portion 12920 to couple with the gasket 13620. Further, as shown, the gaskets 13610, 13615 can each couple with the fingerstock grooves 12918*a*, 12918*b* formed within the upper portion 12918.

In some embodiments, one or more fingerstocks can be used together within one or more inner gaskets to form an RF gasket or seal. Some embodiments of the invention can comprise an RF gasket assembly comprising at least two components. For example, some embodiments include an assembly of components comprising at least one fingerstock coupled to at least one gasket. For example, FIG. 137 illustrates a compound gasket assembly 13700 according to some embodiments of the invention, FIG. 138 illustrates a cross sectional view of a compound gasket assembly 13700. Further, FIG. 139 illustrates a rear view of a gasket assembly 13700 according to one embodiment of the invention, and FIG. 140 illustrates a front view of a gasket assembly 13700 according to one embodiment of the invention. As illustrated, in some embodiments, the compound gasket assembly 13700 can comprise a fingerstock 13701 coupled to one or more inner gaskets 13720.

In some embodiments, the compound gasket assembly 13700 can comprise a fingerstock 13701 comprising a series of generally C-shaped curved fingers 13710 extending from a base or mounting surface 13705. In some embodiments, the fingers 13710 can be integrally formed with the mounting surface 13705. In some other embodiments, the C-shaped curved extensions or tabs can comprise separate fingers 13710 that can be coupled to or mounted onto or over an inner gasket 13720. Further, in some embodiments, the shape and/or the spacing of each of the fingers 13710 can be varied to accommodate different portions of a privacy/security enclosure, and/or to provide different levels of RF attenuation and/or different levels of sealing between portions of the privacy/security enclosure. In some embodiments, the fingerstock 13701 can provide mechanical or physical support to the inner gasket 13720. In some further embodiments, the fingerstock 13701 can provide degradation or wear protection to the inner gasket 13720. For example, in some embodiments, when used to provide one or more RF and/or environmental seals between surfaces and/or portions of a privacy/security enclosure, the use of a fingerstock 13701 at least partially enveloping the inner gasket 13720 can prevent wear and extend the life of the inner gasket 13720.

FIG. 141 illustrates an example of the view of FIG. 133 including dual fingerstocks of FIG. 138 (shown as gasket assembly 14150, 14160) and base gasket 14170 according to some embodiments of the invention. As shown, in some embodiments, the privacy/security enclosure portion 14100 can include two RF gaskets (formed by gasket assembly 14150, 14160 positioned at an interface 14105 formed between an upper and lower portions 14110, 14120 of the privacy/security enclosure). In this example embodiment, the mounting surfaces 14150*a*, 14160*a* of the fingerstocks of gasket assemblies 14150, 14160 can be coupled to the inner surface 14115 of the upper portion 14110, and the fingers 14155, 14165 of the gasket assemblies 14150, 14160 can extend away from portion 14110, coupling with the surface 14120*a* of the base portion 14120. In some other embodiments of the invention, the gasket assemblies 14150, 14160 can be rotated by 180°. For example, FIG. 142 illustrates an example of the view of FIG. 133 including gasket assemblies 14150, 14160. As shown, the mounting surfaces 14150*a*, 14160*a* of the fingerstocks of gasket assemblies 14150, 14160 can be coupled to the surface 14120*a* of the base portion 14120, and the fingers 14155, 14165 can extend towards the inner surface 14115 of the upper portion 14110.

In some embodiments, a privacy/security enclosure can be sealed without a base gasket. For example, FIG. 143 illustrates an example of a view 14300 of FIG. 133 including dual fingerstocks of FIG. 138 (shown as gasket assemblies 14150, 14160) according to some embodiments of the invention, and FIG. 145 illustrates an example of a view 14500 of FIG. 133 including a single gasket assemblies 14150 of FIG. 138 according to some embodiments of the invention. In this example embodiment, the mounting surfaces 14150*a*, 14160*a* can be positioned and coupled as described for FIG. 141. Further, FIG. 144 illustrates an example of the view 14400 of FIG. 133 including gasket assemblies 14150, 14160 of FIG. 138 according to some embodiments of the invention, and FIG. 146 illustrates an example of view 14600 of FIG. 133 including a single gasket assembly 14150 of FIG. 138 according to some embodiments of the invention. As shown, in this example embodiment, the mounting surfaces 14150*a*, can be positioned and coupled as described for FIG. 142.

In some embodiments, one or more fingerstocks can be used together within one or more inner gaskets to form an RF gasket or seal. For example, FIG. 147 illustrates a compound gasket assembly 14700 according to some embodiments of the invention, FIG. 148 illustrates a cross sectional view of a compound gasket assembly 14700. Further, FIG. 149 illustrates a rear view of a gasket assembly 14700 according to one embodiment of the invention, and FIG. 150 illustrates a front view of a gasket assembly 14700 according to one embodiment of the invention. As illustrated, in some embodiments, the compound gasket assembly 14700 can comprise a fingerstock 14701 coupled to one or more inner gaskets 14720. In some embodiments, the compound gasket assembly 14700 can comprise a fingerstock 14701 comprising a series of generally C-shaped curved fingers 14710 extending from a base or mounting surface 14705. In some embodiments, the fingers 14710 can be integrally formed with the mounting surface 14705. In some other embodiments, the C-shaped curved extensions or tabs can comprise separate fingers 14710 that can be coupled to or mounted onto or over an inner gasket 14720. Further, in some embodiments, the shape and/or the spacing of each of the fingers 14710 can be varied to accommodate different portions of a privacy/security enclosure, and/or to provide different levels of RF attenuation and/or different levels of sealing between portions of the privacy/security enclosure. In some embodiments, the fingerstock 14701 can provide mechanical or physical support to the inner gasket 14720. In some further embodiments, the fingerstock 14701 can provide degradation or wear protection to the inner gasket 14720. For example, in some embodiments, when used to provide one or more RF and/or environmental seals between surfaces and/or portions of a privacy/security enclosure, the use of a fingerstock 14701 at least partially enveloping the inner gasket 14720 can prevent wear and extend the life of the inner gasket 14720.

FIG. 151 illustrates an example of the view of FIG. 133 including a gasket assemblies 14700 of FIG. 148 (shown as gasket assemblies 15150, 15160) and base gasket 15170 according to some embodiments of the invention. As shown, in some embodiments, the privacy/security enclosure portion 15100 can include two RF gaskets (formed by gasket assemblies 15150, 15160 positioned at an interface 15105 formed between an upper and lower portions 15110, 15120 of the privacy/security enclosure). In this example embodiment, the mounting surfaces 15150*a*, 15160*a* of the fingerstocks of gasket assemblies 15150, 15160 can be coupled to the inner surface 15115 of the upper portion 15110, and the fingers 15155, 15165 of the gasket assemblies 15150, 15160 can extend away from portion 15110, coupling with the surface 15120*a* of the base portion 15120. px4 the gasket assemblies 15150, 15160 can be rotated by 180°. For example, FIG. 152 illustrates an example of the view of FIG. 133 including gasket assemblies 15150, 15160. As shown, the mounting surfaces 15150*a*, 15160*a* of the fingerstocks of gasket assemblies 15150, 15160 can be coupled to the surface 15120*a* of the base portion 15120, and the fingers 15155, 15165 can extend towards the inner surface 15115 of the upper portion 15110.

As described earlier with respect to the example embodiments of FIGS. 143-144 and 145-146, in some embodiments, the privacy/security enclosure can be sealed without a base gasket. In some embodiments, a privacy/security enclosure can be sealed without a base gasket. For example, FIG. 153 illustrates an example of a view 15300 of FIG. 133 including a dual fingerstocks of FIG. 148 (shown as gasket assemblies 15150, 15160) according to some embodiments of the invention, and FIG. 155 illustrates an example of a view 15500 of FIG. 133 including a single gasket assemblies 15150 of FIG. 148 according to some embodiments of the invention. In this example embodiment, the mounting surfaces 15150*a*, 15160*a* can be positioned and coupled as described for FIG. 151. Further, FIG. 154 illustrates an example of the view 15400 of FIG. 133 including gasket assemblies 15150, 15160 of FIG. 148 according to some embodiments of the invention, and FIG. 156 illustrates an example of view 15600 of FIG. 133 including a single gasket assembly 15150 of FIG. 148 according to some embodiments of the invention. As shown, in this example embodiment, the mounting surfaces 15150*a*, can be positioned and coupled as described for FIG. 152.

In some embodiments, at least a portion of any of the RF gaskets described herein can comprise a metal or a metal alloy. In some embodiments, at least a portion of any of the RF gaskets described herein can comprise copper or a copper alloy. In some other embodiments, at least a portion of any of the RF gaskets described herein can comprise iron or steel. In some embodiments, at least a portion of any of the RF gaskets described herein can comprise nickel or a nickel alloy (e.g., a nickel-copper alloy), or an alloy of copper and tin. In some embodiments, at least a portion of any of the RF gaskets described herein can comprise aluminum, magnesium, or mixtures or alloys thereof.

In some embodiments, at least a portion of any of the RF gaskets described herein can comprise a polymer. For example, in some embodiments, at least a portion of any of the RF gaskets described herein can comprise one or more homopolymers, one or more copolymers, or mixtures thereof. In some embodiments, the polymer matrix can comprise an elastomeric polymer such as rubber or silicone. In some embodiments, the polymer can comprise a solid rubber or silicone. Other embodiments can include a polymer comprising a sponge rubber or silicone. In some embodiments, the polymer can comprise a butyl rubber, silicone rubber, a fluorosilicone, chloroprene rubber, nitrile rubber, or combinations thereof.

In some embodiments, at least a portion of any of the RF gaskets described herein can comprise an elastomer that is cut or machined to size. In some other embodiments, at least a portion of the RF gasket can comprise an elastomer that is molded (injection molding or thermoforming, transfer molding, insert molding) and/or cured to a specified shape. In some other embodiments, the RF gasket can be formed by other conventional manufacturing processes such as extrusion, die-cutting, laser cutting, or printed using a three dimensional printer, etc.

In some embodiments, at least a portion of any of the RF gaskets described herein can comprise a polymer-based matrix material including a dispersed secondary material. For example, some embodiments include an RF gasket comprising one or more polymers infused with conductive elements, conductive compounds, and/or conductive mixtures. Further, in some embodiments, at least a portion of any of the RF gaskets described herein can comprise a polymer-based matrix material including metal filaments dispersed in a matrix to form a polymer composite material. In some other embodiments, at least a portion of any of the RF gaskets described herein can comprise a carbon fiber-filled matrix material including metal filaments dispersed in a matrix to form a carbon fiber composite material. In some embodiments, the polymer can include one or more homopolymers, one or more copolymers, or mixtures thereof. In some embodiments, the polymer matrix can comprise a butyl rubber, silicone rubber, a fluorosilicone, chloroprene rubber, nitrile rubber, or combinations thereof, and the secondary phase can include at least one dispersed conductor. In some embodiments, the conductor can comprise a metal or a carbon-based conductor. In some embodiments, the metal can comprise copper, iron, aluminum, silver, nickel, copper-silver alloy, or combinations thereof.

In some other embodiments, materials useful in one or more embodiments of the invention include a layer of material comprising a carbon fiber-based matrix material including metal filaments dispersed in a matrix to form a carbon fiber composite material. In some embodiments, the carbon fiber matrix can comprise at least one homopolymer and/or copolymer, and can include at least one ceramic, and/or at least one polymer-ceramic mixture. In some embodiments, the metal filaments can comprise nickel filaments. In some further embodiments, the metal filaments can include copper filaments, brass filaments, stainless steel filaments or combinations thereof.

In some embodiments, when used in combination with one or more RF shield layers (coated, embedded, or attached to any portion of the privacy/security enclosure) the combination of the privacy seal formed by the one or more RF gaskets described here and/or one or more additional RF shield layers can form a Faraday cage. In some embodiments, the Faraday cage can substantially attenuate or at least partially block RF transmission into and/or out of the privacy/security enclosure. In some embodiments, the Faraday cage attenuates RF transmission to a level of at least 120 dB.

In some embodiments, more than one type of RF gasket can be used. In some embodiments, any of the RF gaskets described herein can be optimized for a specific function (either to at least partially block or attenuate RF, and/or at least partially block or attenuate sound, and/or at least partially block or attenuate light, and/or at least partially block or attenuate moisture, etc.) However, any one RF gasket can function to attenuate or at least partially block a combination of RF, sound, light, etc. For example, in some embodiments, one or more RF gaskets can function to attenuate RF, and one or more additional RF gaskets can function to attenuate sound, and one or more further RF gaskets can function as an environmental barrier. Moreover, in some embodiments, one or more of the RF gaskets are larger or smaller than one or more other RF gaskets.

In some embodiments, any of the fingerstock described herein (including any fingerstocks forming any of the compound gasket assemblies described herein) can comprise a pitch of about 0.06 inches and a slot diameter of about 0.02 inches. Further, the base height ("B") can be about 0.09 inches. The number of fingers can be 200, although this number can be increased or decreased based on the architecture of the privacy/security enclosure. In some further embodiments, any of the gaskets described herein can include an outer diameter ("A") of about 0.06 inches or 0.062 inches, and an inner diameter ("B") of about 0.02 to about 0.035 inches. Further, in some other embodiments, the outer diameter ("A") of the gasket can be about 0.09 inches, with an inner diameter ("B") of about 0.06 inches. In some embodiments, the inner and outer diameters can be greater or less than as described above.

In some embodiments, any of the fingerstocks described herein can comprise fingerstocks supplied by Parker Chometrics, Woburn, Mass. (http://www.chomerics.com/contact/index.html). Some embodiments include fingerstocks with part numbers 81-C14-XXX-YDZZZZ and/or 81-C15-XXXX-YDZZZZ. In some further embodiments, any of the fingerstocks described herein can comprise one or more stacked or coupled fingerstocks. In some embodiments, the fingerstock can be represented as two stacked fingerstocks comprising fingerstocks with part numbers 81-C07-XXXX-YDZZZZ available from Parker Chometrics mentioned above. In some embodiments, the contact areas of any of the fingers of the fingerstocks described herein can be used to couple with one or more portions of the upper and/or base portions of any of the privacy/security enclosures described herein.

In some embodiments, the fingers of any of the fingerstocks described herein can be integrally formed with the base or mounting surface, and the fingers and mounting surfaces can be coupled or mounted directly to any portion of any interface or sealing surfaces within any of the privacy/security enclosures described herein.

In some embodiments, the fingerstock can be formed by etching a metal substrate and forming the extensions or tabs, and/or any portion of the mounting base of the fingerstock. For example, FIGS. 157A-C and FIGS. 158A-158C illustrate custom fingerstocks according to some embodiments of the invention, any one of which can be formed by conventional etching and/or forming methods.

FIG. 157A illustrates a custom etched fingerstock plate 15700 with a clip 15713 including a bend line 15702, and a tab form 15704 that can form a clip 15713 when formed (shown in FIG. 157B). The etched plate 15701 can include an upper etched finger 15705 and a lower etched finger 15707. FIG. 157B illustrates a formed fingerstock array 15710 comprising an end surface 15712, upper finger 15714, and lower finger 15716. In some embodiments, the custom fingerstock can include a clip (shown in FIG. 157C). In some embodiments, the clip can extend from the base or mounting surface in a generally opposite direction from the extensions or tabs. The form clip 15713 is shown in FIG. 157C, including tab 15720 extending from the end surface 15712.

FIG. 158A-C illustrate custom fingerstocks according to some embodiments of the invention. FIG. 158A illustrates a custom etched fingerstock plate 15800. This example embodiments does not include the clip 15713. As shown, the etched plate 15802 can include upper etched finger 15805 and lower etched finger 15807. FIG. 158B illustrates a formed fingerstock array 15810. The array 15810 can comprise a formed array plate 15812, with an upper finger 15814 and lower finger 15816 extending from the plate 15812 (shown in FIG. 158C).

FIG. 159A-159C illustrates custom fingerstocks integrated with a privacy/security enclosure 15900 according to some embodiments of the invention. In some embodiments, an RF gasket comprising a compound gasket assembly including one or more of the aforementioned fingerstocks can be used to couple and/or seal a privacy/security enclosure. In other embodiments, the RF gasket can comprise custom fingerstocks without a gasket. FIG. 159A illustrates a cross-sectional view of a privacy/security enclosure 15900 shown in FIG. 159C. A close up of the RF gasket 15950 showing wall 15915 with inner surface 15915*a* is shown in FIG. 159B. For example, in some embodiments, at least one RF gasket 15950 can be positioned coupled to, adjacent to, or proximate to an inner surface 15915*a* of an upper portion 15910 of the privacy/security enclosure 15900. For example, in some embodiments, an RF gasket 15950 can be positioned coupled to the inner surface 15915*a* (see FIGS. 159A and 159B). Further, in some embodiments, at least one RF gasket 15950 can be positioned coupled to the inner surface 15915*a* of the upper portion 15910 of the privacy/security enclosure 15900 so that the fingers 15960, 15965 are positioned within the inner region 15905 privacy/security enclosure 15900, and the mounting surface 15927 coupled to the at least one RF gasket 15950 and inner surface 15915*a*. Further, in some embodiments, the at least one RF gasket 15950 including a clip 15955*a* (shown in FIG. 159B) can be further coupled to the upper portion 15910 by at least partially extending over and/or around at least a portion of the end surface 15916 of the upper portion 15910.

FIG. 160 illustrates RF attenuation behavior of various embodiments of the invention. As illustrated, the use of one or more compound gasket assemblies can attenuate RF when used with a privacy/security enclosure including one or more of the embodiments described herein. As shown, the greater attenuation can be provided with embodiments comprising dual compound gasket assemblies with and without a base gasket.

FIG. 160 illustrates RF attenuation behavior of various embodiments of the invention. The attenuation plot 16000 shows attenuation versus frequency for RF gasket configuration 16100 (data plot 16101), RF gasket configuration 16200 (data plot 16201), RF gasket configuration 16300 (data plot 16301), RF gasket configuration 16350 data plot 16351, RF gasket configuration 16400 data plot 16401, RF gasket configuration 16500 (data plot 16501).

In some embodiments of the invention, the privacy/security enclosure can comprise a case formed from at least one housing assembly. In some embodiments, the housing assembly can comprise a single monolithic element or can be formed from a plurality of sub-assemblies and/or components. In some embodiments, at least one of the plurality of sub-assemblies and/or components can be movable with respect to another portion, assembly, or sub-assembly of the housing assembly. In some embodiments, the housing assembly can include an enclosure for a user device. In some embodiments, the enclosure can couple directly to a user device such as a smart phone. In some further embodiments, at least one of the plurality of sub-assemblies and/or components can be rotatable, and/or or pivotable with respect to another portion, assembly, or sub-assembly of the housing assembly Referring to at least FIGS. 161A-162C, in some embodiments of the invention, the housing assembly 16110 including the case 16115 of the privacy/security enclosure 16100 can include at least one chiseled, carved, and/or angular face or surface. For example, in some embodiments, two or more chiseled, carved, and/or angular faces can be coupled to at least one other surface with an edge (such as edges 16113, 16117). In some embodiments, the surface or edge can comprise a hard or substantially abrupt edge surface (providing a chiseled-off appearance or look). In some other embodiments, the edge can comprise a soft or substantially curved or rounded edge surface. In some further embodiments, the two or more chiseled, carved, and/or angular faces can form a portion of the housing assembly providing a chiseled-off appearance and/or an armored and/or robust appearance. In some embodiments, the chiseled-off appearance, and/or an armored and/or robust appearance can extend to the base 16130. Further, in some embodiments, an access edge 16120 can include a chiseled-off appearance, and/or an armored and/or robust appearance.

Referring to at least FIGS. 163A-163C, in some embodiments of the invention, the housing assembly 16205 including the cover 16210, and/or the base 16215, and/or the hood 16220 can include at least one sliced, carved, and/or angular face or surface. For example, in some embodiments, two or more sliced, carved, and/or angular faces can be coupled to at least one other surface with an edge such as edges 16211, 16213. In some embodiments, the surface or edge can comprise a hard or substantially abrupt edge surface (providing a sliced-off appearance). In some other embodiments, the edge can comprise a soft or substantially curved or rounded edge surface. In some further embodiments, the two or more sliced, carved, and/or angular faces can form a portion of the housing assembly providing a sliced-off appearance.

Referring to at least FIGS. 164A-164C, in some embodiments of the invention, the housing assembly 16405 including the cover 16415 coupled to the chassis or carrier 15410, can include at least one sliced, carved, and/or angular face or surface. For example, in some embodiments, two or more sliced, carved, and/or angular faces can be coupled to at least one other surface with an edge such as edges 16412, 16213. In some embodiments, the surface or edge can comprise a hard or substantially abrupt edge surface (providing a sliced-off appearance). In some other embodiments, the edge can comprise a soft or substantially curved or rounded edge surface. In some further embodiments, the two or more sliced, carved, and/or angular faces can form a portion of the housing assembly 16405 providing a sliced-off appearance. In some embodiments of the invention, the housing assembly 16405 can include at least one curved or angular face or surface and/or sub-assembly 16425 substantially monolithically and/or seamlessly coupled to another portion of the housing assembly 16410. For example, in some embodiments, two or more curved or angular faces or surfaces and/or sub-assemblies can be substantially monolithically and/or seamlessly coupled to at least one other surface. In some embodiments, the at least one curved or angular face or surface and/or sub-assembly can comprise a hard or substantially abrupt edge surface (providing a sliced-off appearance or look). In some other embodiments, the at least one curved or angular face or surface and/or sub-assembly edge can comprise a soft or substantially curved or rounded edge surface. In some further embodiments, the two or more curved or angular faces or surfaces and/or sub-assemblies can form a portion of the housing assembly 16410 providing a monolithic or substantially seamless appearance.

Referring to at least FIGS. 165A-166C depicting a privacy/security enclosure 16500, 16600, in some embodiments of the invention, the housing assemblies 16505, 16605 can include at least one curved or rounded face, surface, edge and/or sub-assembly. Some embodiments of the invention can include a privacy/security enclosure 16500, 16600 comprising housing assemblies 16505, 16605 with at least one curved or rounded face, surface, edge and/or sub-assembly substantially coupled to at least one other curved or rounded face, surface, edge and/or sub-assembly substantially. For example, in some embodiments, any portion of the enclosures 16510, 16610 and/or covers 16515, 16615 can include curved or rounded faces or surfaces and/or sub-assemblies that can be substantially monolithically and/or seamlessly coupled to at least one other curved or rounded faces or surfaces and/or sub-assemblies including for example the base portions 16520,

16620. Further, in reference to at least privacy/security enclosure 16500 the housing assembly 16505 can comprise at least one movable, slidable, removable, or replaceable portion. For example, in some embodiments, at least a portion of the housing assembly 16505 can comprise a section, portion and/or component that can be moved, slid, removed, rotated or pivoted, latched or unlatched from, or with respect to, other portions of the privacy/security enclosure. Further, in some embodiments, the privacy/security enclosure can comprise at least one removable or replaceable section, portion, or component that can be removed, slid, latched or unlatched from the privacy/security enclosure after moving, sliding, removing, rotating, or pivoting at least a portion of the housing assembly with respect to other portions of the housing assembly. For example, the privacy/security enclosure 16500 including an housing assembly 16505 with enclosure 16110 including lower portion 16540 and moveable hood portion 16530, the portions 16530, 16540 can include curved or rounded faces or surfaces and/or sub-assemblies that can be substantially monolithically and/or seamlessly coupled to at least one other curved or rounded faces or surfaces and/or sub-assemblies (including for example the base portion 16520). In some embodiments, the at least one curved or rounded face or surface and/or sub-assembly can comprise a soft or substantially rounded or curved edge surface (providing a smooth, rounded, or soft geometric appearance or look).

In some embodiments of the invention, the privacy/security enclosure can include a housing assembly that can comprise at least one splined surface. For example, in some embodiments, any of the privacy/security enclosures 16100, 16200, 16300, 16400, 16500, 16600 can comprise two or more splined surfaces or faces can be coupled to at least one other surface and/or splined surface or face. In some embodiments, the at least one splined surface can comprise a hard or substantially abrupt edge surface (providing a splined-off appearance or look). In some other embodiments, the at least one splined surface can comprise a soft or substantially curved or rounded edge surface. In some embodiments, the two or more splined surfaces can form a portion of the housing assembly, providing a splined appearance.

Referring to at least FIGS. 167A-167C, in some embodiments of the invention, the privacy/security enclosure 16700 can include a housing assembly 16705 that can comprise at least one layered, wrapped, and/or coupled surface or structure. For example, in some embodiments, the housing assembly 16705 can comprise a chassis 16710 and/or cover 16715 and/or surface 16718, and/or base 16720 can include at least one layered, wrapped, and/or coupled surface or structure can be coupled to at least one other one layered, wrapped, and/or coupled surface or structure. In some embodiments, the at least one layered, wrapped, and/or coupled surface or structure can comprise a hard or substantially abrupt edge surface (providing a chiseled, carved, sliced, and/or splined-off appearance or look). In some other embodiments, the at least one layered, wrapped, and/or coupled surface or structure can comprise a soft or substantially curved or rounded edge surface. In some embodiments, two or more one layered, wrapped, and/or coupled surfaces or structures can form a portion of the housing assembly providing a layered, wrapped, and/or multiple parts or assembly coupled appearance.

In some embodiments of the invention, the housing assembly of a privacy/security enclosure can comprise at least one moveable, slidable, and/or latching portion that can engage or disengage with at least a portion of the housing assembly and/or a user device when placed within the privacy/security enclosure. For example, in some embodiments, at least a portion of the housing assembly can comprise a section, portion and/or component that can be moved, slid, rotated, pivoted, latched, or unlatched from or with respect to other portions of the privacy/security enclosure. Further, in some embodiments of the invention, the at least one moveable, slidable, and/or latching portion can engage or disengage with at least a portion of the housing assembly to enable insertion or removal of a user device such as a smart phone, tablet, computer or other such device with one or more microphones and/or camera(s) and/or RF transceiver(s) and/or other sensor(s). In some embodiments, the at least one moveable, slidable, and/or latching portion can be positioned proximate or adjacent one end of the privacy/security enclosure. In some embodiments, the housing assembly can comprise at least two moveable, slidable, and/or latching portions. In some embodiments, the at least two moveable, slidable, and/or latching portions can be positioned proximate each end of the privacy/security enclosure. In some embodiments, the housing assembly can comprise at least one moveable, slidable, and/or latching portion that can engage or disengage with at least a portion of the housing assembly and/or a user device when placed within the privacy/security enclosure that covers one side of the user device only.

FIGS. 168A-168C illustrate perspective views of various embodiments of a privacy/security enclosure 16800 including separable components that can be coupled by sliding one component (e.g., a component for housing a user device) into another component such as a case or cover. For example, housing assembly 16805 illustrates an enclosure 16810 including hood 16812, base 16820, and a removable cover 16815 (FIG. 168C showing an assembly view for insertion of the enclosure 16810 into the case or cover 16815.

Figure 172C:
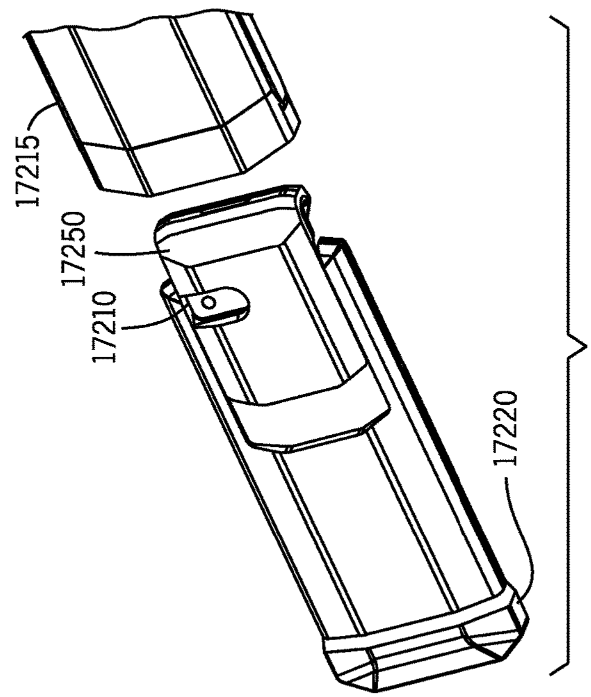
Figure 172B:
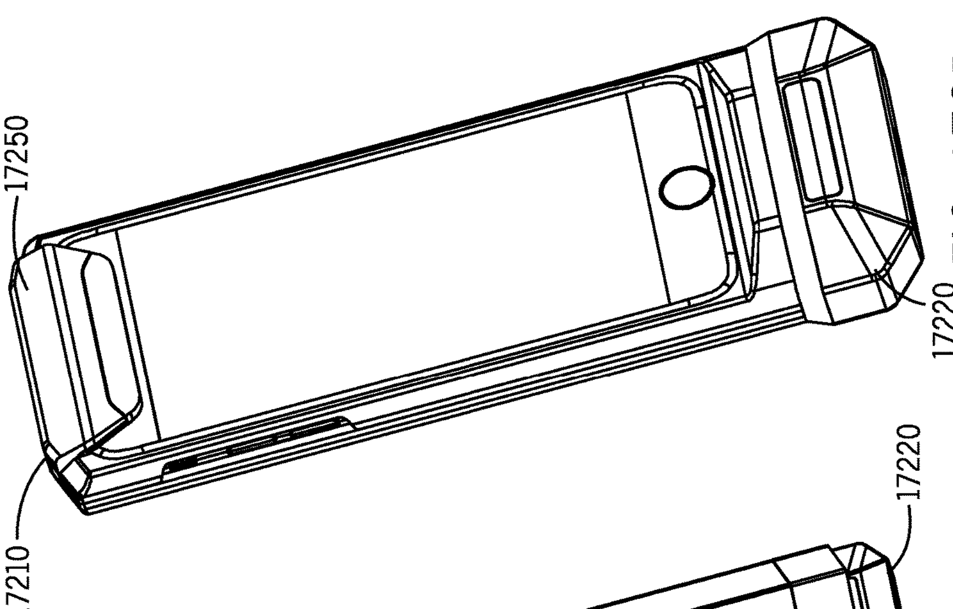
Figure 172A:
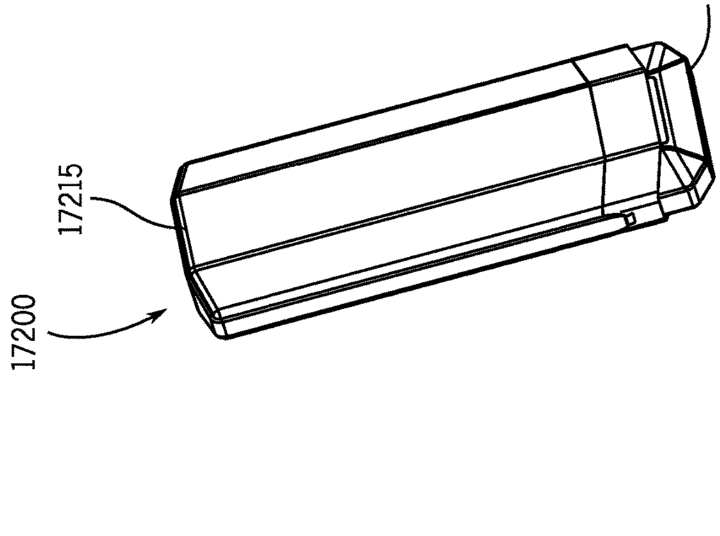

Referring to at least FIGS. 169A and 169B illustrating privacy/security enclosure 16900, FIGS. 170A-170B illustrating privacy/security enclosure 17000, FIGS. 171A-171B illustrating privacy/security enclosure 17100 and FIGS. 172A-172B illustrating privacy/security enclosure 17200, in some embodiments of the invention, the housing assembly can at least partially house or couple to a user interface and/or an indicator such as an LED, or other conventional illumination device, port, or other connector.

FIGS. 169A-169B illustrate perspective views of various embodiments of a privacy/security enclosure 16900. In some embodiments, the privacy/security enclosure 16900 can comprise a housing assembly 16905 including an enclosure 16910, hood 16912, cover or case 16915, and base 16920. In some embodiments, the base 16920 can include a user interface 16925. In some embodiments, the user interface 16925 can display an operation of the privacy/security enclosure 16900 and/or a function of any enclosed device. Similarly, FIGS. 170A-170B illustrate perspective views of various embodiments of a privacy/security enclosure 17000. In some embodiments, the privacy/security enclosure 17000 can comprise a housing assembly 17005 including an enclosure 17010, hood 17012, cover or case 17015, and base 17020. In some embodiments, the base 17020 can include a user interface 17030. In some embodiments, the user interface 17030 can display an operation of the privacy/security enclosure 17000 and/or a function of any enclosed device.

As described earlier, some embodiments of the invention include a privacy/security enclosure that can comprise a housing assembly including at least one moveable, slidable, and/or latching portion or section. Further, in some embodiments of the invention, a privacy/security enclosure can comprise a housing assembly including at least one moveable, slidable, and/or latching portion with at least one user interface and/or an indicator (within either the movable or static portions of the privacy/security enclosure). In some embodiments, the at least one moveable, slidable, and/or latching portion can be positioned at one end of the privacy/security enclosure, and the at least one user interface and/or an indicator can be positioned adjacent or proximate the other end of the privacy/security enclosure. Further, in some embodiments, the at least one moveable, slidable, and/or latching portion can engage or disengage with at least a portion of the housing assembly and/or a user device when placed within ore removed from the privacy/security enclosure. In some embodiments, an action such as movement of the at least one moveable, slidable, and/or latching portion can substantially coincide with and/or cause an action or operation of the user interface and/or an indicator. For example, in some embodiments, when the at least one moveable, slidable, and/or latching portion is moved (e.g., to prepare for insertion or removal of a user device), at least a portion of the user interface and/or the indicator providing an indication (e.g., such as lighting or illumination or the user interface) can change state (e.g., such as light or illuminate and/or display colors, text, or graphics). In some embodiments, at least a portion of the user interface and/or the indicator can provide an indication when opening. In other embodiments, at least a portion of the user interface and/or the indicator can provide an indication when closing.

For example, further referring to FIGS. 171A-171B, in some embodiments, the privacy/security enclosure 17100 can comprise a housing assembly 17105 including an enclosure 17110, hood 17112, cover or case 17115, and base 17120. In some embodiments, the base 17120 can include a user interface 17130 (shown positioned at an end 17111 of the enclosure 17110). In some embodiments, the user interface 17130 can display an operation of the privacy/security enclosure 17100 and/or a function of any enclosed device.

In some embodiments of the invention, a user interface of any of the privacy/security enclosures described herein can include at least one user-accessible function. For example, in some embodiments, a user action of the at least one user-accessible function of the user interface can change a status or actuate a function of the privacy/security enclosure, change a status or actuate a function of the user interface, and/or change a status or actuate a function of at least one user device covered, held or cradled with the privacy/security enclosure. For example, in some embodiments of the invention, the user interface can comprise at least one button capable of enabling a user to power-on or power-off the privacy/security enclosure. For example, in some embodiments, the user can press and hold the button for a specified period of time to power-on the privacy/security enclosure. As an example embodiment, the user can press and hold the button for a short period of time to control the power of the privacy/security enclosure.

In some embodiments, an action by the user of one or more functions of any of the privacy/security enclosures described here through the user interface can change a display or illumination status of the user interface of the privacy/security enclosure. For example, in some embodiments, the action of powering on or off of the privacy/security enclosure by the user using the user interface can be accompanied by a change of display or illumination of the user interface. Some embodiments of the invention include a user interface that comprises an LED that can change illumination status based on the user's interaction with the user interface. For example, in some embodiments, upon turning on the privacy/security enclosure, an LED lamp can illuminate. In some embodiments, the LED can be placed behind a lens. Further, in some embodiments, other user actions such as pressing the button for a short period can change the indicator response. Further, in some embodiments, the user can use the button to power-down the privacy/security enclosure (e.g., by pressing the button for a specified, short (up to several seconds) period of time. In some embodiments, the user interface can comprise an audible interface. For example, in some embodiments, the user interface, or other coupled portion of the privacy/security enclosure can emit one or more sounds based at least in part on a change in status of the privacy/security enclosure, a user initiated action (such as any of the user actions previously described), and/or a change in status or function of at least one user device that is at least partially enclosed by or otherwise coupled to the privacy/security enclosure. In some embodiments, the user interface can comprise capacitive or toggle-style buttons.

In some embodiments, the indicating status of the user interface can be based at least in part on a status or position of at least one moveable portion of the privacy/security enclosure. For example, referring specifically to FIGS. 171C-171D, illustrate user interface 17155 and uses of user interfaces 17155 of a privacy/security enclosure 17150 comprising enclosure 17151, in some embodiments, when the at least one moveable portion of the privacy/security enclosure 17150 (e.g., a hood 17152 is shown in the example embodiment) is moved by a user (e.g., from a closed position shown in FIG. 171D to an open or partially open position shown in FIG. 171C), the indicating status 17155*a* of the user interface 17155 can change.

Figure 175:
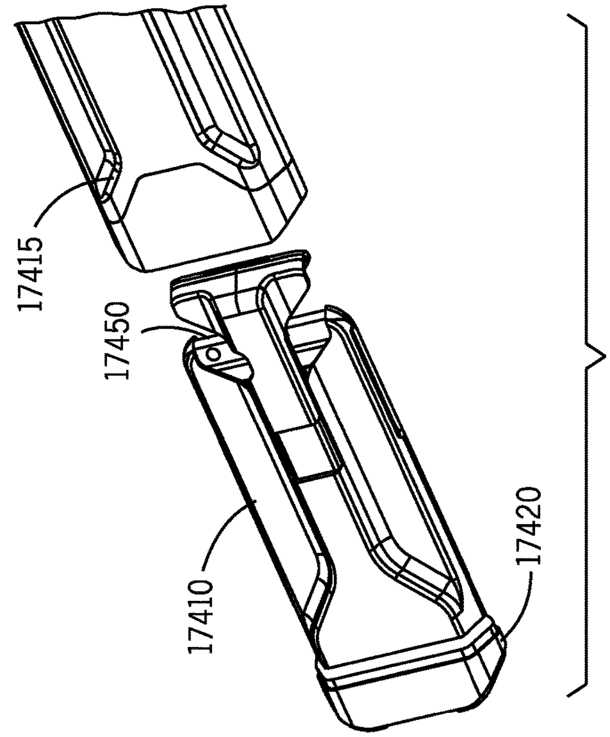
Figure 174:
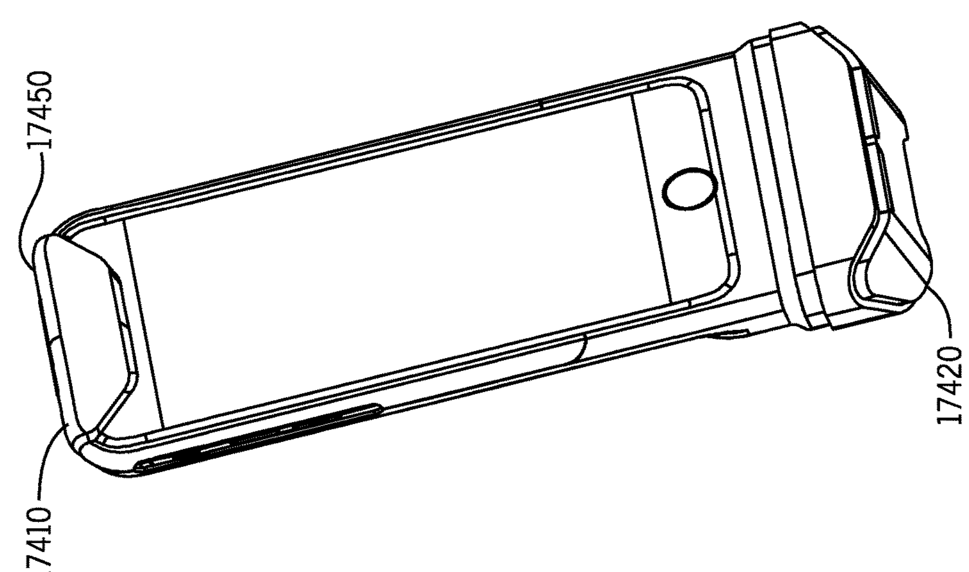
Figure 173:
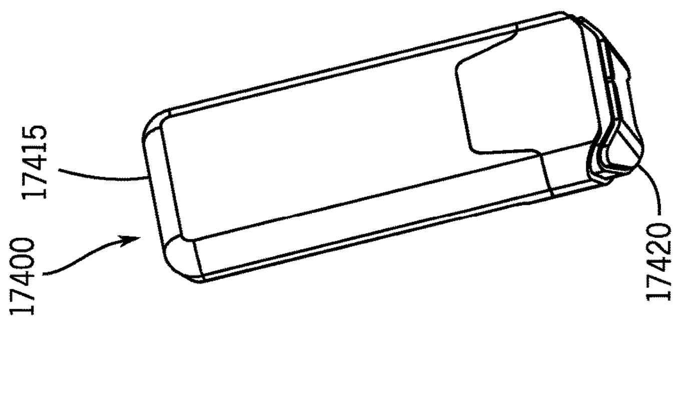
Figure 178:
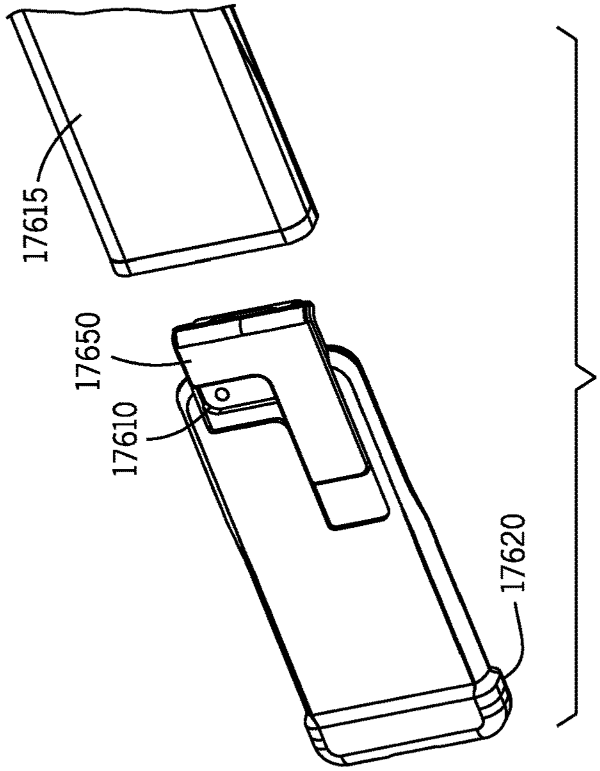
Figure 177:
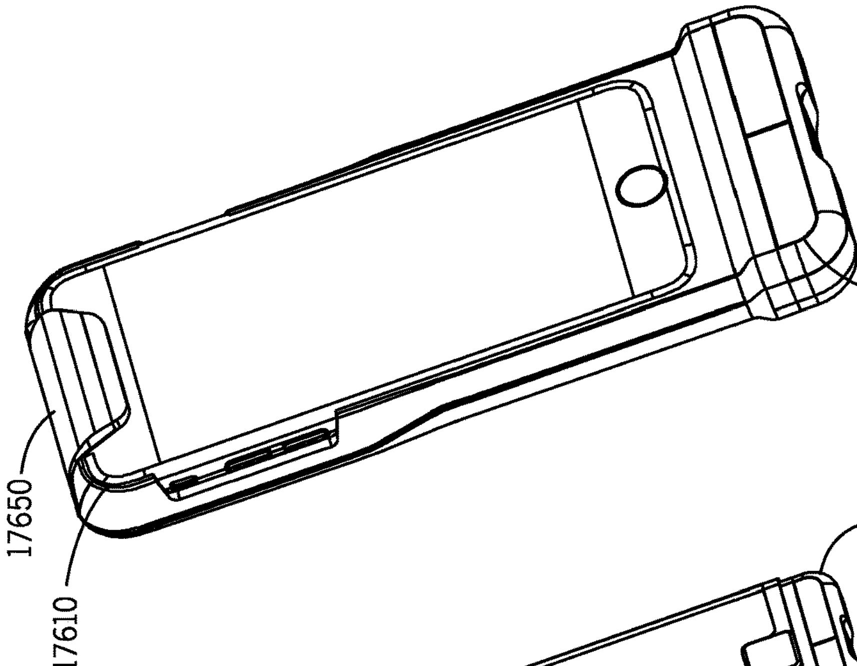
Figure 176:
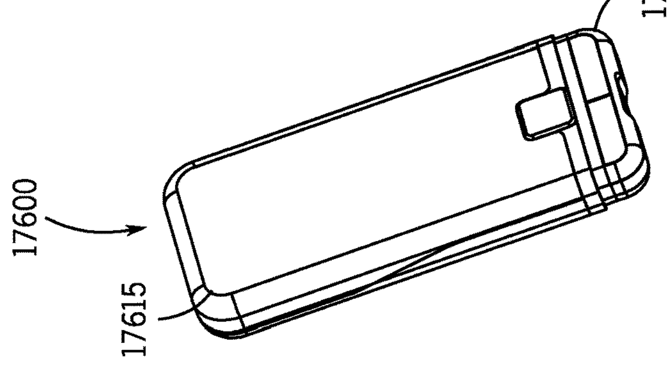
Figure 181:
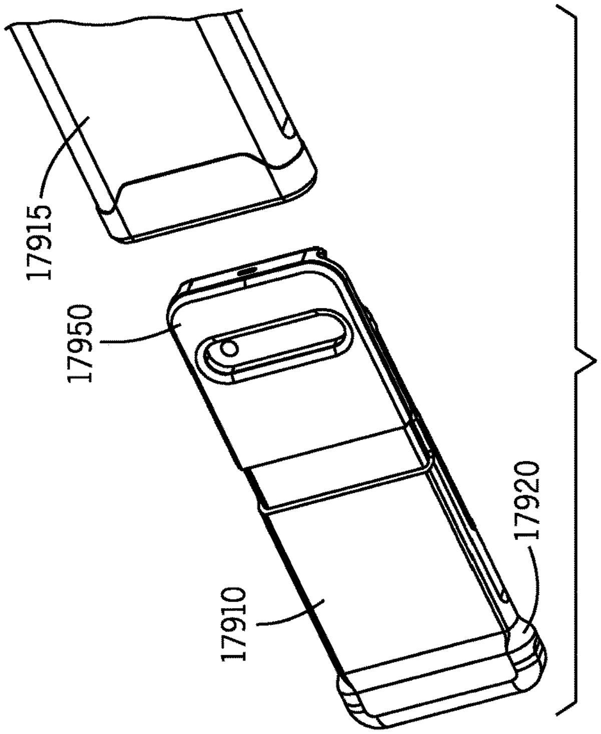
Figure 180:
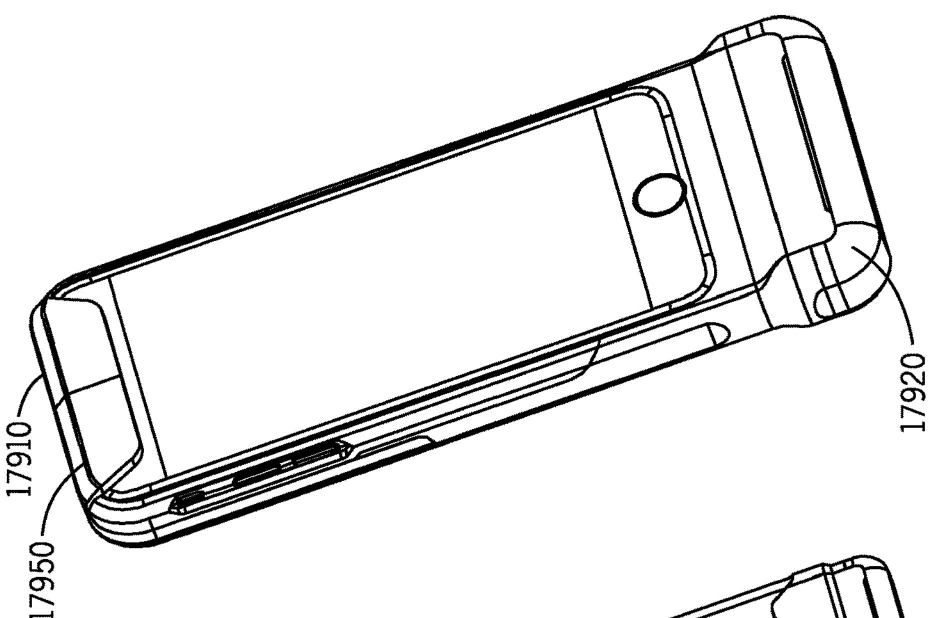
Figure 179:
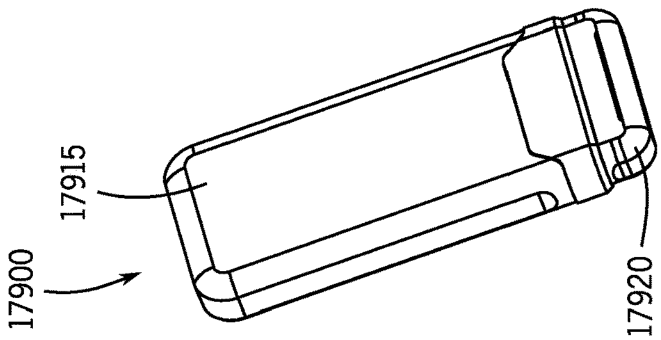

Further examples of privacy/security enclosures including one or more of the above described functions including user interfaces (e.g., such as a beacon) and other functions and alerts of an operational status or state are shown in FIGS. 172A-172C, and 173-187. For example, FIGS. 172A-172C show detailed perspective views of various embodiments of a privacy/security enclosure 17200 according to some embodiments of the invention. In some embodiments, the privacy/security enclosure 17200 can comprise an enclosure 17210 including a hood 17250 and a base 17220. In some embodiments, a cover or case 17215 can be coupled to the enclosure 17210. Further, FIGS. 173-175 show detailed perspective views of various embodiments of a privacy/security enclosure 17400 according to some embodiments of the invention. In some embodiments, the privacy/security enclosure 17400 can comprise an enclosure 17410 including a hood 17450 and a base 17420. In some embodiments, a cover or case 17415 can be coupled to the enclosure 17410. Further, FIGS. 176-178 show detailed perspective views of various embodiments of a privacy/security enclosure 17600 according to some embodiments of the invention. In some embodiments, the privacy/security enclosure 17600 can comprise an enclosure 17610 including a hood 17650 and a base 17620. In some embodiments, a cover or case 17615 can be coupled to the enclosure 17610. FIGS. 179-181 show detailed perspective views of various embodiments of a privacy/security enclosure 17900 according to some embodiments of the invention. In some embodiments, the privacy/security enclosure 17900 can comprise an enclosure 17910 including a hood 17950 and a base 17920. In some embodiments, a cover or case 17915 can be coupled to the enclosure 17910.

Figure 184:
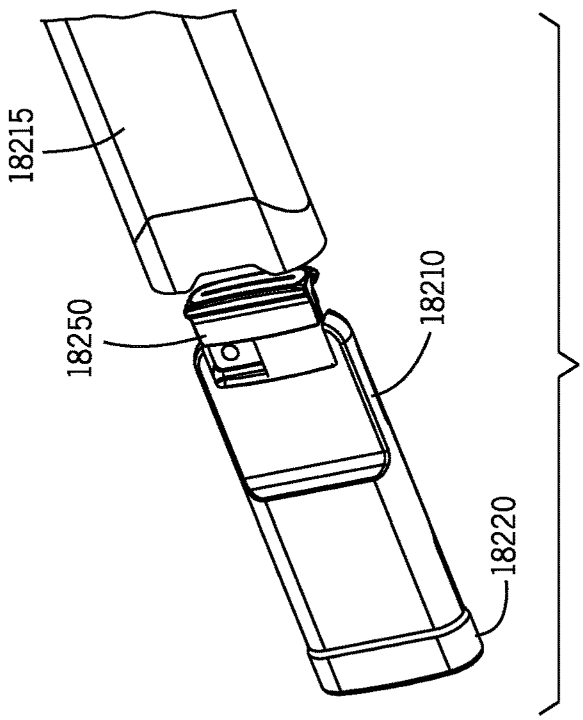
Figure 183:
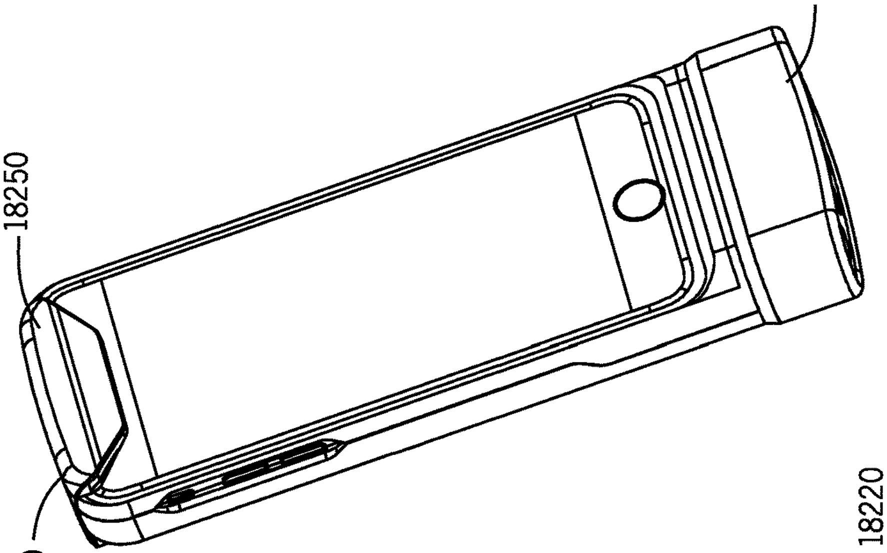
Figure 182:
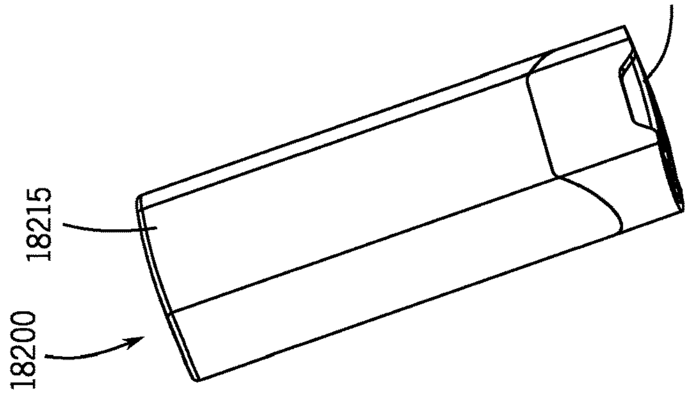
Figure 187:
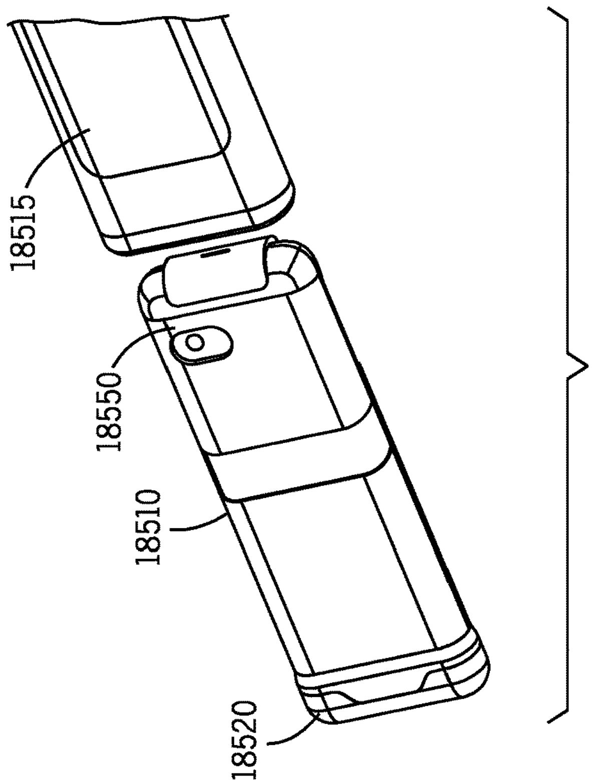
Figure 186:
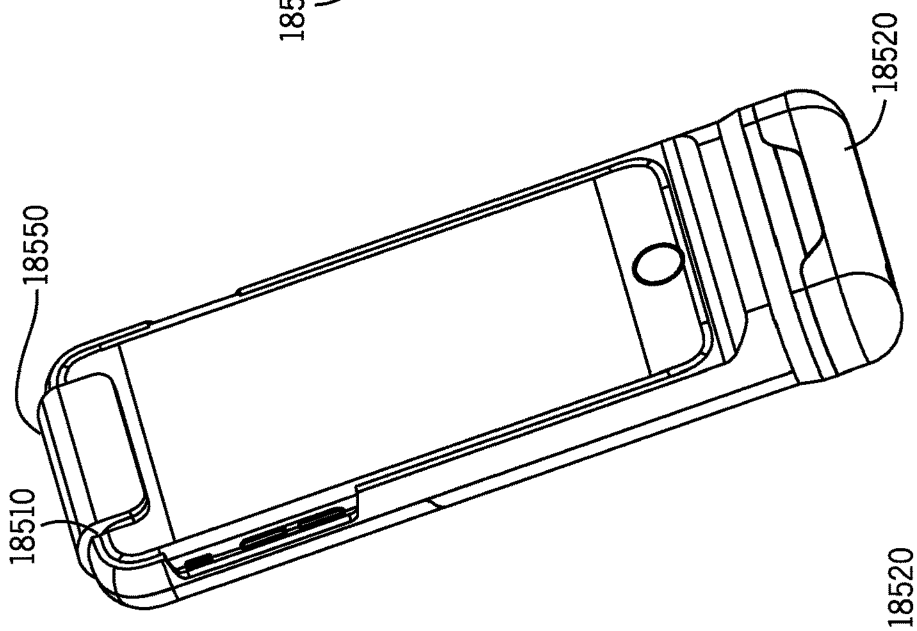
Figure 185:
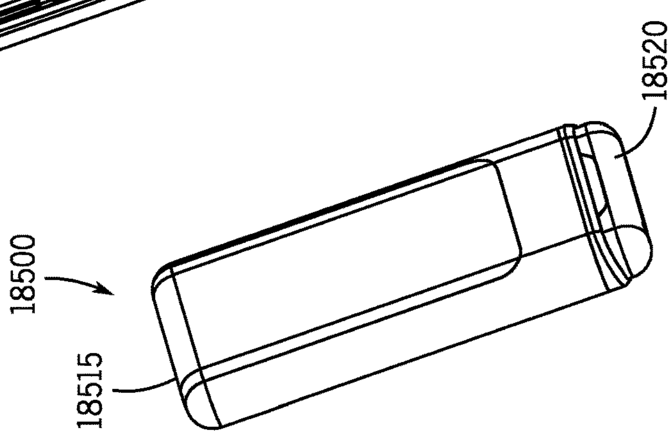

FIGS. 182-184 show detailed perspective views of various embodiments of a privacy/security enclosure 18200 according to some embodiments of the invention. In some embodiments, the privacy/security enclosure 18200 can comprise an enclosure 18210 including a hood 18250 and a base 18220. In some embodiments, a cover or case 18215 can be coupled to the enclosure 18210. FIGS. 185-187 show detailed perspective views of various embodiments of a privacy/security enclosure 18500 according to some embodiments of the invention. In some embodiments, the privacy/security enclosure 18500 can comprise an enclosure 18510 including a hood 18550 and a base 18520. In some embodiments, a cover or case 18515 can be coupled to the enclosure 18510.

Referring to one or more of the privacy/security enclosures 17200, 17400, 17600, 17600, 17900, 18200, and 18500 described above, in some embodiments, when the at least one moveable portion of the privacy/security enclosure (e.g., such as a hood) is moved by a user (e.g., from a closed position to an open or partially open position), the indicating status of the user interface of the hood of the privacy/security enclosure or other portion of the privacy/security enclosure, or both can provide an indicating status. In some other embodiments of the invention, at least some portion of the interior region of the privacy/security enclosure can illuminate and/or can be illuminated upon an action or change of status of the privacy/security enclosure. For example, in some embodiments, when the hood is raised, the interior region of the privacy/security enclosure can illuminate and/or can be illuminated. In some embodiments, the illumination of the interior can be indicative of the unprotected status of any user device within the privacy/security enclosure.

In some other embodiments of the invention, movement of the hood can change a status of the privacy/security enclosure. For example, in some embodiments, when the hood is raised (i.e., when the privacy/security enclosure is opened) the privacy/security enclosure can move to a power off state. In some embodiments, a user can access a button on the user interface of the privacy/security enclosure to power-on the privacy/security enclosure (e.g., by pressing a button on the user interface for a specified, short period of time such as a period between about 0.5 to about 3 seconds).

In some embodiments of the invention, a user can access a battery status using the user interface. For example, in some embodiments of the invention, a user can access a "poll" button on the user interface to ascertain the charge status of the battery of the privacy/security enclosure. In some embodiments, the privacy/security enclosure can display a battery status at pre-determined intervals. Further, in some embodiments, when the battery is being charged, successive LED indicators can illuminate based on the charge status of the battery.

In some embodiments, the privacy/security enclosure can comprise at least one icon display. For example, in some embodiments, the privacy/security enclosure can comprise at least one user interface configured as an icon display and/or configured to display at least one icon. Referring to FIGS. 188-190D illustrating icon displays of a privacy/security enclosure in accordance with some embodiments of the invention, in some embodiments, the icon display can comprise one or more audio function-related icons. For example, in some embodiments, the icon can comprise one or more microphone enabled and/or audio-protected icons. Further, in some embodiments, the icons can comprise combined audio and battery and/or charge indicator icons.

Figure 188:
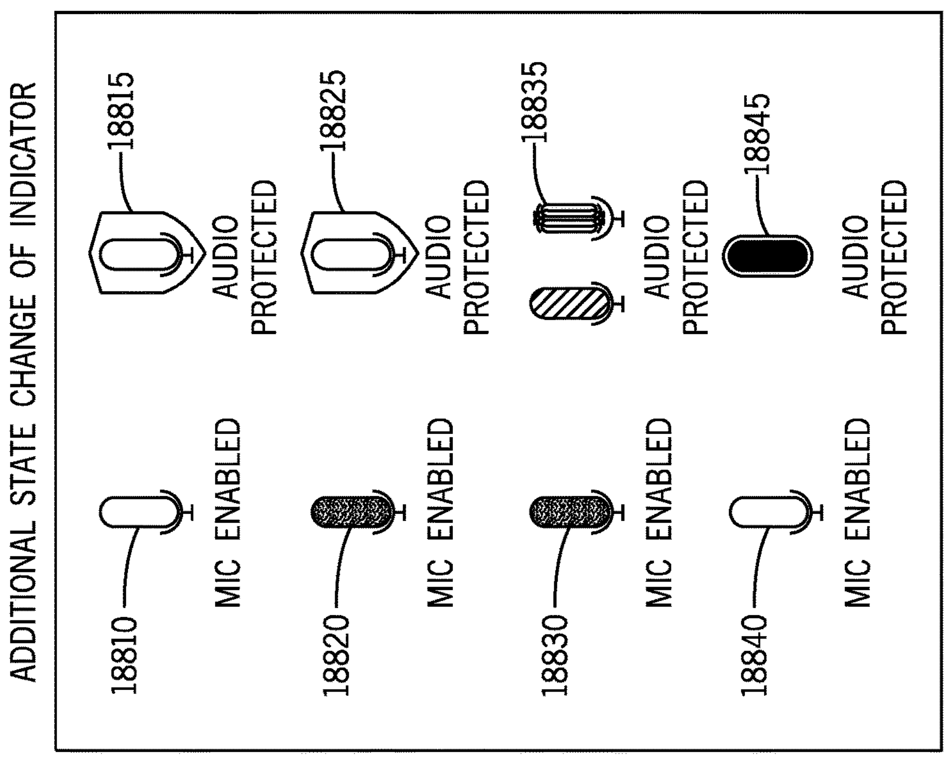

FIG. 188 illustrates icon displays of a privacy/security enclosure in accordance with some embodiments of the invention. Some icons can be illuminated, marked, and/or animated (e.g., flashed on and off or color cycled) depending on a status of one or more functions of at least one of the privacy/security enclosures described herein. Icons include indicators of the status of one or more microphones and audio protection characteristics. For example, some embodiments include at least one microphone enabled icon 18810, audio protected icon 18815, microphone enabled icon 18820, audio protected icon 18825, microphone enabled icon 18830, audio protected icon 18835, microphone enabled icon 18840, and audio protected icon 18845. Any of the privacy/security enclosures disclosed herein can utilize icons 18810, 18815, 18820, 18825, 18830, 18835, 18840, and 18845.

Figure 189:
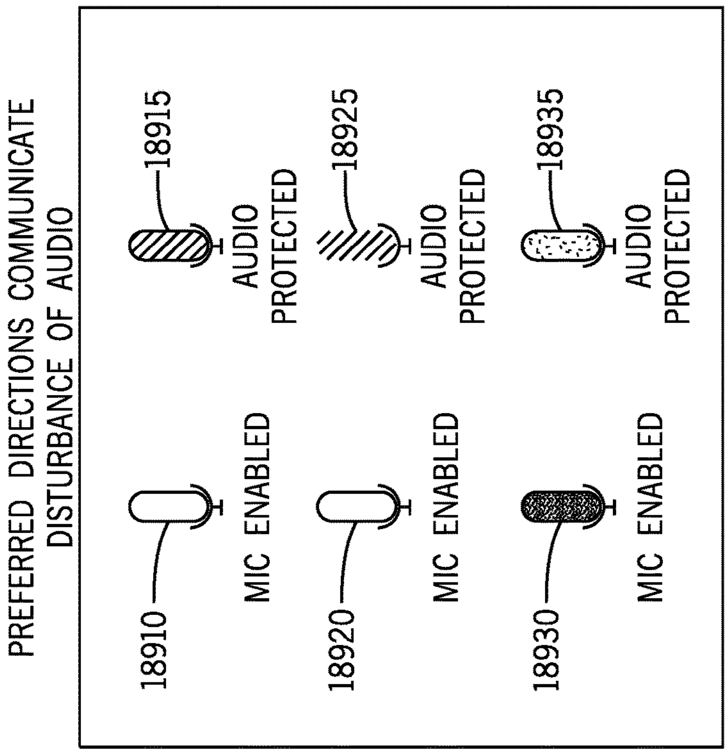

FIG. 189 illustrates icon displays of a privacy/security enclosure in accordance with some embodiments of the invention. Some icons can be illuminated, marked, and/or animated (e.g., flashed on and off or color cycled) depending on a status of one or more functions of at least one of the privacy/security enclosures described herein. Icons include indicators of microphone status, audio protection (including microphone enabled icon 18910), audio protected icon 18915, microphone enabled icon 18920, audio protected icon 18925, microphone enabled icon 18930, and audio protected icon 18935. Any of the privacy/security enclosures disclosed herein can utilize icons 18910, 18915, 18920, 18925, 18930, 18935.

FIGS. 190A-190D illustrates icon displays of a privacy/security enclosure in accordance with some embodiments of the invention. Some icons can be illuminated, marked, and/or animated (e.g., flashed on and off or color cycled) depending on a status of one or more functions of at least one of the privacy/security enclosures described herein. Icons include indicators of battery charge or status, microphone status, audio protection. For example, referring to FIG. 190A, some embodiments include charged and microphone-enabled icon 19010, half-charged and microphone enabled icon 19020, and half-charged and audio-protected icon 19030. Any of the privacy/security enclosures disclosed herein can utilize icons 19010, 19020, 19030. Further, referring to FIG. 190B, some embodiments include audio-protected icon 19040, microphone-enabled icon 19045, and battery charge icon 19050. Any of the privacy/security enclosures disclosed herein can utilize icons 19040, 19045, 19050.

Figure 190A:
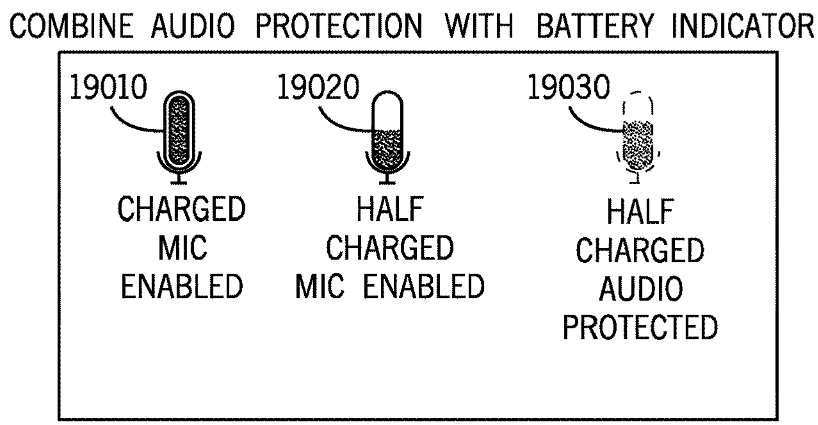
Figure 190B:
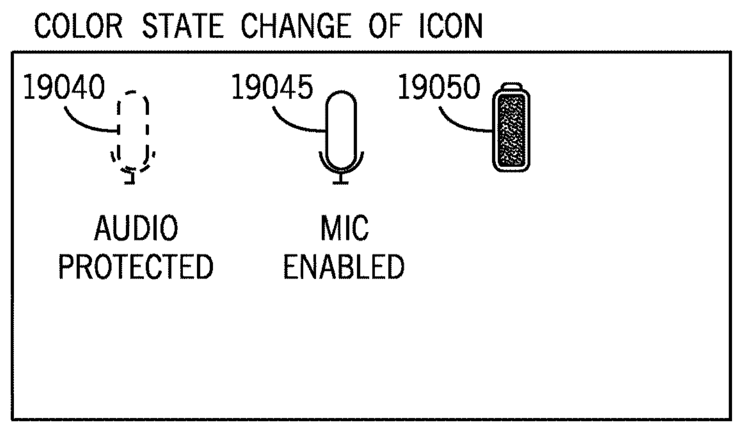
Figure 190C:
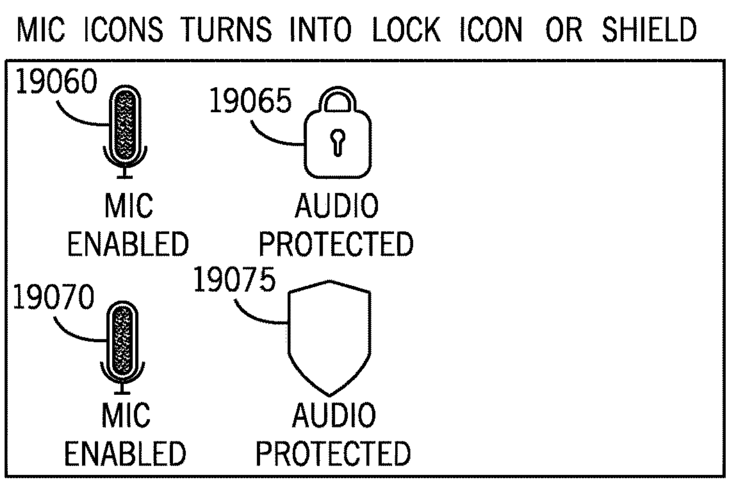
Figure 190D:
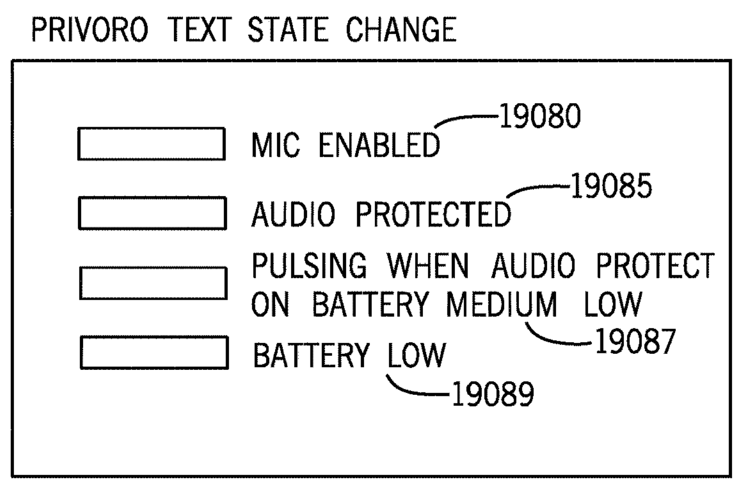

Further, referring to FIG. 190C, some embodiments include microphone enabled icon 19060, audio-protected icon 19065, microphone-enabled icon 19070, and audio-protected icon 19075. Any of the privacy/security enclosures disclosed herein can utilize icons 19060, 19065, 19070, 19075. Further, referring to FIG. 190D, some embodiments include microphone-enabled icon 19080, audio-protected icon 19085, audio protect on icon 19087 (pulsing when on), and battery low indicator icon 19089. Any of the privacy/security enclosures disclosed herein can utilize icons, 19080, 19085, 19087, 19089.

Figures 191A, 191B, 191C, 191D, 191E, 191F:
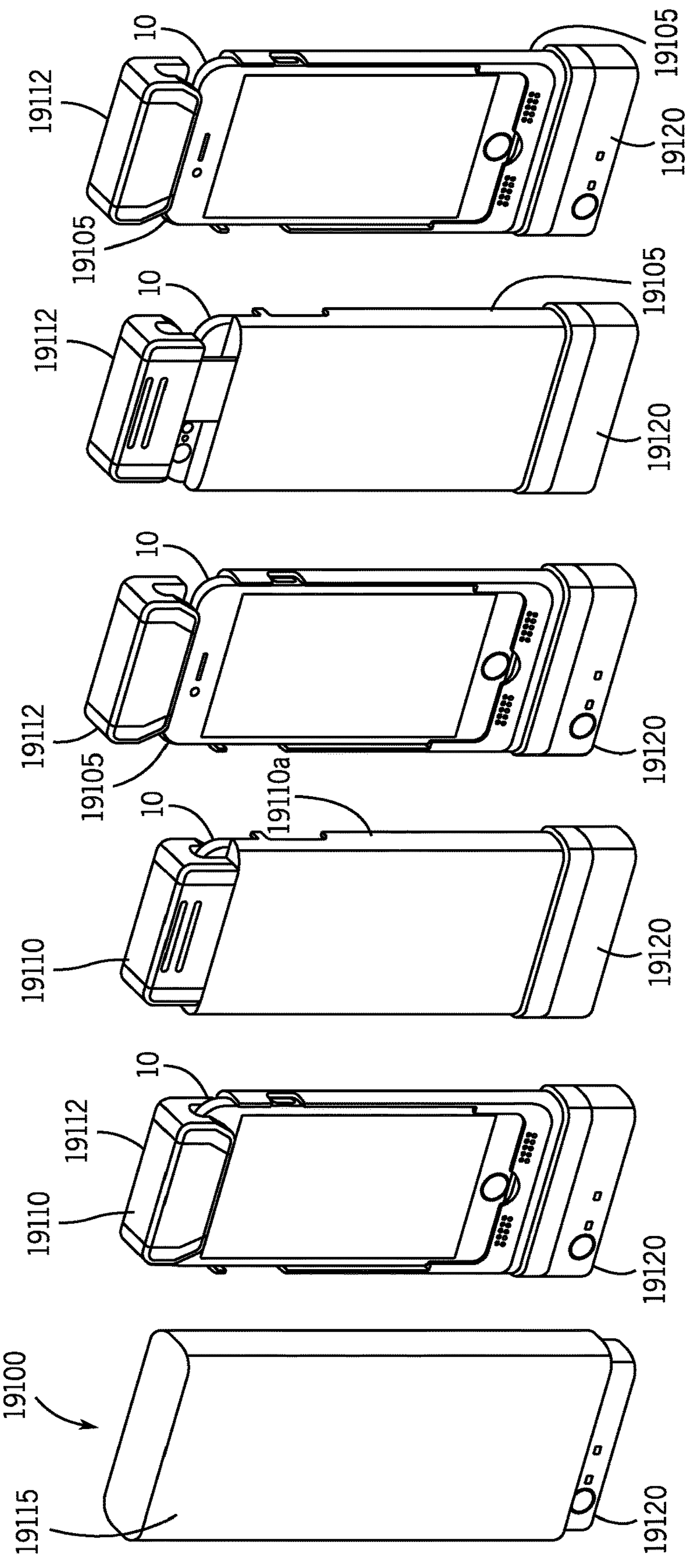

Further details of the structure, assembly, and operating functions of the privacy/security enclosure are described related to FIGS. 191A-205F. Referring to at least FIGS. 191A-191F illustrating an overview of a privacy/security enclosure 19100 in accordance with some embodiments of the invention, in some embodiments of the invention, the privacy/security enclosure 19100 can comprise a chassis 19110 that includes a base 19120 that can hold electronics and a user interface. In some embodiments, the back 19110*a* of the chassis 19110 can hold a rechargeable, user or non-user accessible battery. In some embodiments, at least a portion of the base 19120 can form part of an RF attenuation cage (e.g., a Faraday cage). In some embodiments, when assembled, a cover 19115 completes the RF cage. In some embodiments, the top portion of the chassis (hood 19112) can lower onto or over the top of an enclosed device (shown generically as device 10) such as a smart phone, tablet, computer or other such device with one or more microphones and/or camera(s) and/or RF transceiver(s) and/or other sensor(s). In some embodiments, the chassis 19110 can couple to an enclosure 19105 positioned and formed to support a user's device 10. In some embodiments, the hood 19112 can be moved from a lower position (FIGS. 191B-191C) to a raised position (FIGS. 191D-191F). In some embodiments, the user can raise and lower the hood to facilitate insertion and removal of a user device into the privacy/security enclosure 19100. In some embodiments, the movement of the hood 19112 can change a function or status of the privacy/security enclosure 19100 as described earlier.

In some embodiments, the privacy/security enclosure 19100 and/or any privacy/security enclosure disclosed herein can prevent or reduce the ability of an authorized or unauthorized listener from using the microphone or other sensors, from detecting the presence of speech, or, if the presence of speech can be detected, reducing or eliminating the intelligibility of such speech. In some embodiments, when set to a obfuscation and/or randomness mode, the privacy/security enclosure can randomly broadcast to provide protection even if no one is speaking, thereby diminishing the ability of an authorized or unauthorized listener of detecting when there is actual speech by a user using the system.

In some embodiments, for the device(s) protected by the privacy/security enclosure, including at least one of the privacy/security enclosures disclosure here, lowering a hood or hood equivalent portion or other mechanism, the hood can seal one to all of the microphones (e.g. front, rear, bottom etc.) device(s), and can cover one to all of the cameras (e.g, front, rear etc.), and engage masking sound(s) to be received by the sensor(s) of the protected device(s). In some embodiments, the sealing/unsealing, covering/uncovering and/or activation/deactivation for any up to all of the sensors of the protected device(s) can occur with a single movement or action of the hood or other desired structure (e.g. raising or lowering) or other portion of the privacy/security enclosure, while in others it can require one or more movements and/or actions. In some embodiments, the movement/action described can be manually actuated, while in others the movement/action can be partially or fully electro-mechanically actuated.

In some embodiments, the ability to protect against different types of sensors in different physical locations on the protected device(s) in one or more motions/action can be accomplished by physical or electrical linkages between the portions of the enclosure providing the protection against each and/or every sensor. In some embodiments, the privacy/security enclosure will include sensors to determine if and where any protected devices reside within the enclosure and to determine the state (e.g. raised or lowered) of specific protective assemblies, thereby allowing coordination of protection.

In some embodiments of the invention, the mechanisms that provide protection to a user's device, including protections against audio, video, RF transmit/receive capability and/or other sensors (i.e. gyroscope, accelerometers and/or any other sensor that is part of the enclosed device(s) etc.) can be integrated into the core structure of the privacy/security enclosure. In some embodiments, such mechanisms can be activated or deactivated with a conventional slide, button, switch and/or other such physical and/or electromechanical feature. In some embodiments, the feature can activate/deactivate the protection for one or more microphones, cameras, RF antennas or RF transmit/receive functionality for the enclosed device(s) in a single actuation, action, motion, and/or interaction. In other embodiments of the invention, such a feature can require two or more actuations, action, motion, and/or interactions (i.e. button press, switch slide, etc.). In some embodiments, the two or more actuations, actions, motions, and/or interactions can comprise two or more individual sequential or parallel single actuations, actions, motions, and/or interactions.

In some embodiments of the invention, with the hood down, all or most of the enclosed device(s) functions that do not include secured sensors can be available. In some further embodiments, with the hood raised, all or most of the enclosed device(s) functions can be available. In some embodiments, a button can be used to the masking audio sound turn on and off. In some embodiments, one LED can indicate a masking sound, and another can indicate a battery status, while yet another could indicate other functions such as maintenance requirements and/or feature indications/activations. In other embodiments, the indications/status of the previously mentioned functions could be combined into one or more LEDs. In some embodiments, the case and enclosed device(s) are charged through a micro-USB or other such charging port.

In some embodiments, any of the privacy/security enclosures described herein can include the circuit layout shown in FIG. 192. FIG. 192 illustrates a circuit system layout 19200 that can be used in any of the privacy/security enclosures described herein. As illustrated, the circuit system layout 19200 can comprise a RF case half section 19210, base circuitry and connections 19201, case half connections 19228 including cover 19230, hood 19240, and miscellaneous external connections 19203. In some embodiments, the circuit system layout 19200 can comprise an interface board 19202, main board 19270 with optical communication 19204, case battery 19224, and Lightning™ connector 19226. Connections can comprise charging socket 19206, USB connector 19208, power plug 19209, power socket 19212, i/o features 19214. Visual indicators or masking functions can comprise masking LED 19216, and battery capacitor LED 19218. Other components include foot speaker 19232, hood/phone switch 19260, and pass-through filter 19280. In some embodiments, the pass-through filter 19280 can allow the transmission of specific frequencies, while filtering and/or attenuating others. In some further embodiments, the pass-through filter 19280 can allow the passage of a physical wire through the surface of the Faraday cage, while not materially degrading the RF attenuation capabilities of the Faraday cage. Further, in some embodiments, the boards 19202, 19270 can be coupled using at least one optical communication link 19204, configured to communicate in such a way that does not materially degrade the RF attenuation of the Faraday cage through which the communication is passing. In some embodiments, a hood 19240 and/or enclosed device detection switch (19260) can be coupled to the main board 19270. Further, in some embodiments, the hood 19240 and/or a bottom, foot and/or other portions of the privacy/security enclosure (eg., components 19201, 19210, 19230) can comprise one or more sound generators (e.g., speakers). Further, some embodiments include the battery 19224 coupled to the main board 19270 and/or a Lightning™ connector 19226, USB, micro-USB, and/or other type of power connector coupled to the main board 19270. In some embodiments of the invention, the interface board 19202 is coupled to a charging socket 19206, and input/output features such as a masking LED 19216, a battery capacitor capacity LED 19218, and an on/off button 19222. In some embodiments, the charging socket 19206 can be coupled to a USB connector 19208 and/or a wall charger 19212.

As described earlier and illustrated in FIGS. 171C-171D, in some embodiments, the indicating status of the user interface can be based at least in part on a status or position of at least one moveable portion of the privacy/security enclosure. FIG. 193 illustrates an operational state diagram of a privacy/security enclosure (represented as privacy/security enclosure 19300) with a phone present in accordance with some embodiments of the invention.

For example, the privacy/security enclosure 19300 can include a chassis 19310 with an upper portion 19312, base 19320, a hood 19350, and an attached outer housing or case 19315. In some embodiments, operation of the privacy/security enclosure 19300, movement of the hood 19350, opening of the case 19315 (e.g., such as that defined by any of the symbols 19311) can define a state 19311, and include a status of the case 19315 (status 19314), phone acoustics (19316), masking status (19318), and user device presence (19319). In some embodiments, the operational parameters can be defined as 19370, 19375, 19380, 19385, or 19390 as shown. For example, in some embodiments, a state 19312 comprising "closed off" can be representative of a closed privacy/security enclosure, sealed acoustics, and masking off (19370). In this instance, the privacy/security enclosure 19300 can comprise a microphone sealed indicating symbol turned on.

In some embodiments, a "closed on" state 19312 can comprise a case closed, phone acoustics sealed, and masking fully on (shown as 19375). In this instance, the privacy/security enclosure 19300 can comprise two indicating symbols turned on including a microphones sealed indicator and a masking playing indicator. In some embodiments of the invention, the privacy/security enclosure can comprise an open free state 19312 comprising an open case, unsealed phone acoustics, and masking off (shown as 19380). In this instance, the privacy/security enclosure can comprise no indicating symbols turned on indicating masking silent and microphones unsealed. In some further embodiments, the privacy/security enclosure can comprise an open off state 19312, comprising a case open, phone acoustic sealed, and masking off (shown as 19385). In this instance, the privacy/security enclosure 19300 can comprise an indicating symbol turned on comprising a microphones sealed indicator. In some other embodiments, the privacy/security enclosure can comprise an open on state 19312, comprising a case open, phone acoustic sealed, and masking full on (shown as 19390). In this instance, the privacy/security enclosure can comprise two indicating symbols turned on including a microphones sealed indicator and a masking playing indicator.

FIG. 194 illustrates a state cycle diagram of a privacy/security enclosure in accordance with some embodiments of the invention. In some embodiments, the state cycles can be represented as phone in/out interactions, power on/off interactions, cover on/off interactions, and hood up/down interactions, where solid lines represent a require pathway and a dashed line represents an optional path per hood memory. FIG. 194 illustrates a state cycle diagram 19400 of a privacy/security enclosure in accordance with some embodiments of the invention. In some embodiments, the state cycle diagram 19400 can apply to any of the privacy/security enclosures disclosed herein. The state cycle diagram 19400 19440. In some embodiments, operational state 19440 can be indicated by icons 19446 based on interactions 19448, and parameters 19450.

FIGS. 195A-195B illustrates partial interior perspective views of a privacy/security enclosure 19500 in accordance with some embodiments of the invention. In some embodiments, portions of the privacy/security enclosure 19500 can be completely enclosed by separate and unattached other portions of the privacy/security enclosure (including for example base 19520 as coupled to the chassis 19505, with the combined enclosure providing different and/or increased levels of audio, video, RF and/or other types of sensor, drop, environmental or other types of protection.

Further internal structures, components and assembly can be seen in FIGS. 196-198D. For example, FIG. 196 illustrates a partial cut-away view of a privacy/security enclosure in accordance with some embodiments of the invention. Some embodiments include a cover Faraday assembly 19615, a base assembly 19620 with Faraday assembly 19630, and a DC pass-through assembly (shown in FIG. 197B as 19770), all supported in a privacy/security enclosure 19605.

In some embodiments of the invention, any RF gasket or seal (shown as 19610) of the privacy/security enclosure (e.g., forming the Faraday cage) can include a conventional or custom fingerstock or any fingerstock or component gasket assembly described earlier. In some embodiments, at least a portion of the fingerstock can comprise a metal or a metal alloy. In some embodiments, at least a portion of the fingerstock can comprise copper or a copper alloy. In some other embodiments, at least a portion of the fingerstock can comprise iron or steel. In some embodiments, at least a portion of the fingerstock can comprise nickel or a nickel alloy (e.g., a nickel-copper alloy), or an alloy of copper and tin. In some embodiments, at least a portion of the fingerstock can comprise aluminum, magnesium, or mixtures or alloys thereof. In some embodiments, the fingerstock can comprise beryllium copper ("BeCu") that can electrically couple the cover to the base, and when closing the case. In some embodiments, the fingerstock can comprise a base metal (e.g., such as nickel) with varying thicknesses of plated metals, including, but not limited to gold, palladium nickel, and titanium blend plating options. Some embodiments of the invention can include one or multiple rows of fingerstock brazed soldered, welded, bonded with conductive adhesive, or otherwise conductively bonded into the cover assembly. In some embodiments, in each row of fingerstocks, a hollow or solid circular profile of extruded conductive elastomer can be used. In some embodiments, the bearing surface on the base can be nickel-plated for conductivity and surface hardness.

Some embodiments include openings in the RF cage that do not materially compromise RF attenuation performance. Some embodiments include a DC pass-through assembly 19770 that allows DC power to pass between boards on either side of the cage. In some embodiments, one or more holes or windowed ports can allow light to pass to enable optical communication between boards (such as the main board and the interface board). Some embodiments include a RF pass-through for one or more frequency bands, while continuing to attenuate other frequency bands. In some embodiments, base assembly 19620 and/or Faraday assembly 19630 can include an RF pass-through switch, which allows physical interaction/linking between inner and outer portions of the Faraday cage or privacy/security enclosure, without materially degrading RF protection/attenuation.

FIGS. 197A-197B illustrates a close-up view of the partial cut-away view in FIG. 196 in accordance with some embodiments of the invention. As illustrated, in some embodiments, the cap 19749 can comprise machined aluminum, and the cover body 19750 can comprise extruded and machined aluminum. In some embodiments of the invention, the privacy/security enclosure can comprise inner and/or outer bezels (19752, 19754) comprising machined aluminum, and one or more inner and/or outer fingerstock (19756, 19757) such as a BeCu fingerstock or other such fingerstock or other RF gasket. In some embodiments, the inner and/or outer fingerstock (19756, 19757) and/or interface can include a stepped landing. In some embodiments of the invention, a stepped fingerstock interface can reduce the sliding distance that would be experienced by the leading row of the fingerstock. In some embodiments, reducing the sliding distance can both reduce the wear on the fingerstock, and reduce the wear on the fingerstock landing area (i.e., the rim). In some embodiments, the stepped profile can equalize the sliding distance experienced by the inner, outer or other such rows of fingerstock.

In some embodiments, the cap 19749, the cover body 19750, the inner and outer bezels (19752, 19754), and the inner and outer fingerstocks (19756, 19757) shown as 19764 can be coupled together (e.g., using welding, brazing, or other conventional joining methods). Further, some embodiments also include a Faraday rim 19762 and Faraday pan 19766. In some embodiments, the Faraday rim 19762 and Faraday pan 19766 can be coupled together (e.g., using welding, brazing, or other conventional joining method). In some embodiments, the Faraday rim 19762 and Faraday pan 19766 can comprise aluminum. In some embodiments, the Faraday rim 19762 can comprise machined aluminum, and the Faraday pan 19766 can comprise deep drawn aluminum. In some embodiments, the DC pass-through assembly 19770 can comprise brass, aluminum, magnesium or a blended metal alloy assembly. Further, some embodiments include optical communication holes or ports 19621. In some embodiments, the DC pass-through assembly 19770 can be coupled to the base 19620 (shown as 19727) by soldering.

As described earlier, in some embodiments, acoustic security/protection can be achieved through audio masking. The audio masking noise can be emitted from the privacy/security enclosure proximate or adjacent the expected location of a microphone of an enclosed device, and/or in the general vicinity of the device. In some embodiments, assemblies for masking noise can include one or more assemblies configured to emit noise for pickup up by front, rear, and/or bottom or any other microphones of an enclosed/protected device. For example, FIGS. 198A-198D illustrate partial interior views of portions of a privacy/security enclosure in accordance with some embodiments of the invention showing masking module assemblies comprising at least one speaker driver, coupling, and seal. Further, some embodiments include assemblies to mask a bottom microphone including a push-rod, bottom masking module (comprising a speaker driver, caliper, and seal), and a caliper boot.

FIGS. 198A-198D illustrates partial interior views of portions of a privacy/security enclosure including the base 19620 described above. In some embodiments of the invention, the privacy/security enclosure can include a plurality of sub-assemblies that can each be assembled individually before being assembled together to form the privacy/security enclosure. In some embodiments, the major sub-assemblies can comprise a cover assembly that can form an outer cover, at least partially enclosing a chassis assembly. In some embodiments, the chassis assembly can comprise the hood assembly (shown as 19812) and a base 19620). Further, in some embodiments, the base 19620 can comprise a Faraday base assembly 19630 as described earlier.

In some embodiments, the hood assembly 19812 can comprise a hood housing 19814 including a left and right hood shroud. In some embodiments, the hood assembly 19812 can include a hood clamp that can be used to seal and unseal to the front and back microphones. Consequently, when the hood assembly 19812 or other such mechanism is raised and lowered, the rubbing/sliding/interaction of the sealing surface against the mating surface on/of the protected device(s) can be minimized or reduced thereby enabling a higher cycle count of hood assembly 19812 raises/lowers, reducing or mitigating wear of the gasket/seals). In some embodiments, when the hood assembly 19812 is lowered, tension or compression forces can cause the hood assembly to spring away from the surface of the enclosed device (similar to a binder clip in reverse) and as the hood assembly 19812 is raised, the seals lift. In some embodiments, when the hood assembly 19812 is lowered, ramps can compress the hood clip and force the seals against the microphone with the correct amount of compression to deliver the designed audio protection.

Some embodiments include a different mechanism for the bottom or other microphone(s), the sealing/unsealing of which can be coordinated with the single motion of raising and lowering the hood, where the two or more mechanisms are coupled so that they function together. In some embodiments, the seal to the bottom or other microphone(s) can include mechanisms that reduce the rubbing/sliding/physical interaction between the sealing path and the mating surface when the mechanism is engaged/disengaged, reducing wear and increasing cycle life for such mechanisms.

Some further embodiments include the design of sealing paths to various sensors on the protected device in order to enhance or improve the effectiveness, efficiency and/or usability of protection. In some embodiments, the sealed or partially sealed path/channel from sound generators (e.g. speakers or drivers) can increase the amount of acoustical energy reaching the microphone(s) of the protected devices, reducing power requirements and/or allowing the use of smaller and/or less powerful drivers/speakers when compared to the acoustical power that would be required to deliver an equivalent level of protection in an open or non-sealed/non partially sealed environment. In some embodiments, the sealed or partially sealed path/channel from sound generators (e.g. speakers or drivers) reduces and/or attenuates the amount of masking signal(s) reaching outside of the path/channel, thereby reducing the detectability and/or obtrusiveness of such signal to the outside environment. In some embodiments, the sealed or partially sealed path/channel from sound generators (e.g. speakers or drivers) reduces and/or attenuates outside signals/sounds/audio content from reaching the protected device(s)' microphone(s) and/or sensors, providing some level of protection and/or reducing the level of masking signal(s) required to deliver an equivalent level of protection when compared to an open or non-sealed/non partially sealed environment.

In some embodiments of the invention, the source and/or seed for random and/or other audio, actuator or other such masking signal(s) can be electrical components (such as a diode and/or the thermal noise of a resistor). In some embodiments of the invention, such seed/source can be amplified in order to reach a desired level of protection. In some embodiments of the invention, the seed, amplified and/or unamplified, can be filtered and/or sculpted to a more desired noise profile for the audio or other such masking signal (e.g. blue, pink, gray, white and/or other such profile) which can provide desired characteristics for one or more specific purposes, including, but not limited to lower power consumption and/or more effective masking for a similar/related level of protection against certain types of audio information (e.g. human speech and/or other types of audio information) when compared to other profiles. In some embodiments of the invention, less obtrusive and/or noticeable noise profiles can be created by lowering the frequency components/content above certain frequency levels (e.g. varying and/or different frequency levels typically ranging anywhere from between 300 Hz to 3 kHz) when compared to noise profiles that haven't been filtered/sculpted and/or modified for such purposes. In some embodiments of the invention, the seed can be used as the seed for encryption key(s) and/or for generating the encryption key(s) for voice, data, video and/or other types of encryption implemented and/or supported by the privacy/security enclosure itself and/or by the hardware and/or software of device(s) protected by the privacy/security enclosure.

In some embodiments of the invention, a single and/or multiple audio masking signals (random, pseudo-random, deterministic or other) can be used as the source for protection against one or more microphones and/or other sensors. In some embodiments of the invention, separate and/or distinct audio masking signals (random, pseudo-random, deterministic and/or other) can be used as the source for protection against one or more microphones and/or other sensors, including some embodiments where separate, dedicated audio masking signals can exist for each microphone of any device(s) protected by the privacy/security enclosure. In some embodiments of the invention, separate and/or distinct random audio masking signals can be used for each microphone on a device(s) protected by the privacy/security enclosure, reducing the likelihood and/or ability of an authorized and/or unauthorized listener subtracting and/or otherwise using one signal against another in order to extract and/or process and/or otherwise attempt to recover protected audio content. In some embodiments of the invention, the audio masking signal can be a combination of different types of filtered or sculpted noise profiles and/or can be a result of cycling through a variety of different noise signals.

In some embodiments of the invention, the thermal noise of a resistor can be amplified as the seed of a random acoustic noise source. In other embodiments, other electrical components such as diodes could also serve as the base generator. In some embodiments, the naturally broad noise can be filtered or sculpted to a custom "Pink" profile closely matching the spectral content of human voice. For example, FIG. 206 illustrates a frequency profile 20610 of pink noise in accordance with some embodiments of the invention, and FIG. 207 illustrates a frequency profile 20710 of human voice in accordance with some embodiments of the invention. In some embodiments, this method can provide a number of advantages including that the thermal noise is truly random and secure (i.e., it cannot be cracked). Further, the custom pink profile can use the least amount of power to optimally mask voice. Furthermore, in some embodiments, the pink noise can create the least obtrusive masking signal due to its relatively muted components above about 500 Hz.

In some further embodiments, an independent noise generation circuit can be used for each microphone on an enclosed device(s). If only one source was used for multiple microphones, it could be possible to record the noise on a microphone that was less open to the voice signal (or via some other means of recording), and use that noise to cancel the noise detected by another microphone, increasing the likelihood of recovery of protected audio content.

Some embodiments can include speaker(s)/driver(s) with no or reduced rear port(s) or opening(s). In some embodiments, since rear ports are common in speakers/drivers to help tune the fidelity of the speaker/driver, but thus provide a path for external sound to modulate the speaker/driver cone which in turn can couple to the protected microphone(s), serving to reduce masking effectiveness, the privacy/security enclosure can use speakers/drivers with no ports and/or can close, block, seal, reduce, or otherwise obstruct ports in drivers/speakers that have them.

Some further embodiments include one or more apertures (e.g., holes or slots) in the base portion of the case to allow more sound to reach the bottom microphone (or other microphone(s) accessible via such apertures in any other portions of the privacy/security enclosure) such microphone(s) are uncovered. In some embodiments, the apertures can also allow sound from the speaker(s) accessible by such apertures to more effectively be heard. In some embodiments, this can provide the user with a good user experience if they are using their enclosed device(s) in speakerphone mode or with some other function that uses the bottom or other such speaker. As described earlier, the hood assembly can also include a speaker assembly including speaker drivers, driver mounts, and microphone seals. In some embodiments, the shrouds can comprise DuPont™ Delrin® acetal homopolymer resin and the hood housing can comprise aluminum. In some embodiments, the driver mounts can comprise an acrylonitrile butadiene styrene ("ABS") polymer. Some embodiments of the invention include microphone seals comprising a foam material (e.g., such as a polymer foam).

Some embodiments include a cover assembly. In some embodiments, a cover spring can comprise stainless steel. In some embodiments, the cover sleeve can comprise polyethylene. In some embodiments, the environmental seal can comprise an ethylene propylene diene terpolymer, and the cover outer bezel can comprise an ABS-type polymer.

FIGS. 199A-201E illustrate exterior views of a privacy/security enclosure in accordance with some embodiments of the invention. Some embodiments can include various configurations, branding placements, at least one layer forming the exterior of the privacy/security enclosure that can comprise at least one exterior surface material composition, and/or texture or finish.

Figure 200D:
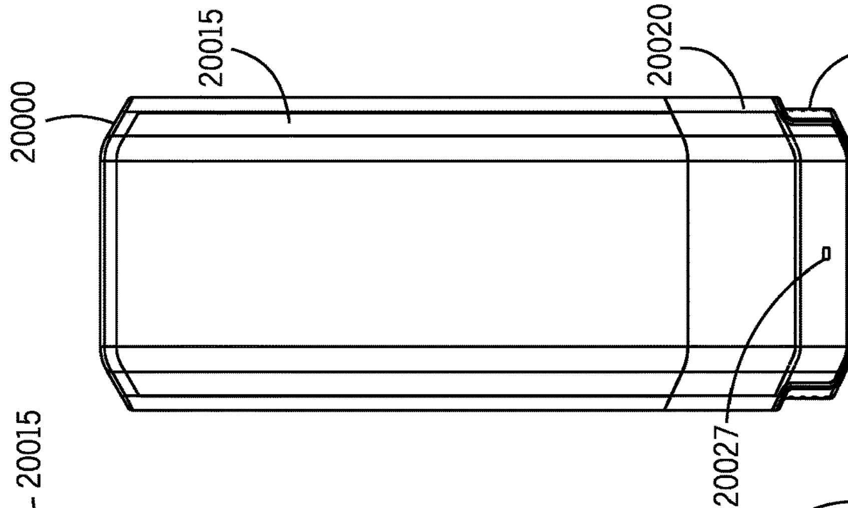
Figure 200C:
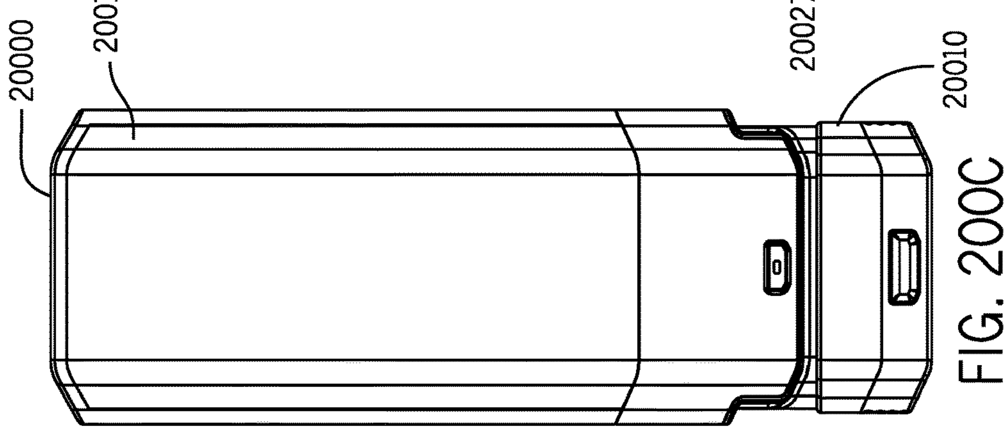
Figure 200B:
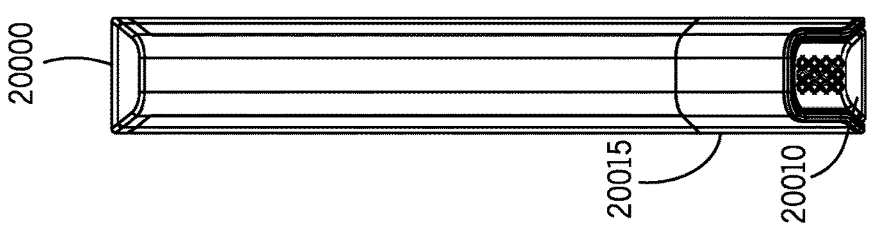
Figure 200A:
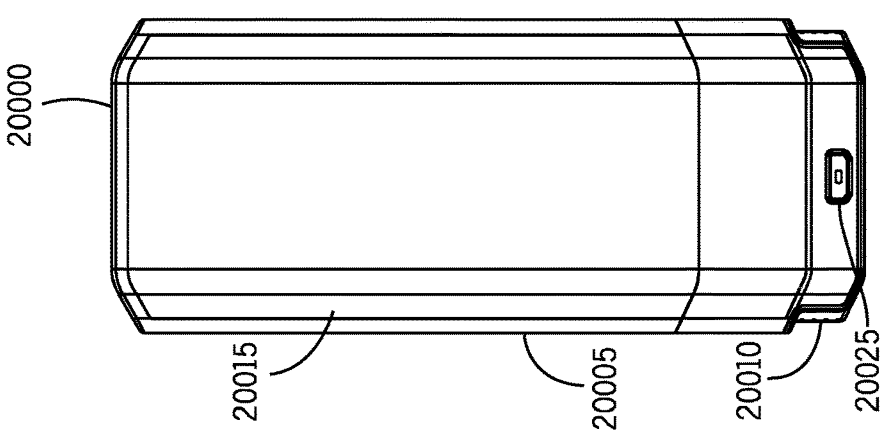

FIGS. 199A-199E illustrates exterior views of a privacy/security enclosure 19900 in accordance with some embodiments of the invention. The privacy/security enclosure 19900 can comprise housing assembly 19905, enclosure 19910, a removable case or cover 19915, base 19920, and hood 19930. Further, FIGS. 200A-200D illustrates exterior views of a privacy/security enclosure 20000 in accordance with some embodiments of the invention. The privacy/security enclosure 19900 can comprise housing assembly 20005, enclosure 20010, a removable case or cover 20015, and base 20020. Referring to FIG. 200A, in some embodiments, the base 20020 can include a pass-through button with hole (shown as 20025) to a main LED. Further, referring to FIG. 200D, on the reverse side of the privacy/security enclosure 20000, the base 20020 can include a hole 20027 to pass through LED indications or other optical information.

Figure 201E:
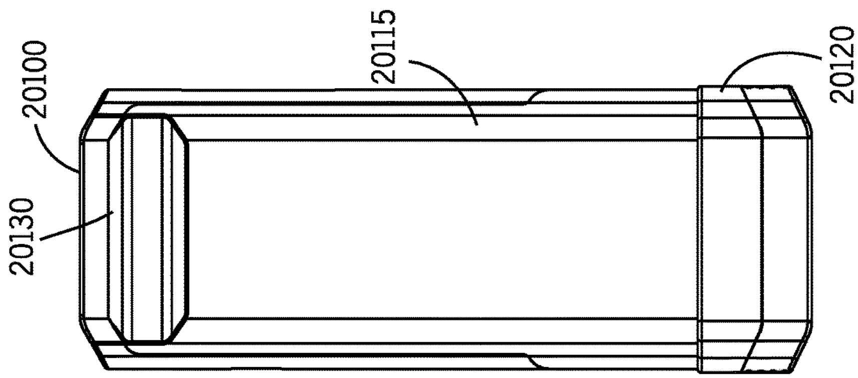
Figure 201D:
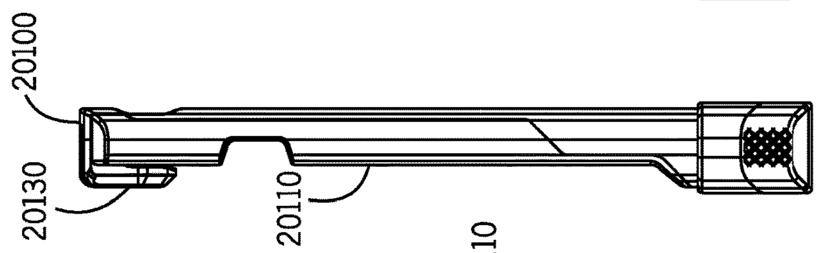
Figure 201C:
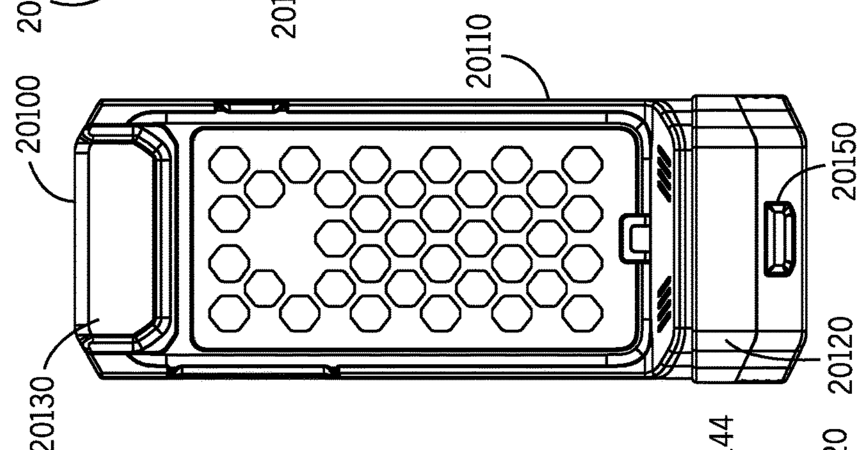
Figure 201B:
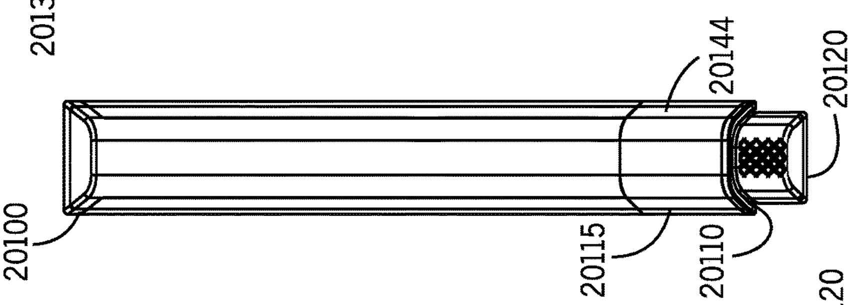
Figure 201A:
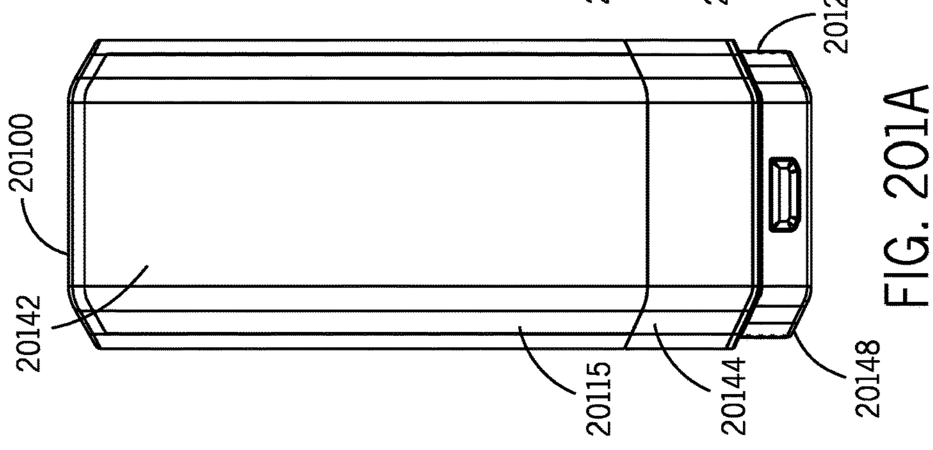

FIGS. 201A-201E illustrates exterior views of a privacy/security enclosure 20100 in accordance with some embodiments of the invention. The privacy/security enclosure 20100 can comprise housing assembly 20105, enclosure 20110, a removable case or cover 20115, base 20120, and hood 20130. FIG. 201A shows a front view, FIG. 201B shows a side view, FIG. 201C shows a front view with case or cover 20115 removed, FIG. 201D shows a side view of the view of FIG. 201C, and FIG. 201D shows a rear view.

In some embodiments, the privacy/security enclosure can comprise a housing assembly that can include at least one logo (e.g., name, entity, and/or company emblems, representations, and/or descriptions), shown as 20142. In some embodiments of the invention, the privacy/security enclosure can include a logo 20142 on any side or face, edge or other portion of the privacy/security enclosure 20100. In some embodiments, the privacy/security enclosure 20100 includes at least one logo 20142 positioned on a moveable portion of the privacy/security enclosure (e.g., such as the hood 20130). In some embodiments, the logos 20142 can be embossed, engraved, pressed, etched, printed, or formed by any suitable conventional method provided they do not compromise the shielding effectiveness of the privacy/security enclosure. In some embodiments, the lower cover 20144 can comprise a different color, material, or texture than the other portion of the case or cover 20115. For example, in some embodiments, the lower cover 20144 can comprise a medium gray anodized bead blast look. Some embodiments include a base trim 20148. In some embodiments, a button and/or LED 20150 can be integrated with the base 20120. In some embodiments, the button and/or LED can comprise a logo 20142.

In some embodiments of the invention, at least a portion of the housing assembly comprises a conductive material. In some embodiments, at least a portion of the outer surface of the housing assembly includes a conductive material. In some embodiments, the conductive material is positioned coupled with a non-conductive portion of the housing assembly. In some embodiments, the housing assembly includes regions of conductive and non-conductive materials that are substantially seamlessly coupled. In some embodiments of the invention, at least a portion of the exterior surface of the housing assembly can comprise an aluminum type surface finish, a brushed finish, a satin finish, an anodized finish, and/or a texturing finish. In some embodiments, the outer surface can comprise at least one of a polymer, metal, or natural material such as wood or leather, or mixtures thereof. In some embodiments, the housing assembly can include at least one exterior trim component forming an exterior surface of the privacy/security enclosure. In some embodiments, the exterior trim can comprise a polymer, metal, wood, leather, or mixtures thereof. In some embodiments, any portion of the exterior can comprise any color or combination of colors. In some embodiments, a portion of the housing assembly can comprise at least one aperture. In some embodiments, the at least one aperture can be aligned with at least a portion of a user interface. In some embodiments, the at least one aperture can be aligned with at least a portion of the privacy/security enclosure comprising an indicator such as an LED.

In some embodiments of the invention, by making the core portion of the privacy case only audio/video protective (and optionally protective for some other sensors), all of the RF protection can be positioned in a separate device and/or enclosure. In some embodiments, this can result in a reduction in the size, weight, and cost of the device. In some embodiments, different sizes of Faraday covers or enclosures can be used to accommodate multiple types and sizes of enclosed device(s) cases (e.g., with some Faraday cases or privacy/security enclosures being capable of handling an Apple® iPhone 6+, a Samsung Galaxy® 6, and other large phone or other device models while a medium case would handle audio/video/other sensor protection enclosures for mid-size or other grouping of phones or other device(s) (e.g. tablets, laptops etc.). Galaxy® is a registered trademark of Samsung Electronics.

In some embodiments of the invention, the privacy/security enclosure can comprise a removable Faraday enclosure. For example, some embodiments include a Faraday enclosure that can be added or removed from the privacy/security enclosure as a separate module. In some embodiments, the Faraday enclosure can comprise of two or more parts that can or may not be physically linked/attached to each other. In some embodiments, the use of one or more compression or other type of RF gaskets can be used to enhance the level of RF attenuation provided by the device.

In some embodiments of the invention, there is no need for RF shielding and/or gasketing for the inner pod (which can provide audio and/or video and/or other sensor protection, but not native RF attenuation/protection.) In some embodiments, such a non-RF protective/privacy case can have a pass-through port to allow access to the headphone jack or other ports of the enclosed device. In some embodiments, both RF and non-RF protective, native or pass-through button and/or switch access to the enclosed device's buttons/switches/controls can be provided. In some embodiments, the Faraday bottom can include passive controls and indicators, and electronics for optional pass-through charging or controlling of the interior device's functions, and/or access/visibility to the interior device's LED's or other such status indicators. Some embodiments include LED pin-hole pass through that can be aligned with passive buttons as described earlier.

FIG. 202A illustrates a privacy/security enclosure 20200 including removable Faraday enclosure 20250 in accordance with some embodiments of the invention. FIG. 202B a removable Faraday enclosure 20250 shown in FIG. 202A in accordance with some embodiments of the invention. As shown in FIGS. 202A-202B, some embodiments include a Faraday top (the housing assembly 20205 including enclosure 20210 and case or cover 20215 comprising a passive shell that can be coupled to a Faraday bottom (the Faraday enclosure 20250). Referring to FIG. 202B, in some embodiments, the Faraday enclosure 20250 can comprise passive controls and indicators 20255 including, but not limited to LED pin-hole pass-through, and one or more passive buttons. Further, FIG. 203 depicts an assembly view of the privacy/security enclosure 20200 including removable Faraday enclosure 20250 in accordance with some embodiments of the invention.

Figure 204A:
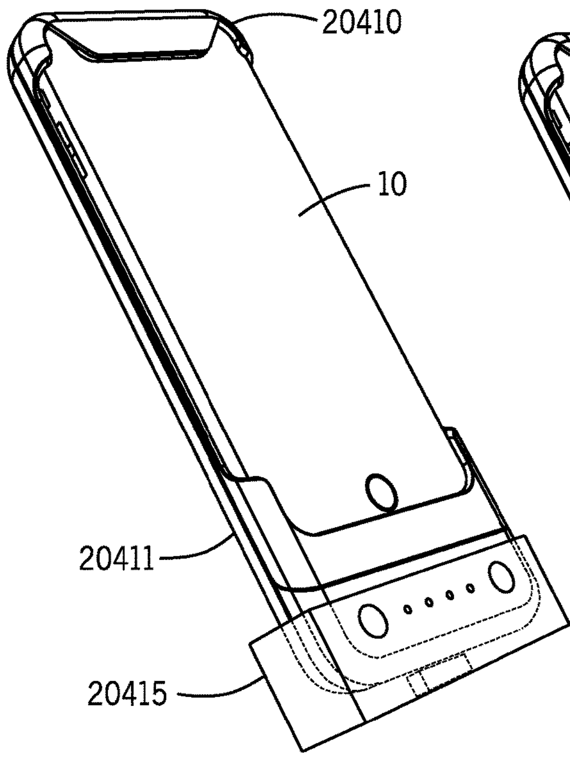
Figure 204B:
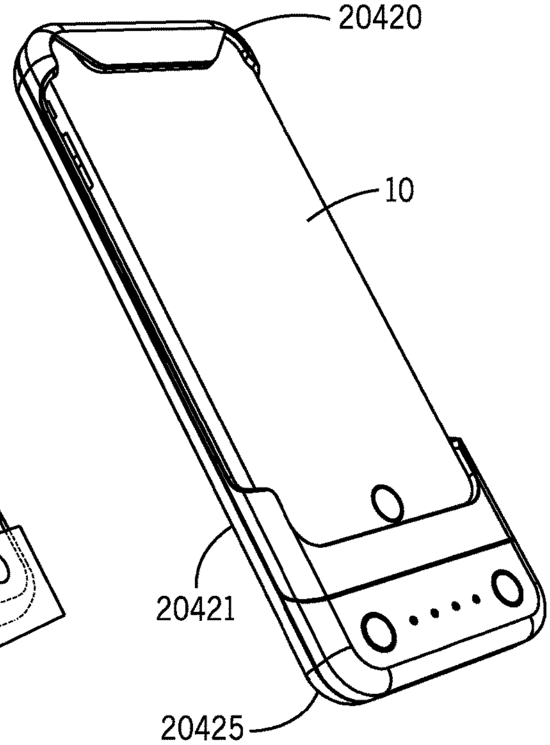
Figure 204C:
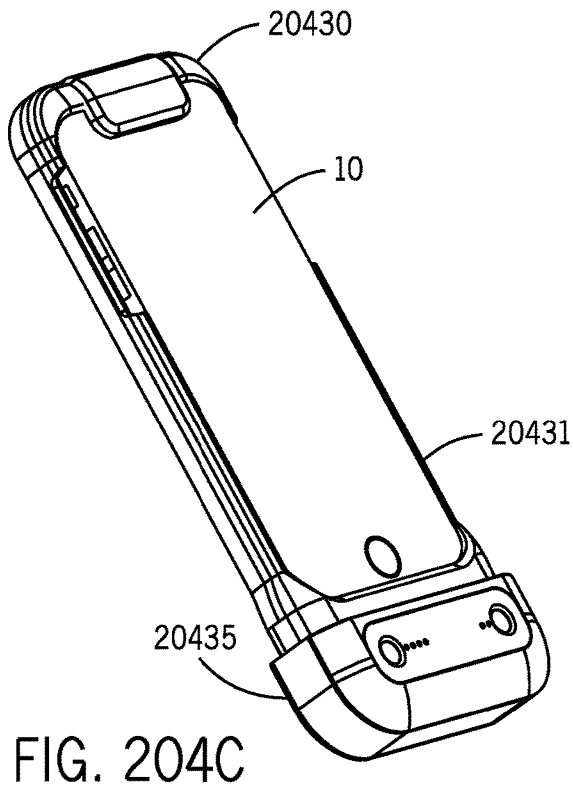
Figure 205A:
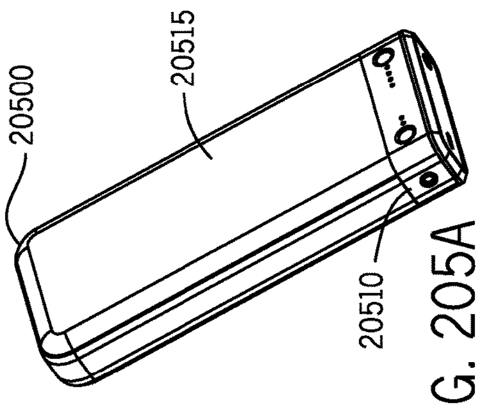
Figure 205B:
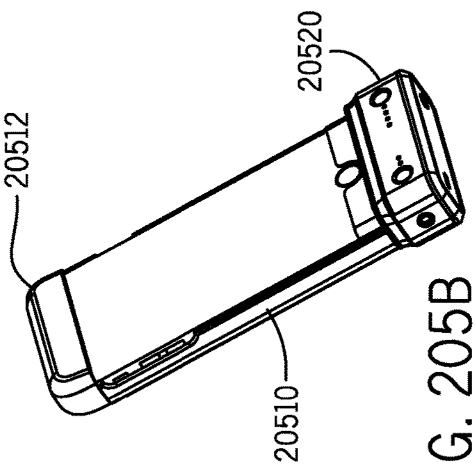
Figure 205C:
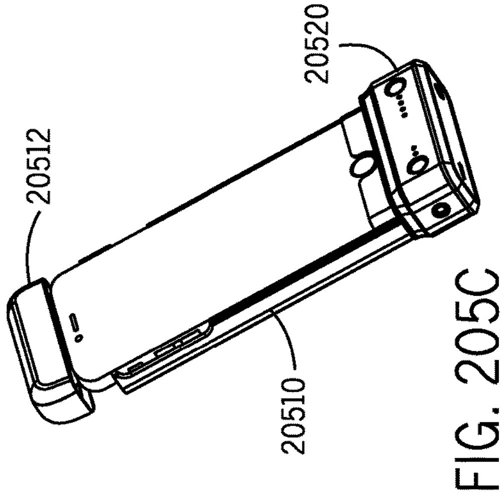
Figure 205D:
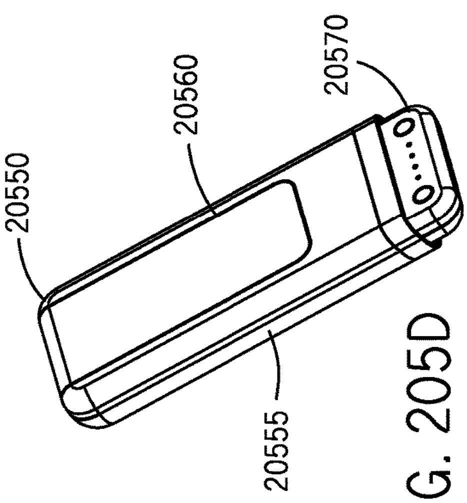
Figure 205E:
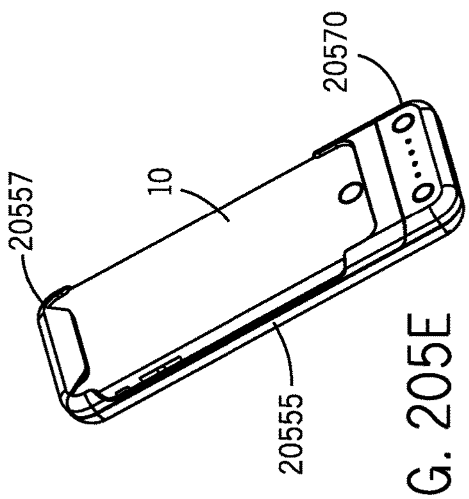
Figure 205F:
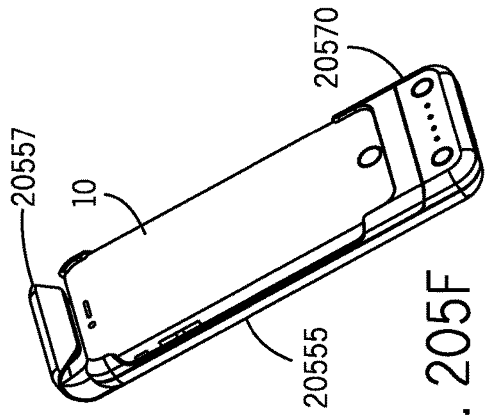

FIGS. 204A-204C, and 205A-205F illustrate a privacy/security enclosures including removable Faraday enclosures and privacy/security enclosures that can be used with removable Faraday enclosures in accordance with some embodiments of the invention. For example, FIG. 204A illustrate a privacy/security enclosure 2410 including a removable Faraday enclosure 20415. Further, FIG. 204B shows a privacy/security enclosure 20420 with enclosure 20421, and base Faraday enclosure 20425. Further, FIG. 204C shows a privacy/security enclosure 20430 including enclosure 20431 with attached base Faraday enclosure 20435. Other alternative embodiments of privacy/security enclosures are shown in FIGS. 205A-205F including privacy/security enclosure 20500 including enclosure 20510 and case or cover 20515, hood 20512 (shown in FIGS. 205B and 205C), and Faraday base 20520. Further, FIGS. 205D-205F shows privacy/security enclosure 20550 including enclosure 20555 and case or cover 20560, and hood 20557 (shown in FIG. 205E in a lowered position, and FIG. 205C in a raised position).

Some embodiments of the invention include charge sharing. Some embodiments include a button or switch that is externally accessible or accessible through an aperture (e.g., by inserting the end of a paper clip) that when actuated can enable a dump charge of the privacy case battery to the user's device. For example, in some embodiments, a fixed percentage (e.g., from about 10% to about 20%) of the charge can be transferred. Some embodiments can also include an emergency override that can transfer substantially all remaining charge from the battery).

Some embodiments of the invention can include hardware and software control features to enable battery conservation. For example, some embodiments include a dim LED mode to indicate protection is active while not being distracting to the user in certain environments (e.g., such as during the night in a bedroom or in a darker environment such as a movie theater, etc.) Further, some embodiments include a bright LED mode to enable uses to know if their device is protected while in bright environments (e.g., such as outside on a sunny day or in some other such brightly lit environment.) Further, some embodiments enable the user cycle between various brightness modes (e.g., bright and dim modes, or other modes). Moreover, some embodiments include a status check feature where the user can either press a button to see a bright LED (for some portion of time) to provide an indication that they are being protected, and where the brightness level subsides to a lower level soon after. In some instances, this can happen by default including at any time after the LED state is changed and/or after audio protection is turned on. For example, if a user wakes up in the morning and wants to change from dim mode to a brighter mode, the user can press the button and the LED goes to 90% power for 10 seconds, then subsides to 25% power (which can be more visible than the dim mode, while not excessively draining the battery and reducing the length of time the privacy case can provide audio protection.

In some embodiments, various components include tamper-proof and/or tamper prevention mechanisms. For example, in some embodiments, portions of any of the housing assemblies and enclosures of any of the privacy/security enclosures illustrated in FIGS. 1-205F can include one or more tamper-proof prevention mechanisms. In some further embodiments, internal components such as PCB assemblies can include tamper prevention mechanisms. In some embodiments, the tamper prevention mechanisms can include one way tabs. In some further embodiments, the tamper prevention mechanism can include a protective layer or material.

In some embodiments of the invention, the privacy/security enclosure can protect against one or more gesture sensors and/or emitters. For example, in some embodiments, the privacy/security enclosure can protect against or reduce the effectiveness of a radar sensor/emitting assembly (e.g., such as a broad beam radar sensor) to measure Doppler image, IQ and spectrogram for use in gesture control of any enclosed device(s).

Some embodiments of the invention can utilize methods to optimize battery performance and longevity. Further, some embodiments can include a battery management profile. For example, some embodiments include a battery management profile that can resist the urge to "fully" charge the battery. In some embodiments, by doing this, the battery capacity fall-off exhibited by LiION cells can be reduced such that the battery can retain its required capacity through more charge cycles. In some embodiments, as disclosed in http://batteryuniversity.com, in terms of longevity, the optimal charge voltage is 3.92 volts per cell. Battery experts believe that this threshold eliminates all voltage-related stresses, and going lower may not gain further benefits but induce other symptoms. Also disclosed is the following table that summarizes the capacity as a function of charge levels. All values are estimated.

TABLE 1 capacity as a function of charge levels (from http://batteryuniversity.com/)

| Charge level (V/cell) | Discharge cycles | Capacity at full charge |
|---|---|---|
| [4.30] | [150-250] | ~[114%] |
| 4.20 | 300-500 | 100% |
| 4.10 | 600-1,000 | ~86% |
| 4.00 | 1,200-2,000 | ~72% |
| 3.92 | 2,400-4,000 | ~58% |

Table 4: Discharge cycles and capacity as a function of charge voltage limit

Every 0.10 V drop below 4.20 V/cell doubles the cycle but holds less capacity. Raising the voltage above 4.20 V/cell would shorten the life. Guideline: Every 70 mV reduction in charge voltage keeps 10% of usable capacity vacant In some embodiments, the any privacy/security enclosure described herein and shown in at least FIGS. 208-265B herein can be mounted or attached to a user's device. In some embodiments, the user's device can comprise a display device such as a computer monitor or display, a smart display or television, or other audio-visual device. The user's device can also include an integrated display and computer. For example, in some embodiments, the display can include components of a computer so that the display functions as a computer. As used herein, the "display", "display device", or "display monitor" can include example embodiments where the display is coupled to a computer and/or integrated with a computer. The user can position the privacy/security enclosure at least partially based on the structure of the user's device, and any structures, components, or devices that a user wishes to cover or otherwise make privatize (i.e., to privatize). As used herein, the terms privatize or make private are intended to describe making substantially completely private or at least partially private. In some embodiments of the invention, the privacy/security enclosure can be used to privatize a computer or display device that includes a camera and/or microphone. The user can modify the position of the privacy/security enclosure based on the location of the number and location of the structures, components, or devices that a user wishes to privatize.

In some embodiments, any privacy/security enclosure described herein and shown in at least FIGS. 208-265B can include a portion or section that can be moved by sliding, raising or lowering, pivoting or rotating, or flipping with respect to another portion or section of the privacy/security enclosure to adjust the level of privacy of the device. In some embodiments, the privacy level of the privacy/security enclosure can be changed by sliding, raising or lowering, pivoting or rotating, or flipping at least a portion of the privacy/security enclosure with respect to another portion of the privacy/security enclosure. For example, in some embodiments, by sliding, raising or lowering, pivoting or rotating, or flipping a portion or section of the privacy/security enclosure, at least one sensor (such as a camera and/or microphone) can be uncovered and revealed. In some embodiments, the sliding, raising or lowering, pivoting or rotating, or flipping can be enabled by one or more slides, hinges, grooves, tracks, springs, and/or other conventional mechanisms. For example, in some embodiments, the privacy/security enclosure can comprise at least one portion that can be coupled to another portion by at least one hinge. In some embodiments, the privacy level of the privacy/security enclosure can be changed by pivoting or rotating at least a portion of the privacy/security enclosure with respect to another portion of the privacy/security enclosure using the at least one hinge.

In some embodiments, in a slide-closed position, any privacy/security enclosure described herein and shown in at least FIGS. 208-265B can privatize the underlying device. In some embodiments, the privacy level of the privacy/security enclosure can be changed by sliding at least a portion of the privacy/security enclosure with respect to another portion of the privacy/security enclosure. For example, in some embodiments, by sliding a portion or section of the privacy/security enclosure, as the slidable portion or section of the privacy/security enclosure is slid away from an underlying aperture of a fixed portion of the privacy/security enclosure, the interior of the privacy/security enclosure can be revealed to a user, and potentially at least one sensor (such as a camera and/or microphone) can be uncovered and revealed. In some embodiments, the sliding can be enabled by one or more guides or tracks. As described earlier in some other embodiments, the interior of the privacy/security enclosure can be color-coded to alert a user to a security threat that might be posed when the privacy/security enclosure is at least partially slid open. In some embodiments, the user can use the slidable portion or section of the privacy/security enclosure to uncover one sensor versus the other (for example when a user prefers to use their computer's microphone to dial into a conference call, but not participate in a video portion. Alternatively, in other circumstances, the user may want to use their video display to show something to other people during a teleconference call, but they may have dialed into the conference call on a land line, and prefer not to use the computer's microphone. In other circumstances, the user may want all sensors to be uncovered (e.g., during a FaceTime® or Skype® call on a computer where both the camera and microphone will be used simultaneously). FaceTime® is a registered trademark of Apple, Inc. SKYPE®, is a registered trademark of Microsoft Corporation.

In some embodiments, the interior of any privacy/security enclosure described herein and shown in at least FIGS. 208-265B can be color-coded to alert a user to a security threat that might be posed when the privacy/security enclosure is at least partially open. For example, in some embodiments, the interior can be colored red. In other embodiments, the interior can be colored yellow, blue, or magenta. In some embodiments, the interior can include switchable illumination to alert the user to at least partial lack of privacy.

Referring to FIG. 208, illustrating a front view of a computer or display monitor, in some embodiments, a mounted privacy/security enclosure 20800 can be coupled to the computer or display monitor (shown as user's device 11). In some embodiments, the privacy/security enclosure can be mounted to any portion of the user's device 11. For example, in some embodiments, a user can position the privacy/security enclosure 20800 shown in FIG. 208 to any portion of the computer or display monitor shown in this example embodiment. In some embodiments, the user can use the privacy/security enclosure 20800 to cover more than one portion, component or device of the user's device 11. In some further embodiments, the user can use more than one privacy/security enclosure 20800 to privatize the user's device 11.

In some embodiments of the invention, the privacy/security enclosure 20800 can be optionally configured to increase or reduce a level of privacy of a user's device 11. In some embodiments, this can be accomplished simply by positioning or repositioning the privacy/security enclosure 20800. In other embodiments, this can be accomplished by moving and/or adjusting a portion of the privacy/security enclosure 20800. For example, in some embodiments, the privacy/security enclosure 20800 can comprise a main housing 20810 including a movable portion, section, or hood 20850, and a couple or integrated moveable portion, section, window, door or shutter (shown as 20820). In some embodiments, a privacy/security enclosure including a main housing 20810 and hood 20850 can be coupled to a computer and/or display. The main housing 20810 can remain stationary during operation, and the hood 20850 can move relative to the computer and/or display in order to seal and un-seal against the microphones of the user's device. For example, FIG. 209 illustrates a close up view of the privacy/security enclosure 20800 of FIG. 208 in accordance with some embodiments of the invention. In some embodiments, the hood 20850 of the privacy/security enclosure 20800 can be moved with respect to another portion or section of the privacy/security enclosure 20800 (e.g., with respect to the main housing 20810 or other coupled component) to adjust the coverage (and therefore the privacy level) of the privacy/security enclosure 20800 mounted or coupled to the user's device 11 (e.g., a computer or display monitor as shown in the example embodiment of FIG. 208.) In some embodiments, the privacy/security enclosure 20800 can also be used with other user devices such as laptops, tablets and devices that contain cameras, microphones or other such sensors.

In some embodiments, the level of privatization can be partial in that some components or devices of the user's device 11 can remain non-private and others are private. For example, in some embodiments, a hood 20850 of the privacy/security enclosure 20800 can be moved with respect to another portion or section of the privacy/security enclosure to cover and make private a webcam but leave open a microphone. For example, example, FIG. 210 illustrates a close up front perspective view of a privacy/security enclosure 20800 in a covered and protected configuration 20802 in accordance with some embodiments of the invention. In the configuration 20802, the hood 20850 is lowered into the main housing 20810. Conversely, FIG. 211 illustrates a close up front perspective view of a privacy/security enclosure 20800 in an uncovered and unprotected configuration 20804 in accordance with some embodiments of the invention. This example embodiment shows the hood 20850 in a raised position.

In some embodiments, the main housing 20810 can contain one or more PCBs, electronics components, and at least one battery such as a Li-Ion battery for at least partially powering the privacy/security enclosure, one or more springs, and one or more latches, etc. In some embodiments, the user's device can be attached by snapping it into the mounting plate. In some embodiments, the mounting plate includes a release lever that can allow the device to be removed from the mounting plate. In some embodiments, this lever can also act as a spring to hold the device in place when it is attached.

In some embodiments of the invention, the hood 20850 can contain at least one sealing mechanism, one or more PCBs, and/or one or more LEDs, etc. In some embodiments, the hood 20850 can be positioned in two positions (e.g., down and up). In some embodiments, when the hood 20850 is down, it can be fully seated into the main housing 20810, and any rubber seals can be in contact with the areas around the microphones to provide audio sealing. In some embodiments, when the hood 20850 is up, the seals may not be in contact with the computer and/or display, and hence the microphones can provide audio functionality.

In some embodiments, the hood 20850 or other moveable and/or upper portion can include a texture or pattern. In other embodiments, other portions of the main housing 20810 can include a texture or pattern. In some further embodiments, the hood 20850 or other movable upper portion can include an outer surface comprising a glossy surface. In some embodiments, other portions of the main housing 20810 can include a glossy outer surface. In some other embodiments, the movable upper portion can include an outer surface comprising a matte surface. In some embodiments, other portions of the main housing 20810 can include a matte outer surface.

Some embodiments include one or more mechanisms for moving and/or closing portions of the privacy/security enclosure (e.g., a lower portion or base portion and an upper portion or lid or hood 20850). For example, in some embodiments, when a user applies a force to the lid or hood 20850, the privacy/security enclosure 20810 can be closed. In some embodiments, by pulling on the lid or hood 20850, the privacy/security enclosure 20810 can be opened. In other embodiments, the user can push a closed lid or hood 20850 to open or release it from the main housing 20810. In some other embodiments, the user can push the hood 20850 down to lower it, and can push a button to raise the hood 20850 (uncovering one or more microphones). In some embodiments, the button can be on the top of the privacy/security enclosure, the front of the privacy/security enclosure, or somewhere else on the device.

In some embodiments of the invention, the mechanisms that provide protection, including protections against audio, video, and/or other sensors (i.e. gyroscope, accelerometers and/or any other sensor that is part of the enclosed/protected device(s) etc.) can be integrated into the core structure of the privacy/security enclosure (i.e. not require the described hood 20850 mechanism). In some embodiments, such mechanisms can be activated/deactivated with a slide, button, switch and/or other such physical and/or electro-mechanical feature, which feature can activate/deactivate the protection for zero, one or more microphone(s), camera(s) or other sensors for the enclosed device(s) in a single action/motion/interaction, while in other embodiments of the invention, such a feature can require two or more actions/motions/interactions (i.e. button press, switch slide, etc.).

Some embodiments include one or more springs to help raise the hood 20850 up from the down position. Different types of springs with different spring rates and different dampening mechanisms can be used to give varying levels of tension and different mechanical feedback to the user for raising and lowering the hood 20850. In some embodiments, different types of material can also be used to change the sound the user hears when the hood 20850 raises or lowers. In some other embodiments, the privacy/security enclosure can include at least one latch that can be used to couple with the hood 20850 as it is lowered to the base. In some embodiments, a catch mechanism can be used with the latch. In some embodiments, the latch can be released from the catch using a release button. An embodiment including a latch is discussed further below in relation to FIG. 217C.

In some embodiments, the hood 20850 can include a push-pull action to open and close the hood 20850 with the main housing 20810. For example, in some embodiments, the hood 20850 can be pushed down by the user to translate one or more seal mechanisms from the open unsealed state to the closed sealed state. Further, in some embodiments, one or more internal latches can retain the hood 20850 in the closed position to maintain pressure on the seals. Some embodiments include internal rods that are mounted in the stationary main housing 20810, and guides in the hood 20850 couple with the rods to enable the rods to slide smoothly in the correct positions. In some embodiments, dual, triple or quadruple rods and corresponding guides can be used.

In some embodiments, the hood 20850 can be pulled up by the user to release the seals and move the hood 20850 to the open position. In some further embodiments, the retaining latch can be overpowered by the force of the user pulling up, and the hood 20850 can be moved until it reaches a peak position. In some embodiments, when released from the user's finger or hand, the hood 20850 can be maintained in the upright position by the retaining latch. Some further embodiments include the addition of at least one spring to provide a spring-assisted motion to the hood 20850.

In some embodiments of the invention, the user can perform a similar action to close the hood 20850 (i.e., by pushing down on the hood 20850). In some embodiments, one or more conventional internal latches can be installed. In some embodiments, the latch can couple onto the hood 20850, and when the full distance of the stroke is achieved, the user can release the hood 20850, and the hood 20850 can be retained in the sealed position. In some embodiments, the latch can require an over travel of about 1-2 millimeters. In this instance, after reaching the fully depressed position and being released, the latch can allow the hood 20850 to return a couple of millimeters on the upward stroke before the mechanical lock can fully engage into a final position.

In some embodiments, in order to release the hood 20850 to the upright position, the user can again push down on the hood 20850 from the top. This movement actuates the latch and releases the hood 20850, and the hood 20850 can then move upward into a fully open position. In some embodiments, the system can be spring loaded to provide an upward spring force on the hood 20850, driving the hood 20850 into the upright open position when it is released.

In some embodiments of the invention, the hood 20850 can be pushed down from the top to mechanically latch in place in a final sealed position. In some embodiments, an internal custom-made latch can be positioned in the main housing 20810 to retain the hood 20850. In some embodiments, over-travel is not required in this system. In some embodiments, in order to release the hood 20850, a push-button can be positioned on the front of the device. In some embodiments, a user can push this button move the latch from the retaining feature and spring loaded hood 20850 lifts to an open position. In some embodiments, the release of the latch can be actuated from a button on the side, or front, or back, or top of the device. In some embodiments, a lever or pull-button, or other conventional actuator can be used in place of the button.

In some embodiments, the hood 20850 can be moved using an electronic and/or electro-mechanical assembly. For example, in some embodiments, the hood 20850 can be translated using a solenoid or small motor. In some embodiments, these systems can involve the user pushing a button (on the device, or remote to the device, either tethered or wireless) that can actuate the motor/solenoid. This would translate the hood 20850 from the open to the closed position, or vice-versa. The button could be protected with an additional security layer, such as a PIN entry keypad, or fingerprint sensor, or other.

In some embodiments, the privacy/security enclosure 20800 can utilize various sub-assemblies and components that attach to and/or mechanically interact with the computer and/or display. For example, some embodiments of the invention include one or more mounting plates. For example, some embodiments include a molded plastic plate that can be aligned relative to the top, rear and/or other such microphones on the computer and/or display, and can be attached to the rear surface with an adhesive tape. Some embodiments include a v-notch in the center of the top portion of the plate that indicates where a specific microphone should be in relation to the plate. Some further embodiments include one or more upper alignment tabs (e.g., one on each side) of the mounting plate that can hang over the top edge of the computer and/or display to position the mounting plate vertically on the computer and/or display. Further, some embodiments include various features, detents, holes, etc., on the mounting plate that interact with the sealing mechanisms of the device. Some embodiments include a plurality of tabs on the mounting plate that act as features to guide and retain the device when it is mounted to the mounting plate. In some further embodiments, an adhesive foam tape can be positioned under the mounting plate to enable a mechanical attachment to the computer and/or display, while proving a substantially sealed audio coupling between the housing of the computer and/or display and the mounting plate. Substantially sealed as used herein means providing a seal sufficient to enable the privacy/security enclosure to minimize and/or reduce eavesdropping or the effectiveness of eavesdropping on or listening to communications. Gaskets can also be used to help improve the sealing characteristics as well.

Embodiments of the invention include various sealing element geometries (e.g., flat, conical, round, o-ring, molded, etc.), and with various durometer values, and within various rubber materials (EPDM, polyurethane, etc.) In some embodiments, the sealing element can be attached to the computer and/or display with adhesive tape. In other embodiments, the sealing element can be attached to the hood 20850, and configured to couple to the computer and/or display when translated up and/or down. Perfect seals are impossible to create in these applications, of course, but seals suitable for the purposes of these embodiments are readily created using the disclosed structures. Accordingly, the term "seal" as used herein is not limited to a complete or perfect seal, but instead a seal that is sufficient to provide desired reduction or attenuation.

In some embodiments of the invention, the hood 20850 can house or integrate one or more speakers and PCB with the noise generators, an LED "on" light, and other electronic components. In some embodiments, each of the speakers can be embedded in a molded sealing element that can act to partially seal out ambient noise from the speaker chamber. In some embodiments, when this sealing element is an intimate contact with the computer and/or display and/or the mounting plate, the speaker can partially isolated from the ambient noise, and a small column of air can be trapped between the microphone and the speaker. In this instance, when the speakers are turned on, the microphones can primarily sense the noise that is being generated by the device. In some embodiments, the sealing element, the sealing surface on the mounting plate, the seal between the mounting plate and the computer and/or display, and the locking force provided by the retaining features/latches/spring of the system can be factors in providing an adequate seal to the microphones.

In some embodiments of the invention, the upper microphone sealing mechanism can operate by applying downward force from the hood 20850, through the sealing element, to the surface of the computer and/or display around the top microphone. In some embodiments, the compression force can be retained by the internal latch of the system.

Some embodiments of the invention include a lever seal. For example, some embodiments include a spring loaded lever that would normally pull the sealing element of the rear speaker to an upright, or open position. In some embodiments, when the hood 20850 is closed, the lever can be rotated into the closed position to provide the sealing force on the sealing element, where the lever or something coupled to the lever contacts a feature of the mounting plate as it reaches the sealing position. In some embodiments, the spring force, the lever geometry and actuating feature geometry can function together to provide the timing and effectiveness of the seal. Further, in some embodiments, the system can be reversed, so that the lever can be spring loaded to be normally closed, and an actuating feature on the mounting plate can move the lever as the hood 20850 is raised to the open position.

Some embodiments include a piston seal. In some embodiments, a spring loaded carrier can house the sealing element. In some embodiments, the spring loaded mechanism can force the sealing element down normal to the mounting plate. In some embodiments, the carrier can include multiple contact pins that serve to space the sealing element at a distance from the mounting plate. In some embodiments, this can ensure that when the hood 20850 is anywhere other than the final sealing location, the pins can lift the sealing element up off the mounting plate, and thus the microphones can offer normal functionality. In some embodiments, there are detent features in the mounting plate corresponding to the pins that allow the carrier to move down into the final sealed position when the hood 20850 is in the closed position. Therefore, in some embodiments, the rear sealing element can be in intimate contact with the mounting plate in the closed position, and the rear microphone can sealed from ambient noise.

Some further embodiments include one or more sealing paths to various sensors on the protected device in order to enhance or improve the effectiveness, efficiency and/or usability of protection. In some embodiments, the sealed or partially sealed path/channel from sound generators (e.g. speakers or drivers) can increase the amount of acoustical energy reaching the microphone(s) of the protected devices, reducing power requirements and/or allowing the use of smaller and/or less powerful drivers/speakers when compared to the acoustical power that would be required to deliver an equivalent level of protection in an open or non-sealed/non partially sealed environment. In some embodiments, the sealed or partially sealed path/channel from sound generators (e.g. speakers or drivers) can reduce and/or attenuate the amount of masking signal(s) reaching outside of the path/channel, thereby reducing the detectability and/or obtrusiveness of such signal to the outside environment. In some embodiments, the sealed or partially sealed path/channel from sound generators (e.g. speakers or drivers) can reduce and/or attenuate outside signals/sounds reaching the protected device(s) microphone(s) and/or sensors, providing some level of protection and/or also reducing the level of masking signal(s) required to deliver an equivalent level of protection in an open or non-sealed/non partially sealed environment.

In some embodiments of the invention, the source and/or seed for random audio masking signal(s) can be electrical components such as a diode and/or the thermal noise of a resistor. In some embodiments of the invention, such random noise seed/source can be amplified in order to reach a desired level of protection. In some embodiments of the invention, the noise seed, amplified and/or unamplified, can be filtered and/or sculpted to a more desired noise profile for the audio masking signal (e.g. blue, pink, gray, white and/or other such profile) which can provide desired characteristics for one or more specific purposes, including, but not limited to lower power consumption and/or more effective masking for a similar/related level of protection against certain types of audio information (e.g. human speech and/or other types of audio information) when compared to other noise profiles. In some embodiments of the invention, less obtrusive and/or noticeable noise profiles can be created by lowering the frequency components/content above certain frequency levels (e.g. varying and/or different frequency levels typically ranging anywhere from between 300 Hz to 3 kHz) when compared to noise profiles that haven't been filtered/sculpted and/or modified for such purposes. In some embodiments of the invention, the random seed can be used as the seed for being and/or generating encryption keys for voice, data, video and/or other types of encryption implemented or supported by the privacy/security enclosure itself and/or the hardware and/or software of device(s) protected by the privacy/security enclosure.

In some embodiments of the invention, a single and/or multiple audio masking signals (random, pseudo-random, deterministic or other) can be used as the source for protection against one or more microphones and/or other sensors. In some embodiments of the invention, separate and/or distinct audio masking signals (random, pseudo-random, deterministic and/or other) can be used as the source for protection against one or more microphones and/or other sensors, including some embodiments where separate, dedicated audio masking signals can exist for each microphone of any device(s) protected by the privacy/security enclosure. In some embodiments of the invention, separate and/or distinct random audio masking signals can be used for each for each microphone on a device(s) protected by the privacy/security enclosure, reducing the likelihood and/or ability of an authorized and/or unauthorized listener from subtracting and/or otherwise using one signal against another in order to extract and/or process and/or otherwise attempt to recover protected audio content. In some embodiments of the invention, the audio masking signal(s) can be a combination of different types of filtered/sculpted noise profiles or they can be a result from cycling through a variety of different noise signals.

In some embodiments of the invention, the volume and/or power level of some and/or all audio masking signals can be varied, with resulting effects such as the increase and/or decrease in the level of audio masking effectiveness in masking signal detectability, etc. In some embodiments of the invention, the variation in audio masking signal power can be performed without user interaction/input while in other embodiments of the invention the user can control such variation with buttons, knobs, dials, sliders, software and/or other user input/output/interaction mechanisms.

In some embodiments of the invention, the hood 20850 and/or the main housing 20810 can contain a sensor system (such as a sensor coupled to a controller) that interacts to determine if the hood 20850 is at least partially open or in a sealed position. For example, in some embodiments, a magnet can be attached to the main housing 20810, and a Hall-effect sensor can be coupled to the hood 20850. In some embodiments of the invention, when the hood 20850 is closed, the magnet can be sensed by the Hall-effect sensor, and the system can determine that the hood 20850 is in the closed position. In some embodiments, this event can cause the system to turn on or off and/or activate and/or deactivate the noise speaker(s). In some embodiments, when the hood 20850 moves from the closed position, the system (using the Hall-effect sensor) can sense the absence of the magnet, and the system can turn off. In some embodiments, this can be done with a reed sensor in place of a Hall-effect sensor, or with a mechanical switch actuated when the hood 20850 moves. In some embodiments, by sensing when the hood 20850 is in the closed position, the user interface can be simplified because there is no "on-off" switch. Moreover, it ensures that the system is turned on when the hood 20850 is in position, so the user is prevented from forgetting to turn the audio masking on.

In some embodiments, the privacy/security enclosure can include an alternative hood 20850 sensor that allows to the user to determine when the hood 20850 is in the raised versus lowered position. In some embodiments, the hood sensor can be used by a control system to automatically turn off any current audio masking signal when the hood 20850 is raised, and automatically turn the signal back on when the hood 20850 is lowered).

In some embodiments of the invention, the hood 20850 can provide enhanced audio when it is raised. For example, in some embodiments, any cavities created when the hood 20850 is raised can be shaped or curved to modify and/or enhance the amount and/or quality of sound that reaches the microphone(s) when the hood 20850 is raised. In some embodiments, well-known sound enhancing shapes can be provided in the hood 20850. In some embodiments of the invention, where multiple cavities are created when the hood 20850 or other portion of the invention is moved, the creation and/or shape of the cavities can be used to enhance noise reduction/cancellation and/or echo cancellation technologies using the various uncovered microphones.

In some embodiments of the invention, the privacy/security enclosure can include one or more gesture sensors and/or emitters. For example, in some embodiments, the privacy/security enclosure can include a radar sensor/emitting assembly (e.g., such as a broad beam radar sensor) to measure Doppler image, IQ and spectrogram for use in gesture control of the privacy/security enclosure and/or any user device contained within the privacy/security enclosure.

FIGS. 212A-212C illustrate an internal architecture view of a privacy/security enclosure 21200 in accordance with some embodiments of the invention. In some embodiments, the privacy/security enclosure 21200 and other example embodiments including privacy/security enclosures shown in FIGS. 213A-265B can include any of the features and functions described above, including those described for privacy/security enclosure 20800 in the preceding paragraphs. In some embodiments of the invention, the privacy/security enclosure 21200 can include a main housing 21210 enclosing various operation components of the privacy/security enclosure. In some embodiments, the privacy/security enclosure 21200 can comprise a main housing 21210 and a moveable hood 21250. In some embodiments, the privacy/security enclosure 21200 can include a webcam 21220. In other embodiments, the privacy/security enclosure 21200 can include an aperture providing adjustable access to a webcam of a user's device 11. In some embodiments, the privacy/security enclosure 21200 can include at least one PCB and electronics component 21230, at least one battery (such as battery 21235 comprising a 450 mAh Li-ion battery, and a battery 21240 such as a 600 mAh Li-ion battery) for at least partially powering the privacy/security enclosure. In some embodiments, the main housing 21210 can include at least one movable portion (e.g., hood 21250) for covering a component or device such as a webcam and/or a microphone. Further, in some embodiments, the privacy/security enclosure 21200 can include integrated speakers 21245 configured to emit sound. In some further embodiments, the privacy/security enclosure 21200 can include integrated microphones 21248 configured to sense sound.

FIGS. 213A-213B illustrate front and rear perspective views of a privacy/security enclosure 21300 in accordance with some embodiments of the invention. In some embodiments, the privacy/security enclosure 21300 can comprise at least one universal mount 21318 for coupling the privacy/security enclosure to a user device. In some embodiments, the at least one universal mount 21318 can comprise a VHB mount clip, slide on, snap-on, and/or a magnetic mount. In some other embodiments, the privacy/security enclosure can include a custom mount specific to one or more computers or computer displays. For example, some embodiments include one or more custom components for coupling to various surfaces or edges of the computer or computer display.

In some embodiments, the privacy/security enclosure 21300 can comprise a main housing 21310 that comprises or includes the at least one universal mount 21318. Further, the main housing 21310 can include a coupled camera shutter 21320 and a camera shutter button 21325 for operating the camera shutter 21320. The privacy/security enclosure 21300 can also include at least one visual indicator of operation such as one or more LED indicators 21330, along with an LED dimmer button 21335. The hood 21350 can comprise a microphone seal 21340 that can be used to seal with the inner region 21342 of the main housing 21310. Further, in some embodiments, the hood 21350 can be operational to form a microphone seal engagement using finger grip, button release and push-down, and/or pen style push and release. Data, power, or other connectivity can be accomplished through cable management 21345 (e.g. a USB cable management).

Some further embodiments can include alternative embodiments of cable management. For example, in some embodiments, the privacy/security enclosure can include USB cable management comprising magnetic control management, and/or color coded management, and/or at least one visual cue. FIGS. 265A-265B illustrate rear perspective views of computer or display mounted privacy/security enclosure 26500 including hood 26550 with cable management 26570 in accordance with some embodiments of the invention. In some embodiments, cable power and/or communication cables can be routed away from the privacy/security enclosure to a USB and/or power connection in various adjustable directions using a wire routing coupler(s) coupled to the computer or display.

In some embodiments, some portion of the privacy/security enclosure can include an alignment marking or notch. In some embodiments, the marking or notch can assist the user to position the cover or mount to a specific location. Some embodiments can also include an aperture that can be aligned with and/or placed over one or more microphones of the device (e.g., such as a top and/or rear facing microphone).

In some further embodiments, the privacy/security enclosure can include one or more mounting tabs that can be used for attachment to a computer and/or display. Some embodiments can include moveable release mechanisms to enable attachment or release of the privacy/security enclosure. In some embodiments, the mounting bracket or feature can include mechanical structures and/or mating, sealing and/or other such materials that aid in the creation of a sealed path/channel between any speaker(s) of the privacy/security enclosure and microphone(s) of the protected device(s).

In some embodiments, the privacy/security enclosure can include at least one microphone seal. Some embodiments include a microphone seal that comprises a vertical slide. In some further embodiments, the microphone seal can comprise a flip, pivot, or rotating seal that can flip, pivot, or rotate from the main body of the privacy/security enclosure to provide effective sealing that is durable over a larger number of sealing and unsealing cycles than many conventional sliding seals.

In some embodiments, engagement of the microphone seal can be accomplished using a finger grip. In some further embodiments, a user can engage the microphone seal using a button release and combined push down. Some further embodiments can comprise a pen-style push and release (e.g., such a conventional spring-loaded push down and release mechanism used in a conventional pen).

Some embodiments include LED indicators. Some embodiments can include one or more logos and/or brand images, including logos and/or brand images that comprise LED indicators. Some embodiments include a light pipe as at least a portion of an indicator. In some embodiments, the privacy/security enclosure can include a light pipe to allow ambient light through the privacy/security enclosure so that the automated screen brightness function of the enclosed user device (if it has one) continues to function even though at least a portion of the privacy/security enclosure is at least partially covering the user's device. In some embodiments, the privacy/security enclosure can comprise an LED dimmer button. In some embodiments, the button can comprise a capacitive touch button, a round button, or a square button.

As described earlier, in some embodiments, the privacy/security enclosure can be configurable or reconfigurable to adjust the level of privacy. In some embodiments, the privacy/security enclosure can include a removable portion or section that can be added or removed with respect to another portion or section of the privacy/security enclosure to adjust the level of privacy of the device. In some other embodiments, the privacy/security enclosure can include a movable portion or section that can be moved with respect to another portion or section of the privacy/security enclosure to adjust the level of privacy of the device.

Some embodiments of the invention can comprise at least one surface provided with an adhesive (e.g., such as an adhesive tape) to couple the privacy/security enclosure to a surface of the user's device. In some embodiments, other conventional attachment mechanisms can be used including, but not limited to clips, guides or sliders, snap-on mounts, magnetic mounts, and Velcro® mounts. For example, in some embodiments, the privacy/security enclosure can be coupled to a computer and/or display using double-sided adhesive. FIG. 214 depicts a reconfiguration of a mounted privacy/security enclosure and includes an adhesively mounted portion 21420. The privacy/security enclosure 21400 can comprise a main housing 21410 that can be attached to the mounting portion 21420 (e.g., using adhesive 21425). Once mounted, the privacy/security enclosure 21400 can be move, slid, repositioned on the mounted portion 21420. Further, the privacy/security enclosure 21400 can be positioned on the mounted portion 21420 to align the aperture 21415 with the hood 21450. Power and/or data can be fed and/or managed through cable management 21430.

In some embodiments, the privacy level of the privacy/security enclosure 21400 can be modified by sliding the slidable main housing 21410 so that the aperture 21452 of the main housing 21400 and aperture 21415 at least partially overlap. In other embodiments, the privacy level of the privacy/security enclosure 21400 can be increased by sliding the slidable main housing 21410 so that the aperture 21452 of the main housing 21410 and aperture 21415 do not overlap.

FIG. 215 depicts a reconfiguration of a mounted privacy/security enclosure in accordance with another embodiment of the invention. The privacy/security enclosure 21500 includes main housing 21510, and a mounting portion 21520 with aperture 21515. Using the adhesive 21525, the mounting portion 21520 can be coupled to the user's device 11. Once mounted, the privacy/security enclosure 21500 repositioned on the mounted portion 21520. Further, the privacy/security enclosure 21500 can be positioned on the mounted portion 21520 to align the aperture 21515 with the hood 21550. Power and/or data can be fed and/or managed through cable management 21530. In some embodiments, the privacy level of the privacy/security enclosure 21500 can be modified by positioning the slidable main housing 21510 so that the aperture 21552 of the main housing 21500 and aperture 21515 at least partially overlap. In other embodiments, the privacy level of the privacy/security enclosure 21500 can be increased by positioning the main housing 21510 so that the aperture 21552 of the main housing 21510 and aperture 21515 do not overlap.

In some embodiments of the invention, the privacy/security enclosure can include a movable portion or section that can be moved by rotating or pivoting with respect to another portion or section of the privacy/security enclosure to adjust the level of privacy of the device. For example, FIG. 216 illustrates architecture views of a privacy/security enclosure in accordance with some embodiments of the invention.

FIG. 216 illustrates architecture views of a privacy/security enclosure 21600 in accordance with some embodiments of the invention. In some embodiments, the mounting portions 21425, 21525 can comprise the enclosure 21600. In some embodiments, the privacy/security enclosure 21600 can comprise a main body 21649 that can comprise a front surface 21647 and a rear surface 21645 folded from a surface 21640 defined between edges 21615. Initially the privacy/security enclosure 21600 can be formed or assembled as shown in FIG. 16 by folding about hinges 21603*a*, 21603*b* (thus forming edges 21615 and the surface 21640). The privacy/security enclosure 21600 can also comprise at least one aperture including, but not limited to, a webcam alignment aperture 21630 and a microphone alignment aperture 21620.

In some embodiments of the invention, a section or portion of the privacy/security enclosure can be raised or lowered to alter the privacy level of the privacy/security enclosure. Various seals can be engaged and disengaged during this process including seals to microphones, speakers, sensors and optical capture devices. For example, FIGS. 217A-217C illustrates views of a privacy/security enclosure 21700 in accordance with some embodiments of the invention, and FIGS. 218A-218C illustrates views of a privacy/security enclosure 21800 in accordance with some further embodiments of the invention.

FIG. 217A shows the privacy/security enclosure 21700 including main housing 21710 and movable hood 21750. In some embodiments, in a lowered position (shown in FIG. 217B), the privacy/security enclosure 21700 can privatize the underlying device. In some embodiments, one or more rubber seals 21715 can coupled to one or more microphones 21717. Further, in some embodiments, the main housing 21710 can include at least one sound tube 21719 coupled to at least one speaker 21721. FIG. 2171C shows the privacy/security enclosure 21700 with hood 21750 raised, and depicts sound 21752*a*, 21752*b* directed to microphones 21717*a*, 21717*b* open to the sound. In some embodiments of the invention, the privacy/security enclosure 21800 can comprise a latch to enable the hood 21750 of the privacy/security enclosure 21700 to be decoupled from the unmoved portion (main housing 21710) of the privacy/security enclosure 21700. In some embodiments, as the hood 21750 of the privacy/security enclosure is moved away from the main housing 21710, the interior of the privacy/security enclosure can be revealed to a user. When lowered, the latch that retains the hood 21750 in place. For example, referring to FIG. 217C, in some embodiments, a latch 21713 can be coupled to the main housing 21700 positioned to couple to the hood 21750 when the hood 21750 is lowered into the main housing 21710.

FIGS. 218A-218C illustrates views of a privacy/security enclosure in accordance with some embodiments of the invention. FIG. 218A shows the privacy/security enclosure 21800 including main housing 21810 and movable hood 21850. In some embodiments, in a raised position (shown in FIG. 218B), the privacy/security enclosure 21800 can privatize the underlying device. In some embodiments, one or more rubber seals 21815 can coupled to one or more microphones 21817. Further, in some embodiments, the main housing 21810 can include at least one sound tube 21819 coupled to at least one speaker 21821. FIG. 2171C shows the privacy/security enclosure 21800 with hood 21750 lowered, and depicts sound 21852*a*, 21782*b* directed to microphones 21817*a*, 21817*b* open to the sound. In some embodiments, hinge 21723 can be coupled to the main housing 21800 and the hood 21850 positioned to enable the hood 21750 to be lowered and raised by rotating about the hinge 21723.

In some embodiments of the invention, any of the privacy/security enclosures shown and described in FIGS. 208-265B can suppress or attenuate sound to reduce the ease and/or effectiveness of eavesdropping. In some embodiments, one or more o-rings or gaskets can be used to attenuate or partially block sound. In some embodiments, the cover can include sound dampening layers/materials. Some embodiments of the invention have at least a portion of the privacy/security enclosure formed of a material at least partially attenuating sound emitted from inside the privacy/security enclosure. In some other embodiments, at least a portion of the privacy/security enclosure is formed of a material partially or substantially attenuating sound emitted from outside of the privacy/security enclosure.

In some further embodiments, any of the privacy/security enclosures shown and described in FIGS. 208-265B can partially block and/or damp the signals reaching audio sensors and/or microphones within the user's device. For example, in some embodiments, the privacy/security enclosure can include audio blocking/reducing/confusing capabilities so that typical conversation-level audio outside the privacy/security enclosure will be partially or substantially unintelligible or indiscernible by the enclosed device's microphone. Some embodiments of the invention can include one or more microphone attachment and/or sealing mechanisms. In some embodiments, a physical element of the privacy/security enclosure architecture can be placed against the surface of the device at location at or near where the microphones that are being protected are located. In some embodiments, this physical element can comprise a seal or gasket that minimizes the passage of sound.

Some embodiments of the invention include active sound masking. Some embodiments of the invention include a noise delivery system that takes the masking signal generated by one or more speakers within the privacy/security enclosure and delivers it to one or more of the various microphones that can be covered and/or protected by the privacy/security enclosure. In some embodiments, any of the privacy/security enclosures shown and described in FIGS. 208-265B can play one or more masking signals to muffle, overwhelm, confuse or mask sounds being picked up by one or more microphones of the user device. Further, some embodiments of the invention include listen and respond capabilities. Some embodiments enable the privacy/security enclosure to use one or more microphones to listen to the environment and play one or more masking signals when sound is detected. Some embodiments include a privacy/security enclosure that comprises one or more microphones that are band limited to specific frequencies that are associated with voice. In this instance, the microphones have a lowered noise floor that is below the threshold of microphones in the enclosed user device.

For example, in some embodiments, the privacy/security enclosure can comprise one microphone in the middle of the low frequency of the common voice frequency band and another in the middle of the medium frequency voice band. In some embodiments, using a deep noise floor, the presence of speech can be detected (while not capturing the voice content) while ensuring privacy/security enclosure protection is activated. Some embodiments include a random masking signal. In some embodiments, one or more speakers can be used to cover one or more microphones to create a separate random, pseudo-random or other type of noise source and separate speaker for each microphone in a protected device. Some embodiments of the invention include specialized speaker and/or speaker driver selection. Some embodiments include a privacy/security enclosure that can produce one or more specific waveforms to mask human speech. Moreover, some embodiments include speakers that can produce the desired waveforms with relatively low power consumption. For example, some waveforms can be produced with power consumption less than 850 uA. In some embodiments, the privacy/security enclosure can change and/or delay a starting time for the masking signal. For example, in some embodiments, the privacy/security enclosure includes a control system that enables the system and/or the user to select and vary the amount of time between speech detection and masking signal activation.

In some embodiments, any of the privacy/security enclosures shown and described in FIGS. 208-265B can change the masking signal tail time. For example, after speech ceases, the control system can stop the transmission of the masking signal substantially immediately. In some further embodiments, after speech ceases, the control system can include a transmission of the masking signal that comprises a tail (i.e. a transmission for a certain period of time after speech ceases). In some embodiments, this can minimize obtrusiveness as testing indicates that a constant start/stop is more obtrusive than continuous transmission. In some embodiments, tuning the tail can allow substantially continuous broadcast through the normal starts and stops and pauses that are a part of human conversation. Further, in some other embodiments, the volume of the masking signal can be varying. In some embodiments, the control system or the user can vary the volume of the masking signal based on the volume of the detected sound (e.g. such as a human voice).

In some embodiments of the invention, any of the privacy/security enclosures shown and described in FIGS. 208-265B can include an obfuscation and/or randomness setting. In some embodiments, for a variety of reasons, the privacy/security enclosure can prevent or reduce the ability of an authorized and/or unauthorized listener from detecting the presence of speech, or, if the presence of speech can be detected, reducing or eliminating the intelligibility of such speech. In some embodiments, in the obfuscation and/or randomness mode, the privacy/security enclosure can randomly broadcast to provide protection even if no one is speaking, thereby diminishing the ability of an authorized and/or unauthorized listener of detecting when there is actual speech by a user using the system. Some embodiments of the invention include an always on mode. In this instance, the privacy/security enclosure includes active audio masking that is always on. In this mode, the privacy/security enclosure can broadcast at least one masking/obfuscation signal(s) as long as there is power to the device or enough charge in one or more batteries (if included) to power the transmission of such signal(s).

In some embodiments of the invention, a section or portion of the privacy/security enclosure can be slid or moved to alter the privacy level of the privacy/security enclosure. For example, FIG. 219 illustrates an operational view of a privacy/security enclosure 21900 in accordance with some embodiments of the invention. The privacy/security enclosure 21900 can comprise a main housing 21910 mountable to a user device 11. Part of the housing 21900 includes a moveable portion or hood 21950 that can be moved away from the housing wall 21912 to lower a privacy level, or can be coupled to the housing wall 21912 to raise or set a privacy level. In some embodiments, surfaces 21915 and/or 21955 can be color coded and/or illuminated to warn or caution a user of a non-private configuration or a lower privacy setting.

As described earlier with respect to privacy/security enclosure 20800, some embodiments can include an integrated moveable portion, section, window, door or shutter. Further example embodiments of privacy/security enclosures with various shutter and shutter actuation methods are shown in FIGS. 220-226. For example, FIG. 220 illustrates an operational view of a privacy/security enclosure 22000 in accordance with some further embodiments of the invention. Some embodiments of the invention include a privacy/security enclosure 22000 comprising a main housing 22010 including a coupled hood 22050. The main housing 22010 can include a shutter aperture 22020 and an actuable shutter 22030. Further, the shutter 22030 can be actuated by a user using an integrated shutter actuator 22040. In some embodiments, the shutter 22030 can be manually or automatically actuated. For example, in some embodiments, a user can close the shutter 22030 by sliding the slider insert 22040. When closed, the shutter 22030 can be opened by moving the slider insert 22040 in the reverse direction.

In some embodiments of the invention, regions of the privacy/security enclosure that can be used for user interaction (e.g., various surfaces that can be used to grip or move a portion of the privacy/security enclosure) can include tabs or raised areas (e.g., ramps etc.) that can enable the user to more easily move the portion of the device that needs to be moved, and also to provide a cue as to where and how they should actuate such a mechanism. Some embodiments include textured surfaces or materials/coatings that make such surfaces less slippery to the user.

FIG. 221 illustrates an operational view of a privacy/security enclosure 22100 in accordance with some embodiments of the invention. Some embodiments of the invention include a privacy/security enclosure 22100 comprising a main housing 22110 including a coupled hood 22150. The main housing 22110 can include a shutter aperture 22120 and an actuable shutter 22130. Further, the shutter 22130 can be actuated by a user using an integrated shutter grip surface 22140. In some embodiments, the shutter 22130 can be manually or automatically actuated. For example, in some embodiments, a user can close the shutter 22130 by pushing the shutter 22130 aided by the grip surface 22140. When closed, the shutter 22130 can be opened by moving the slider insert 22140 in the reverse direction. In some embodiments, the grip surface 22140 can comprise an uneven or textured surface. In some further embodiments, the grip surface 22140 can comprise at least one notch or at least one extension.

In some embodiments, a user can activate a portion of the privacy/security enclosure to privatize the underlying device. In some embodiments, the privacy level of the privacy/security enclosure can be changed by opening at least a portion of the privacy/security enclosure (such as a shutter) with respect to another portion of the privacy/security enclosure. In some embodiments, the privacy/security enclosure can comprise a button-activated aperture such as a shutter. In some embodiments, the camera shutter can comprise an iris. In some embodiments, the camera shutter can comprise a horizontal shutter. In some further embodiments, the camera shutter can comprise a vertical shutter.

In some embodiments of the invention, the privacy/security enclosure can comprise a camera shutter operating mechanism. For example, in some embodiments, the camera shutter can comprise a push-button mechanism. In some further embodiments, the camera shutter can comprise a slider, such as a slide positioned in one or more guides. For example, in reference to FIG. 222 illustrating an operational view of a privacy/security enclosure 22200 in accordance with some further embodiments of the invention, in some embodiments, by activating a button positioned on the fixed body of the privacy/security enclosure, at least a portion or section of the privacy/security enclosure can be opened or slid away from an underlying aperture of a fixed portion of the privacy/security enclosure. At this stage, the interior of the privacy/security enclosure can be revealed to a user, and potentially at least one sensor (such as a camera and/or microphone) can be uncovered and revealed. In some embodiments, the interior of the privacy/security enclosure can be color-coded to alert a user to a security threat that might be posed when the privacy/security enclosure includes a shutter that is at least partially slid open.

Some embodiments of the invention include a privacy/security enclosure 22200 comprising a main housing 22210 including a coupled hood 22250. The main housing 22210 can include a shutter aperture 22220 and an actuable shutter 22230. Further, the shutter 22230 can be actuated by a user using an integrated shutter actuator button 22240. In some embodiments, the shutter 22230 can be manually or automatically actuated. For example, in some embodiments, a user can close the shutter 22230 by actuating the shutter actuator button 22240. When closed, the shutter 22230 can be opened by actuating the shutter actuator button 22240.

Referring to FIG. 223, illustrating an operational view of a privacy/security enclosure 22300 in accordance with some embodiments of the invention, in some embodiments, a user can close an open shutter by sliding the shutter to a closed position. Some embodiments of the invention include a privacy/security enclosure 22300 comprising a main housing 22310 including a coupled hood 22350. The main housing 22310 can include a shutter aperture 22320 and an actuable shutter 22330. Further, the shutter 22330 can be actuated by a user using an integrated shutter actuator button 22340. In some embodiments, the shutter 22330 can be manually actuated after actuation of the button 22340. For example, in some embodiments, a user can close the shutter 22330 by actuating the shutter actuator button 22340, and pushing the shutter 22340 towards the button 22340. When closed, the shutter 22330 can be opened by actuating the shutter actuator button 22340. The shutter can then either automatically open, or the user can pull or push-open the shutter 22330.

Referring to FIG. 224, illustrating an operational view of a privacy/security enclosure in accordance with some further embodiments of the invention, in some embodiments, the button can be positioned on the sliding shutter. Some embodiments of the invention include a privacy/security enclosure 22400 comprising a main housing 22410 including a coupled hood 22450. The main housing 22410 can include a shutter aperture 22420 and an actuable shutter 22430. Further, the shutter 22430 can be actuated by a user using an integrated shutter actuator button 22440 that is positioned on the shutter 22430. In some embodiments, the shutter 22430 can be manually or automatically actuated. For example, in some embodiments, a user can close the shutter 22430 by actuating the shutter actuator button 22440. When closed, the shutter 22430 can be opened by actuating the shutter actuator button 22440. In either case, actuation of the button 22440 can release the shutter 22430 for movement manually or automatically (e.g., using a conventional spring actuation or motor).

Referring to FIGS. 225 and 226, in some embodiments of the invention, the privacy/security enclosure can include one or more logos and/or brand images. In some embodiments, the privacy logos and/or brand images can comprise an LED dimmer button. In some embodiments, the button can comprise a capacitive touch button.

Referring to FIG. 225, some embodiments of the invention include a privacy/security enclosure 22500 comprising a main housing 22510 including a coupled hood 22550. The main housing 22510 can include a shutter aperture 22520 and an actuable shutter 22530. Further, the shutter 22530 can be actuated by a user using an integrated slider 22540. In some embodiments, the shutter 22530 can be manually or automatically actuated. When closed, the shutter 22530 can be opened by moving the slider integrated slider 22540 in the reverse direction. In some embodiments, the main housing 22510 can comprise an LED dimmer, and/or a backlit logo (shown as 22548).

Referring to FIG. 226, some embodiments of the invention include a privacy/security enclosure 22600 comprising a main housing 22610 including a coupled hood 22650. The main housing 22610 can include a shutter aperture 22620 and an actuable shutter 22630. Further, the shutter 22630 can be actuated by a user using an integrated shutter actuator button 22640. In some embodiments, the shutter 22630 can be manually or automatically actuated. For example, in some embodiments, a user can close the shutter 22630 by actuating the shutter actuator button 22640. When closed, the shutter 22630 can be opened by actuating the shutter actuator button 22640. In some embodiments, the main housing 22510 can comprise an LED dimmer, and/or a backlit logo (shown as 22648).

In some embodiments of the invention, the privacy/security enclosure can include at least one external connector such as a USB or micro-USB connector. In some embodiments, the external connector can include a coupled lead such a USB or micro-USB lead. In some embodiments, the coupled lead can provide power to the privacy/security enclosure. In some embodiments, a USB wall charger can be used to couple to the USB to provide power to the privacy/security enclosure.

In some embodiments, the external connector and/or external lead can be positioned adjacent one end of the privacy/security enclosure. In other embodiments, the external connector and/or external lead can be positioned between the ends of the privacy/security enclosure. In some embodiments of the invention, the external connector and/or external lead can be positioned at the rear of the privacy/security enclosure. For example, FIG. 227 illustrates a rear view of a privacy/security enclosure 227 comprising a main housing 22710 in accordance with some embodiments of the invention. In some embodiments, the external connector 22735 and/or external lead can include a color accent 22745. Further, FIG. 228 illustrates a rear view of a privacy/security enclosure 22800 comprising main housing 22810 in accordance with some embodiments of the invention, and shows the external connector 22830 and/or external lead can include a color accent 22845. In some further embodiments, the external connector and/or external lead 22735, 22845 can include internal illumination.

Some embodiments comprise an internally powered privacy/security enclosure. For example, FIG. 229 illustrates a front view of a privacy/security enclosure 22900 in accordance with some embodiments of the invention, and FIG. 230 illustrates a side view of a privacy/security enclosure 22900 in accordance with some embodiments of the invention. In some embodiments, the privacy/security enclosure 22900 can comprise a main housing 22910 that can include a main section 22911 housing electronics 22930 and at least one battery 22935, and a secondary section including an upper portion 22920 including at least one extension or flange 22915. In some embodiments, the upper portion 22920 can house at least one speaker 22960. During use, a user can clip the extension or flange 22915 over and/or around a device to be privatized, and position the privacy/security enclosure 22900 to at least partially align the at least one speaker 22960 with at least one microphone of the user's device.

In some embodiments, a privacy/security enclosure can include at least one speaker mounted in the main section of the main housing and positioned proximate the inner surface of the main portion of the main housing, and at least one speaker mounted in the upper portion of the main housing, and positioned proximate the inner surface of the upper portion. For example, FIG. 231 illustrates a side view of a privacy/security enclosure 23100 in accordance with some embodiments of the invention. In some embodiments, the privacy/security enclosure 23100 can comprise a main housing 22310 that can include a main section 22311 housing and a secondary section including an upper portion 23120 including at least one extension or flange 223122. In some embodiments, the upper portion 22920 can house at least one speaker 23165 coupled to a seal 23175, and the main section 23111 can include at least one speaker 23160 coupled to a seal 23170. During use, a user can clip the extension or flange 23122 over a device to be privatized, and position the privacy/security enclosure 23100 to at least partially align the at least one speaker 23165, 23160 with at least one microphone of the user's device and seal at least one of the seals 23175, 23170.

FIGS. 232A-245C illustrate various views of privacy/security enclosures in accordance with some embodiments of the invention. In some embodiments, in addition to or in place of the color coded interior of the privacy/security enclosure alerting to a potential non-privacy, the privacy/security enclosure can include one or more active visual indications of potential non-privacy. Further, referring to at least FIGS. 232A-234C, and 236A-236C in some embodiments, a movable portion or shutter of an extension or flange can be positioned in a frame. For example, FIGS. 232A-232C illustrate views of a privacy/security enclosure showing an embodiment including a webcam LED. FIG. 232A shows a front perspective view, FIG. 232B shows a rear perspective view, and FIG. 232C shows a front view. As illustrated, the privacy/security enclosure 23200 can comprise a main housing 23210 with an extendable hood 23250. At least one logo 23212, 23260 can be positioned on the main housing including a logo 23212 positioned on the main section, and logo 23260 positioned on the secondary section 23215. The privacy/security enclosure 23200 can include a shutter aperture 23225 including slidable shutter 23220. In some embodiments, the slidable shutter 23220 includes an LED lightpipe 23222 that can be configured to block at least one camera of the user's device. In some embodiments, the webcam LED assembly 23222 can illuminate based on the position of the movable cover, the shutter, or both. Further, as also shown in FIGS. 233A-236C, in some embodiments, LED assembly 23222 can include an LED light-pipe that can be positioned to block a camera of the user's device.

In reference to FIGS. 233A-233C, some embodiments include a privacy/security enclosure 23300 comprising a main housing 23310 including a main section 23320, and secondary section 23325, and hood 23350. In some embodiments, raising the hood 23350 can expose a color accent warning 23330. The shutter 23335 can include an LED assembly and/or LED lightpipe 23337. Further, in some embodiments, the main housing 23310 can include at least one backlit capacitive touch control 23352. Further, FIGS. 234A-234C illustrate perspective views of a privacy/security enclosure 23400 comprising a main housing 23410 including a main section 23415 and secondary section 23420, and hood 23450. In some embodiments, raising the hood 23450 can expose a color accent warning 23430. The shutter 23420 can be positioned within the frame 23455, and can include an LED assembly and/or LED lightpipe 23425. Further, in some embodiments, the main housing 23410 can include at least one backlit jewel button 23452.

In some further embodiments, one or more lightpipes can be used to enable a user to view at least a portion of the display or other structure of the user's device. For example, in some embodiments, a lightpipe can include an optical pass-through function to enable the LED signal of the underlying device to pass-through to the user. For example, if the user's device has display or LED that is lit (e.g., indicating that the device's camera is recording), even though a portion of the privacy device can actually be covering or partially obstructing such LED.

Referring to FIGS. 235A-235C, some embodiments include a privacy/security enclosure 23500 can comprise a main housing 23510 including a main section 23520, and secondary section 23525, and hood 23550. In some embodiments, raising the hood 23550 can expose a microphone opening 23535 and a color accent warning 23530. The shutter 23560 can include an LED assembly and/or LED lightpipe 23565 in some embodiments. Further, in some embodiments, the hood 23550 can include at least one backlit capacitive touch control 23552.

FIGS. 236A-236C illustrate perspective views of a privacy/security enclosure 23600 in accordance with some embodiments of the invention. Some embodiments include a privacy/security enclosure 23600 comprising a main housing 23610 including a main section 23615, secondary section 23625, and hood 23650. In some embodiments, raising the hood 23650 can expose a color accent warning 23635. The shutter 23645 can include a webcam LED assembly 23670 and/or LED lightpipe 23660. Further, in some embodiments, the main housing 23610 can include at least one backlit capacitive touch control 23695 and/or at least one illuminated or non-illuminated logo 23690. The frame 23622 can form part of the secondary section 23625, supporting the shutter 23645.

FIGS. 237A-237C illustrate perspective views of a privacy/security enclosure 23700 in accordance with some embodiments of the invention. In some embodiments, the privacy/security enclosure 23700 can comprise a main housing 23710 including a hood 23750, shutter aperture 23720 and a shutter slider 23730. In some embodiments, the privacy/security enclosure 23700 can comprise a main housing 23710 that includes at least one glossy surface. For example, in some embodiments, an end portion 23710*a* of the privacy/security enclosure 23700 can comprise a glossy outer surface. In other embodiments, the privacy/security enclosure 23700 can comprise an outer surface that includes at least one non-glossy or matte surface 23710*b*.

In some further embodiments, the privacy/security enclosure 23700 can comprise an outer surface that includes at least one patterned or textured outer surface. In some embodiments, raising the hood 23750 can expose a color accent warning. Further, in some embodiments, the main housing 23710 can include at least one capacitive touch control 23712. In some embodiments, the main housing 23710 can include one or more logos 23711. Further, in some embodiments, a micro-USB connector can be coupled into the main housing 23710.

Referring to FIGS. 238A-238D, illustrating perspective views of a privacy/security enclosure 23800 in accordance with some embodiments of the invention, in some embodiments, a movable portion (such as the angled microphone seal 23880) of the privacy/security enclosure 23800 can comprise a capacitive touch button 23805. In some embodiments, a user can touch the capacitive touch button 23805 to extend the movable portion 23880 from the main housing 23810 to open the privacy/security enclosure 23800 (i.e. the movable portion 23880 can rise to open). In some embodiments, a shutter slider 23830 can be integrated into the main housing 23810. Further, as illustrated, the privacy/security enclosure 23800 can include an internal color warning accent 23885. When closed, the angled microphone seal 23880 can include deflection points 23801, 23802 to deflect and/or absorb audio or visual information. Further, in some embodiments, the main housing 23810 can include and/or at least one illuminated or non-illuminated logo 23840.

FIGS. 239A-239C illustrate perspective views of a privacy/security enclosure 23900 in accordance with some embodiments of the invention. In some embodiments, the privacy/security enclosure 23900 can include a shutter 23935 that can be flipped by rotating or pivoting with respect to the main housing 23910 of the privacy/security enclosure 23900 to adjust the level of privacy of the user's device 11. For example, in some embodiments, by rotating or pivoting the shutter 23935 of the privacy/security enclosure 23900, at least one sensor (such as a camera and/or microphone 23930) can be uncovered and revealed. In some embodiments, the rotation or pivoting can be enabled by one or more hinges 23925 and/or other conventional mechanisms. In some embodiments, the interior of the privacy/security enclosure (e.g., such as an inner surface 23935*a* of the shutter 23935, shutter aperture 23922 or surface 23923) can be color-coded to alert a user to a security threat that might be posed when the privacy/security enclosure 23900 is at least partially open. Further, in some embodiments, the shutter 23935 can include a warning notification comprising a text warning 23935*b*. Further, in some embodiments, the privacy/security enclosure 23900 can include a hood 23950 of the privacy/security enclosure 23900 can comprise a capacitive touch button 23955.

The example embodiments of FIGS. 239A-239C illustrate a shutter 23935 that can be flipped by rotating or pivoting left or right, with an axis of rotation generally parallel with the end of the privacy/security enclosure 23900. In some embodiments, a privacy/security enclosure can include a shutter that can be flipped by rotating or pivoting left or right, with an axis of rotation generally perpendicular to the end of the privacy/security enclosure. For example, FIG. 240A-240C illustrates perspective views of a privacy/security enclosure in accordance with some further embodiments of the invention showing the portion or section that can be flipped by rotating or pivoting up or down with an axis of rotation generally parallel with the upper and lower surfaces of the privacy/security enclosure.

FIG. 240A-240C illustrates perspective views of a privacy/security enclosure 24000 in accordance with some embodiments of the invention. In some embodiments, the privacy/security enclosure 24000 can include a shutter 24035 that can be flipped by rotating or pivoting with respect to the main housing 24010 of the privacy/security enclosure 24000 to adjust the level of privacy of the user's device 11. For example, in some embodiments, by rotating or pivoting the shutter 24035 of the privacy/security enclosure 24000, at least one sensor (such as a camera and/or microphone 24030) can be uncovered and revealed. In some embodiments, the rotation or pivoting can be enabled by one or more hinges 24025 and/or other conventional mechanism. In some embodiments, the interior of the privacy/security enclosure (e.g., such as an inner surface 24035*a* of the shutter 24035, shutter aperture 24022 or surface 24023) can be color-coded to alert a user to a security threat that might be posed when the privacy/security enclosure 24000 is at least partially open. Further, in some embodiments, the shutter 24035 can include a warning notification comprising a text warning 24035*b*. Further, in some embodiments, the privacy/security enclosure 24000 can include a hood 24050 of the privacy/security enclosure 24000 can comprise a capacitive touch button 24055.

Referring to FIG. 241A-241C, illustrating perspective views of a privacy/security enclosure 24100 in accordance with some embodiments of the invention, in some embodiments, the front face 24115 of the privacy/security enclosure 24100 can comprise at least one shutter slider 24140. In some embodiments, the shutter slider 24140 can comprise a color accent 24140*a*. In some embodiments, the privacy/security enclosure 24100 can comprise an external connector and lead 24170 that include a color accent 24175. In some embodiments, the color accents of the shutter slide and the connector and lead can be matched. The privacy/security enclosure 24100 can comprise a main housing 24110 including a hood 24150, and shutter aperture 24120. In some embodiments, raising the hood 24150 can expose a color accent warning. Further, in some embodiments, the main housing 24110 can include at least one capacitive touch control or logo 24155. In some embodiments, the main housing 24110 can include one or more logos.

Referring to FIGS. 242A-242C, illustrating perspective views of a privacy/security enclosure 24200, in some embodiments, the hood 24250 can include at least one textured surface 24255. In some embodiments, the hood 24250 can include a capacitive touch button including an LED indicator 24212. Further, in some embodiments, the front facing surface 24251 of the hood 24250 can comprise a textured surface 24214 (such as textured touch points). The privacy/security enclosure 24200 can also include a shutter 24235 positioned in a shutter aperture 24220 in the main housing 24210. In some embodiments, the shutter 24235 can comprise a vertical shutter. Further, in some embodiments, the shutter 24235 can include a colored or textured surface 24235*a*. In some embodiments, the privacy/security enclosure 24200 can comprise an external connector and lead 24270. In some embodiments, the lead 24270 can include a color accent.

In some embodiments of the invention, the shutter of a privacy/security enclosure can be moved by a user using an extension or slider at one end of the privacy/security enclosure. For example, referring to FIGS. 243A-243D and 244A-244C, in some embodiments, the extension or slider can extend from a side of one end of the privacy/security enclosure. In some embodiments, the extension or slider can be moved upwards or downwards (i.e., generally along an axis parallel with the end of the privacy/security enclosure) to move the shutter upwards or downwards respectively. For example, FIG. 243A-243D illustrates perspective views of a privacy/security enclosure 24300 in accordance with some embodiments of the invention. In some embodiments, the privacy/security enclosure 24300 can comprise a main housing 24310 including a primary portion 24312 coupled to an end of an upper portion 24314. A secondary portion 24315 of the main housing 24310 can couple to an opposite end of the upper portion 24314. The privacy/security enclosure 24300 can include an extendible hood 24350 that can extend out from the upper portion 24314 of the main housing 24310. In some embodiments, the privacy/security enclosure 24300 can include a shutter aperture 24320 positioned in the secondary portion 24315. A shutter 24330 can be positioned within the aperture 24320. Further, in some embodiments, a shutter slide 24340 can be positioned extending from a side of the main housing 24310, and can be configured to enable a user to move the shutter 24330 by moving the slide 24340 away from or towards the upper portion 24314 of the main housing 24310.

Further, FIG. 244A-244C illustrates perspective views of a privacy/security enclosure 24400 in accordance with some embodiments of the invention. In some embodiments, the privacy/security enclosure 24400 can comprise a main housing 24410 including a primary portion 24413 coupled to an end of an upper portion 24414. A secondary portion 24415 of the main housing 24410 can couple to an opposite end of the upper portion 24414. The privacy/security enclosure 24400 can include an extendible hood 24450 that can extend out from the upper portion 24414 of the main housing 24410. In some embodiments, the privacy/security enclosure 24400 can include a shutter aperture 24420 positioned in the secondary portion 24415. A shutter 24430 can be positioned within the aperture 24420. Further, in some embodiments, a shutter slide 24440 can be positioned extending from a side of the main housing 24410, and can be configured to enable a user to move the shutter 24430 by moving the slide 24440 away from or towards the upper portion 24414 of the main housing 24410. Further, in some embodiments, the upper portion 24414 and/or the hood 24450 can include a capacitive touch switch 24412. In some embodiments, the switch 24412 can be configured to raise and/or lower the hood 24450.

Referring to FIGS. 245A-245C, illustrating perspective views of a privacy/security enclosure 24500 comprising a main housing 24500, and including a shutter aperture 24520 and integrated shutter 24530. In accordance with some embodiments of the invention, the privacy/security enclosure 24550 can include at least one LED indicator 24515. In some embodiments, the indicator 24515 can traverse around at least a portion of the main housing 24510. In some embodiments, the privacy/security enclosure 24515 can comprise at least one LED indicator 24515 that can extend around the privacy/security enclosure 24500 extending from an upper surface 24552 to a lower surface 24512 on both sides of the privacy/security enclosure 24500. In some embodiments, the LED indicator 24515 can extend around a push button release 24665 positioned on the upper surface 24552 of the main housing 24510. In some embodiments, the at least one LED indicator 24515 can comprise a color that is substantially the same as the color accent of a coupled extension and lead 24580. Further, the color of the interior surface 24570 of the privacy/security enclosure 24500 can comprise a privacy alert color that matches the accent color. Further, in some embodiments, the privacy/security enclosure 24500 can include a capacitive touch arm 24545 positioned on a front face portion 24517 of the main housing 24510. In some embodiments of the invention, the use of the LED indicator(s) such LED indicator 24515 and others described herein can include indicating that certain types of privacy protection are active (i.e. the active audio masking signal is being transmitted), the battery status (if a battery in included) and maintenance or alert signals of different types. The LED indicators could also be decorative in nature.

In some embodiments, the main housing can be customized. For example, FIG. 246A-246D illustrates perspective views of a privacy/security enclosure 24600 and accent covers 24612, 24614 in accordance with some embodiments of the invention showing at least one customizable component. In some embodiments, the main housing 24610 of the privacy/security enclosure 24600 can comprise an outer face plate 24611 that can be customized (e.g., customized by a user or purchaser of the privacy/security enclosure). For example, in some embodiments, the outer face plate 24611 shown positioned on the main housing 24610 of the privacy/security enclosure 24600 can be customized to be replaced with or coupled to a glossy face plate 24612 (FIG. 246B) or a textured faceplate 24614 (FIG. 246C). In some further embodiments, the outer face plate 24611 can comprise a matt, textured, or patterned face plate. In some embodiments, the outer face plate 24611 can be positioned adjacent or proximate the aperture 24620. In some embodiments, the outer face plate 24611 can include an aperture generally matched in size and geometry to the aperture 24620. In some embodiments, the outer face plate 24611 can be positioned adjacent or proximate the hood 24650. In some embodiments, the outer face plate 24611 can positioned at least partially around the hood 24650.

In some embodiments, the privacy/security enclosure can be mounted to a surface by coupling to an adapter. In some embodiments, the adapter can be configured specifically for a user device (such as a 21" or 27" computer or display). In some embodiment, the adapter can be coupled to the user device using one or more adhesive strips. In some embodiments, after coupling the adapter to the user device, the privacy/security enclosure can be mounted to the user device by coupling the privacy/security enclosure with the adapter. In some other embodiments, the privacy/security enclosure can be mounted to the adapter, and the privacy/security enclosure with adapter can be mounted to the user device. In some embodiments, a gasket can be used in addition to the adapter to improve the seal between the surface and the cover and/or adapter. For example, FIG. 247 illustrates a privacy/security enclosure mounting assembly view in accordance with some embodiments of the invention. In some embodiments, the privacy/security enclosure 24700 can be assembled and attached to the user device 11 using either one of adapters 24718, 24720. For example, in some embodiments, the adapter 24718 can be coupled to the inner surface 24711 of the main housing 24710 of the privacy/security enclosure 24700. Alternatively, in some embodiments, the adapter 24720 can be coupled to the inner surface 24711 of the main housing 24710 of the privacy/security enclosure 24700 as determined by the size and/or geometry of the user's device 11. In some embodiments, to mount the privacy/security enclosure 24700 including either of the attached adapters 24718, 24725, the privacy/security enclosure 24700 can be hung over an edge and/or top of the device 11 placing the primary portion 24715 of the main housing over or against one side or portion of the device 11 and the secondary portion 24717 of the main housing over another side or portion of the device 11. In some embodiments, the privacy/security enclosure 24700 and adapters 24718, 24725 can be adapted, shaped, and sized to be used with a 21" diagonal display or a 27" diagonal display.

In some embodiments, the privacy/security enclosure embodiments 24800 can be mounted to a user device. For example, FIG. 248 illustrates a front perspective view of a privacy/security enclosure 24800 in accordance with some embodiments of the invention, and FIG. 249 illustrates a rear perspective view of the privacy/security enclosure 24800 of FIG. 248 mounted to a computer or display (user device 11) in accordance with some embodiments of the invention. The privacy/security enclosure 24800 can comprise a main housing 24810 including secondary portion 24815 including a shutter 24830. The secondary portion 24815 can be mounted over the device 11 on one side, and the main section 24811 can be mounted over an opposite side of the device 11. Power and/or data can be coupled to the privacy/security enclosure 24800 through the connector 24870 on the side of the device 11 opposite the secondary portion 24815 as shown. Further, FIG. 250 illustrates a front perspective view of a privacy/security enclosure 25000 in accordance with some embodiments of the invention, and FIG. 251 illustrates a rear perspective view of the privacy/security enclosure 25000 of FIG. 250 mounted to a computer or display device in accordance with some embodiments of the invention. The privacy/security enclosure 25000 can comprise a main housing 25010 including secondary portion 25015 including a shutter 25030. The secondary portion 25015 can be mounted over the device 11 on one side, and the main section 25011 can be mounted over an opposite side of the device 11. Power and/or data can be coupled to the privacy/security enclosure 25000 through the connector 25070 on the side of the device 11 opposite the secondary section 25015 as shown.

In some embodiments, the privacy/security enclosure embodiments 25200 can be mounted to a user device. For example, FIG. 252 illustrates a front perspective view of a privacy/security enclosure 25200 in accordance with some embodiments of the invention, and FIG. 249 illustrates a rear perspective view of the privacy/security enclosure 25200 of FIG. 252 mounted to a computer or display (user device 11) in accordance with some embodiments of the invention. The privacy/security enclosure 25200 can comprise a main housing 25210 including secondary portion 25215 including a shutter 25230. The secondary portion 25215 can be mounted over the device 11 on one side, and the main section 25211 can be mounted over an opposite side of the device 11. Power and/or data can be coupled to the privacy/security enclosure 25200 through the connector 25270 on the side of the device 11 opposite the secondary section 25215 as shown.

Further, FIG. 254 illustrates a front perspective view of a privacy/security enclosure 25400 in accordance with some embodiments of the invention, and FIG. 251 illustrates a rear perspective view of the privacy/security enclosure 25400 of FIG. 254 mounted to a computer or display device in accordance with some embodiments of the invention. The privacy/security enclosure 25400 can comprise a main housing 25410 including secondary portion 25415 including a shutter 25430. The secondary portion 25415 can be mounted over the device 11 on one side, and the main section 25411 can be mounted over an opposite side of the device 11. Power and/or data can be coupled to the privacy/security enclosure 25400 through the connector 25470 on the side of the device 11 opposite the secondary section 25415 as shown. In some embodiments, the privacy/security enclosure 25200 can comprise at least one logo and/or at least one button or capacitive control or arm. For example, in some embodiments, the privacy/security enclosure 25200 can comprise a at least one button or capacitive control or arm 25275 and/or at least one logo 25285. Further, in some embodiments, the privacy/security enclosure 25400 can comprise a at least one button or capacitive control or arm 25475 and/or at least one logo 25485.

Further, FIGS. 256-258 illustrate views of a privacy/security enclosure 25600 in accordance with some embodiments of the invention. The privacy/security enclosure 25600 can comprise a main housing 25610 including secondary portion 25615 including a shutter 25630. The secondary portion 25615 can be mounted over the device 11 on one side (shown in FIG. 256), and the main section 25611 can be mounted over an opposite side of the device 11 (shown in perspective view in FIG. 257, and in side view in FIG. 258). Power and/or data can be coupled to the privacy/security enclosure 25600 on the side of the device 11 opposite the secondary section 25615. In some embodiments, the privacy/security enclosure 25600 can comprise at least one logo 25657 and/or at least one button or capacitive control or arm 25655. Further, in some embodiments, the privacy/security enclosure 25600 can comprise a at least one button or capacitive control 25610 for actuation of the shutter 25630. The partial inner view of FIG. 258 depicts an internal actuator assembly. In some embodiments, the actuator assembly can comprise an internal release assembly 25690 including at least one internal release mechanism configured to enable the hood 25650 to be raised and lowered within the main housing 25610. For example, the inner view shown in FIG. 257 shows internal release mechanisms 25691, 25692. Example internal release mechanisms suitable for internal release mechanisms 25691, 25692 for use in any of the privacy/security enclosure embodiments disclosed herein are also shown in FIGS. 259, 259A, 259B, 260, 260A, 261, 261A. Some embodiments include one or more push-rods that can be actuated by a user to operate a release catch, seal, or other conventional latching mechanism. Some embodiments include a combination of at least one push or pull rods and a slidable latch, catch, or conventional holding or sealing mechanism. For example, some embodiments can utilize a push latch or panel access mechanism from GBK-UK (e.g., such as push latch—small reference code 41002).

FIGS. 259, 259A, 259B, 260, 260A, 261, 261A illustrates internal release mechanisms in accordance with some embodiments of the invention. For example, some embodiments include at least one release rod 25910 coupled to at least one control spring 25912. In some embodiments, a latch 25930 (shown in perspective in FIG. 259B) can control release and capture of the at least one release rod 25910. Some embodiments also include one or more seals (shown in FIGS. 259A, 260A, and 261A). For example some embodiments include a seal 25960, 26010, 26110. In some further embodiments, a release rod 25910 can be used in conjunction with a tension spring 26120 to provide a push and pull type action to raising and lowering of a hood of a privacy/security enclosure.

FIGS. 262-263 illustrate rear perspective views of computer or display mounted privacy/security enclosures in accordance with some embodiments of the invention. In some embodiments, the privacy/security enclosure 26200 can be mounted on a user device 11 including connector and lead 26210. Referring to FIGS. 264A-264B illustrating rear perspective views of privacy/security enclosures 26400, 26401, including textures 26430, 26455, in some embodiments, connector and lead 24670 (used in either of the privacy/security enclosures 26400, 26401) can comprise any of the leads and/or connectors described herein.

FIG. 266 illustrates a front perspective view of a privacy/security enclosure 26600 according to some embodiments of the invention. The privacy/security enclosure 26600 can comprise a main housing 26610 including a coupled hood cover assembly 26615 and an enclosure 26605. In some embodiments, the privacy/security enclosure 26600 can also include a base assembly 26620 that can comprise a Faraday base as described in preceding embodiments. Further, in some embodiments, the hood cover assembly 26615 can include a reversible cover 26620*a*. In some embodiments, the privacy/security enclosure 26600 can include one or more surface facets 26625 extending at least a partial length of the privacy/security enclosure. In some embodiments, the facets 26625 can be formed in the hood cover assembly 26615 and/or in the base assembly 26620. For example, as shown in FIG. 266, the hood cover assembly 26615 and base assembly 26620 can include facets 26626, 26621. In this example embodiment, the geometry of the facets 26626 in the hood cover assembly can complement the facets 26621 of the base assembly thereby providing a seamless outer structure extending the length and width of the privacy/security enclosure. In some embodiments, the facets 26625 can extend to the outer edge surfaces of the hood cover assembly and/or the base assembly. In some embodiments, the geometry of the facets 26626 of the hood cover assembly and/or the facets 26621 of the base assembly can complement facets on the outer edge surfaces (such as outer edge surfaces 26617*b*), thereby providing a seamless outer structure extending the length and width of the privacy/security enclosure including the outer edge surfaces. In some embodiments, the hood cover assembly 26615 and/or the base assembly 26620 can comprise one or more product logos, markings, signs, or graphics (e.g., such as logo 26670 show on the hood cover assembly 26615).

In some embodiments of the invention, a hood cover or enclosure/cover 26615*a* can be coupled with an internal case or device in multiple orientations, including, but not limited to, a 180 degree or reversible orientation. In some embodiments, features of the internal case or enclosed/covered device can be accessible, visible or be able to be activated or deactivated, tuned, adjusted, or changed via various devices and/or assemblies, including, but not limited to light pipes, buttons, switches, controls, transparent, translucent or otherwise light, texture and/or touch sensitive/passing materials and/or surfaces.

In some further embodiments of the invention, the passing of sensor information, data communication via wired or wireless technologies and/or other types of energy or information transfer can be allowed in at least one direction to or from, through or to the inside and outside of the privacy/security enclosure 26600. For example, in some embodiments, a port or mechanism for data transfer can be included to allow power passing and/or charging of batteries. Further, ports or mechanisms to pass other forms of energy such as sound, light, pressure, heat and others can be included. In some embodiments of the invention, any information or energy passing to/from or through any cover or enclosure of the privacy/security enclosure 26600 can be modified, changed, obfuscated, amplified, attenuated or blocked for a particular purpose. For example, in some embodiments of the invention, a port or other mechanism can be included such that sensors (including, but not limited to barometric, echo location/sonar, motion, heat, light, RF, video or sound sensors) can operate within the cover or enclosure.

In other embodiments of the invention, the port or other mechanism can be sealable/closable to a full or partial percentage to content/information passing through the port, another mechanism or the cover or enclosure itself can be modified or changed by features or functions built into or around the cover or enclosure, making it either easier or more difficult for the sensor or impacted capability to operate or to record/capture information as compared to the absence of such port, mechanism, seal, repeater, amplification, modification, masking, obfuscation or other capability. For example, FIG. 266 shows an embodiment of a hood cover with a pass-through button 26680 that allows LED or other optical signaling/feedback information to pass through the hood cover, while simultaneously providing a button by which a user can activate, deactivate or otherwise tune audio masking/jamming or other capabilities of the internal case or device. In some embodiments of the invention, the capabilities described can be asymmetrically provided in the cover or enclosure. For example, FIG. 266 depicts a transfer button and LED pass-through capability (shown as 26680) on one side of a reversible cover 26620*a*. In some embodiments, a user can select or vary functionality by choosing the desired orientation of the cover or enclosure (i.e., the reverse side of the cover 26620*a* is devoid of the pass-through button 26680.

Some embodiments can include an enclosure that can be at least partially opened or closed by a user, and/or can include a portion that can be moved, adjusted, opened or closed by a user to adjust a level of privacy/security. In some embodiments, at least a portion of the housing assembly can be moved with respect to another portion of the housing assembly, or can comprise one or more separable and/or moveable portions. For example, FIG. 267 illustrates a front perspective view of the privacy/security enclosure 26600 with a hood or cover portion with a hood cover assembly 26615 removed according to some embodiments of the invention. With the hood cover assembly 26615 removed, a base assembly 26625 including a Faraday base assembly 26627 can be seen at the base end of the enclosure, and a hood assembly 26630 can be seen at the other end of the enclosure 26625. All of these components and assemblies can be coupled to form the housing assembly 26701. The structure including enclosure 26605 shown in FIG. 267 can form a cradle or enclosure for one or more user devices (such as a user device 10). In some embodiments, the inner surface 26607 of the cradle or enclosure 26606 of the enclosure 26605 can include a patterned surface 26609. Further, in some embodiments, the inner surface 26607 can comprise one or more product logos, markings, signs, or graphics 26611.

The structure shown in FIG. 268 illustrates an exploded assembly view 26801 of portions of the privacy/security enclosure 26600 in accordance with some embodiments of the invention. In some embodiments, various structural, functional, and aesthetic components can be assembled and coupled to form at least a portion of the housing assembly 26701, including for example, the hood cover assembly 26615, a base assembly 26625 including a Faraday base assembly 26627, and a hood assembly 26630. In no particular order of importance, embodiments of the housing assembly 26701 can include a variety of components and sub-assemblies including a hood arm 26810, hood mask 26823, hood arm lid 26825, hood cap 26827, slider 26829, hood spring 26821, and hood clamp 26816. Some embodiments of the invention can include various electrical and electronic components, in addition to various structures and materials for housing and/or protecting the components. For example, some embodiments include a phone detect switch 26818, a speaker flex board 26918, speaker drivers 26814, and acoustic seals 26812.

Some embodiments include structures forming or housing a Faraday cage (including, without limitation, the Faraday base assembly 26627 shown in FIG. 267). For example, FIG. 269 illustrates components of the Faraday base assembly 26627 including, but not limited to, a lower portion comprising a Faraday pan 26915, and an upper portion forming a Faraday rim 26910. The Faraday pan 26915 and Faraday rim 26910 can be coupled to form part of the base assembly 26625 illustrated in FIG. 267. In some embodiments, a DC pass-through assembly 26920 can be housed within the base assembly 26625. In this instance, the DC pass-through assembly 26920 can be coupled to the Faraday pan 26915 and/or coupled to the Faraday rim 26915.

Further components of the base assembly 26625 can be seen in FIG. 270, illustrating an exploded assembly view of portions of the base assembly 26625 in accordance with some embodiments of the invention. For example, in some embodiments of the invention, the Faraday base assembly 27010 can be coupled to a housing sub-assembly forming an end portion of the privacy/security enclosure 26600 (or other privacy/security enclosure described herein). For example, in some embodiments, the Faraday base assembly 27010 can be coupled to a removable main base 27025. The main base 27025 can form a structurally supporting portion of the housing assembly 26701, while also forming a portion of the coupled hood cover assembly 26615 and an enclosure 26605 of the privacy/security enclosure 26600. In some embodiments of the invention, various functional components can be coupled and/or integrated to the Faraday base assembly 27010 and/or the main base 27025, when the Faraday base assembly 27010 is coupled to the main base 27025. For example, some embodiments include an interface board 27015.

In some further embodiments, one or more components can extend through the main base 27025. For example, in some embodiments, a control button assembly 27020 can be positioned in the main base 27025, including a portion (i.e., a button 27021) that extends through an aperture 27026 in the main base 27025 to enable access and control of at least one function of the privacy/security enclosure 26600 by the user. Other embodiments can include one or more light-pipe assemblies 27030 positioned within the main base 27025 to enable optical transfer.

The main board assembly with the base assembly can also be seen in FIG. 271, illustrating an exploded assembly view 27101 of portions of the privacy/security enclosure 26600 in accordance with some embodiments of the invention. In no particular order of importance or function, the exploded assembly view 27101 can include assembly of components and sub-assemblies comprising enclosure 27105, hood assembly 27107, detent wear inserts 27109, battery wear sheet 27111, and miscellaneous screws and screw covers or other fasteners 27113. Further, some components include battery 27117, battery door 27119, base assembly 27121, and main board 27123. Further, other components coupled to the main board 27123 include an Apple Lightning™ connector pivot 27115 and lower acoustic seal 27125. The assembly of the base assembly 27121 with the aforementioned hood assembly 26630 can be seen in the example embodiments. Lightning™ is a registered trademark of Apple, Inc. of Cupertino, Calif.

Some embodiments can include various Faraday cage related structures and/or shell or cover components. For example, FIG. 272 illustrates an exploded assembly view 27201 of portions of the privacy/security enclosure 26600 in accordance with some embodiments of the invention. In some embodiments, the privacy/security enclosure 26600 can include a Faraday tube or canister 27207 and/or a Faraday cover assembly 27209, and outer shell 27205. In some embodiments, the privacy/security enclosure 26600 can include the Faraday tube or canister 27027 and/or the outer shell 27205 coupled to the metal bezel 27211. In some embodiments, wear strips 27221 can be assembled into the privacy/security enclosure 26600 to prevent or limit wear caused by movable portions or sections of the privacy/security enclosure 26600. Further, some embodiments include one or more conductive o-rings 27215 and one or more fingerstock 27213 coupled between the metal bezel 27211 and the main base (27025 shown in FIG. 270). Some embodiments also include various components to cover or protect the privacy/security enclosure including a cover bumper 27219 and/or an environmental seal 27217. Some embodiments include one or more detents to enable one or more components (e.g., such as outer shell 27205) to be added or removed while creating an audible sound and/or vibration that appears satisfying to a user.

Many modern mobile phones have the ability to measure acceleration in the x, y, and z axis (e.g., using an accelerometer), and have the ability to measure rotational velocity around the x, y, and z axis (e.g., using a gyroscope). In some embodiments, it is possible to convert measurements from accelerometer and gyroscope outputs to signals that capture the human voice. For example, in the case of a user's mobile phone contained within an enclosure resting on a table, acoustic energy from user's conversation can be captured by the table and can be coupled to the mobile phone via the enclosure. A major coupling mechanism in this example, depending on the source of the audio content, can be the accelerometer z axis, where the z axis is defined as perpendicular to the surface of the mobile phone and the table.

Some embodiments of the invention include systems and methods for obscuration or elimination of the detection of human voice using any sensor within a mobile communication device. For example, such obscuration can prevent or disrupt the ability of a sensor such as an accelerometer and gyroscope to detect the presence of a human voice, discriminate the gender of a spoken human voice, and/or understand the content and meaning spoken by a human voice (i.e., the recorded communication is not intelligible.)

Figure 273:
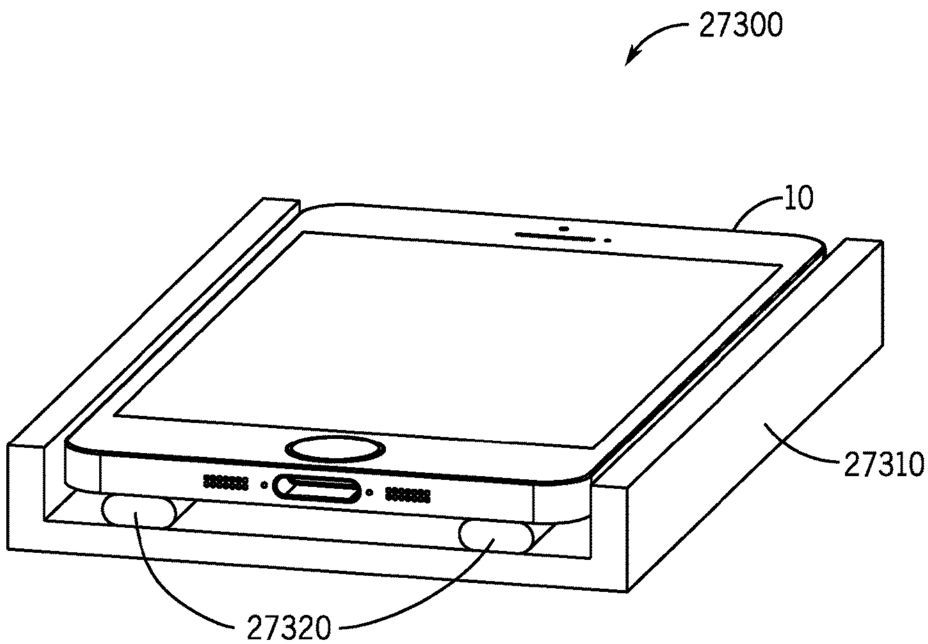

FIGS. 273-276 illustrate perspective views of privacy/security enclosures including mechanical isolation structures and functions in accordance with some embodiments of the invention. Referring to FIG. 273, some embodiments include an assembly 27300 that can include mechanical isolation of the mobile phone from the enclosure. In some embodiments, the mobile phone (user device 10) can be isolated from the enclosure 27310 using one or more suspension elements 27320. In some embodiments, the suspension elements 27320 can be mounted at both the top and bottom interfaces, and/or at both ends. In some embodiments, the suspension elements 27320 can be mounted at least one interface and/or at one end of the enclosure 27310. In some embodiments, one or more suspension elements 27320 can comprise any compliant and/or sprung material including a spring or other material that can provide vibration damping.

Figure 274:
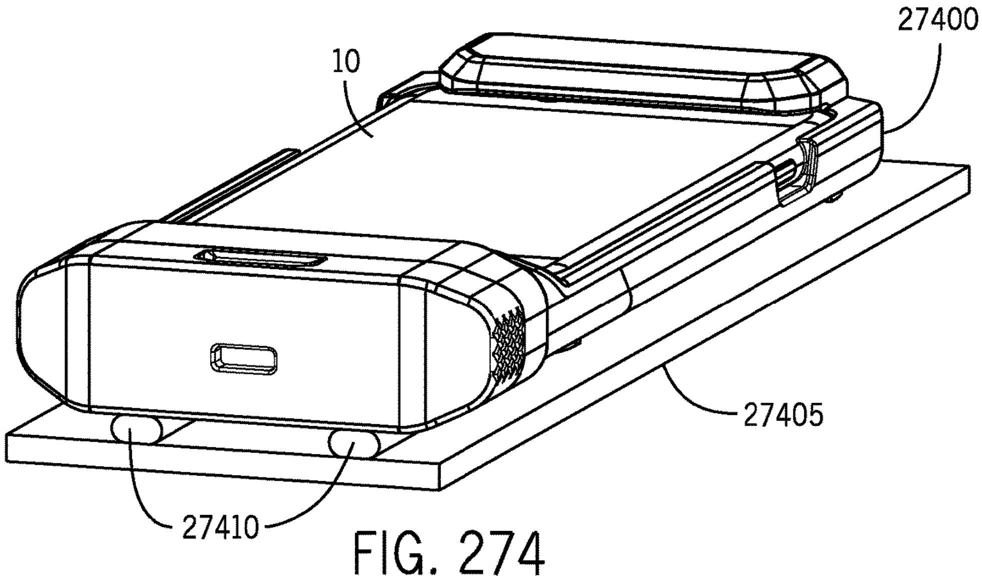

Referring to FIG. 274, some embodiments can include mechanical isolation of the enclosure from the external environment. For example, in some embodiments, using one or more suspension elements 27410, the enclosure 27400 can be mechanically isolated from the external environment (when placed on a surface 27405 while containing a user device 10 as shown). Some embodiments include suspension elements 27410 mounted at both the top and bottom interfaces, and at both ends of the enclosure 27400. In some further embodiments, the suspension elements 27410 can be mounted at one interface and/or at one end of the enclosure 27400.

Figure 275:
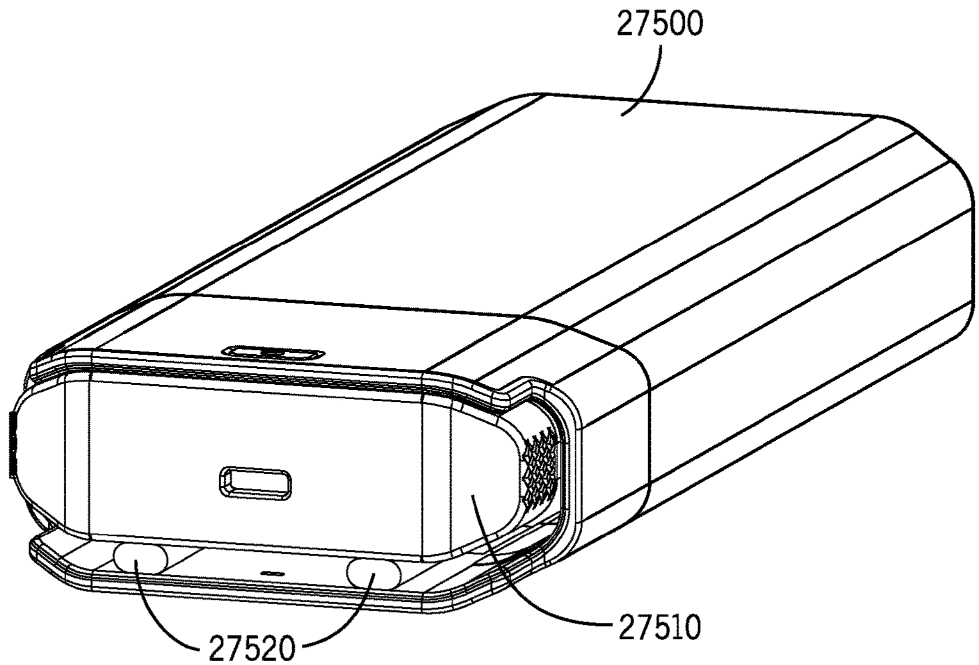

Referring to FIG. 275, some embodiments include mechanical isolation of the enclosure 27510 from the case 27500. In some embodiments, the enclosure 27510 is mechanically isolated from the case 27500 when placed within the case 27500, and the user device 10 is contained within the enclosure 27510. Some embodiments include suspension elements 27520 mounted at both the top and bottom interfaces, and at both ends of the enclosure 27510. In some further embodiments, the suspension elements 27520 can be mounted at one interface and/or at one end of the enclosure 27520.

Figure 276:
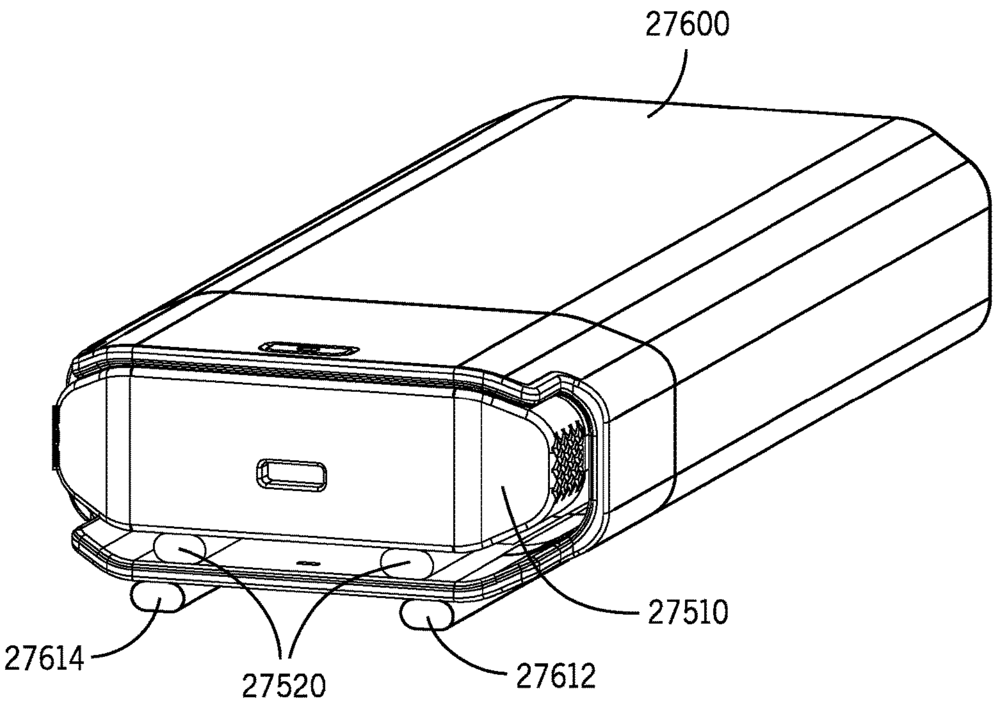

Referring to FIG. 276, in some embodiments, the case 27600 can be mechanically isolated from the external environment (placed on a surface while containing the enclosure 27510 containing the user device 10). Suspension elements 27520 can isolate the enclosure 27510 from the case 27600, while suspension elements 27614 and/or 27612 can isolate the case 27600 and the enclosure 27510 from an external surface.

Some embodiments include integrated vibrators or actuators. For example, FIG. 277 illustrates an end view of a privacy/security enclosure 27700 including broadband vibration in accordance with some embodiments of the invention. Some embodiments include a system for creating broadband vibration at the surface (or other portion) of a user device 10 positioned within the enclosure 27705 for use as a mask or obscuration of audio reception or passage of vibrations caused by audio or the human voice. In some embodiments, an actuator 27710 can be electronically driven using a broadband signal to provide the broadband vibration described above. Further, some embodiments include signal spectral output that is matched or otherwise tailored to mask audio frequencies of interest.

Some embodiments of the invention include integrated vibrators or actuators designed to mask, reduce, confuse, trick, send false or misleading information or prevent the ability of gyroscopes, accelerometers or other sensors to provide movement and/or location information. For example, in some cases, given a known or approximated starting location, even in the absence of location tracking capabilities provided by cellular triangulation, GPS capabilities, WiFi, beacon or other technologies, gyroscopes, accelerometers or other such sensors can be able to provide general or specific movement information such that when an ending location is known or approximated, movements between the starting and ending location can be determined, either roughly or specifically. Some embodiments of the invention can use signals such as pulsed, random, pseudo-random, deterministic, broadband, tuned and/or otherwise tailored signals to drive vibrators and/or actuators in such a way that masks, confuses, misleads, reduces or prevents the ability of sensors to determine movement and/or location information. Such vibrators and/or actuators can be coupled to the user device 10 in conventional ways or as described above. Some embodiments of the invention can use the motion of the enclosed user device 10 or of the enclosure itself as an input/variable used in determining the signal driving the vibrators/actuators.

In some embodiments, a sensor can be used to measure vibrational energy at the surface of the user device 10, and an actuator is used to create a compensating vibration at the surface of the user device 10. In some embodiments of the invention, a processing element can receive signals from a sensor. In some embodiments, the processing element sends a drive signal to an actuator to indicate that the sensed vibrations are compensated within the audio bandwidth. In this instance, the resulting vibration at the surface of the phone is changed, reduced or practically eliminated. In some embodiments, the sensing and actuating elements can be the same (e.g. piezoelectric drive/piezoelectric sensing). In some other embodiments, the sensing and actuating elements can be different. For example, FIG. 278 illustrates an end view of a privacy/security enclosure 27800 including active vibration cancellation in accordance with some embodiments of the invention. In some embodiments, the privacy/security enclosure 27800 can comprise a system 27850 configured for active vibration cancelling that can be used to reduce, change or eliminate vibration at the surface of a user device 10. For example, some embodiments include an enclosure 27805 with a system 27850 comprising at least one actuator 27810 and at least one sensor 27830 coupled with close loop processing control of the at least one actuator 27810 based at least in part on a signal from sensor 27830.

Some embodiments can include controlled light transfer and/or collection. For example, FIG. 279 illustrates an internal cross-sectional view of a privacy/security enclosure 27900 with a light pipe 27910. In some embodiments, a light pipe 27910 can be placed directly above a conventional ambient light sensor. In some embodiments, a light pipe 27910 can be proximate a speaker slot 27920. Referring to FIG. 280 shows an example assembly of shells parts 28020 and spring parts 28010, and light pipes 28005 with minimal space and tight assembly tolerances. FIGS. 281-282, and 283-284 illustrate light pipe structures (28100, 28200, 28300, 28400) arranged in a periscope-like configuration (light transfer element 28201 coupled to light transfer element 28203 coupled to light transfer element 28205) for use in light transmission within a privacy/security enclosure in accordance with some embodiments of the invention. In some embodiments of the invention, the placement and collecting area of the ambient light gathering portion of the light pipe can be placed in order to minimize visibility of the light pipe by users of the privacy/security enclosure. In other embodiments of the invention, the collecting surface area and the reflecting and/or transit surface areas and/or volumes can be designed, engineered and/or optimized such that light sensors of protected devices can operate as if they were not being blocked, or so that the light provided to them via the light pipe only results in a reduction of 10%-30%. In this instance, users of the privacy/security enclosure can be minimally aware or unaware that the native light sensor(s) of protected devices are covered by the privacy/security enclosure.

Referring to FIGS. 285A-285E, in some embodiments of the invention, the privacy/security enclosure can include an adjustable aperture for use in covering and uncovering a portion of the user's device while attached or coupled to the user's device. For example, in some embodiments, the user's device can include at least one window. In some embodiments, the window can be slid open and closed to uncover or cover a portion of the user's device (e.g., such as a camera or other sensor). In some embodiments, the window can be attached or clipped on. In some embodiments, the window can comprise a compliant material that can be folded or wrapped (e.g., such as a flap or curtain). In some embodiments of the invention, devices such as mobile communication and computing devices including cellular phones, smart phones, computer laptops and tablets etc., desktop computers, gaming consoles, wearable devices such as smart watches and Google Glass® can be rendered at least partially private using one or more of the disclosed privacy/security enclosures. For example, embodiment 28505 illustrated in FIG. 285B shows an adhesively attachable shutter 28507. Further, for example, embodiment 28505 illustrated in FIG. 285A shows a sliding shutter 28510. Further, for example, embodiment 28520 illustrated in FIG. 285C shows a flappable shutter 28530. Further, the embodiment 28540 illustrated in FIG. 285D shows a magnetic coupling and a foldable shutter 28550. Further, for example, embodiment 28560 illustrated in FIG. 285E depicts a clip-on shutter.

In some embodiments, the privacy/security enclosure can comprise a structure that accommodates a user using the privacy/security enclosure as a sleeve to protect or make private one or more user devices. In some embodiments, the privacy/security enclosure can be wrapped, attached, secured, or otherwise coupled to the user's device. For example, FIG. 286 illustrates a privacy/security enclosure including a Faraday sleeve 28600 in accordance with some embodiments of the invention. In some embodiments, an enclosure 28610 can be inserted into the Faraday sleeve 28600 to enhance the privacy of the user's device. In some further embodiments, the privacy/security enclosure can be coupled to the user's device using a conventional adhesive. In other embodiments, the attached, secured, or otherwise coupled device can be coupled to the user's device using any suitable conventional device, component or materials including, but not limited to a "snap-on" assembly, Velcro, clip, screw, magnet, or combination thereof. Further, referring to FIGS. 287A-287B, illustrating privacy/security enclosures for use with device cases, in some embodiments of the invention, the privacy/security enclosure can be clipped around portions of the case or housing of a user's device (e.g., such as a laptop case or shell). In some embodiments, the privacy/security enclosure can include one or more separate portions clipped to the user's device. Alternatively, in some embodiments, the user can attach more than one privacy/security enclosure to various areas of the user's device. For example, FIGS. 287A-287B illustrate privacy/security enclosures 28700, 28710 for use with device cases and user devices 15 in accordance with some embodiments of the invention. In some embodiments, the privacy/security enclosure 28700, 28710 can wrap and/or attach to the user device 15.

In some embodiments, the privacy/security enclosure can communicate to the user's device though this connection and/or receive power from this connection. In some embodiments, the privacy/security enclosure can control one or more components of the user's device through the device's USB, micro-USB or other port and/or while coupled to the device's USB, micro-USB or other port. In some embodiments, the privacy/security enclosure can physically cover or electronically control one or more sensors of the user's device including, but not limited to, a camera or microphone.

In some embodiments of the invention, the privacy/security enclosure can couple to a USB, micro-USB or other port/connector of a user's device. For example, FIG. 288 illustrates a USB-powered active portion 28805 of a privacy/security enclosure 28800 in accordance with some embodiments of the invention. In some embodiments, the portion 28805 can be coupled to the USB port 15*a* of a device 15 to alter the privacy level of the device 15.

In some embodiments, the privacy/security enclosure can be configured with one or more device tethers. For example, FIGS. 289A-289C illustrate a tethered privacy/security enclosure 28900 in accordance with some embodiments of the invention. For example, referring to FIGS. 289A-289B, in some embodiments, the privacy/security enclosure 28900 can include an elevated stand 28910. Further, in some embodiments, a tethered enclosure 28930 can be coupled to the privacy/security enclosure 28900. Further, referring to FIG. 289C, in some embodiments, the privacy/security device 28955 can be coupled to the user's device 15 and be tethered to the user's device 15. In some embodiments, the privacy/security enclosure 28950 can be coupled to the user's device 15 and be tethered to the privacy/security device 28955. FIG. 296 also illustrates embodiments of a tethered privacy/security enclosure illustrating a tethered privacy/security enclosure 29600 coupled to a user's device 15 comprising a laptop with coupled keyboard.

FIG. 290 illustrates an ultrasonic clip-on privacy/security enclosure 29000 in accordance with some embodiments of the invention. For example, in some embodiments, one or more privacy/security enclosures 29000 can be configured to attach, clip, or otherwise couple to a user's device 15. In some embodiments, the privacy/security enclosure 29000, attached, clipped or otherwise coupled to a user device 15 can include an ultrasonic "tapper" 29010 (e.g., such as an ultrasonic and/or vibratory emitter). In some embodiments, the ultrasonic "tapper" 29010 can be integrated into a privacy/security enclosure 29000 to enable the privacy/security enclosure 29000 to transfer ultrasonic energy to at least a portion of the user's device 15 (e.g., such as a microphone).

In some embodiments of the invention, the privacy/security enclosure can be configured to create at least a partial vacuum in at least a portion of the user's device 15. For example, FIG. 291 illustrates a vacuum seal over microphone in accordance with some embodiments of the invention. In some embodiments, the privacy/security enclosure 29100 can draw air out of the privacy/security enclosure 29100 to form at least a partial vacuum in the user's device 15. In some embodiments, the formation of at least a partial vacuum within or adjacent to microphone of the user's device can partially attenuate, suppress or prevent the transmission of sound to the microphone.

In some embodiments of the invention, the privacy/security enclosure can comprise a system or method for redirecting or channeling fan exhaust air within the user's device over or to a microphone of the user's device 15. For example, FIG. 292 illustrates internal air flow acoustic muffling 29200 in accordance with some embodiments of the invention. In some embodiments, any privacy/security enclosure disclosed herein can comprise a channel fluidly coupling one or more exhaust fans of the user's device and one or more microphones of the user's device. In some embodiments, the air flow does not overwhelm the microphones rendering them unresponsive to any inputs. Instead, in these embodiments of the invention, the air flow can render the output of the microphones useless or less useful for determining speech content while still allowing some response by the microphones to the user's speech. Many other embodiments of the invention provide this same benefit without rendering sensors, microphones, or speakers completely or virtually completely unresponsive. These approaches can significantly reduce energy consumption and ambient noise compared to prior art devices.

In some embodiments, the geometry and structure of the privacy/security enclosure can be adjusted to complement the size, shape, or form factor of the user's device. In some embodiments, the privacy/security enclosure can include a structure capable of at least partially housing and enclosing a laptop or computer tablet. For example, FIGS. 293A-293B illustrate perspective views of a privacy/security enclosures 29300, 29350 and method of use in accordance with some embodiments of the invention. In some embodiments, the privacy/security enclosure 29300 can comprise a sleeve-type structure 23950 (similar to that described earlier with respect to FIG. 286). In other embodiments, the privacy/security enclosure can comprise a clam-shell type structure 29300.

In some embodiments of the invention, the privacy/security enclosure can comprise a docking station type configuration. In some embodiments, a user device 10 (or 15) can be docked into an aperture of the privacy/security enclosure or the privacy/security enclosure can be wrapped or folded around the user device to dock or secure the device. For example, FIGS. 294A-294B illustrate a privacy/security enclosure 29400 for docked devices in accordance with some embodiments of the invention. In some embodiments, while docked (e.g., by sealing the user's device with portion 29420), the user can adjust the privacy/security level of the privacy/security enclosure 29400 using one or more moveable elements (i.e. such as a moveable shutter, section, window or lever 29410). In other embodiments, while docked, the user can adjust the privacy/security level of the privacy/security enclosure using one or more buttons or controls on the privacy/security enclosure, or using a remote control.

Figure 295B:
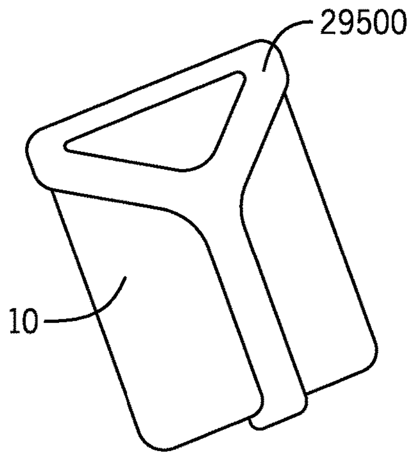
Figure 295A:
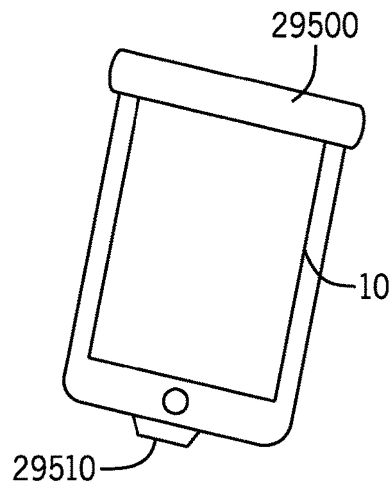
Figure 295C:
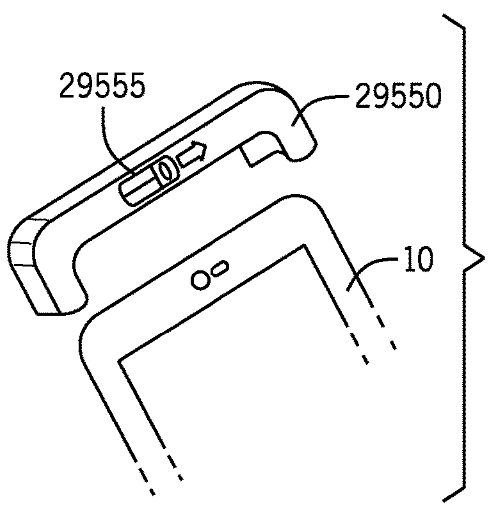
Figure 295D:
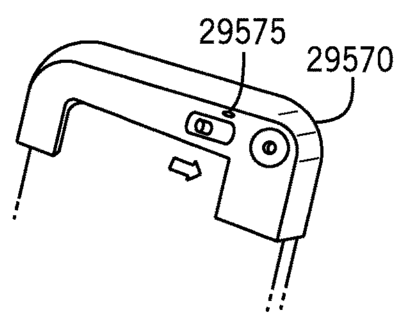

Alternative privacy/security enclosure structures are shown in FIGS. 295A-295D, illustrating privacy/security enclosures for partial cases in accordance with some embodiments of the invention. In some embodiments, the user's device 10 can be docked or coupled to a holder, display case, frame or partial frame, cover (such as an elastomeric cover 29500), or shell or partial shell structure. Similarly, any of these example embodiments can include options for privacy/security adjustment including any of the moveable options described above. In some embodiments, the cover 29500 can include a coupled connector such as Lightning™ connector 29510. Further, some embodiments include an attached section 29550 (FIG. 295C). In some embodiments, attached section 29550 can include a slidable window 29555. Further, referring to FIG. 29570, some embodiments include attachable section 29570 (FIG. 295D). In some embodiments, attached section 29570 can include a slidable window 29575.

Some embodiments of the invention include a privacy/security enclosure configured to emit noise. For example, FIG. 297 illustrates a privacy/security enclosure 29700 comprising a noise emitter in accordance with some embodiments of the invention. In some embodiments, the privacy/security enclosure 29700 or a component of a privacy/security enclosure 29700 can comprise a noise emitter configured to be coupled to at least one input or output port or connector such as head-phone jack, firmware port, USB or micro-USB port, etc. (shown as 29710).

In some embodiments of the invention, the privacy/security enclosure can be configured as an added cover or enclosure to cover or cover of a user's device. For example, FIG. 298 illustrates a cover add-on privacy/security enclosure 29800 in accordance with some embodiments of the invention. In some embodiments, the privacy/security enclosure 29800 can be configured with more than one cover 29810. For example, some embodiments include a standard cover 29820 and an additional cover 29830. In some embodiments, the additional cover 29830 can comprise a metal cover. In some embodiments, the additional cover 29830 can include one or more privacy/security protection devices including, but not limited to, at least one active protection device 29840.

In some embodiments, the privacy/security enclosure can include a privacy/security enclosure configured to alter the privacy/security of a commercial gaming or gaming peripheral. For example, FIGS. 299A-299D illustrate privacy/security enclosures for a Microsoft Kinect™ system (device 20) in accordance with some embodiments of the invention. In some embodiments, the privacy/security enclosure can include a sheath or sleeve portion that can be slid or positioned over a region of the Microsoft Kinect™ system, including for example a camera, IR, and/or motion sensor. For example, some embodiments of privacy/security enclosure 29900 can comprise an assembly including a main housing 29910 and integrated shutter 29925. As shown in the assembly view of FIG. 299A, in some embodiments, the privacy/security enclosure 29900 can be slid over the device 20 to enable a user to adjust the privacy of the device 20.

In some embodiments, the privacy/security enclosure for a Microsoft Kinect™ system or similar gaming system or gaming peripheral can comprise one or more foldable or articulating covers. For example, FIGS. 300A-300B illustrate a fold-down cover or flap 30010 30060 privacy/security enclosure for a Microsoft Kinect™ system in accordance with some embodiments of the invention. The example embodiment as shown includes a moveable cover or flap portion coupled to a flange (30015 shown in FIG. 300A) or hinge assembly (shown in FIG. 300B) coupled or mounted to the Microsoft Kinect™ system. In some embodiments, the cover or flap 30010, 30060 can be rotated or flipped by a user to cover or uncover at least a portion of the Microsoft Kinect™ system. In some embodiments, the cover or flap 30010, 30060 can include an acoustic absorbing or dampening material (shown as 30011 in FIG. 300A and 30012 in FIG. 300B) that can be used to cover one or more microphones of the Microsoft Kinect™ system. For example, in some embodiments, an acoustic absorbing or dampening material can applied along one edge or surface of the cover or flap and positioned to couple to the microphones when the cover or flap is closed against the Microsoft Kinect™ system.

In some embodiments, the privacy/security enclosure can include privacy/security adjustment options for optical and IR sensing and audio functions of the Microsoft Kinect™ For example, FIG. 301 illustrates a remote cover privacy/security enclosure 30100 for a Microsoft Kinect™ system in accordance with some embodiments of the invention. In some embodiments, the privacy/security enclosure 30100 can include a configurable cover slide 30105 in addition to a configurable sound bar 30110. In some embodiments, the cover slide 30105 can include a slidable window 30107 to enable the user to alter the privacy/security level of the Microsoft Kinect™. In some embodiments, the sound bar 30110 can comprise a foldable sound protection bar that can be folded over one or more audio functions of the Microsoft Kinect™ (including a microphone and/or a speaker).

In some further embodiments, the privacy/security enclosure can comprise a recess in a box enclosure. For example, FIGS. 302A-302B illustrate an elevator recess cover privacy/security enclosure 30200 for a Microsoft Kinect™ system in accordance with some embodiments of the invention. In some embodiments, the Microsoft Kinect™ system can be elevated up and out of the privacy/security enclosure 30200 or lowered and enclosed within the privacy/security enclosure.

In some embodiments, the privacy/security enclosure can include an attachable cover comprising a sound dampening material. FIG. 303 illustrates an attachable cover privacy/security enclosure 30310 for a Microsoft Kinect™ system in accordance with some embodiments of the invention. In some embodiments, the cover 30310 can include integrated active and/or passive privacy/security features, and or more or more status indicators. For example, in some embodiments, the cover 30310 can include a noise emitter 30305 to provide additional sound masking or muffling capability. Further, in some embodiments, the cover can include a battery indicator or other status indicator 30315.

In some embodiments of the invention, the actuation of privacy/security features, the movement of any or all covers, flaps, sheaths, sleeves, shields or any other moveable portion of the enclosure can be accomplished via electro-mechanical assemblies or devices. In some embodiments of the invention, the triggering or activation of any powered protection features, such as the electro-mechanical movement of a cover, shield, sleeve or any other moveable portion of the enclosure, the turning on, off or increase/decrease in the volume or level of protective features such as audio masking, the modification of some aspect of the user interface such as the brightness of LED's or other such feature can occur via switches, buttons or other physical interface on the enclosure, or via one or more remote-controlled, wired or wireless interface device. In some embodiments of the invention, the controls of the privacy/security enclosure can be triggered by voice or sound activation, motion or other such interface.

In some embodiments, the privacy/security enclosure can comprise a privacy/security device configured to operate as a power controller and/or circuit breaker between the Microsoft Kinect™ system and one or more gaming systems. In some embodiments, a user can use a wired or wireless controller of a coupled gaming system to control the privacy/security device (e.g., to enable or disable power and/or connectivity between the Microsoft Kinect™ system and one or more gaming systems).

For example, in some embodiments of the invention, the privacy/security enclosure can control the power, connectivity, or at least one function of the Microsoft Kinect™ system. As just one example, FIG. 304 illustrates an interruption privacy/security device 30400 in accordance with some embodiments of the invention. In some embodiments, a remote transmitter or transceiver 30405 can activate or control the privacy/security device 30400. In some further embodiments of the invention, the privacy/security enclosure 30400 can comprise a privacy/security device configured to operate as a power controller and/or circuit breaker and/or MAC (media access control) address changer for any powered electronic device, including but not limited to devices such as cable modems, routers, switches, video cameras, computers, servers, laptops, electric panels, any network connected devices or internet of things enabled devices and others.

In some embodiments of the invention, the privacy/security enclosure can comprise a cylinder or roll-cover type assembly. For example, FIGS. 305A-305B illustrate a Faraday cylinder privacy/security enclosure 30500 in accordance with some embodiments of the invention. In some embodiments, the privacy/security enclosure 30500 can comprise a generally cylindrical-shaped housing 30505 including at least one movable cover portion 30510. In some embodiments, the at least one movable cover portion 30510 can be rolled back to expose at least a portion of the Microsoft Kinect™ system. Further, in some embodiments, the cover can be rolled down to a closed position to cover the Microsoft Kinect™ system to form or couple with a Faraday cage system.

Referring to FIG. 306, some embodiments include a privacy/security enclosure 30600 including optical blinding in accordance with some embodiments of the invention. In some embodiments, one or more LED's or other conventional light and/or IR sources 30620 can be integrated into a portion 30610 of a housing 30605 of the privacy/security enclosure 30600 and used to blind, confuse, white-out, or otherwise distort or impair an input to one or more optical sensors and/or control circuitry of the Microsoft Kinect™ system, any other system containing a camera or video recording device or any other cameras or video recording device of any type, in any shape or form. In some embodiments, at least one of the light or IR sources can be positioned within a moveable flap or cover.

In some embodiments of the invention, multiple distortion, confusion or masking light sources can be coordinated to reduce or eliminate the ability of optical sensors to perform their intended function. In other embodiments of the invention, software or hardware based recognition technologies can be used on inbound images and/or data received by camera(s) integrated into the privacy/security enclosure to recognize and/or identify external cameras and optical sensors such that masking, confusing or distorting signals can be targeted towards such identified devices. In some embodiments of the invention, the privacy/security enclosure can be mounted on or within vehicles. In other embodiments of the invention, the privacy/security enclosure can be integrated with or take the shape of wearable devices such as hats, clothing, glasses or some other such form of easily portable or moveable device that can be carried by the user in some or many of their day to day activities.

FIG. 307 illustrates a Microsoft Kinect™ system audio interference system in accordance with some embodiments of the invention. In some embodiments, the privacy/security enclosure 30700 can comprise a frequency turbulence generator configured to attenuate, overlap, mask or distort an audio signal reaching the Microsoft Kinect™ system.

In some embodiments of the invention, the privacy/security enclosure can comprise a removable adhesive cover or sticker configured to at least partially absorb, reflect, or otherwise prevent transmission of optical or IR radiation. For example, FIG. 308 illustrates an IR sticker privacy/security system 30800 in accordance with some embodiments of the invention. In some embodiments, a cover or sticker 30820 can be peeled from a stock sheet 30810 including a plurality of covers or stickers 30815 and positioned over one or more sensors, emitters, or cameras of the Microsoft Kinect™ system. In some embodiments, the covers or stickers 30815 can include a peel-tab 30825 to facilitate removal and handling from the stock sheet 30810.

FIGS. 309A-309B illustrate manually operated privacy/security enclosures 30900, 30950 in accordance with some embodiments of the invention. In some embodiments of the invention, the privacy/security enclosure 30925 can comprise one or more mechanical mechanisms for adjusting or moving a portion of the privacy/security enclosure in order to alter the privacy/security of a coupled user device (device 15). For example, in some embodiments, the privacy/security enclosure 30900 can comprise a mechanical thumbwheel or gear 30925 that can be rotated to adjusted to move a cover or shutter 30930 over one or more sensors of the user's device. Alternatively, in some other embodiments, the adjustment or movement of a portion of the privacy/security enclosure in order to alter the privacy/security of a coupled user device can be automated or semi-automated. Referring to FIG. 309A, in some embodiments, a user can touch the top 30960 of an upper housing portion 30955 of the privacy/security enclosure to activate a cover 30980 that slides down. In other embodiments, the cover 30980 can slide across or diagonally.

In some embodiments, the operation and privacy/security of a remote control device can be altered using a privacy/security enclosure. For example, FIGS. 310A-310B illustrate privacy/security protection of a remote control in accordance with some embodiments of the invention. In some embodiments, the privacy/security enclosure 31000 can enclose the remote (shown as device 17) and operate to alter the privacy/security of the device 17 as described for any enclosed user device described earlier.

In some embodiments, one or more functions of the privacy/security enclosure can be operated using a remote control transceiver. For example, FIGS. 311A-311B illustrate a remote controlled cover privacy/security enclosure 31100 in accordance with some embodiments of the invention. In some embodiments, a user can use a remote control (such as a device 17) to operate the privacy/security enclosure and alter the privacy/security features of the privacy/security enclosure 31100 using an attached controller 31105. In some embodiments, the user can remotely open and/or close a cover, flap, or shutter to alter the privacy/security level of the user's device 15. As shown in FIG. 311B, the privacy/security enclosure 31100 can include a shutter 31125, a status LED 31107, audio masking 31109, and a power connector 31111. FIG. 31150 illustrates an alternative embodiment of the privacy/security enclosure 31100.

In some embodiments of the invention, the privacy/security enclosure can include smart glass or filter. For example, FIG. 312 illustrates a smart glass privacy/security enclosure 31200 in accordance with some embodiments of the invention. In some embodiments, a portion 31205 of the privacy/security enclosure can include a smart glass or filter 31225 that is switchable between one or more levels of transparency. For example, in some embodiments, when a user wishes to increase the privacy/security setting of the privacy/security enclosure 31200, the user can activate the smart glass or filter 31225 to induce opacity within the smart glass or filter 31225 to optically block or obscure light transmission. In some embodiments, a user can operate the transmission characteristics of the smart glass or filter 31225 using a remote control.

In some embodiments, the privacy/security enclosure can include a power or battery control function. For example, FIG. 313 illustrates an on-off remote battery circuit breaker 31300 in accordance with some embodiments of the invention. In some embodiments, using a remote function 31303, a user can control power from a battery 31305 (i.e., turn-on or turn-off power from the battery).

Some embodiments can include automobile privacy protection. For example, some embodiments include a privacy/security enclosure that can act as a switch or circuit breaker controlling the ability of one or more of a vehicle's communication systems to operate. For example, some embodiments of the invention can address the well-publicized remote hacking of a popular manufacturer's vehicle, wherein the brakes, acceleration and other functions of the car were able to be remotely controlled by the hacker. In some embodiments of the invention, the privacy/security enclosure can restrict, filter or cut off access to one or more of the vehicles external communication capabilities, minimizing, reducing, making more difficult or eliminating the ability of a remote actor to control one or more of the vehicle's functions. In other embodiments of the invention, the privacy/security enclosure, actuated either manually by the user or by software in the event of one or more trigger conditions, can restrict, filter or cut off access of one or more portions of a vehicle's systems from one or more others. For example, in some embodiments of the invention, the privacy/security enclosure can cut-off, minimize, filter or restrict access from a vehicle's entertainment system or other such system to provide protective capability in the event that the system is faulty, has been hacked and/or had its software, firmware or hardware added to, modified, deleted or replaced, or had new software, firmware or hardware installed, maliciously or otherwise. In some embodiments of the invention, the privacy/security enclosure can restrict, minimize, filter or eliminate access of one or more portions or sub-portions (e.g. not the entire vehicle control system, but rather the braking system or not the entire braking system, but rather portion of the braking system) of one or more of the vehicles systems to one or more other portions or sub-portions of one or more other systems or to one or more shared networks, buses or other such communication facilities. For example, some embodiments of the privacy/security enclosure can provide more nuanced filtering, reduction or elimination of connectivity such that certain critical, non-faulty or non-hacked capabilities maintain connectivity while other, less critical, faulty or hacked portions of the system have their connectivity reduced, filtered or cut-off. In some embodiments of the invention, the privacy/security enclosure can allow or trigger the connection to or activation of backup vehicle control or other such systems. In other embodiments of the invention, the privacy/security enclosure can allow the ability to access, source or reload one or more backup, redundant, or protected software/code sources for one or more vehicle systems. Some embodiments of the privacy/security enclosure can reduce or eliminate the ability of one or more vehicle systems from being able to access other systems and/or from accessing any remote network or communication capability. For example, some embodiments of the privacy/security enclosure can reduce, eliminate or filter the access of systems that control vehicle operation (e.g., brakes, steering, acceleration, gauges, windshield wipers etc.) from systems such as vehicular entertainment systems or cellular or other forms of remote communication, such that while auto manufacturers or other parties can no longer be able to remotely access sensor data from such systems, hackers can no longer be able to remotely access such systems either.

Some embodiments include automobile privacy/security enclosures configured to function at least as described above. For example, FIGS. 314-317A illustrate automobile privacy/security enclosures in accordance with some embodiments of the invention. In some embodiments, using one or more of the privacy/security enclosures 31400, 31500, 31600, 31650 depicted, the privacy/security level of a communication system within an automobile (user device 30) can be changed. Some embodiments include a privacy/security enclosure 31400 installed adjacent to a microphone within or adjacent to a headliner of an automobile or within or adjacent to wherever a microphone can be found within an automobile, truck or other moving vehicle. In this example embodiment, the privacy/security enclosure 31400 can comprise a controller 31405 including a user control 31425 configured to control or engage audio masking. In other embodiments, the privacy/security enclosure 31500, 31600 can be installed adjacent to the automobiles dashboard or steering wheel. In some further embodiments, the privacy/security enclosure 31650 can be installed in an engine compartment and/or coupled to a vehicle's audio and/or communication electronics. In some embodiments, a vehicle's key or key-fob (device 35) can be used to activate or control the automobile's privacy/security enclosure 31400, 31500, 31600, 31650. In other embodiments, the automobile's privacy/security enclosure 31400, 31500, 31600, 31650 can be operated via a cellular connection. In other embodiments, automobile's privacy/security enclosure 31400, 31500, 31600, 31650 can be operated from a control or switch within the vehicle. In some further embodiments, automobile's privacy/security enclosure 31400, 31500, 31600, 31650 can be operated and/or monitored through an internet connection.

FIG. 317B illustrates a privacy/security system 31700 in accordance with some embodiments of the invention. In some embodiments of the invention, the privacy/security system 31700 can include a privacy/security system 31701 that can be activated by a user to control one or more electrical, mechanical, and/or electromechanical systems of the vehicle. A discussion of specific electrical, mechanical, and/or electromechanical systems of the vehicle that can be controlled by embodiments of the privacy/security system 31700 are shown and described in FIGS. 317C and 317D illustrating mechanical, electrical, and electromechanical systems of a vehicle that can be controlled by the privacy/security system of FIG. 317B. In some embodiments, the privacy/security system 31701 can control at least one electrical, mechanical, and/or electromechanical systems of a user's vehicle. Further, in some embodiments, the privacy/security system 31701 can enable a switch to a backup system for control of at least one electrical, mechanical, and/or electromechanical systems of a user's vehicle. For example, some embodiments include a privacy/security system 31702 that is protected by a Faraday cage.

In some embodiments, the privacy/security systems 31701, 31702 can enable a user to select and control and/or disconnect existing sensors or inputs to a vehicle's control system (shown as system control 31715). In some embodiments, the privacy/security systems 31701, 31702 can enable a user to select and control existing sensors or inputs to a vehicle's control system (shown as system control 31715). In some embodiments, the privacy/security systems 31701, 31702 can enable a user to select and control and/or disconnect existing outputs from a vehicle's control system (shown as system control 31710). Further, in some embodiments, the privacy/security systems 31701, 31702 can activate/connect one or more backup systems, including blocking access to non-critical systems or those that provide a route for malware (e.g., such as entertainment systems, voice/data communications, remote keyless entry systems, etc. In some embodiments, the privacy/security system 31702 can include backup control systems that comprise protected non-networked systems with no remote access, and base configurations not capable of being modified without physically interaction with the systems. In some embodiments, the various mechanical, electrical, and electromechanical systems that can be protected and controlled includes, but is not limited to, night vision systems, a heads-up display, driver alertness monitoring, instrument cluster, accident recorder, event data recorder, auto-dimming mirror, interior lighting, active cabin noise suppression, voice/data communications, cabin environmental controls, dedicated short-range communication systems (dsrc), entertainment systems, battery management, lane correction systems, electronic toll collection systems, digital turn signals, navigation systems, security system, active exhaust noise suppression, active suspension, hill-hold control, regenerative braking, antilock braking, tire pressure monitoring, parking system, electronic stability control, active yaw control, seat control position, transmission control, lane departure warning, blindspot detection, remote keyless entry, onboard diagnostics, active vibration control, cylinder deactivation, idle stop/start, electronic valve timing, electronic throttle control, electric power steering, automatic braking, adaptive cruise control, adaptive front lighting, airbag deployment, engine control, parental controls, and windshield wiper control In reference to FIGS. 317C and 317D illustrating mechanical, electrical, and electromechanical systems of a vehicle that can be controlled by the privacy/security system of FIG. 317B, the average new car has dozens of computers that control everything from the airbags and brakes to the lights and entertainment system. The engine control module (ECM) is the most powerful (and expensive) microcontroller in the vehicle. Engine control modules determine where to set the throttle, how much fuel to inject into the cylinders, and when to fire the spark plugs. In many vehicles this controller also regulates the electric power distribution, provides the on-board diagnostics, and communicates with a number of other automotive systems to share information it obtains from various sensors. The engine control modules take data from a wide variety of analog sensors, digitize this information, and use it to calculate the proper engine settings. The results of these calculations are converted to actuator settings, and both digital and analog outputs from the module are used to operate these actuators.

Although cars did not have engine control modules for the first 80-90 years after the gasoline engine was invented, cars today would not be able to meet modern fuel efficiency and emissions requirements without them. Improvements in engine control algorithms, data collection, and data communication continue to be a major reason that cars are more efficient and less polluting with each new model year. Some vehicles allow the driver to make trade-offs between power and fuel economy by simply activating a switch that causes the ECM to run different engine control subroutines. There are also various programmable ECMs that are available to give car enthusiasts a great deal of control over how their engine will perform in various situations.

Today's ECMs generally employ 32-bit microcontrollers with a few megabytes of memory clocked at speeds between 32 MHz and 100 MHz. They generally communicate with other electronic modules using one or more CAN bus interfaces. In cases where the engine control function and the transmission control function are combined in the same module, the module is generally referred to as a powertrain control module (PCM). Various sensors that can be controlled include the pedal position sensor, throttle valve position sensor, engine oil temperature sensor, oxygen sensor, induction air temperature sensor, EGR sensor, oil pressure sensor, fuel level sensor, wheel speed sensor, torque sensor, knock sensor, air flow sensor, crankshaft position sensor, camshaft position sensor, manifold absolute pressure sensor, coolant temperature sensor. Other systems that can be controlled directly or indirectly include actuators, fuel injectors, spark plugs, EGR valve, fuel tank venting, cooling fan, starter motor, throttle position motor, check engine light, and data communications.

Power steering systems supplement the torque that the driver applies to the steering wheel. Traditional power steering systems are hydraulic systems, but electric power steering (EPS) is becoming much more common. EPS eliminates many HPS components such as the pump, hoses, fluid, drive belt, and pulley. For this reason, electric steering systems tend to be smaller and lighter than hydraulic systems. EPS systems have variable power assist, which provides more assistance at lower vehicle speeds and less assistance at higher speeds. They do not require any significant power to operate when no steering assistance is required. For this reason, they are more energy efficient than hydraulic systems. The EPS electronic control unit (ECU) calculates the assisting power needed based on the torque being applied to the steering wheel by the driver, the steering wheel position and the vehicle's speed. The EPS motor rotates a steering gear with an applied force that reduces the torque required from the driver. There are four forms of EPS based on the position of the assist motor. They are the column assist type (C-EPS), the pinion assist type (P-EPS), the direct drive type (D-EPS) and the rack assist type (R-EPS). The C-EPS type has a power assist unit, torque sensor, and controller all connected to the steering column. In the P-EPS system, the power assist unit is connected to the steering gear's pinion shaft. This type of system works well in small cars. The D-EPS system has low inertia and friction because the steering gear and assist unit are a single unit. The R-EPS type has the assist unit connected to the steering gear. R-EPS systems can be used on mid- to full-sized vehicles due to their relatively low inertia from high reduction gear ratios. Unlike a hydraulic power steering system that continuously drives a hydraulic pump, the efficiency advantage of an EPS system is that it powers the EPS motor only when necessary. This results in reduced vehicle fuel consumption compared to the same vehicle with an HPS system. These systems can be tuned by simply modifying the software controlling the ECU. This provides a unique and cost effective opportunity to adjust the steering "feel" to suit the automotive model class. An additional advantage of EPS is its ability to compensate for one-sided forces such as a flat tire. It is also capable of steering in emergency maneuvers in conjunction with the electronic stability control.

In current-day systems, there is always a mechanical connection between the steering wheel and the steering gear. For safety reasons, it is important that a failure in the electronics never result in a situation where the motor prevents the driver from steering the vehicle. EPS systems incorporate fail-safe mechanisms that disconnect power from the motor in the event that a problem with the ECU is detected. The next step in electronic steering is to remove the mechanical linkage to the steering wheel and convert to pure electronically controlled steering, which is referred to as steer-by-wire. This functions by transmitting digital signals to one or more remote electric motors instead of a rack and pinion assembly, which in-turn steers the vehicle. While it has been used in electric forklifts and some tractors, as well as a handful of concept cars. In the event that a problem is detected with the electronic controls, a clutch engages to restore the driver's mechanical control. As with throttle control systems, it is likely that steer-by-wire will become the standard once the electronic controls prove to be safer and more reliable than the current hybrid systems. Any of the above mentioned vehicle control system can be access, selected, controlled, and protected using the privacy/security systems 31701, 31702.

Referring to FIGS. 318A-321, in some embodiments, the privacy/security enclosure can be integrated with and/or used with travel accessories. Any of the embodiments as shown and described in FIGS. 318 to 321 can include materials, structures, and fabrication methods as described for privacy/security enclosures shown in the preceding figures. Any of the materials, structures, and fabrication methods can be scaled to any of the structures that are generally larger in size that those described for enclosing single devices such as mobile phones and sensors of portable devices. For example, FIGS. 318A-318C illustrate a protective suitcase privacy/security system 31800 in accordance with some embodiments of the invention. FIGS. 319A-319B illustrate another protective suitcase privacy/security system 31900 in accordance with some embodiments of the invention. Further, FIG. 320 illustrates a Faraday cage in bag privacy/security system 32000 in accordance with some embodiments of the invention, and FIG. 321 illustrates a Faraday sleeve privacy/security system 32100 in accordance with some embodiments of the invention. Referring to FIG. 318, in some embodiments, the privacy/security enclosure 31800 can form a travel briefcase 31805 capable of housing multiple user devices including mobile phones, laptop computers, computer tablets, etc. Referring to FIGS. 319A-319B, in some embodiments, the privacy/security enclosure 31900 can form a rolling luggage structure 31905 attached to luggage 31910. In some embodiments, the rolling luggage 31910 including the privacy/security enclosure 31900 can include an access door or lid 31912 and one or more lockable and removable enclosures 31925. In some embodiments, one or more of the lockable and removable enclosures 31925 can be locked using a lock key 31930.

In some further embodiments, the privacy/security enclosure 32000 can comprise a back-pack structure. For example, referring to FIG. 320, in some embodiments, a privacy/security enclosure 32000 can comprise a backpack structure 32005 can include a secure hard inner case 32007 and an outer soft or compliant case 32010.

Referring to FIG. 321, in some embodiments, the privacy/security enclosure 32100 can comprise a personal travel sleeve cover 32105. In some further embodiments, the sleeve cover 32105 can comprise a sealable opening 32110 to enable a user to insert and seal a device.

Some embodiments of the invention can be designed to integrate with common consumer household or office products such as jackets or other forms of clothing, purses, handbags, backpacks and briefcases, chairs, couches, kitchen counters, car consoles, seats, dashboards or doors, tables, desks, drawers and/or bed stands/night tables amongst others. In some embodiments of the invention, the privacy/security enclosure can be integrated in such a way that it is not visible to an outside observer. Some embodiments can be integrated into purses and other aforementioned products such that the privacy/security enclosure appears to be integrated into the surface of the product or so that when the purse or other such product is opened, the user can have access to the privacy/security enclosure into which they can place their phone, tablet or other electronic device, in any case at which point that once the privacy/security enclosure is engaged, it can then provide on or more of the protective masking, obfuscation, minimizing, jamming, blocking and/or other privacy/security features via the systems and methods described herein.

Some embodiments include box or cabinet type privacy/security enclosures. For example, FIG. 322 illustrates a lockbox privacy/security enclosure 32200 in accordance with some embodiments of the invention. In some embodiments, privacy/security enclosure 32200 can comprise a housing 32205 including a coupled cover 32210 enabling access to at least one slot 32215. In some embodiments, the privacy/security enclosure 32200 can include feet 32225 for IMV protection.

FIG. 323 illustrates a safe-type privacy/security enclosure in accordance with some embodiments of the invention. In some embodiments, the privacy/security enclosure 32300 can include a housing 32305 mounted on a support 32325. In some embodiments, an access door 32310 can enable a user to access slots 32315 for storage of the user's device(s).

FIG. 324 illustrates a tackle box privacy/security enclosure 32400 in accordance with some embodiments of the invention, and FIG. 325 illustrates a letter box privacy/security enclosure 32500 in accordance with some embodiments of the invention. In some embodiments, the privacy/security enclosure 32400 can comprise a housing 32405, and access doors or flaps 32410, 32415 enabling a user to access one or more slots 32430. The privacy/security enclosure 32400 can also include an upper tray 32435 including additional slots 32437 for storage of additional user devices. Referring to FIG. 325, in some embodiments, the privacy/security enclosure 32500 can comprise housing 32505 including a coupled access door or flap 32510 enabling a user to access at least one storage slot 32515. In some embodiments, one or more user devices can be enclosed and stored within one or more holders, drawers, slots, or compartments of the privacy/security enclosures shown in FIGS. 322-325.

Some embodiments include privacy/security enclosure specific to office or executive spaces. For example, FIG. 326 illustrates a roundabout cage-type privacy/security enclosure 32600 in accordance with some embodiments of the invention, and FIG. 327 illustrates a built-in type privacy/security enclosure 32700 in accordance with some embodiments of the invention. In some embodiments, the privacy/security enclosure 32600 can comprise a carousel-type structure 32607 including a housing 32605 one or more slots 32615, and an actuation top 32610. The slots 32615 can be configured to accept and store a plurality of user devices after the structure 32607 is raised from the lower portion 32606 of the housing 32605. In some embodiments, structure 32607 can be raised by pressing the actuation top 32610. Further, in some embodiments, structure 32607 can be lowered into the lower portion 32606 of the housing 32605 by depressing the top 32610. In some embodiments, privacy/security enclosure 32600 can be integrated into a desk or other type of furniture or decoration of a room (e.g., such as a boardroom).

Some embodiments include a privacy/security enclosure integrated into a desk or other type of furniture or decoration of a room (e.g., such as a boardroom). For example, FIG. 327 illustrates a built-in type privacy/security enclosure 32700. In accordance with some embodiments of the invention, privacy/security enclosure 32700 can comprise a housing 32705 integrated into a desk or other type of furniture or decoration of a room (e.g., such as a boardroom). The housing 32705 can enclose a slot 32710 into which a user can store one or more device. A door 32715 can be used to close the privacy/security enclosure 32700.

In some embodiments of the invention, using any of the privacy/security enclosures disclosed here, remote or wireless access to internal electronics such as chips, microprocessors, microcontrollers, memory, storage, PCB boards and other such electronic components, devices or assemblies can be prevented, thereby decreasing the likelihood or ease by which the invention can be hacked, accessed or controlled remotely. In some embodiments of the invention, the use of microprocessors, microcontrollers or other electronic components that have features such as one-time write, read restrictions, that encrypt, lock or otherwise secure or obfuscate their software, firmware or other command/configuration information can be used to prevent or increase the difficulty of hacking, modifying or changing the intended operation and/or functionality of the invention. In some embodiments of the invention, direct, remote, RF, wired or wireless access to electronic component can be prevented or made more difficult by the use of Faraday cages, by the omission of RF transceivers or other connecting or networking capabilities, by the elimination, exclusion or reduction of functionality of internal or external ports that might provide access to electronic components, by the clipping, removal or otherwise destroying or tampering with some or all pins or pathways that can allow software or firmware updates, by soldering, gluing, covering with a foreign material or other technique to make it difficult to remove or change chips, PCB boards or electronic components, or by the combination of some or all of these and other techniques. In some embodiments of the invention, with the potential of increasing the cost or ability to diagnose, repair, replace or reuse some or all of the components, the ability or ease by which some embodiments of the invention can be opened and/or internal components or features can be accessed can be reduced or made more difficult through the use of techniques such as one way connectors, tabs or other such features, the use of ultrasonic welding or other such manufacturing techniques or the obfuscation or hiding of assembly features, any or all of which capabilities can provide for the destruction or degradation of the embodiment's operation or performance or can result in a user being more readily aware that an attempt (successful or unsuccessful) has been made to open or tamper with the embodiment and/or its features or capabilities.

In some embodiments of the invention, any of the privacy/security enclosures disclosed herein can act as a security token for the user to use as part of an authentication or login process with a website, network, computer or other device or facility desiring such a level of authenticated access. For example, in some embodiments of the invention, when a user wants to login to a secure website, device, software, network or facility, a code can be generated by the privacy/security device/enclosure that is required to be provide in order to login or access the desired website, device, software, network or facility. In other embodiments of the invention, communication to or from the enclosed device can be monitored and/or passed, verified, changed, blocked or redirected based on criteria, rules or algorithms either pre-loaded or downloaded (and occasionally or periodically updated if or when desired) on the privacy/security enclosure. In yet other embodiments of the invention, data, voice or video traffic can be encrypted or decrypted by the privacy/security enclosure prior to transmission or on receipt or at some other such time as fits within the desired security profile.

In some embodiments of the invention, one or more microphones can be used to detect and/or capture audio content reaching the privacy/security enclosure, which audio content can then be repeated or replayed, with or without a delay, on one or more speakers/audio drivers included in the enclosure. In some embodiments of the invention, full or partially sealed pathways can be provided from each of one or more speakers/audio drivers to one more or all of the microphone or microphones within an enclosed device or devices. In some embodiments of the invention, sealed pathways may not be used and repeated or replayed sound can be broadcast to the interior or exterior of the enclosure, uncontained by such pathways/seals.

In some embodiments, installation of the privacy/security enclosure can include installation to the user's device so that external audio energy from the external environment is reduced, attenuated or changed. In some embodiments, the installation can include techniques including various conventional seals and sound isolating techniques. In some embodiments, the protected device(s)' microphone(s) can be partially or fully isolated from external audio excitation using compressive materials used to form a seal. Novel structures or baffles or tortuous paths can be used in some embodiments to help reduce or eliminate external audio energy from reaching the protected device(s)' microphone(s).

In some embodiments of the invention, one or more seals can remain in position while in other embodiments of the invention one or more seals can be moveable, sealing and unsealing at different points in time. In some embodiments of the invention, the ability to seal and/or unseal and/or the ability to play/direct masking noise or changed/manipulated/processed audio content to one or more microphones of enclosed devices can be available on a microphone by microphone basis. In other embodiments, it can be available for combinations or all microphones together. In some embodiments of the invention, different audio content (e.g., pass-through, noise, modified, processed, manipulated or otherwise changed content) can be played for different microphones at the same time, while in other embodiments of the invention, similar or the same content can be played at the same time. In some embodiments of the invention, a conventional mechanical or electro-mechanical mechanism can be used to apply one or more seals to its mated surface. In some embodiments of the invention, differing compression levels can be used for one or more seals, even if applied by a conventional mechanism, in order to more effectively deliver the desired functionality (e.g., audio masking, delivering audio content, reduced obtrusiveness, external audio attenuation etc.)

In some embodiments of the invention, seals and/or sealed pathways/channels can be used to more effectively deliver audio content to one or more microphones of enclosed device in order to attenuate broadcast audio content and/or to attenuate external audio content. In some embodiments of the invention, the seals can comprise neoprene or other compliant material. As illustrated in FIGS. 328A-328F, showing seals 32810, 32820, 32830, 32840, 32850, and 32860, in some embodiments of the invention, the seals 32810, 32820, 32830, 32840, 32850, and 32860 can be shaped to optimize acoustical coupling to a targeted microphone. This can be achieved by taking into account various factors including, but not limited to, the space available for the seal, the surface material, texture and form of an interface to which the seal can mate, the acoustical path by which the targeted microphone detects audio content (e.g., a hole or pattern of holes in the phone behind which the targeted microphone is mounted, attached or coupled etc.), and the level of sealing required to meet the desired level of attenuation. As further illustrated in FIGS. 328A-328F, in some embodiments of the invention the seal(s) can have a cut-out surrounded by varying thickness and shape of wall in order to meet the goals previously described. In other embodiments of the invention, the seal(s) can have a series of concentric or non-concentric/asymmetric chambers to meet the previously described goals.

In some embodiments of the invention, the audio content captured by the privacy/security enclosure's microphone(s) can be blocked, attenuated, amplified, changed, obfuscated, distorted, filtered, replaced or otherwise modified at, before or during the time it is captured, played, broadcast or transmitted, if it is played, broadcast or transmitted at all by the one or more speakers/audio drivers included in the enclosure.

In some embodiments of the invention, the audio content from the one or more microphones may not be transmitted or replayed/rebroadcast by the one or more speakers/audio drivers in the enclosure, but rather one or more masking signals can be broadcast by the one or more speakers/audio drivers in the system, with one such effect being that it can be more difficult to determine audio content other than the masking signal(s) from recordings or content captured by one or more microphones in any device or devices protected by the privacy/security enclosure. In some embodiments of the invention, the masking signal can be deterministic, while in others it can be truly random or pseudo-random, and in one or more of these examples, the frequency of the masking/jamming signal(s) can be tuned or filtered to a profile such as white, blue, pink, gray or some other such noise or frequency profile as described herein.

In some embodiments of the invention, the user can activate, deactivate, tune or change the level, volume, power or capabilities of the electronic audio repeating and/or masking/jamming capability through the use of switches, buttons or other such physical interface included in or with the enclosure, while in other embodiments of the invention, such features or capabilities can be activated, deactivated, tuned or changed by movements, motion, remote control(s) such as RF, infrared, or other wired or wireless technology or sound such as a spoken keyword or phrase. In some embodiments of the invention, the use of electronic audio repeating, manipulation and/or jamming, masking, attenuating or blocking can provide features or capabilities beyond just audio protection, but can include features such as amplification, audio enhancement, noise or echo canceling, audio mixing and other forms of audio manipulation to name a few.

In some embodiments of the invention, the privacy/security enclosure can be designed such that if power is lost, audio content can no longer be clearly rebroadcast//transferred to the desired microphone, but rather physical characteristics of the enclosure such as sealed pathways and others can result in a noticeable difference in audio quality, detectable by an average listener. For example, in some embodiments of the invention, if a user desires protection of the enclosure and a hacker or other party accidentally or intentionally eliminates power, and/or plugs, blocks or degrades one or more speakers/audio drivers, damages one or more seals or other physical aspects of the enclosure, or otherwise degrades the enclosure's audio jamming/masking/protective capability, the user can detect the reduction or elimination of protection during an audio call with another party. The other party can identify a change to the enclosure's protection because the audio clarity of the conversation can be degraded or different when compared to the audio quality provided when the enclosure is operating correctly. Such degradation or other audio clarity change can be accomplished using proprietary techniques described herein or a variety of techniques well-known to one of ordinary skill in the art.

In some embodiments of the invention, microphone(s) included with the enclosure can be placed such that they are directional can be of higher or lower quality than microphone(s) in the protected device(s). Alternatively, they can include capabilities or features that increase or decrease audio performance when compared to that provided by the enclosed or protected device(s) native microphone(s). In other embodiments of the invention, the transfer function of recorded and replayed audio content can be changed, can be different, or can be optimized for performance in different environments, settings or conditions, for different times of day or for different/varying speakers (e.g. male, female, young, old, loud or soft-spoken individuals, accents etc.). In other embodiments of the invention, the transfer function of recorded and replayed audio content can be changed, distorted, replaced, translated or otherwise modified for various purposes including, but not limited to, protection, communication, fun, novelty or performance.

In some embodiments of the invention, when the privacy/security enclosure's protection is activated, the embedded microphone(s) are disabled or are otherwise prevented from delivering any usable detected, captured or recorded audio content. In some embodiments, this can be achieved by techniques such as eliminating power or turning off/deactivating, disregarding any content detected or captured, physically or electronically disconnecting or blocking any path(s) to any associated speaker/audio driver, or by other conventional methods.

In some embodiments of the invention, the use of electronic audio repeating, manipulation and/or jamming, masking, attenuating or blocking can result in benefits such as reduced cost to design and manufacture, reduced assembly complexity, reduction or elimination of moving parts, increased cycle life, durability, repeatability and control, reduced size/weight and other such benefits when compared to purely mechanical methods of attenuating, blocking or jamming/masking audio content or applying such capabilities to microphone(s) contained by protected device(s).

Some embodiments of the invention can integrate and connect with software running on enclosed or other device(s), communicating via wired or wireless connections. For example, in some embodiments of the invention, a connection to an enclosed smartphone via wireless or wired connection to a data port can allow interaction with a mobile app to provide any of numerous functions, including private or secured messaging and communications, secure token capabilities, monitoring and manipulation or protection of data and data transmissions etc. In some embodiments of the invention, one or more totally dedicated and independent set of mechanical and electrical/electronic components (e.g., microprocessors, microcontrollers, memory, storage etc.) and/or pathways between such electrical/electronic and/or mechanical components can exist to provide a certain set of features, functions and/or interactions. In some embodiments of the invention, the existence of such isolated and dedicated components and pathways can eliminate, minimize or reduce the risk or ability of accidental or intentional manipulation, reduction or elimination of one set of features or capabilities by any individual, software or hardware interacting with, accessing or using another.

In some embodiments, the privacy/security enclosure can mount directly or through a clamping interface. In some embodiments, the privacy/security enclosure can be positioned on the user's device so that the internal microphones are covered and sealed from the external audio environment. In some embodiments, privacy/security enclosure can include microphone transducers to sense the external audio environment and electronics to process captured sound as needed. The device can also be used with laptops, tablets and devices that contain cameras, microphones or other such sensors). In some embodiments, the extension of privacy/security can comprise isolating audio and/or video from the user's device. In some embodiments, the level of privatization can be partial in that some components or devices of a user's device remain non-private and others are private. For example, in some embodiments, a movable portion or section of the privacy/security enclosure can be moved with respect to another portion or section of the privacy/security enclosure to cover and make private a webcam but leave open a microphone.

In some embodiments, removing power from the privacy/security enclosure can turn off the capture and/or rebroadcast of audio content, resulting in a detectable change on the quality, fidelity, volume, clarity or other such sound characteristic when engaging in phone calls or any other microphone application, with such change providing an additional level of security on the system operation as the change can indicate the loss of power, intentional or otherwise.

In some embodiments, plugging, disabling, damaging, changing or blocking a privacy/security enclosure's speaker(s) or broadcast pathway can reduce, attenuate or even effectively eliminate the protected device(s)' audio capture, effectively disabling or impacting audio applications of a protected device(s). In some embodiments, damaging or changing a privacy/security enclosure seal can cause a noticeable audible anomaly by introducing a separate and time-different input to the user's device microphone (e.g., an echo).

In some embodiments, the privacy/security enclosure can provide an option for using a forward or other directionally directed microphone(s) for better audio coupling as compared to the microphone(s) native to the protected device(s). Further, in some embodiments, the privacy/security enclosure electronics can be used to optimally shape the microphone/speaker transfer function. In some embodiments, the electronic privacy/security enclosure device can be more slender than a manually controlled privacy/security device and can be mechanically coupled to the protected device.

FIGS. 329 and 331-344 show some embodiments of the invention including privacy/security enclosures for providing protection for a desktop computer. For example, some embodiments include a privacy/security enclosure 32900, 33200, 33600, 33610, 34300 that can be used to increase the privacy/security of a user when using or in the presence of a user device. In some embodiments, the privacy/security enclosure can comprise a housing assembly that can comprise a rigid, structurally self-supporting chamber that can be attached, mounted, or otherwise coupled to a user's device.

Referring to FIG. 329, illustrating privacy/security enclosure, in some embodiments, the privacy/security enclosure privacy/security enclosure 32900 can also include devices for generating noise and directing the output to encapsulated speakers. Further, in some embodiments, switching between feeding the speakers with noise and external audio is accomplished with a single button press (control switch 32925). For example, the privacy/security enclosure 32900 can comprise a main housing 32905 including a primary portion 32907 and a coupled secondary portion 32909. An upper portion 32911 can include microphone 32915 and a speaker 32920. The primary portion 32907 can include a microphone 32916 and speaker 32922. The control switch 32925 can be positioned in the upper portion 32911, and a power connector 32930 can extend into the end 32908.

Some embodiments of the invention include methods to determine the functional status of the privacy/security enclosure. In some embodiments, an application running on a user's computer or other protected device can connect to the protected device's microphone output(s) and measure the signal level(s). In some embodiments, the amplifier to the privacy/security enclosure speaker(s) can be turned off (via a user interface element) so that no sound is emitted by the privacy/security enclosure speaker(s). The protected device's application can "listen" to the output of the device's microphone(s) while outputting audio through the device's speaker. In some embodiments, if the signal measured by the device's microphone is below a predetermined threshold, the mechanical seal of the privacy/security enclosure is properly blocking external audio from the device's microphone(s). The user can be alerted to proper isolation by the device's application.

In some further embodiments, a second and/or third or more microphone(s) can be installed inside the privacy/security enclosure. If the privacy/security enclosure is properly sealed, the extra microphone outputs can be compared to a predetermined threshold within the privacy/security enclosure electronics. In some embodiments, if this threshold is not exceeded, the privacy/security enclosure is determined to be properly sealed. In some further embodiments, the output from the extra microphone(s) can be altered by an electronic filter or signal processing algorithm within the privacy/security enclosure electronics so that the audio signal(s) from the extra microphone(s) can be optimized versus the predetermined threshold used for determining the effectiveness of the mechanical isolation seal. Some other embodiments can include the privacy/security microphone(s) sampling the external environment as a trigger for determining when to sample the threshold comparison described above.

Referring to FIG. 330 illustrates a schematic of a privacy/security system 33000 in accordance with some embodiments of the invention, and FIG. 331 illustrates a system schematic 33001 of a privacy/security system 33000 in accordance with some embodiments of the invention. In some embodiments, privacy/security enclosure 33000 can comprise privacy/security enclosure 33001 including a microphone 33020 coupled to electronics 33010. A speaker 33030 can be coupled to the electronics and be configured to interface with a computer 33005. The computer 33005 can comprise an application 33050 coupled to a speaker driver 33060 that is coupled to a speaker 33070, and can be coupled to a microphone software driver 33040 coupled to a computer microphone 33045. In some embodiments, the privacy/security enclosure 33001 can include an extra microphone 33075 as shown in FIG. 331.

FIGS. 332-344 illustrates views of privacy/security enclosures showing portions of the internal structure including a movable portion or section of the privacy/security enclosure can be moved with respect to another portion or section of the privacy/security enclosure to adjust the coverage (and therefore the privacy/security level) of the privacy/security enclosure mounted or coupled to the user's device (e.g., a computer or display monitor as shown in the example embodiment of FIG. 329). The example embodiments of the invention include some cross-sectional and partial views including various latching mechanisms and structures that are configured to enable a user to control movement of a portion of the privacy/security enclosure that can affect the level of privacy and security the device provides to a user. For example, FIGS. 332-335 illustrate cross-sectional views of a privacy/security enclosure 33200 incorporating internal assemblies to enable a user to open a hood 33210 using a "push down" action in accordance with some embodiments of the invention. A user-actuated latch mechanism 33217 is shown extending within the housing 33205 of the privacy/security enclosure 33200. In some embodiments, the latch mechanism 33217 includes a coupled tab or button 33212 that extends outward from an aperture 33211 in the front face 33215 of the housing 33205 of the privacy/security enclosure 33200, and a latch arm 33228 with a catch element 33232 coupled to a pivot 33225 and configured to couple with a spring-assisted strut 33230 for extending or retracting a hood 33210 of the privacy/security enclosure 33200. The user can initiate movement of the hood 33210 by pressing the button 33212. The spring-assist (with spring 33240 shown in FIG. 333) can enable the hood 33210 to be extended with little or no interaction by the user. In other embodiments, the spring 33240 can assist the user extending the hood 33210. The return of the button 33212 can be assisted by the spring 33218.

Another example embodiment is shown in FIGS. 336-342 illustrating cross-sectional views of a privacy/security enclosure 33600 incorporating internal assemblies to enable a user to open a hood 33210 using a "push up" action in accordance with some embodiments of the invention. The alternate embodiment includes a latching mechanism 33617 operating the hood 33610 extended out or away from the housing 33605 that can be controlled by pulling or pushing the tab or button 33612 upwards (i.e., toward the top surface 33606 of the hood 33610). In this configuration, the tab or button release spring 33608 is located in the upper portion 33607 of the housing 33605, and positioned to be compressed when a user applies force to the tab or button 33612 by moving the tab or button 33612 towards the upper portion 33607 of the hood 33610. A return action can be assisted by spring 33608. In this instance, the latch arm 33618 rotates in a clock-wise direction about the pivot 33625, rather than in an anti-clockwise direction shown for the embodiment in FIGS. 332-335 described above. The latch arm 33618 of the user-actuated latch mechanism 33217 is shown extending within the front face 33615 of the housing 33205 of the privacy/security enclosure 33600. In some embodiments, the coupled tab or button 33612 extends outward from an aperture 33611 in the front face 33615 of the housing 33605 of the privacy/security enclosure 33600, and a latch arm 33628 with a catch element 33632 coupled to a pivot 33625 and configured to couple with a spring-assisted strut 33630 for extending or retracting a hood 33610 of the privacy/security enclosure 33600. The user can initiate movement of the hood 33610 by pulling the button 33612 upwards towards the top surface 33606 of the housing 33610. The spring-assist (with spring 33640) can enable the hood 33610 to be extended with little or no interaction by the user. In other embodiments, the spring 33640 can assist the user extending the hood 33610.

FIGS. 338-342 illustrates a cross-sectional views of a privacy/security enclosure 33600 including opening hood stage 33601, locked hood stage 33602, latch release stage 33603, latch return stage 33604*a*, and re-latch stage 33604*b*. The stage 33601 shows a latch mechanism 33617 in a stayed position. The stage 33602 shows the hood 33610 lowered and locked. The stage 33603 shows the hood 33610 releasing following pull up of the button 33612. The stage 33604*a* shows the hood 33610 raised, and the latch 33618 return. The stage 33604*b* shows the button 33612 push down to relatch with a lead-in on the latch foot (shown as 33630).

FIGS. 343 and 344 illustrate perspective views of a privacy/security enclosure 34300 including adjustable shutter 34330 and showing the tab or button 34355 extending from the front face 34310 of the housing 34505, with the hood 34350 in the closed position (FIG. 343) and the open position (FIG. 344). In some embodiments, a user can apply pressure to the tab or button 34355 to at least partially rotate the latch arm of the latch mechanism about a pivot point described above. This action can cause the latch arm to disengage or move (assisted by the spring) to cause the hood 34350 to move outward from the housing 34305. In some embodiments, the actions described can be reversed by a user applying force to the top surface 34352 of the hood 34350 to force the hood 34350 inward towards the housing 34305, compressing the spring, and causing the latch arm to latch to a spring-assisted actuator.

In some embodiments, any protected device's microphone(s) can be mechanically isolated to some extent from external audio sources via a mechanical seal, and a small speaker (e.g., such as a hearing aid speaker) can be placed inside the mechanical seal, tightly coupled to the protected device's microphone(s). In some embodiments, speaker drive electronics can be used to send an audio signal to each privacy/security enclosure speaker. Further, in some embodiments, the driver circuit can be used to send a pink, white or other noise signal to the speakers. In some embodiments, this noise signal can be enabled and the microphone is disabled when the user selects to block/reduce audio by masking some or all of any remaining external audio not blocked by mechanical seals from reaching the protected device's microphone or microphones.

In some embodiments of the invention, one or more microphones in the privacy/security enclosure can be exposed to the external environment. In some embodiments, these microphones can be enabled when the user chooses to allow the protected device's microphone(s) to listen to the external environment. In some embodiments, when enabled, the signal from the privacy/security microphone is amplified such that it can drive the speaker or speakers described above.

In some embodiments of the invention, the output signal from the microphone can be electronically filtered by frequency to either enhance or equalize the frequency response of the system when played through one or more speakers as described above. In some embodiments, the enhancement or equalization can compensate for the frequency response of the speaker. In one embodiment, this compensation can cancel out speaker resonance so that overall system frequency response from microphone input to speaker output is equalized as closely as possible to a generally flat spectrum or some other such desired profile within a certain frequency range. In some embodiments of the invention, output from microphone(s) and/or outputs from signal filtering or other form of change/manipulation to the output of a microphone(s) can be de-amplified before being sent to a speaker for broadcast in order improve the quality of the audio picked up by the targeted microphone. Playing the speaker at low volume can facilitate the ability of a closely coupled microphone(s) to get a good signal and not overwhelm, saturate or otherwise negatively impact the quality of such detected/recorded signal.

In some embodiments, power to the privacy/security enclosure can be provided using a USB cord from the privacy/security enclosure connected to an AC/DC USB power block at an AC outlet and to a USB power compatible input on privacy/security enclosure. Alternatively, the privacy/security enclosure can be powered via a USB port on the computer or associated device (or via a standalone USB power block). In some embodiments, plugging in the USB cable can automatically turn on the unit. Alternatively, the unit can be turned on or latched on via a pushbutton.

Some further embodiments include a disposable lithium coin cell used to power the privacy/security enclosure. In some embodiments, a rechargeable battery can be used to power the privacy/security enclosure. In some embodiments, this battery can be of any standard rechargeable battery type. In some embodiments, a single-celled lithium ion battery can be used. Further, a USB cable can be used to provide charging power to the privacy/security enclosure.

Some embodiments of the invention include privacy/security enclosures that enable DC power pass-through while maintaining a highly functional Faraday cage. For example, FIG. 345 illustrates a circuit diagram 34500 for a DC pass-through in accordance with some embodiments of the invention. In some embodiments, the ferrite bead 34520 can comprise a 200 MHz 0.236 length ferrite bead, such as part number FB43-226-RC (e.g., shown at http://www-.digikey.com/product-detail/en/FB43-226-RC/M8700-ND/775239). Further, in some embodiments, the filter 34510 can comprise a 50000 PF C type filter, such as manufacturer part number 4300-014LF (e.g., shown at http://www.digikey.com/product-search/en?vendor=0&keywords=4300-0141f). FIG. 346 illustrates a front view of a DC pass-through assembly 34600 implementing the circuit 34500 of FIG. 345 in accordance with some embodiments of the invention, and FIG. 347 illustrates a rear view of the DC pass-through assembly 34600 of FIG. 346 in accordance with some embodiments of the invention.

In some embodiments of the invention, the capacitors of the circuit as shown are a short circuit to high frequencies such as frequencies above about 1 MHz, and the inductors (the ferrite beads) are high impedance to those high frequencies. Consequently, in some embodiments, the high frequencies have a low impedance path to the case and high impedance to pass through. Moreover, the chambered design as shown (similar to forming two small Faraday cages) can protect the wires from picking up RF radiation, while the direct current flow has a low impedance through (i.e., when powering a device) and a high impedance to the case.

In some embodiments, the privacy/security enclosure can enable charging of one or more batteries within the privacy/security enclosure with a functioning Faraday cage. Further, some embodiments also enable charging of batteries of one or more enclosed devices within the privacy/security enclosure or enclosure. Moreover, in some embodiments, charging of one or more batteries in the privacy/security enclosure and one or more batteries of at least one enclosed device can occur substantially at the same time. In some embodiments, the privacy/security enclosure can comprise one or more charging conductors or wires that pass through the Faraday cage of the privacy/security enclosure for purposes such as charging or communicating. While charging, the Faraday cage remains functional (i.e., the conductor or wire pass-through does not significantly alter the protection/attenuation provided by the Faraday cage relative to the targeted level of attenuation/protection). Further, in some embodiments, the privacy/security enclosure or enclosure can comprise at least one charging conductor or wire that passes through the Faraday cage that do not require a user to connect and disconnect separate leads on the inside and/or outside of the privacy/security enclosure.

Some embodiments include a system and method for alerting the user that the coin cell needs to be replaced or that a battery needs to be recharged. For example, in some embodiments, alerting the user to replace the coin cell can include a blinking red LED. The illumination of the LED can be modified to conserve battery power (e.g., the blink on time can be short and the blink repetition rate can be slow to conserve the remaining battery power when the system is in the low battery state.)

In some embodiments of the invention, the privacy/security enclosure can interact with hardware and/or software components of the device to block, attenuate, reduce, confuse, distort, transform, encrypt, delete, amplify, increase, add or append to, remove, change, mask or otherwise impact or modify energy levels, settings and/or data or information residing on or being sent to or from the protected or enclosed device(s). For example, in some embodiments of the invention, power can be drained from one or more of the enclosure's batteries periodically by sharing or transferring to or from one or more batteries that are part of enclosed or protected device(s) and/or batteries within the enclosed device(s). In some embodiments, the power transfer, drainage or extraction can occur at varying rates and/or at different power levels to prevent or confuse identification or fingerprinting of the protected device(s) via it's battery charge levels, rate of discharge, or other battery related statistic or information. In some other embodiments of the invention, gyroscopes, accelerometers, or any other sensor can be similarly protected via features or capabilities of the privacy/security enclosure by itself or in conjunction with the protected device(s) and/or hardware or software that is a part of or is working with the protected or enclosed device(s).

In some embodiments of the invention, when the privacy/security enclosure has more than one device enclosed, differential protection can be provided based on the location or type of enclosed device and/or protection can be provided between enclosed devices. For example, in some embodiments of the invention, a "high security" portion of the enclosure can be provided while other portions of the enclosure provide a lower level of privacy/security. Other embodiments of the invention can include multiple internal chambers, partitions or sections, each with some or all of the protective features of the others. Some further embodiments of the invention can include protection between the chambers, partitions or sections, with Faraday cages attenuating RF access between one or more sections being just one non-limiting example.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A privacy/security apparatus for a portable communication device comprising:

a housing assembly configured to at least partially attenuate at least one of sound energy, acoustic energy, and electromagnetic energy including light, optical, and IR energy and RF radiation from passing through the housing assembly, the housing assembly including:

a Faraday cage comprising two or more portions, and at least one protective shell coupled to or forming at least one aperture, the at least one aperture configured and arranged to at least partially enclose the portable communication device, wherein the at least one protective shell comprises at least a portion of the Faraday cage enabling at least a portion of the portable communication device to be positioned on or adjacent the Faraday cage;

at least one seal coupled or integrated with the protective shell;

a seed source or seed generator, the seed source or seed generator configured to generate at least one random seed;

at least one speaker or noise generator configured and arranged to generate acoustic jamming noise, the acoustic jamming noise comprising at least one audio jamming signal;

a controller circuit coupled to the at least one speaker or noise generator, the controller circuit configured and arranged to generate the acoustic lamming noise sound from the at least one speaker or noise generator based at least in part on at least one user selectable privacy setting and the at least one random seed.

2. The privacy/security apparatus of claim 1, wherein the housing assembly includes an articulating assembly configured and arranged to articulate a portion of the housing assembly to one or more positions to enable a user to insert or enclose and remove the portable communication device.

3. The privacy/security apparatus of claim 1, wherein the housing assembly includes a sliding assembly configured and arranged to slide a portion of the housing assembly to one or more positions to enable a user to insert, enclose or remove the portable communication device.

4. The privacy/security apparatus of claim 1, wherein the at least one speaker or noise generator is coupled to the at least one seal and an active acoustic jamming system, and the active acoustic system is activated by the controller circuit.

5. The privacy/security apparatus of claim 1, wherein the housing assembly is configured and arranged to be movable between an open and a closed position to enable a user to insert or enclose and remove the portable communication device.

6. The privacy/security apparatus of claim 1, wherein the housing assembly comprises a sheath.

7. The privacy/security apparatus of claim 1, wherein the housing assembly comprises a hood assembly and a base assembly, the base assembly including a Faraday base assembly forming at least one of the portions of the Faraday cage.

8. The privacy/security apparatus of claim 7, wherein the hood assembly is configured and arranged to enable and disable a plurality of the portable communication device's microphones and/or cameras from receiving unjammed or unblocked audio and light energy in a single motion.

9. The privacy/security apparatus of claim 7, wherein the hood assembly is configured and arranged to reversibly apply at least one audio jammer to reversibly enable and disable at least one microphone of the portable communication device from receiving unjammed audio energy.

10. The privacy/security apparatus of claim 7, wherein the hood assembly is configured and arranged to reversibly apply at least one element to reversibly cover and uncover at least one camera of the portable communication device.

11. The privacy/security apparatus of claim 7, wherein the at least one seal comprises a seal configured and arranged to cover at least one microphone of the portable communication device irrespective of the position or movement of the hood assembly on the housing assembly.

12. The privacy/security apparatus of claim 1, wherein the at least one seal comprises an environmental seal.

13. The privacy/security apparatus of claim 1, wherein the at least one seal comprises an RF attenuation or absorbing seal.

14. The privacy/security apparatus of claim 1, wherein the at least one seal comprises at least one of a magnetic seal, an electromagnetic seal, an acoustic attenuation seal, and an optical seal.

15. The privacy/security apparatus of claim 1, wherein the at least one seal comprises a fingerstock element.

16. The privacy/security apparatus of claim 15, wherein the seal includes at least one elastomeric element positioned adjacent to the fingerstock.

17. The privacy/security apparatus of claim 16, wherein the at least one elastomeric element is positioned within at least a portion of the fingerstock.

18. The privacy/security apparatus of claim 1, wherein the housing assembly includes at least one port configured to couple with the portable communication device.

19. The privacy/security apparatus of claim 18, wherein the at least one port comprises at least one of a sound transfer port, an RF transfer port, a data transfer port, a power transfer port, and an optical port.

20. The privacy/security apparatus of claim 1, wherein the at least one protective shell includes a decorative layer or region.

21. The privacy/security apparatus of claim 20, wherein the decorative layer or region comprises at least one of a patterned surface, a window, a display, an emblem, and a logo.

22. The privacy/security apparatus of claim 1, wherein the controller circuit is configured and arranged to modulate at least one privacy/security setting selected by a user.

23. The privacy/security apparatus of claim 22, wherein the at least one privacy/security setting includes a setting that is configured and arranged to alter the magnitude of energy reaching the portable communication device through the housing assembly.

24. The privacy/security apparatus of claim 23, wherein the energy comprises at least one of sound energy, RF energy, electrical energy, electromagnetic energy, and optical and/or IR energy.

25. The privacy/security apparatus of claim 1, wherein the housing assembly includes at least one microphone.

26. The privacy/security apparatus of claim 1, wherein the housing assembly includes at least one seal configured and arranged to couple with at least one of a microphone, a speaker, a camera, a display, a sensor, and an RF antenna of the portable communication device.

27. The privacy/security apparatus of claim 1, wherein the controller circuit includes a random noise generator configured and arranged to generate a signal acoustically delivered to at least one microphone of the portable communication device.

28. The privacy/security apparatus of claim 1, wherein the housing assembly includes at least one DC pass-through configured and arranged to pass direct current through the Faraday cage.

29. The privacy/security apparatus of claim 1, wherein the housing assembly includes an onboard power supply.

30. A privacy/security apparatus for a portable communication device comprising:

- a housing assembly configured to at least partially attenuate sound energy from passing through the housing assembly, the housing assembly including,
- a Faraday cage comprising two or more portions;
- at least one protective shell coupled to or forming at least one aperture, the at least one aperture configured and arranged to at least partially enclose the portable communication device so that at least a portion of the portable communication device is positioned within at least one portion of the Faraday cage;
- a seed source or seed generator, the seed source or seed generator configured to generate a random seed;
- a hood assembly integral or coupled to the housing assembly, the hood assembly reversibly slidable or extendible from the at least one protective shell from a closed position to an open position and any position between the closed and open positions;
- a controller configured and arranged to enable generation of acoustic jamming noise based at least in part on at least one user-selectable privacy setting, the position of the hood assembly, and the random seed; and
- wherein at least a portion of the acoustic jamming noise is configured to be delivered by at least one speaker or noise generator of the housing assembly and received by one or more microphones of the portable communication device positioned in the at least one protective shell; and
- wherein the controller is configured and arranged to automatically turn off any acoustic jamming noise when the hood assembly is not in a closed position, and to automatically turn the acoustic jamming noise on when the controller is activated and the hood assembly is in a closed position at least partially enclosing a portable communication device.

31. The privacy/security apparatus of claim 30, wherein the housing assembly is configured and arranged to reversibly apply at least one element to at least one sensor of the portable communications device with a single movement of at least a portion of the housing assembly.

32. The privacy/security apparatus of claim 31, wherein sensor comprises the one or more microphones.

33. The privacy/security apparatus of claim 31, wherein sensor comprises at least one camera.

* * * * *